US012281248B2

(12) United States Patent
Joo et al.

(10) Patent No.: US 12,281,248 B2
(45) Date of Patent: Apr. 22, 2025

(54) ORGANIC LIGHT-EMITTING ELEMENT USING POLYCYCLIC AROMATIC DERIVATIVE COMPOUND

(71) Applicants: SFC CO., LTD., Cheongju-si (KR); HODOGAYA CHEMICAL CO., LTD., Tokyo (JP)

(72) Inventors: Sung-hoon Joo, Cheongju-si (KR); Byung-sun Yang, Cheongju-si (KR); Su-jin Kim, Cheongju-si (KR); Ji-hwan Kim, Cheongju-si (KR); Hyeon-jun Jo, Cheongju-si (KR); Sung-eun Choi, Cheongju-si (KR); Bong-ki Shin, Cheongju-si (KR); Young-hwan Park, Cheongju-si (KR); Shuichi Hayashi, Tokyo (JP); Takeshi Yamamoto, Tokyo (JP); Shunji Mochizuki, Tokyo (JP); Yuta Hirayama, Tokyo (JP)

(73) Assignees: SFC CO., LTD., Cheongju-si (KR); HODOGAYA CHEMICAL CO., LTD., Tokyo (JP)

( * ) Notice: Subject to any disclaimer, the term of this patent is extended or adjusted under 35 U.S.C. 154(b) by 216 days.

(21) Appl. No.: 17/296,347

(22) PCT Filed: Nov. 28, 2019

(86) PCT No.: PCT/KR2019/016612

§ 371 (c)(1),
(2) Date: May 24, 2021

(87) PCT Pub. No.: WO2020/111830

PCT Pub. Date: Jun. 4, 2020

(65) Prior Publication Data

US 2022/0102635 A1 Mar. 31, 2022

(30) Foreign Application Priority Data

Nov. 30, 2018 (KR) ........................ 10-2018-0151781
Nov. 27, 2019 (KR) ........................ 10-2019-0154524

(51) Int. Cl.

| | |
|---|---|
| ***H01L 51/00*** | (2006.01) |
| ***C07F 5/02*** | (2006.01) |
| ***C07F 11/00*** | (2006.01) |
| ***C09K 11/06*** | (2006.01) |
| ***H10K 85/30*** | (2023.01) |
| ***H10K 85/60*** | (2023.01) |
| *H10K 50/15* | (2023.01) |
| *H10K 50/16* | (2023.01) |
| *H10K 50/17* | (2023.01) |
| *H10K 50/844* | (2023.01) |

(52) U.S. Cl.

CPC ................ *C09K 11/06* (2013.01); *C07F 5/02* (2013.01); *C07F 5/027* (2013.01); *C07F 11/00* (2013.01); *H10K 85/322* (2023.02); *H10K 85/626* (2023.02); *H10K 85/633* (2023.02); *H10K 85/636* (2023.02); *H10K 85/6572* (2023.02); *H10K 85/6574* (2023.02); *H10K 85/6576* (2023.02); *H10K 85/658* (2023.02); *C07B 2200/05* (2013.01); *C09K 2211/1018* (2013.01); *C09K 2211/1022* (2013.01); *H10K 50/15* (2023.02); *H10K 50/16* (2023.02); *H10K 50/171* (2023.02); *H10K 50/844* (2023.02)

(58) Field of Classification Search

CPC ......... C07F 5/02; C07F 5/027; H10K 85/322; C09K 2211/1022

See application file for complete search history.

(56) References Cited

U.S. PATENT DOCUMENTS

| | | | | |
|---|---|---|---|---|
| 2003/0137239 | A1 | 7/2003 | Matsuura et al. | |
| 2004/0217934 | A1 | 11/2004 | Yang | |
| 2006/0043858 | A1* | 3/2006 | Ikeda | C07C 43/20 313/250 |
| 2009/0053557 | A1 | 2/2009 | Spindler et al. | |
| 2014/0225100 | A1* | 8/2014 | Yokoyama | H10K 85/6572 257/40 |
| 2015/0236274 | A1* | 8/2015 | Hatakeyama | H10K 85/322 548/405 |
| 2016/0056386 | A1 | 2/2016 | Lee et al. | |
| 2017/0213969 | A1 | 7/2017 | Shin et al. | |
| 2017/0346009 | A1* | 11/2017 | Yokoyama | H10K 85/615 |
| 2018/0006235 | A1 | 1/2018 | Yokoyama et al. | |
| 2018/0301629 | A1 | 10/2018 | Hatakeyama et al. | |
| 2019/0207112 | A1 | 7/2019 | Hatakeyama et al. | |
| 2020/0098991 | A1 | 3/2020 | Kim et al. | |
| 2020/0176679 | A1 | 6/2020 | Jeong et al. | |
| 2021/0184121 | A1* | 6/2021 | Suh | C07F 5/027 |

FOREIGN PATENT DOCUMENTS

| | | |
|---|---|---|
| CN | 101490207 A | 7/2009 |
| CN | 103864789 A | 6/2014 |

(Continued)

OTHER PUBLICATIONS

Englsih language translation of WO 2015001726A1, Apr. 19, 2023, pp. 1-24.*

(Continued)

*Primary Examiner* — Alexander C Kollias
(74) *Attorney, Agent, or Firm* — NSIP Law

(57) ABSTRACT

An organic light-emitting element according to the present invention employs a polycyclic aromatic derivative compound in a light-emitting layer inside the element, and further comprises a capping layer. Thus, the organic light-emitting element can be made highly efficient and can be useful for a device selected from among a flat panel display device, a flexible display device, a monochrome or white flat panel lighting device, and a monochrome or white flexible lighting device.

24 Claims, No Drawings

(56) References Cited

FOREIGN PATENT DOCUMENTS

| | | | | |
|---|---|---|---|---|
| CN | 107342366 A | | 11/2017 | |
| CN | 107851724 A | | 3/2018 | |
| CN | 107925001 A | | 4/2018 | |
| EP | 3 246 963 A2 | | 11/2017 | |
| EP | 3 660 024 A1 | | 6/2020 | |
| JP | 2014-72120 A | | 4/2014 | |
| JP | 2016-86147 A | | 5/2016 | |
| JP | 2017-168796 A | | 9/2017 | |
| JP | 6755806 B2 | | 9/2020 | |
| JP | 2021-504373 A | | 2/2021 | |
| KR | 10-2016-0087059 A | | 7/2016 | |
| KR | 10-2017-0061772 A | | 6/2017 | |
| KR | 10-2017-0089094 A | | 8/2017 | |
| KR | 10-2017-0127593 A | | 11/2017 | |
| KR | 10-2017-0130434 A | | 11/2017 | |
| KR | 10-2017-0130435 A | | 11/2017 | |
| KR | 10-2018-0018404 A | | 2/2018 | |
| KR | 10-2018-0037695 A | | 4/2018 | |
| KR | 10-1876763 B1 | | 7/2018 | |
| KR | 10-2018-0122298 A | | 11/2018 | |
| KR | 10-2019-0128954 A | | 11/2019 | |
| KR | 10-2094830 B1 | | 3/2020 | |
| WO | WO-2015001726 A1 | * | 1/2015 | ..... H10K 2102/3026 |
| WO | WO-2016104289 A1 | * | 6/2016 | ........... C07C 211/54 |
| WO | WO 2017/027333 A1 | | 2/2017 | |
| WO | WO 2017/183625 A1 | | 10/2017 | |
| WO | WO 2018/095397 A1 | | 5/2018 | |
| WO | WO 2018/203666 A1 | | 11/2018 | |
| WO | WO 2020/054676 A1 | | 3/2020 | |

OTHER PUBLICATIONS

International Search Report issued on Mar. 20, 2020 in counterpart International Patent Application No. PCT/KR2019/016612 (2 pages in English and 2 pages in Korean).

Japanese Office Action issued on Jun. 21, 2022, in counterpart Japanese Patent Application No. 2021-531137 (4 pages in Japanese).

Extended European search report issued on Aug. 10, 2022, in counterpart European Patent Application No. 19890930.1 (8 pages in English).

Chinese Office Action issued on Apr. 22, 2023, in corresponding Chinese Patent Application No. 201980078604.9 (9 pages in English, 8 pages in Chinese).

Chinese Office Action issued on Sep. 18, 2020, in corresponding Chinese Patent Application No. 201911199295.9 (12 pages in English, 7 pages in Chinese).

Japanese Office Action issued on Aug. 25, 2020, in corresponding Japanese Patent Application No. 2019-217554 (4 pages in Japanese).

Korean Office Action issued on Dec. 24, 2019, in corresponding Korean Patent Application No. 10-2019-0069314 (3 pages in Korean).

United States Office Action issued on Aug. 19, 2020, in U.S. Appl. No. 16/687,916 (16 pages in English).

Liang, Xiao, et al. "Peripheral amplification of multi-resonance induced thermally activated delayed fluorescence for highly efficient OLEDs." *Angewandte Chemie* vol. 130. Issue 35 (2018). pp. 1-6.

Saito, Shohei, et al., "Polycyclic π-electron System with Boron at Its Center." Journal of the American Chemical Society 134.22 (2012): 9130-9133.

Korean Office Action issued on Oct. 10, 2019, in counterpart Korean Patent Application No. 10-2019-0069314 (3 pages in English, 3 pages in Korean).

Korean Office Action issued on Dec. 24, 2019, in counterpart Korean Patent Application No. 10-2019-0069314 (2 pages in English, 2 pages in Korean).

* cited by examiner

ORGANIC LIGHT-EMITTING ELEMENT USING POLYCYCLIC AROMATIC DERIVATIVE COMPOUND

CROSS REFERENCE TO RELATED APPLICATIONS

This application is a U.S. National Stage Application of International Application No. PCT/KR2019/016612, filed on Nov. 28, 2019, which claims the benefit under 35 USC 119 (a) and 365 (b) of Korean Patent Application No. 10-2018-0151781, filed on Nov. 30, 2018, and Korean Patent Application No. 10-2019-0154524, filed on Nov. 27, 2019 in the Korean Intellectual Property Office, the entire disclosure of which is incorporated herein by reference for all purposes.

TECHNICAL FIELD

The present invention relates to highly efficient organic electroluminescent devices with greatly improved luminous efficiency using polycyclic aromatic compounds.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

There has been much research aimed at improving the characteristics of organic electroluminescent devices by changes in the performance of organic layer materials. In addition, a technique for improving the color purity and enhancing the luminous efficiency of a device by optimizing the optical thickness of layers between an anode and a cathode is considered as a crucial factor for improving the device performance. For example, the formation of a capping layer on an electrode achieves increased luminous efficiency and high color purity.

Thus, there is a continued need to develop structures of organic electroluminescent devices optimized to improve their luminescent properties and new materials capable of supporting the optimized structures of organic electroluminescent devices.

DETAILED DESCRIPTION OF THE INVENTION

Problems to be Solved by the Invention

Therefore, the present invention intends to provide a highly efficient organic electroluminescent device using at least one polycyclic aromatic compound and including a capping layer.

Means for Solving the Problems

An organic electroluminescent device according to one aspect of the present invention has the following features:

(1) the organic electroluminescent device includes a first electrode, a second electrode opposite to the first electrode, and a light emitting layer interposed between the first and second electrodes;

(2) the organic electroluminescent device includes a capping layer formed on one of the surfaces of the first and second electrodes opposite to the light emitting layer;

(3) the light emitting layer includes a compound represented by Formula A-1 and/or A-2:

[Formula A-1]

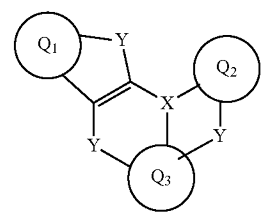

[Formula A-2]

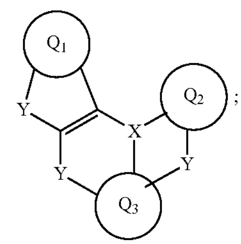

and (4) the capping layer includes a compound represented by Formula B:

[Formula B]

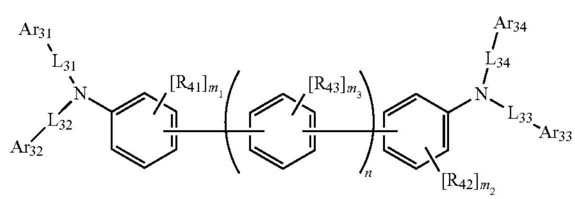

A description will be given concerning the structures of the compounds of Formula A-1, Formula A-2, and Formula B, the definitions of substituents in the compounds of Formula A-1, Formula A-2, and Formula B, specific examples of compounds that can be represented by Formula A-1, Formula A-2, and Formula B, and the organic electroluminescent device including the compound of Formula A-1 and/or A-2 and the compound of Formula B.

Effects of the Invention

The formation of the light emitting layer employing the polycyclic aromatic compound and the optional capping layer makes the organic electroluminescent device of the present invention highly efficient.

BEST MODE FOR CARRYING OUT THE INVENTION

The present invention will now be described in more detail.

An organic electroluminescent device of the present invention includes a first electrode, a second electrode opposite to the first electrode, a light emitting layer interposed between the first and second electrodes, and a capping layer formed on one of the surfaces of the first and second electrodes opposite to the light emitting layer.

In the present invention, the light emitting layer includes a compound represented by Formula A-1:

[Formula A-1]

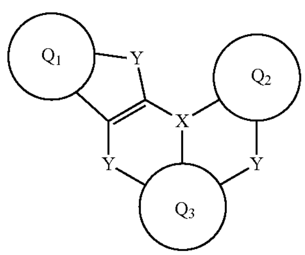

wherein $Q_1$ to $Q_3$ are identical to or different from each other and are each independently a substituted or unsubstituted $C_6$-$C_{50}$ aromatic hydrocarbon ring or a substituted or unsubstituted $C_2$-$C_{50}$ heteroaromatic ring, the linkers Y are identical to or different from each other and are each independently selected from N—$R_1$, $CR_2R_3$, O, S, Se, and $SiR_4R_5$, X is selected from B, P, P═S, and P═O, and $R_1$ to $R_5$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that each of $R_1$ to $R_5$ is optionally bonded to $Q_1$, $Q_2$ or $Q_3$ to form an alicyclic or aromatic monocyclic or polycyclic ring, $R_2$ and $R_3$ are optionally linked to each other to form an alicyclic or aromatic monocyclic or polycyclic ring, and $R_3$ and $R_4$ are optionally linked to each other to form an alicyclic or aromatic monocyclic or polycyclic ring, and/or a compound represented by Formula A-2:

[Formula A-2]

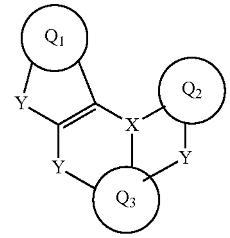

wherein $Q_1$, $Q_2$, $Q_3$, X, and Y are as defined in Formula A-1.

In the present invention, the capping layer includes a compound represented by Formula B:

[Formula B]

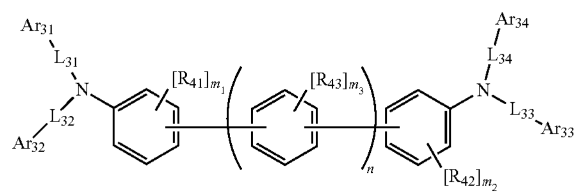

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

According to one embodiment of the present invention, the compound of Formula A-1 or A-2 may have a polycyclic aromatic skeletal structure represented by Formula A-3, A-4, A-5 or A-6:

[Formula A-3]

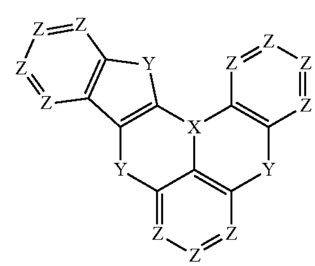

wherein each Z is independently CR or N, the substituents R are identical to or different from each other and are independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the substituents R are optionally bonded to each other or are optionally linked to other adjacent substituents to form alicyclic or aromatic monocyclic or polycyclic rings whose carbon atoms are optionally substituted with one or more heteroatoms selected from N, S, and O atoms, and X and Y are as defined in Formulae A-1 and A-2,

[Formula A-4]

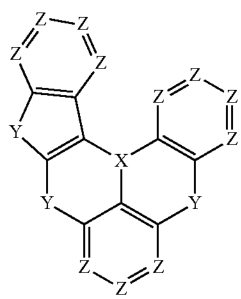

wherein X, Y, and Z are as defined in Formula A-3,

[Formula A-5]

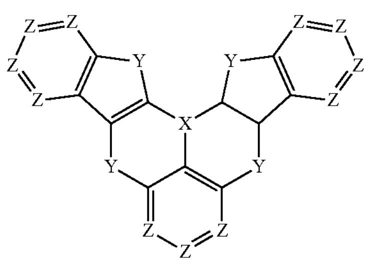

wherein X, Y, and Z are as defined in Formula A-3,

[Formula A-6]

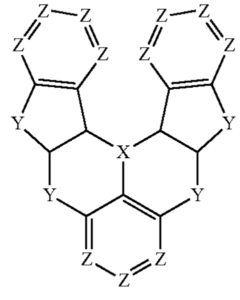

wherein X, Y, and Z are as defined in Formula A-3.

The use of the skeletal structure meets desired requirements of the light emitting layer of the organic electroluminescent device, achieving high efficiency of the device.

According to one embodiment of the present invention, at least one of $Ar_{31}$ to $Ar_{34}$ in Formula B is represented by Formula C:

[Formula C]

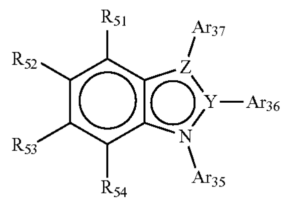

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula B.

As used herein, the term "substituted" in the definition of the substituents in the compounds of Formulae A-1, A-2, and B and various substituents in various compounds described below indicates substitution with one or more substituents selected from the group consisting of deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and terphenyl groups. Examples of the polycyclic aryl groups include naphthyl, anthracenyl, phenanthrenyl, pyrenyl, perylenyl, tetracenyl, chrysenyl, fluorenyl, acenaphthacenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isooxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group, but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, and arylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl groups in the arylamine groups may be monocyclic or polycyclic ones. The arylamine groups may include two or more aryl groups. In this case, the aryl groups may be monocyclic aryl groups or polycyclic aryl groups. Alternatively, the aryl groups may consist of a monocyclic aryl group and a polycyclic aryl group. The aryl groups in the arylamine groups may be selected from those exemplified above.

The aryl groups in the aryloxy group and the arylthioxy group are the same as those described above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the compound of Formula A-1 or A-2 used in the organic electroluminescent device of the present invention may be selected from the following compounds:

-continued
1
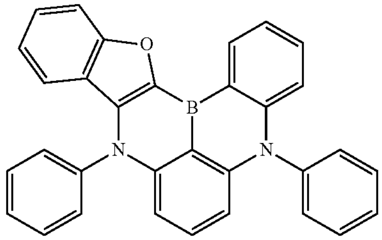
2
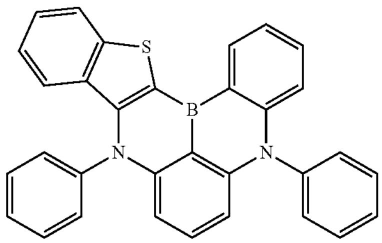
3
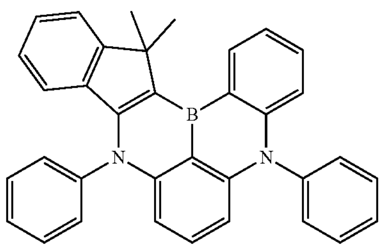
4
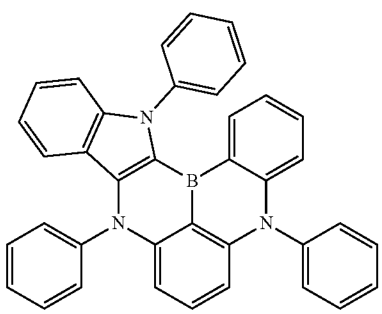
5
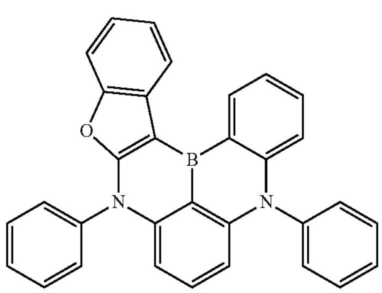
6
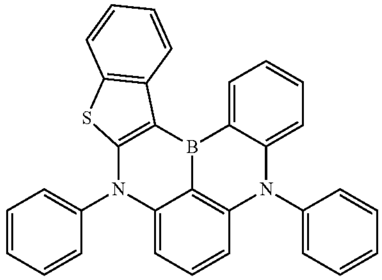
7
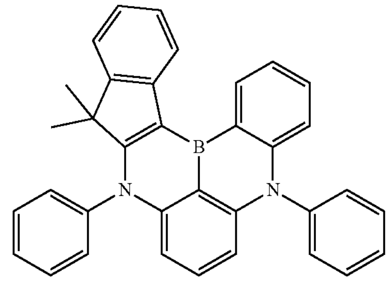
8
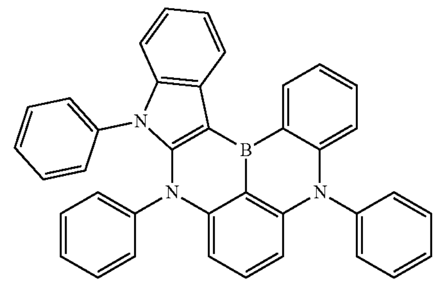
9
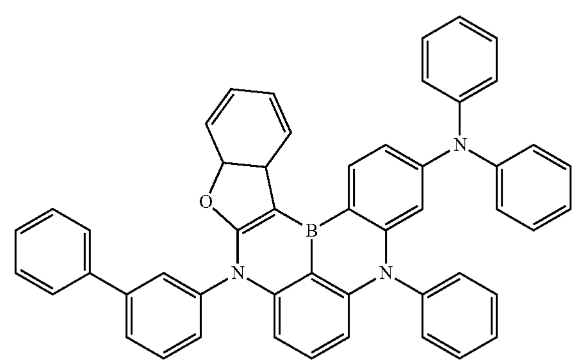
10
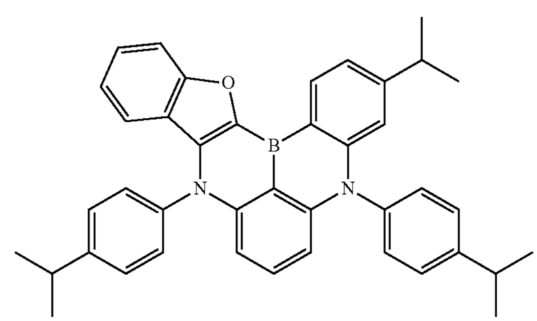
11
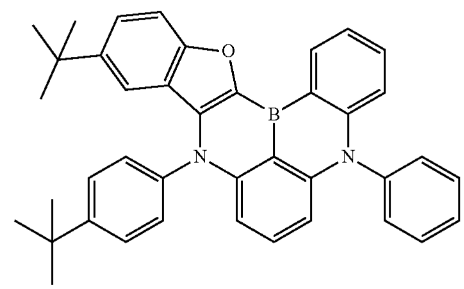

-continued
12
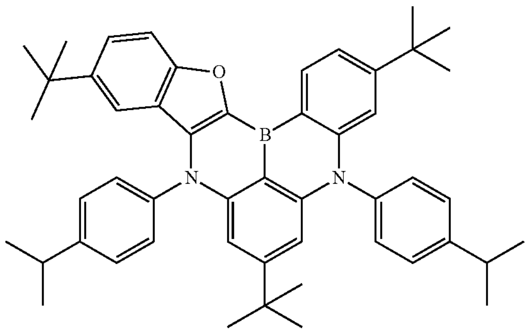
13
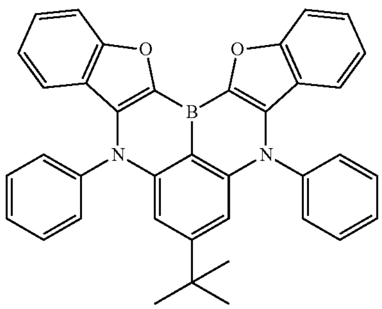
14
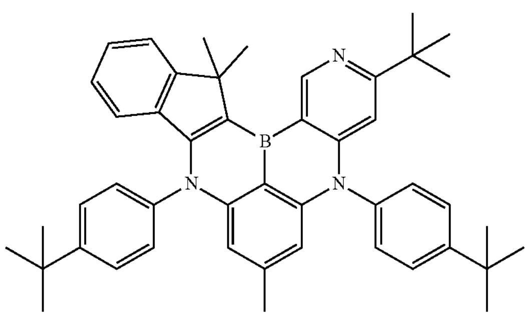
15
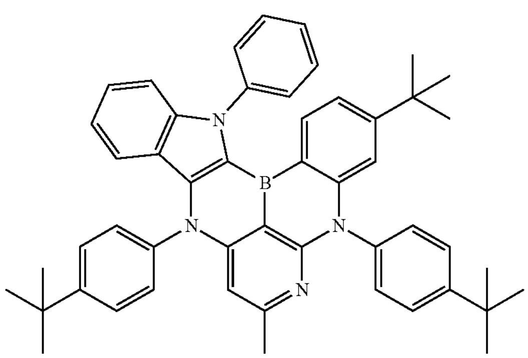
-continued
16
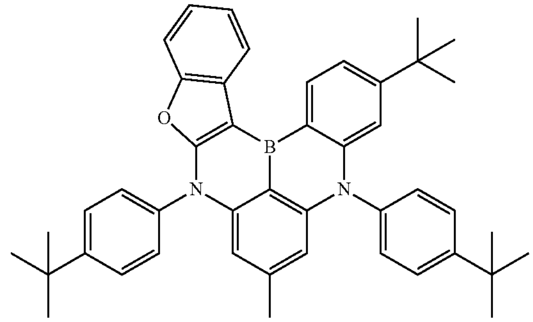
17
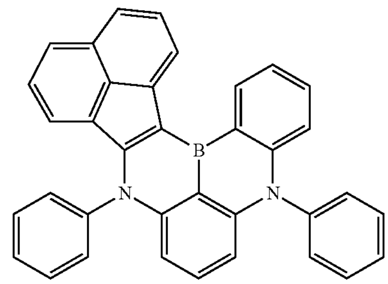
18
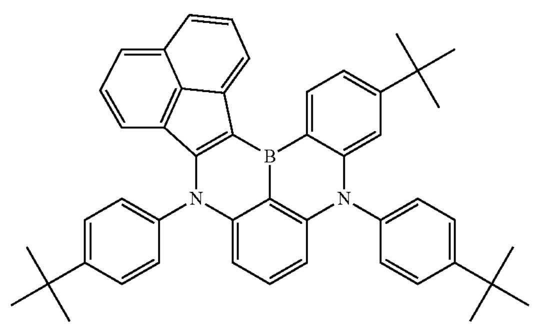
19
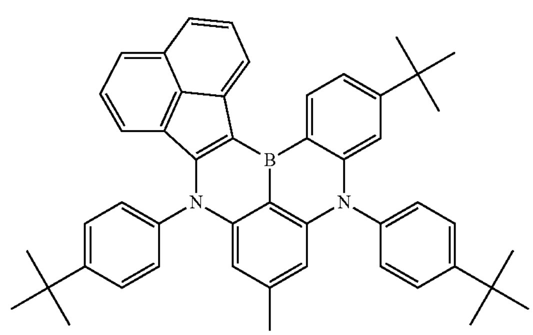

-continued
20
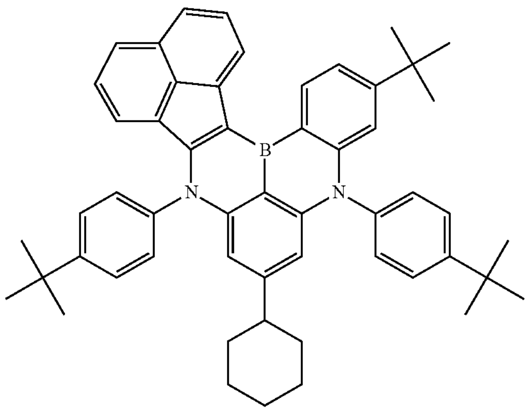
21
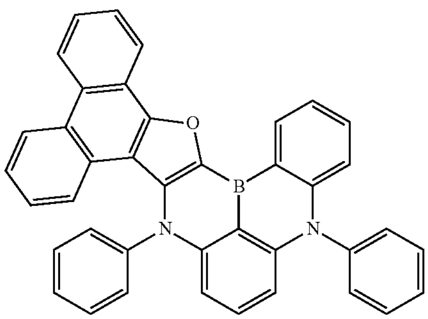
22
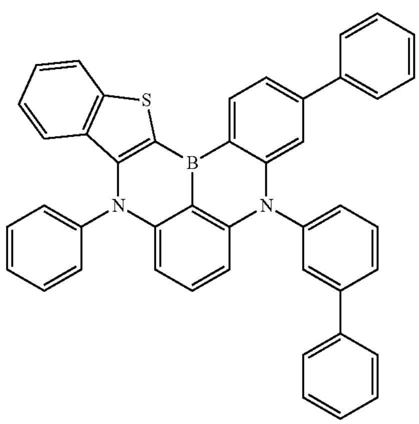
23
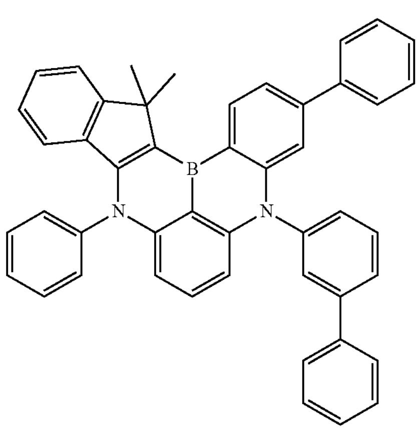
-continued
24
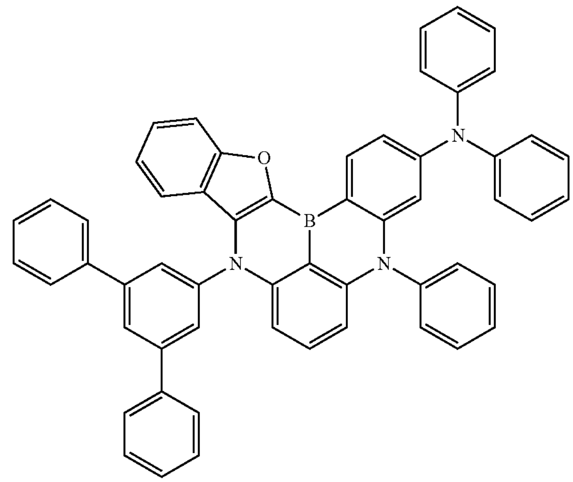
25
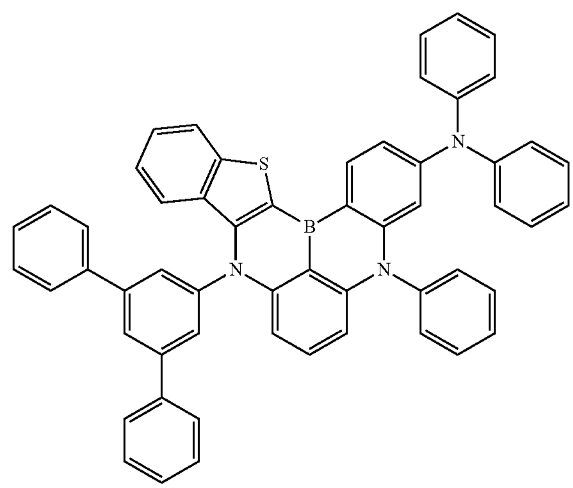
26
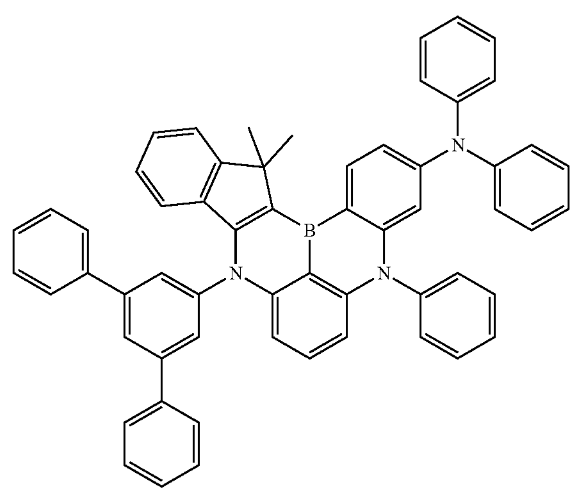

-continued
27
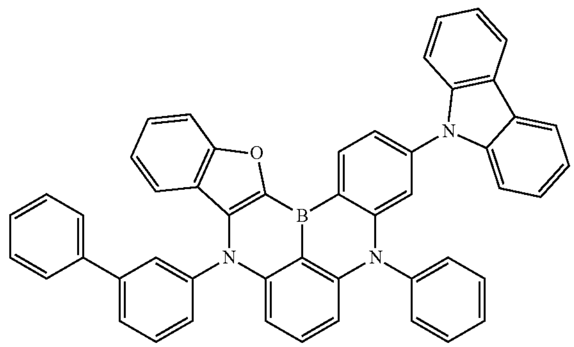
28
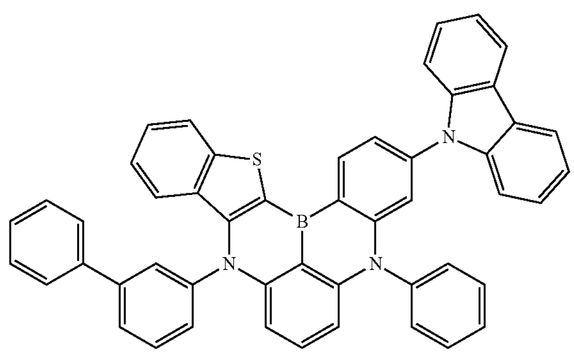
29
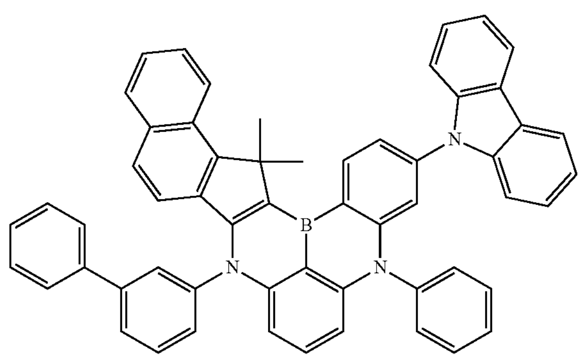
30
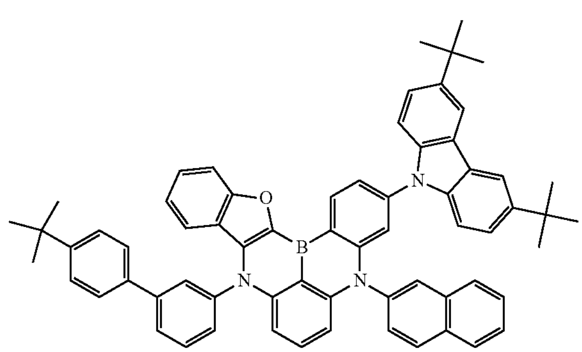
-continued
31
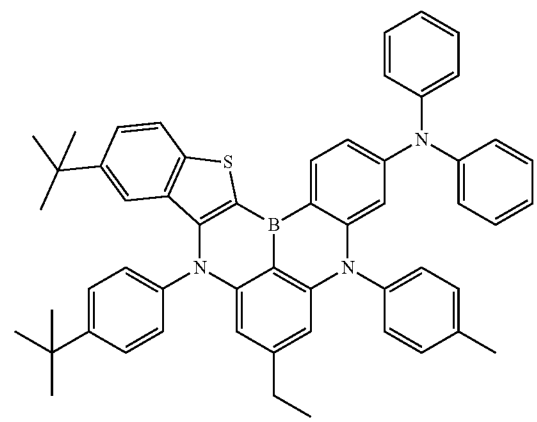
32
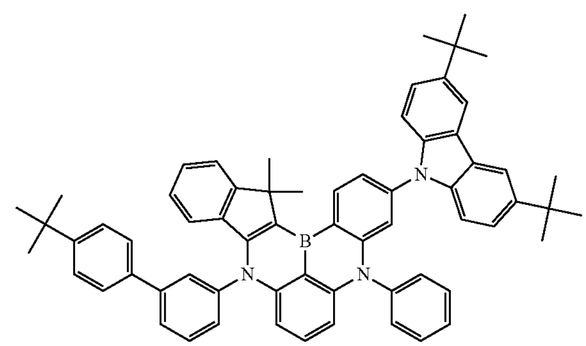
33
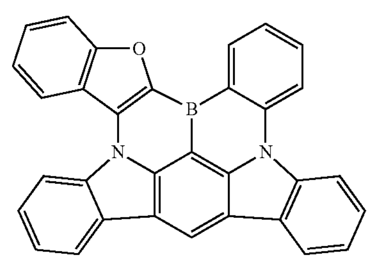
34
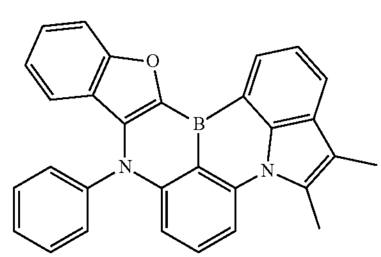
35
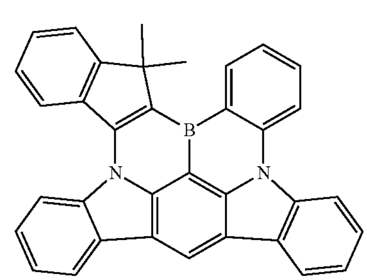

36
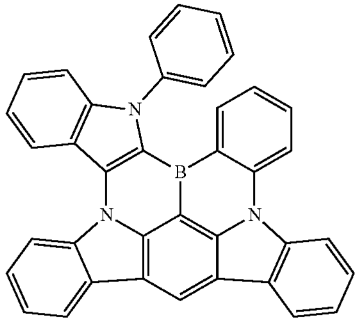
37
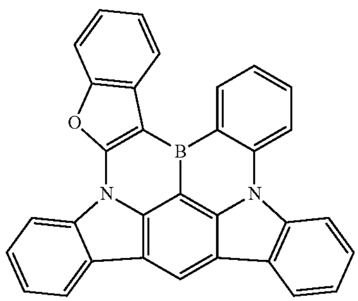
38
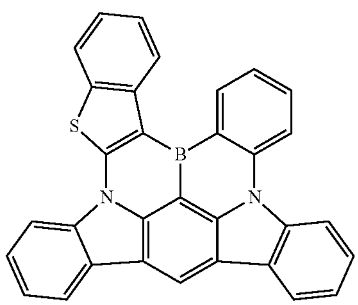
39
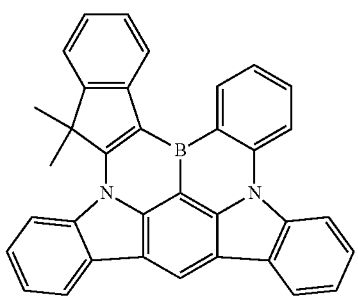
40
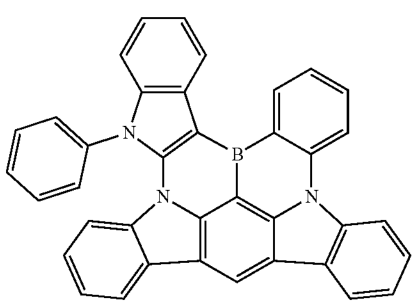
41
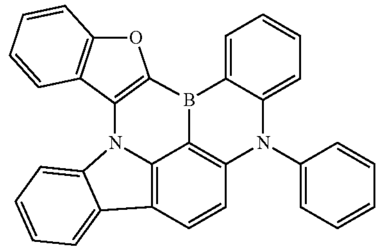
42
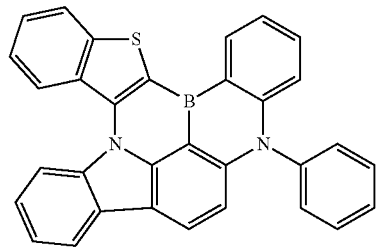
43
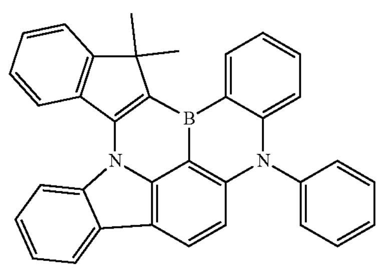
44
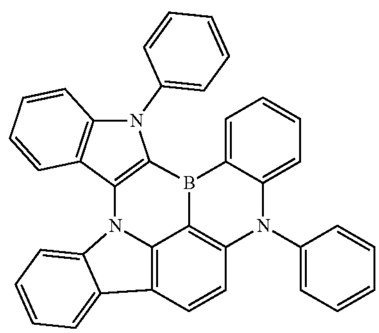
45
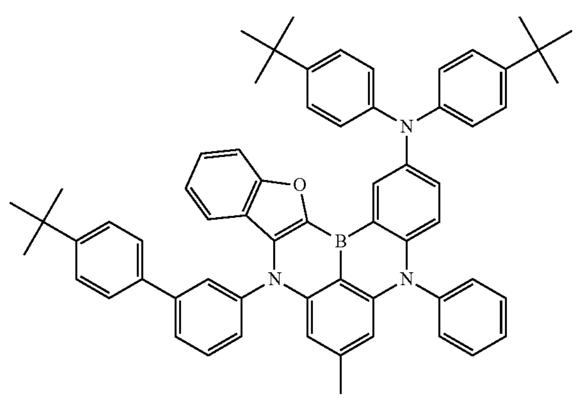

-continued
46
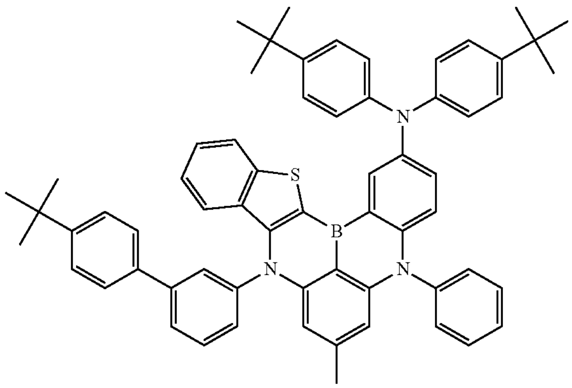
47
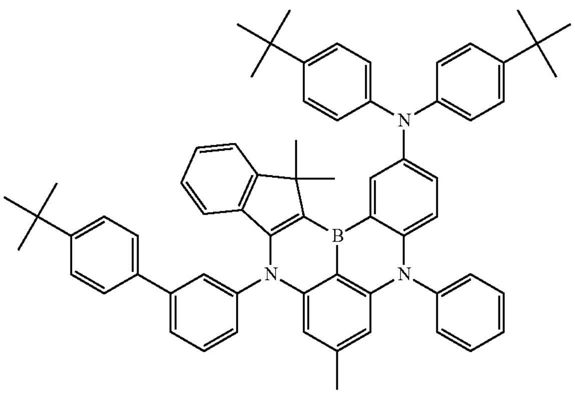
48
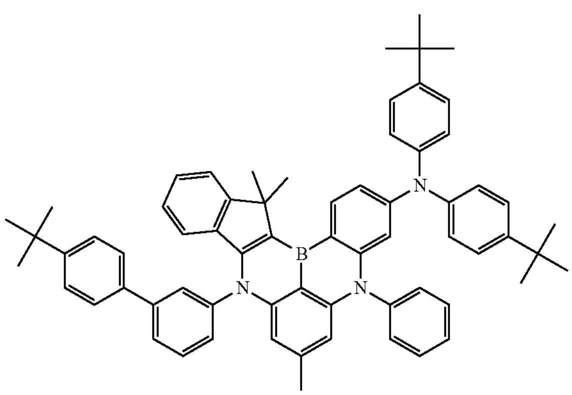
49
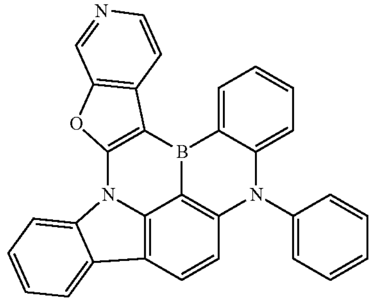
-continued
50
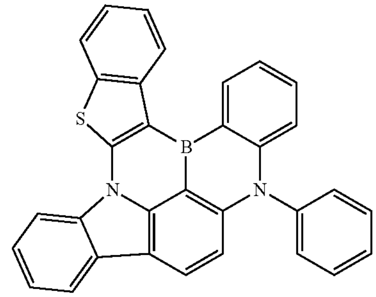
51
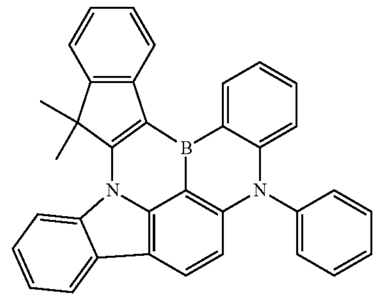
52
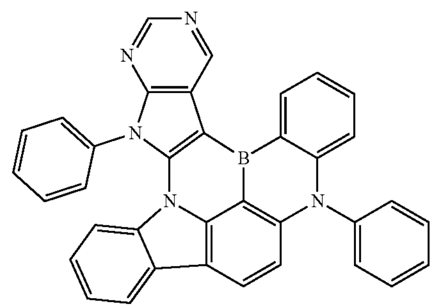
53
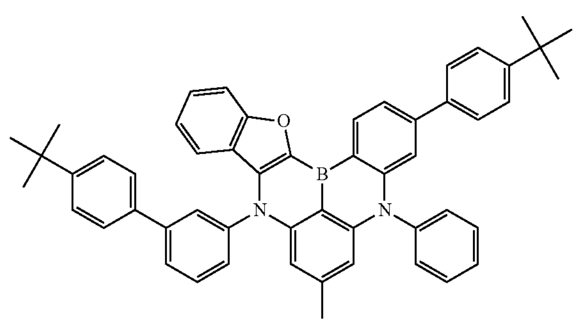
54
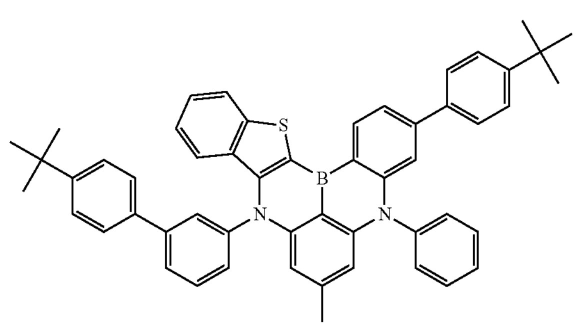

-continued
55
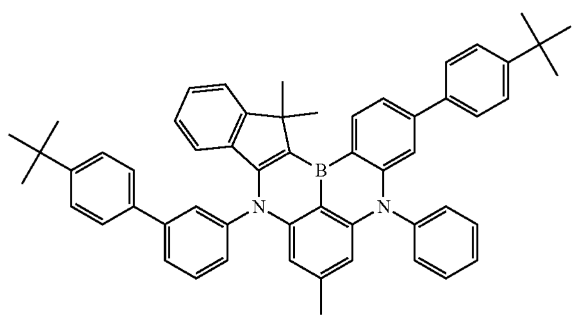
56
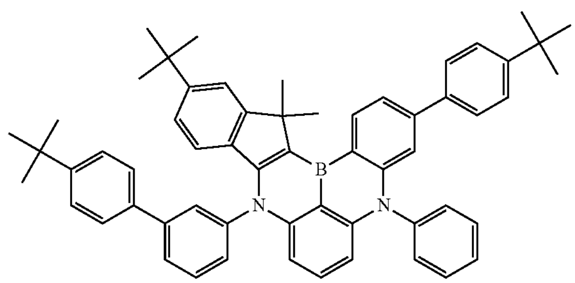
57
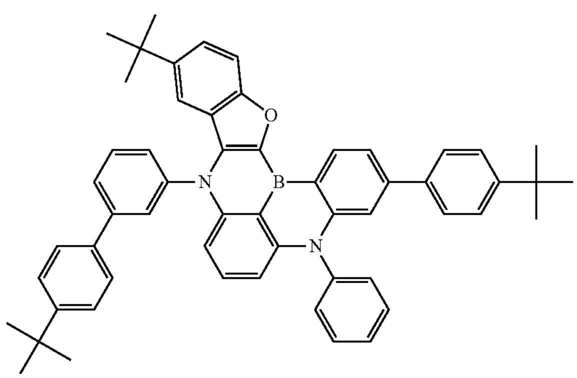
58
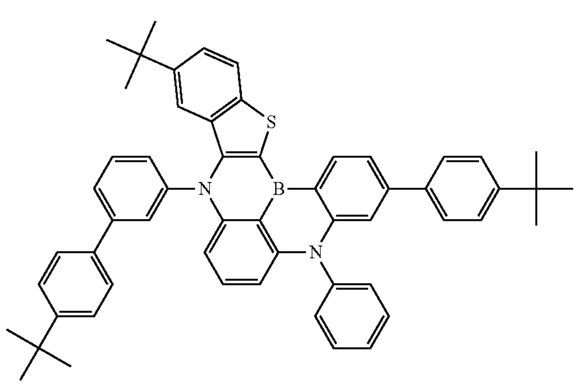
-continued
59
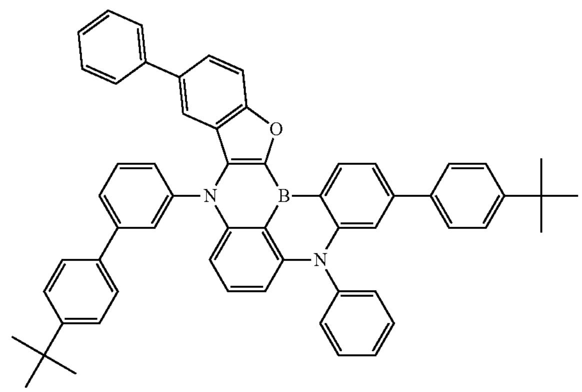
60
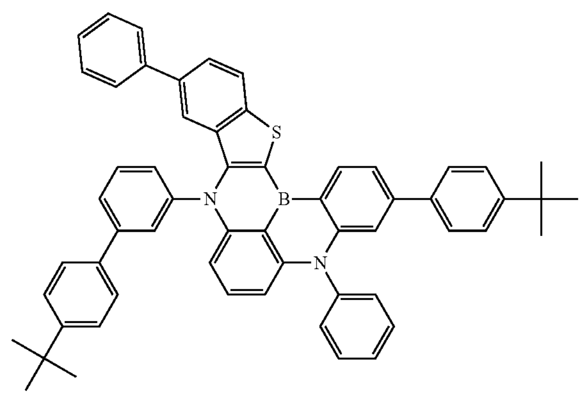
61
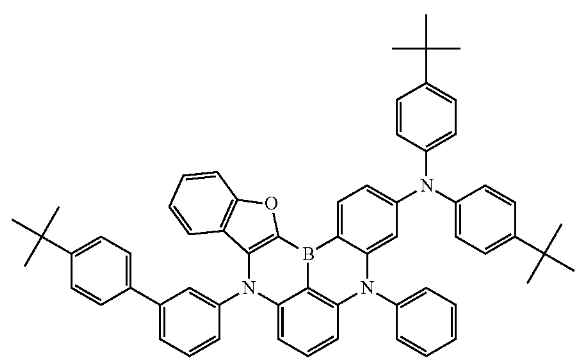
62
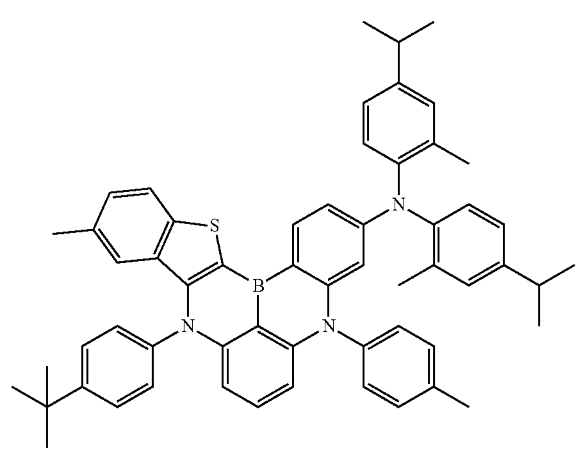

-continued
63
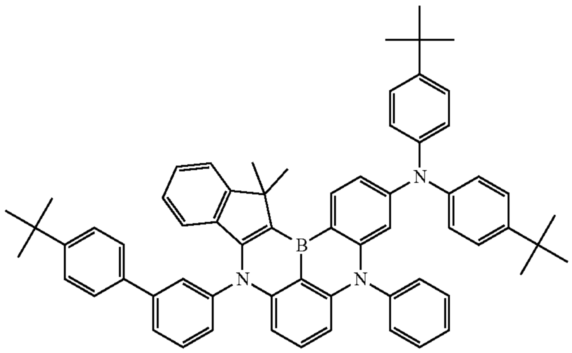
64
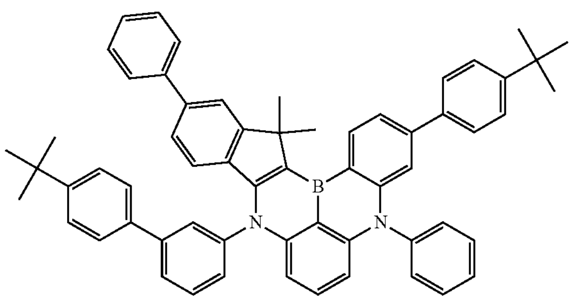
65
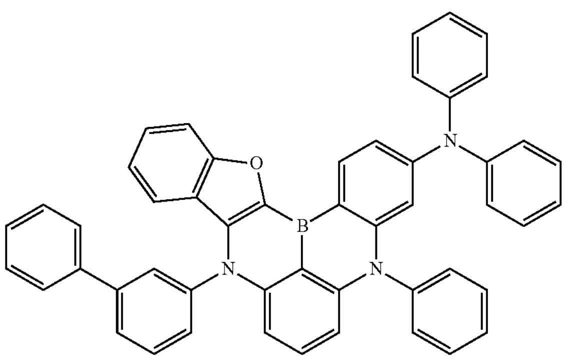
66
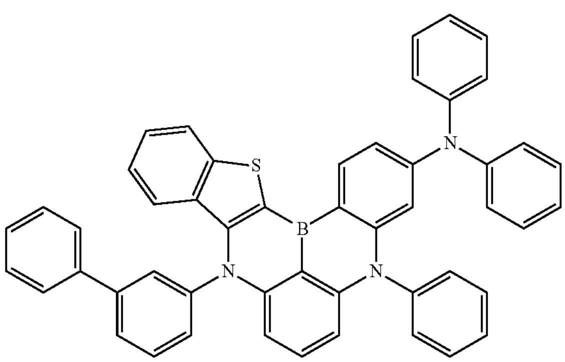
-continued
67
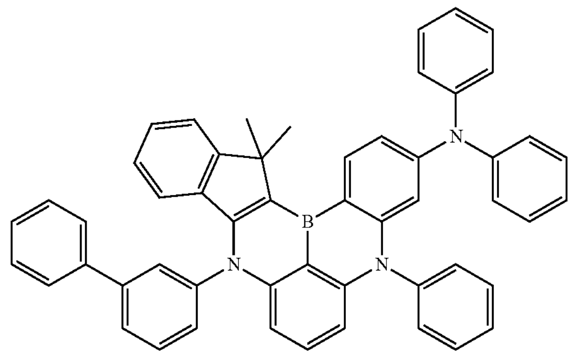
68
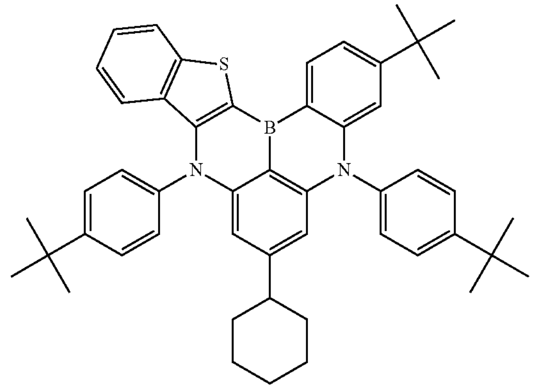
69
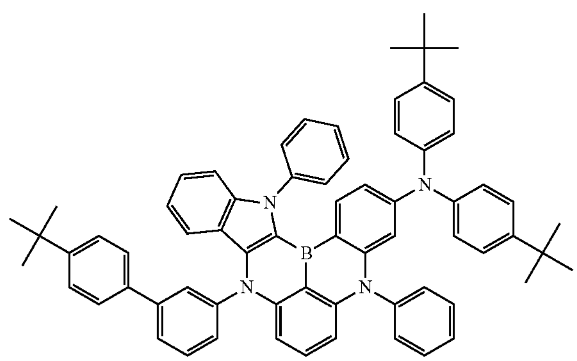
70
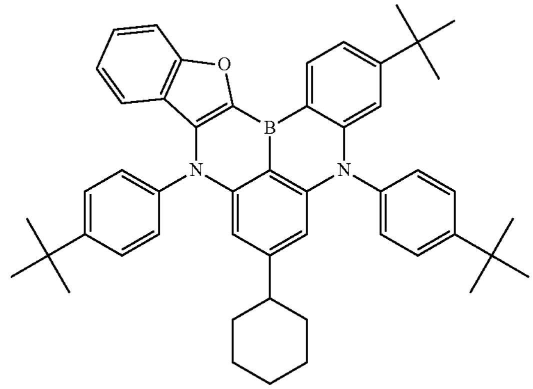

71
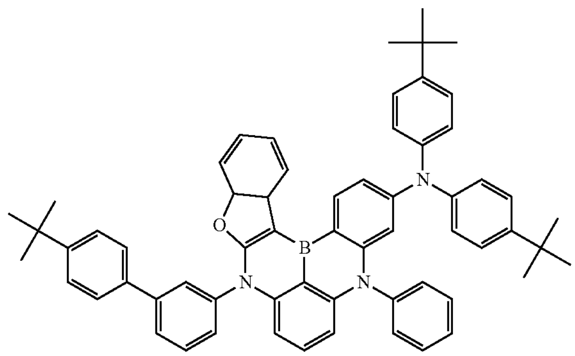
72
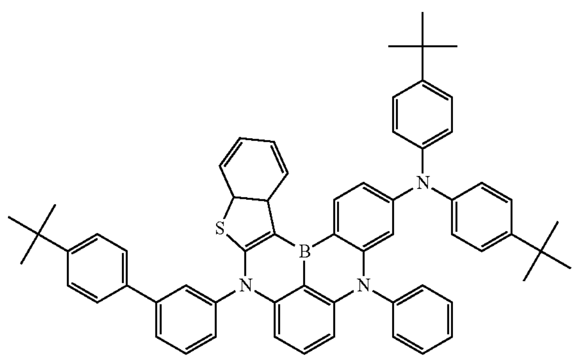
73
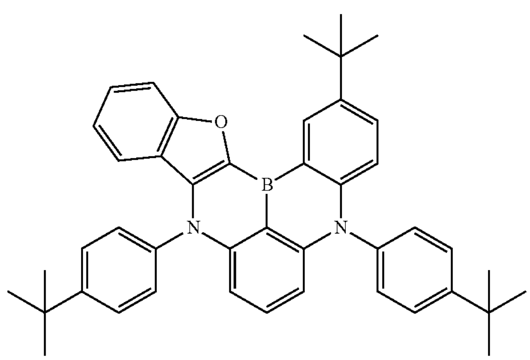
74
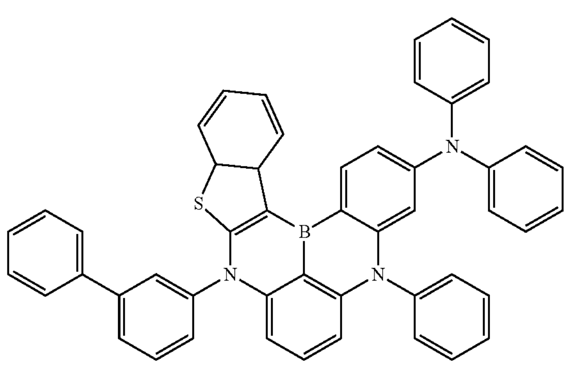
75
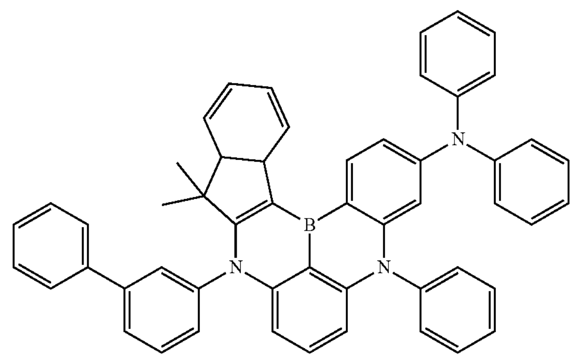
76
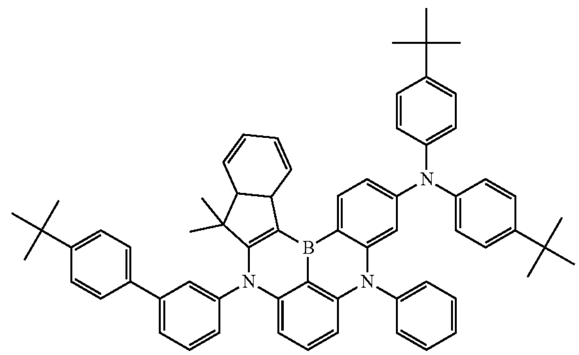
77
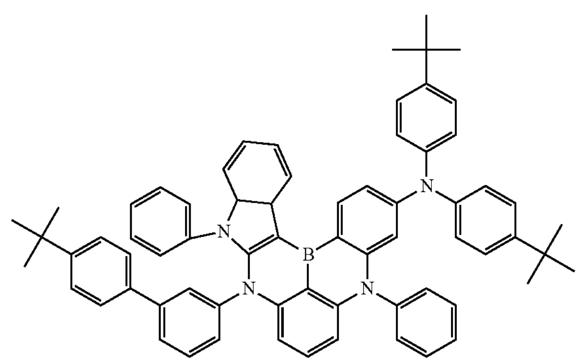
78
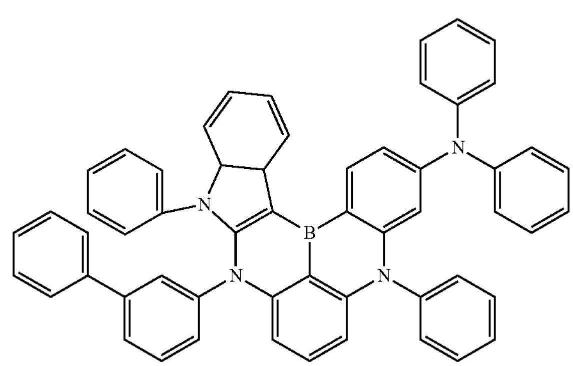

-continued
79
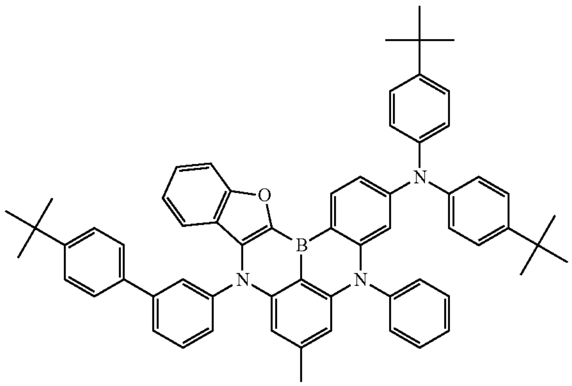
80
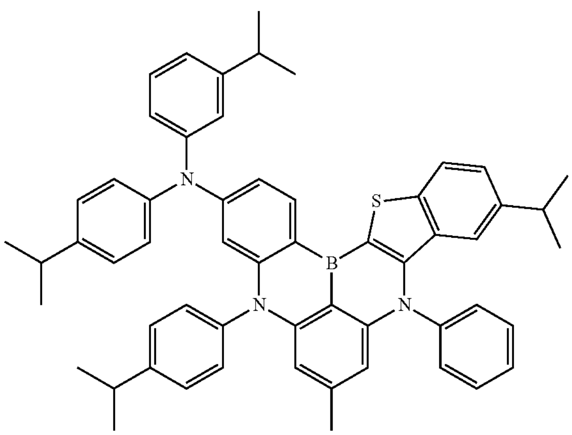
81
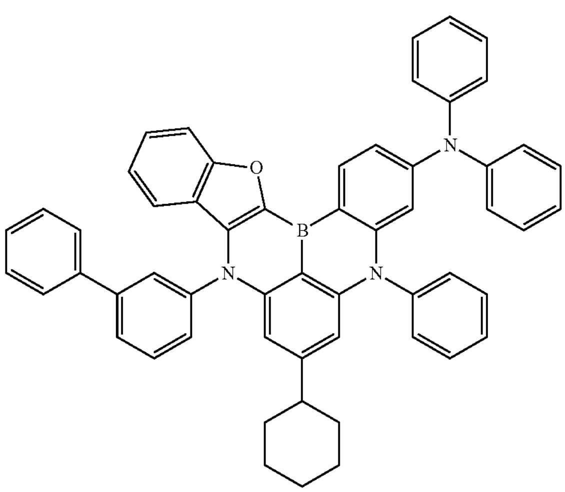
-continued
82
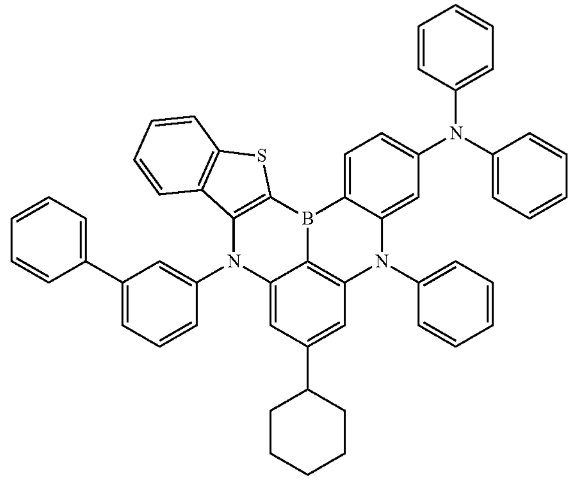
83
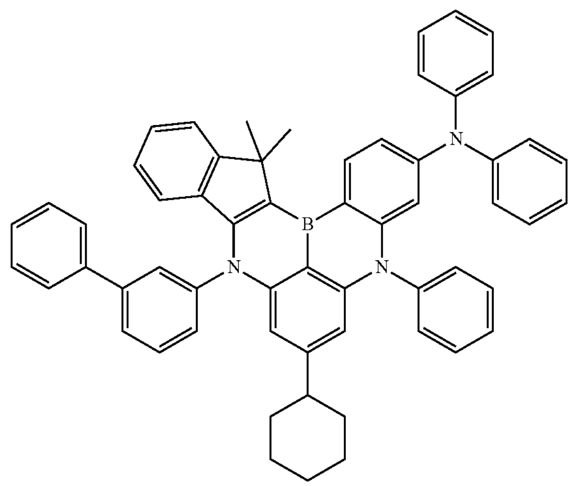
84
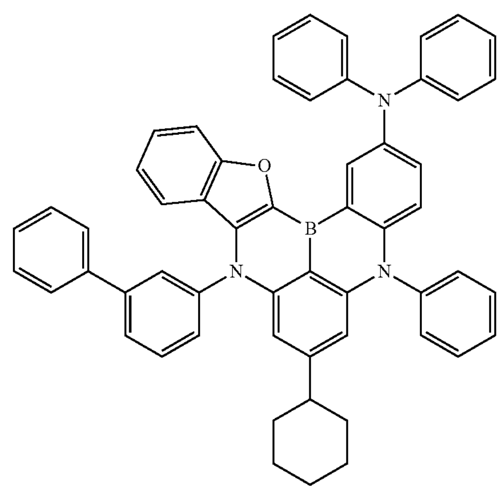

-continued
85
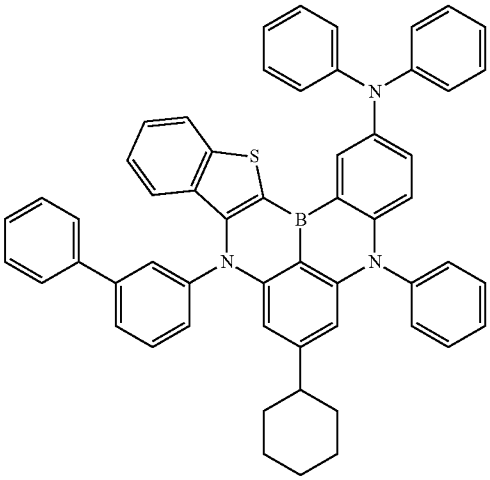
86
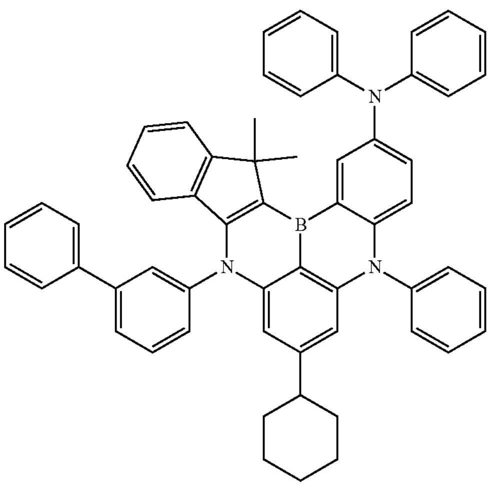
87
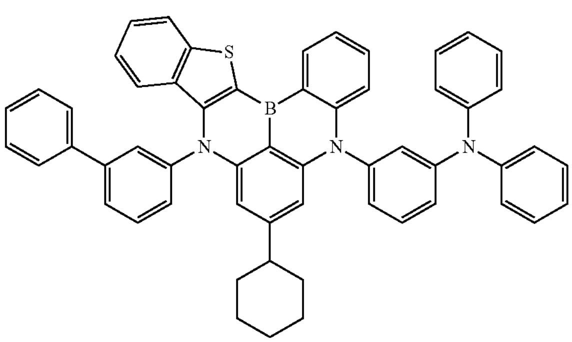
-continued
88
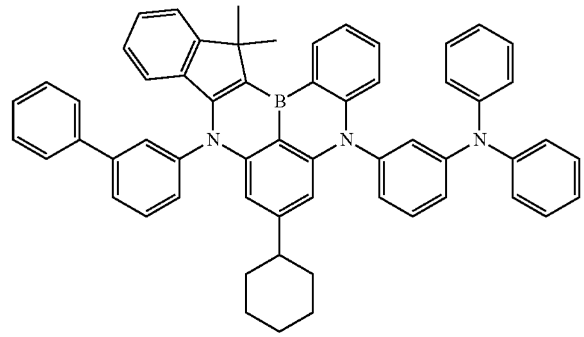
89
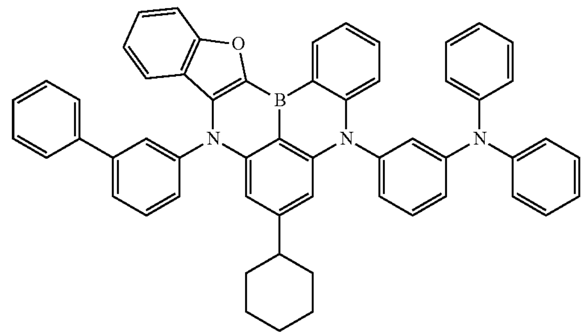
90
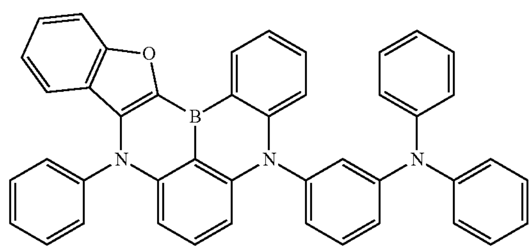
91
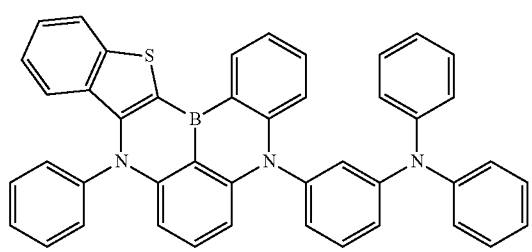
92
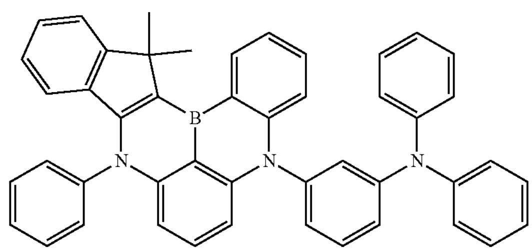

-continued
93
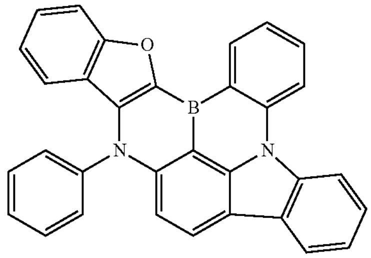
94
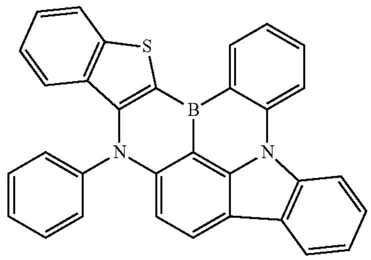
95
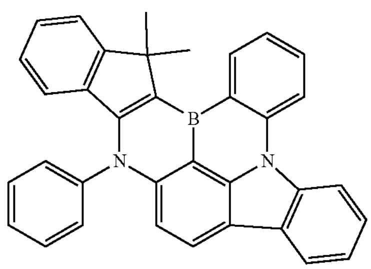
96
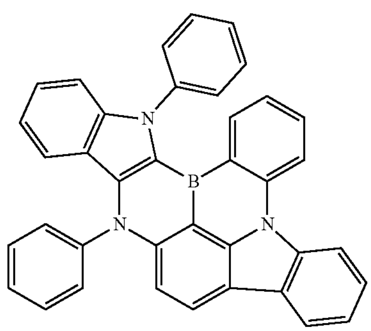
97
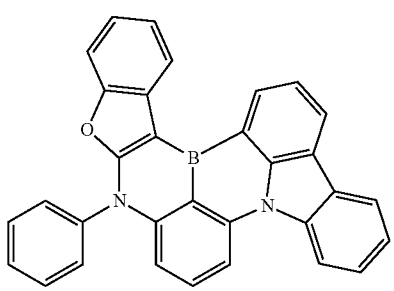
-continued
98
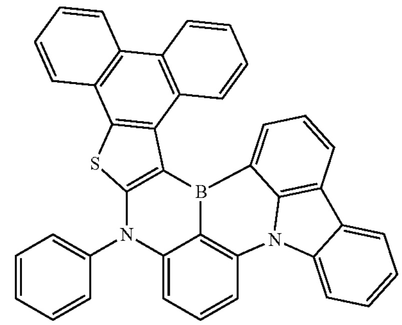
99
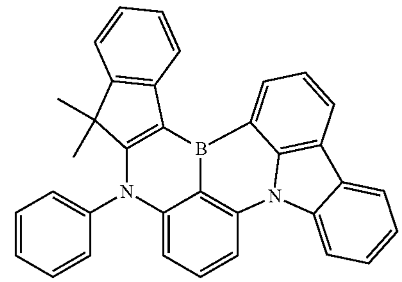
100
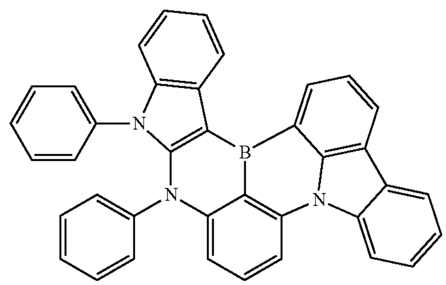
101
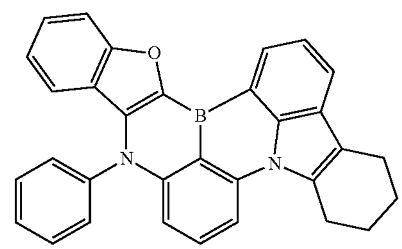
102
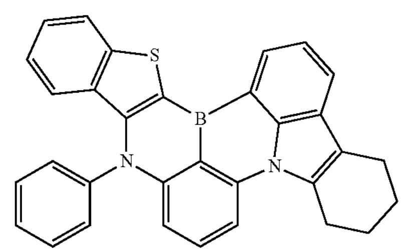
103
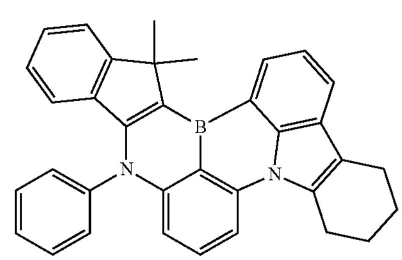

-continued
104
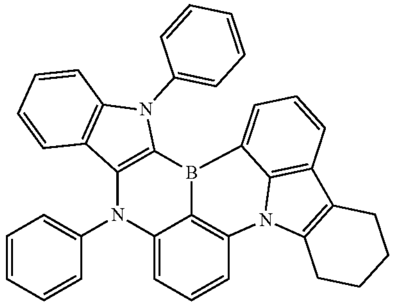
105
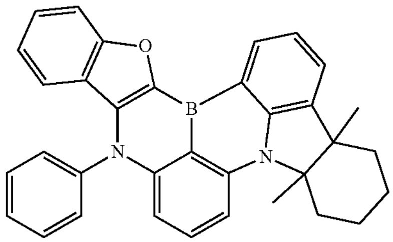
106
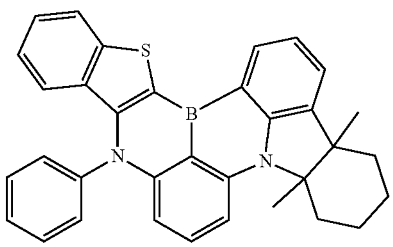
107
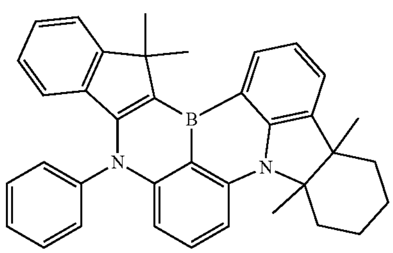
108
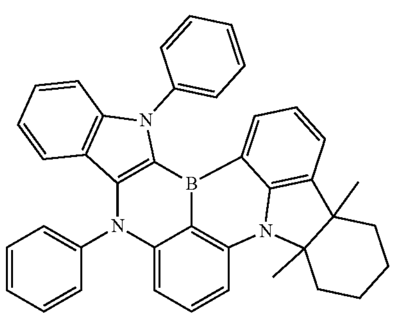
109
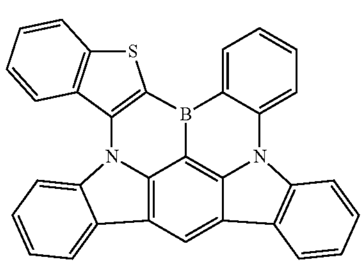
-continued
110
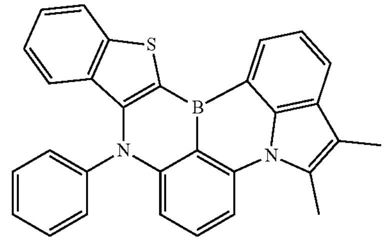
111
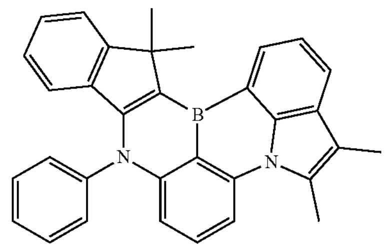
112
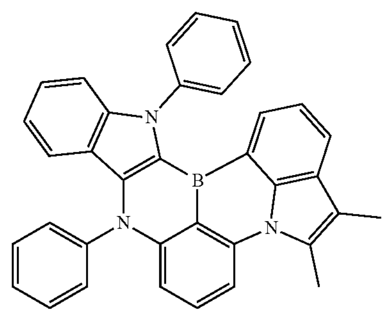
113
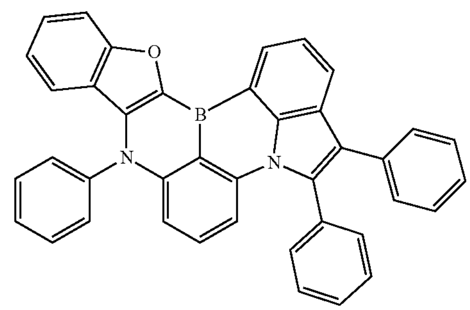
114
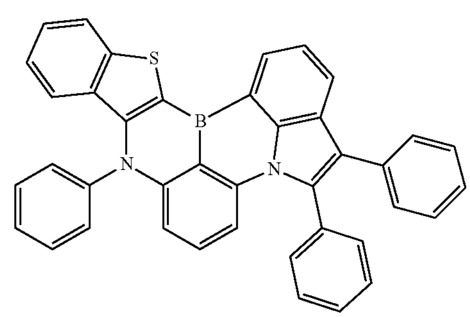

-continued
115
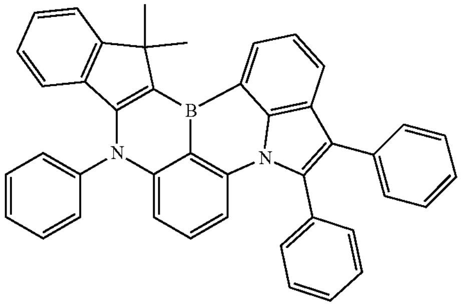
116
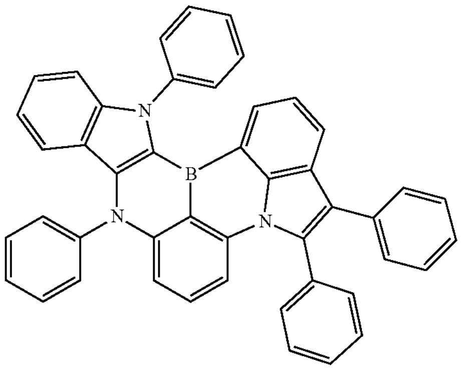
117
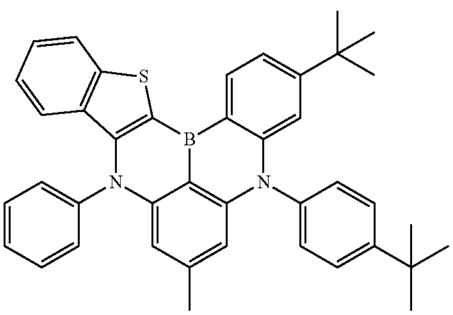
118
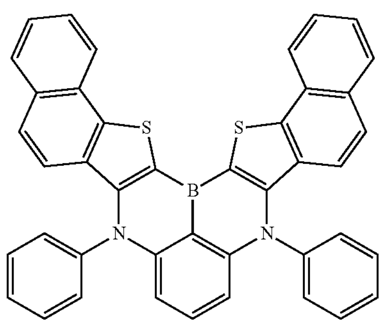
119
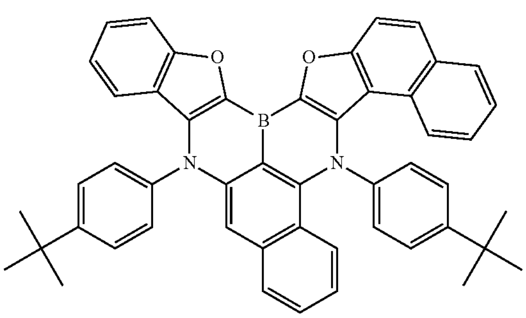
-continued
120
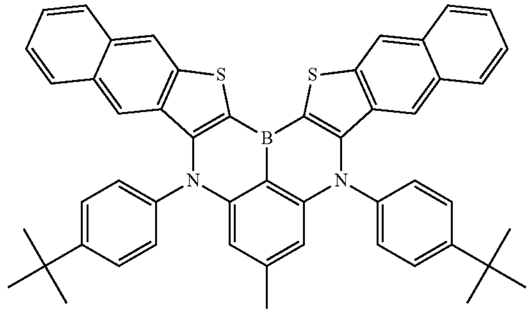
121
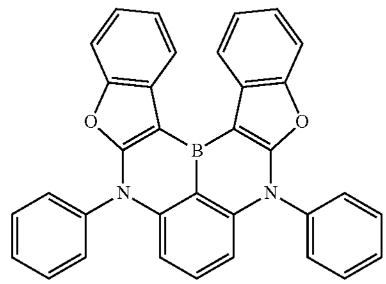
122
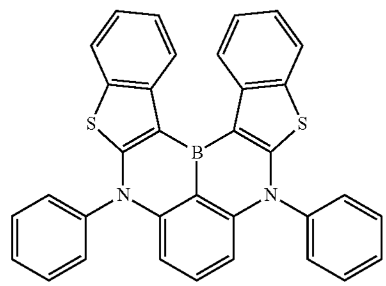
123
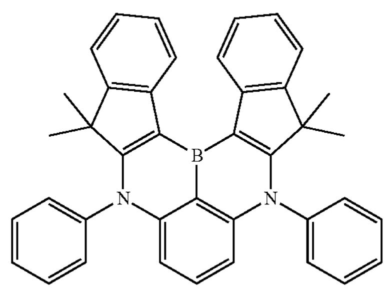
124
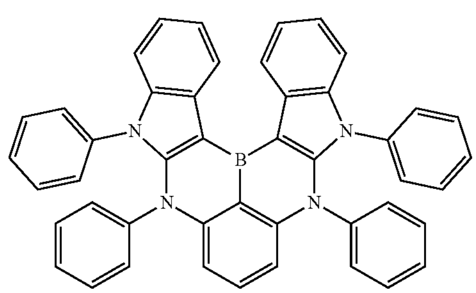

-continued
125
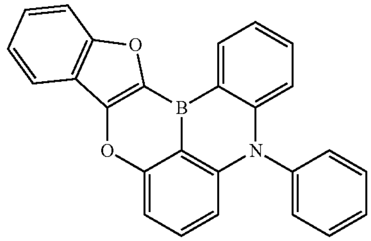
126
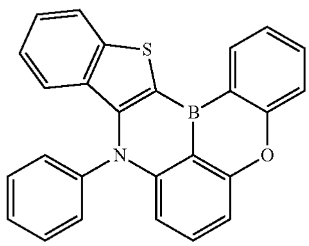
127
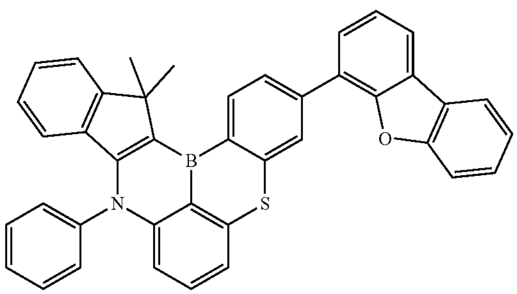
128
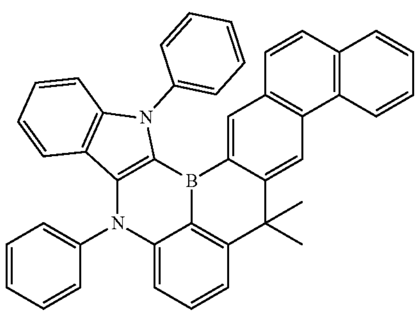
129
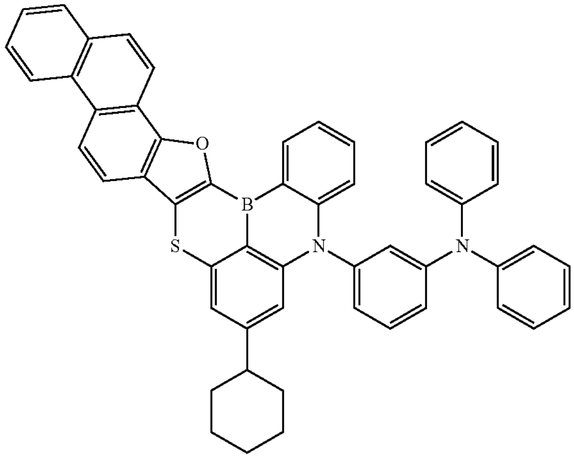
-continued
130
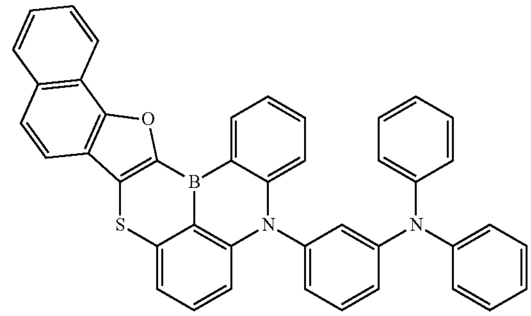
131
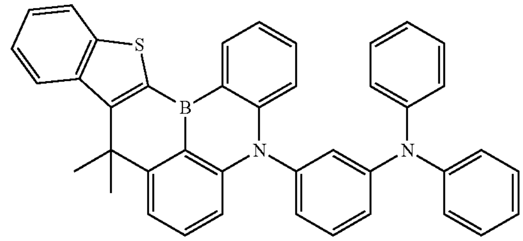
132
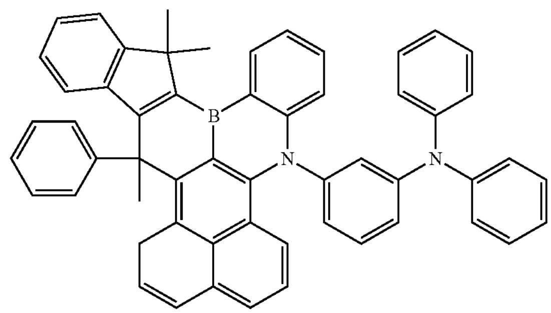
133
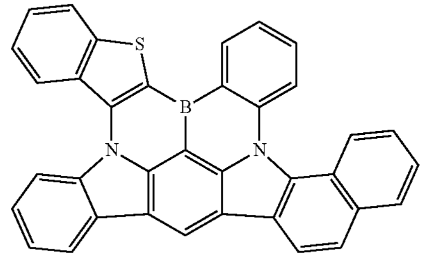
134
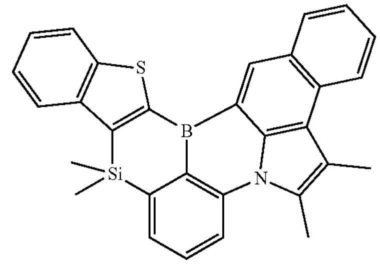

-continued
135
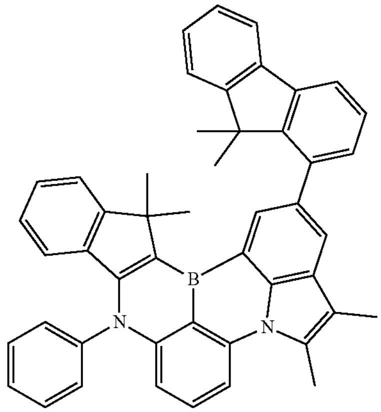
136
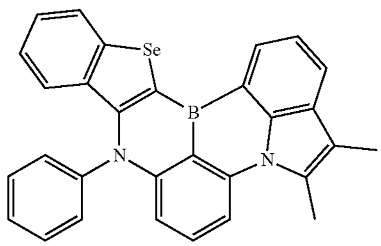
137
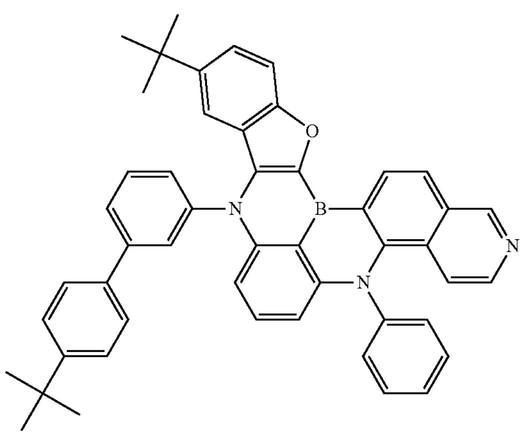
138
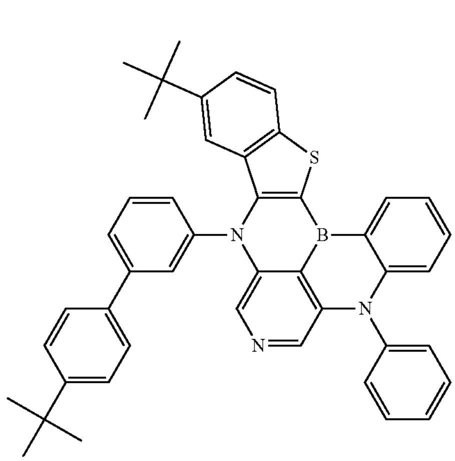
-continued
139
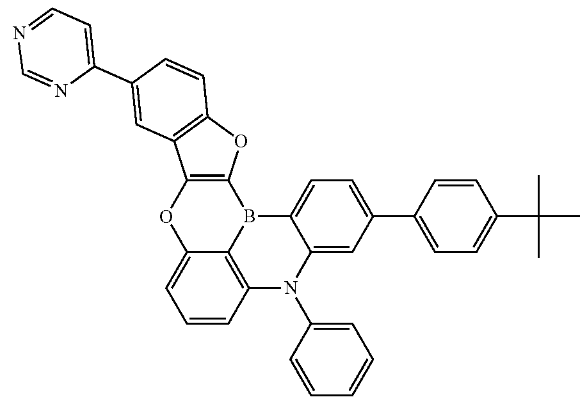
140
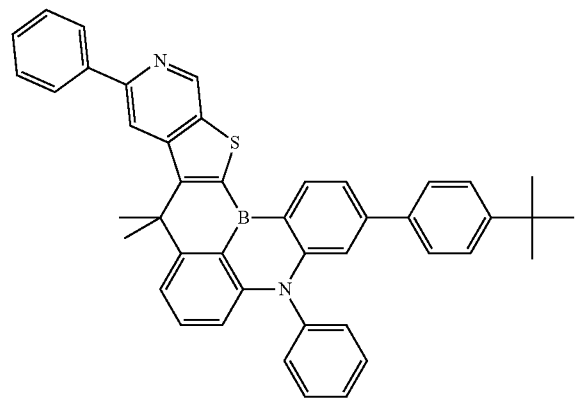
141
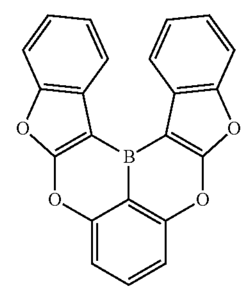
142
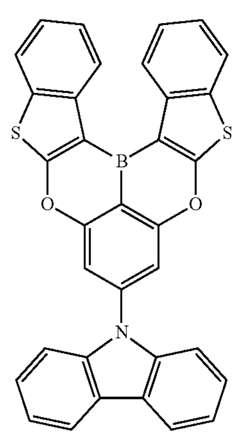

143
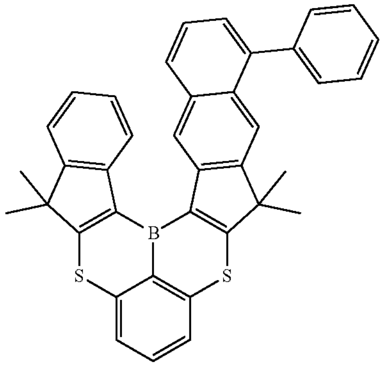
144
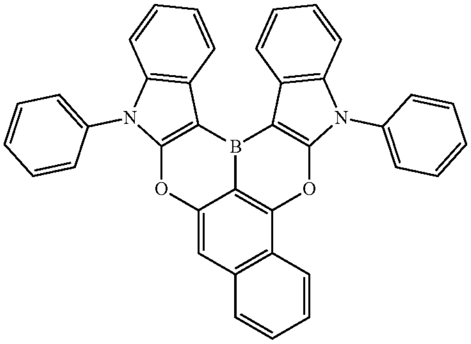
145
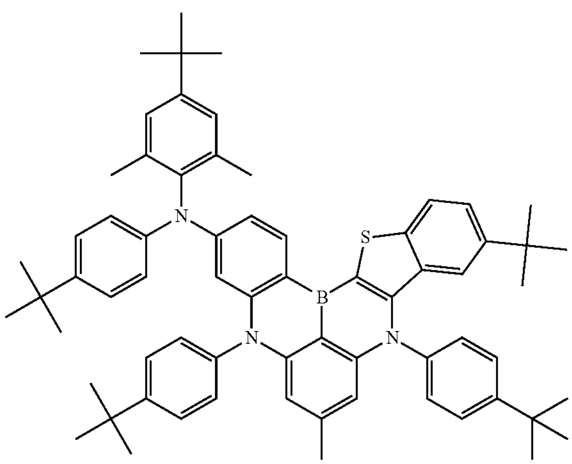
146
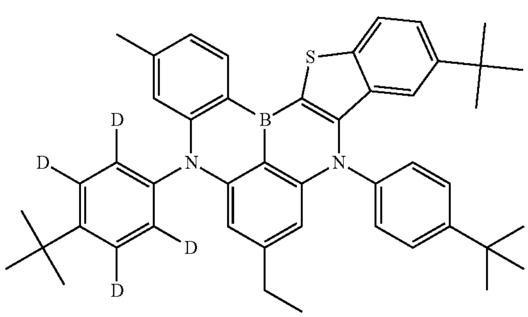
147
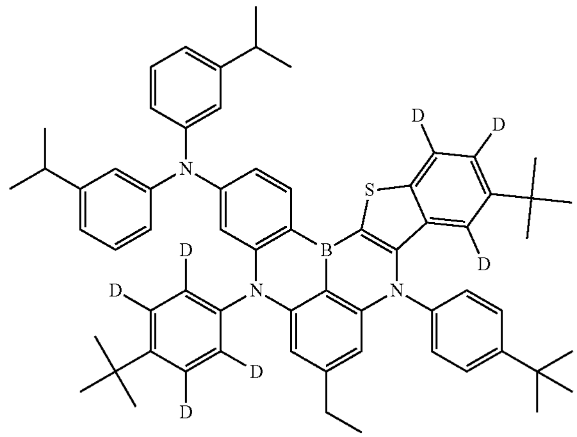
148
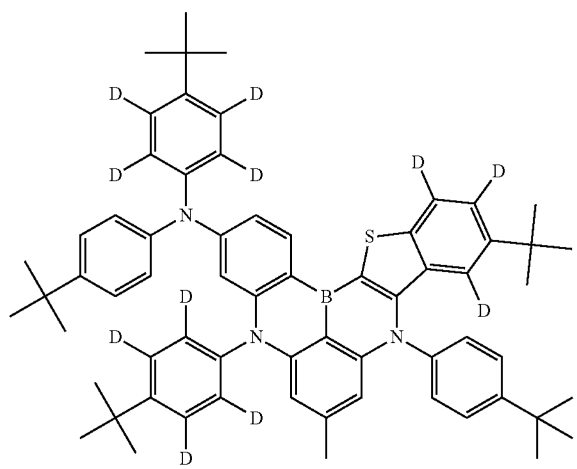
149
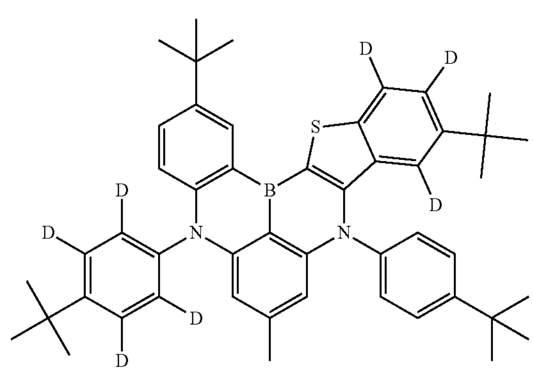

-continued
150
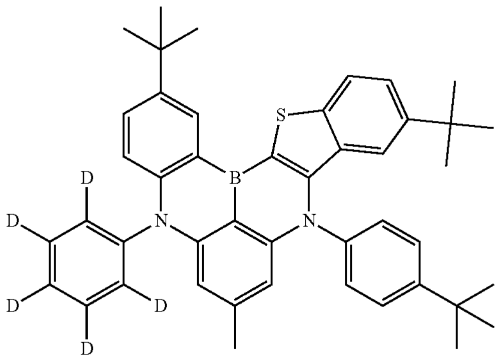
151
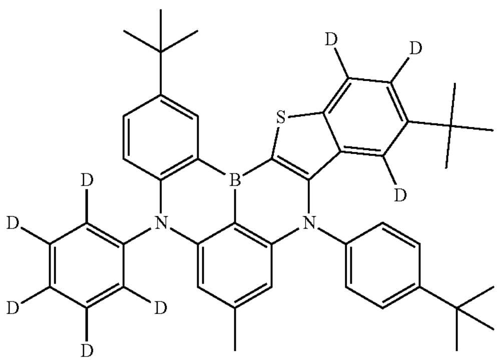
152
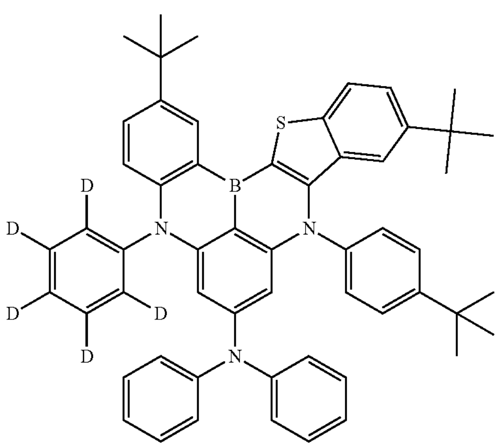
153
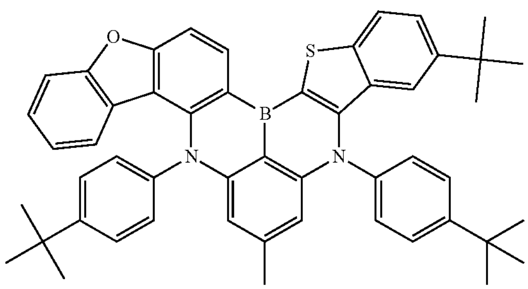
-continued
154
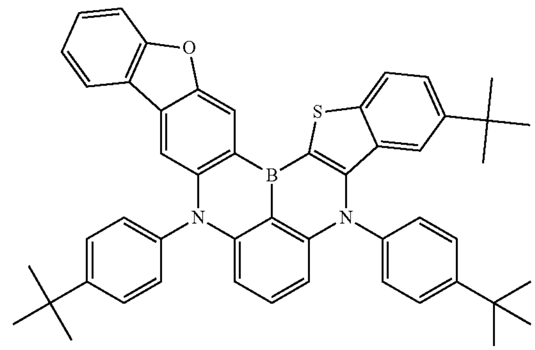
155
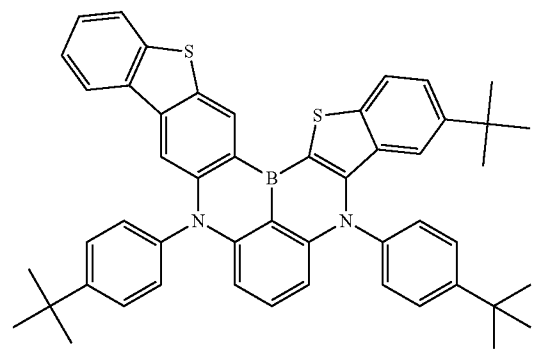
156
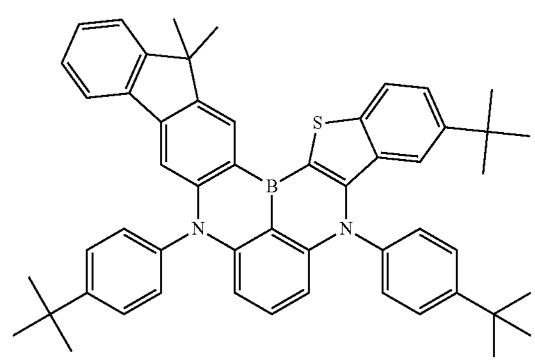
157
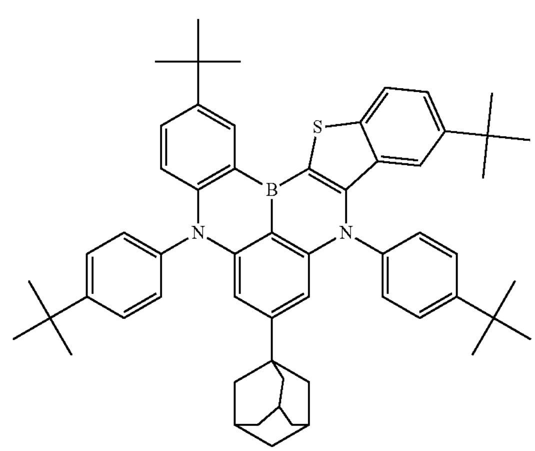

158
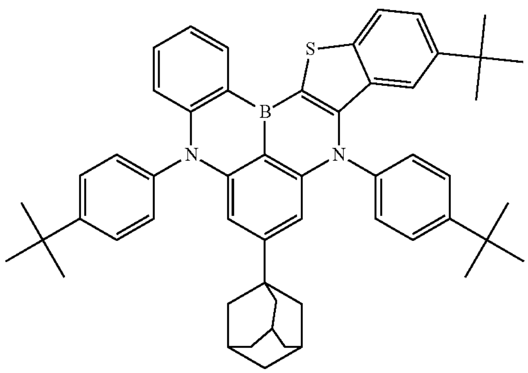
159
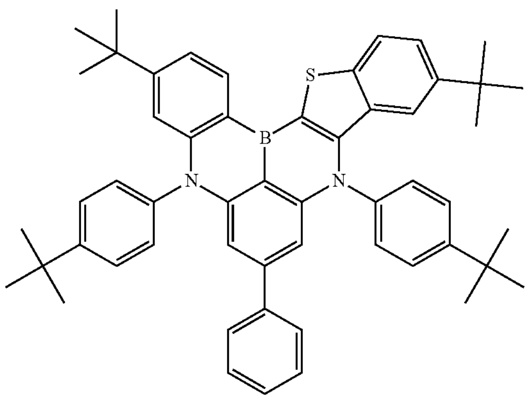
160
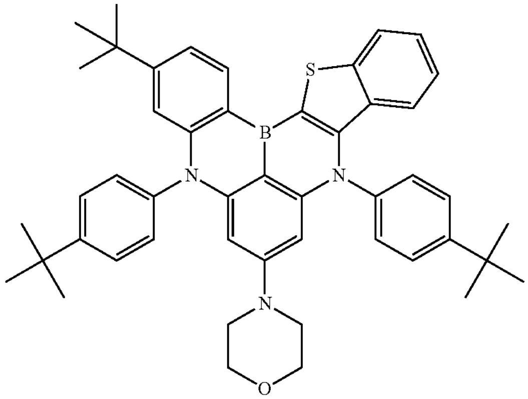
161
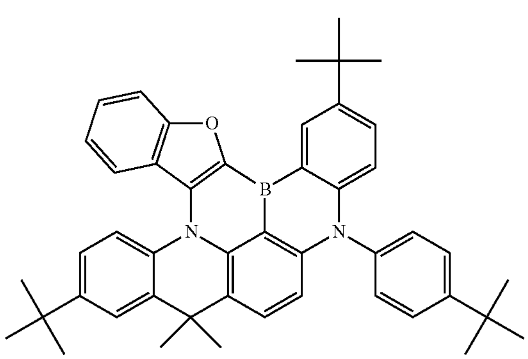
162
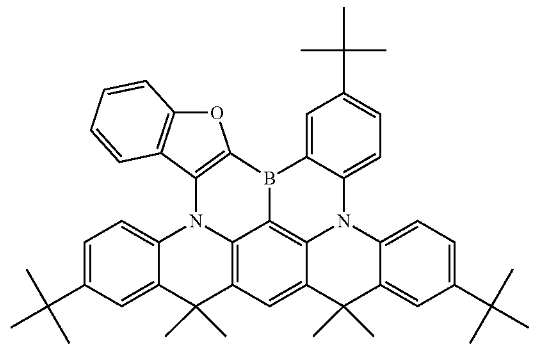
163
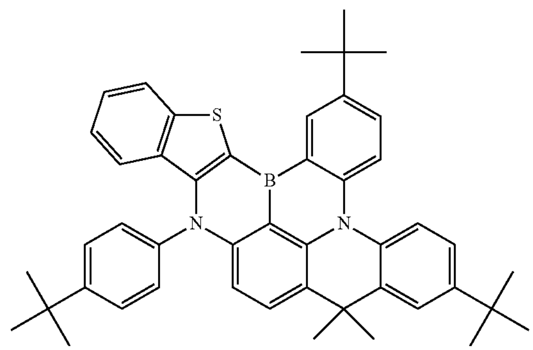
164
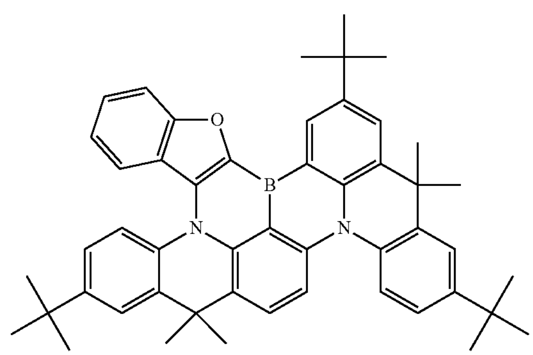
165
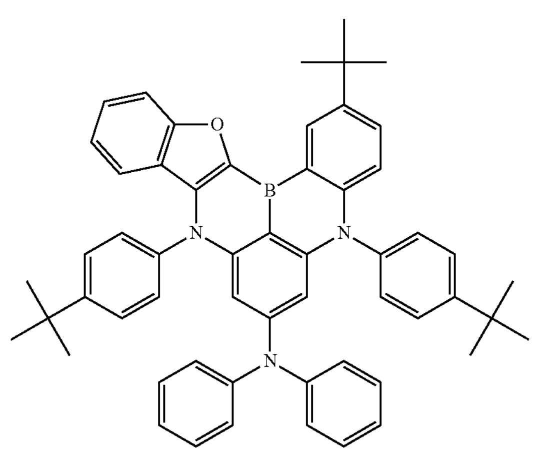

-continued
166
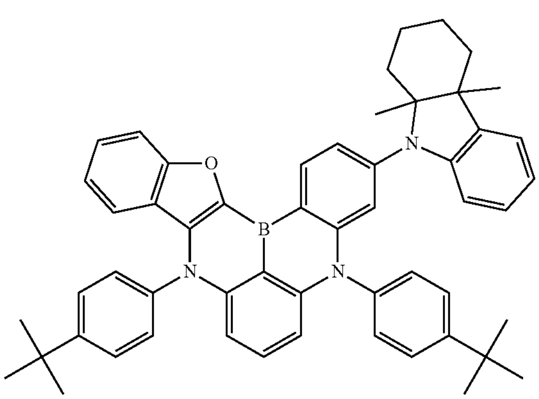
167
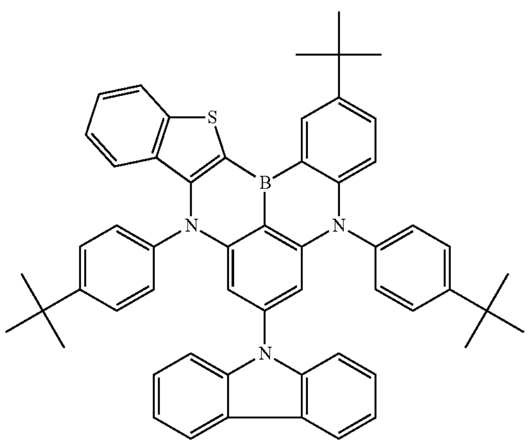
168
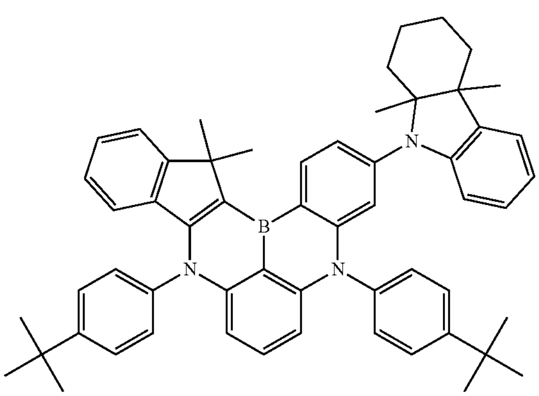
169
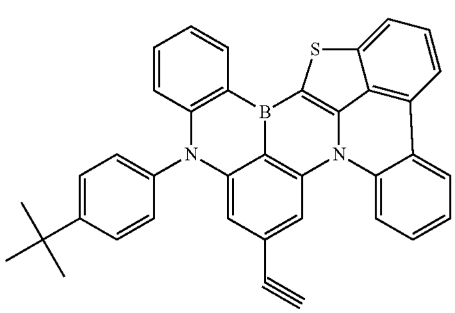
-continued
170
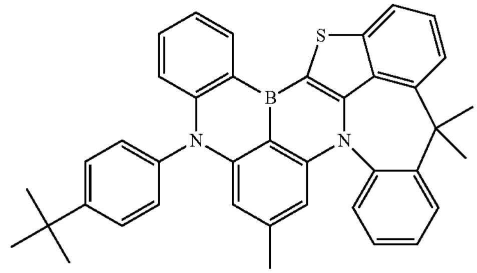
171
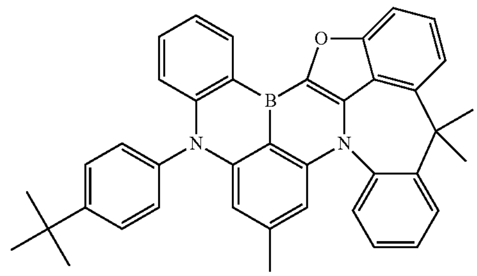
172
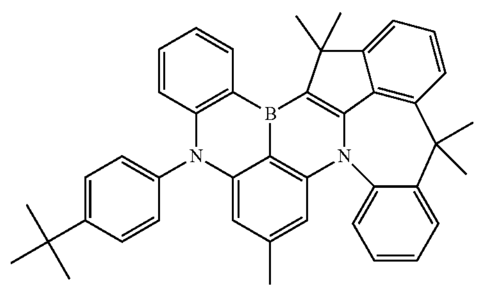
173
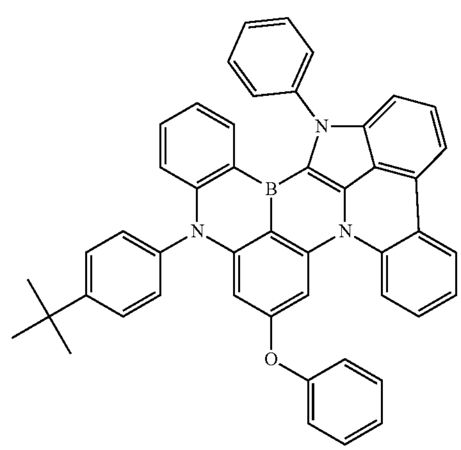

-continued
174
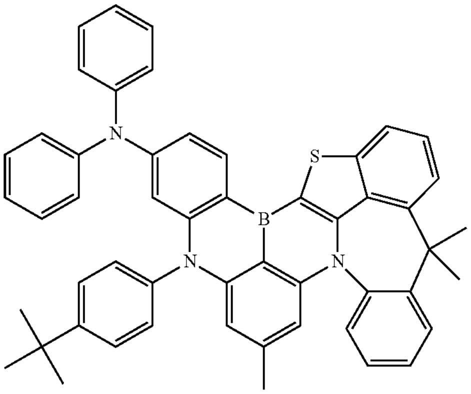
175
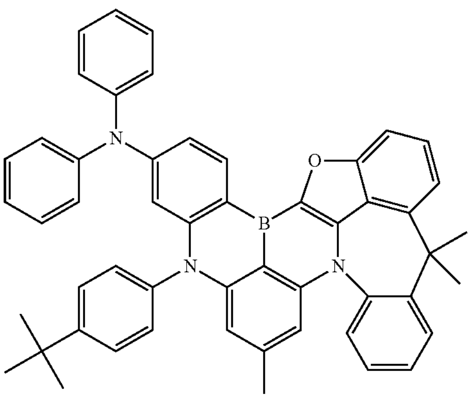
176
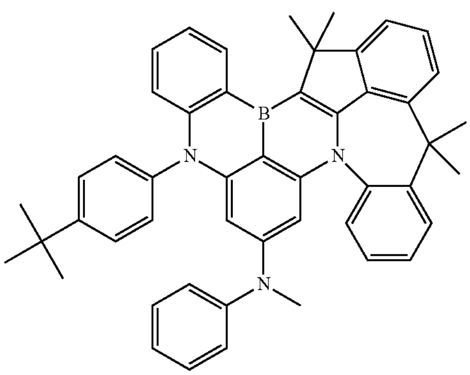
177
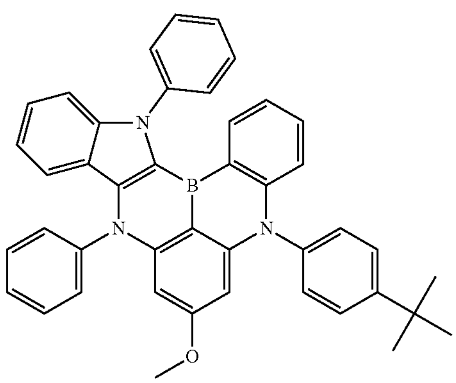
-continued
178
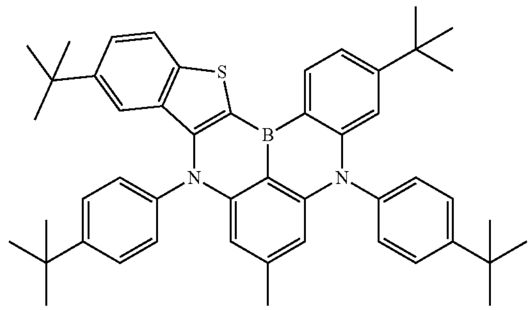
179
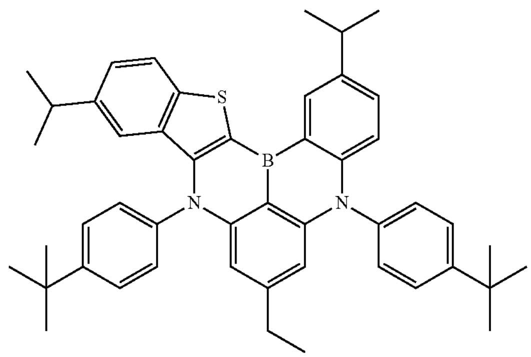
180
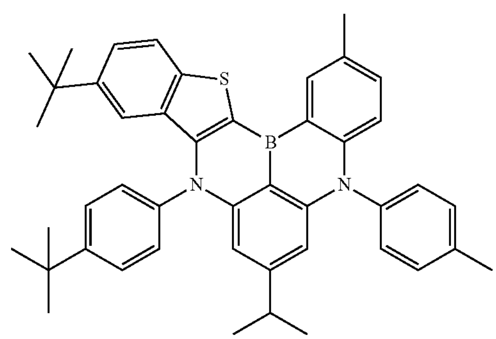
181
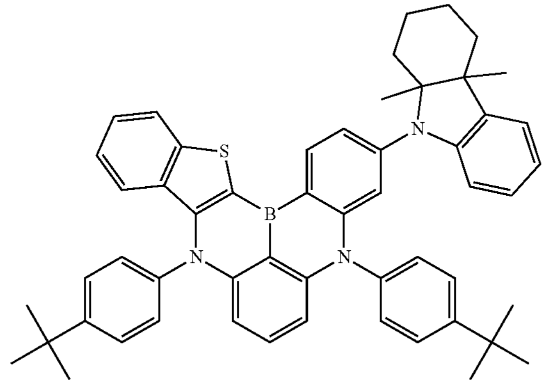

-continued
182
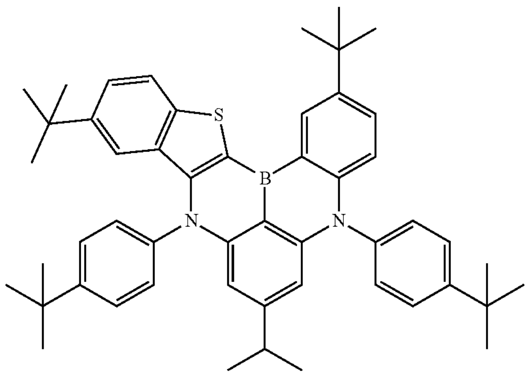
183
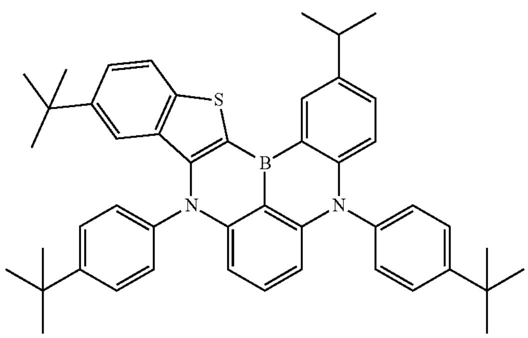
184
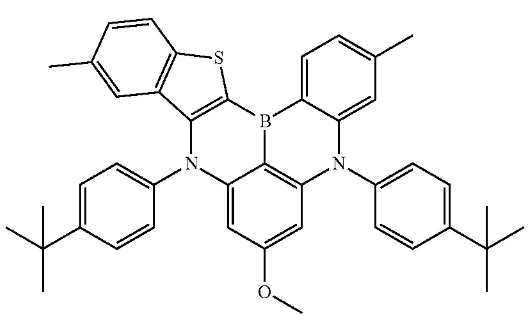
185
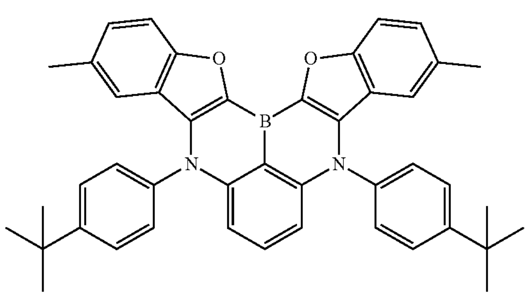
-continued
186
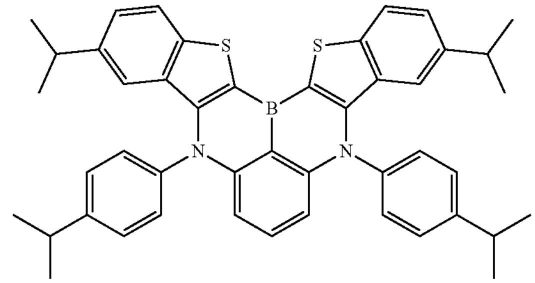
187
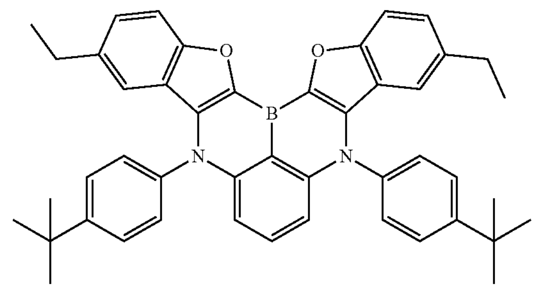
188
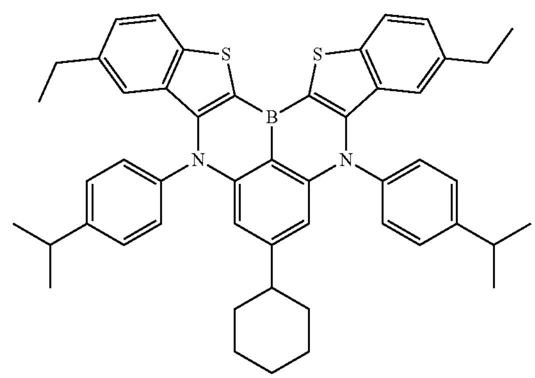
189
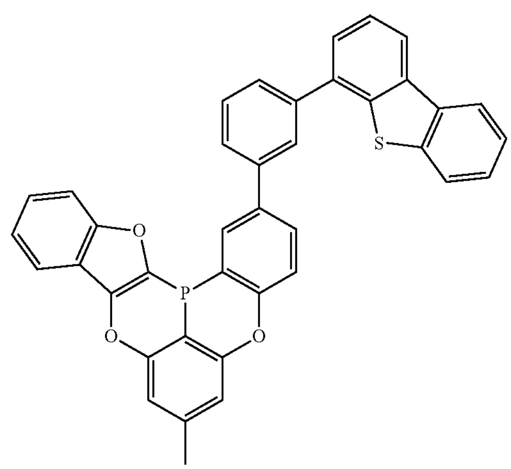

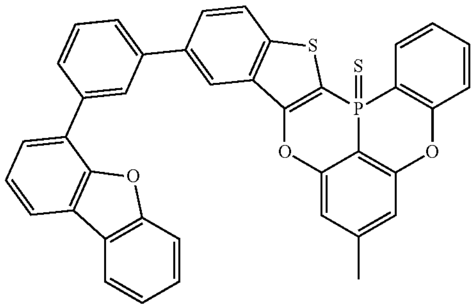
190
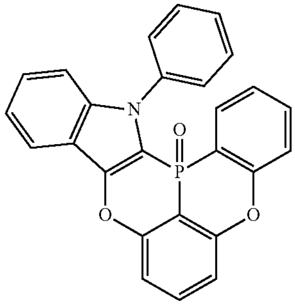
191
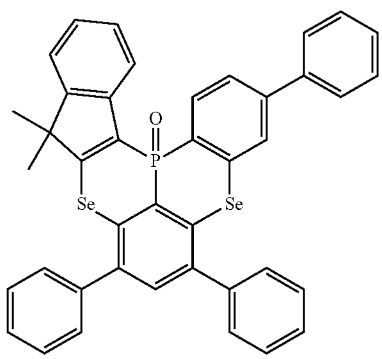
192
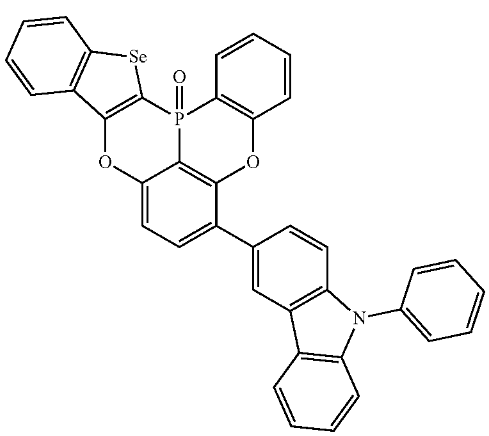
193
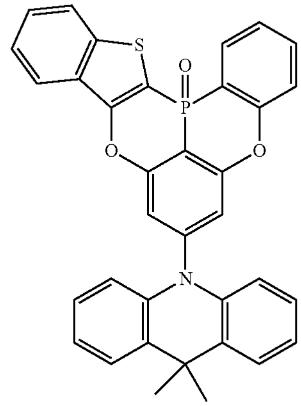
194
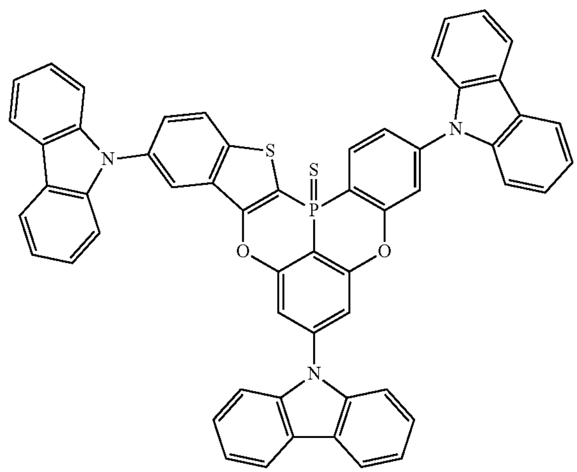
195
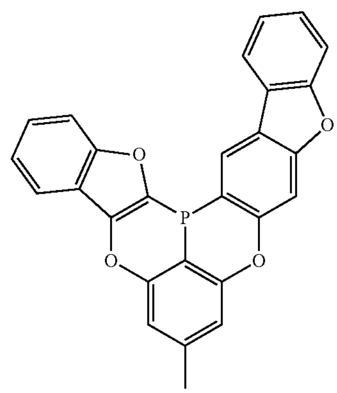
196
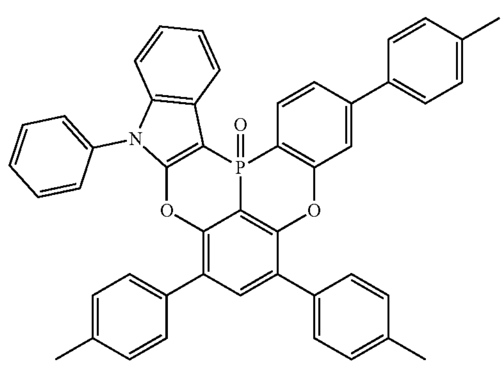
197

-continued
198
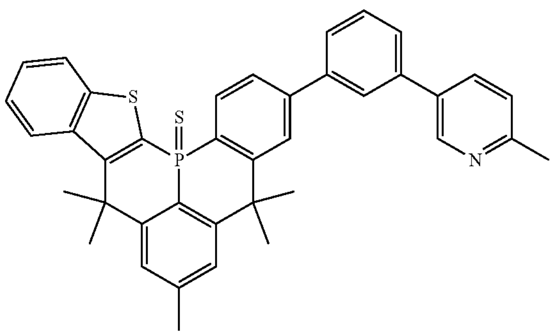
199
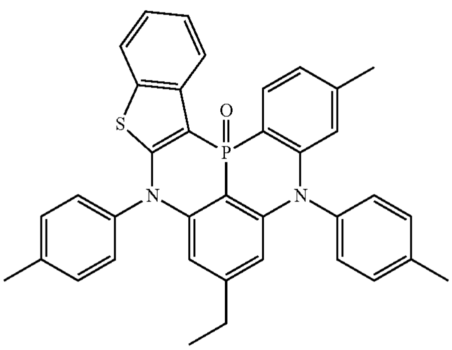
200
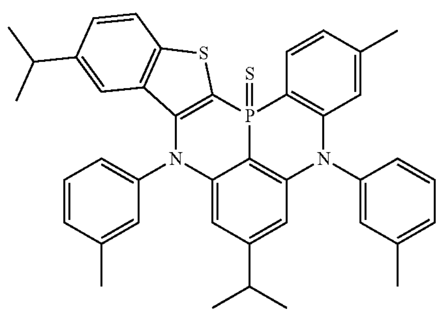
201
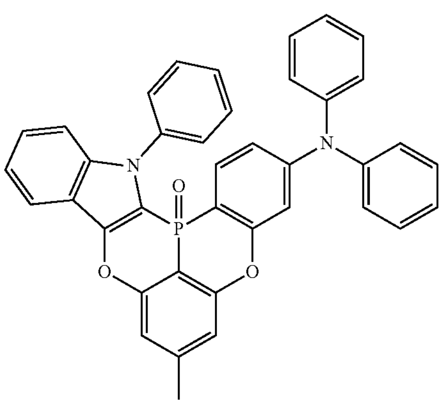
-continued
202
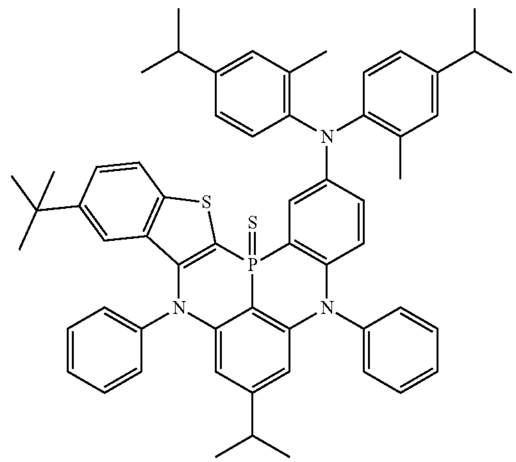
203
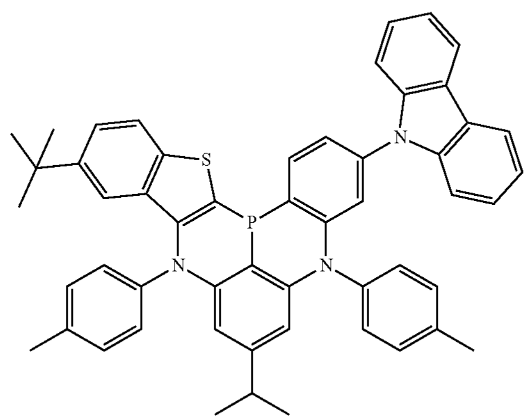
204
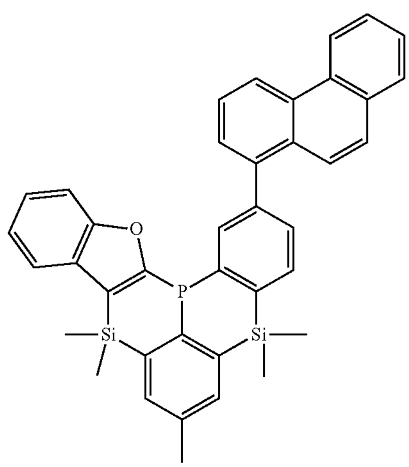
The specific examples of the substituents defined above can be found in the compounds of Formulae 1 to 204 but are not intended to limit the scope of the compound represented by Formula A-1 or A-2.

More specifically, the compound of Formula B employed in the capping layer of the organic electroluminescent device according to the present invention may be selected from the following compounds:
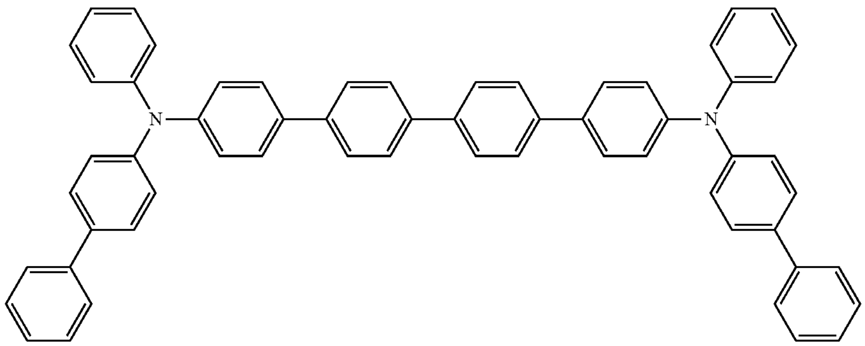
B1
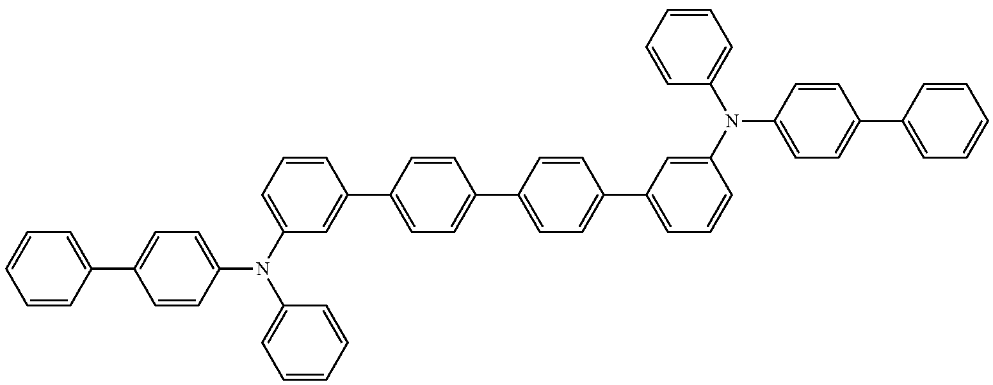
B2
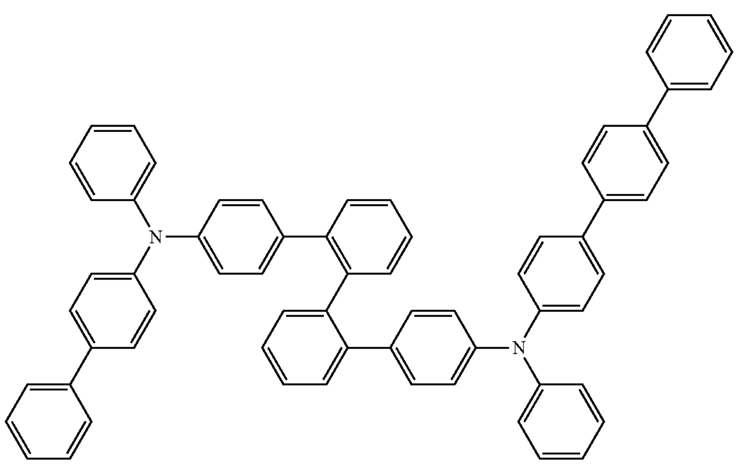
B3
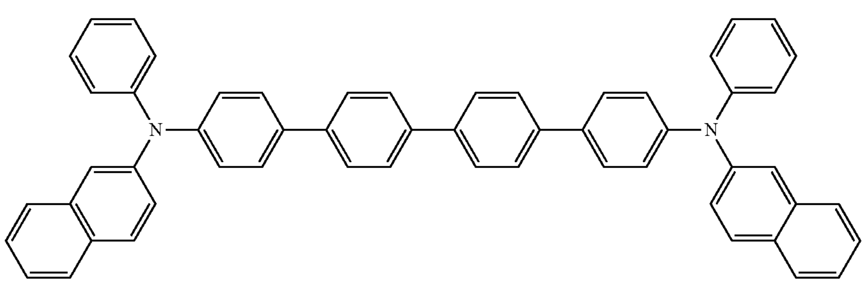
B4

-continued
B5
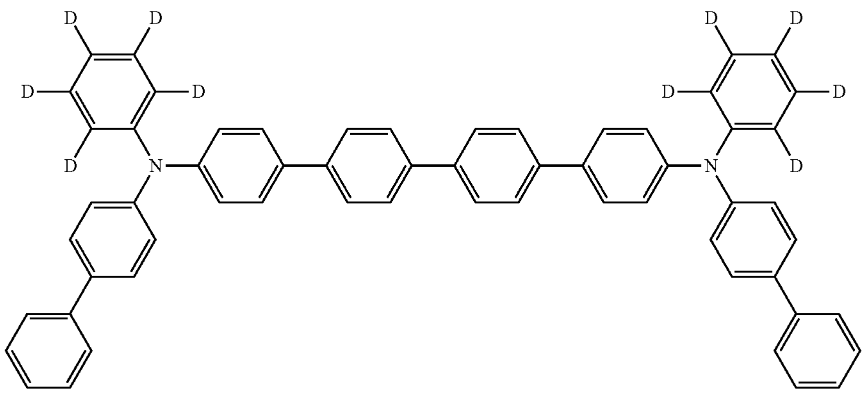
B6
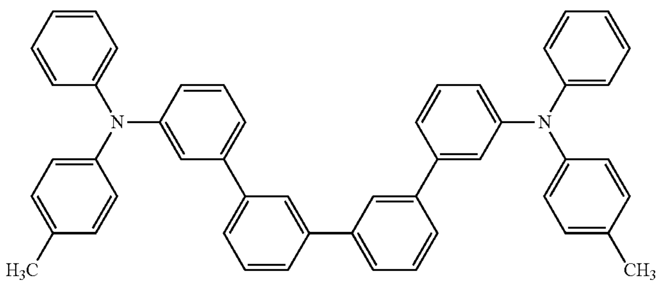
B7
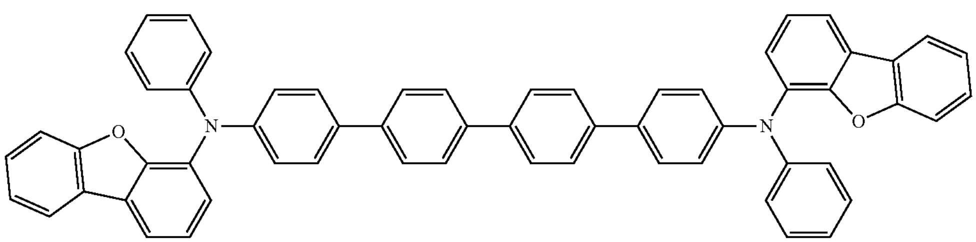
B8
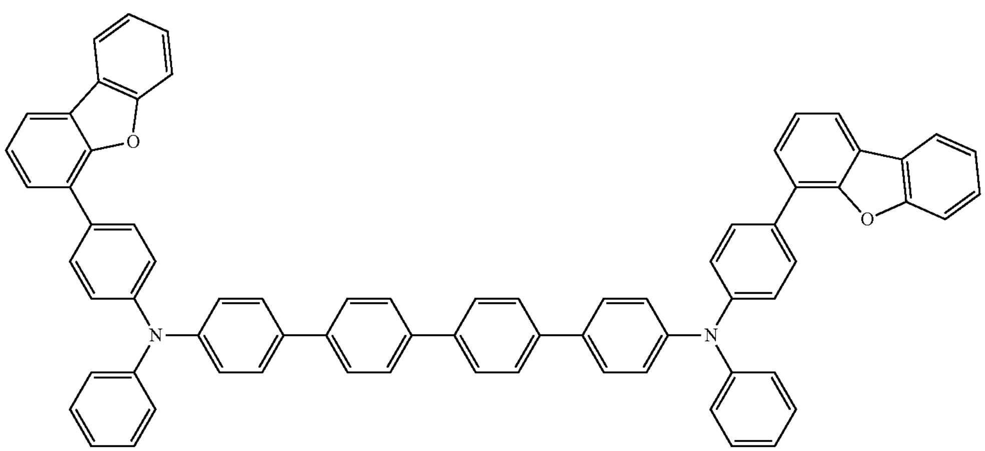

-continued
B9
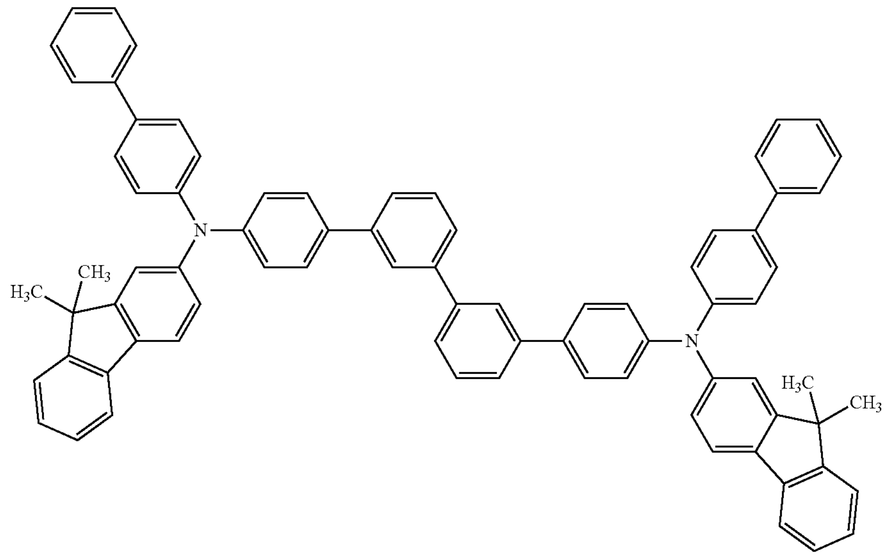
B10
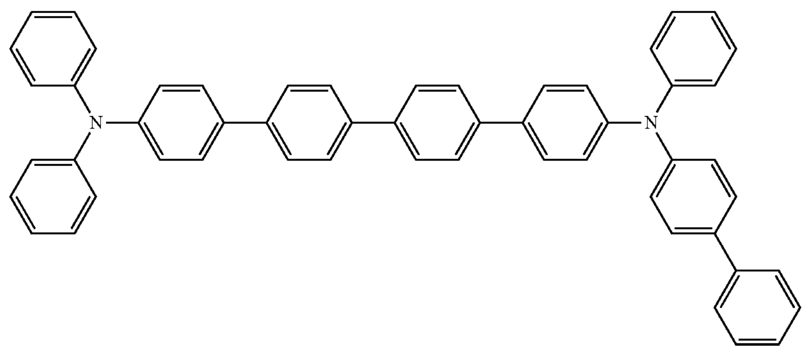
B11
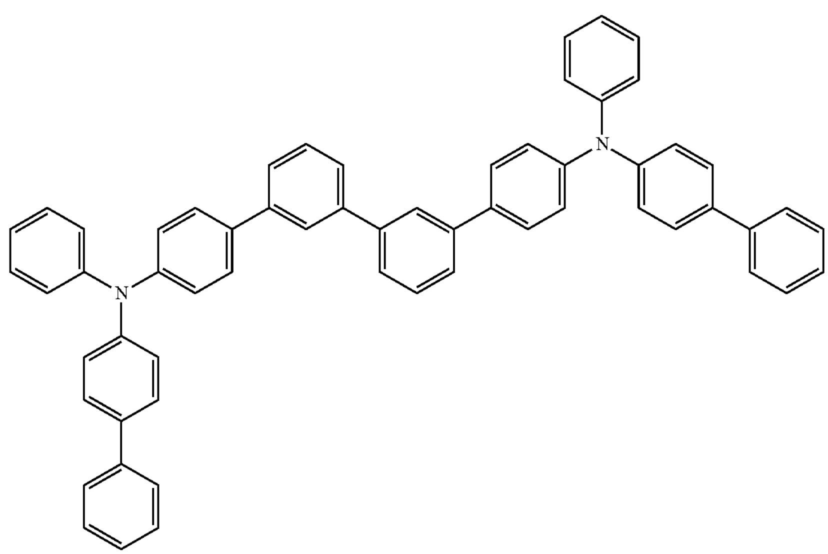

-continued
B12
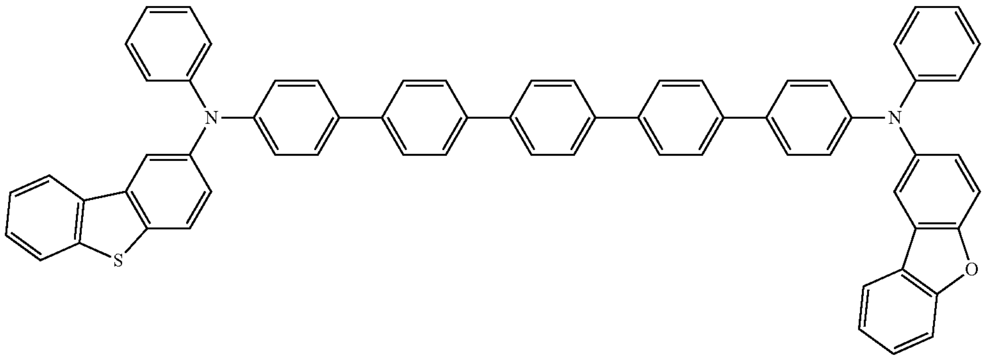
B13
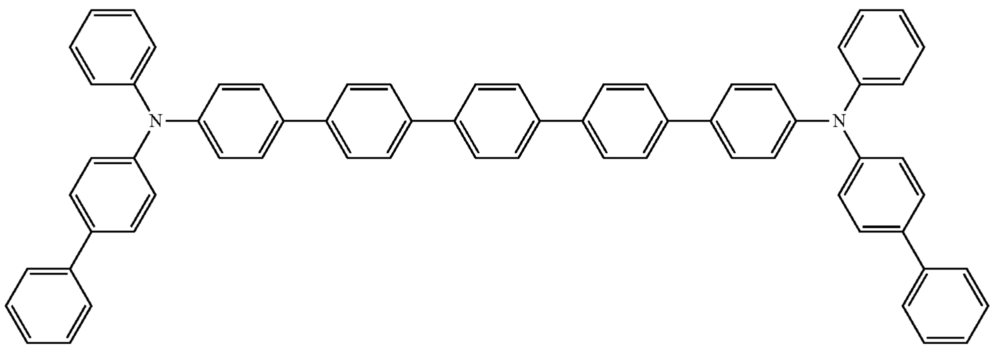
B14
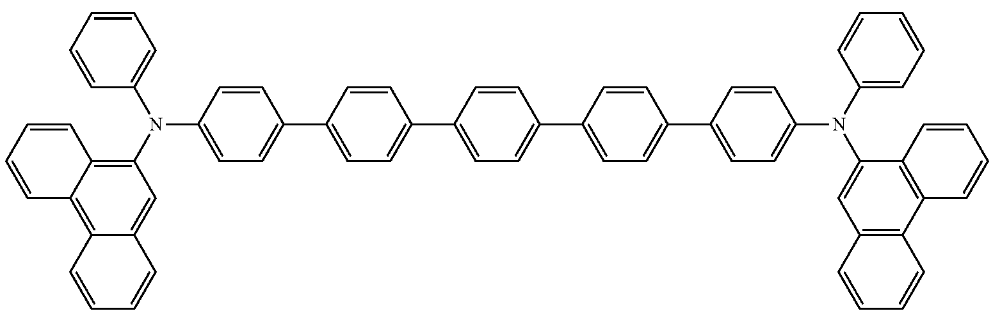
B15
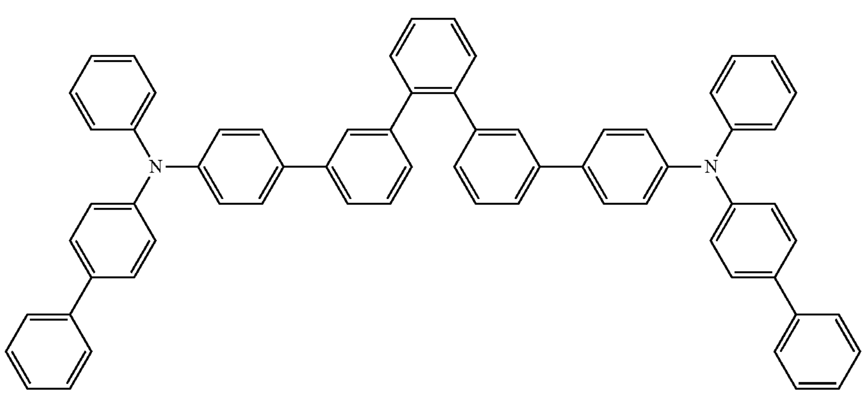

-continued
B16
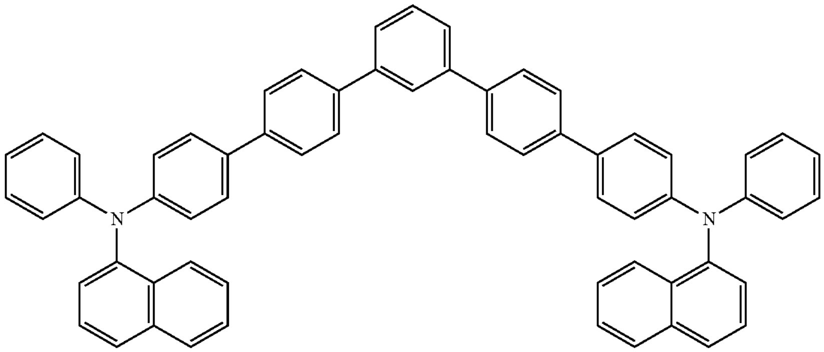
B17
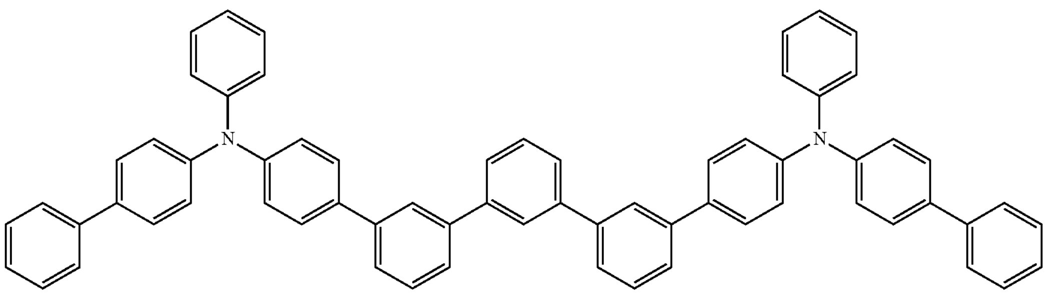
B18
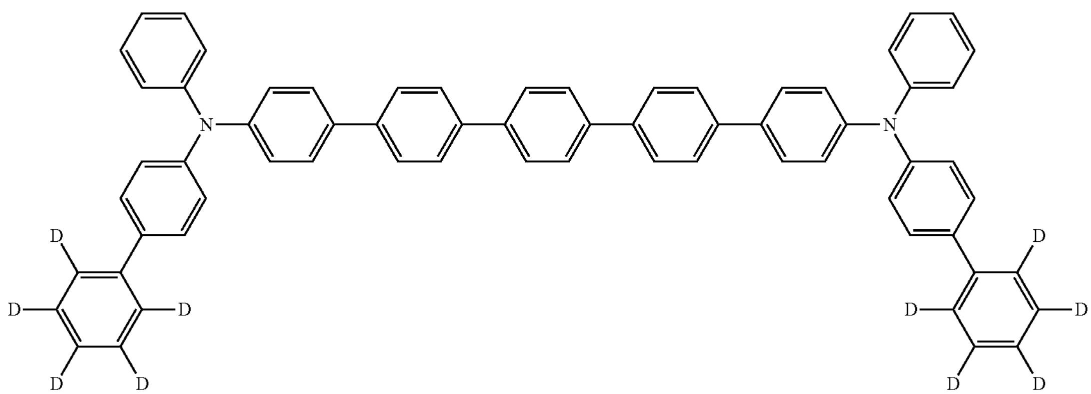
B19
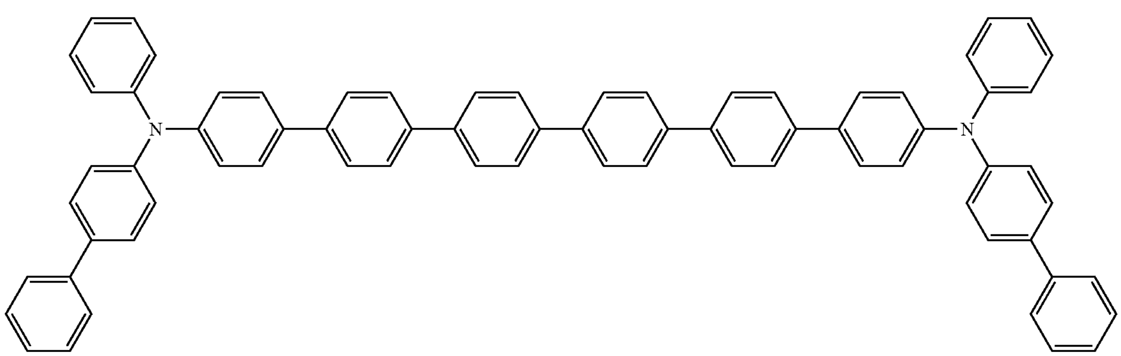

-continued
B20
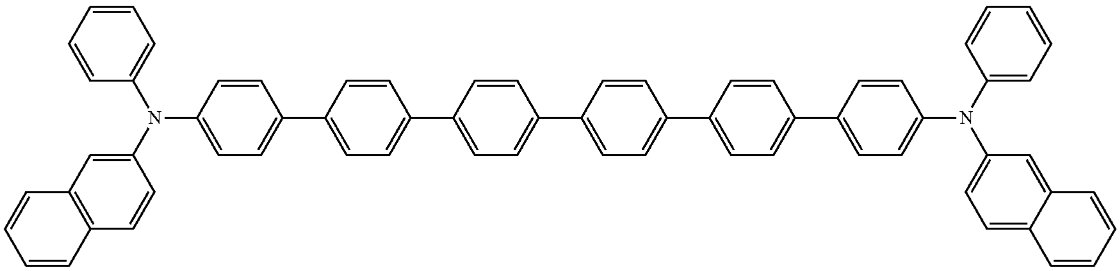
B21
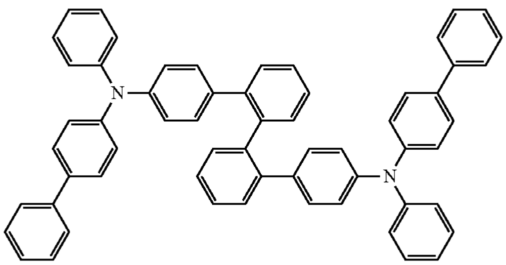
B22
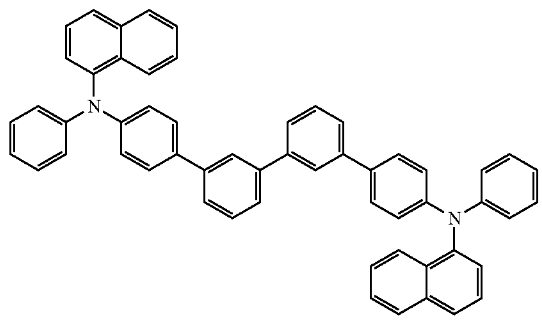
B23
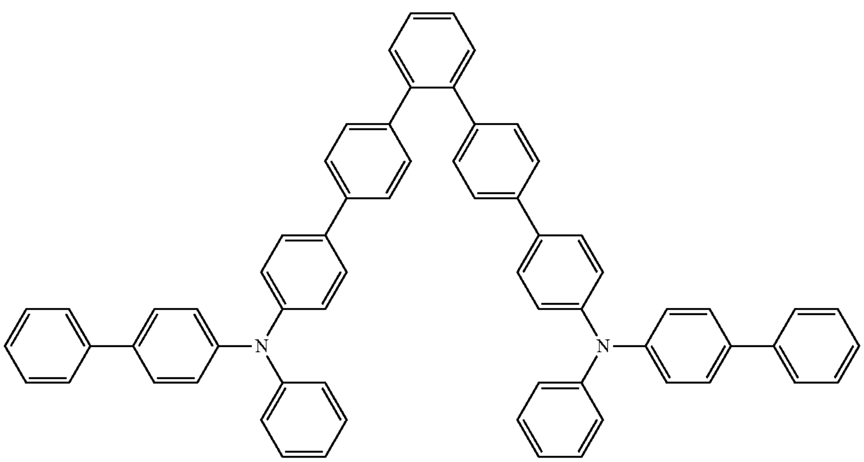
B24
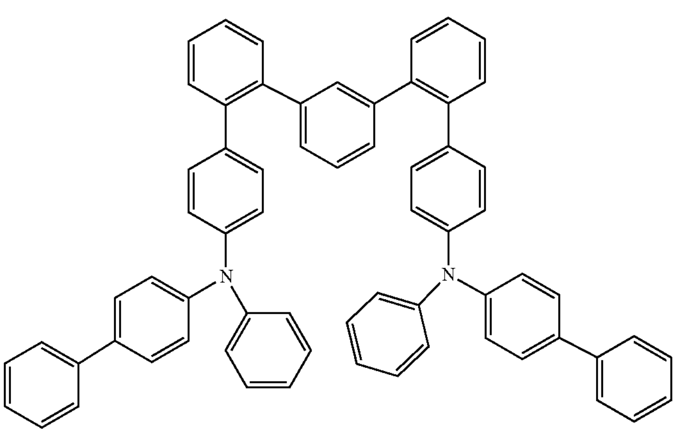

-continued
B25
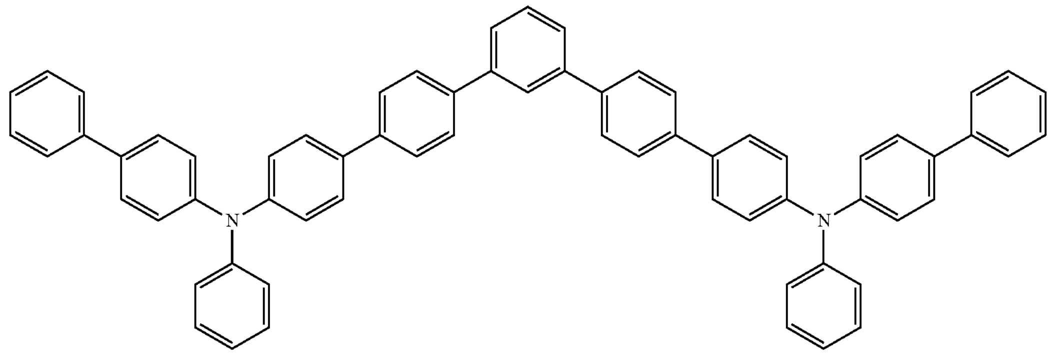
B26
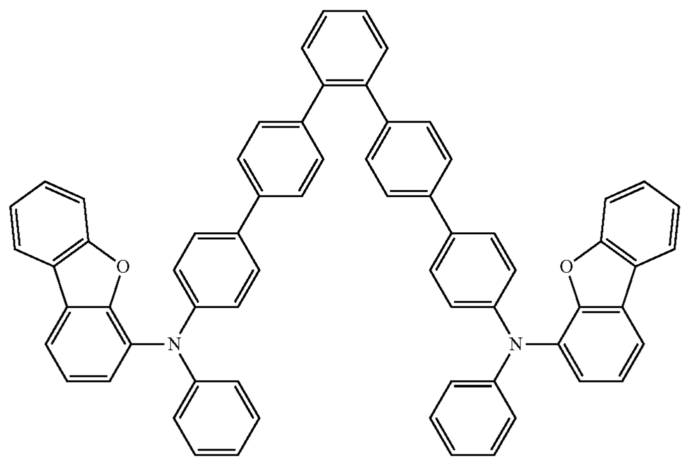
B27
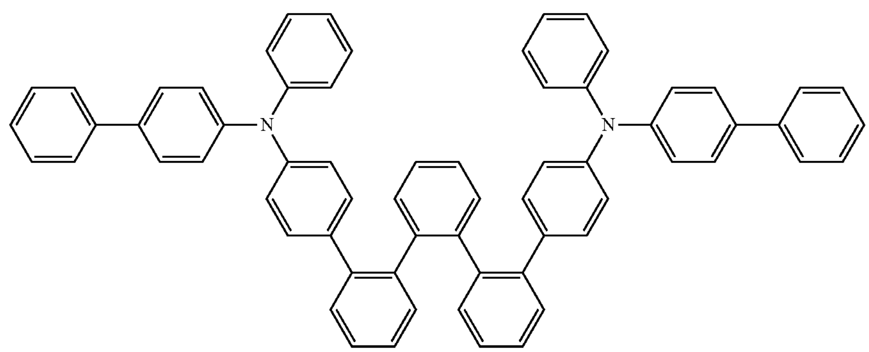
B28
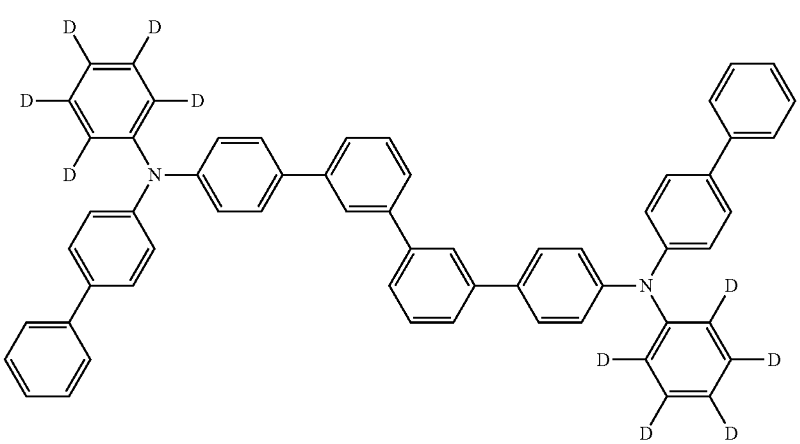

-continued
B29
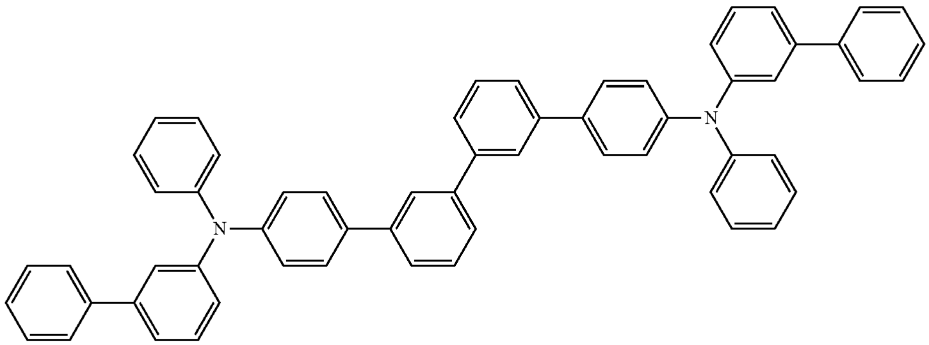
B30
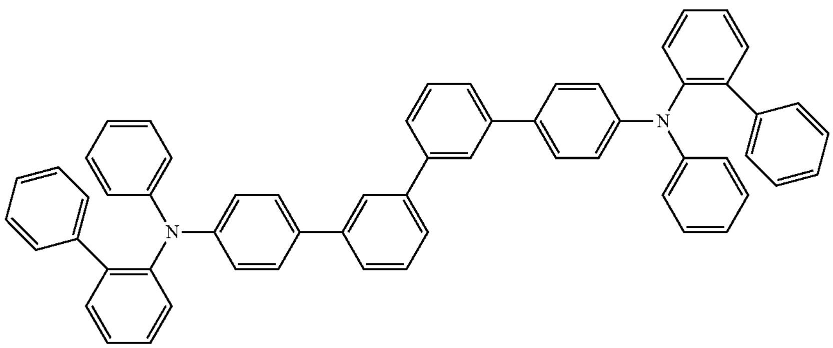
B31
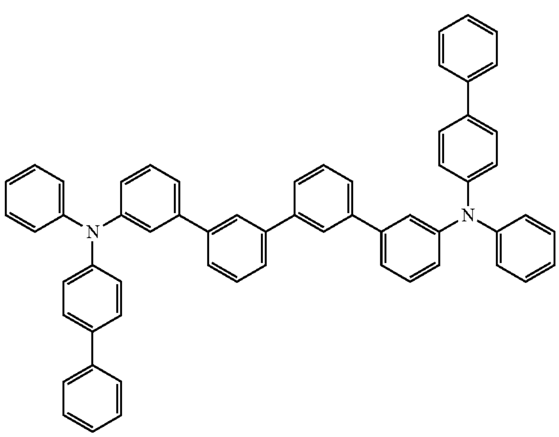
B32
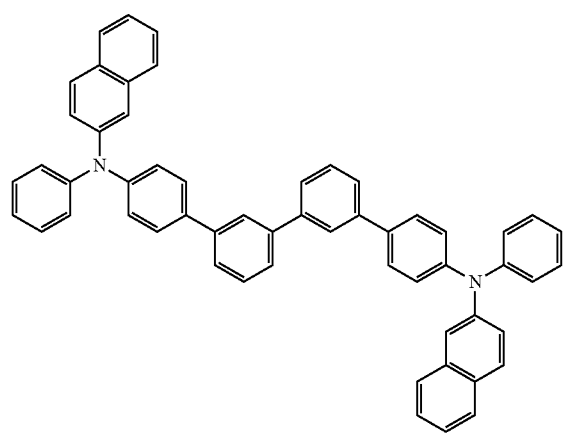
B33
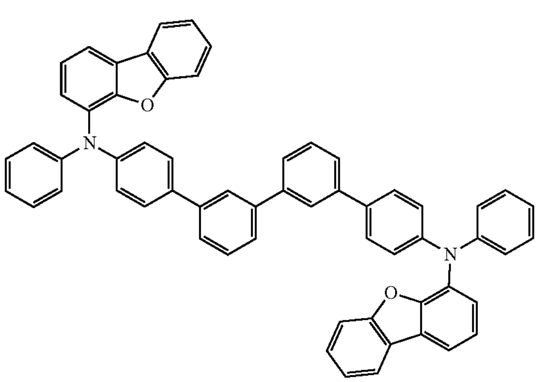
B34
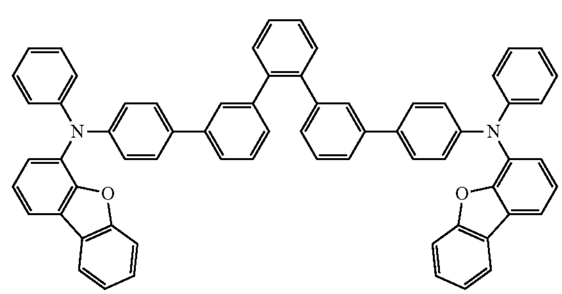

-continued
B35
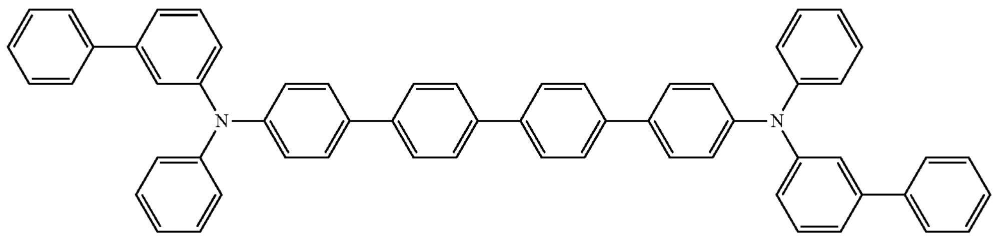
B36
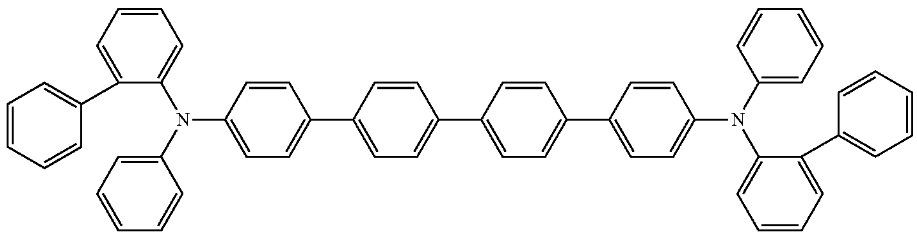
B37
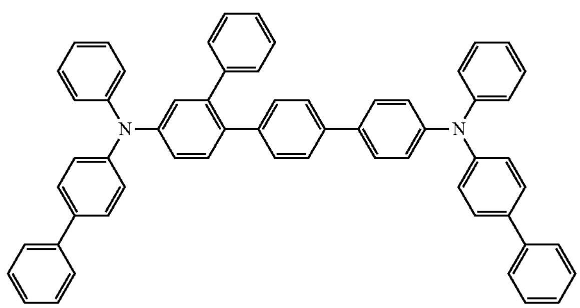
B38
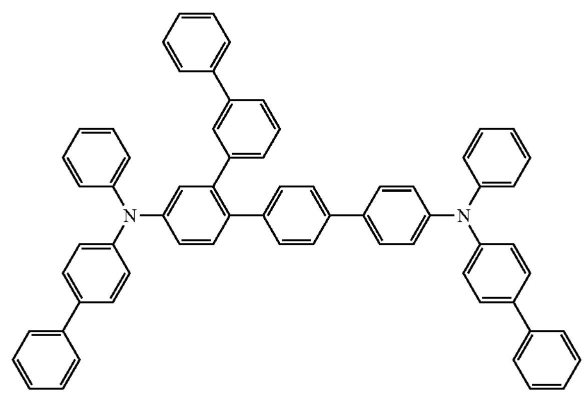
B39
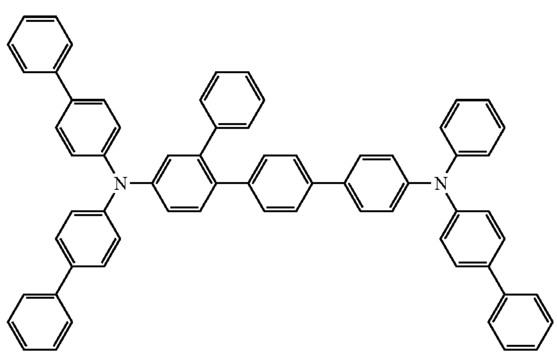
B40
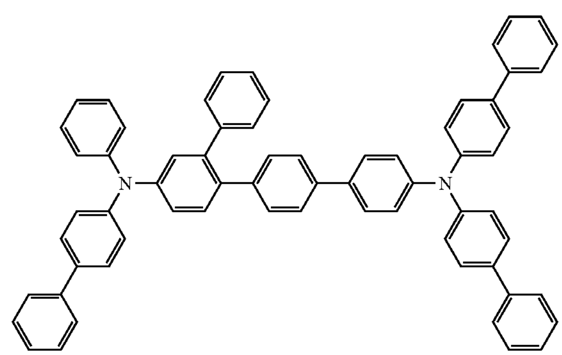
B41
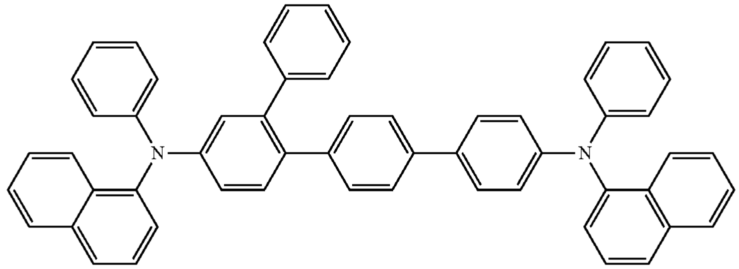

-continued
B42
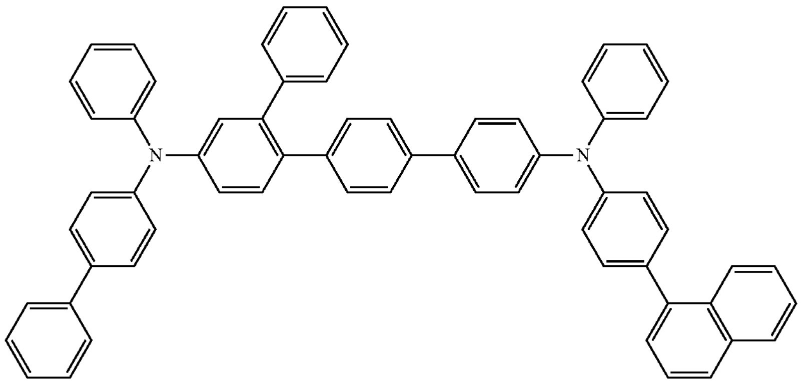
B43
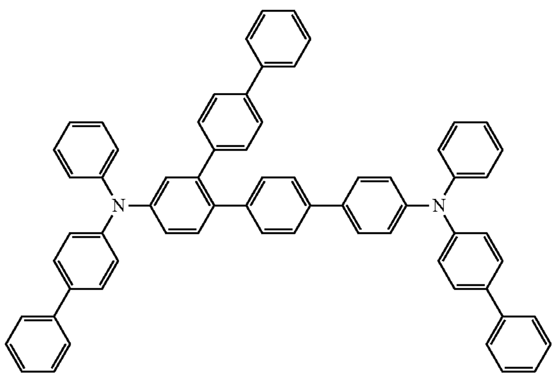
B44
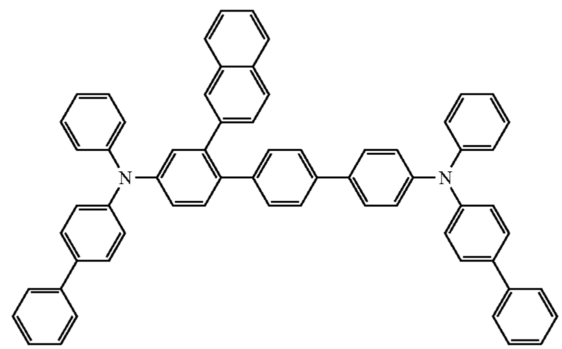
B45
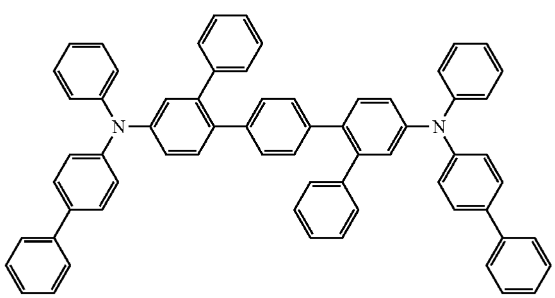
B46
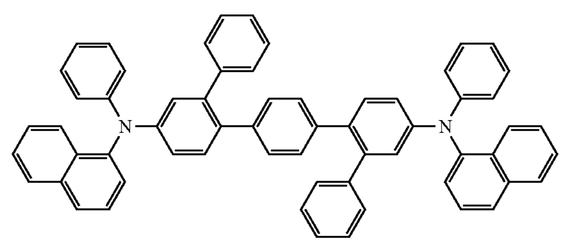
B47
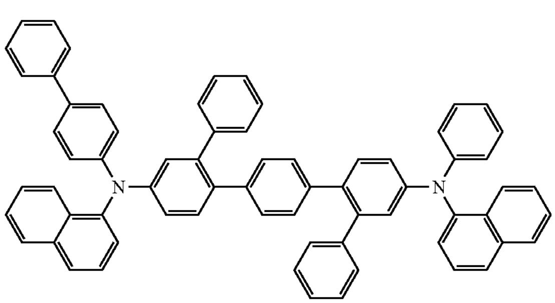
B48
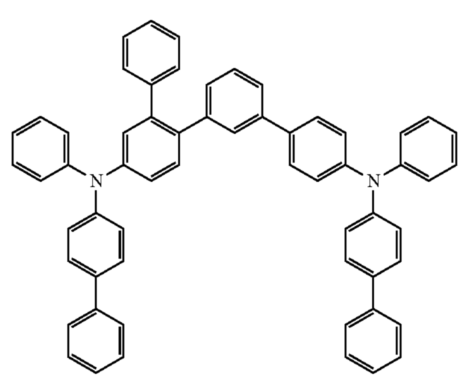

-continued
B49
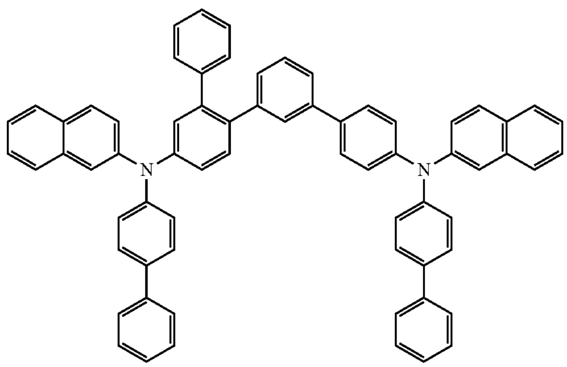
B50
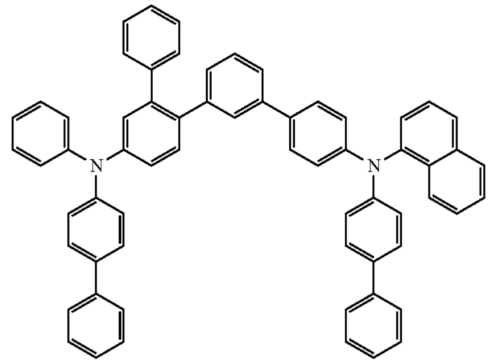
B51
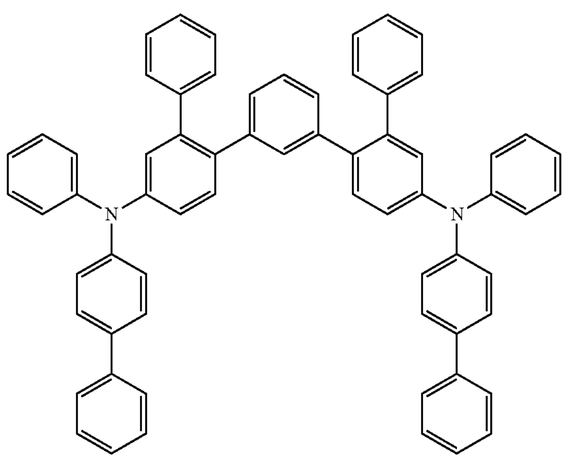
B52
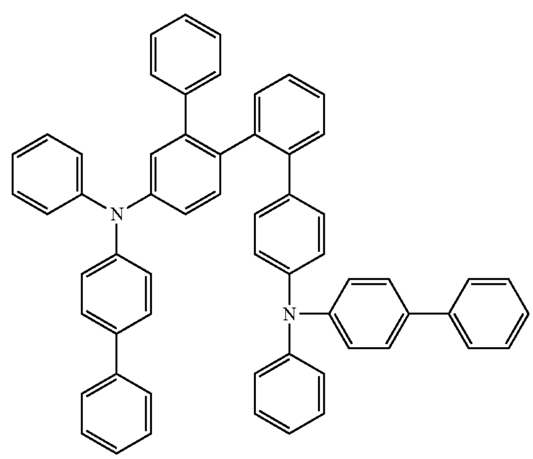
B53
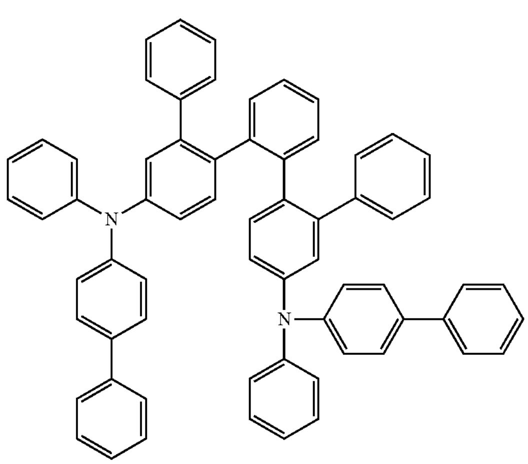

-continued
B54
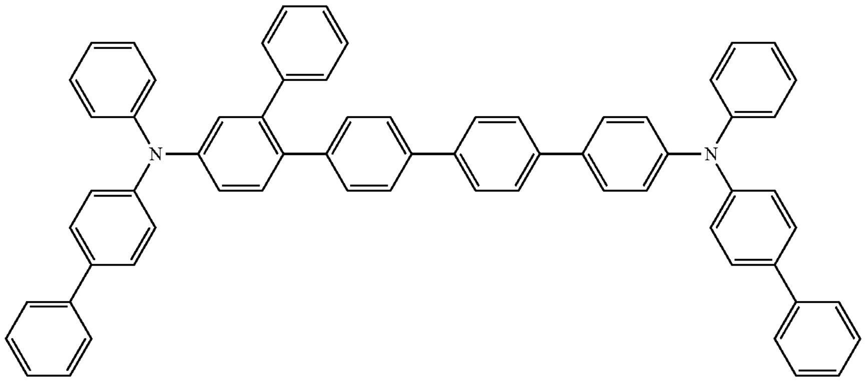
B55
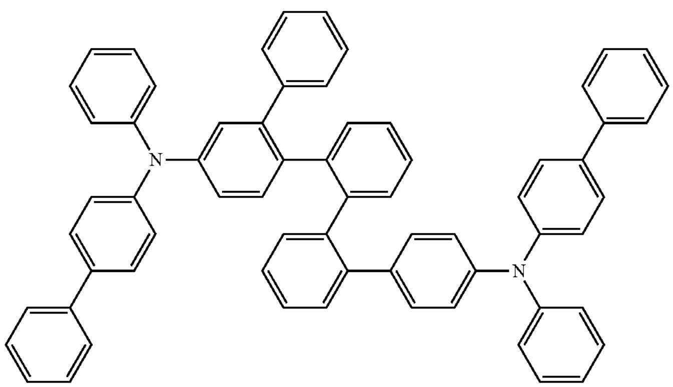
B56
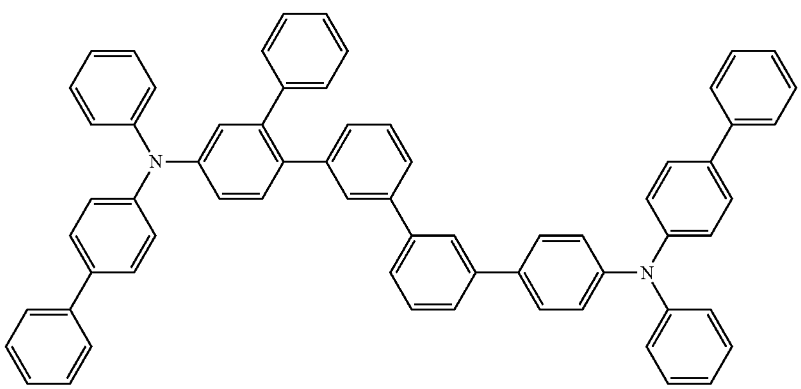
B57
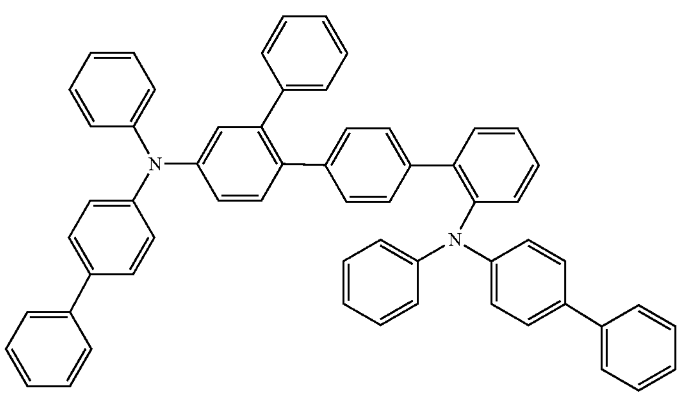

-continued
B58
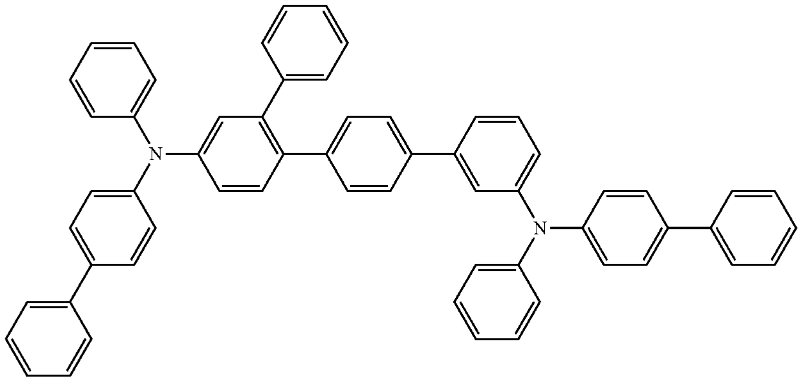
B59
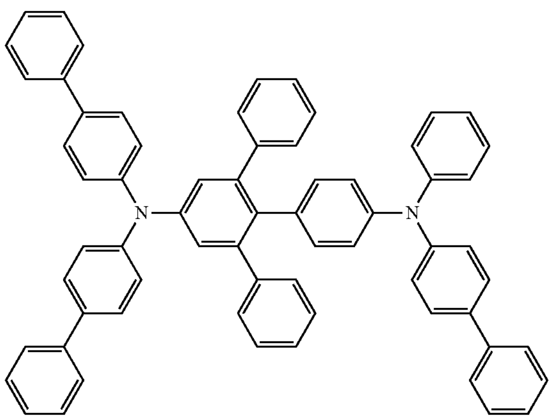
B60
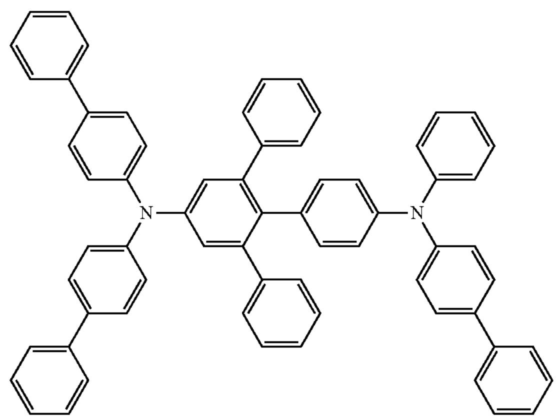
B61
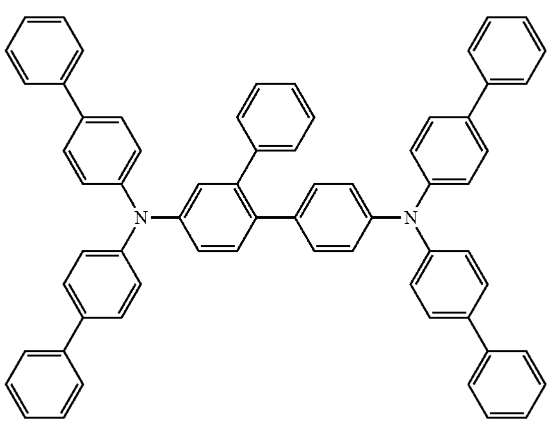
B62
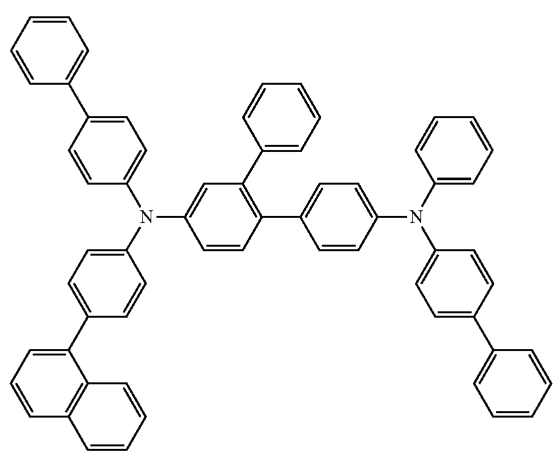

-continued
B63
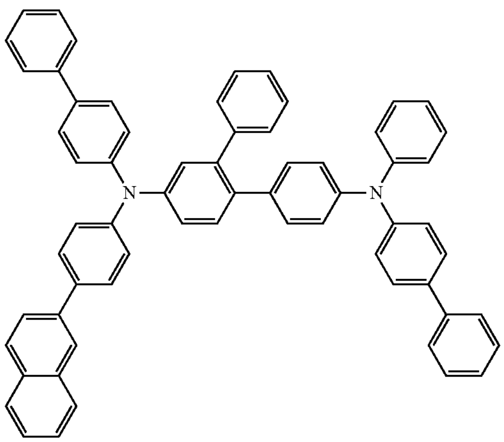
B64
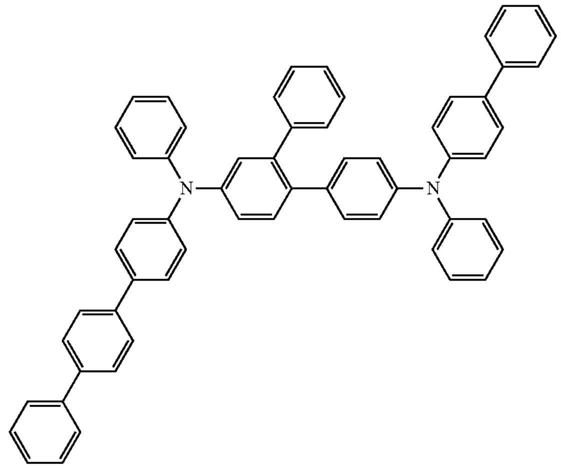
B65
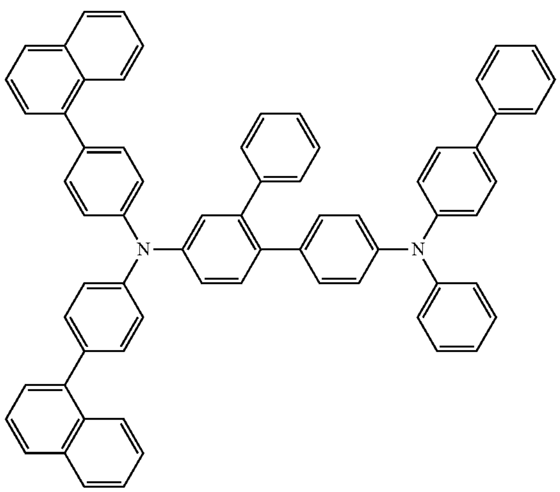
B66
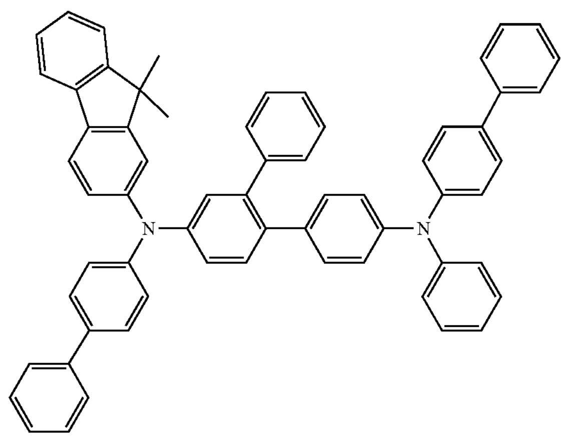
B67
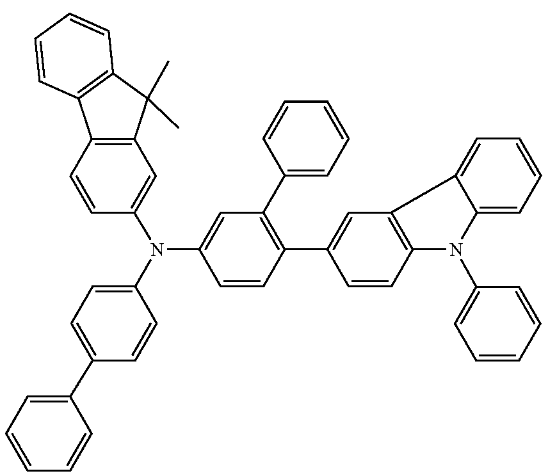
B68
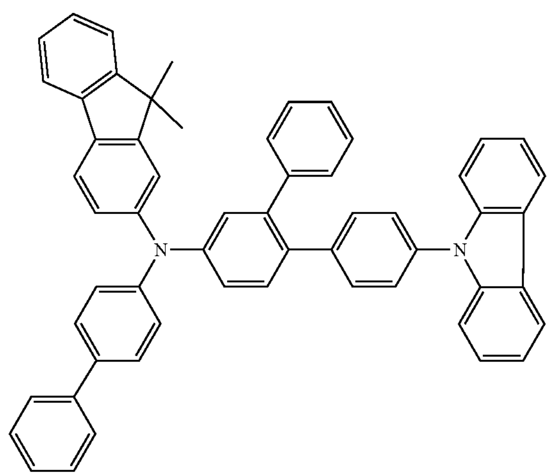

-continued
B69
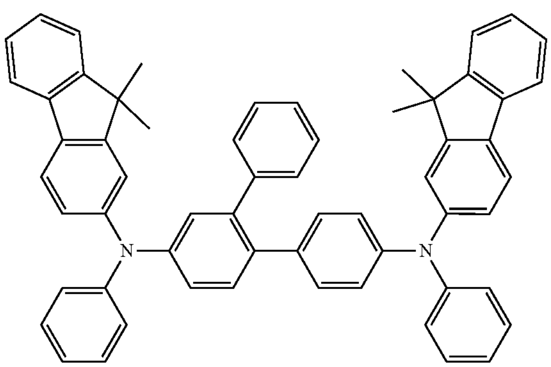
B70
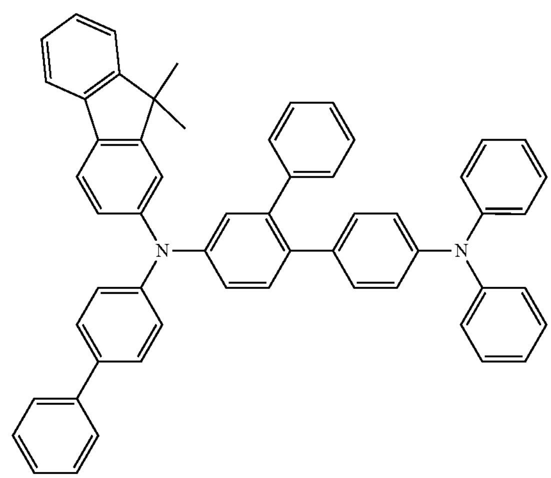
B71
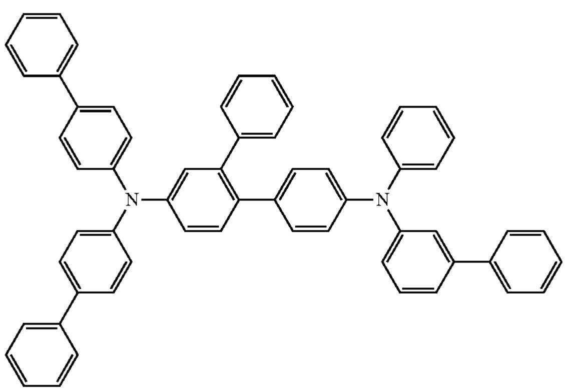
B72
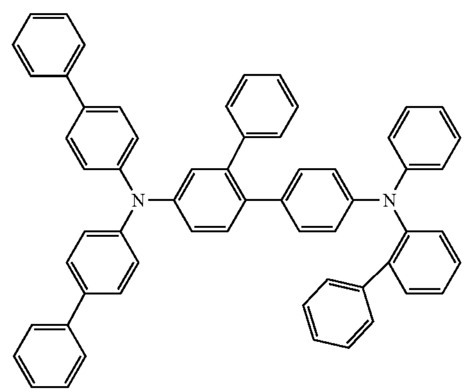
B73
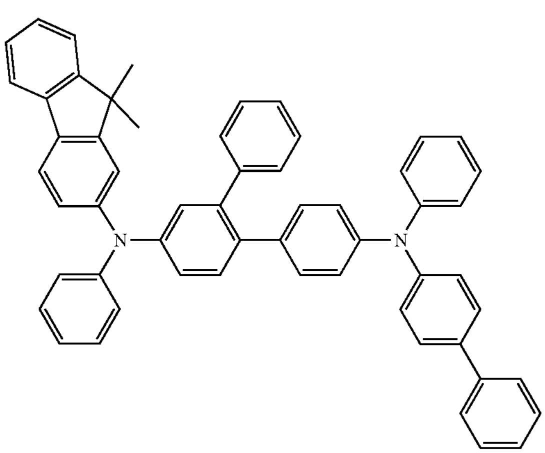
B74
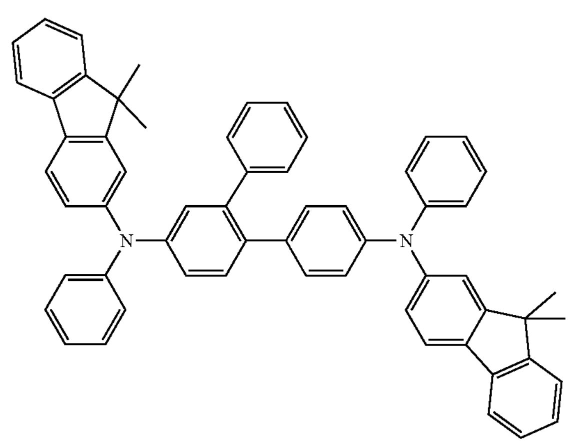

-continued
B75
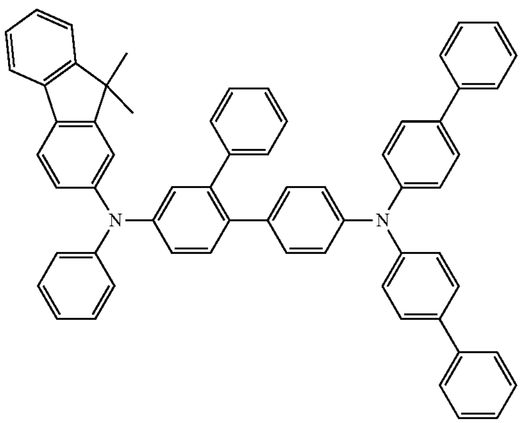
B76
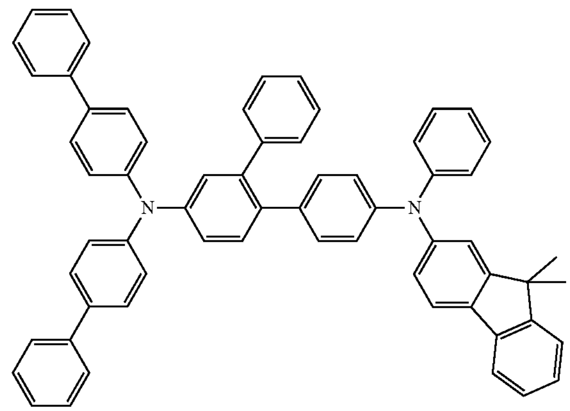
B77
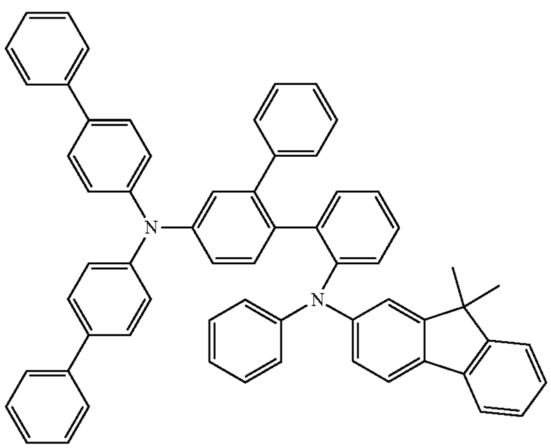
B78
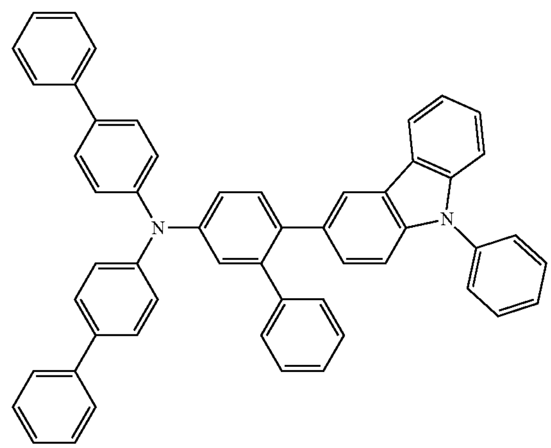
B79
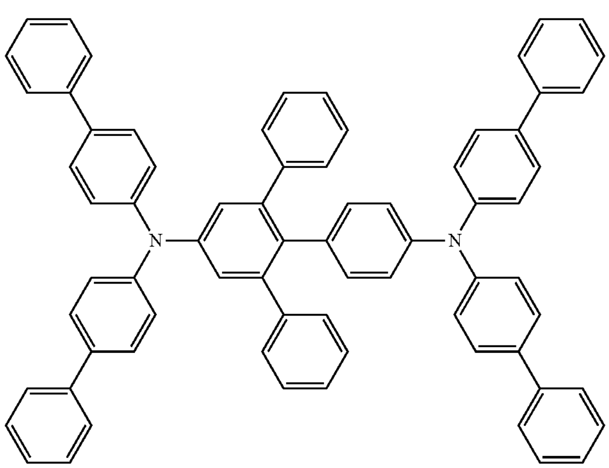

-continued
B101
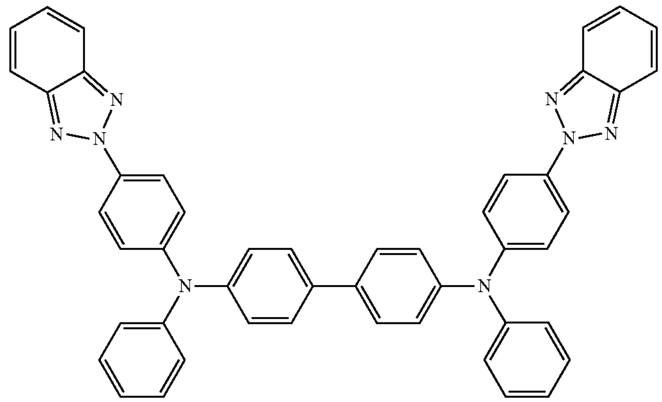
B102
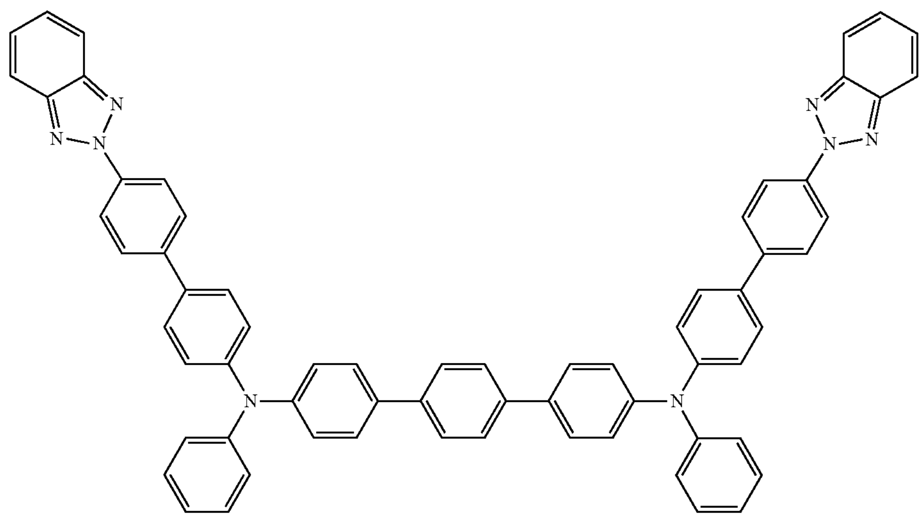
B103
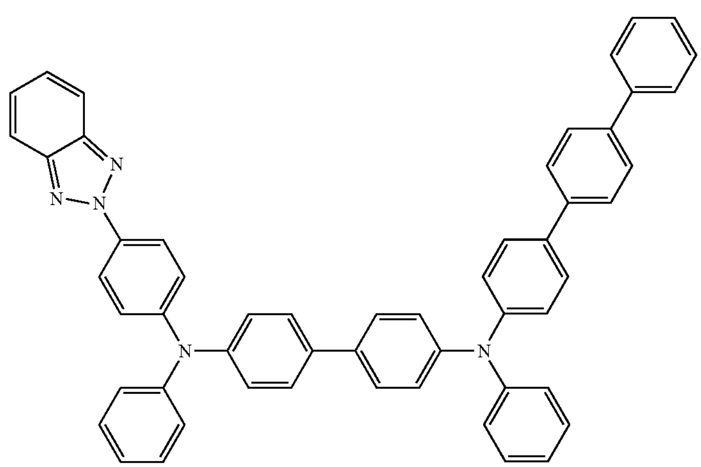

-continued
B104
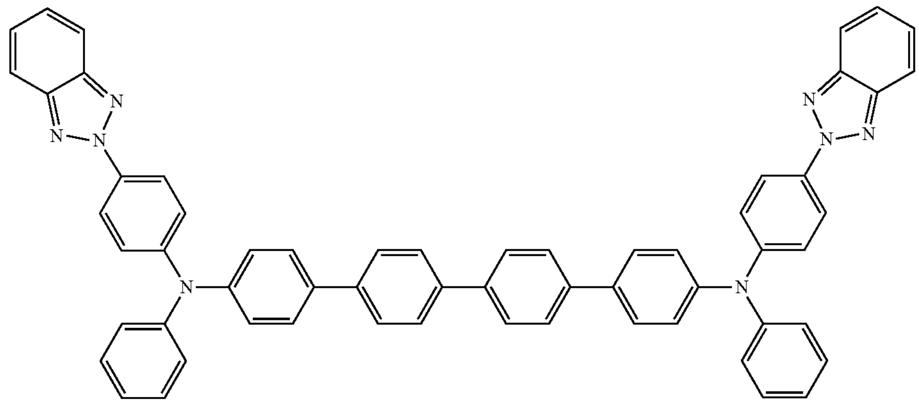
B105
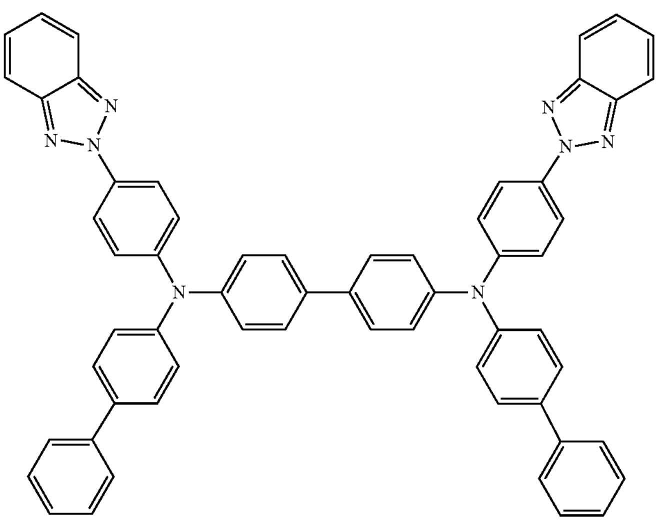
B106
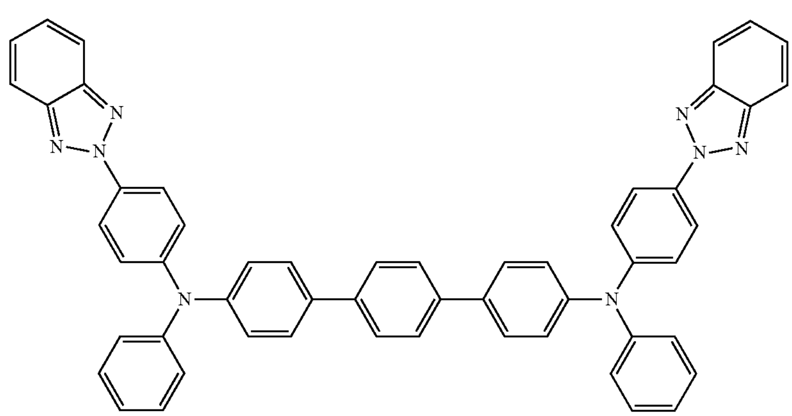

-continued
B107
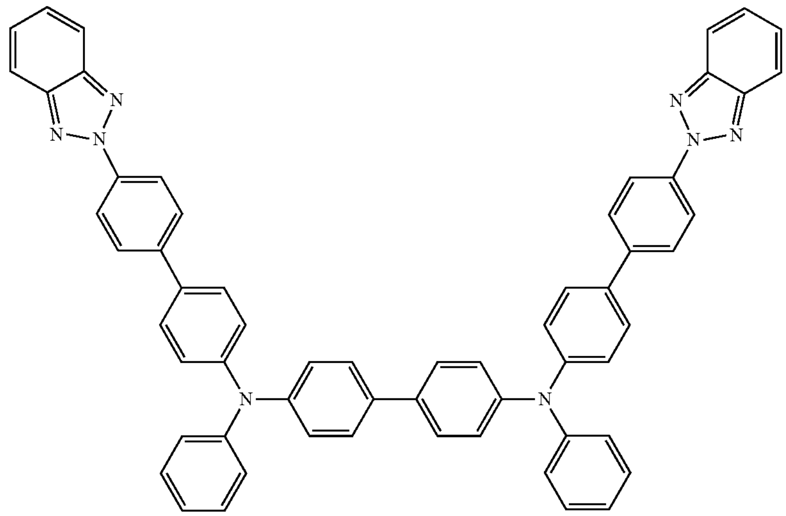
B108
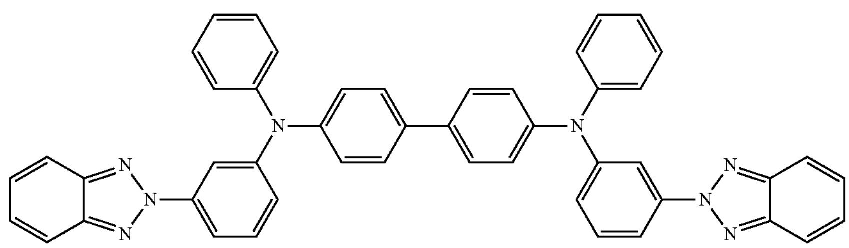
B109
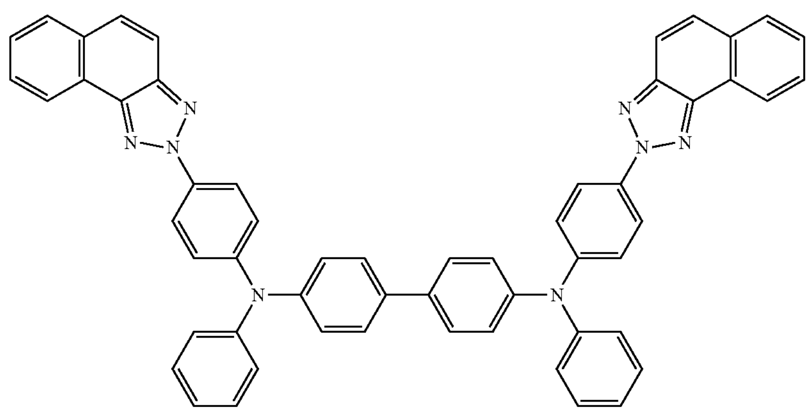
B110
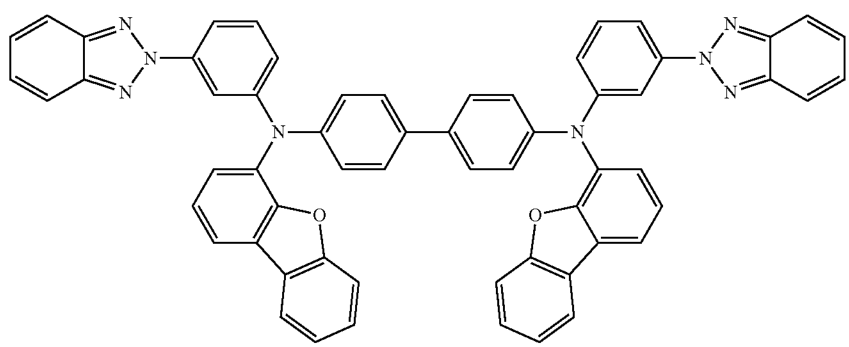

-continued
B111
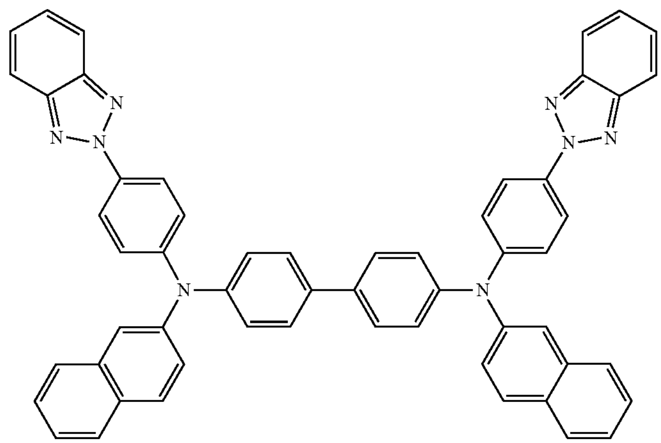
B112
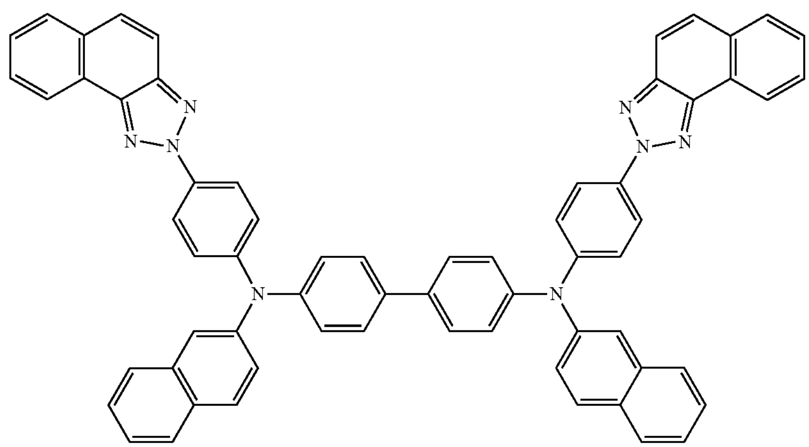
B113
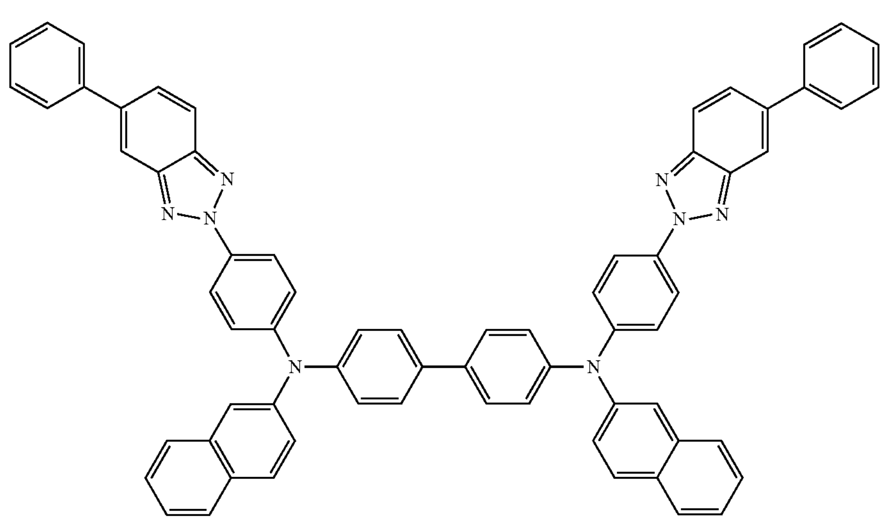

-continued
B114
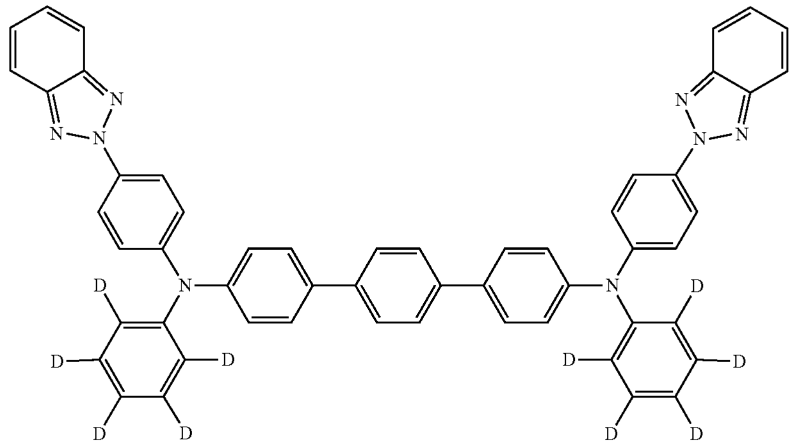
B115
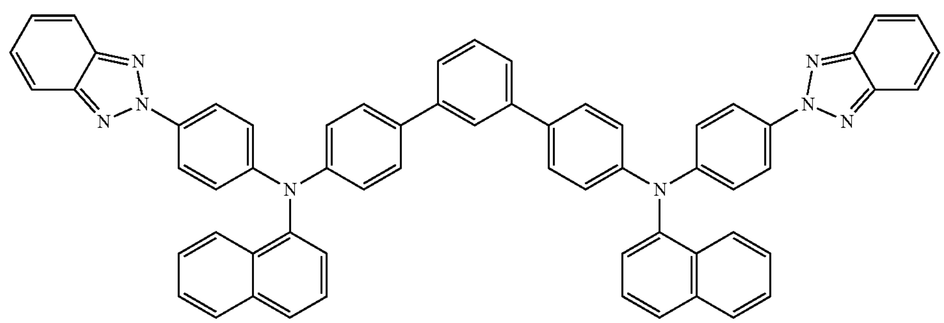
B116
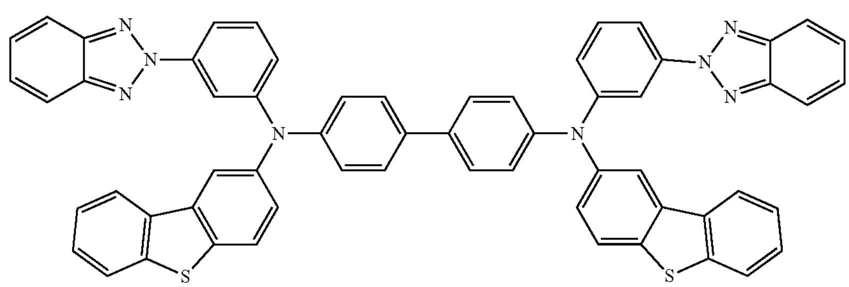
B117
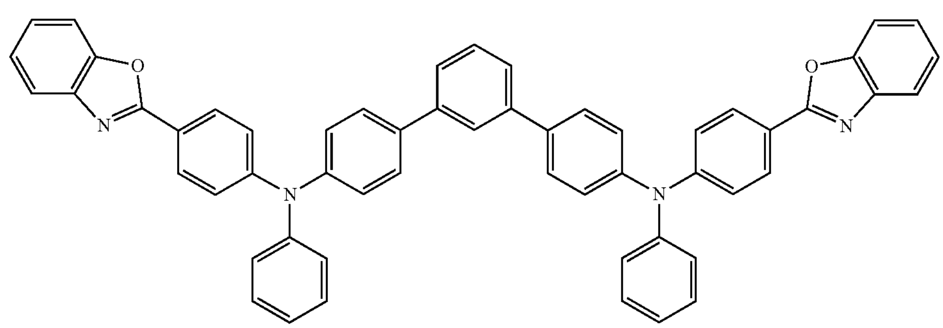

-continued
B118
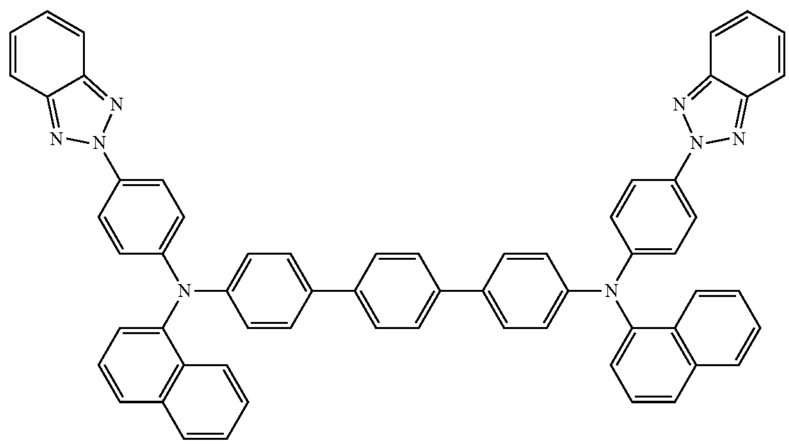
B119
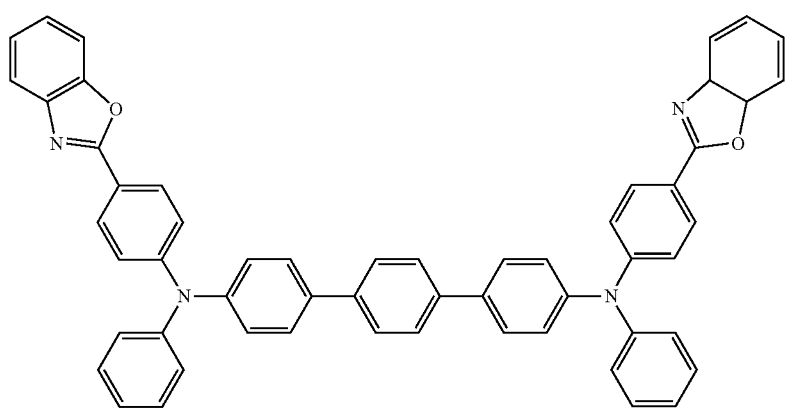
B120
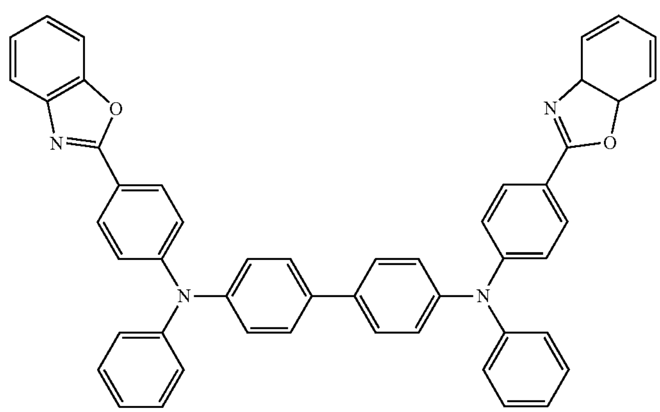

-continued
B121
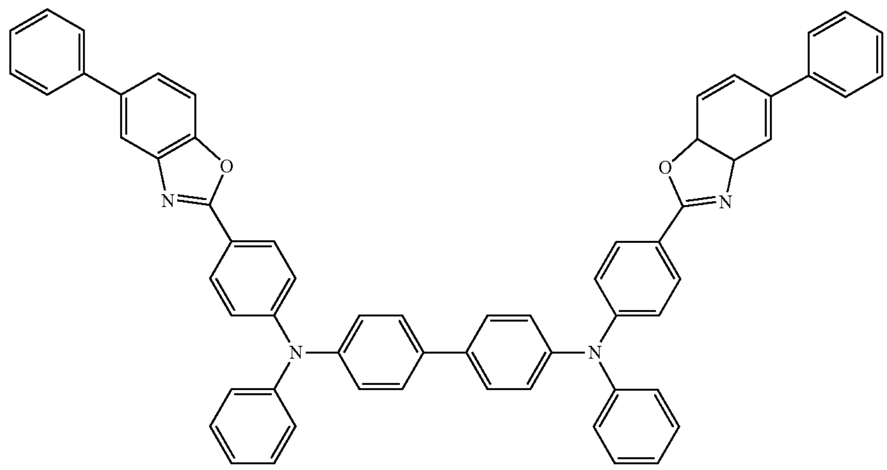
B122
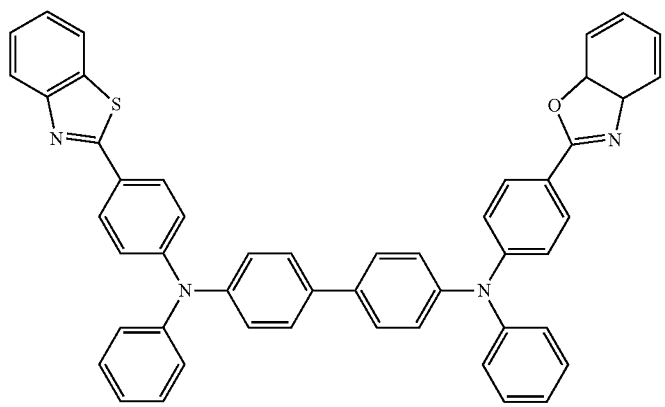
B123
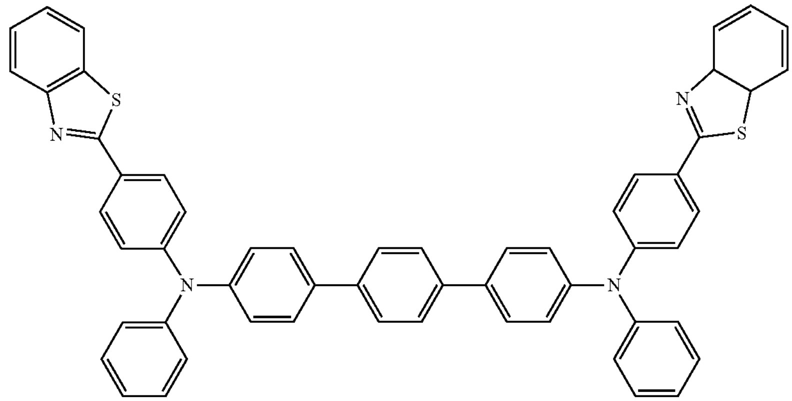

-continued
B124
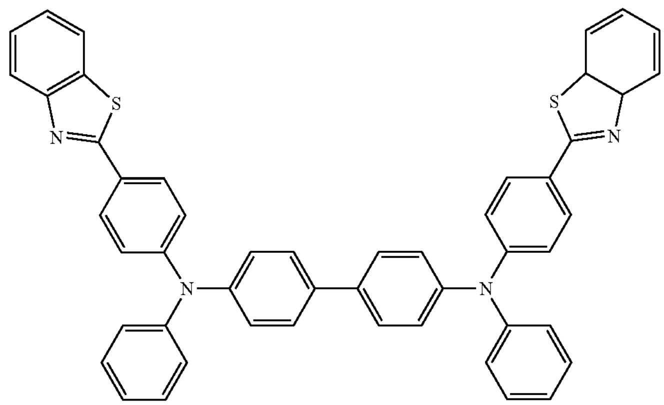
B125
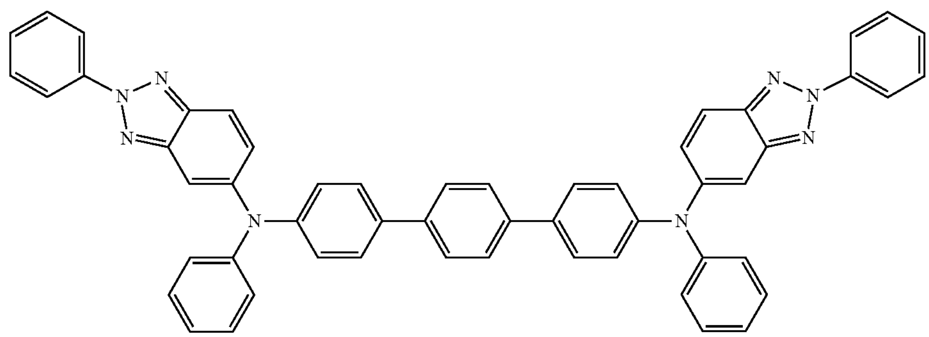
B126
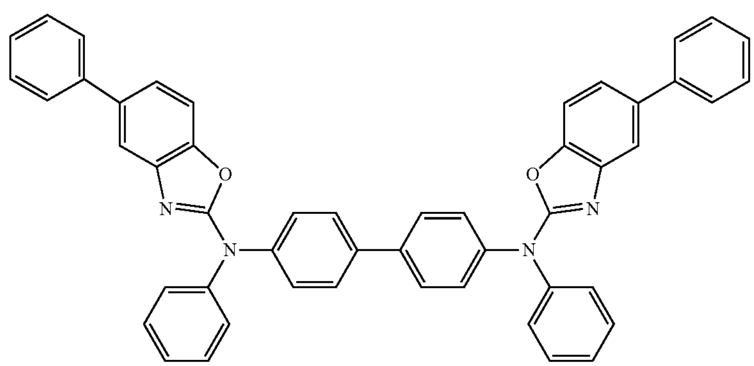
B127
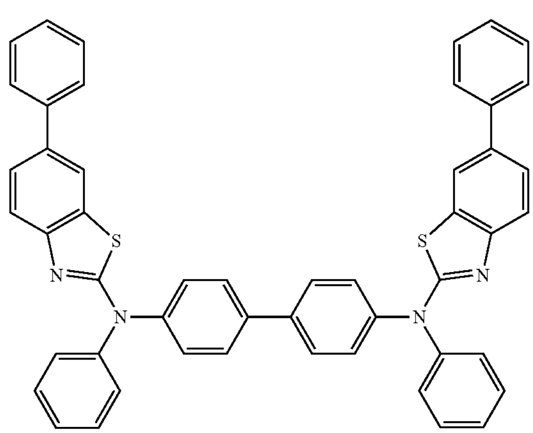

-continued
B128
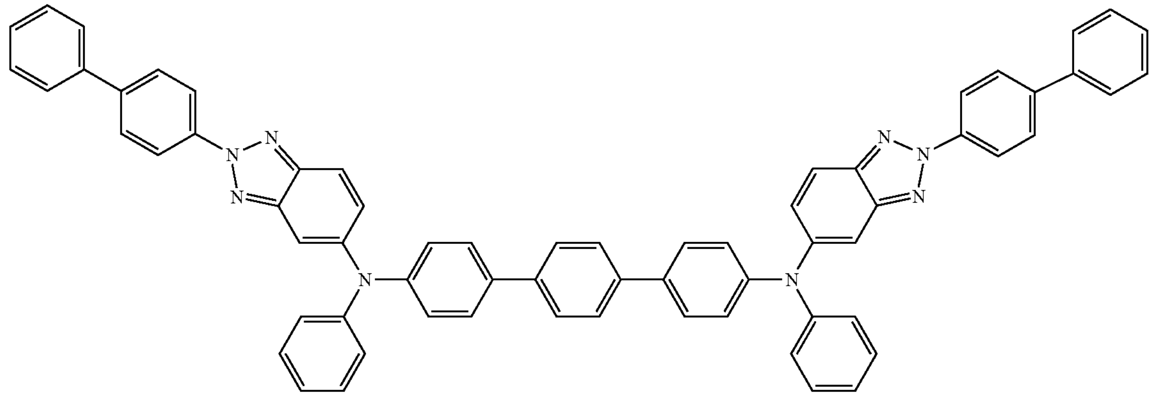
B129
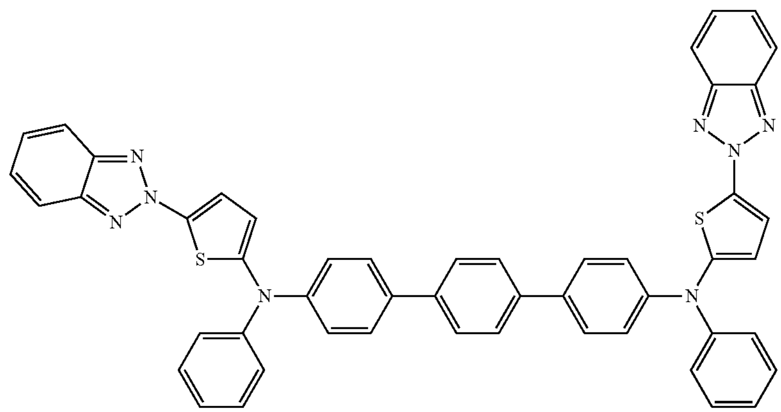
B130
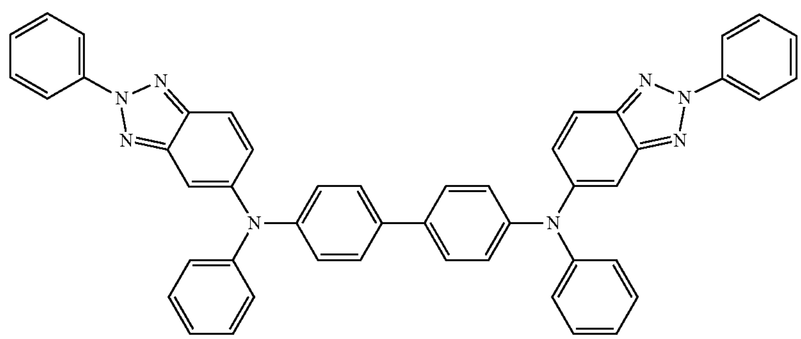
B131
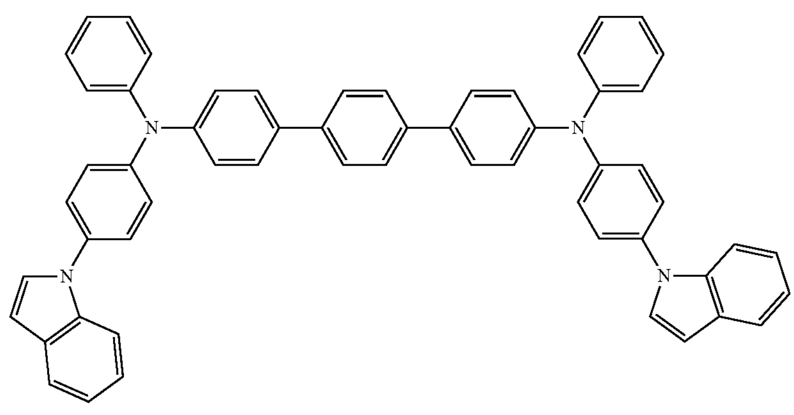

-continued
B132
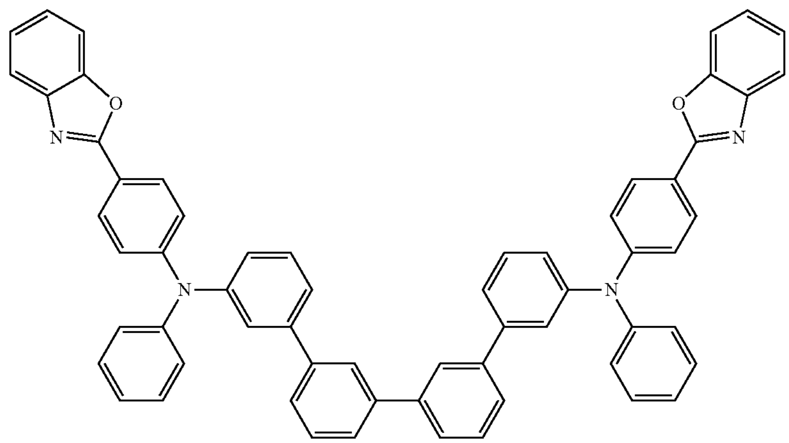
B133
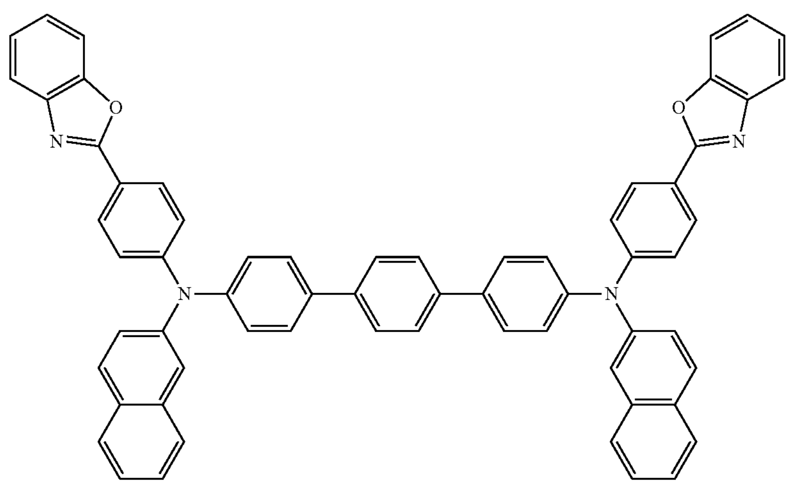
B134
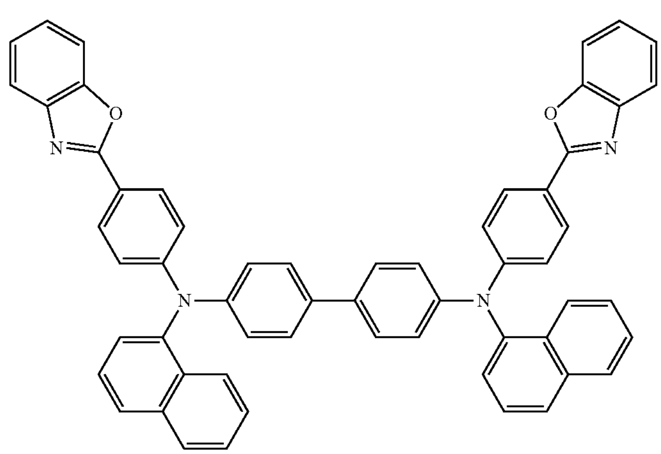

-continued
B135
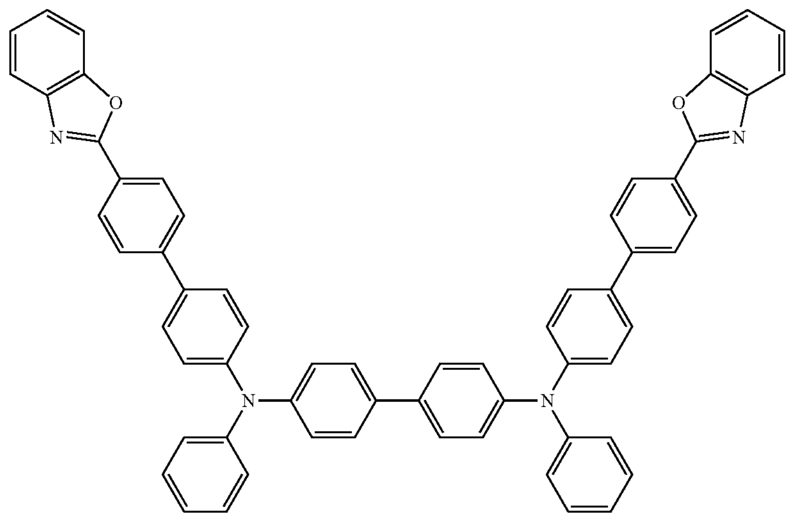
B136
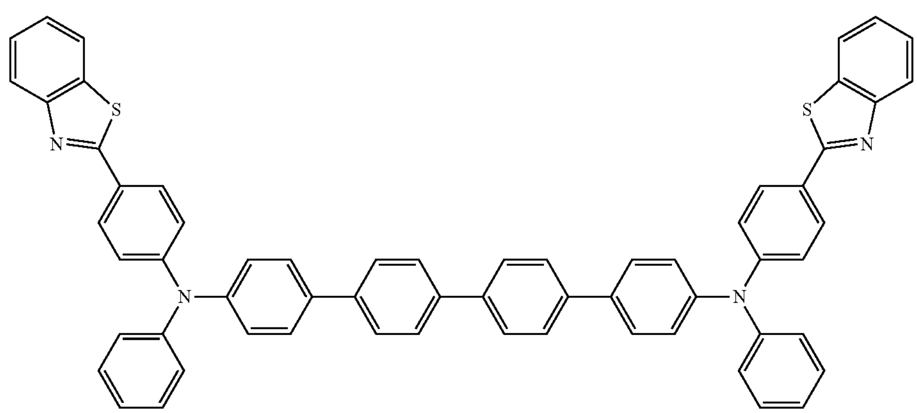
B137
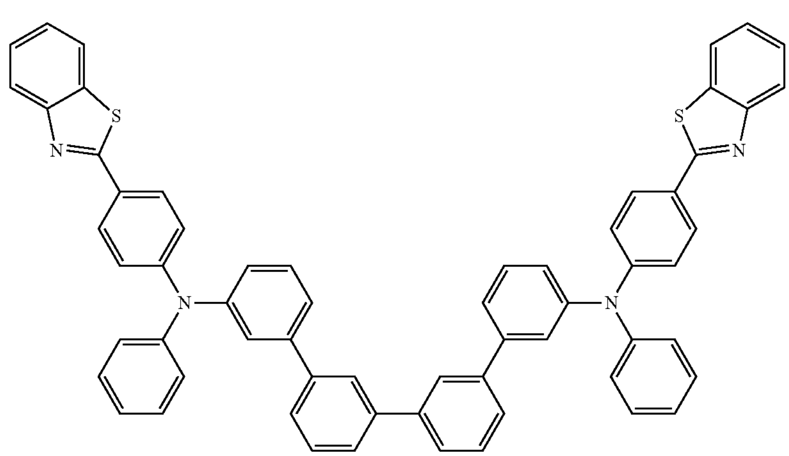

-continued
B138
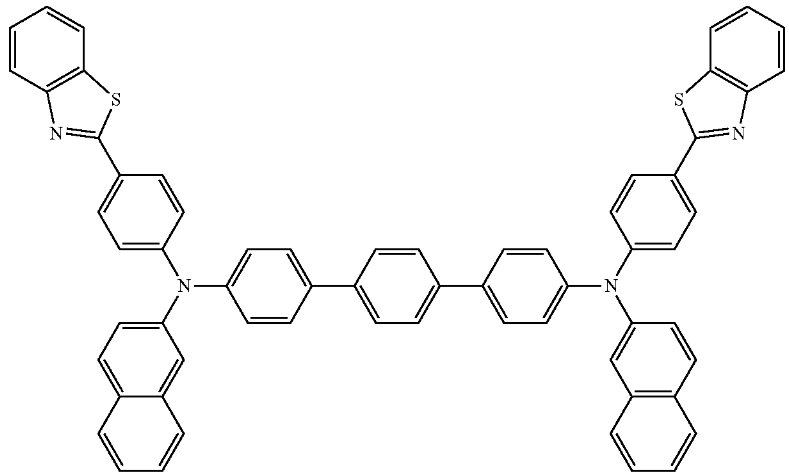
B139
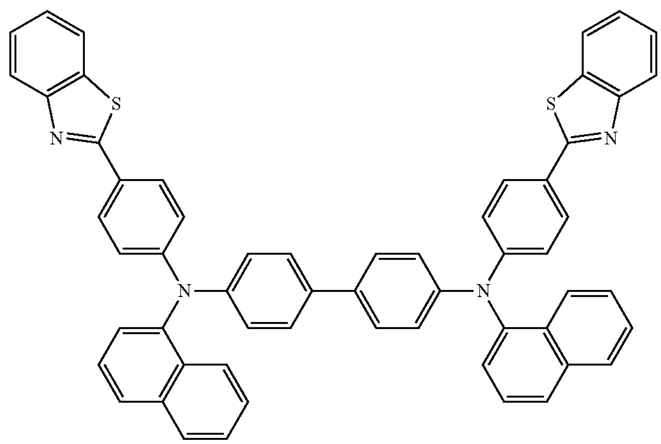
B140
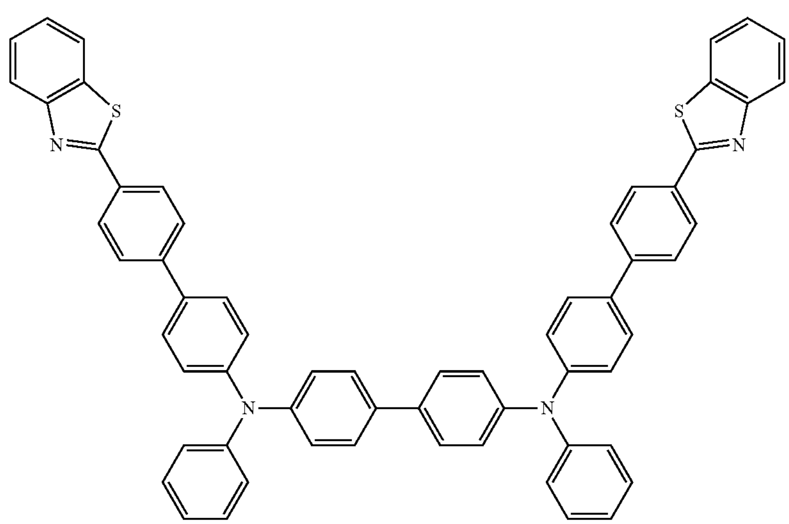

-continued
B141
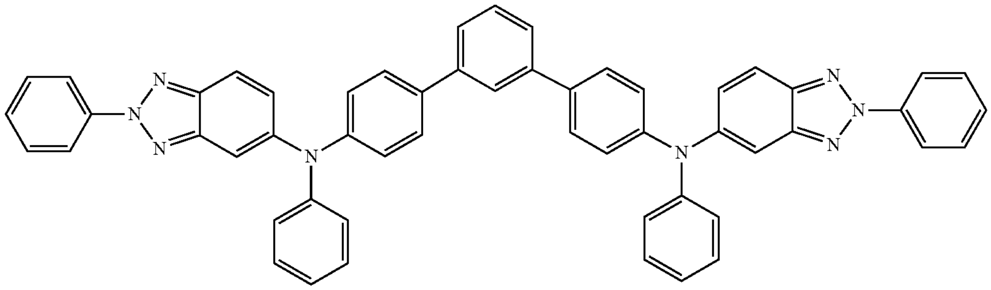
B142
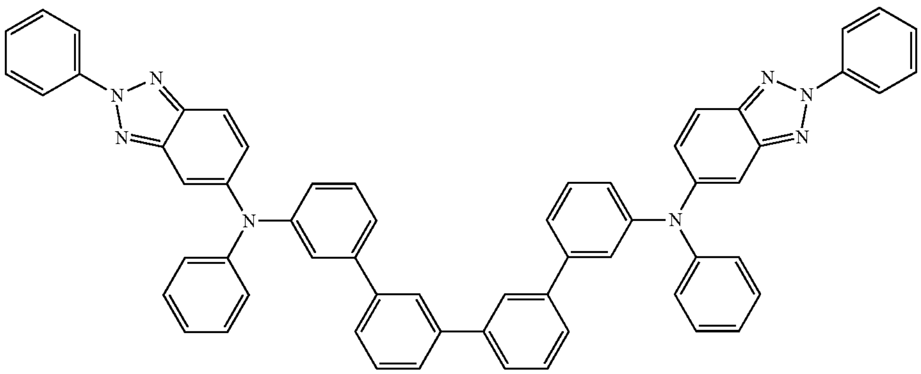
B143
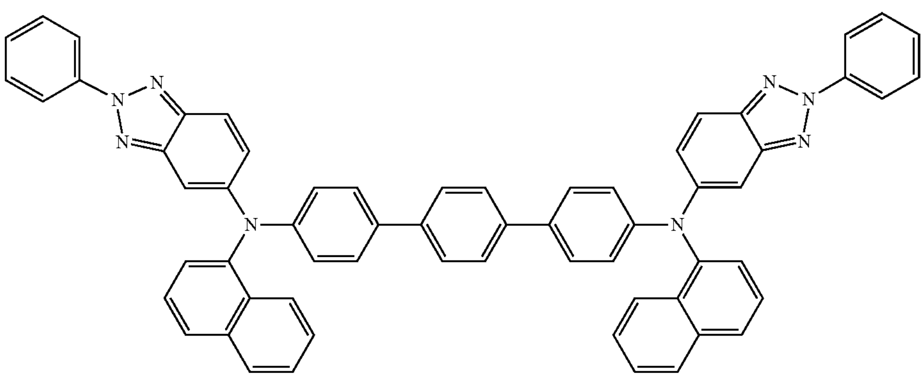
B144
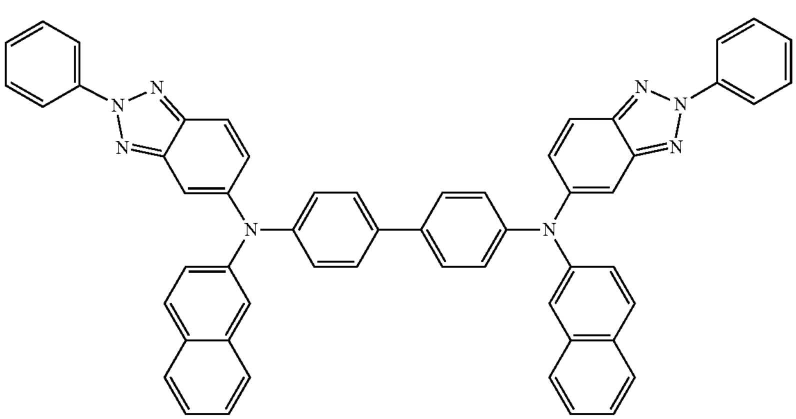

-continued

B145

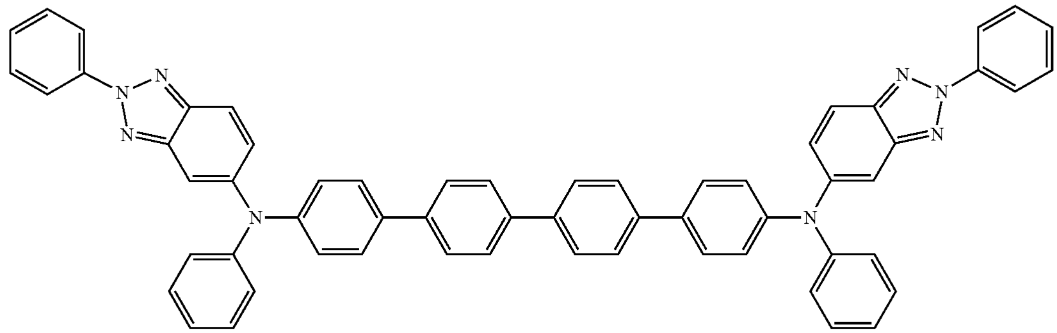

The specific example of the substituents defined above can be found in the compounds of Formulae B1 to B145 but are not intended to limit the scope of the compound represented by Formula B.

The introduction of the characteristic skeletal structures and various substituents into the compounds employed in the light emitting layer and the capping layer of the organic electroluminescent device according to the present invention allows the compounds to have inherent characteristics of the skeletal structures and the substituents. This introduction makes the organic electroluminescent device highly efficient.

The organic electroluminescent device of the present invention may include one or more organic layers interposed between the first and second electrodes wherein at least one of the organic layers includes the compound represented by Formula A-1 or A-2. According to one embodiment of the present invention, the light emitting layer may be the organic layer including the compound represented by Formula A-1 or A-2.

That is, according to one embodiment of the present invention, the organic electroluminescent device has a structure in which the organic layers are arranged between the first electrode and the second electrode. The organic electroluminescent device of the present invention may be fabricated by a suitable method known in the art using suitable materials known in the art, except that the compound of Formula A-1 or A-2 is used to form the corresponding organic layer.

The organic layers of the organic electroluminescent device according to the present invention may form a monolayer structure. Alternatively, the organic layers may have a multilayer laminate structure. For example, the structure of the organic layers may include a hole injecting layer, a hole transport layer, a hole blocking layer, a light emitting layer, an electron blocking layer, an electron transport layer, and an electron injecting layer, but is not limited thereto. The number of the organic layers is not limited and may be increased or decreased. Preferred structures of the organic layers of the organic electroluminescent device according to the present invention will be explained in more detail in the Examples section that follows.

According to one embodiment of the present invention, the organic electroluminescent device further includes a substrate. In this embodiment, the first electrode serves as an anode, the second electrode serves as a cathode, and the capping layer is formed under the first electrode (bottom emission type) or on the second electrode (top emission type).

When the organic electroluminescent device is of a top emission type, light from the light emitting layer is emitted to the cathode and passes through the capping layer (CPL) formed using the compound of the present invention having a relatively high refractive index. The wavelength of the light is amplified in the capping layer, resulting in an increase in luminous efficiency. Also when the organic electroluminescent device is of a bottom emission type, the compound of the present invention can be employed in the capping layer to improve the luminous efficiency of the organic electroluminescent device based on the same principle.

A more detailed description will be given concerning one embodiment of the organic electroluminescent device according to of the present invention.

The organic electroluminescent device includes an anode, a hole transport layer, a light emitting layer, an electron transport layer, and a cathode. The organic electroluminescent device may optionally further include a hole injecting layer between the anode and the hole transport layer and an electron injecting layer between the electron transport layer and the cathode. If necessary, the organic electroluminescent device may further include one or two intermediate layers such as a hole blocking layer or an electron blocking layer. The organic electroluminescent device may further include one or more organic layers, including the capping layer, that have various functions depending on the desired characteristics of the device.

The light emitting layer of the organic electroluminescent device according to the present invention includes, as a host compound, an anthracene derivative represented by Formula D:

[Formula D]

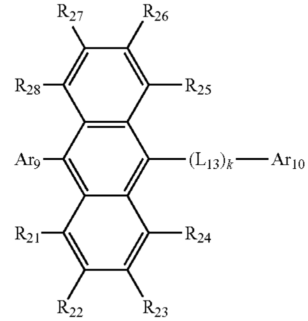

wherein $R_{21}$ to $R_{28}$ are identical to or different from each other and are as defined for $R_1$ to $R_5$ in Formula A-1 or A-2, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula D is represented by Formula D-1:

[Formula D-1]

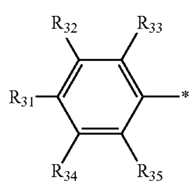

wherein $R_{31}$ to $R_{35}$ are identical to or different from each other and are as defined for $R_1$ to $R_5$ in Formula A-1 or A-2, and each of $R_{31}$ to $R_{35}$ is optionally bonded to an adjacent substituent to form a saturated or unsaturated ring.

The compound of Formula D employed in the organic electroluminescent device of the present invention may be specifically selected from the compounds of Formulae D1 to D48:

D1

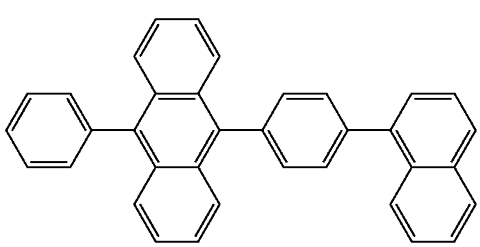

D2

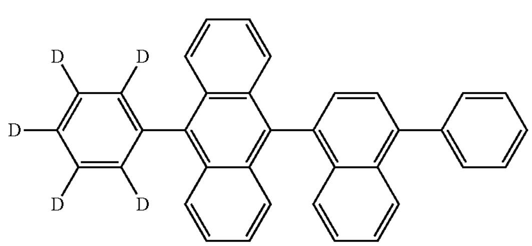

-continued

D3

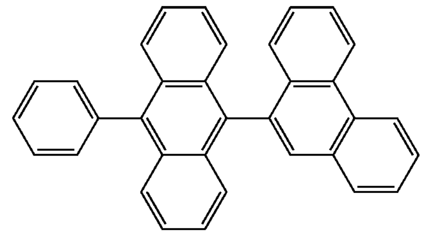

D4

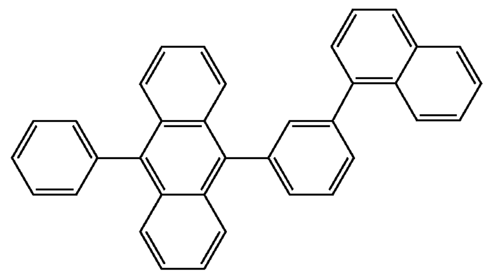

D5

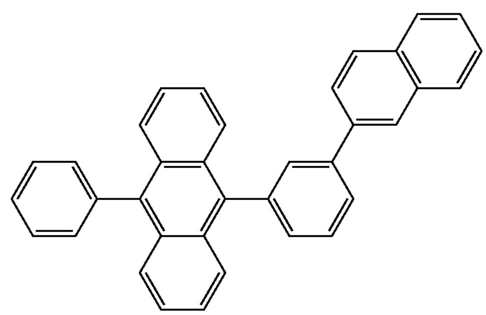

D6

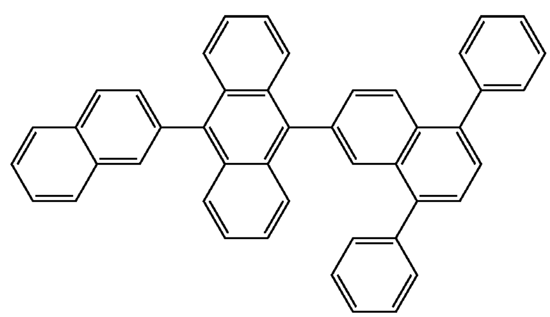

D7

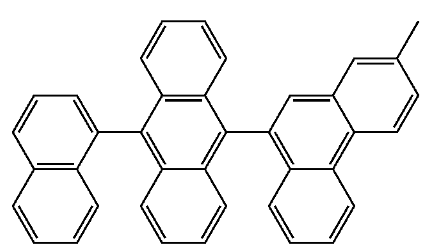

-continued
D8
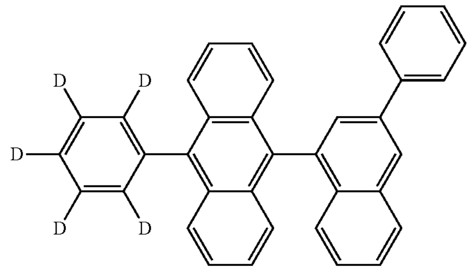
D9
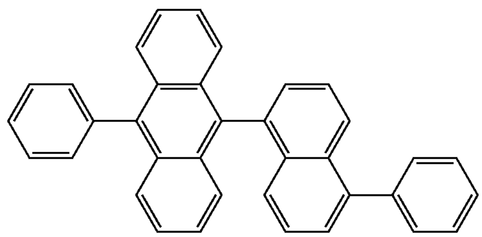
D10
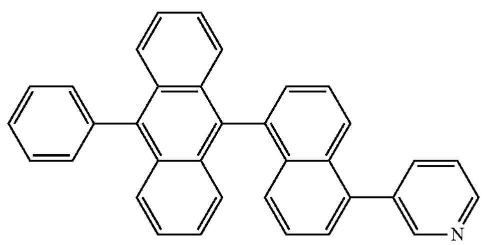
D11
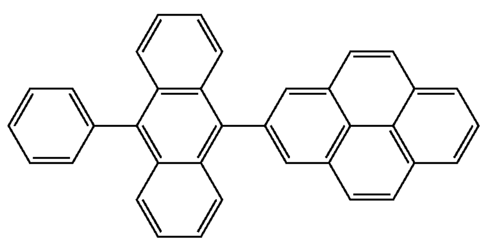
D12
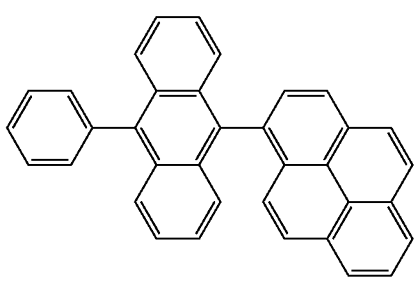
D13
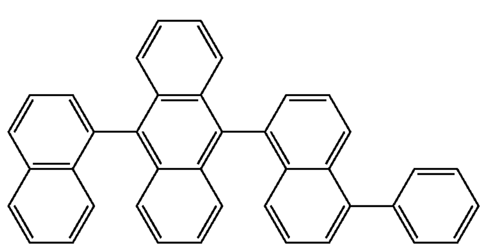
-continued
D14
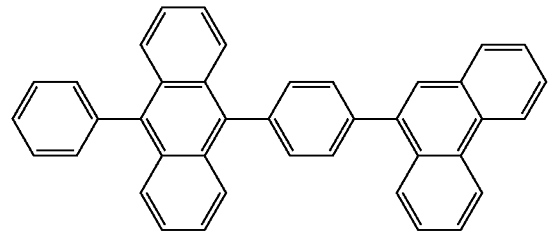
D15
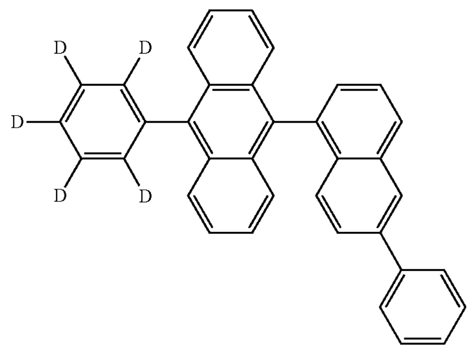
D16
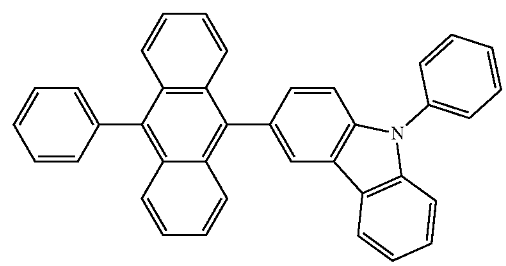
D17
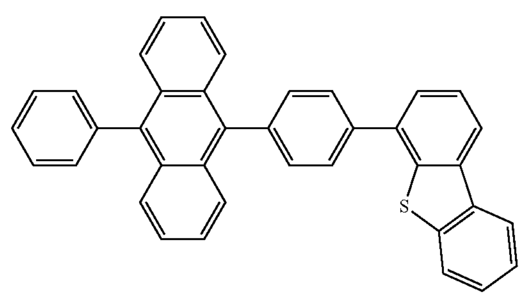
D18
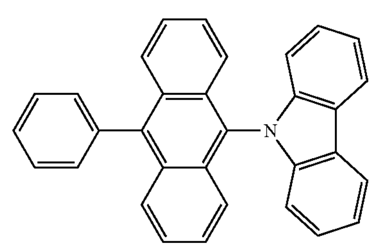

-continued
D19
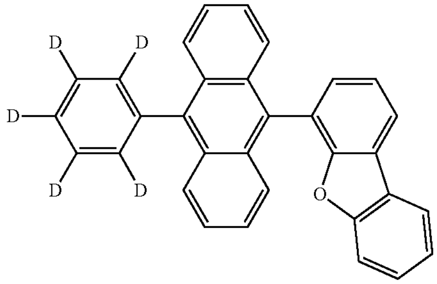
D20
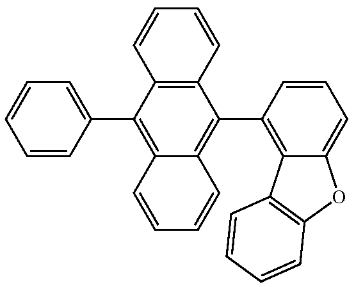
D21
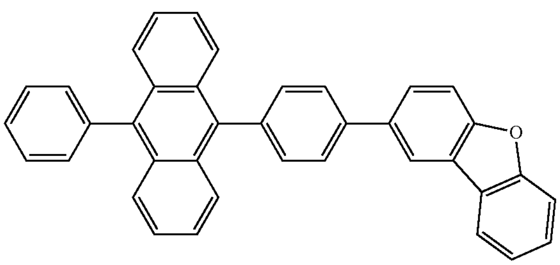
D22
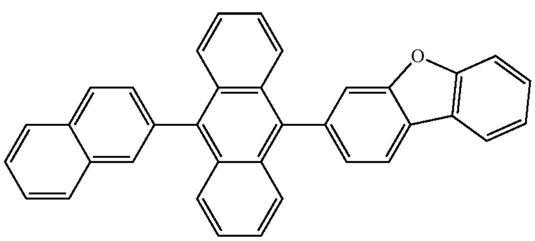
D23
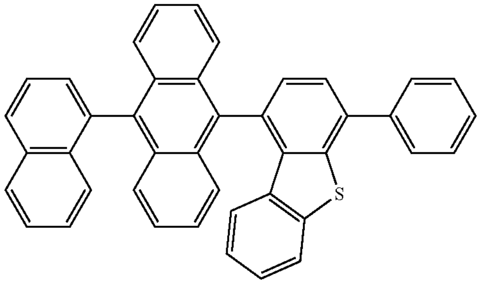
-continued
D24
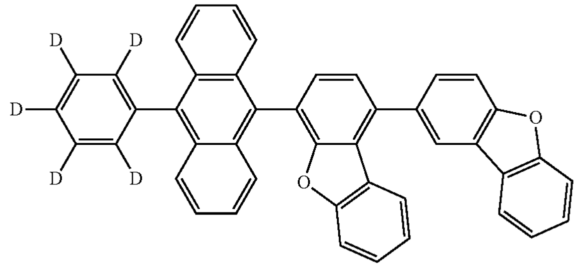
D25
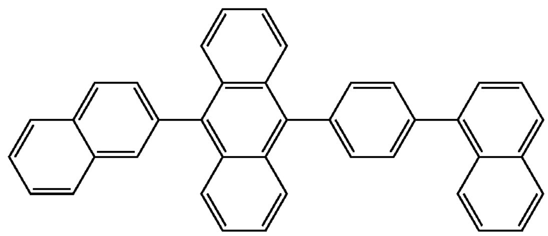
D26
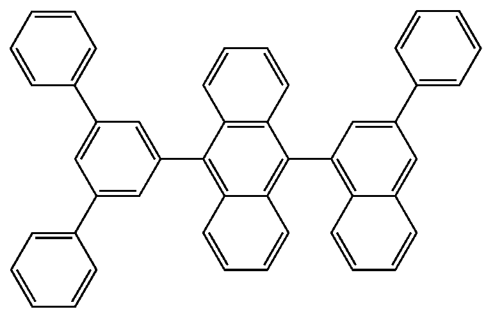
D27
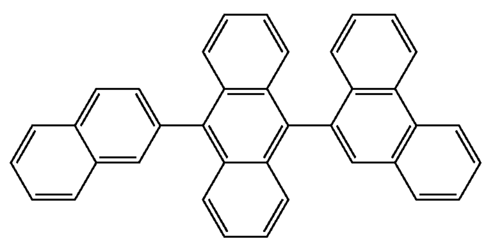
D28
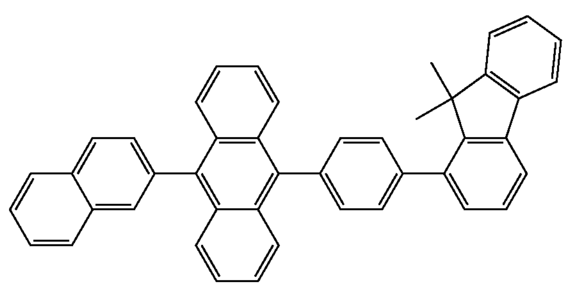

D29
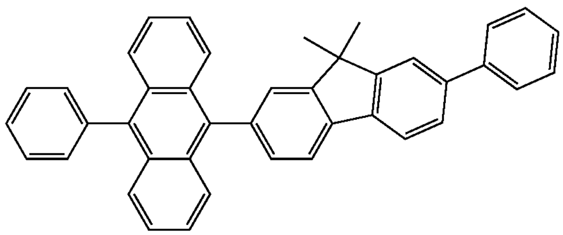
D30
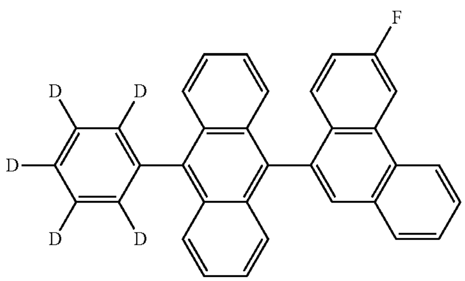
D31
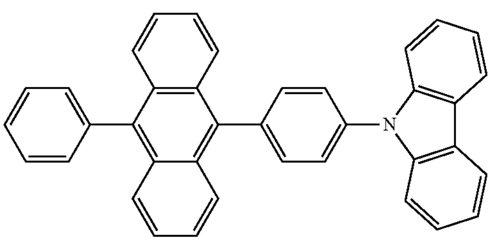
D32
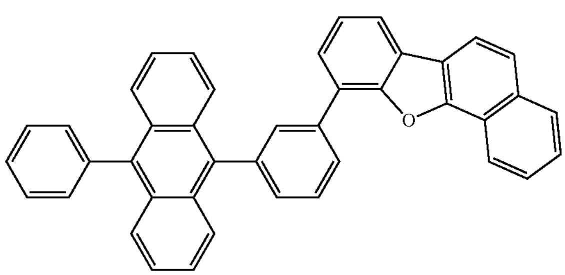
D33
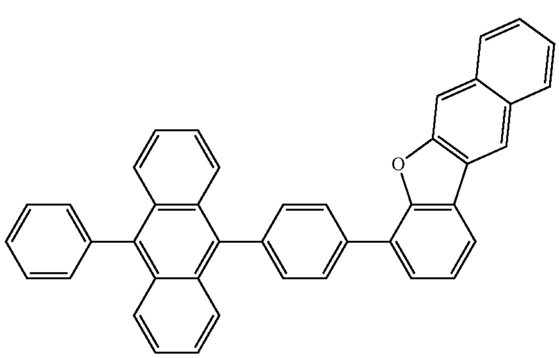
D34
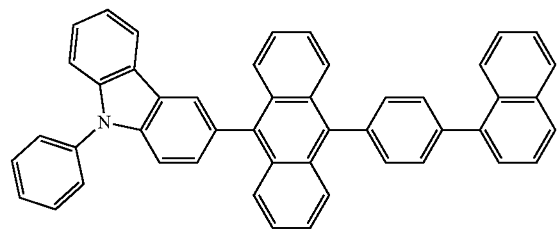
D35
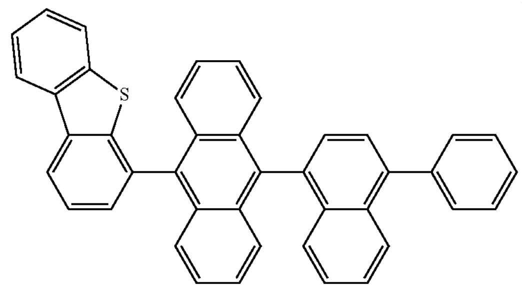
D36
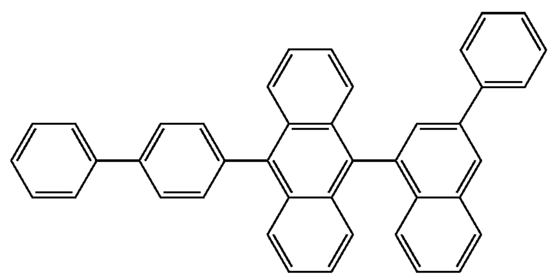
D37
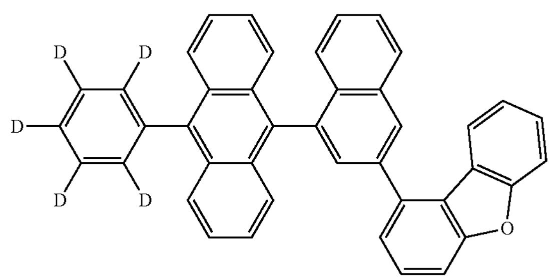
D38
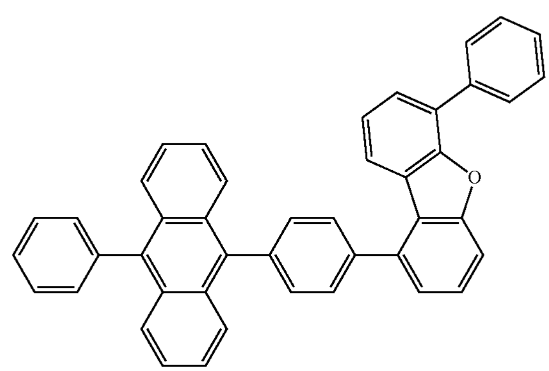

D39
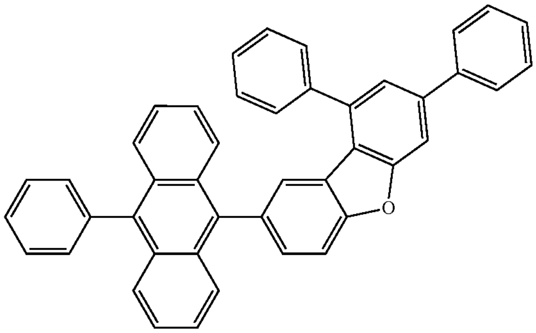
D40
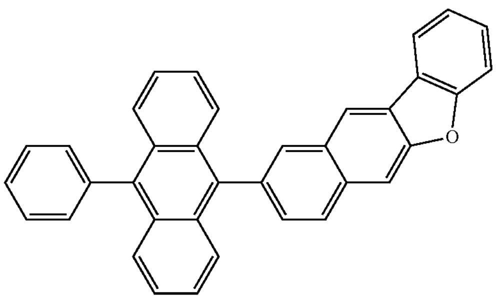
D41
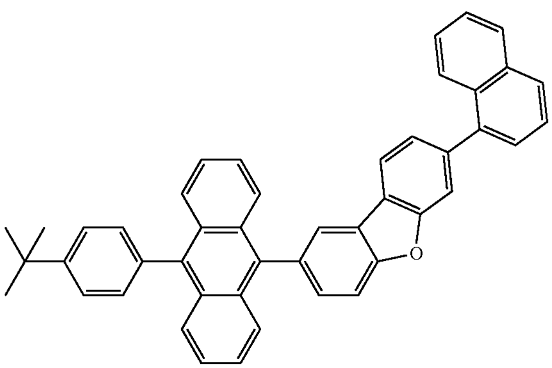
D42
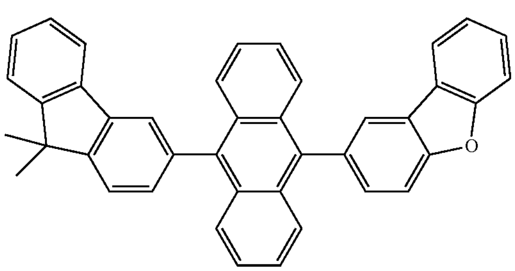
D43
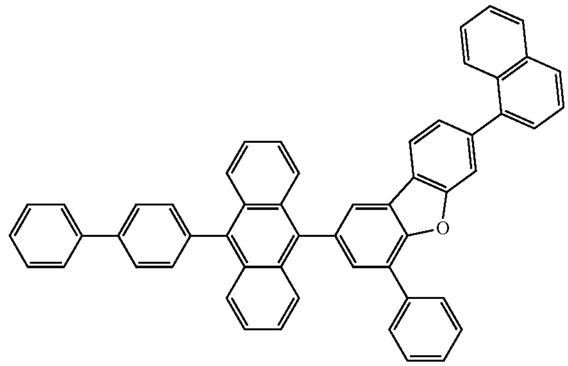
D44
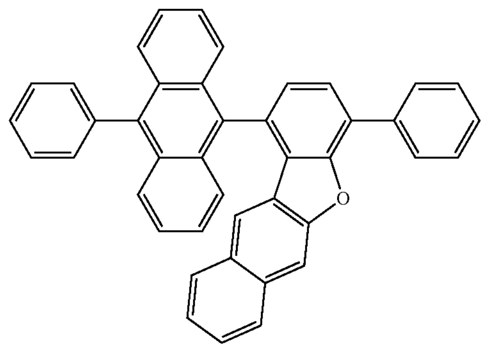
D45
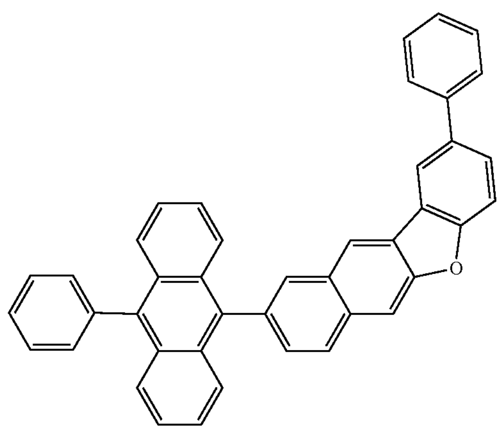
D46
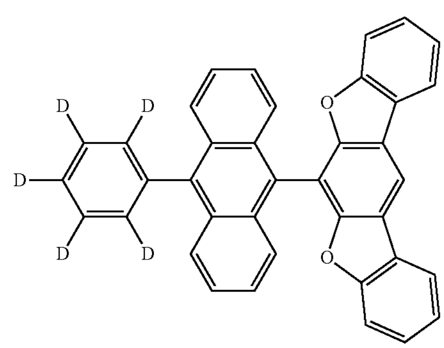

-continued

D47

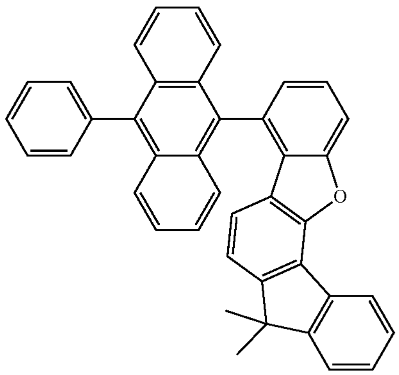

D48

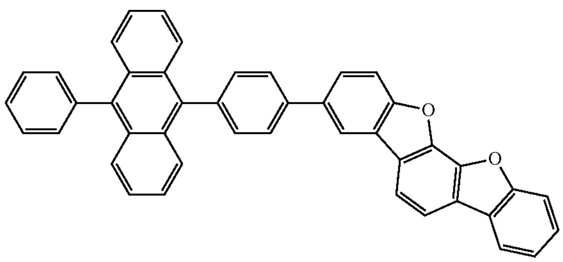

Each of the hole transport layer and the electron blocking layer may include a compound represented by Formula E:

[Formula E]

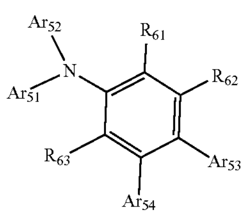

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

The compound of Formula E employed in the organic electroluminescent device of the present invention may be specifically selected from the compounds of Formulae E1 to E33:

E1

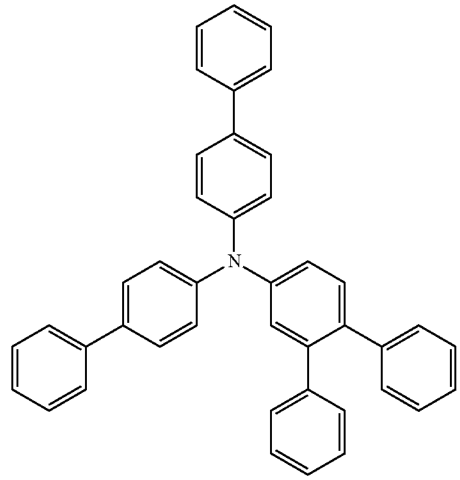

E2

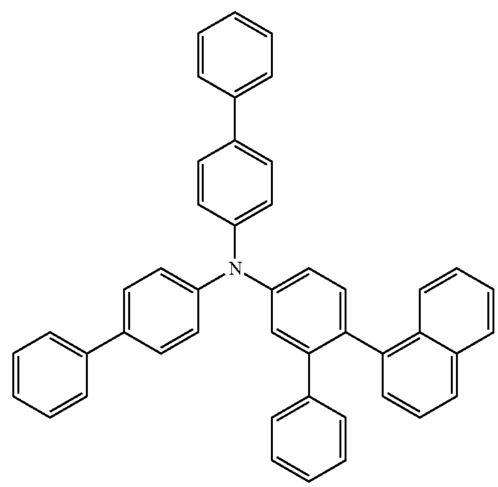

E3

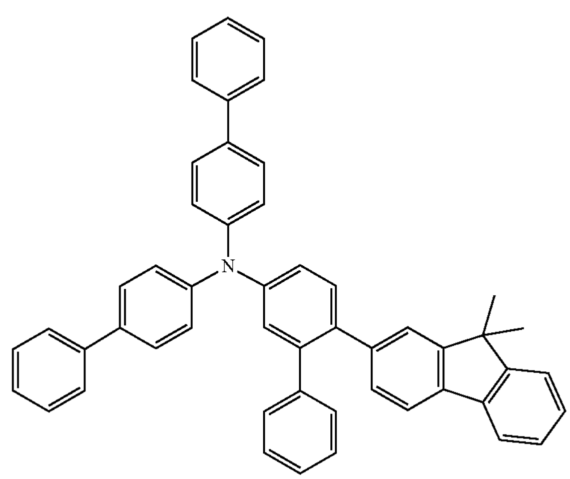

-continued
E4
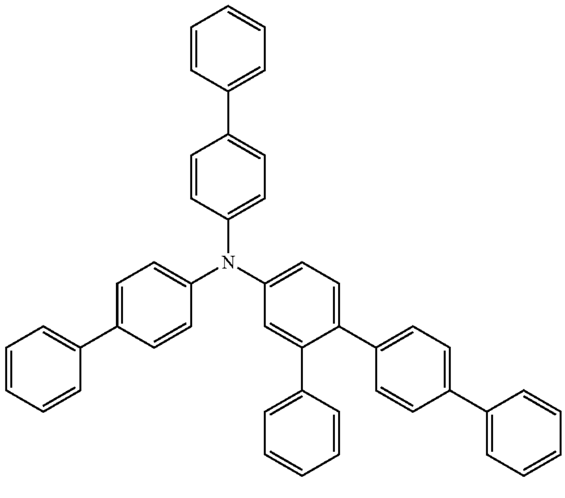
E5
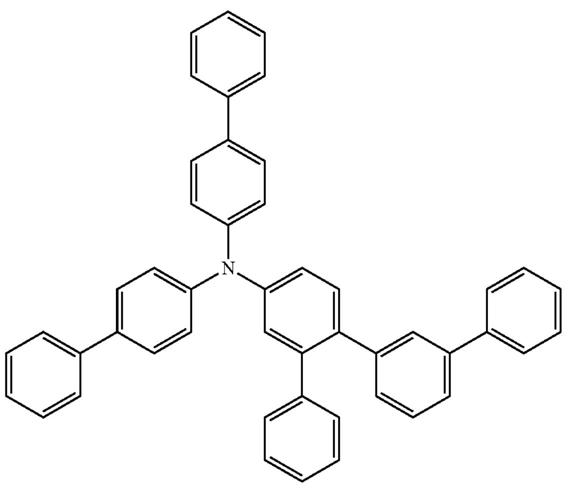
E6
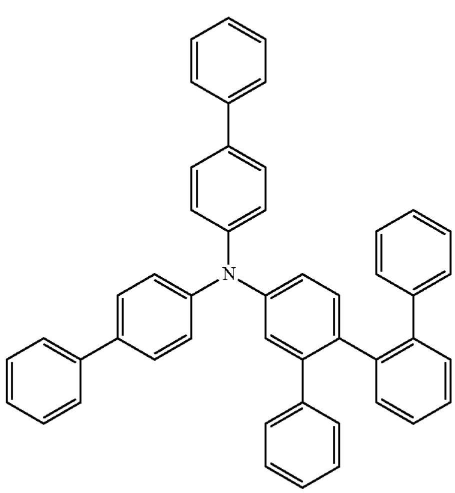
-continued
E7
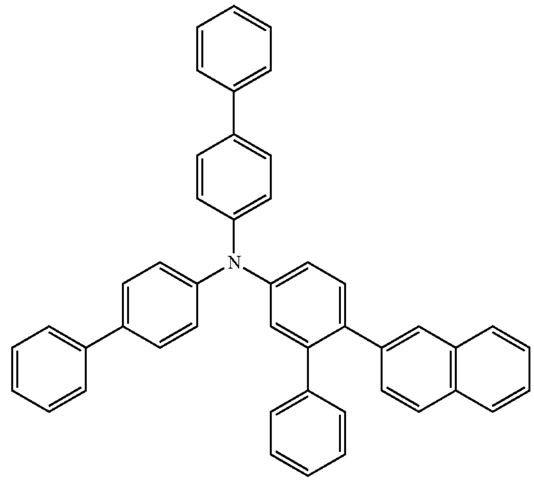
E8
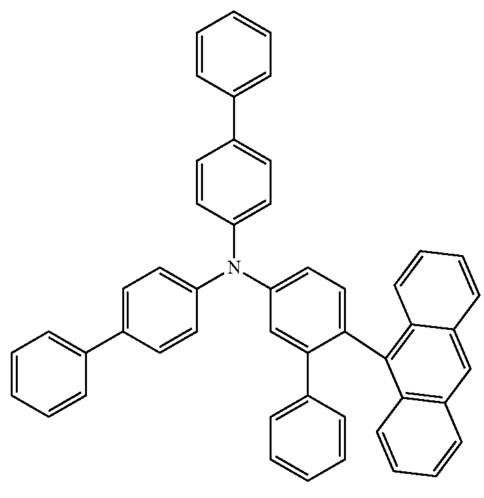
E9
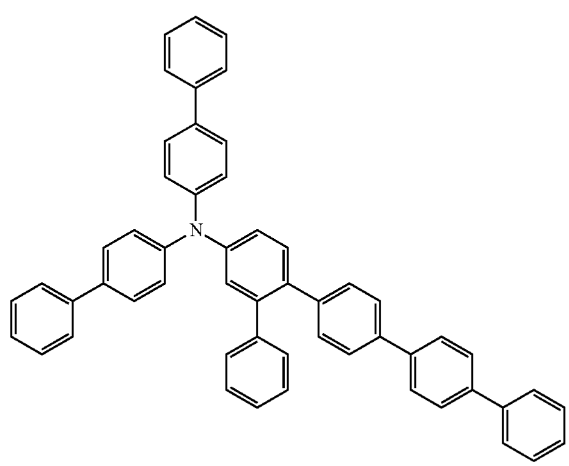

E10
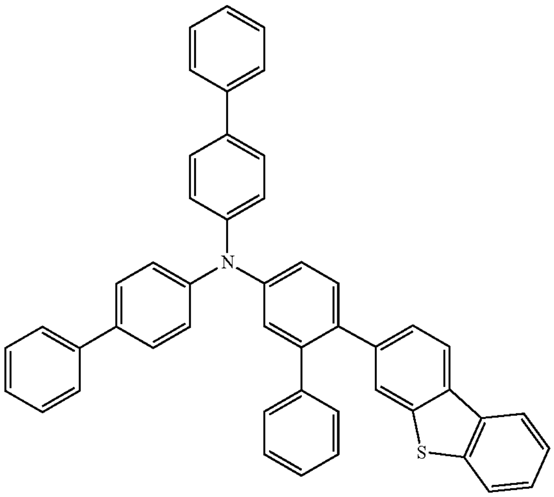
E11
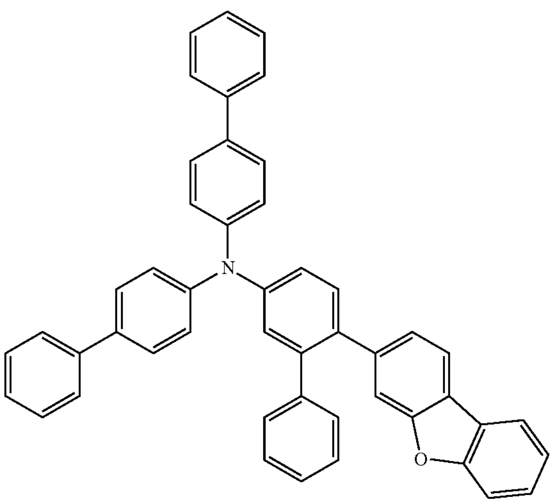
E12
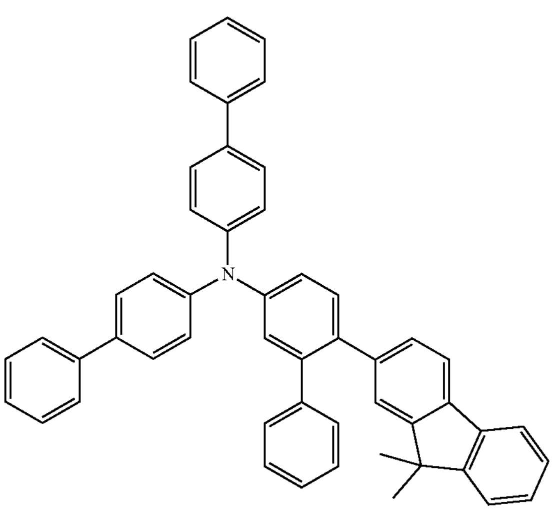
E13
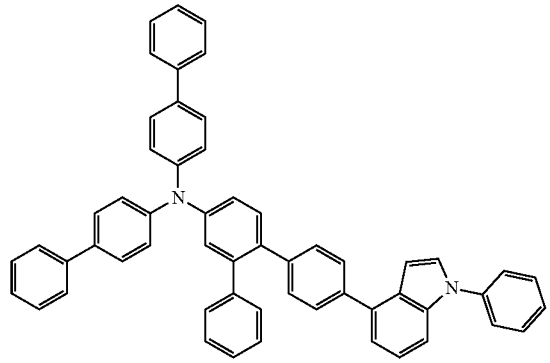
E14
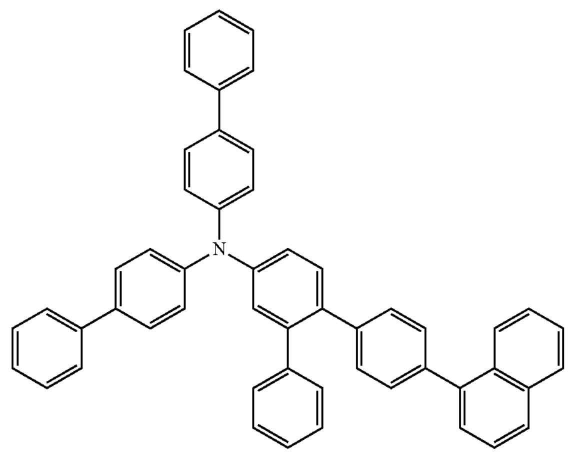
E15
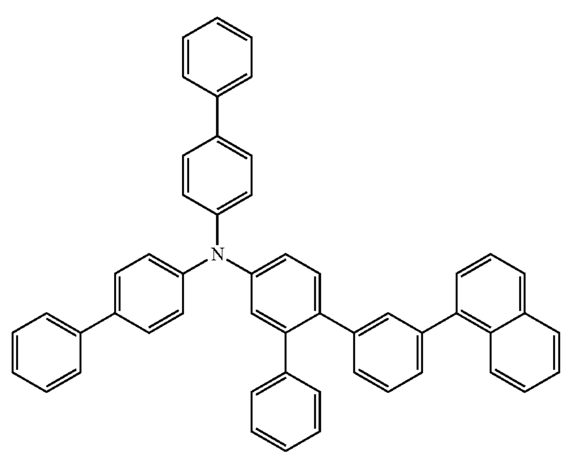

E16
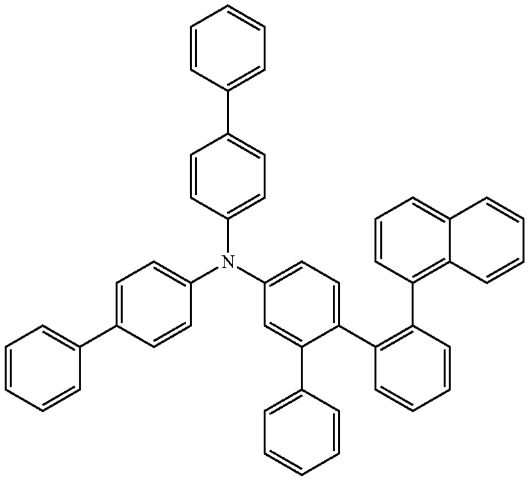
E17
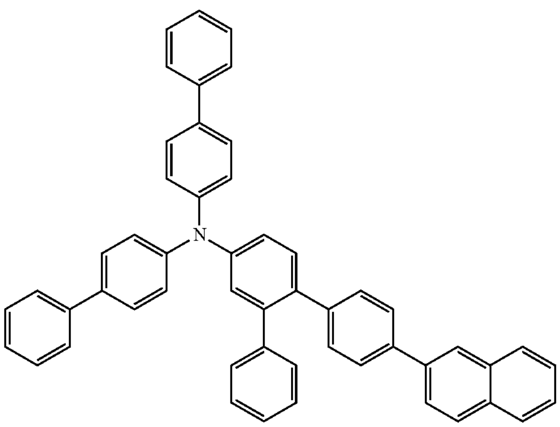
E18
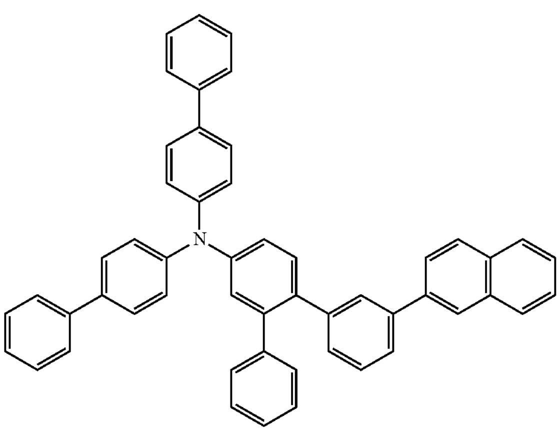
E19
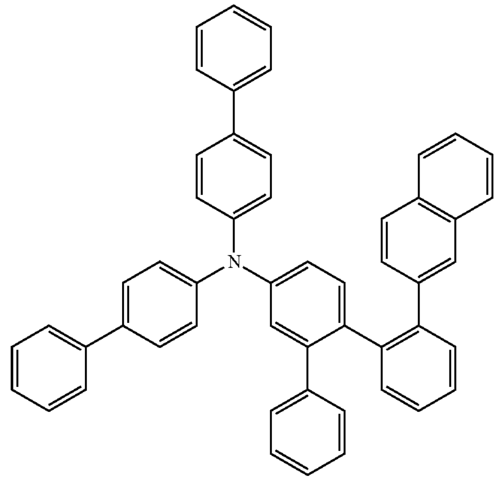
E20
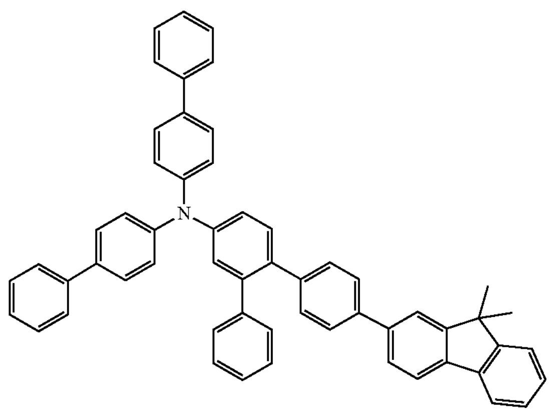
E21
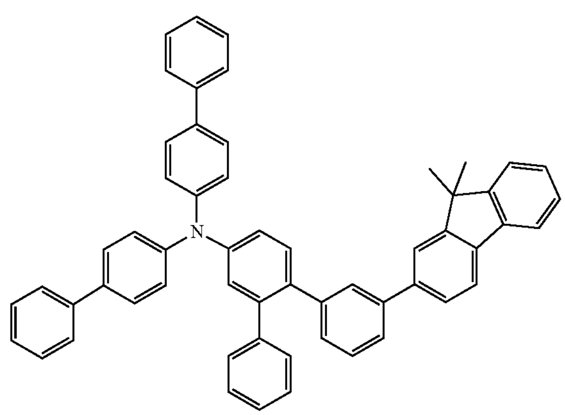

-continued
E22
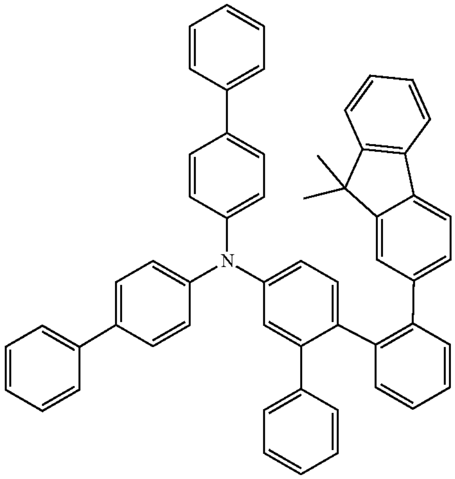
E23
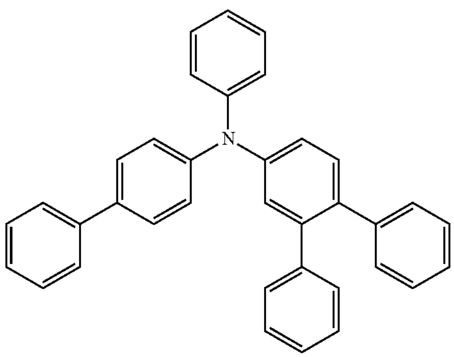
E24
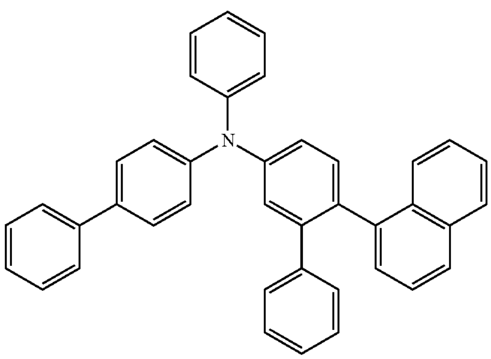
E25
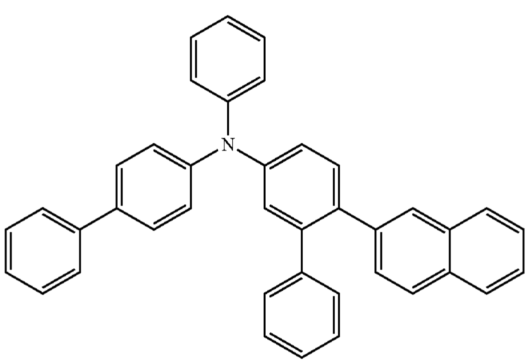
-continued
E26
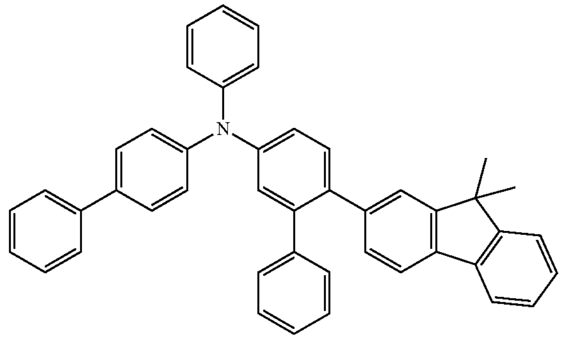
E27
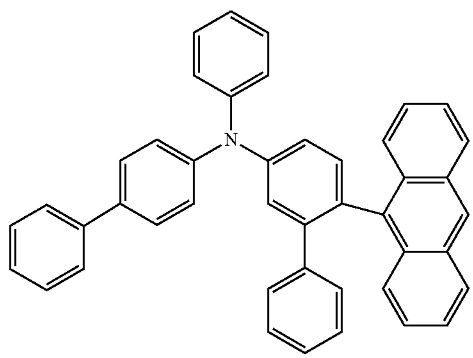
E28
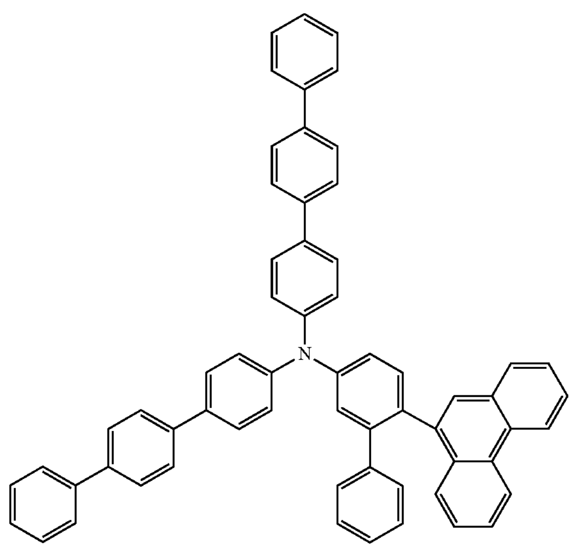

-continued

E29

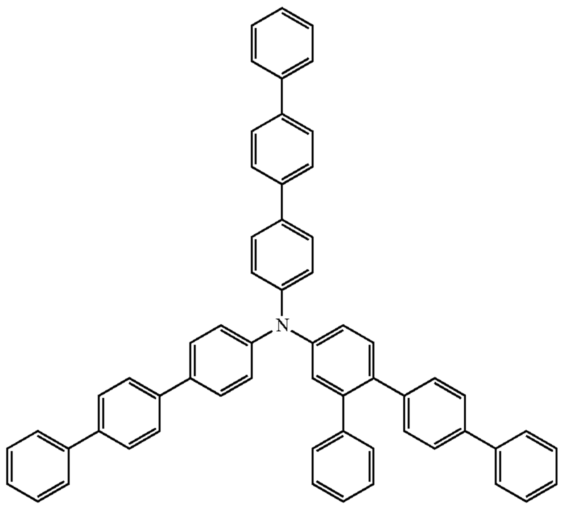

E30

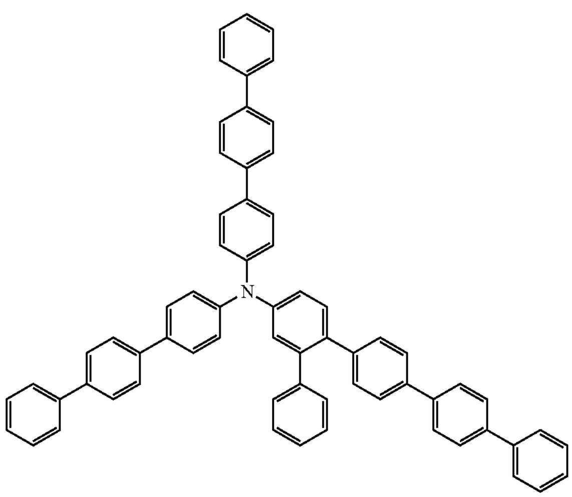

E31

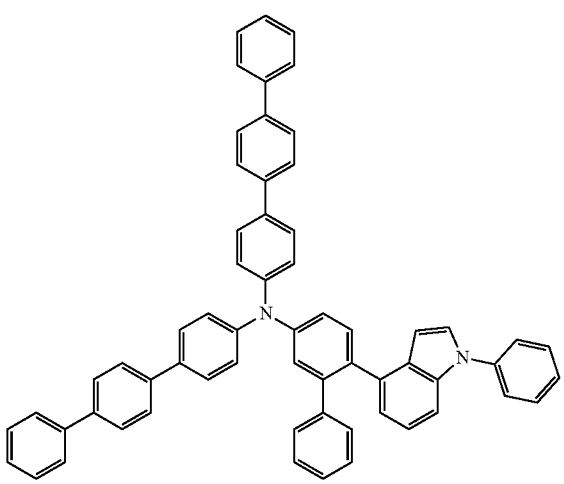

-continued

E32

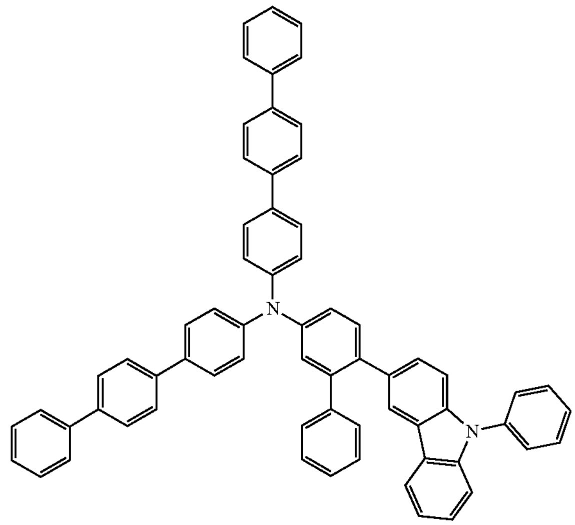

E33

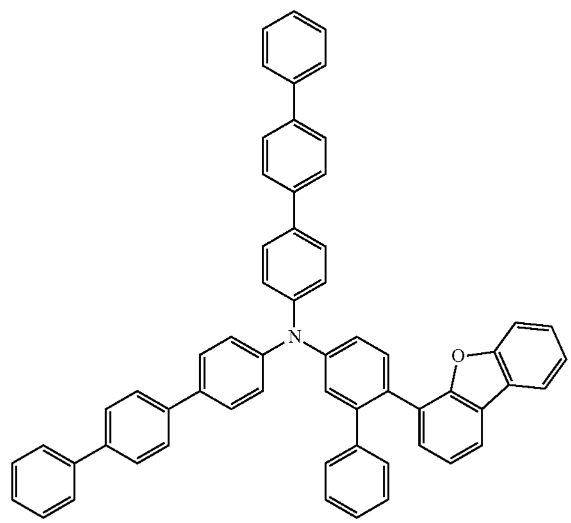

A specific structure of the organic electroluminescent device according to the present invention, a method for fabricating the device, and materials for the organic layers will be described below.

First, a material for the anode is coated on the substrate to form the anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide, such as indium tin oxide (ITO), indium zinc oxide (IZO), tin oxide ($SnO_2$) or zinc oxide (ZnO), is used as the anode material.

A material for the hole injecting layer is coated on the anode by vacuum thermal evaporation or spin coating to form the hole injecting layer. Then, a material for the hole transport layer is coated on the hole injecting layer by vacuum thermal evaporation or spin coating to form the hole transport layer.

The material for the hole injecting layer is not specially limited so long as it is usually used in the art. Specific examples of such materials include 4,4',4"-tris(2-naphthyl (phenyl)amino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis[4-(phenyl-m-tolylamino)phenyl]biphenyl-4,4'-diamine (DNTPD).

The material for the hole transport layer is not specially limited so long as it is commonly used in the art. Examples of such materials include N,N'-bis(3-methylphenyl)-N,N'-diphenyl-[1,1-biphenyl]-4,4'-diamine (TPD) and N,N'-di (naphthalen-1-yl)-N,N'-diphenylbenzidine (α-NPD).

Subsequently, a hole auxiliary layer and the light emitting layer are sequentially laminated on the hole transport layer. A hole blocking layer may be optionally formed on the organic light emitting layer by vacuum thermal evaporation or spin coating. The hole blocking layer blocks holes from entering the cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it has the ability to transport electrons and a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, Liq, and the compounds of Formulae 501 to 507:

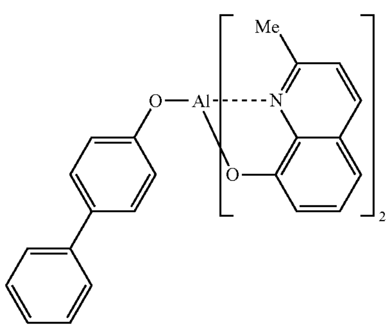

BAlq

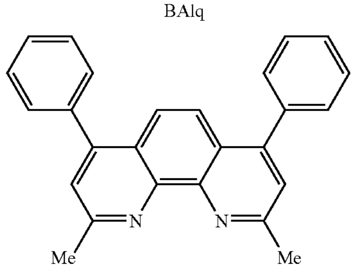

BCP

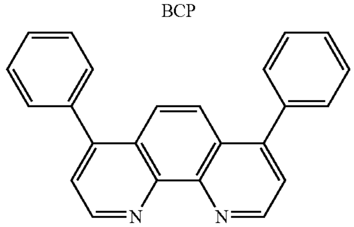

Bphen

-continued

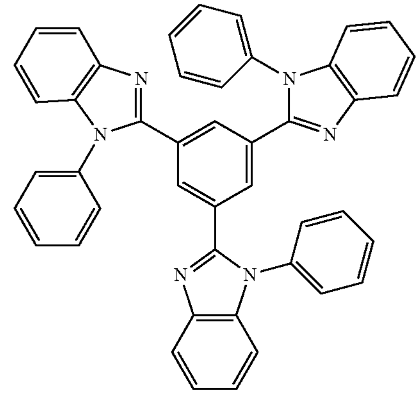

TPBI

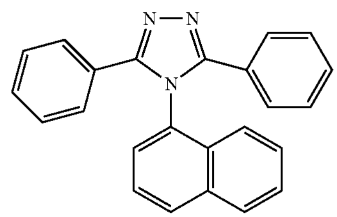

NTAZ

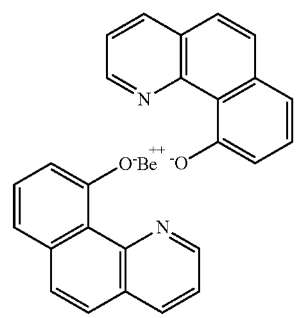

$BeBq_2$

OXD-7

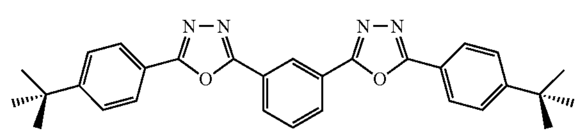

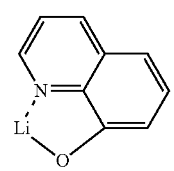

Liq

501

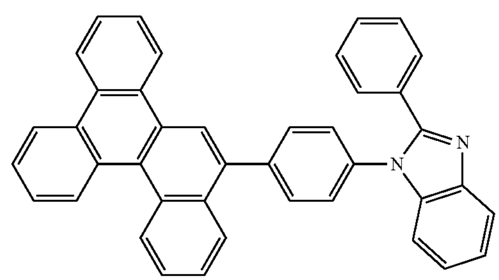

-continued

502

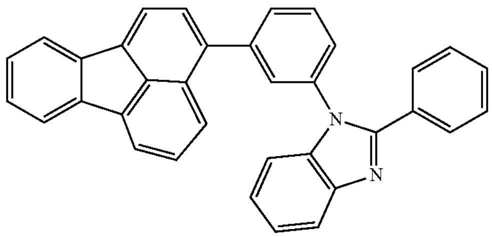

503

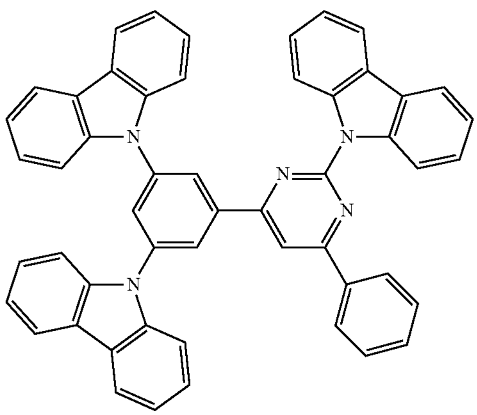

504

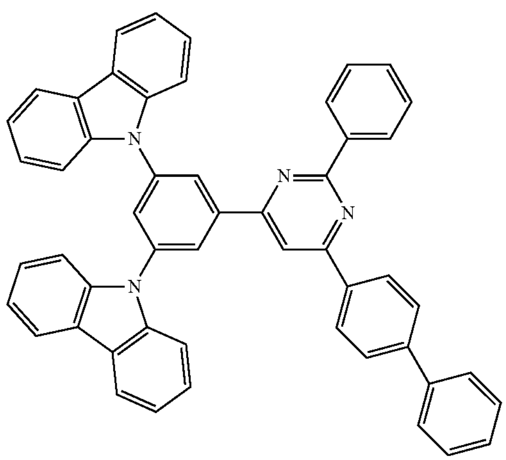

505

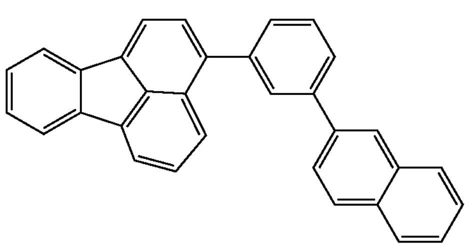

-continued

506

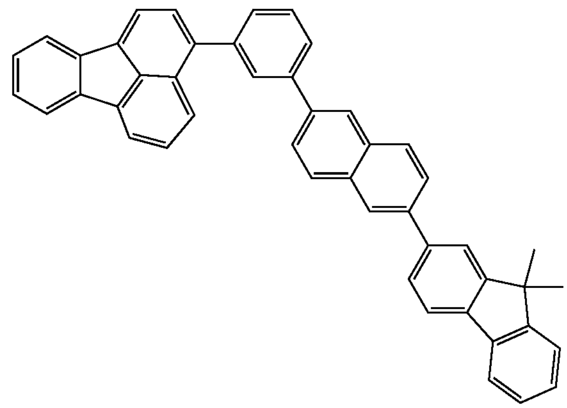

507

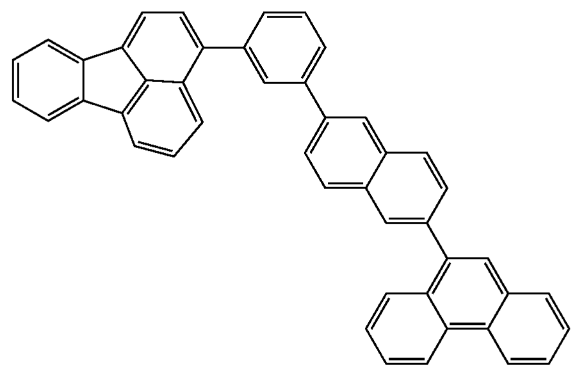

The electron transport layer is deposited on the hole blocking layer by vacuum thermal evaporation or spin coating, and the electron injecting layer is formed thereon. A metal for the cathode is deposited on the electron injecting layer by vacuum thermal evaporation to form the cathode, completing the fabrication of the organic electroluminescent device.

As the metal for the formation of the cathode, there may be used, for example, lithium (Li), magnesium (Mg), aluminum (Al), aluminum-lithium (Al—Li), calcium (Ca), magnesium-indium (Mg—In) or magnesium-silver (Mg—Ag). The organic electroluminescent device may be of top emission type. In this case, a transmissive material, such as ITO or IZO, may be used to form the cathode.

The material for the electron transport layer functions to stably transport electrons injected from the cathode. The electron transport material may be any of those known in the art and examples thereof include, but are not limited to, quinoline derivatives, particularly, tris(8-quinolinolate)aluminum (Alq3), TAZ, BAlq, beryllium bis(benzoquinolin-10-olate (Bebg2), ADN, the compounds of Formulae 401 and 402, and oxadiazole derivatives, such as PBD, BMD, and BND:

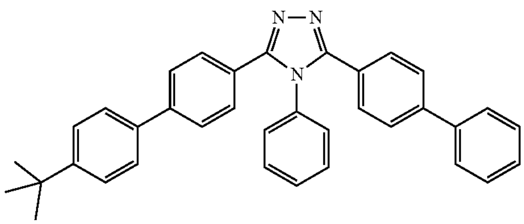

TAZ

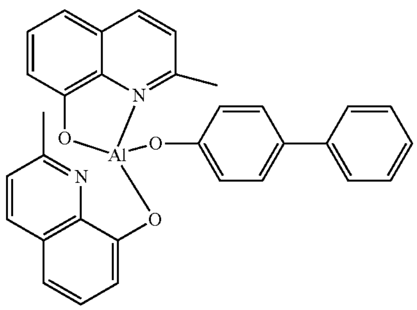

BAlq

401

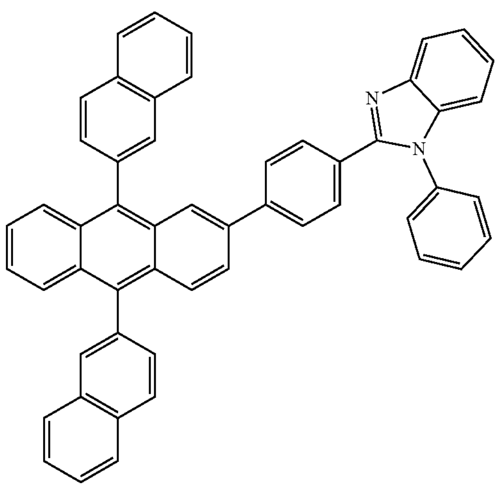

402

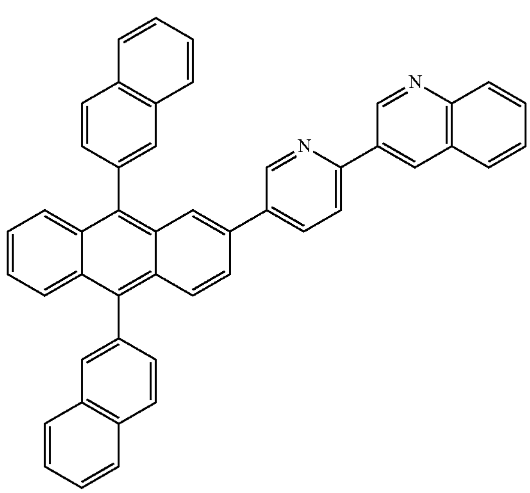

-continued

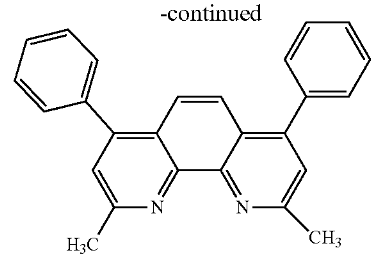

BCP

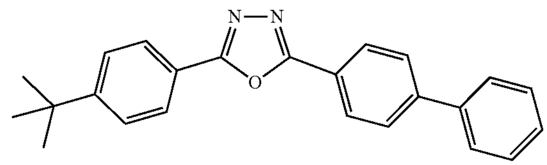

PBD

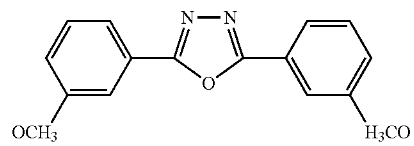

BMD

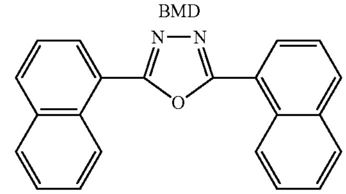

BND

The light emitting layer may further include various host materials and various dopant materials.

Each of the organic layers can be formed by a monomolecular deposition or solution process. According to the monomolecular deposition process, the material for each layer is evaporated under heat and vacuum or reduced pressure to form the layer in the form of a thin film. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR CARRYING OUT THE INVENTION

The present invention will be explained in more detail with reference to the following examples. However, it will be obvious to those skilled in the art that these examples are in no way intended to limit the scope of the invention.

Synthesis of the Compounds Represented by Formula A-1/Formula A-2

Synthesis Example 1: Synthesis of Compound 1

Synthesis Example 1-1: Synthesis of Intermediate 1-a

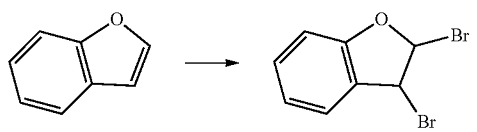

<Intermediate 1-a>

Benzofuran (50 g, 423 mmol) and dichloromethane (500 mL) were stirred in a 1 L reactor. The mixture was cooled to −10° C. and a dilute solution of bromine (67.7 g, 423 mmol) in dichloromethane (100 mL) was added dropwise thereto. The resulting mixture was stirred at 0° C. for 2 h. After completion of the reaction, the reaction mixture was added with an aqueous sodium thiosulfate solution, stirred, and extracted with ethyl acetate and $H_2O$. The organic layer was recrystallized from ethanol to afford Intermediate 1-a (100 g, yield 93%).

Synthesis Example 1-2: Synthesis of Intermediate 1-b

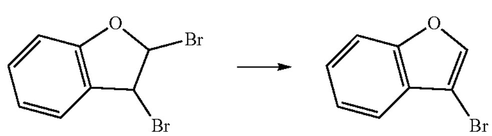

<Intermediate 1-b>

Potassium hydroxide (48.6 g, 866 mmol) and ethanol (400 mL) were dissolved in a 1 L reactor and a solution of Intermediate 1-a (120 g, 433 mmol) in ethanol was added dropwise thereto at 0° C. After the dropwise addition was finished, the mixture was refluxed with stirring for 2 h. After completion of the reaction, the reaction mixture was concentrated under reduced pressure to remove the ethanol and extracted with ethyl acetate and water. The organic layer was concentrated and purified by column chromatography to afford Intermediate 1-b (42 g, yield 50%)

Synthesis Example 1-3: Synthesis of Intermediate 1-c

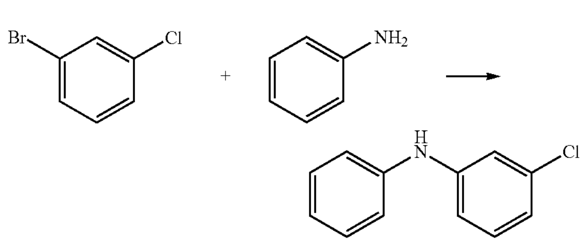

<Intermediate 1-c>

1-Bromo-3-iodobenzene (4.5 g, 16 mmol), aniline (5.8 g, 16 mmol), palladium acetate (0.1 g, 1 mmol), sodium tert-butoxide (3 g, 32 mmol), bis(diphenylphosphino)-1,1'-binaphthyl (0.2 g, 1 mmol), and toluene (45 mL) were placed in a 100 mL reactor. The mixture was refluxed with stirring for 24 h. After completion of the reaction, the reaction mixture was filtered. The filtrate was concentrated and purified by column chromatography to afford Intermediate 1-c (5.2 g, yield 82%).

Synthesis Example 1-4: Synthesis of Intermediate 1-d

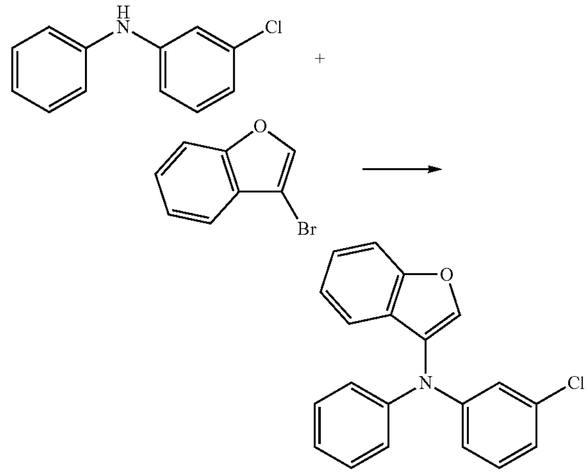

<Intermediate 1-d>

Intermediate 1-c (20 g, 98 mmol), Intermediate 1-b (18.4 g, 98 mmol), palladium acetate (0.5 g, 2 mmol), sodium tert-butoxide (18.9 g, 196 mmol), tri-tert-butylphosphine (0.8 g, 4 mmol), and toluene (200 mL) were placed in a 250 mL reactor. The mixture was refluxed with stirring. After completion of the reaction, the reaction mixture was filtered. The filtrate was concentrated and purified by column chromatography to afford Intermediate 1-d (22 g, yield 75%)

Synthesis Example 1-5: Synthesis of Intermediate 1-e

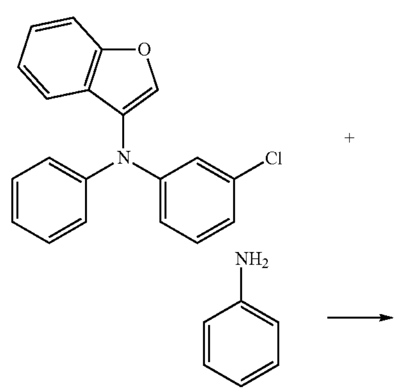

-continued

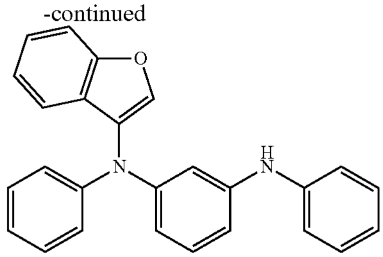

<Intermediate 1-e>

Intermediate 1-e (18.5 g, yield 74.1%) was synthesized in the same manner as in Synthesis Example 1-3, except that Intermediate 1-d was used instead of 1-bromo-4-iodobenzene.

Synthesis Example 1-6: Synthesis of Intermediate 1-f

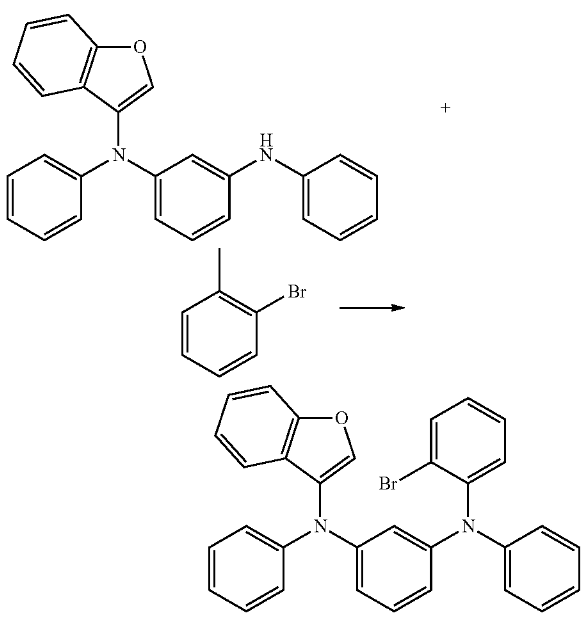

<Intermediate 1-f>

Intermediate 1-f (12 g, yield 84.1%) was synthesized in the same manner as in Synthesis Example 1-4, except that Intermediate 1-e and 1-bromo-2-iodobenzene were used instead of Intermediate 1-c and Intermediate 1-b.

Synthesis Example 1-7: Synthesis of Compound 1

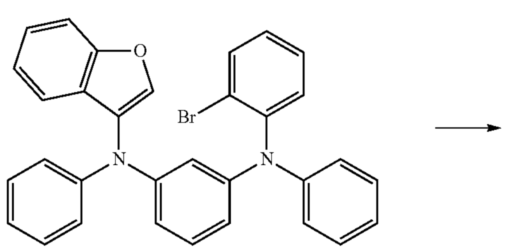

-continued

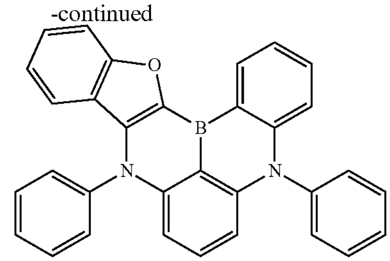

<Compound 1>

Intermediate 1-f (12 g, 23 mmol) and tert-butylbenzene (120 mL) were placed in a 300 mL reactor, and n-butyllithium (42.5 mL, 68 mmol) was added dropwise thereto at −78° C. After the dropwise addition was finished, the mixture was stirred at 60° C. for 3 h. Thereafter, the reactor was flushed with nitrogen to remove heptane. After dropwise addition of boron tribromide (11.3 g, 45 mmol) at −78° C., the resulting mixture was stirred at room temperature for 1 h and N,N-diisopropylethylamine (5.9 g, 45 mmol) was added dropwise thereto at 0° C. After the dropwise addition was finished, the mixture was stirred at 120° C. for 2 h. After completion of the reaction, the reaction mixture was added with an aqueous sodium acetate solution at room temperature, stirred, and extracted with ethyl acetate. The organic layer was concentrated and purified by column chromatography to give Compound 1 (0.8 g, yield 13%).

MS (MALDI-TOF): m/z 460.17 [$M^+$]

Synthesis Example 2: Synthesis of Compound 2

Synthesis Example 2-1: Synthesis of Intermediate 2-a

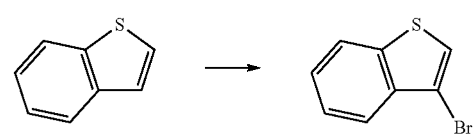

<Intermediate 2-a>

Benzothiophene (50 g, 373 mmol) and chloroform (500 mL) were stirred in a 1 L reactor. The mixture was cooled to 0° C. and a dilute solution of bromine (59.5 g, 373 mmol) in chloroform (100 mL) was added dropwise thereto. After the dropwise addition was finished, the resulting mixture was stirred at room temperature for 4 h. After completion of the reaction, the reaction mixture was added with an aqueous sodium thiosulfate solution, stirred, and extracted. The organic layer was concentrated under reduced pressure and purified by column chromatography to afford Intermediate 2-a (70 g, yield 91%)

Synthesis Example 2-2: Synthesis of Intermediate 2-b

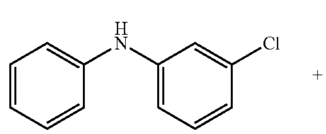

-continued

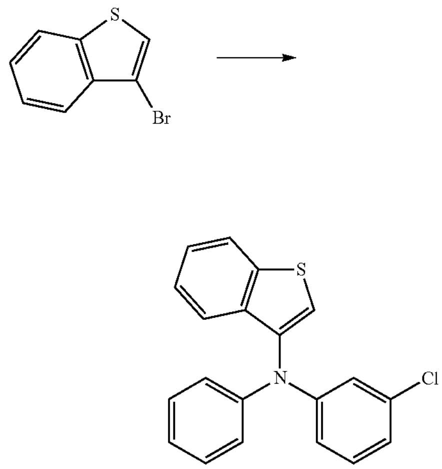

<Intermediate 2-b>

Intermediate 2-b (32 g, yield 75.4%) was synthesized in the same manner as in Synthesis Example 1-4, except that Intermediate 2-a was used instead of Intermediate 1-b.

Synthesis Example 2-3: Synthesis of Intermediate 2-c

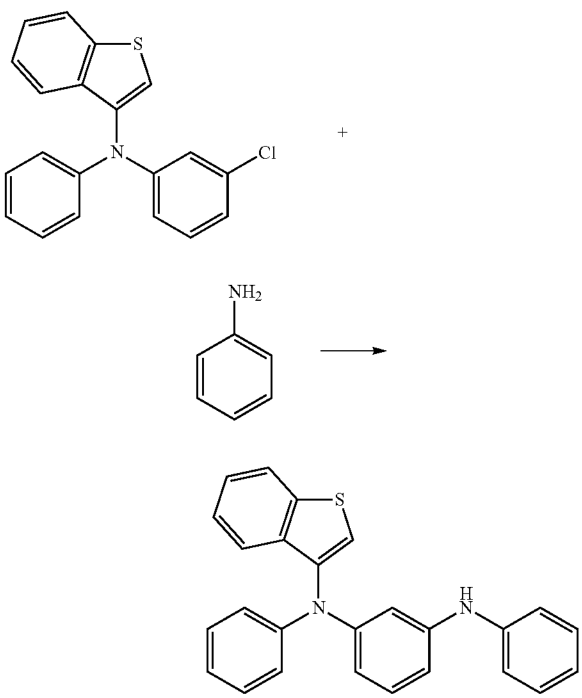

<Intermediate 2-c>

Intermediate 2-c (24.5 g, yield 73.1%) was synthesized in the same manner as in Synthesis Example 1-3, except that Intermediate 2-b was used instead of 1-bromo-4-iodobenzene.

Synthesis Example 2-4: Synthesis of Intermediate 2-d

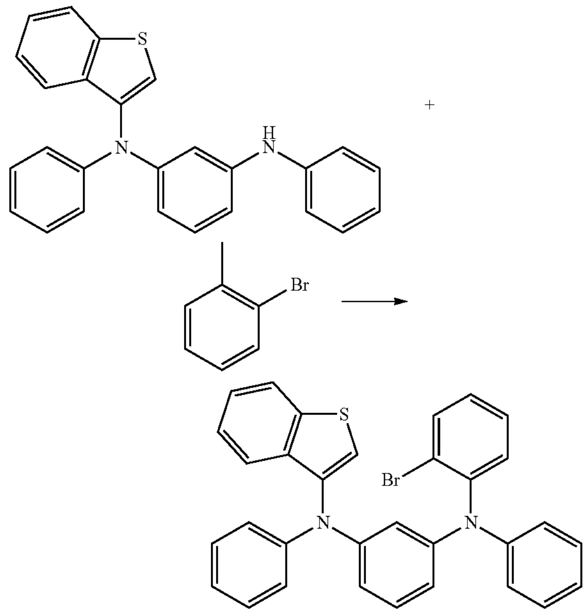

<Intermediate 2-d>

Intermediate 2-d (21 g, yield 77.5%) was synthesized in the same manner as in Synthesis Example 1-4, except that Intermediate 2-c and 1-bromo-2-iodobenzene were used instead of Intermediate 1-c and Intermediate 1-b.

Synthesis Example 2-5: Synthesis of Compound 2

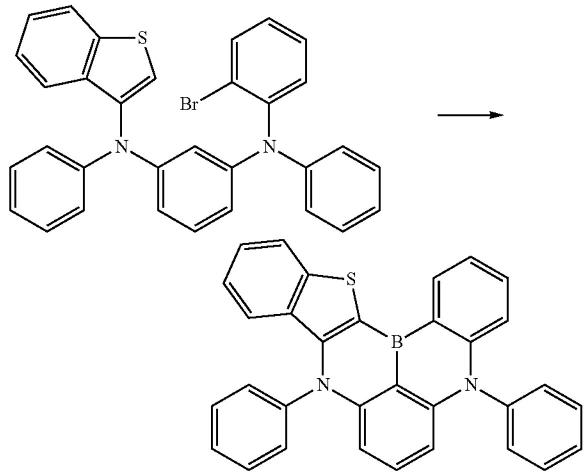

<Compound 2>

Compound 2 (1.5 g, yield 10.1%) was synthesized in the same manner as in Synthesis Example 1-7, except that Intermediate 2-d was used instead of Intermediate 1-f.

MS (MALDI-TOF): m/z 467.15 [$M^+$]

Synthesis Example 3: Synthesis of Compound 13

Synthesis Example 3-1: Synthesis of Intermediate 3-a

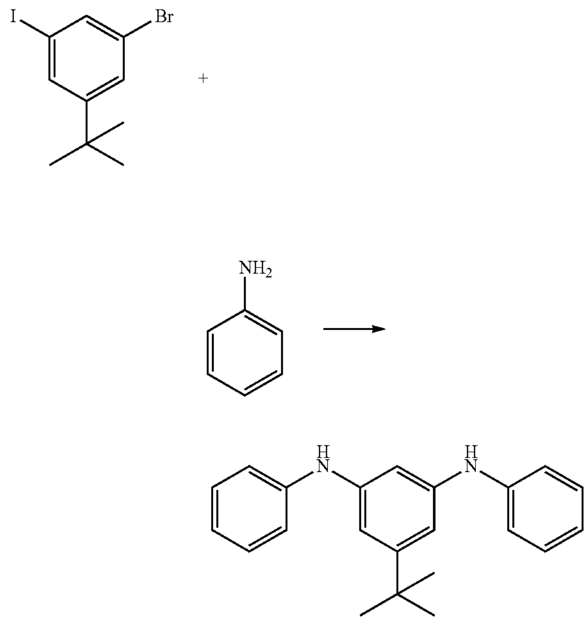

<Intermediate 3-a>

1-Bromo-3(tert-butyl)-5-iodobenzene (50 g, 177 mmol), aniline (36.2 g, 389 mmol), palladium acetate (1.6 g, 7 mmol), sodium tert-butoxide (51 g, 530 mmol), bis(diphenylphosphino)-1,1'-binaphthyl (4.4 g, 7 mmol), and toluene (500 mL) were placed in a 1 L reactor. The mixture was refluxed with stirring for 24 h. After completion of the reaction, the reaction mixture was filtered, concentrated, and purified by column chromatography to afford Intermediate 3-a (42.5 g, yield 50%).

Synthesis Example 3-2: Synthesis of Intermediate 3-b

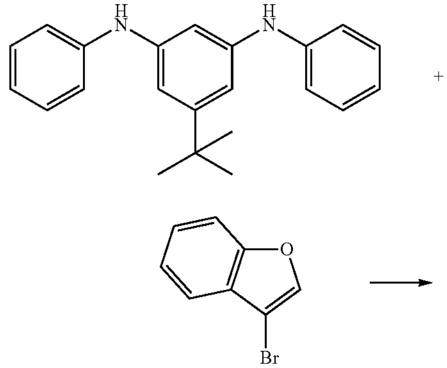

-continued

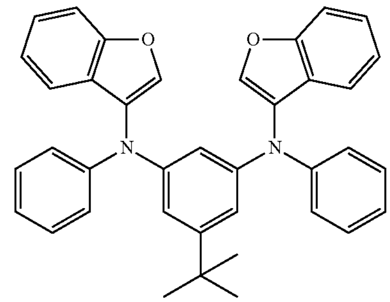

<Intermediate 3-b>

Intermediate 3-a (11 g, 42 mmol), Intermediate 1-b (20 g, 101 mmol), palladium acetate (1 g, 2 mmol), sodium tert-butoxide (12.2 g, 127 mmol), tri-tert-butylphosphine (0.7 g, 3 mmol), and toluene (150 mL) were placed in a 250 mL reactor. The mixture was refluxed with stirring for 5 h. After completion of the reaction, the reaction mixture was filtered. The filtrate was concentrated and purified by column chromatography to afford Intermediate 3-b (11 g, yield 65%)

Synthesis Example 3-3: Synthesis of Compound 13

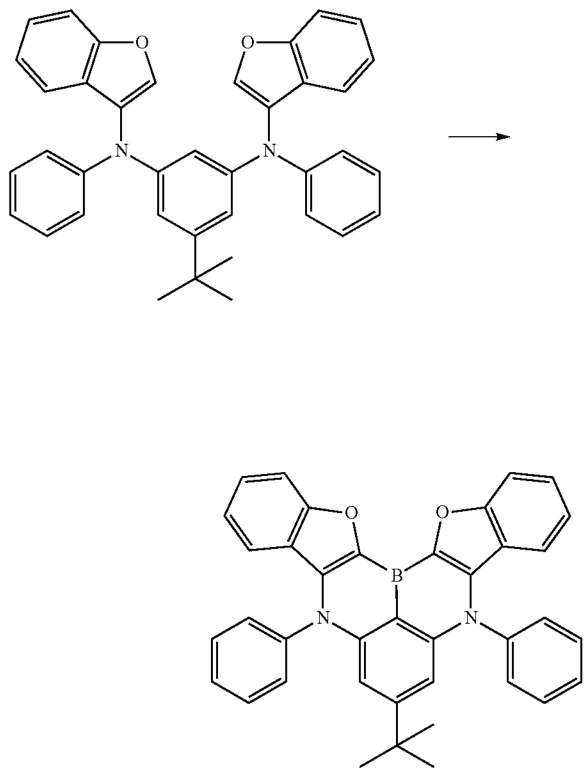

<Compound 13>

Compound 13 (0.5 g, yield 8%) was synthesized in the same manner as in Synthesis Example 1-7, except that Intermediate 3-b was used instead of Intermediate 1-f.

MS (MALDI-TOF): m/z 556.23 [$M^+$]

Synthesis Example 4: Synthesis of Compound 65

Synthesis Example 4-1: Synthesis of Intermediate 4-a

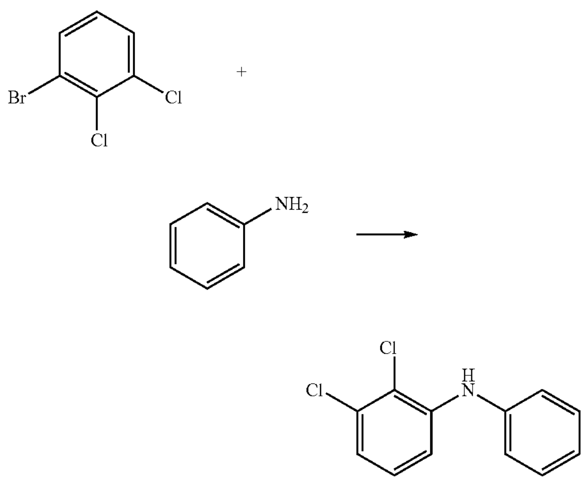

<Intermediate 4-a>

Intermediate 4-a (35.6 g, yield 71.2%) was synthesized in the same manner as in Synthesis Example 1-3, except that 1-bromo-2,3-dichlorobenzene was used instead of 1-bromo-4-iodobenzene.

Synthesis Example 4-2: Synthesis of Intermediate 4-b

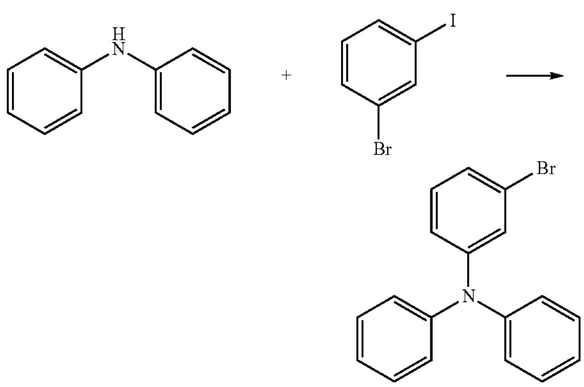

<Intermediate 4-b>

Diphenylamine (60.0 g, 355 mmol), 1-bromo-3-iodobenzene (100.3 g, 355 mmol), palladium acetate (0.8 g, 4 mmol), xantphos (2 g, 4 mmol), sodium tert-butoxide (68.2 g, 709 mmol), and toluene (700 mL) were placed in a 2 L reactor. The mixture was refluxed with stirring for 2 h. After completion of the reaction, the reaction mixture was filtered at room temperature, concentrated under reduced pressure, and purified by column chromatography to afford Intermediate 4-b (97 g, yield 91.2%).

Synthesis Example 4-3: Synthesis of Intermediate 4-c

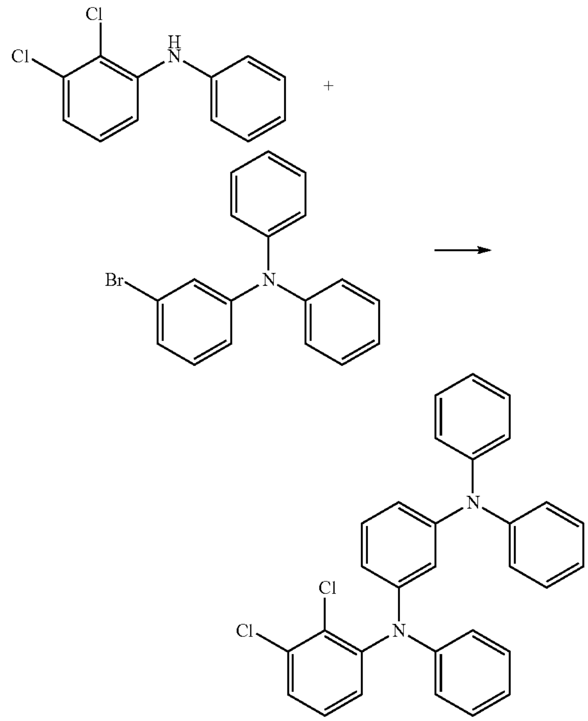

<Intermediate 4-c>

Intermediate 4-c (31 g, yield 77.7%) was synthesized in the same manner as in Synthesis Example 1-4, except that Intermediate 4-a and Intermediate 4-b were used instead of Intermediate 1-c and Intermediate 1-b.

Synthesis Example 4-4: Synthesis of Intermediate 4-d

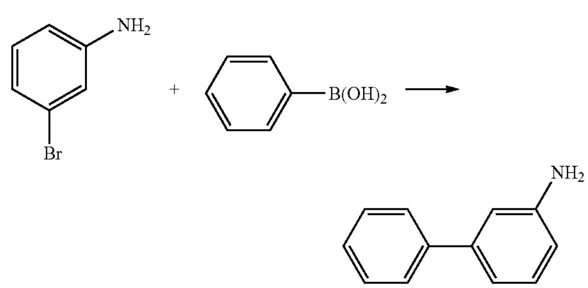

<Intermediate 4-d>

3-Bromoaniline (30 g, 174 mmol), phenylboronic acid (25.5 g, 209 mmol), tetrakis(triphenylphosphine)palladium (4 g, 3 mmol), potassium carbonate (48.2 g, 349 mmol), 1,4-dioxane (150 mL), toluene (150 mL), and distilled water (90 mL) were placed in a 1 L reactor. The mixture was refluxed with stirring for 4 h. After completion of the reaction, the reaction mixture was allowed to stand for layer separation. The organic layer was concentrated under reduced pressure and purified by column chromatography to afford Intermediate 4-d (24 g, yield 80%).

Synthesis Example 4-5: Synthesis of Intermediate 4-e

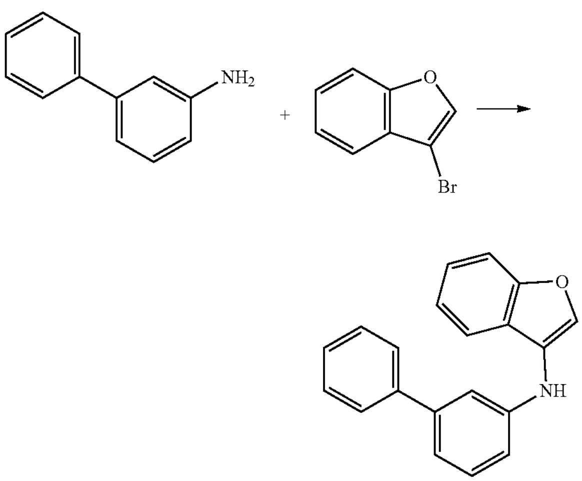

<Intermediate 4-e>

Intermediate 4-e (31.6 g, yield 68.2%) was synthesized in the same manner as in Synthesis Example 1-3, except that Intermediate 4-d and Intermediate 1-b were used instead of 1-bromo-4-iodobenzene and aniline.

Synthesis Example 4-6: Synthesis of Intermediate 4-f

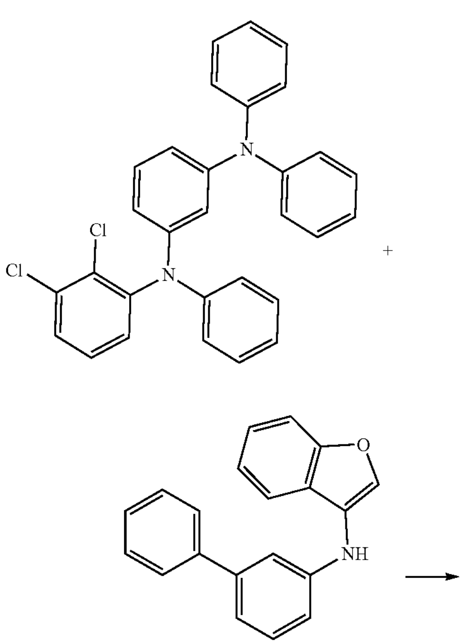

-continued

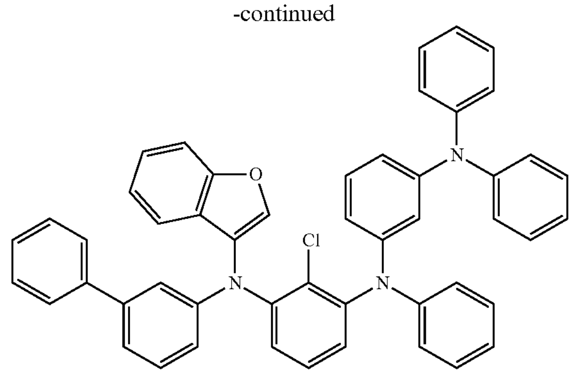

<Intermediate 4-f>

Intermediate 4-f (21 g, yield 67.7%) was synthesized in the same manner as in Synthesis Example 1-4, except that Intermediate 4-c and Intermediate 4-e were used instead of Intermediate 1-c and Intermediate 1-b.

Synthesis Example 4-7: Synthesis of Compound 65

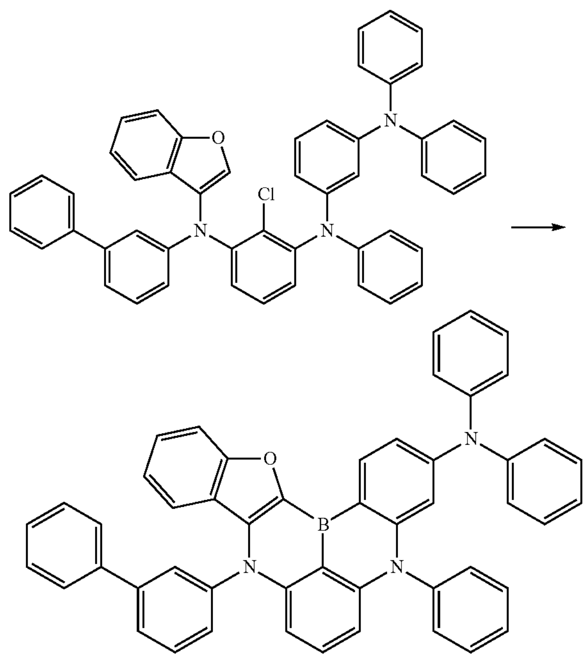

<Compound 65>

Intermediate 4-f (21 g, 37 mmol) and tert-butylbenzene were placed in a 250 mL reactor, and tert-butyllithium (42.4 mL, 74 mmol) was added dropwise thereto at −78° C. After the dropwise addition was finished, the mixture was stirred at 60° C. for 3 h. Thereafter, the reactor was flushed with nitrogen to remove pentane. After dropwise addition of boron tribromide (7.1 mL, 74 mmol) at −78° C., the resulting mixture was stirred at room temperature for 1 h and N,N-diisopropylethylamine (6 g, 74 mmol) was added dropwise thereto at 0° C. The mixture was stirred at 120° C. for 2 h. After completion of the reaction, the reaction mixture was added with an aqueous sodium acetate solution, stirred, and extracted with ethyl acetate. The organic layer was concentrated and purified by column chromatography to give Compound 65 (2.0 g, yield 17.4%).

MS (MALDI-TOF): m/z 703.28 [$M^+$]

Synthesis Example 5: Synthesis of Compound 73

Synthesis Example 5-1: Synthesis of Intermediate 5-a

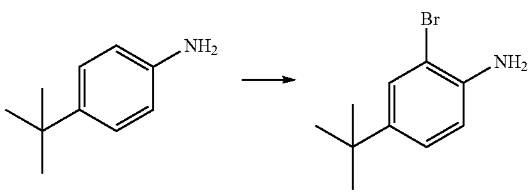

<Intermediate 5-a>

4-tert-butylaniline (40 g, 236 mmol) was dissolved in methylene chloride (400 mL) in a 1 L reactor. The mixture was stirred at 0° C. Thereafter, N-bromosuccinimide (42 g, 236 mmol) was added to the reactor. The resulting mixture was stirred at room temperature for 4 h. After completion of the reaction, $H_2O$ was added dropwise to the reaction mixture at room temperature, followed by extraction with methylene chloride. The organic layer was concentrated and purified by column chromatography to afford Intermediate 5-a (48 g, yield 80%).

Synthesis Example 5-2: Synthesis of Intermediate 5-b

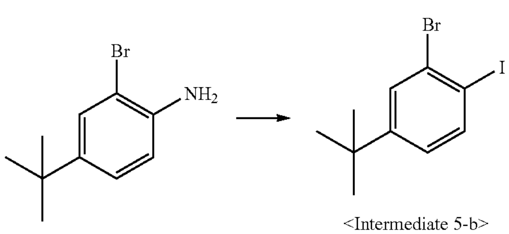

<Intermediate 5-b>

Intermediate 5-a (80 g, 351 mmol) and water (450 mL) were stirred in a 2 L reactor. The mixture was added with sulfuric acid (104 mL) and a solution of sodium nitrite (31.5 g, 456 mmol) in water (240 mL) was added dropwise thereto at 0° C. After the dropwise addition was finished, the resulting mixture was stirred at 0° C. for 2 h. After dropwise addition of a solution of potassium iodide (116.4 g, 701 mmol) in water (450 mL), the mixture was stirred at room temperature for 6 h. After completion of the reaction, the reaction mixture was added with an aqueous sodium thiosulfate solution at room temperature, stirred, and extracted with ethyl acetate. The organic layer was purified by column chromatography to afford Intermediate 5-b (58 g, yield 51%).

Synthesis Example 5-3: Synthesis of Intermediate 5-c

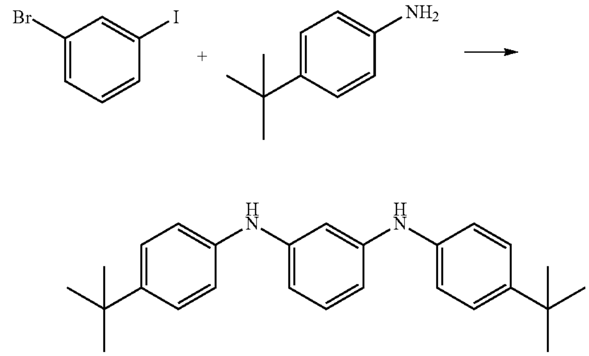

<Intermediate 5-c>

Intermediate 5-c (95 g, yield 80.4%) was synthesized in the same manner as in Synthesis Example 3-1, except that 4-tert-butylaniline was used instead of aniline.

Synthesis Example 5-4: Synthesis of Intermediate 5-d

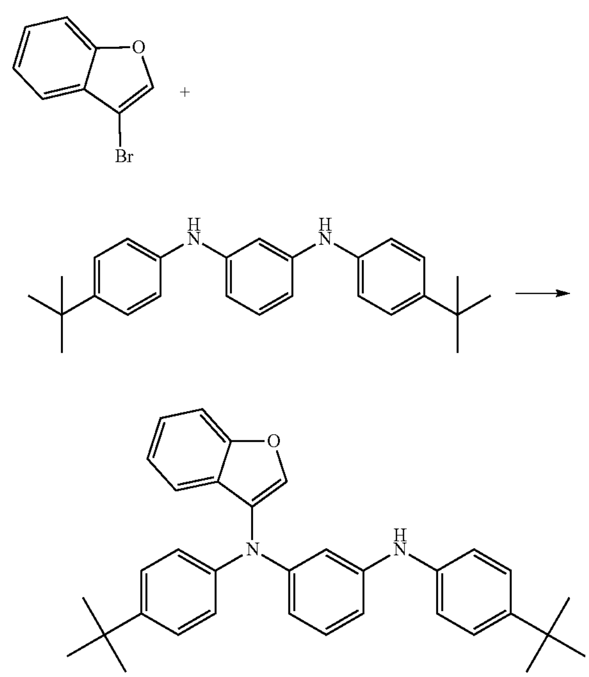

Intermediate 5-d

Intermediate 5-d (31 g, yield 71.5%) was synthesized in the same manner as in Synthesis Example 1-4, except that Intermediate 5-c was used instead of Intermediate 1-c.

Synthesis Example 5-5: Synthesis of Intermediate 5-e

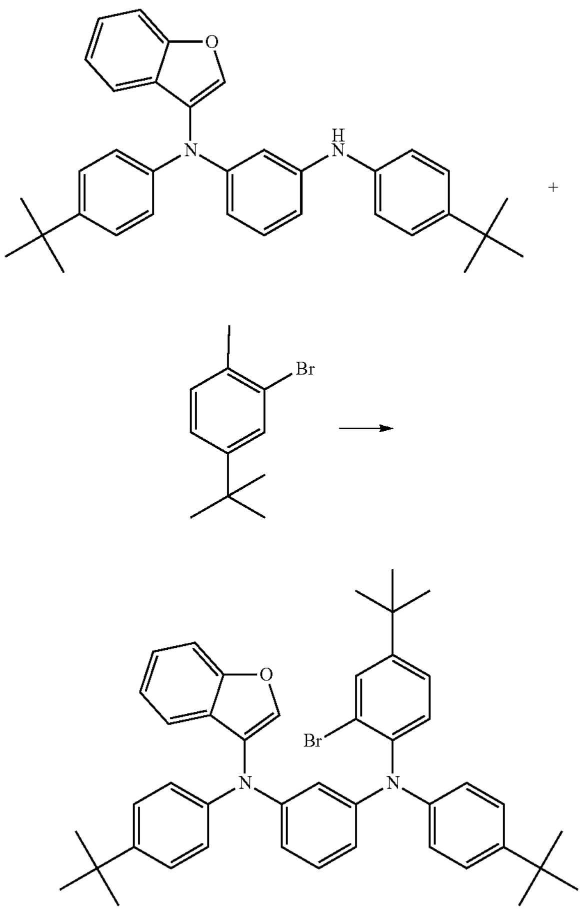

<Intermediate 5-e>

Intermediate 5-e (24 g, yield 67.1%) was synthesized in the same manner as in Synthesis Example 1-4, except that Intermediate 5-d and Intermediate 5-b were used instead of Intermediate 1-c and Intermediate 1-b.

Synthesis Example 5-6: Synthesis of Compound 73

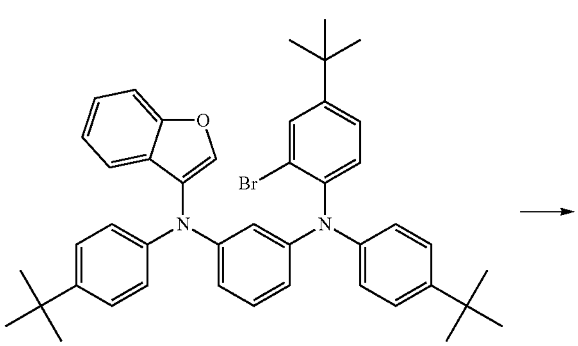

-continued

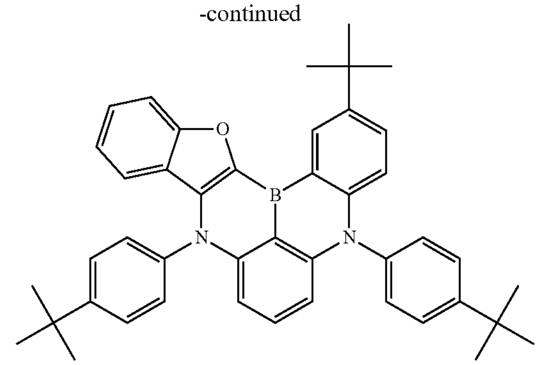

<Compound 73>

Compound 73 (2.4 g, yield 15%) was synthesized in the same manner as in Synthesis Example 1-7, except that Intermediate 5-e was used instead of Intermediate 1-f.

MS (MALDI-TOF): m/z 628.36 $[M^+]$

Synthesis Example 6: Synthesis of Compound 109

Synthesis Example 6-1: Synthesis of Intermediate 6-a

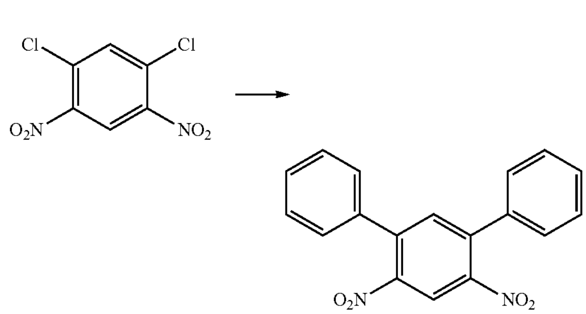

<Intermediate 6-a>

1,5-Dichloro-2,4-dinitrobenzene (40.0 g, 123 mmol), phenylboronic acid (44.9 g, 368 mmol), tetrakis(triphenylphosphine)palladium (2.8 g, 2.5 mmol), potassium carbonate (50.9 g, 368 mmol), 1,4-dioxane (120 mL), toluene (200 mL), and water (120 mL) were placed in a 1 L reactor. The mixture was refluxed with stirring. After completion of the reaction, the reaction mixture was extracted. The organic layer was purified by column chromatography to afford Intermediate 6-a (27.5 g, yield 70%).

Synthesis Example 6-2: Synthesis of Intermediate 6-b

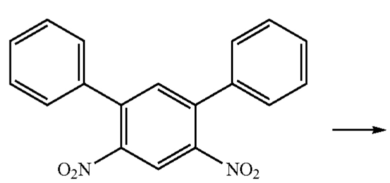

-continued

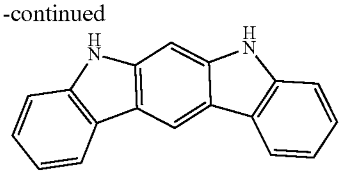

<Intermediate 6-b>

Intermediate 6-a (27.5 g, 86 mmol), triphenylphosphine (57.8 g, 348 mmol), and dichlorobenzene (300 mL) were placed in a 1 L reactor. The mixture was refluxed with stirring for 3 days. After completion of the reaction, the dichlorobenzene was removed, followed by column chromatography to afford Intermediate 6-b (10.8 g, yield 49.0%).

Synthesis Example 6-3: Synthesis of Intermediate 6-c

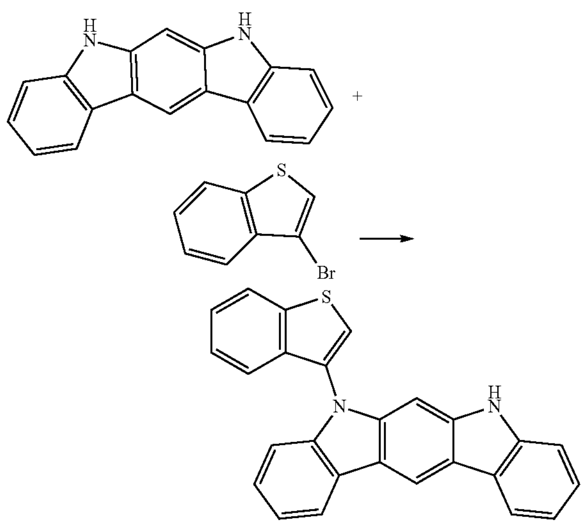

<Intermediate 6-c>

Intermediate 6-b (10.8 g, 42 mmol), Intermediate 2-a (11.0 g, 10.8 mmol), a copper powder (10.7 g, 1 mmol), 18-crown-6-ether (4.5 g, 17 mmol), and potassium carbonate (34.9 g, 253 mmol) were placed in a 250 mL reactor, and dichlorobenzene (110 mL) was added thereto. The mixture was refluxed with stirring at 180° C. for 24 h. After completion of the reaction, the dichlorobenzene was removed, followed by column chromatography to afford Intermediate 6-c (9.5 g, yield 52%).

Synthesis Example 6-4: Synthesis of Intermediate 6-d

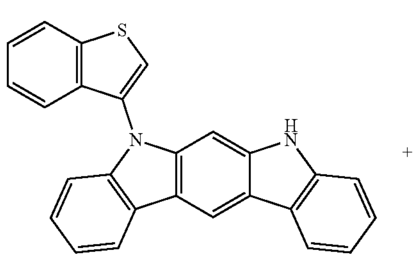

-continued

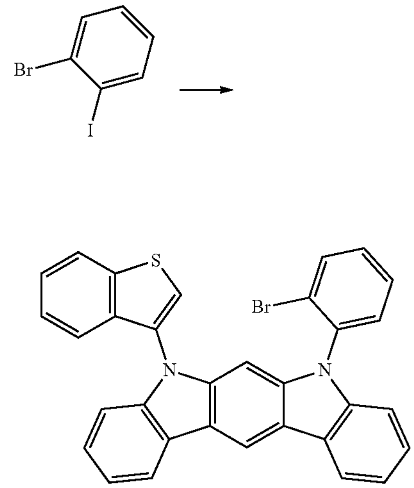

<Intermediate 6-d>

Intermediate 6-d (14 g, yield 67.1%) was synthesized in the same manner as in Synthesis Example 6-3, except that Intermediate 6-c and 1-bromo-2-iodobenzene were used instead of Intermediate 1-c and Intermediate 2-a.

Synthesis Example 6-5: Synthesis of Compound 109

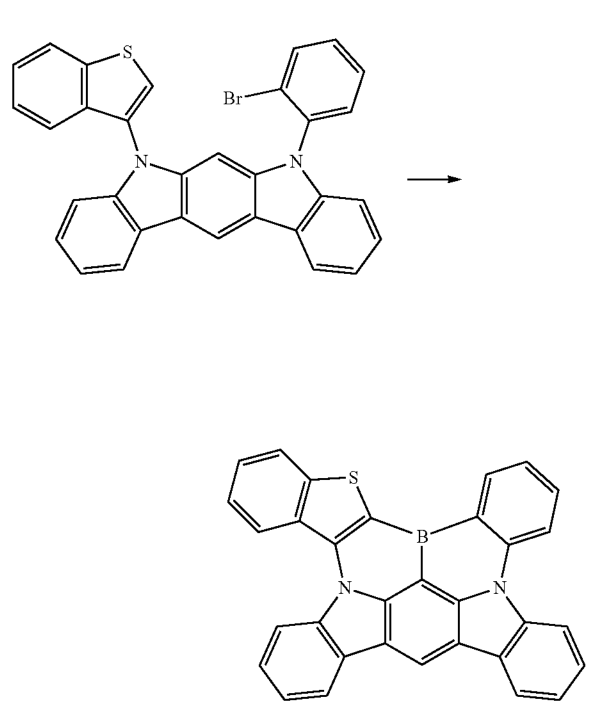

<Compound 109>

Compound 109 (2.1 g, yield 14%) was synthesized in the same manner as in Synthesis Example 1-7, except that Intermediate 6-d was used instead of Intermediate 1-f.

MS (MALDI-TOF): m/z 472.12 [$M^+$]

Synthesis Example 7: Synthesis of Compound 126

Synthesis Example 7-1: Synthesis of Intermediate 7-a

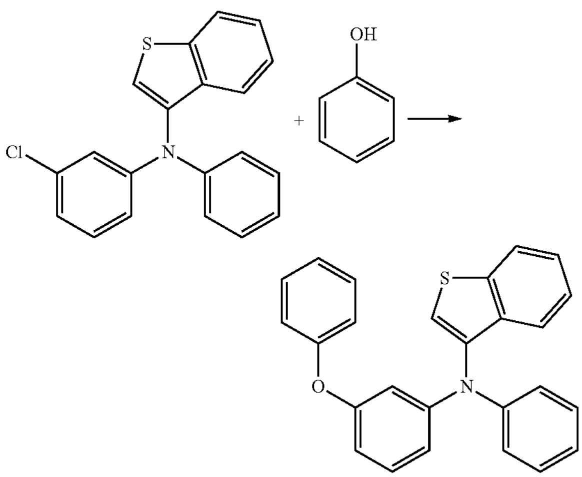

<Intermediate 7-a>

Intermediate 2-b (30.0 g, 150 mmol), phenol (31.2 g, 160 mmol), potassium carbonate (45.7 g, 300 mmol), and NMP (250 mL) were placed in a 500 mL reactor. The mixture was refluxed with stirring at 160° C. for 12 h. After completion of the reaction, the reaction mixture was cooled to room temperature, distilled under reduced pressure to remove the NMP, and extracted with water and ethyl acetate. The organic layer was concentrated under reduced pressure and purified by column chromatography to afford Intermediate 7-a (22 g, yield 68%).

Synthesis Example 7-2: Synthesis of Compound 126

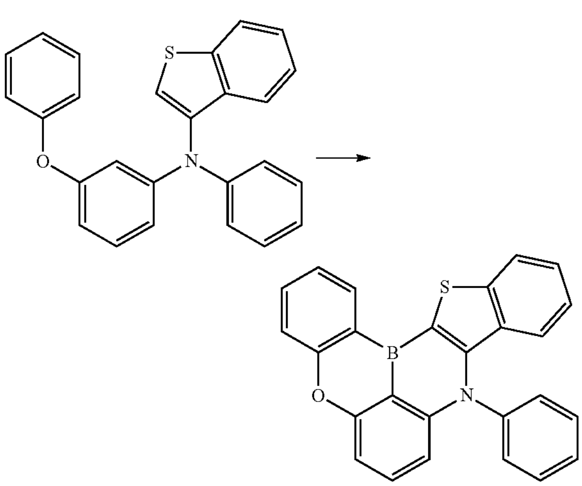

<Compound 126>

Compound 126 (1.2 g, yield 13.4%) was synthesized in the same manner as in Synthesis Example 1-7, except that Intermediate 7-a was used instead of Intermediate 1-f.

MS (MALDI-TOF): m/z 401.10 [$M^+$]

Synthesis Example 8: Synthesis of Compound 145

Synthesis Example 8-1: Synthesis of Intermediate 8-a

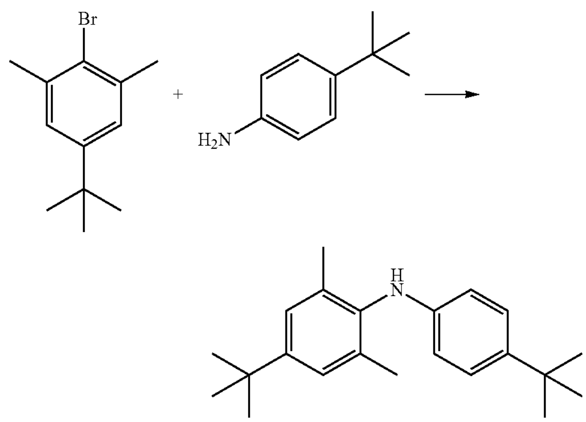

<Intermediate 8-a>

Intermediate 8-a (41.6 g, yield 88.2%) was synthesized in the same manner as in Synthesis Example 1-3, except that 2-bromo-5-tert-butyl-1,3-dimethylbenzene and 4-tert-butylaniline were used instead of 1-bromo-3-iodobenzene and aniline.

Synthesis Example 8-2: Synthesis of Intermediate 8-b

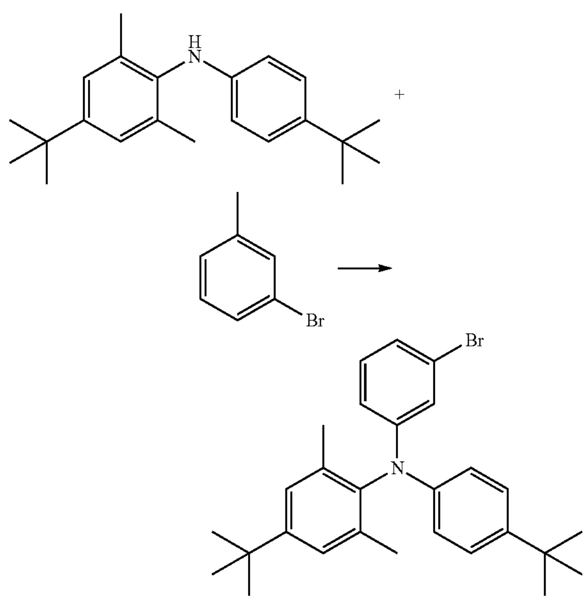

<Intermediate 8-b>

Intermediate 8-b (37.6 g, yield 78.4%) was synthesized in the same manner as in Synthesis Example 4-2, except that Intermediate 8-a was used instead of diphenylamine.

Synthesis Example 8-3: Synthesis of Intermediate 8-c

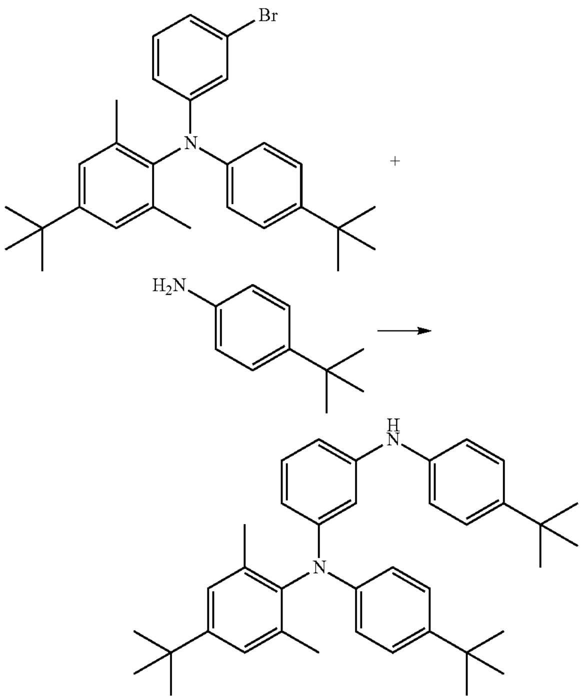

<Intermediate 8-c>

Intermediate 8-c (31.2 g, yield 74.2%) was synthesized in the same manner as in Synthesis Example 1-3, except that Intermediate 8-b and 4-tert-butylaniline were used instead of 1-bromo-3-iodobenzene and aniline.

Synthesis Example 8-4: Synthesis of Intermediate 8-d

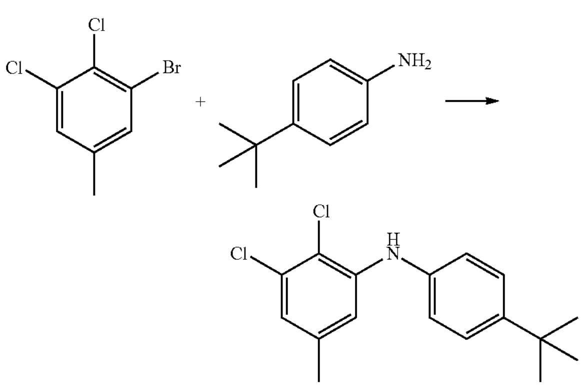

<Intermediate 8-d>

Intermediate 8-d (30.3 g, yield 89.8%) was synthesized in the same manner as in Synthesis Example 1-3, except that 1-bromo-2,3-dichloro-5-methylbenzene and 4-tert-butylaniline were used instead of 1-bromo-3-iodobenzene and aniline.

Synthesis Example 8-5: Synthesis of Intermediate 8-e

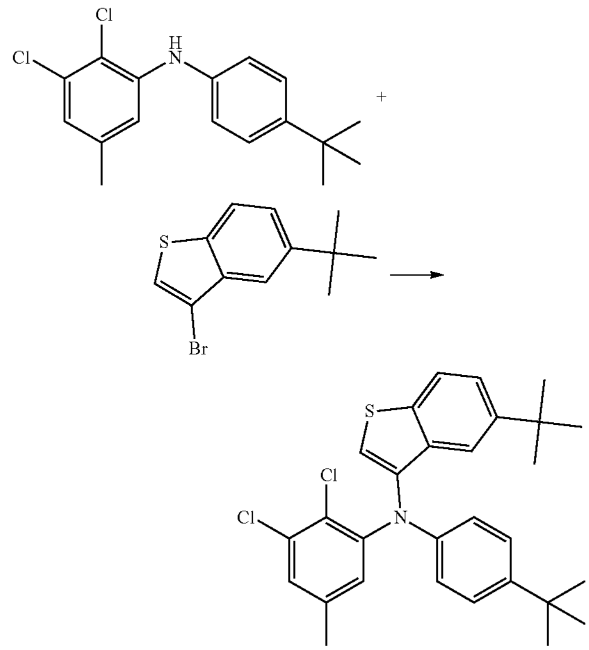

<Intermediate 8-e>

Intermediate 8-e (27.4 g, yield 77.1%) was synthesized in the same manner as in Synthesis Example 1-4, except that Intermediate 8-d and 3-bromo-5-tert-butylbenzothiophene were used instead of Intermediate 1-c and Intermediate 1-b.

Synthesis Example 8-6: Synthesis of Intermediate 8-f

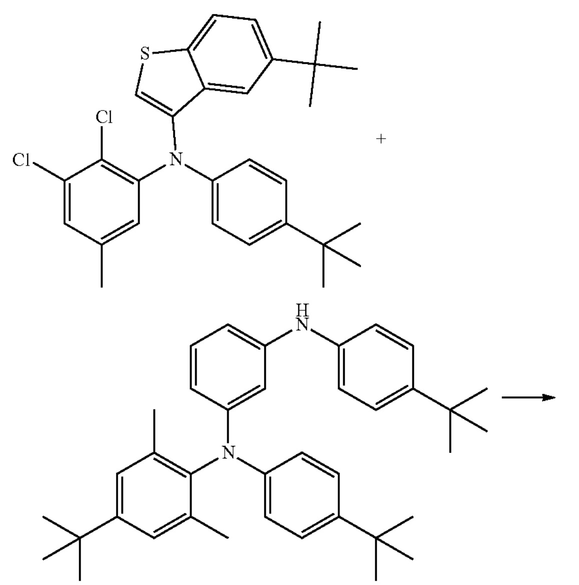

-continued

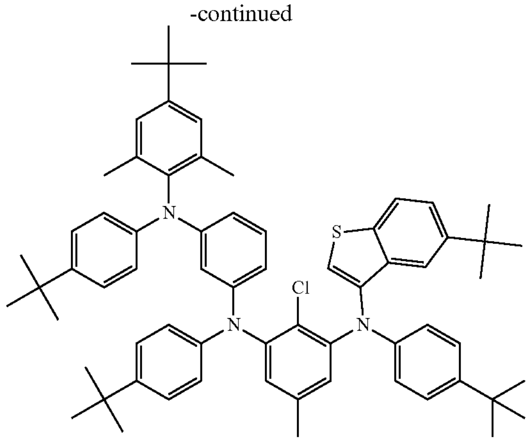

<Intermediate 8-f>

Intermediate 8-f (21 g, yield 74.1%) was synthesized in the same manner as in Synthesis Example 1-4, except that Intermediate 8-e and Intermediate 8-c were used instead of Intermediate 1-c and Intermediate 1-b.

Synthesis Example 8-7: Synthesis of Compound 145

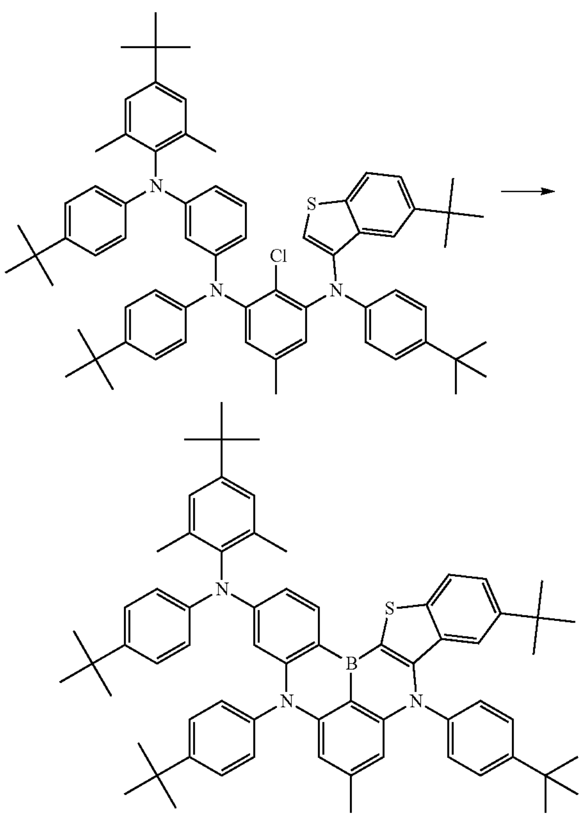

<Compound 145>

Compound 145 (3.4 g, yield 19.4%) was synthesized in the same manner as in Synthesis Example 1-7, except that Intermediate 8-f was used instead of Intermediate 1-f.

MS (MALDI-TOF): m/z 979.60 $[M]^+$

Synthesis Example 9: Synthesis of Compound 150

Synthesis Example 9-1: Synthesis of Intermediate 9-a

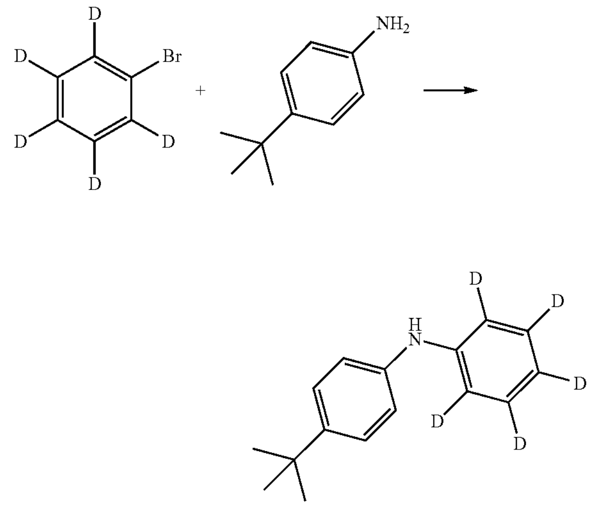

<Intermediate 9-a>

Intermediate 9-a (32.7 g, yield 78.2%) was synthesized in the same manner as in Synthesis Example 1-3, except that 1-bromobenzene-d5 and 4-tert-butylaniline were used instead of 1-bromo-3-iodobenzene and aniline.

Synthesis Example 9-2: Synthesis of Intermediate 9-b

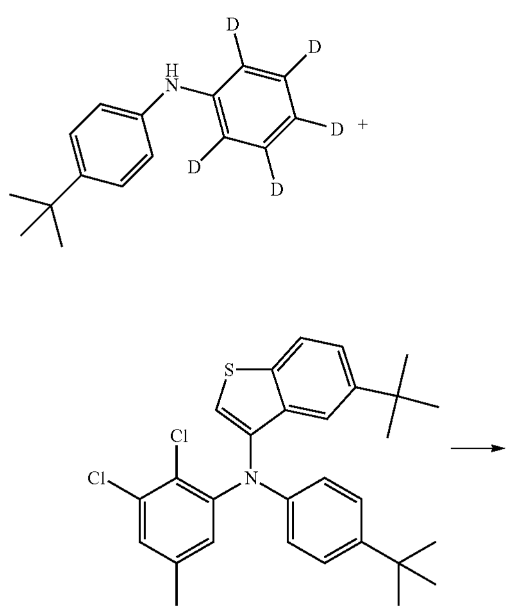

-continued

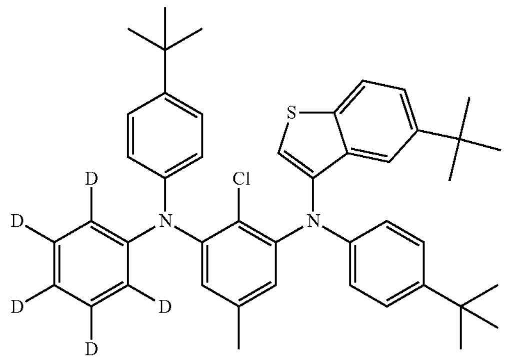

<Intermediate 9-b>

Intermediate 9-b (34.2 g, yield 84.1%) was synthesized in the same manner as in Synthesis Example 1-4, except that Intermediate 8-e and Intermediate 9-a were used instead of Intermediate 1-c and Intermediate 1-b.

Synthesis Example 9-3: Synthesis of Compound 150

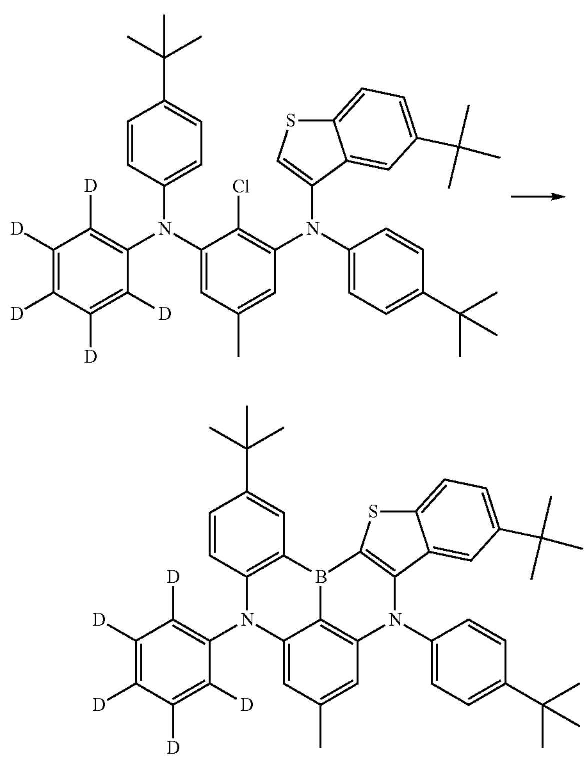

<Compound 150>

Compound 150 (2.7 g, yield 11.4%) was synthesized in the same manner as in Synthesis Example 1-7, except that Intermediate 9-b was used instead of Intermediate 1-f.

MS (MALDI-TOF): m/z 663.39 $[M]^+$

Synthesis Example 10: Synthesis of Compound 153

Synthesis Example 10-1: Synthesis of Intermediate 10-a

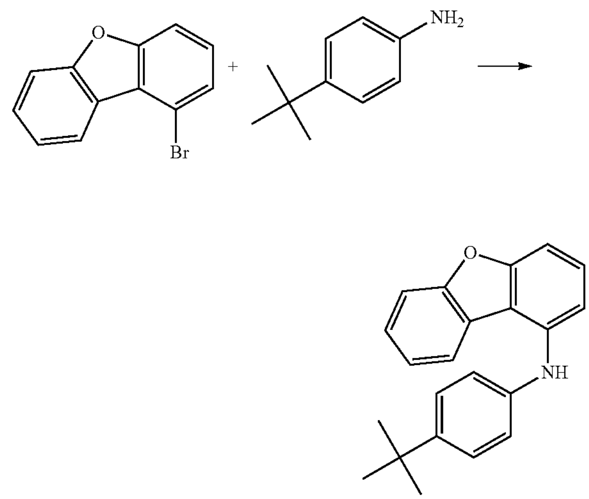

<Intermediate 10-a>

Intermediate 10-a (25.6 g, yield 79.2%) was synthesized in the same manner as in Synthesis Example 1-3, except that 1-bromo-dibenzofuran and 4-tert-butylaniline were used instead of 1-bromo-3-iodobenzene and aniline.

Synthesis Example 10-2: Synthesis of Intermediate 10-b

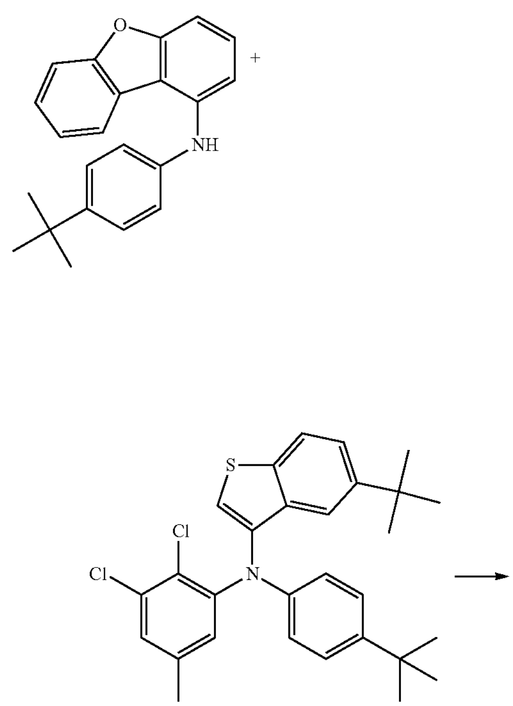

-continued

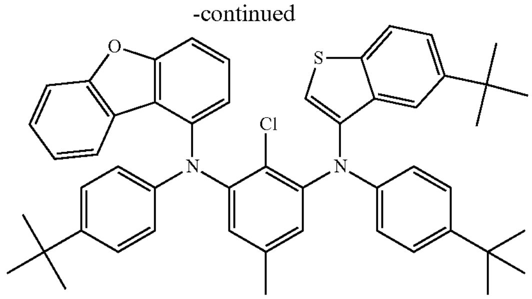

<Intermediate 10-b>

Intermediate 10-b (18.6 g, yield 74.1%) was synthesized in the same manner as in Synthesis Example 1-4, except that Intermediate 8-e and Intermediate 10-a were used instead of Intermediate 1-c and Intermediate 1-b.

Synthesis Example 10-3: Synthesis of Compound 153

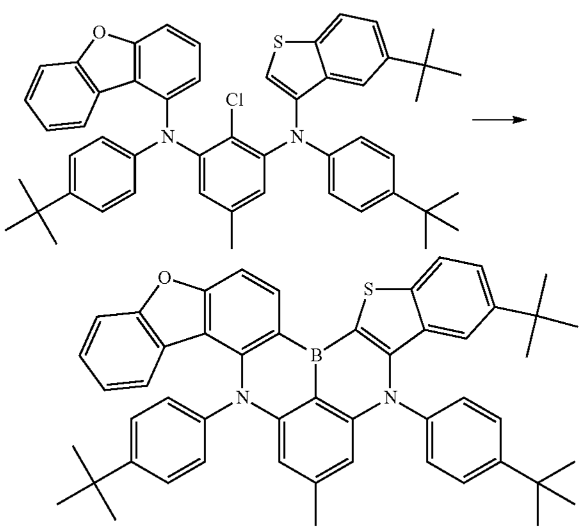

<Compound 153>

Compound 153 (3.4 g, yield 15.4%) was synthesized in the same manner as in Synthesis Example 1-7, except that Intermediate 10-b was were used instead of Intermediate 1-f.

MS (MALDI-TOF): m/z 748.37 $[M]^+$

Synthesis Example 11: Synthesis of the Compound 185

Compound 185 (2.1 g, yield 12%) was synthesized in the same manner as in Synthesis Example 3, except that 1-bromo-3-iodobenzene and 4-tert-butylaniline were used instead of 1-bromo-3-(tert-butyl)-5-iodobenzene and aniline (Synthesis Example 3-1), respectively, and 3-bromo-5-methylbenzofuran was used instead of 3-bromobenzofuran (Intermediate 1-b) (Synthesis Example 3-2).

MS (MALDI-TOF): m/z 640.33 $[M]^+$

Synthesis Example 12: Synthesis of the Compound 4

Compound 4 (1.1 g, yield 19%) was synthesized in the same manner as in Synthesis Examples 1-4 to 1-7, except that 3-bromo-1-phenyl-1H-indole was used instead of Intermediate 1-b (Synthesis Example 1-4).

MS (MALDI-TOF): m/z 535.22 $[M]^+$

Synthesis of the Compounds Represented by Formula B

Synthesis Example 13: Synthesis of the Compound B101

4.2 g of 2-(4-bromophenyl)-2H-benzo[1,2,3]triazole, 2.3 g of N,N'-diphenylbenzidine, 2.0 g of sodium tert-butoxide, and 50 mL of toluene were placed in a reactor, which had been flushed with nitrogen. Nitrogen gas was passed through the reactor during sonication for 30 min. 62.0 mg of palladium acetate and 0.2 mL of tri-tert-butylphosphine was added to the reactor. The mixture was heated to 91° C. and stirred at the same temperature for 5 h. After cooling to room temperature, the reaction mixture was extracted with 50 mL of toluene. The organic layer was collected, concentrated, purified by column chromatography on NH silica gel (eluent: toluene/n-hexane), and dispersed in and washed with 100 mL of n-hexane to give the Compound B101 (3.3 g, yield 66%) as a yellow powder.

The structure of the yellow powder was identified by NMR. The following 34 hydrogen signals were detected by $^1$H-NMR (THF-$d_8$).

δ (ppm)=8.26 (4H), 7.89 (4H), 7.60 (4H), 7.39 (4H), 7.33 (4H), 7.24 (4H), 7.21 (8H), 7.10 (2H).

Synthesis Example 14: Synthesis of the Compound B106

14.0 g of 4,4"-diiodo-1,1':4',1"-terphenyl, 18.3 g of {4-(2H-benzo[1,2,3]triazol-2-yl)phenyl}phenylamine, 13.2 g of potassium carbonate, 0.3 g of copper powder, 0.9 g of sodium hydrogen sulfite, 0.7 g of 3,5-di-tert-butylsalicylic acid, and 30 mL of dodecyl benzene were placed in a reactor, which had been flushed with nitrogen. The mixture was heated to 210° C. and stirred at the same temperature for 44 h. After the reaction mixture was allowed to cool to room temperature, 50 mL of toluene was added thereto. The precipitate was collected by filtration, dissolved in 230 mL of 1,2-dichlorobenzene by heating, and subjected to hot filtration to remove insolubles. The filtrate was concentrated, purified by crystallization from 1,2-dichlorobenzene, and dispersed in and washed with methanol to give the Compound B106 (22.2 g, yield 96%) as a yellow powder.

The structure of the yellow powder was identified by NMR. The following 38 hydrogen signals were detected by $^1$H-NMR ($CDCl_3$).

δ (ppm)=8.24 (4H), 7.99-7.92 (4H), 7.72-7.58 (7H), 7.50-7.12 (23H).

Synthesis Example 15: Synthesis of the Compound B119

Compound B119 (12.4 g, yield 47%) as a yellow powder was synthesized in the same manner as in Synthesis Example 14, except that {4-(benzoxazol-2-yl)phenyl}phenylamine was used instead of {4-(2H-benzo[1,2,3]triazol-2-yl)phenyl}phenylamine.

The structure of the yellow powder was identified by NMR. The following 38 hydrogen signals were detected by $^1$H-NMR ($CDCl_3$).

δ (ppm)=8.13 (4H), 7.80-7.55 (11H), 7.50-7.16 (23H).

Synthesis Example 16: Synthesis of the Compound B120

Compound of B120 (8.8 g, yield 54%) as a lemon yellow powder was synthesized in the same manner as in Synthesis Example 13, except that 2-(4-bromophenyl)benzoxazole was used instead of 2-(4-bromophenyl)-2H-benzo[1,2,3] triazole.

The structure of the lemon yellow powder was identified by NMR. The following 34 hydrogen signals were detected by $^{1}$H-NMR ($CDCl_3$).

δ (ppm)=8.12 (4H), 7.80-7.72 (2H), 7.60-7.53 (5H), 7.41-7.14 (23H).

Synthesis Example 17: Synthesis of the Compound B122

Compound B122 (9.3 g, yield 62%) as a lemon yellow powder was synthesized in the same manner as in Synthesis Example 13, except that 2-(4-bromophenyl)benzothiazole was used instead of 2-(4-bromophenyl)-2H-benzo[1,2,3] triazole. The structure of the lemon yellow powder was identified by NMR. The following 34 hydrogen signals were detected by $^{1}$H-NMR ($CDCl_3$).

δ (ppm)=8.10-7.88 (8H), 7.60-7.13 (26H).

Synthesis Example 18: Synthesis of the Compound B123

9.3 g of N-{4-(benzothiazol-2-yl)phenyl}phenylamine, 7.1 g of 4,4''-diiodo-1,1':4',1''-terphenyl, 4.6 g of sodium tert-butoxide, and 140 mL of toluene were placed in a reactor, which had been flushed with nitrogen. Nitrogen gas was passed through the reactor during sonication for 30 min. 0.20 g of palladium acetate and 0.5 g of a 50% (v/v) toluene solution of tert-butylphosphine was added. The mixture was heated and refluxed with stirring for 3 h. The reaction mixture was cooled to room temperature. The precipitate was collected by filtration and purified by repeated crystallization from a mixed solvent of 1,2-dichlorobenzene/methanol to give the Compound B123 (7.0 g, yield 58%) as a yellow powder.

The structure of the yellow powder was identified by NMR. The following 38 hydrogen signals were detected by $^{1}$H-NMR (THF-$d_8$).

δ (ppm)=8.07-7.88 (8H), 7.70-7.60 (8H), 7.54-7.46 (2H), 7.40-7.15 (20H).

Examples 1-12: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. 4,4',4''-tris[2-naphthyl(phenyl) amino]triphenyl amine (2-TNATA) (700 Å) and the compound of Formula F (600 Å) were deposited in this order on the ITO. A mixture of BH1 as a host and the compound of [Formula A-1] and [Formula A-2] of the present invention (3 wt %) was used to form a 200 Å thick light emitting layer. Thereafter, the compound of Formula E-2 was used to form a 300 Å thick electron transport layer on the light emitting layer. The compound of Formula E-1 was used to form a 10 Å thick electron injecting layer on the electron transport layer. MgAg was deposited on the electron injecting layer to form a 120 Å electrode. Finally, the compound of the present invention was used to form a 600 Å capping layer on the MgAg electrode, completing the fabrication of an organic electroluminescent device. The luminescent properties of the organic electroluminescent device were measured at 0.4 mA.

[Formula F]

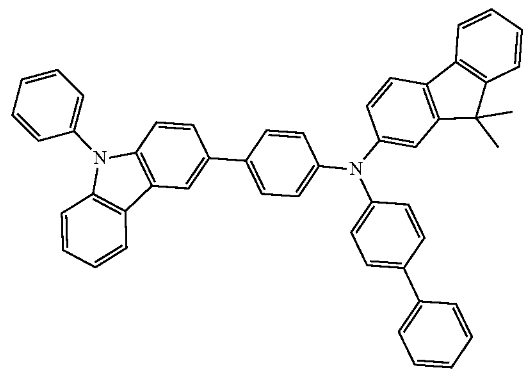

[Formula E-1]

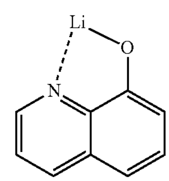

[Formula E-2]

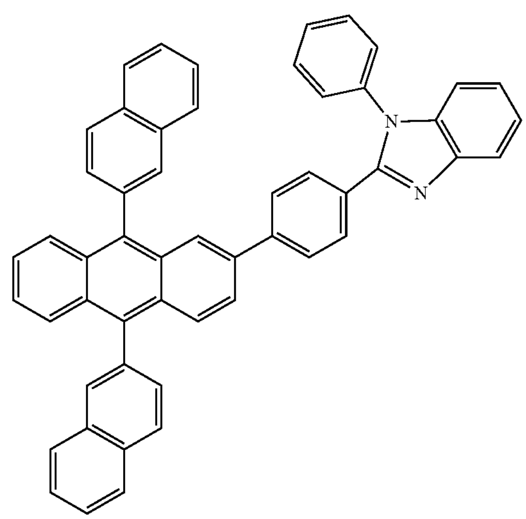

-continued

[BH]

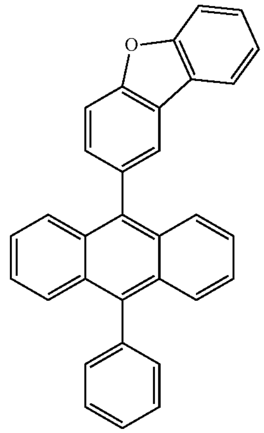

Comparative Examples 1-8

Organic electroluminescent devices were fabricated in the same manner as in Example 1, except that BD1, BD2, BD3, BD4, and BD5 were used instead of the dopant compound and Alq3 and CPL-1 were used instead of the compound for the capping layer. The luminescent properties of the organic electroluminescent device were measured at 0.4 mA. The structures of BD1, BD2, BD3, BD4, BD5, and CPL-1 are as follows.

[BD1]

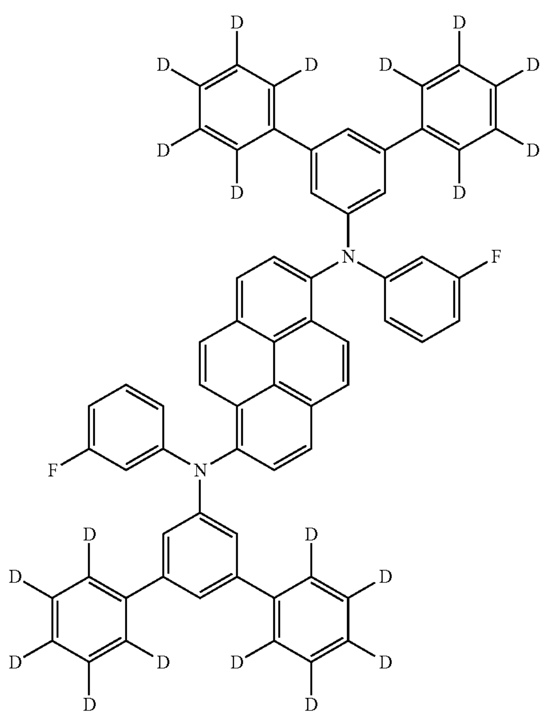

-continued

[BD2]

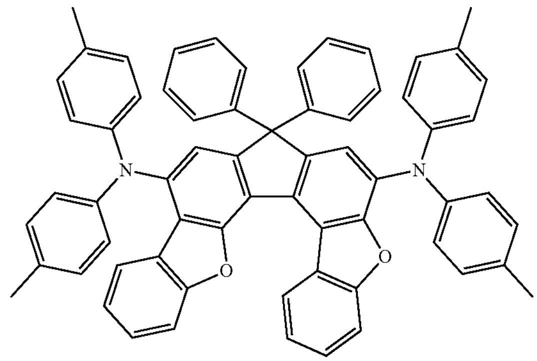

[BD3]

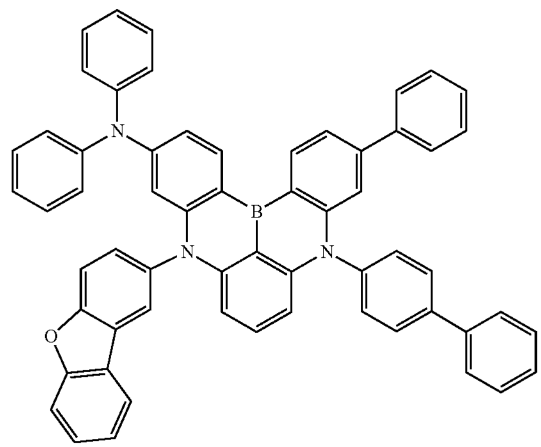

[BD4]

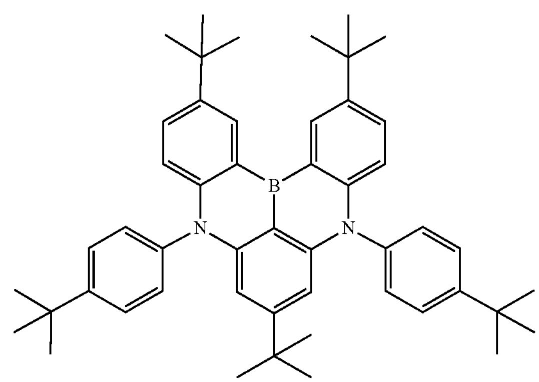

[BD5]

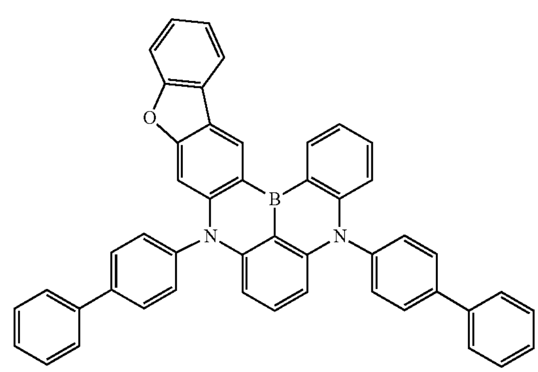

-continued

[CPL-1]

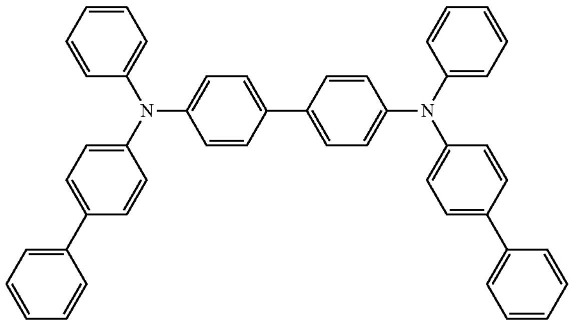

The organic electroluminescent devices of Examples 1-12 and Comparative Examples 1-8 were measured for driving voltage and efficiency. The results are shown in Table 1.

TABLE 1

| Example No. | Host | Dopant | CPL | Driving voltage | Efficiency (Cd/A) |
|---|---|---|---|---|---|
| Example 1 | BH1 | 1 | B101 | 3.8 | 8.4 |
| Example 2 | BH1 | 4 | B101 | 3.8 | 9.2 |
| Example 3 | BH1 | 126 | B106 | 3.8 | 8.3 |
| Example 4 | BH1 | 145 | B106 | 3.8 | 8.3 |
| Example 5 | BH1 | 145 | B101 | 3.8 | 8.3 |
| Example 6 | BH1 | 146 | B106 | 3.8 | 9.2 |
| Example 7 | BH1 | 146 | B101 | 3.8 | 9.1 |
| Example 8 | BH1 | 153 | B106 | 3.8 | 9.1 |
| Example 9 | BH1 | 157 | B106 | 3.8 | 8.7 |
| Example 10 | BH1 | 167 | B106 | 3.8 | 8.7 |
| Example 11 | BH1 | 180 | B106 | 3.8 | 8.9 |
| Example 12 | BH1 | 185 | B101 | 3.8 | 10.6 |
| Comparative Example 1 | BH1 | BD1 | B106 | 3.8 | 6.6 |
| Comparative Example 2 | BH1 | BD2 | B106 | 3.8 | 6.8 |
| Comparative Example 3 | BH1 | BD3 | B106 | 3.8 | 6.2 |
| Comparative Example 4 | BH1 | BD4 | B106 | 3.8 | 7.8 |
| Comparative Example 5 | BH1 | BD5 | B106 | 3.8 | 6.8 |
| Comparative Example 6 | BH1 | BD2 | Alq3 | 3.8 | 5.5 |
| Comparative Example 7 | BH1 | BD2 | CPL-1 | 3.8 | 5.7 |
| Comparative Example 8 | BH1 | BD4 | Alq3 | 3.8 | 7.8 |

The organic electroluminescent devices of Examples 1-12, each including the light emitting layer and the capping layer employing the compounds shown in Table 1, showed higher efficiencies than the organic electroluminescent devices of Comparative Examples 1-8.

INDUSTRIAL APPLICABILITY

The formation of the light emitting layer employing the polycyclic aromatic compound and the optional capping layer makes the organic electroluminescent device of the present invention highly efficient. In addition, the organic electroluminescent device of the present invention is suitable for use in a display or lighting system selected from flat panel displays, flexible displays, monochromatic flat panel lighting systems, white flat panel lighting systems, flexible monochromatic lighting systems, and flexible white lighting systems.

The invention claimed is:

1. An organic electroluminescent device comprising a first electrode, a second electrode opposite to the first electrode, a light emitting layer interposed between the first and second electrodes, and a capping layer formed on one of the surfaces of the first and second electrodes opposite to the light emitting layer, wherein the light emitting layer comprises a compound represented by Formula A-5 and the capping layer comprises a compound represented by Formula B:

[Formula A-5]

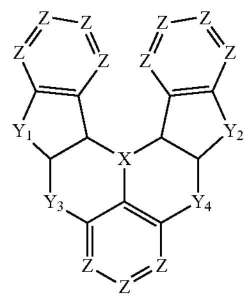

wherein each Z is independently CR or N, $Y_1$ and $Y_2$ are identical to or different from each other and are each independently selected from the group consisting of $CR_2R_3$, O, S, Se, and $SiR_4R_5$, $Y_3$ and $Y_4$ are identical to or different from each other and are each independently selected from the group consisting of $CR_2R_3$, and $SiR_4R_5$, X is selected from the group consisting of B, P, P═S, and P═O, and R, $R_2$ to $R_5$ are identical to or different from each other and are independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that R are optionally bonded to each other or are optionally linked to other adjacent R to form alicyclic or aromatic monocyclic or polycyclic rings whose carbon atoms are optionally substituted with one or more heteroatoms selected from the group consisting of N, S, and O atoms, and

[Formula B]

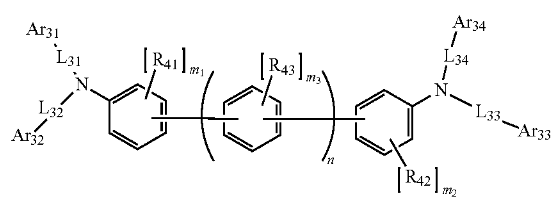

wherein $R_{41}$ to $R_{43}$ are identical to or different from each other and are each independently selected from the group consisting of hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from the group consisting of substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from the group consisting of substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

2. The organic electroluminescent device according to claim 1, wherein at least one of $Ar_{31}$ to $Ar_{34}$ in Formula B is represented by Formula C:

[Formula C]

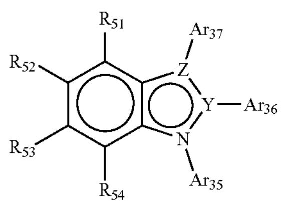

wherein $R_{51}$ to $R_{54}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from the group consisting of substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, or $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula B.

3. The organic electroluminescent device according to claim 1, wherein the compound of Formula B is selected from the group consisting of the following the compounds of Formula B1 to B79:

B1

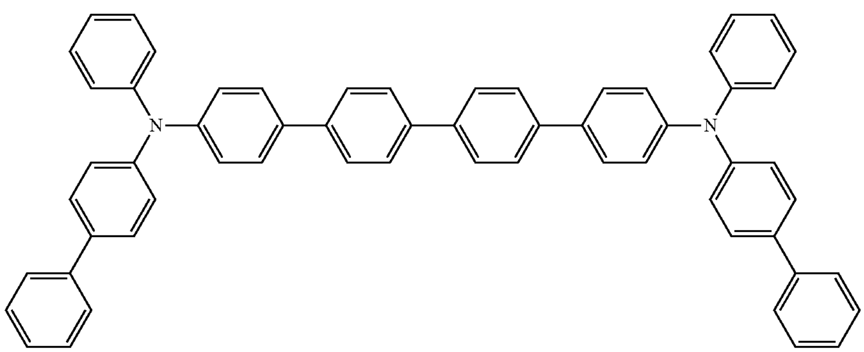

B2

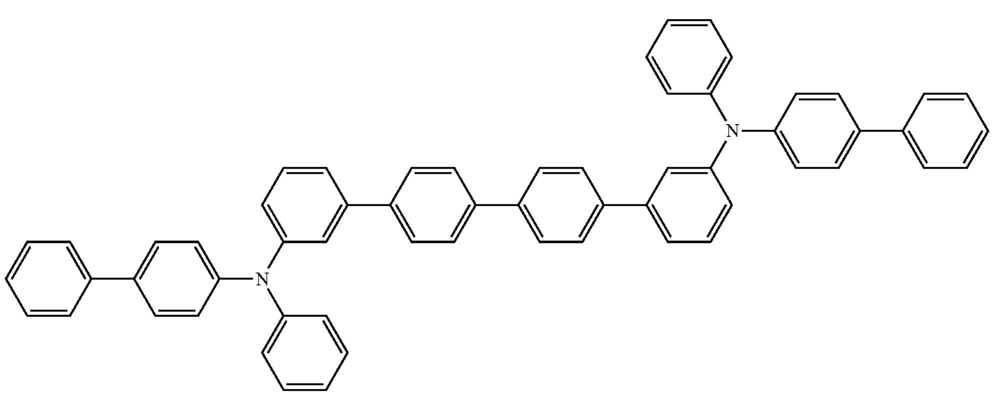

-continued
B3
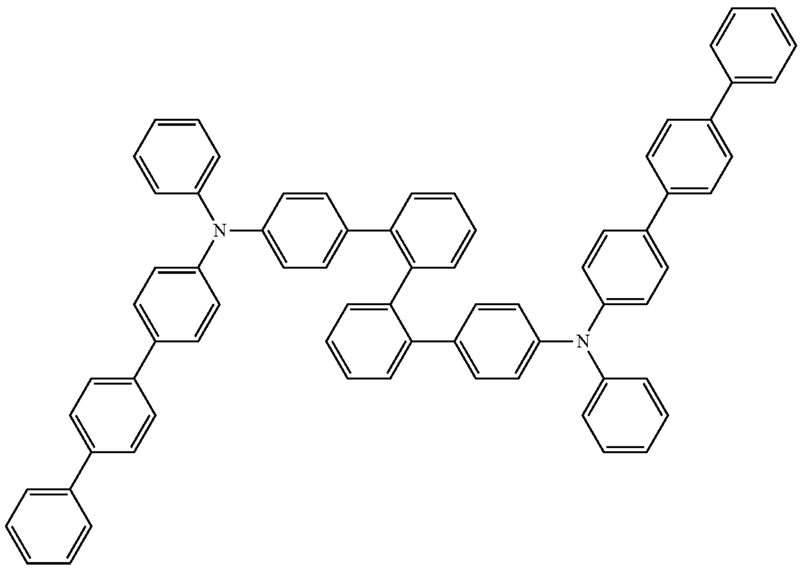
B4
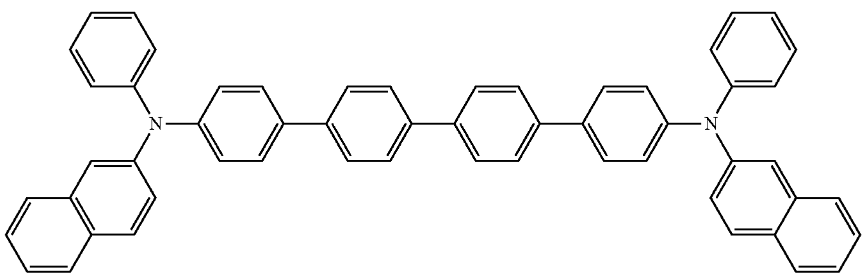
B5
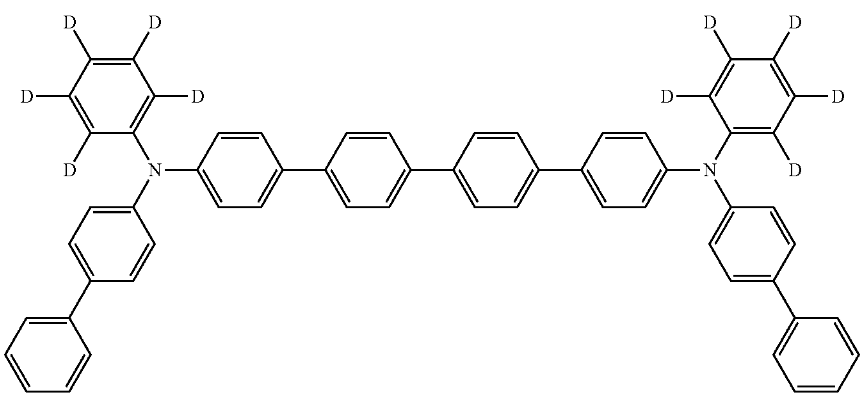
B6
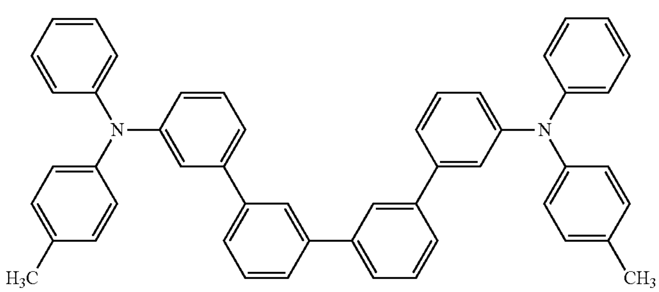

-continued
B7
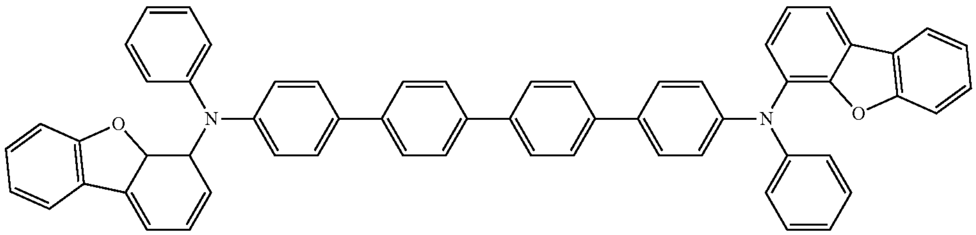
B8
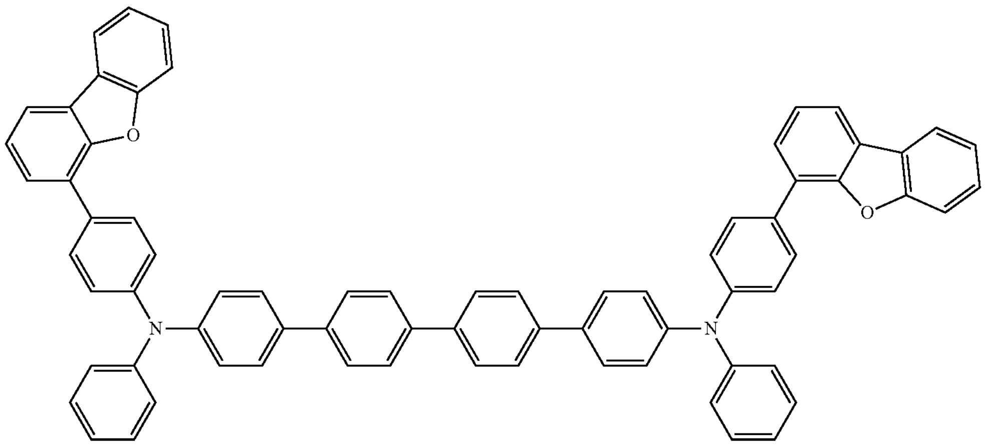
B9
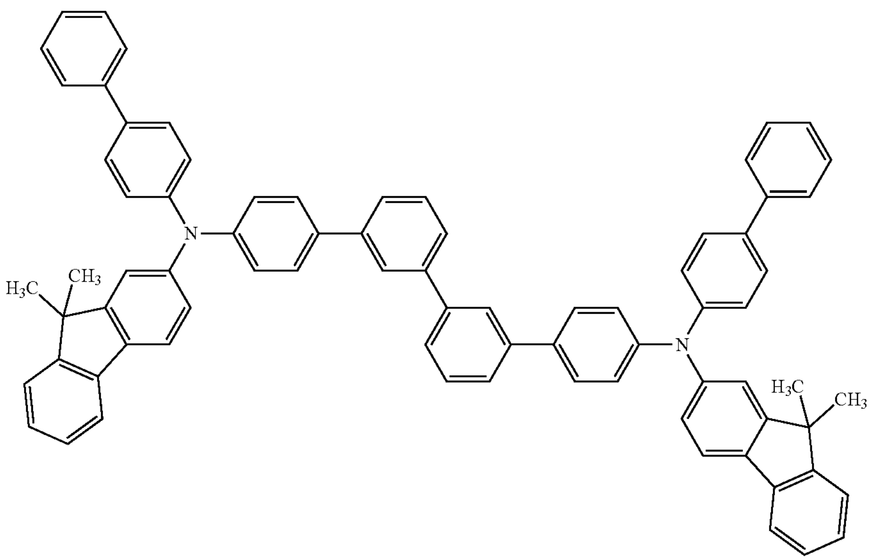
B10
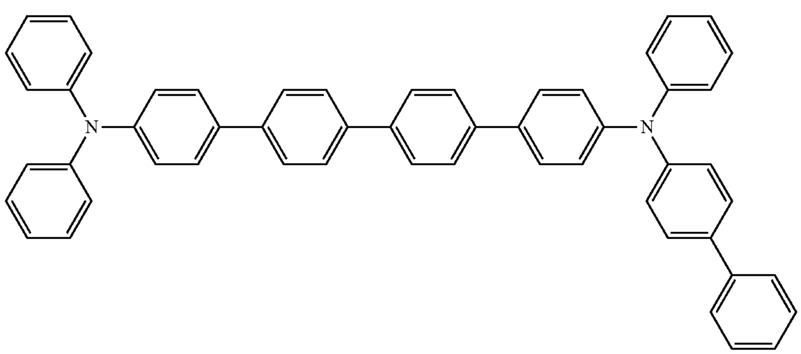

-continued
B11
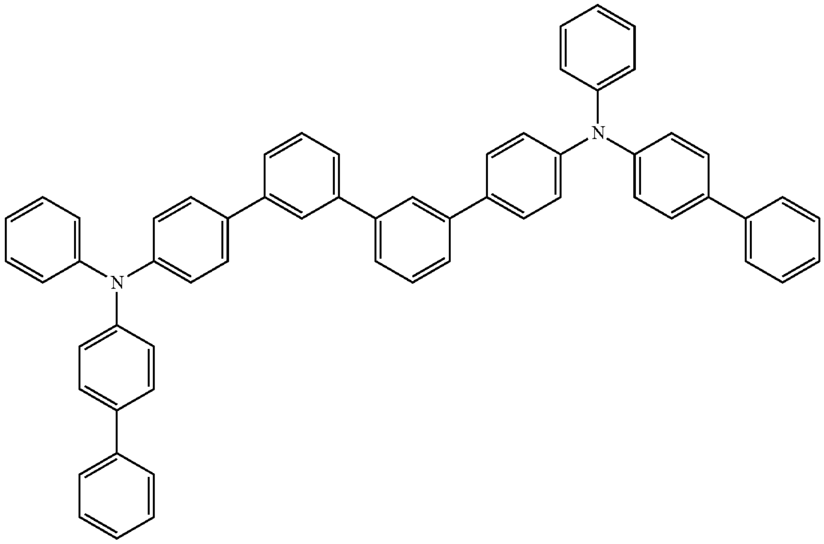
B12
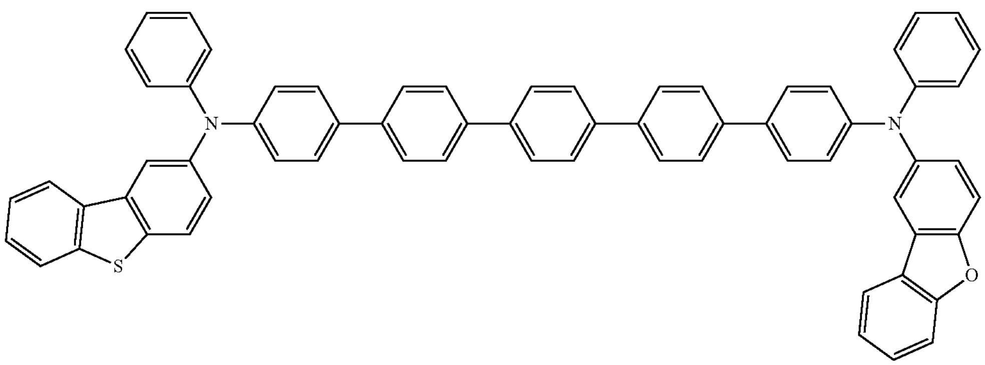
B13
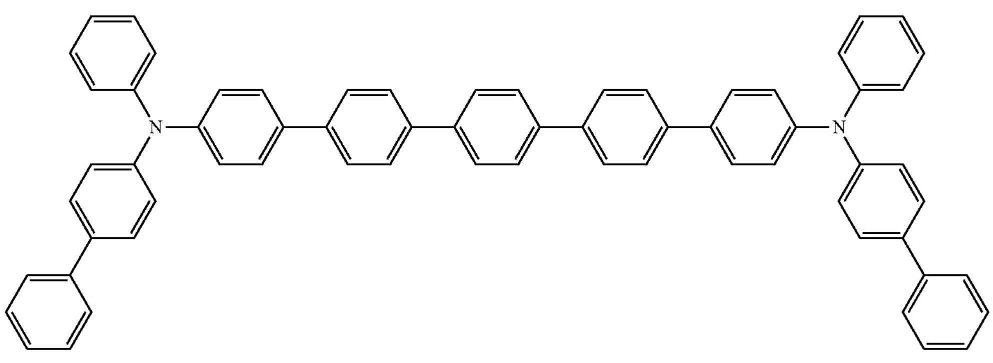
B14
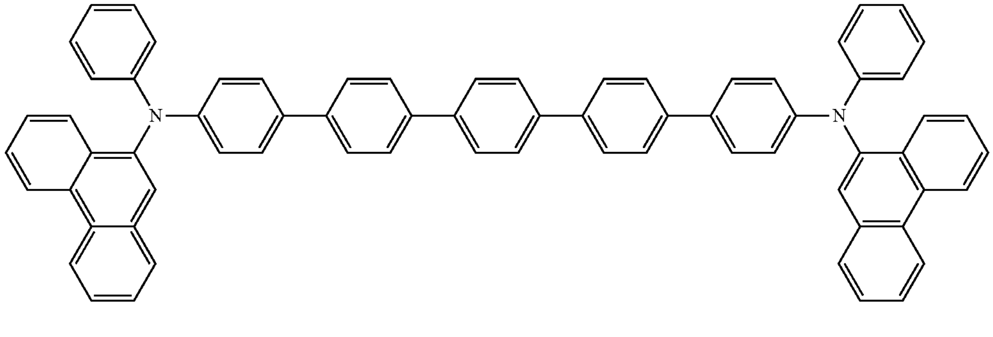

-continued
B15
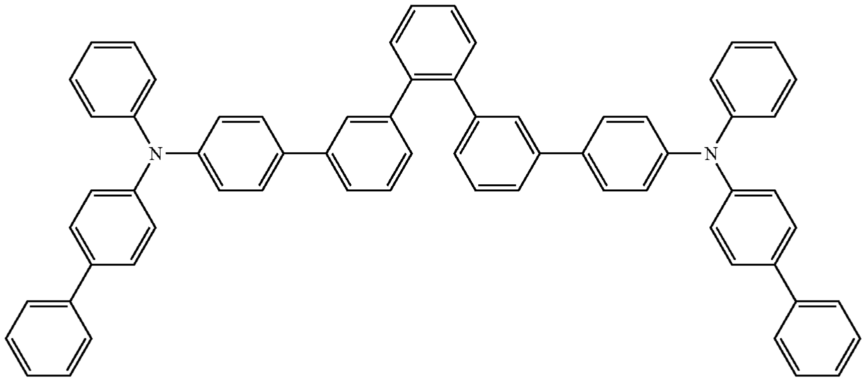
B16
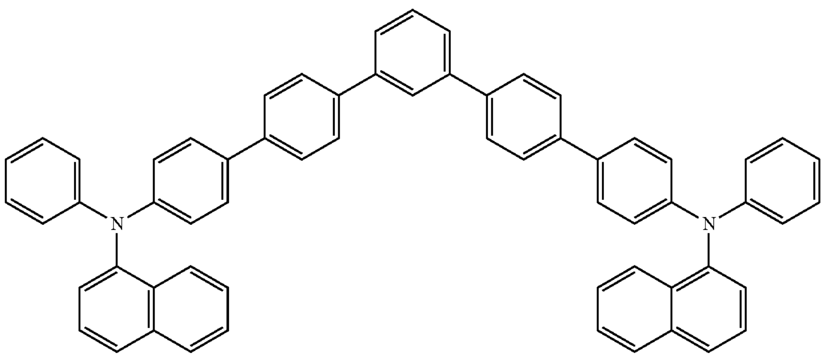
B17
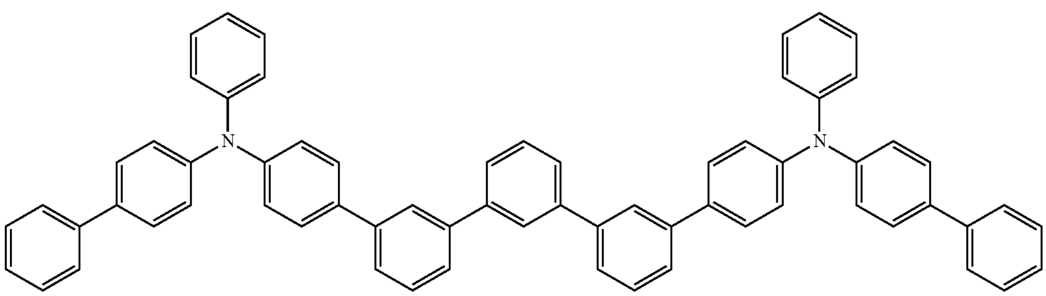
B18
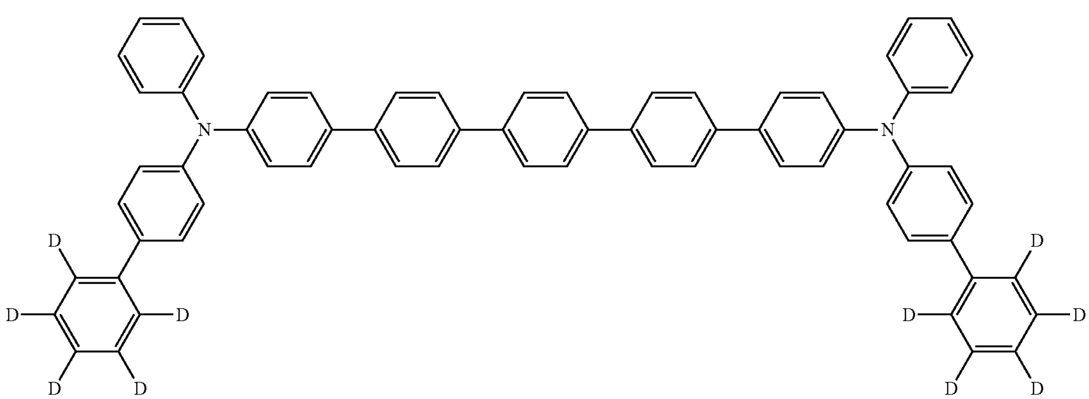

-continued
B19
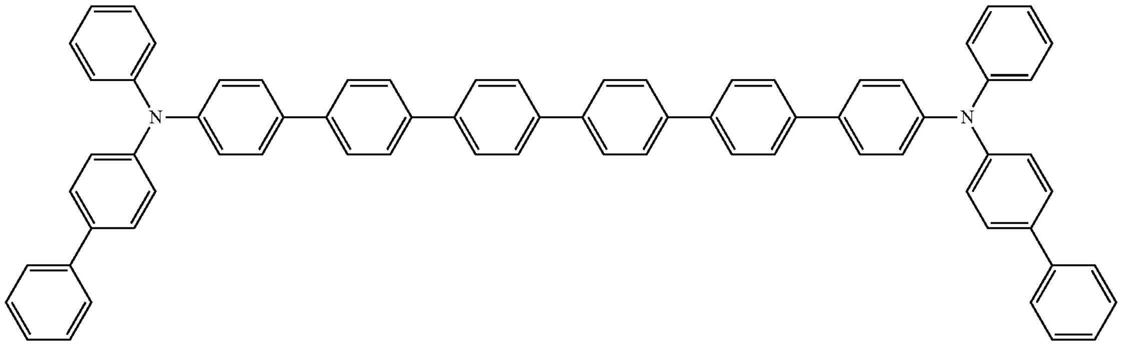
B20
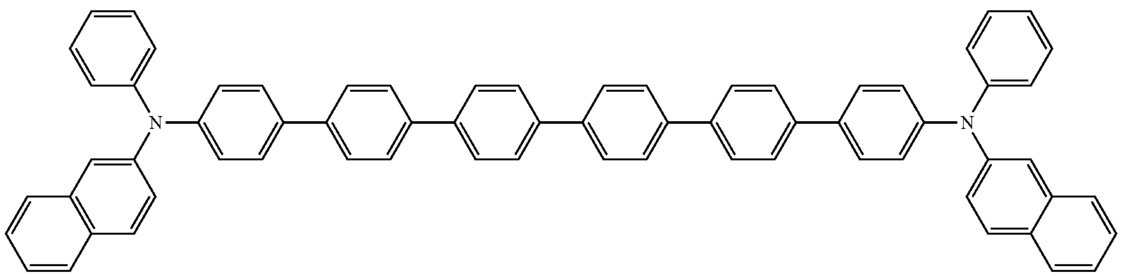
B21
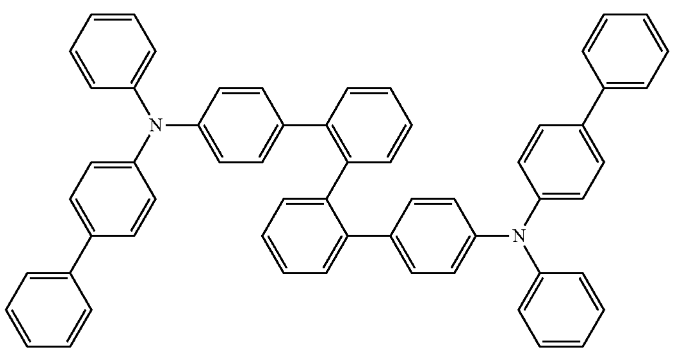
B22
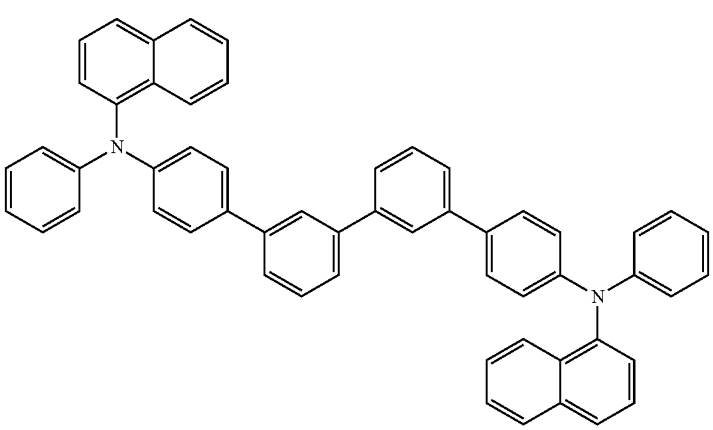

-continued
B23
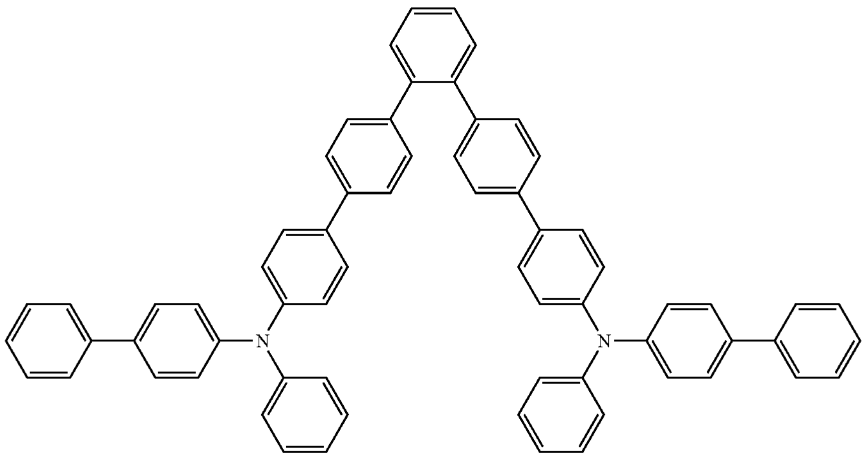
B24
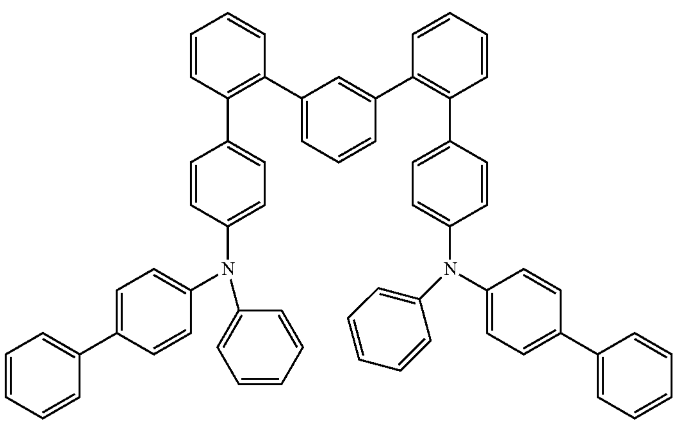
B25
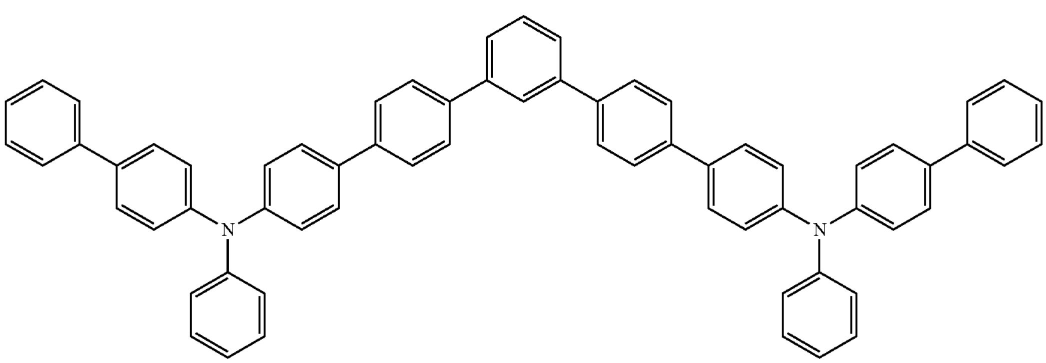

-continued
B26
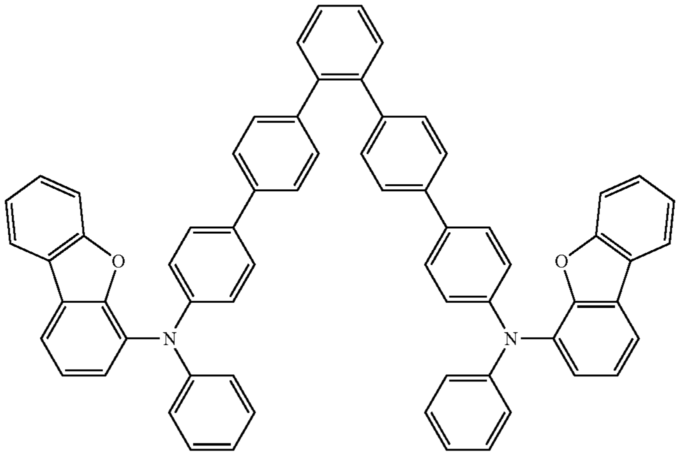
B27
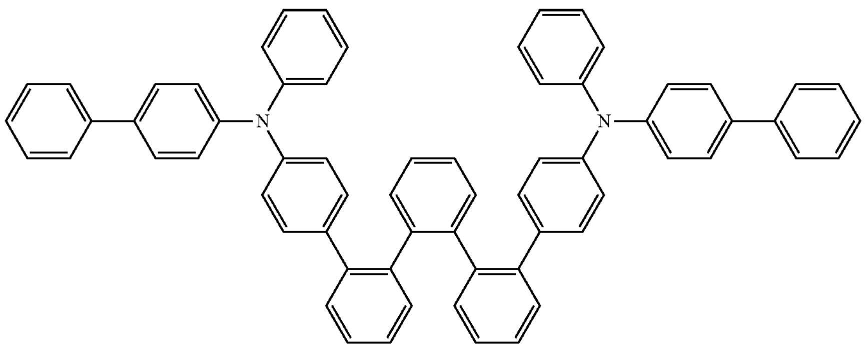
B28
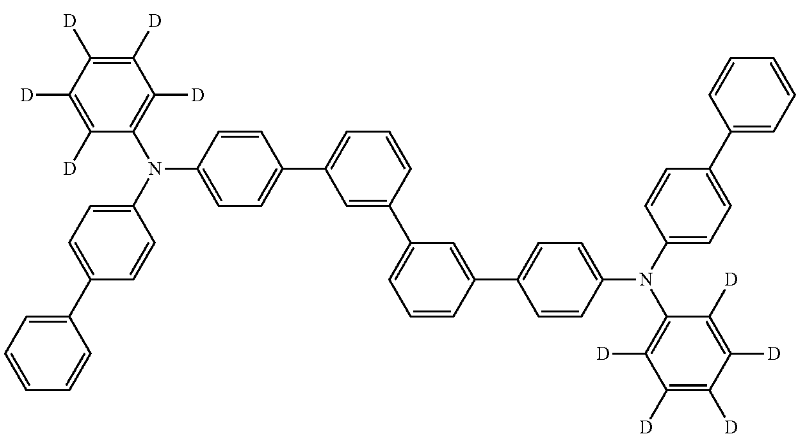
B29
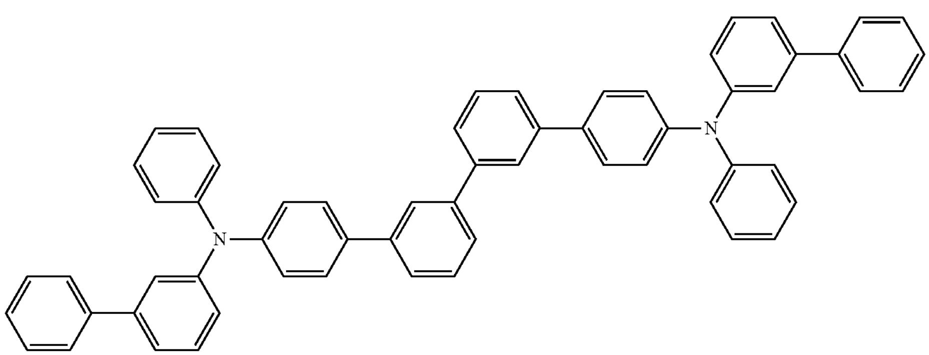

-continued
B30
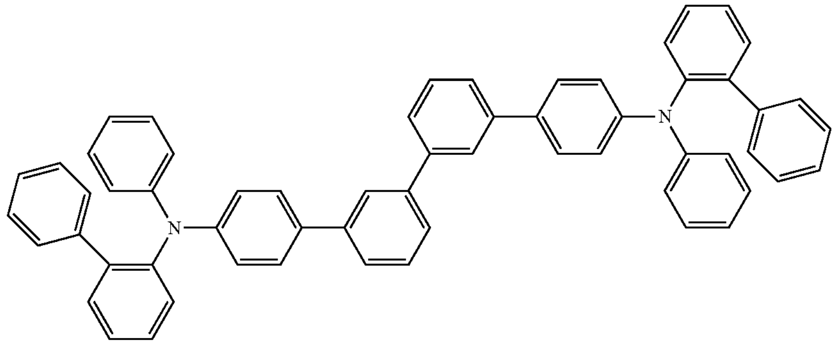
B31
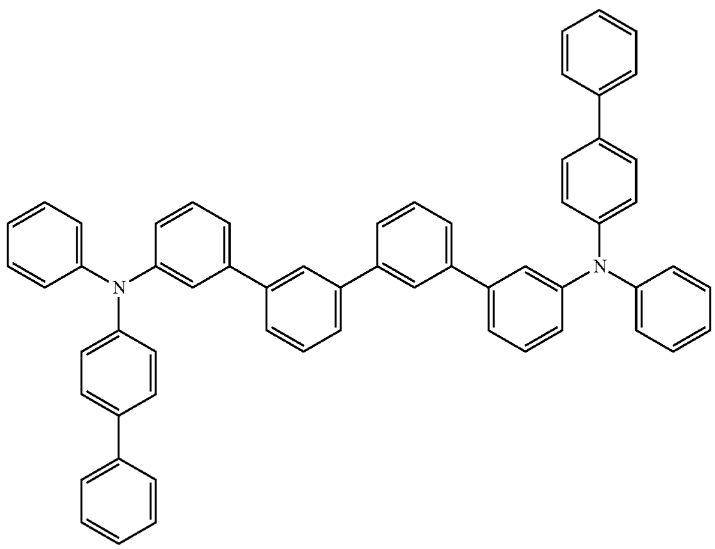
B32
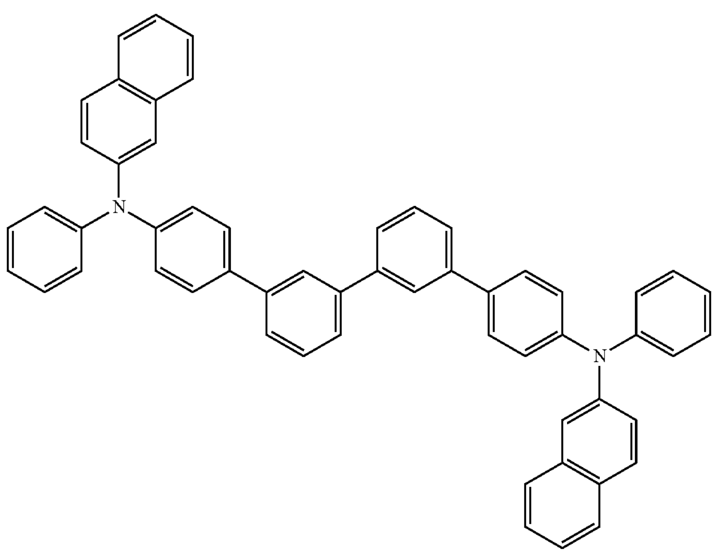

-continued
B33
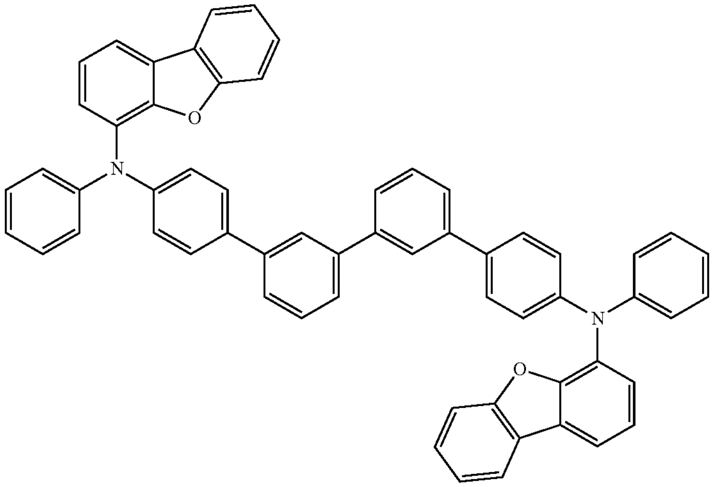
B34
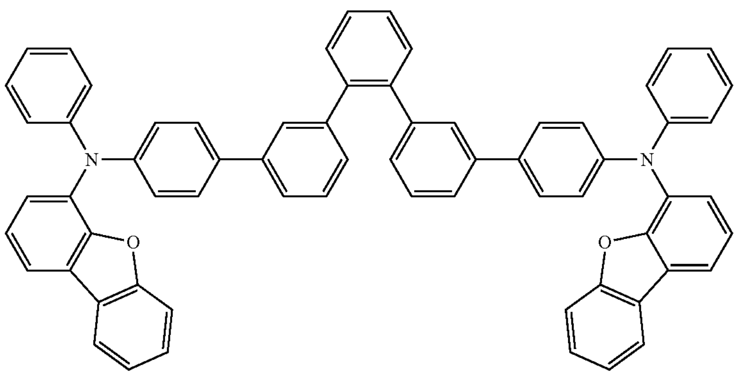
B35
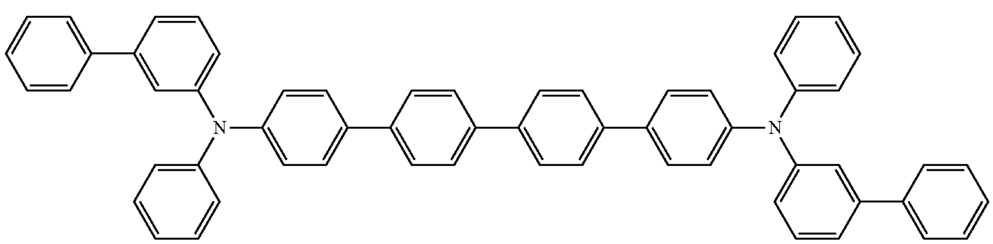
B36
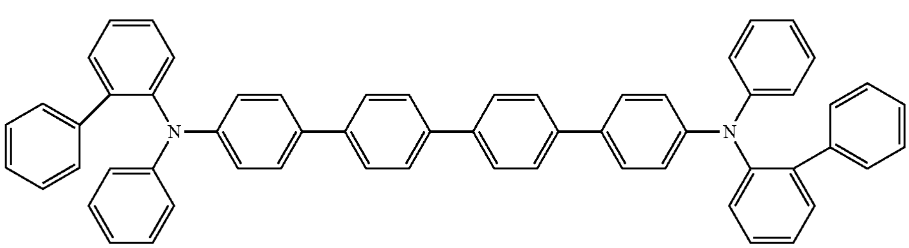

-continued
B37
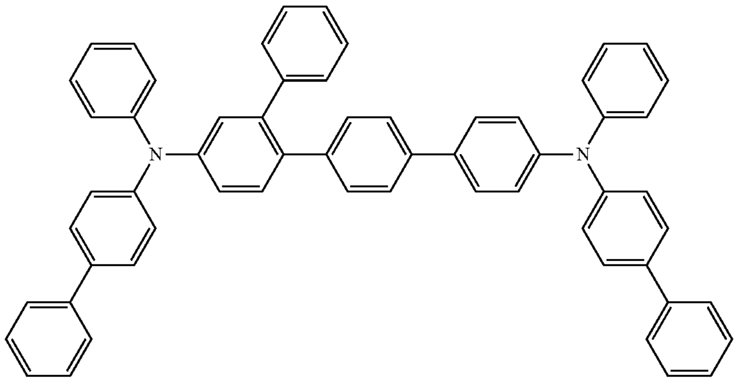
B38
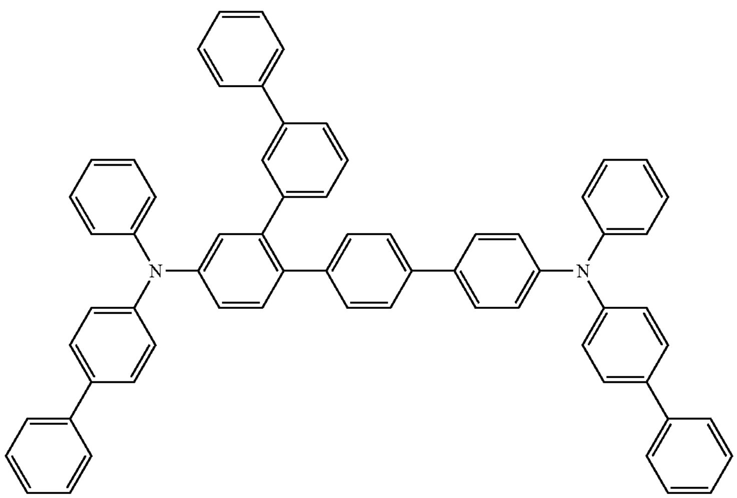
B39
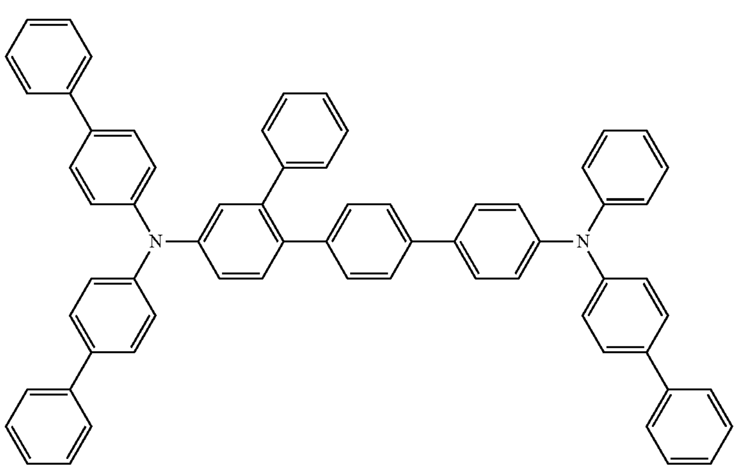

-continued
B40
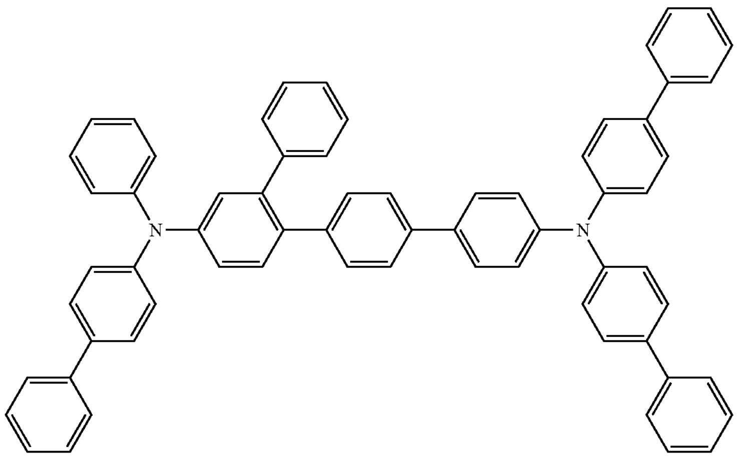
B41
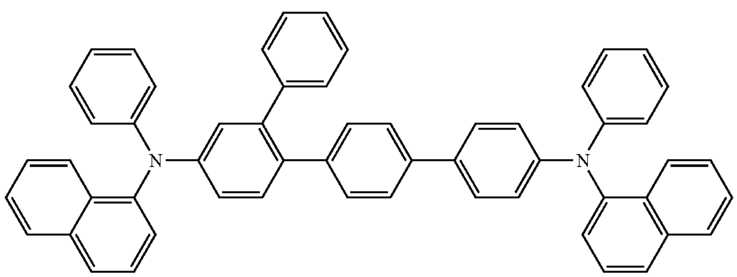
B42
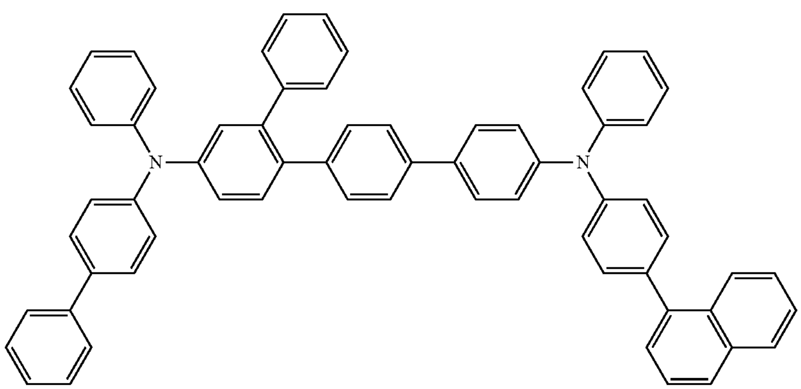
B43
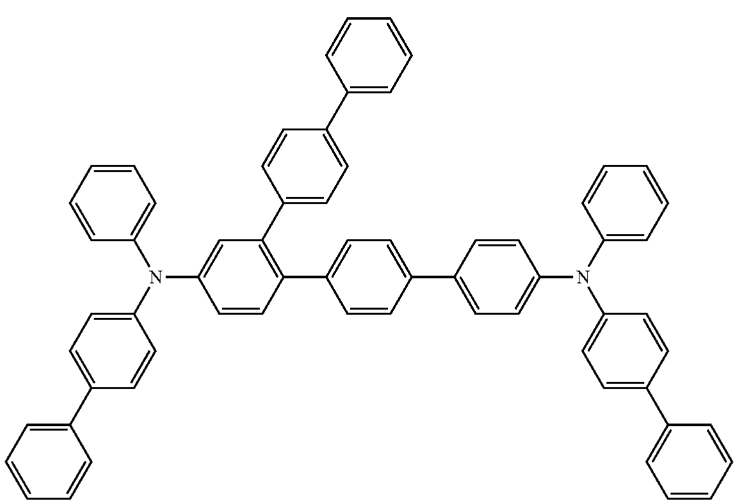

-continued
B44
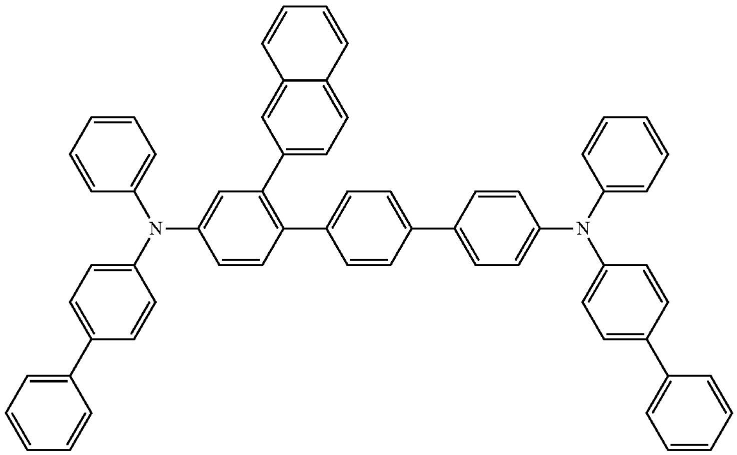
B45
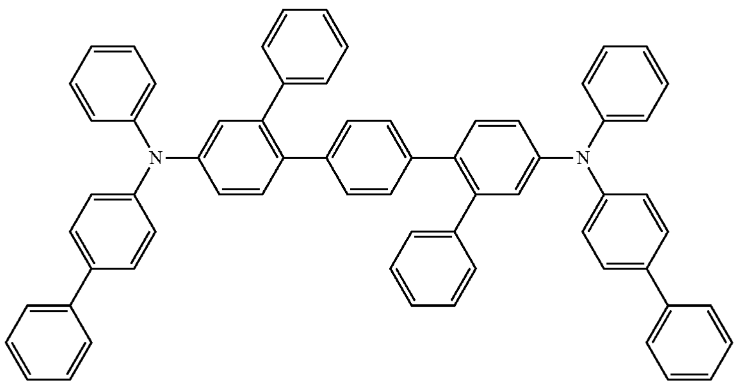
B46
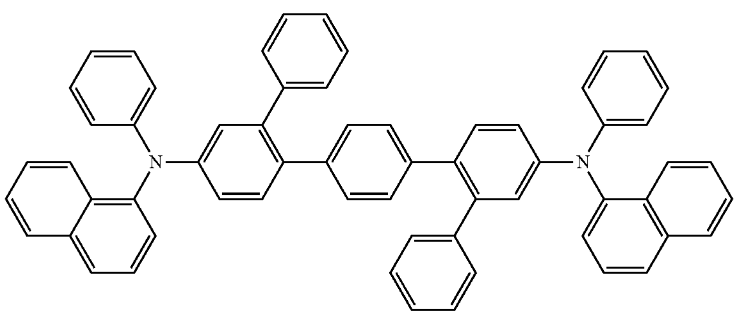
B47
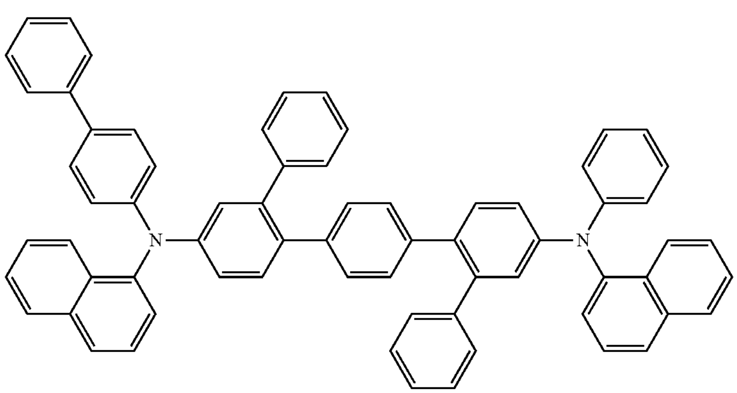

-continued
B48
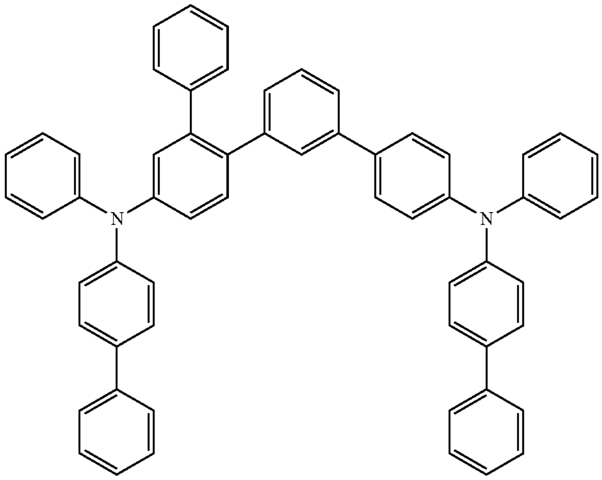
B49
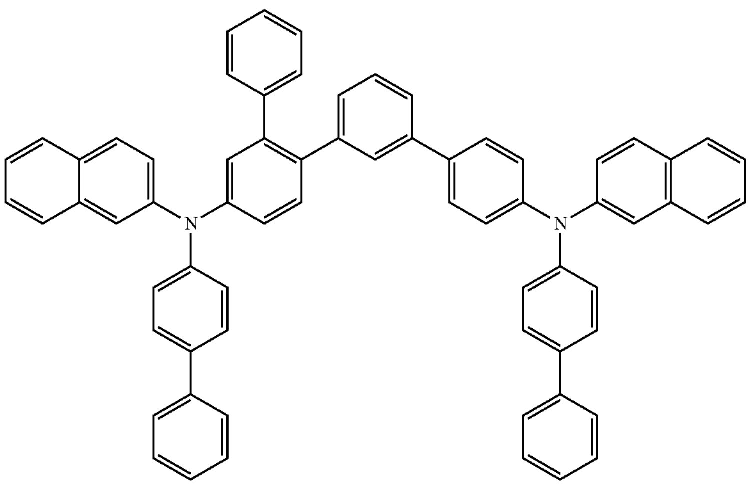
B50
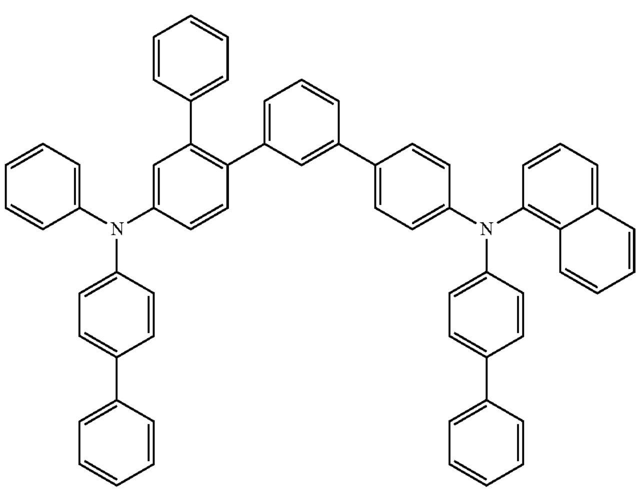

-continued
B51
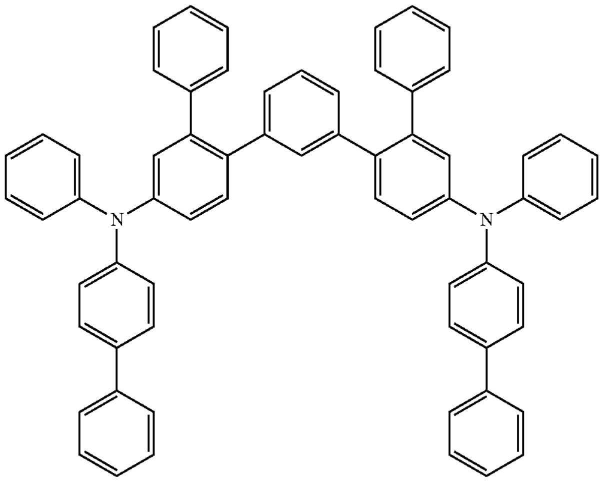
B52
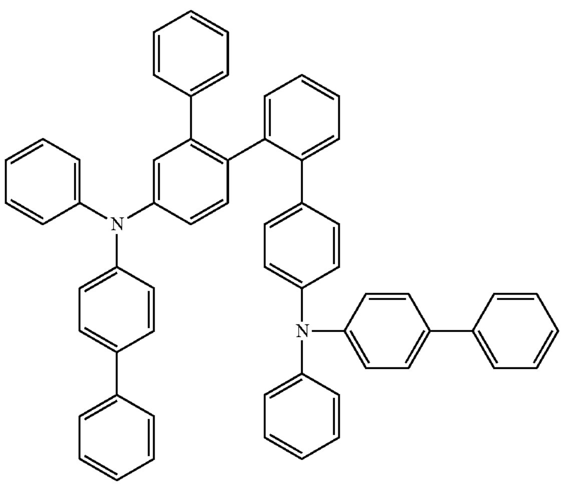
B53
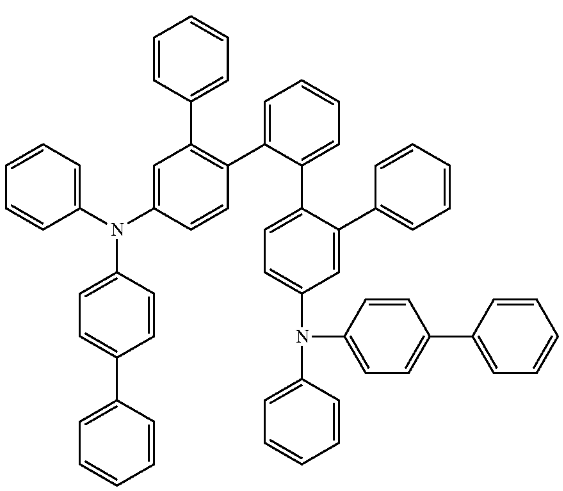

-continued
B54
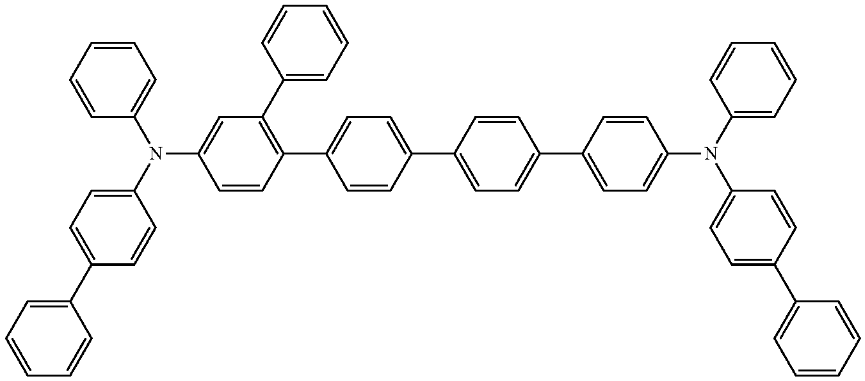
B55
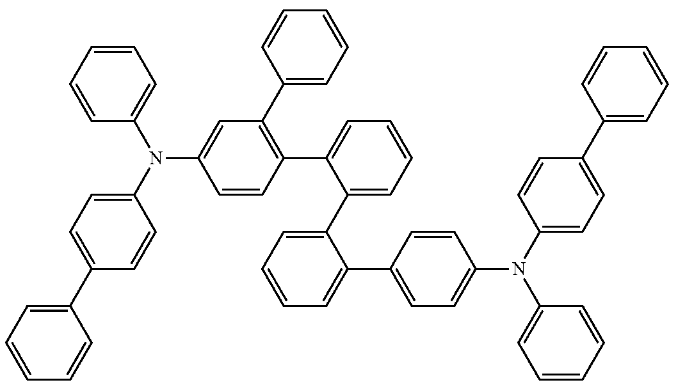
B56
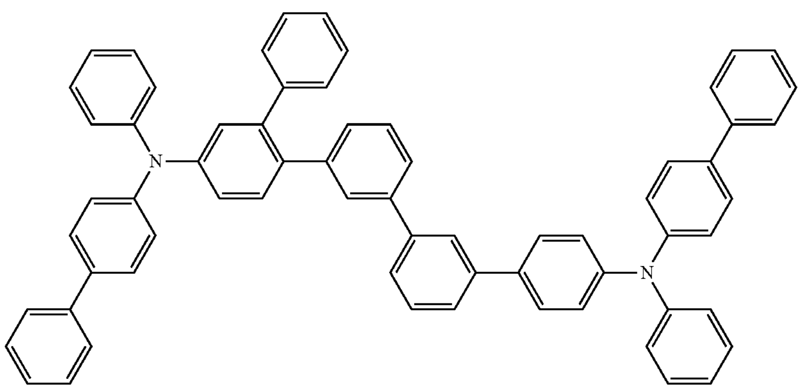
B57
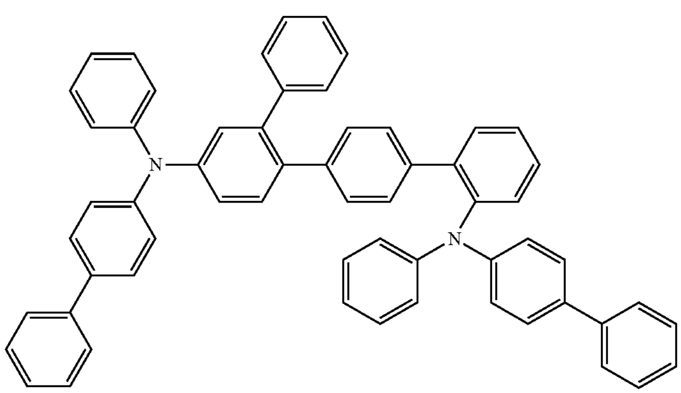

-continued
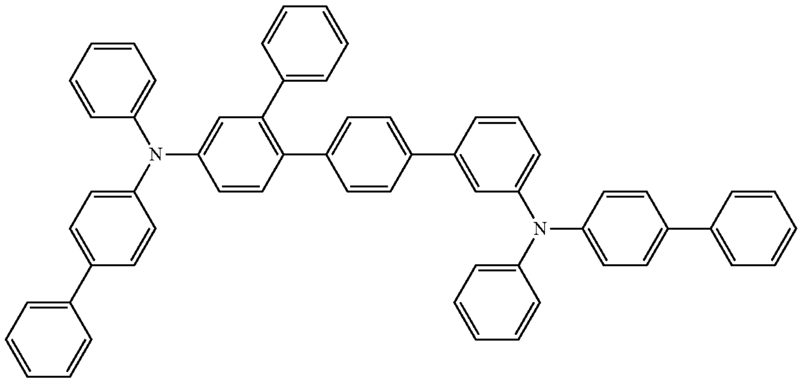
B58
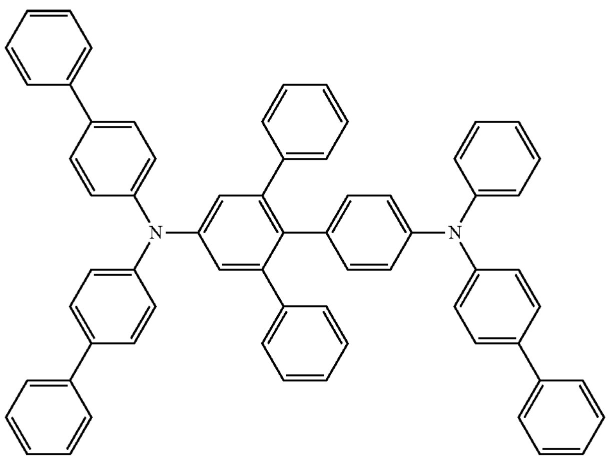
B59
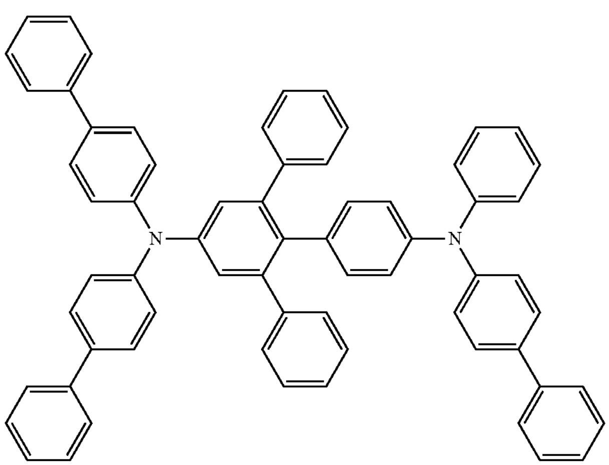
B60

-continued
B61
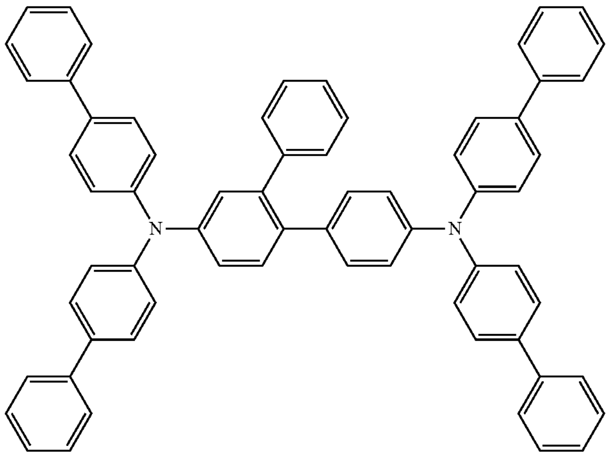
B62
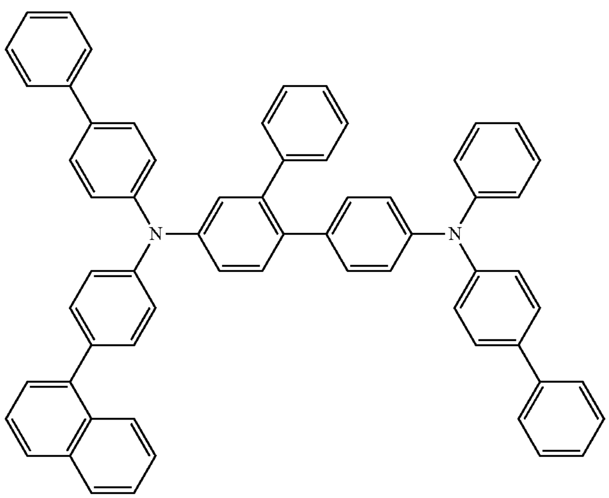
B63
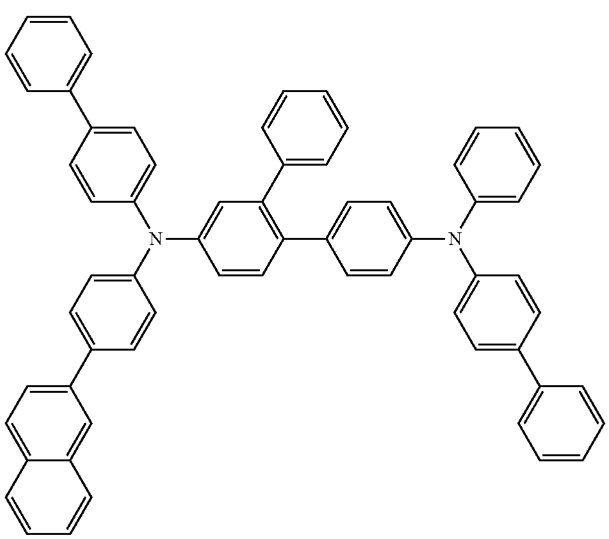

-continued
B64
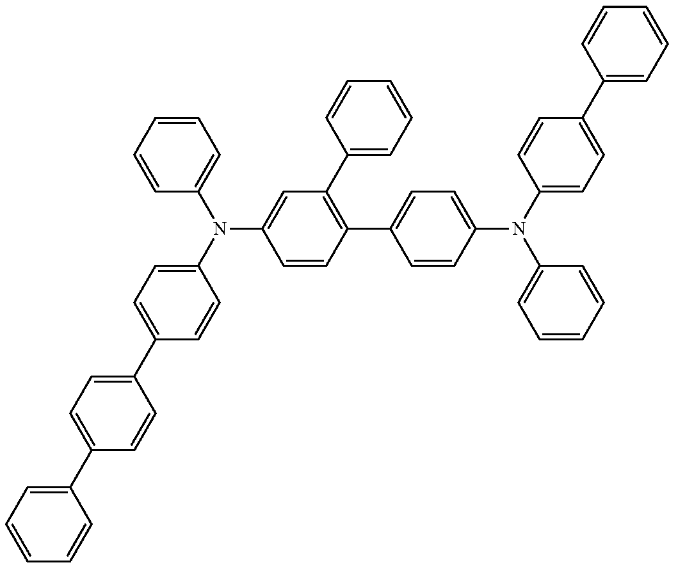
B65
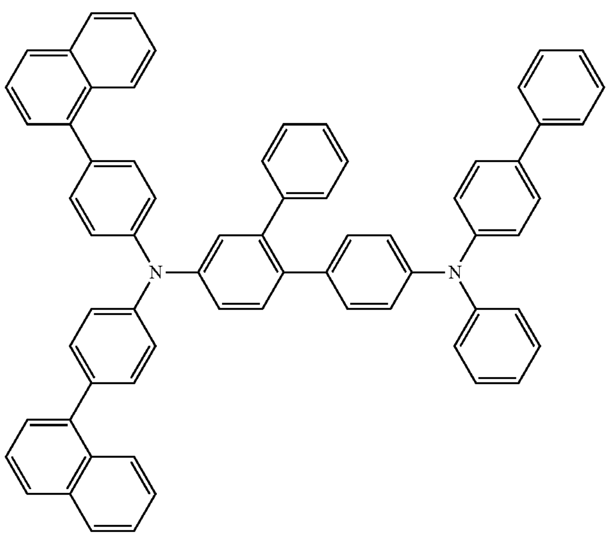
B66
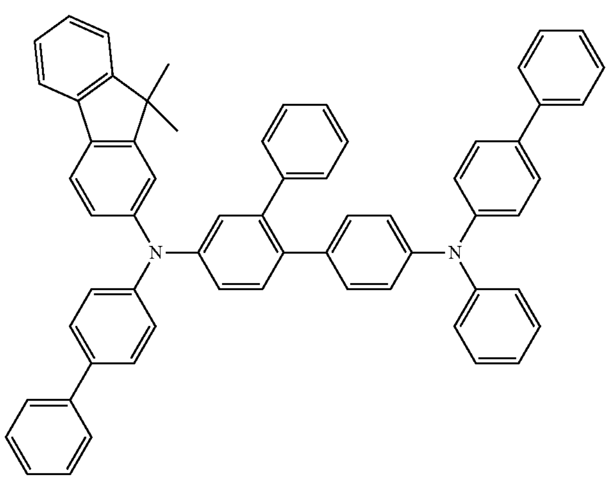

-continued
B67
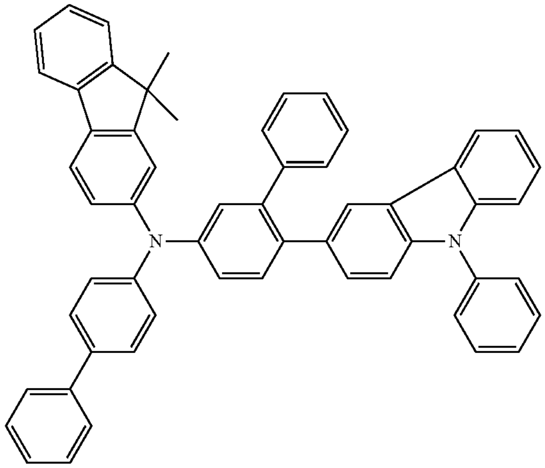
B68
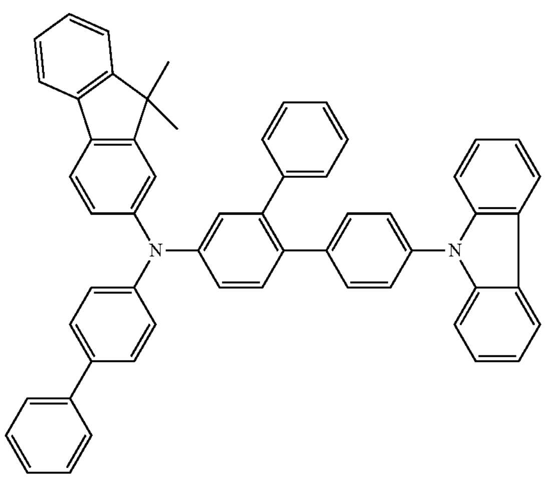
B69
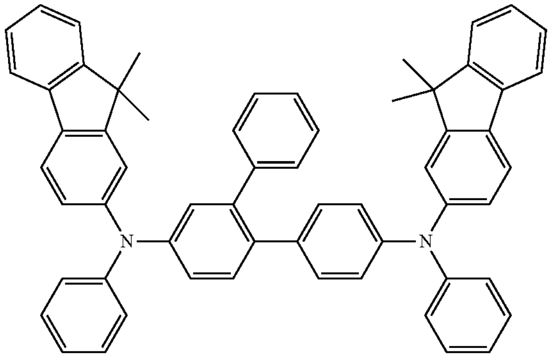

-continued
B70
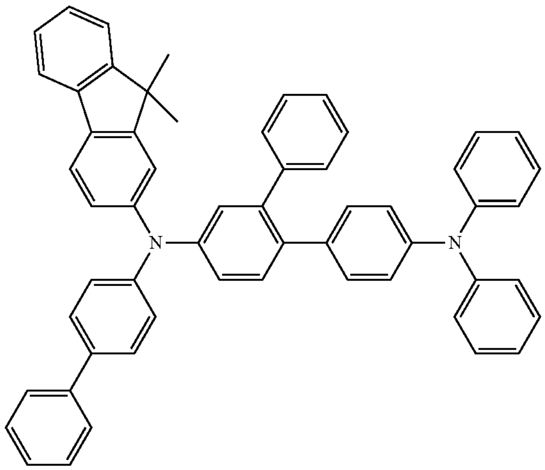
B71
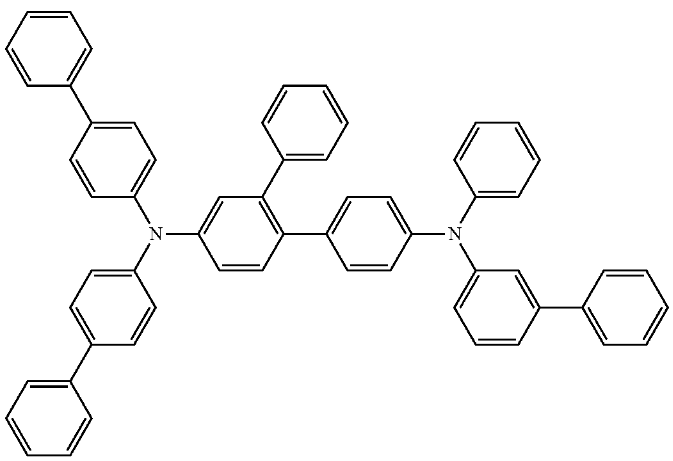
B72
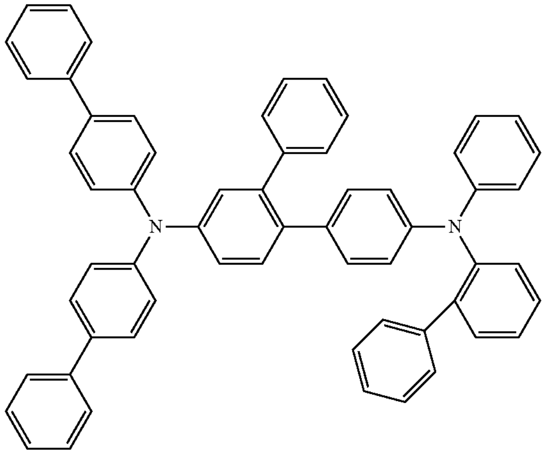

-continued
B73
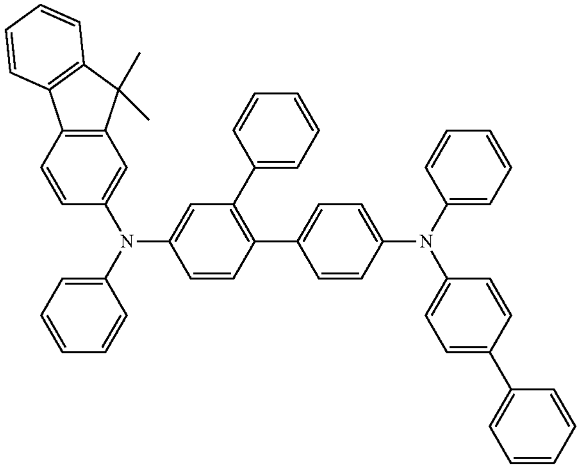
B74
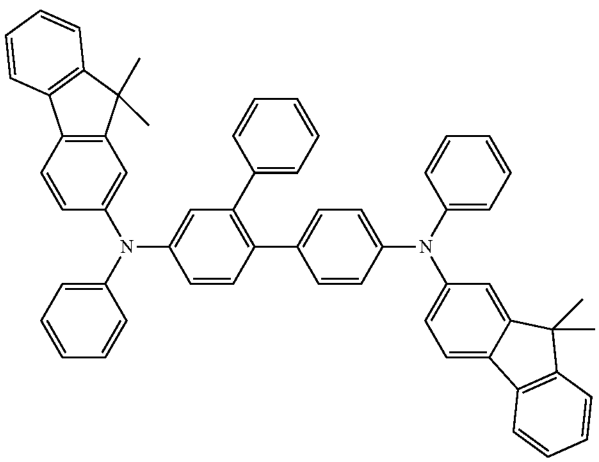
B75
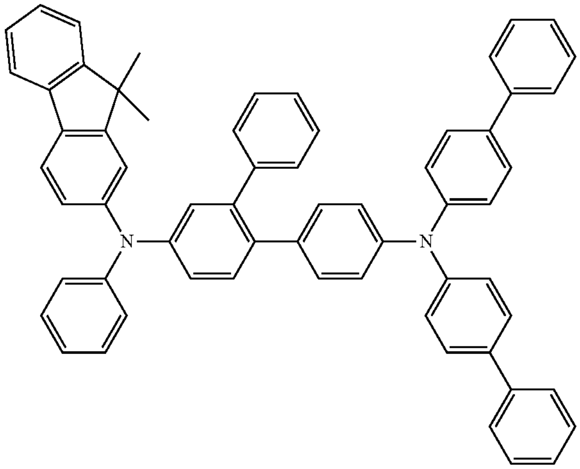

-continued
B76
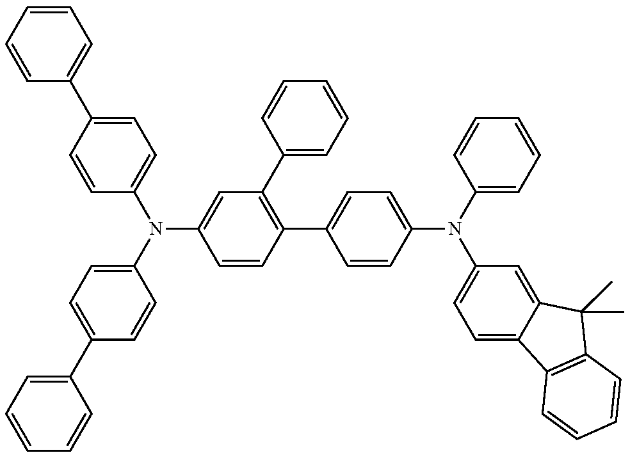
B77
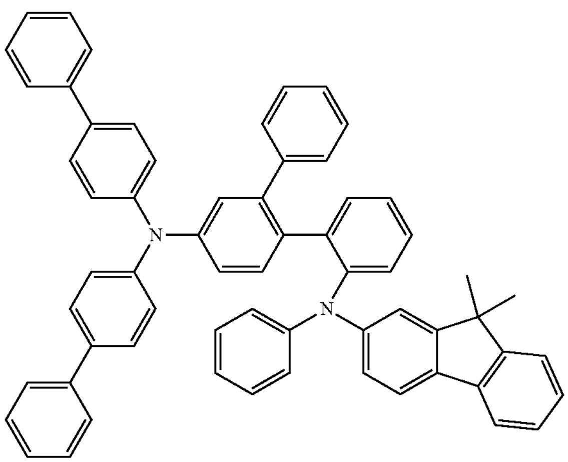
B78
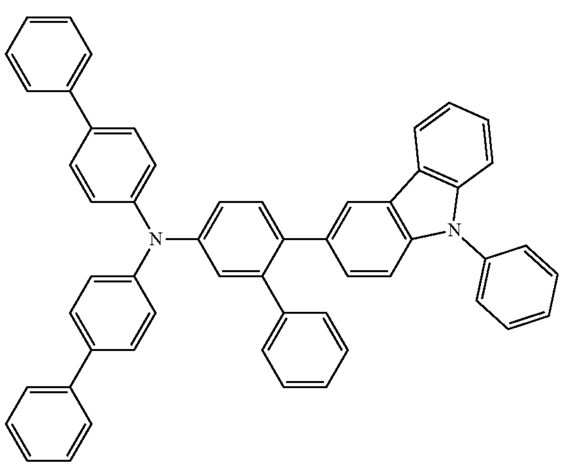

-continued
B79
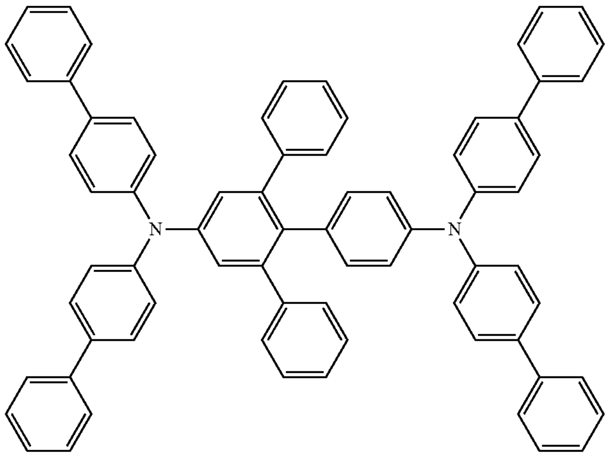
4. The organic electroluminescent device according to claim 1, wherein the compound of Formula B is selected from the group consisting of the following the compounds of Formula B101 to B145:
B101
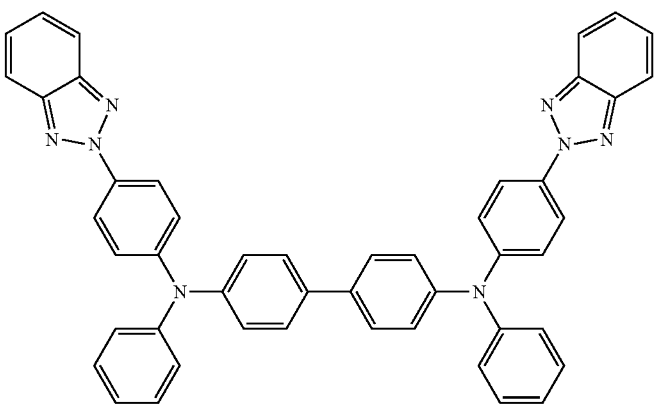
B102
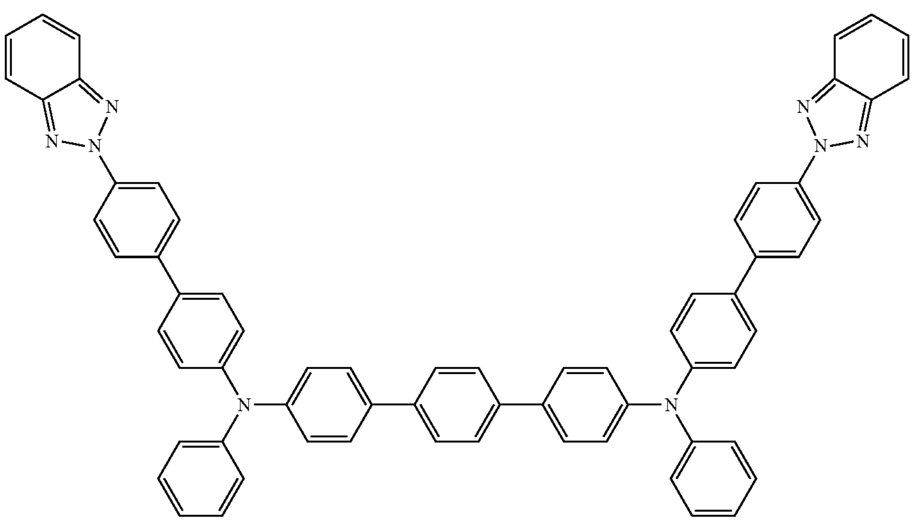

-continued
B103
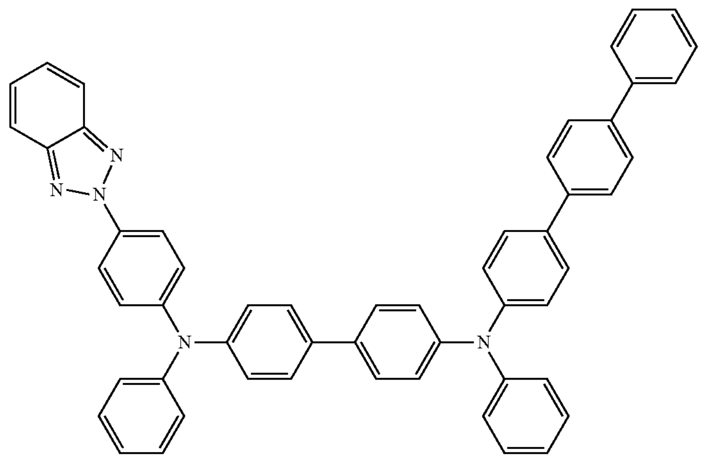
B104
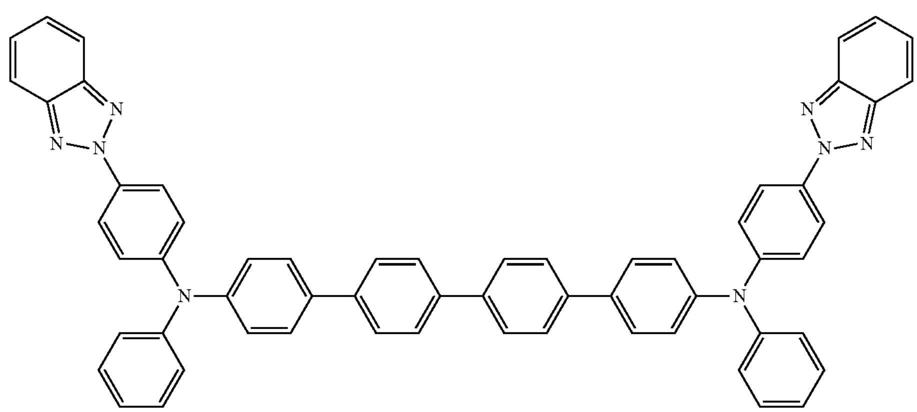
B105
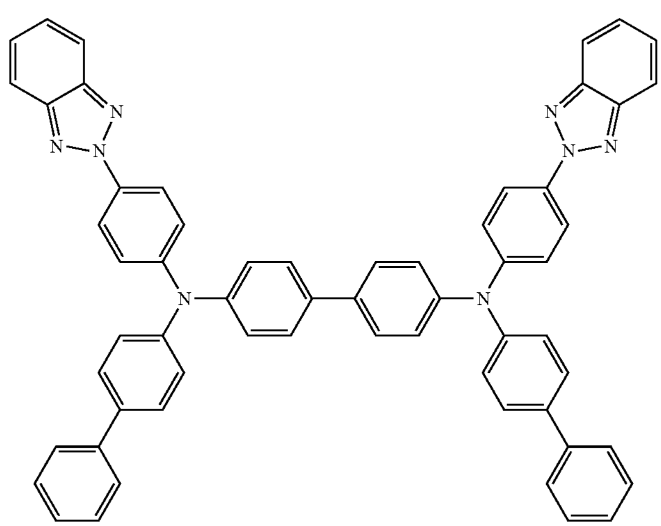

-continued
B106
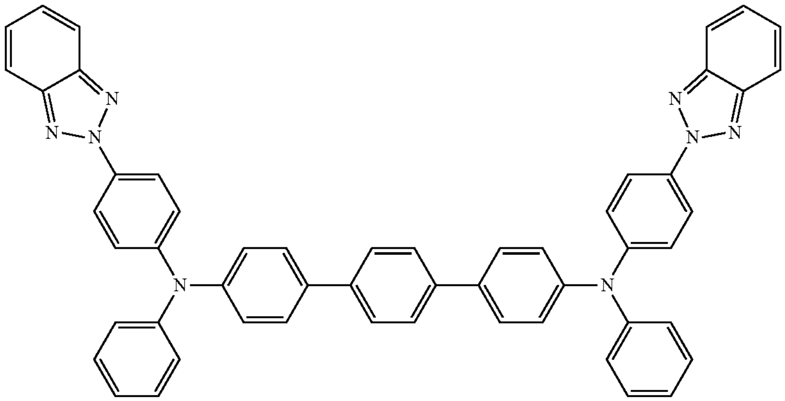
B107
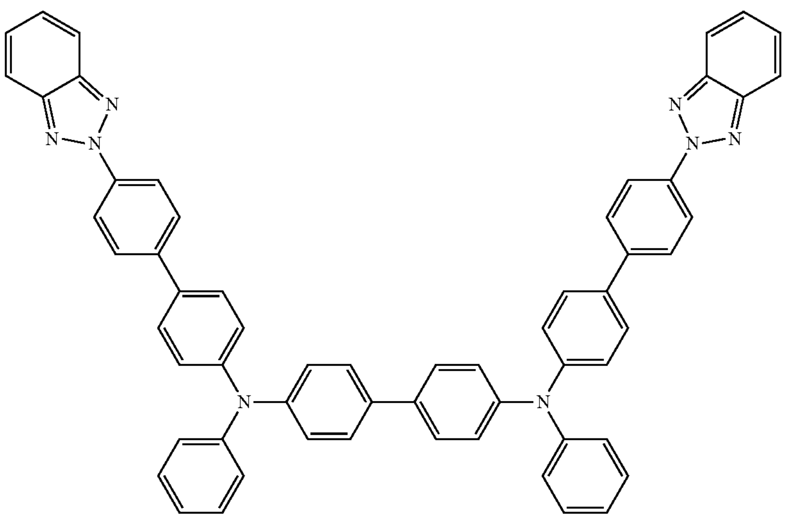
B108
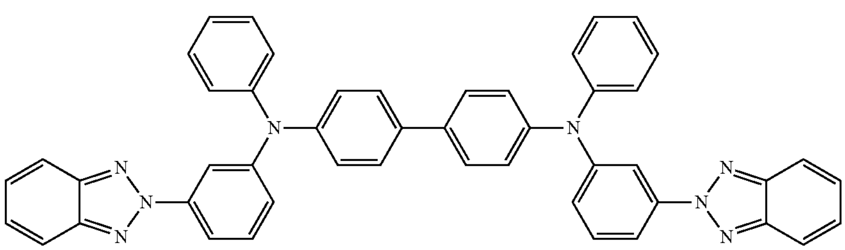
B109
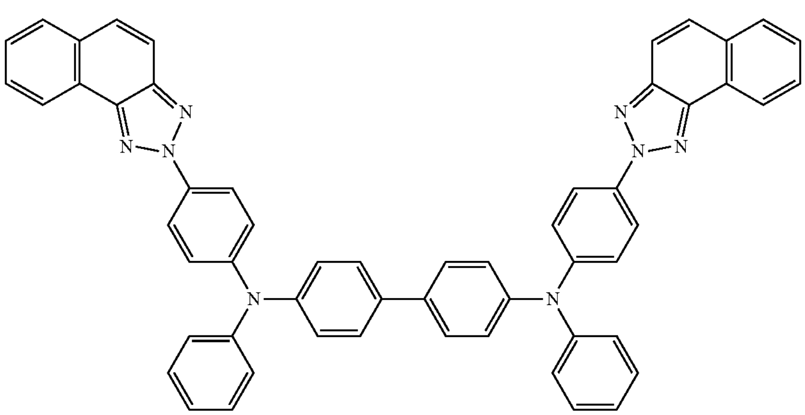

-continued
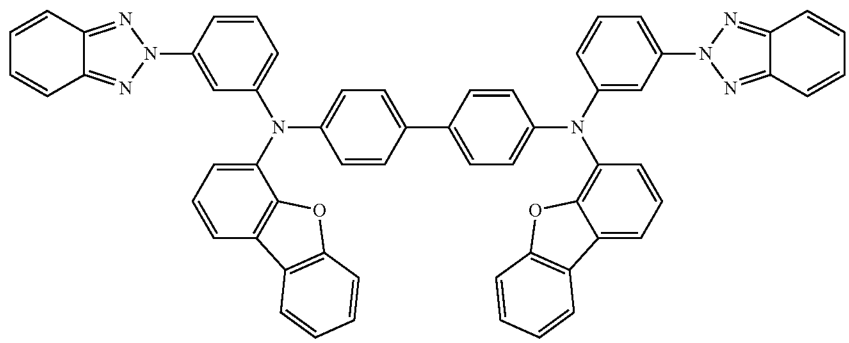
B110
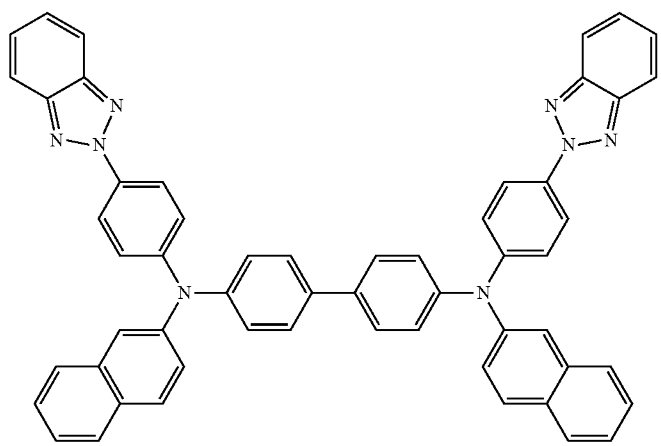
B111
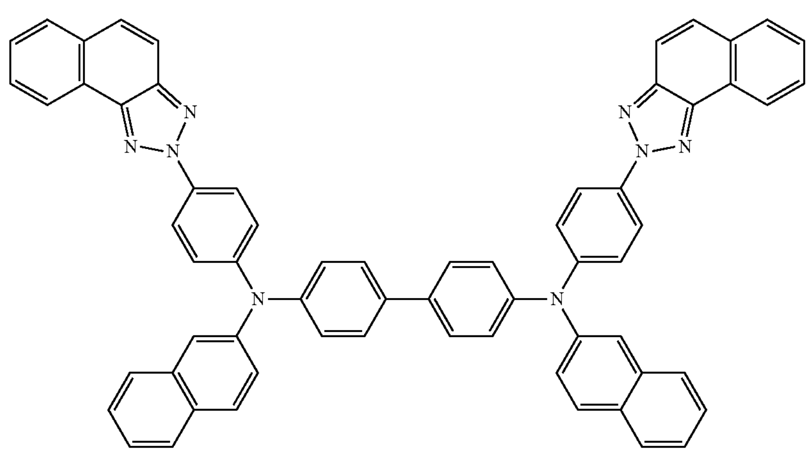
B112

-continued
B113
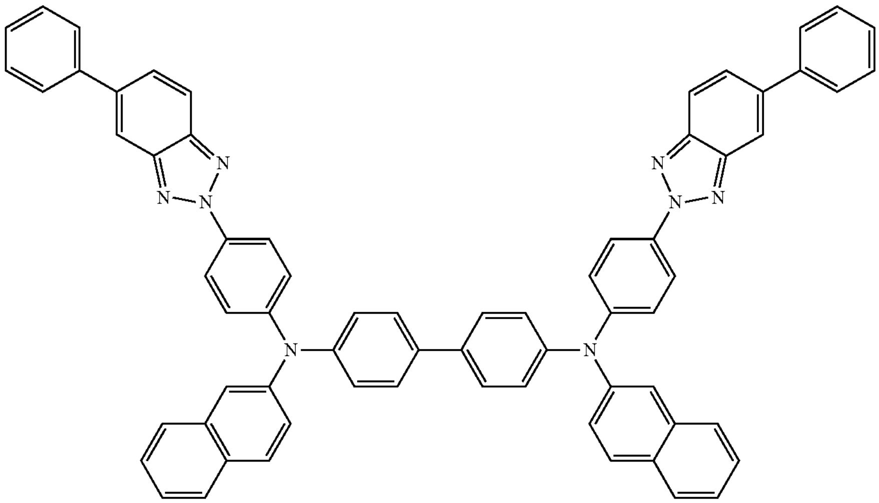
B114
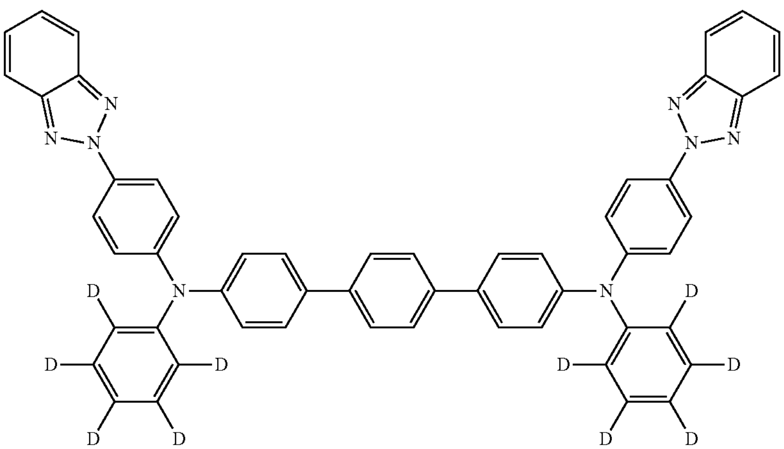
B115
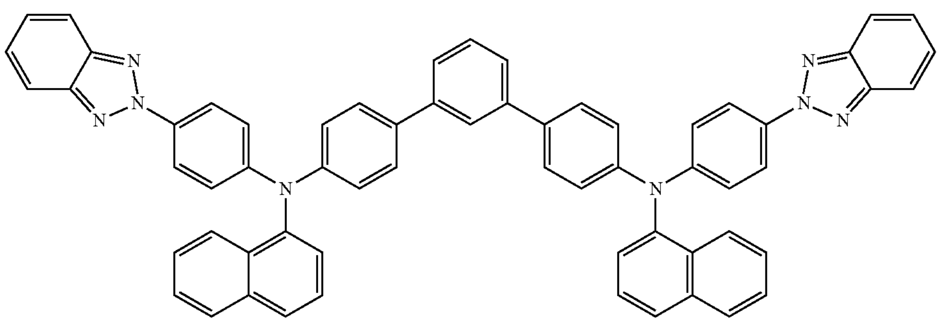
B116
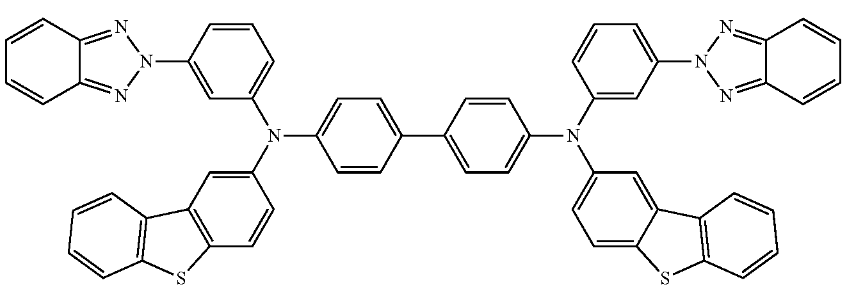

-continued
B117
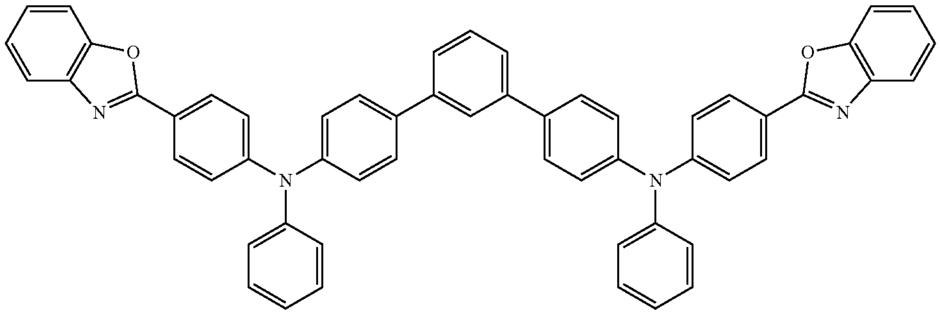
B118
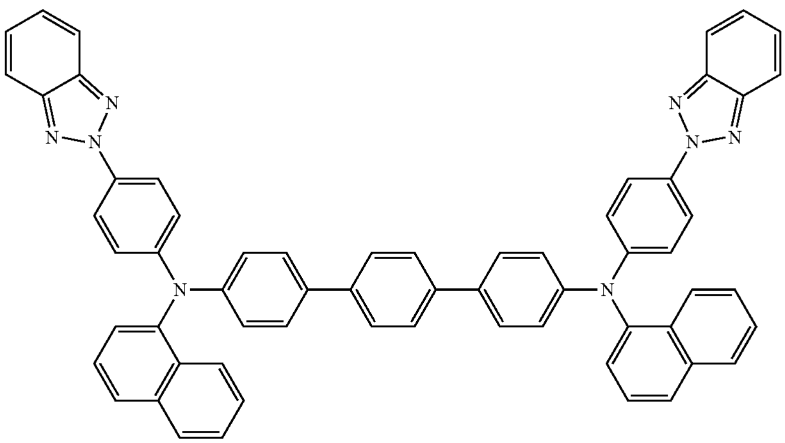
B119
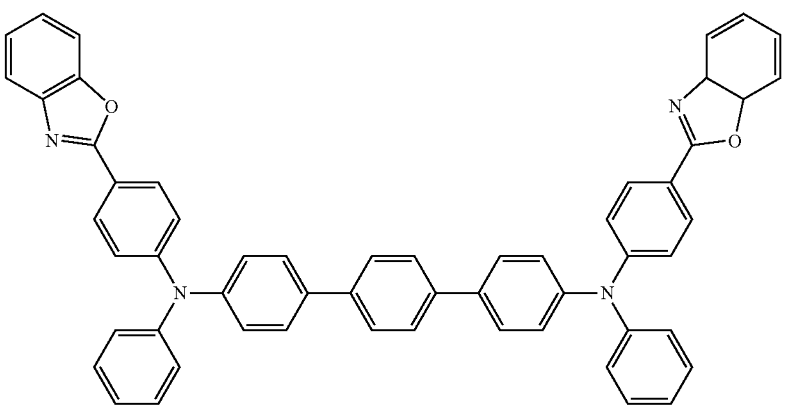
B120
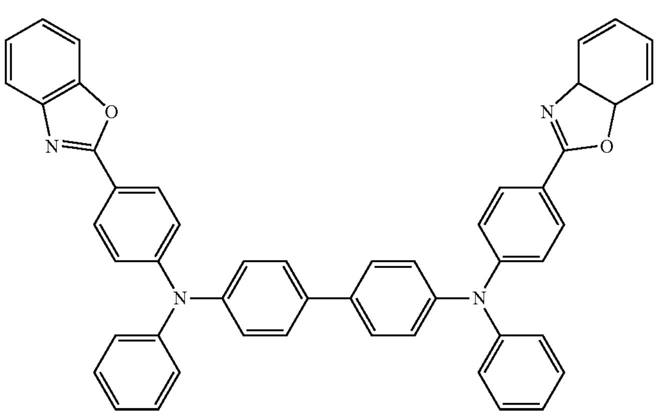

-continued
B121
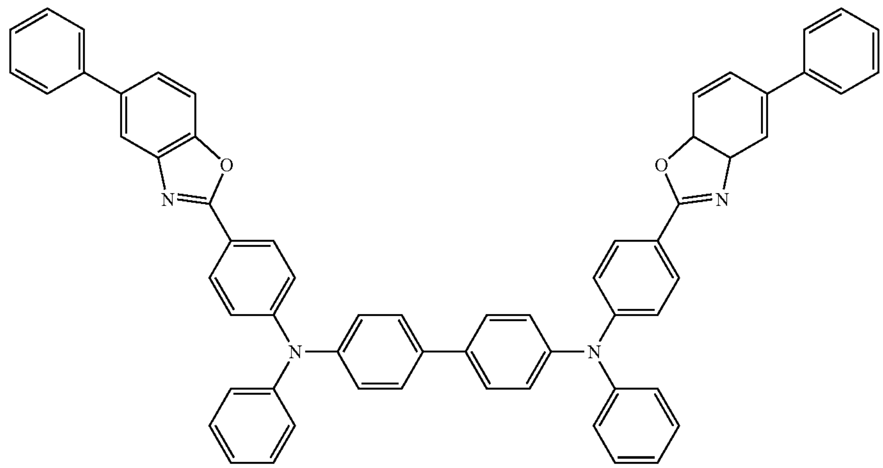
B122
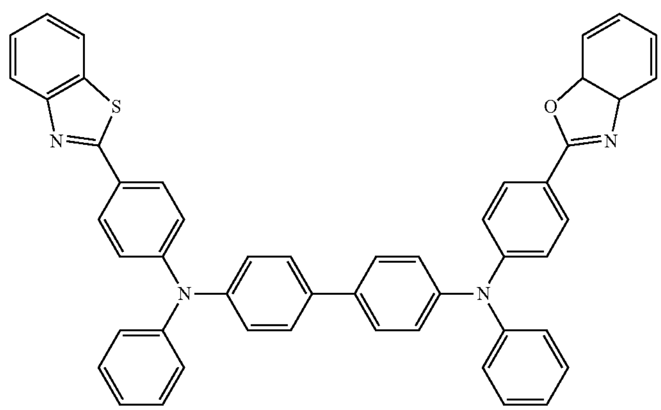
B123
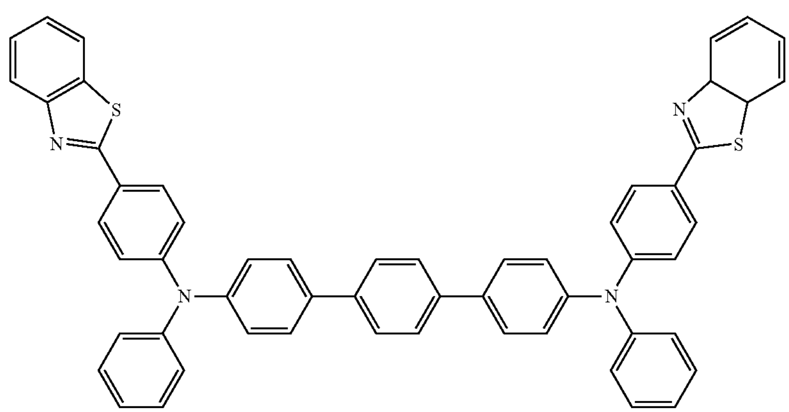

-continued
B124
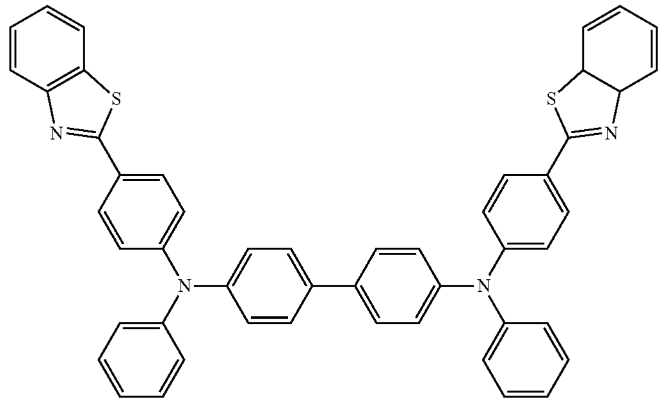
B125
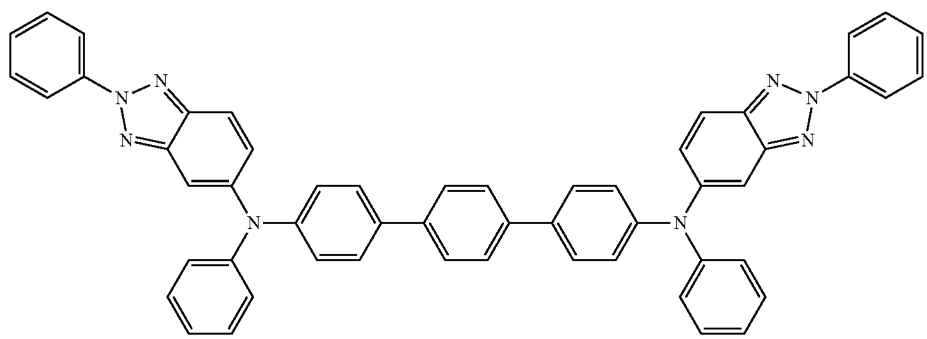
B126
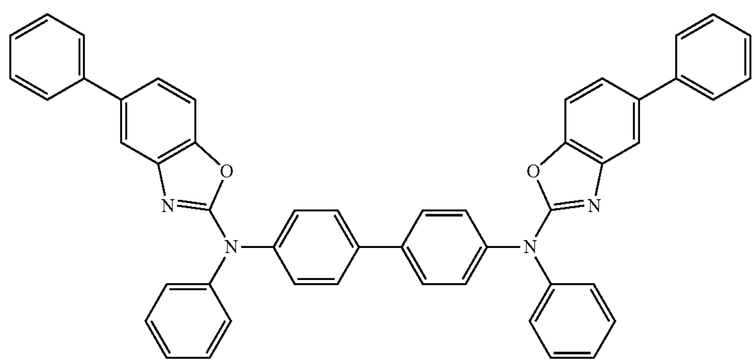
B127
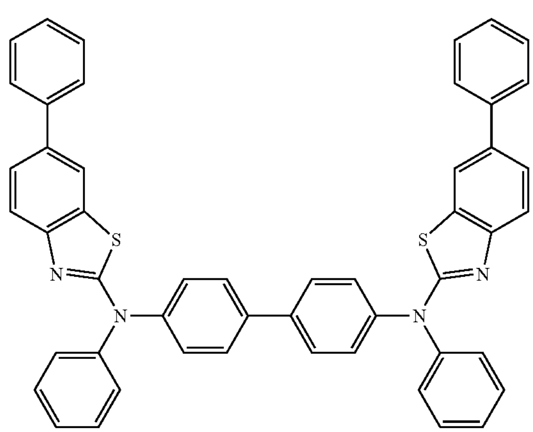

-continued
B128
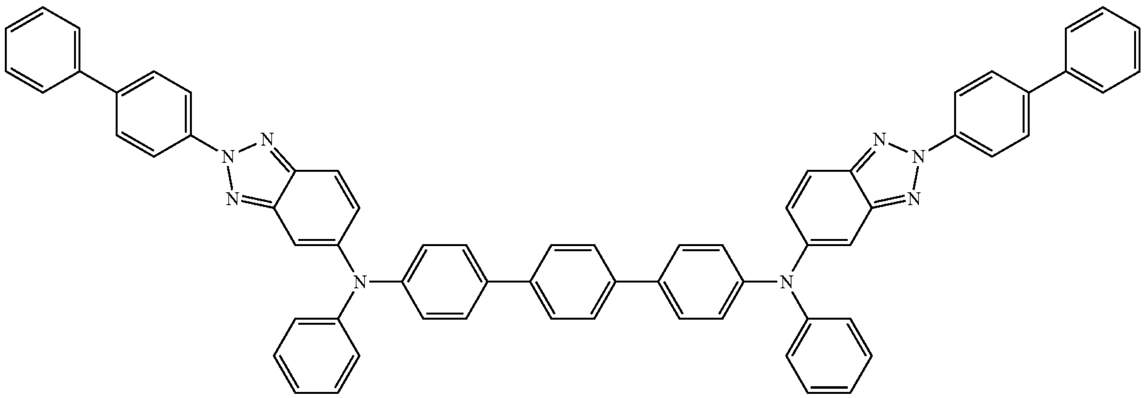
B129
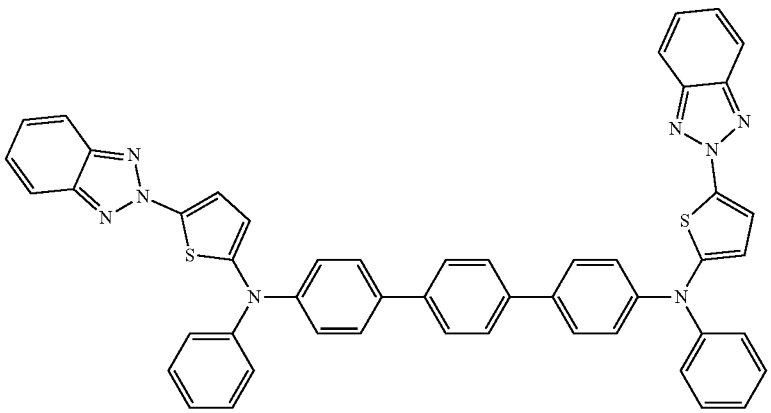
B130
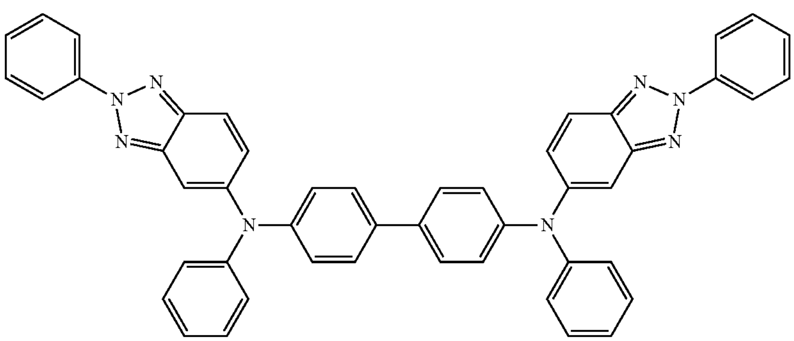
B131
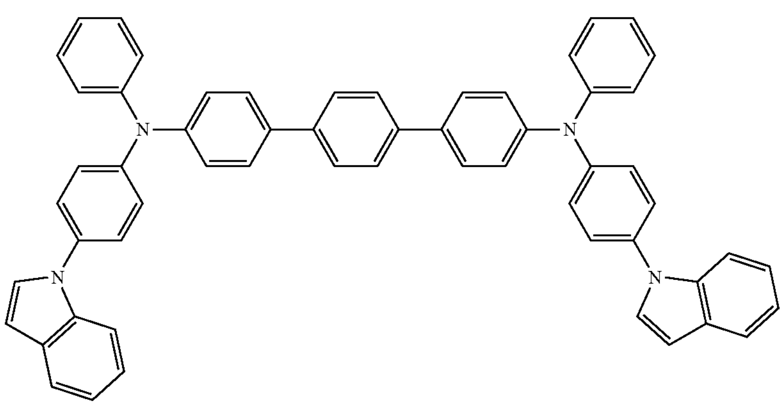

-continued
B132
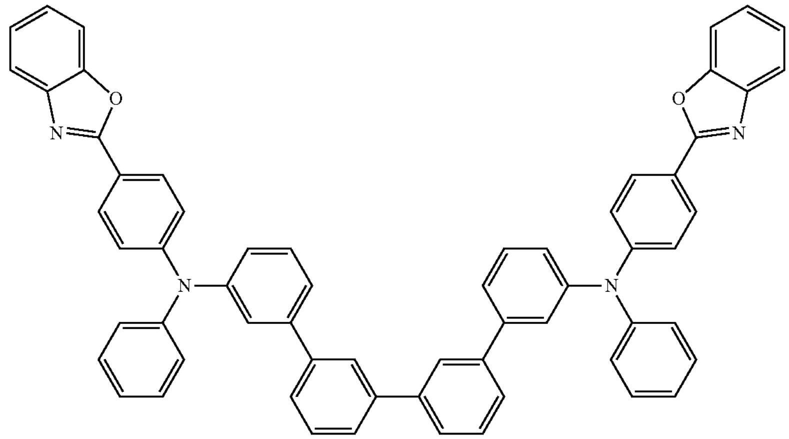
B133
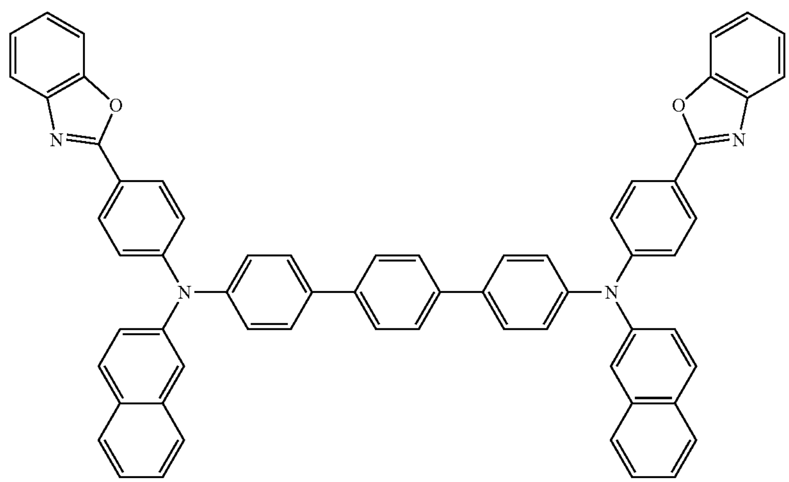
B134
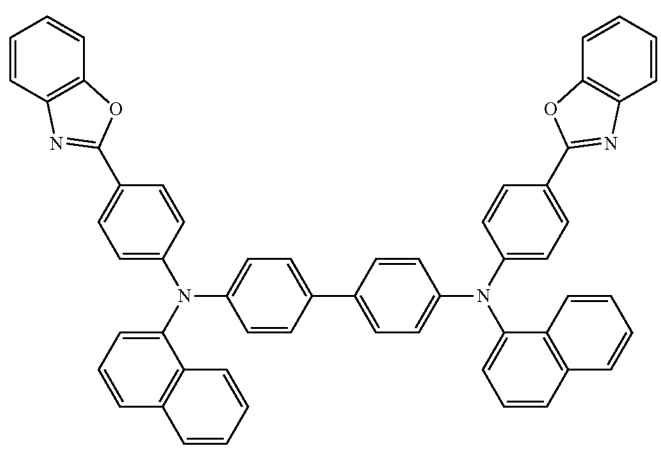

-continued
B135
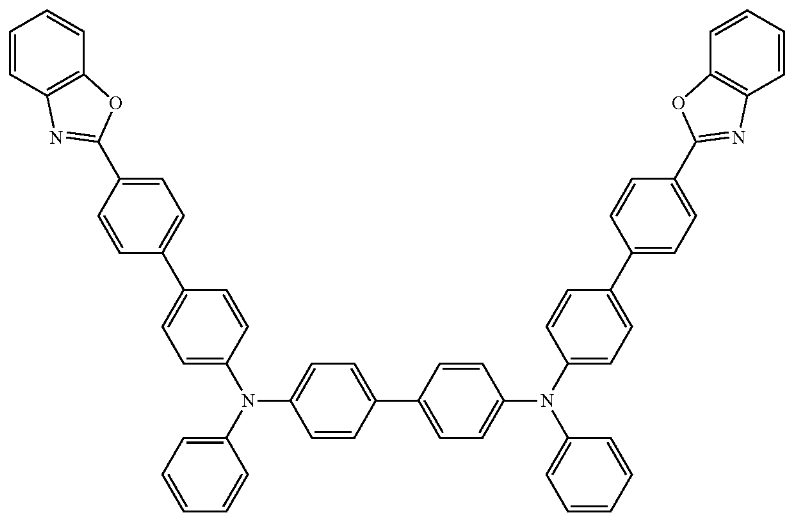
B136
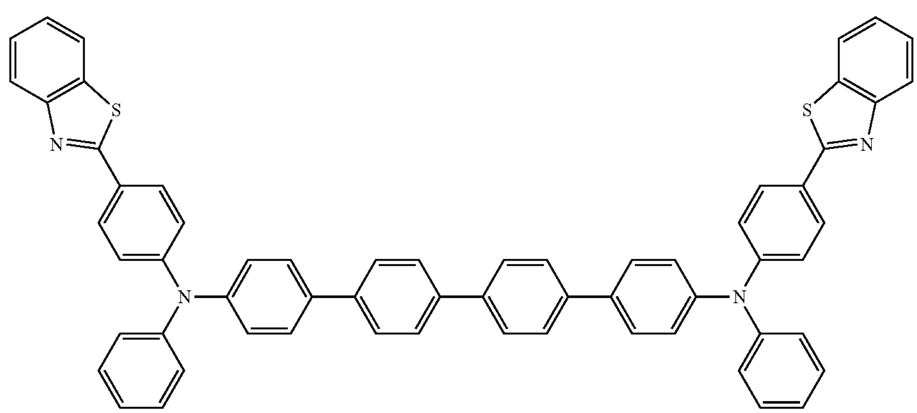
B137
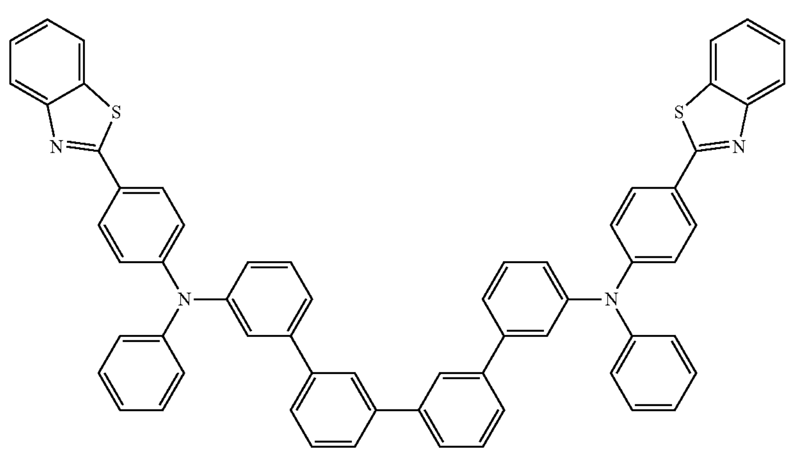

-continued
B138
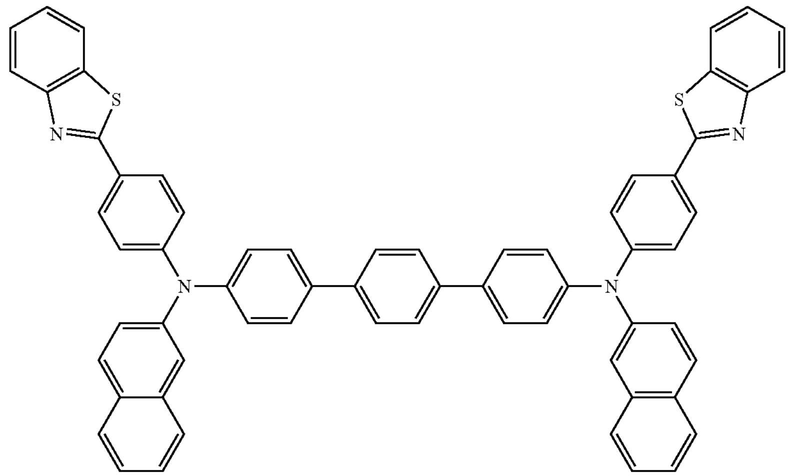
B139
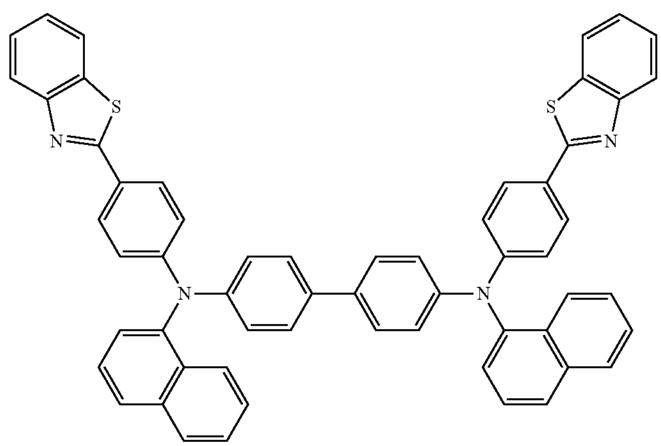
B140
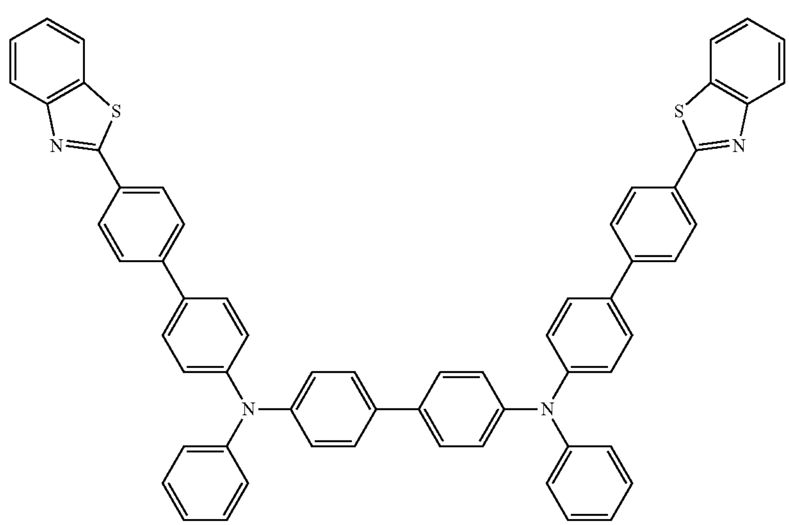

-continued
B141
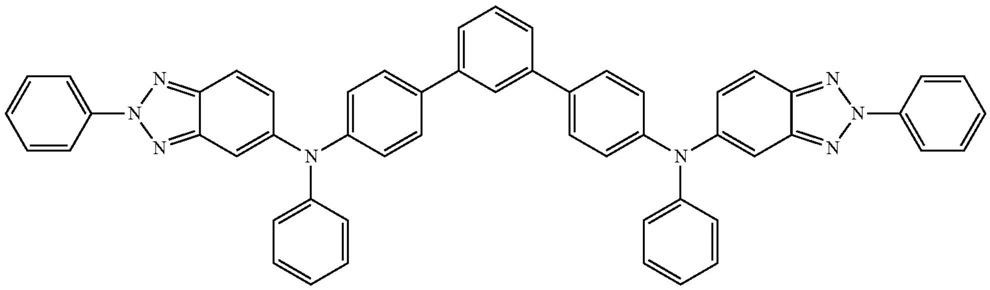
B142
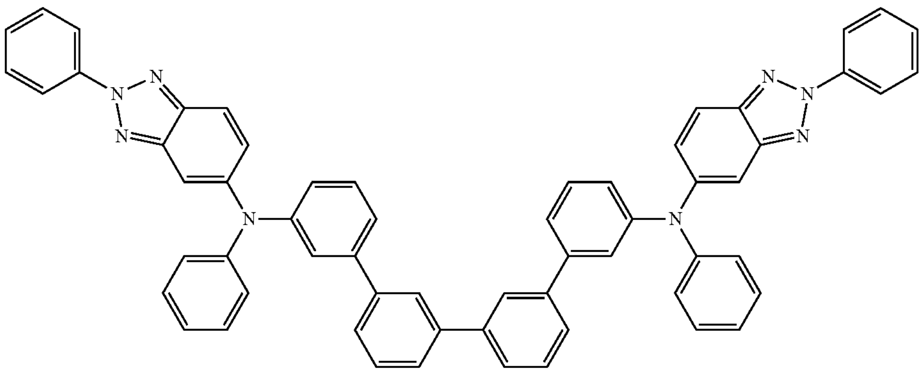
B143
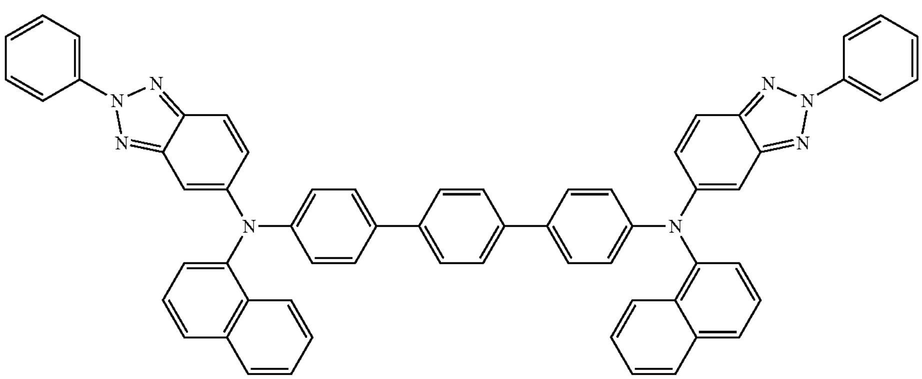
B144
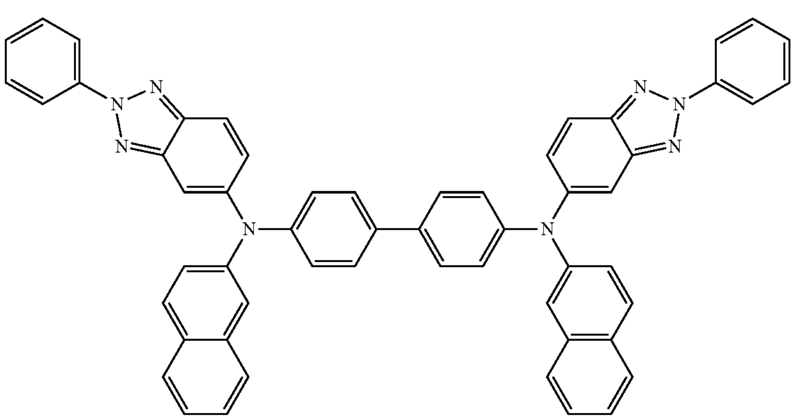

-continued

B145

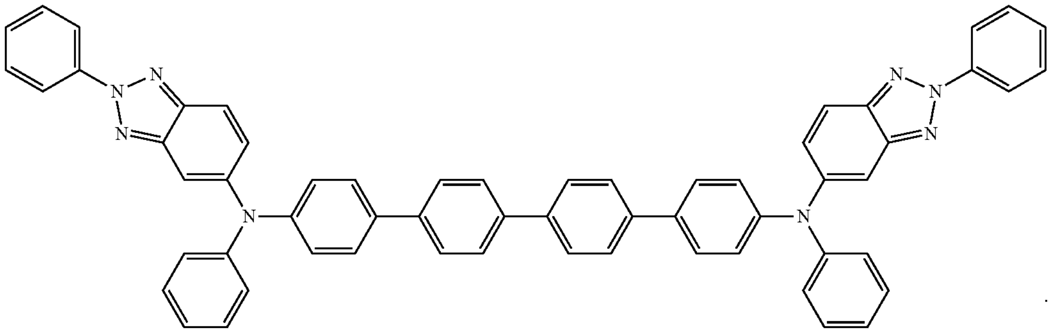

5. The organic electroluminescent device according to claim 1, wherein the light emitting layer comprises, as a host compound, an anthracene derivative represented by Formula D:

[Formula D]

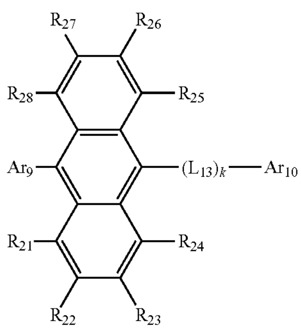

wherein $R_{21}$ to $R_{28}$ are identical to or different from each other and are as defined for R, $R_2$ to $R_5$ in Formula A-5, $Ar_9$ and $Ar_{10}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from the group consisting of substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

6. The organic electroluminescent device according to claim 5, wherein the compound of Formula D is selected from the group consisting of the compounds of Formulae D1 to D48:

D1

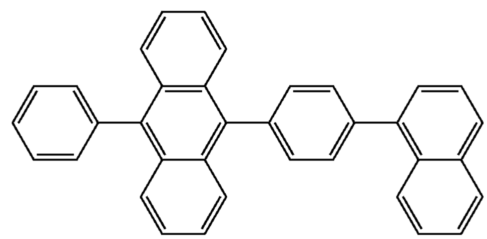

D2

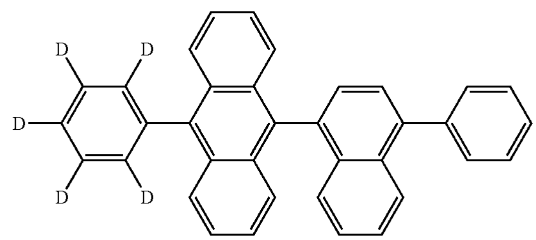

D3

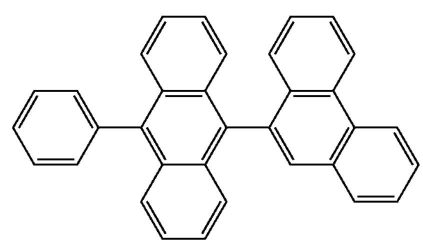

D4

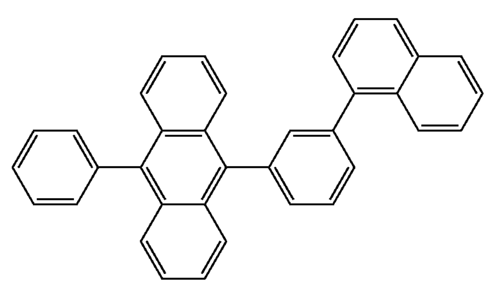

-continued
D5
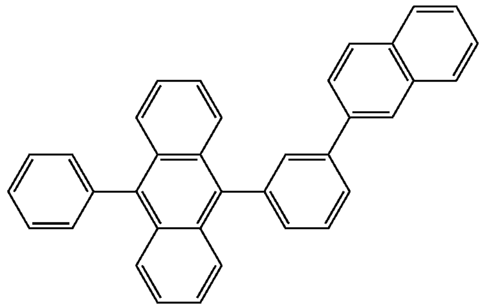
D6
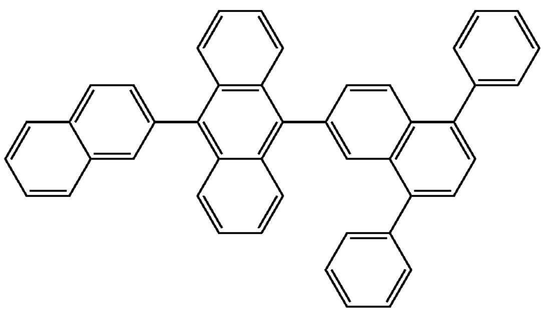
D7
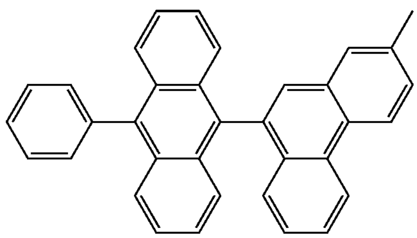
D8
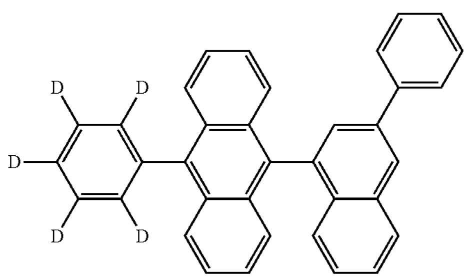
D9
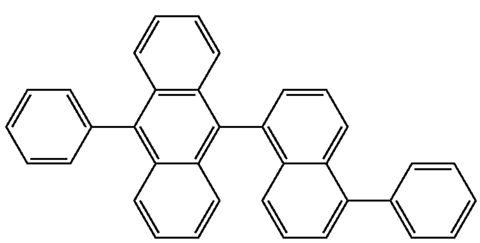
D10
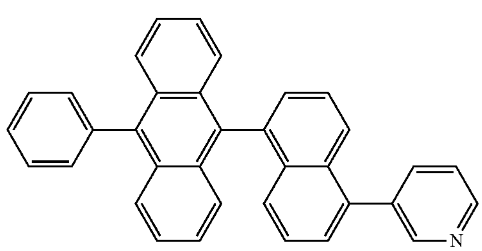
-continued
D11
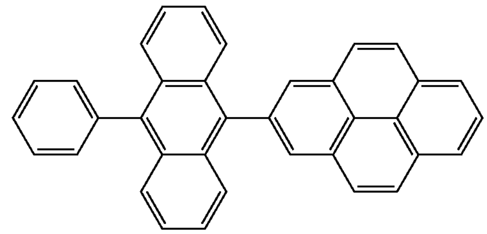
D12
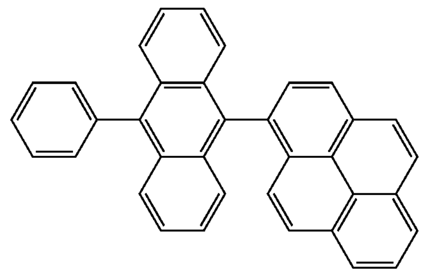
D13
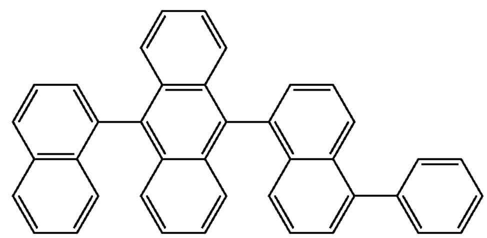
D14
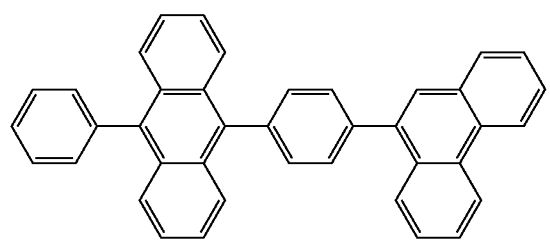
D15
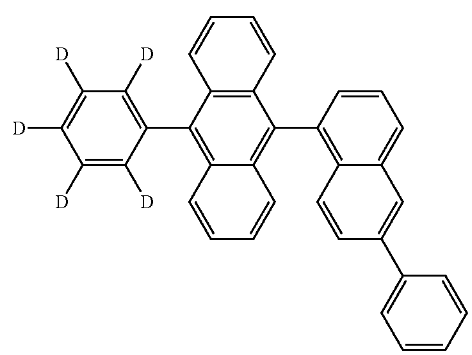

-continued
D16
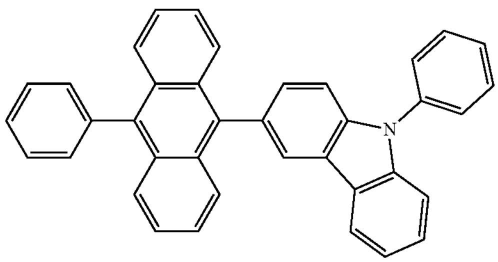
D17
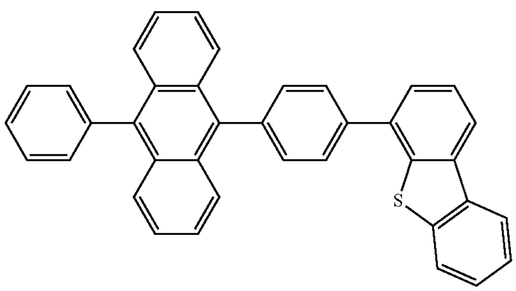
D18
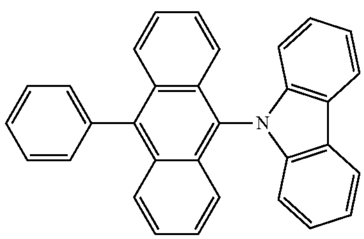
D19
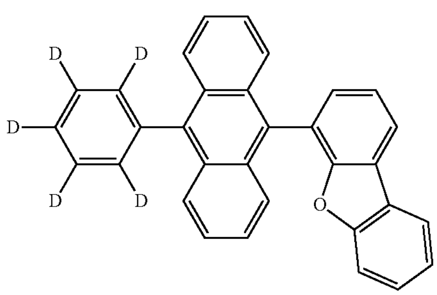
D20
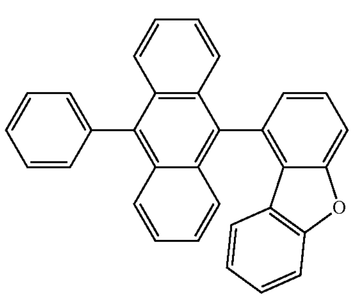
-continued
D21
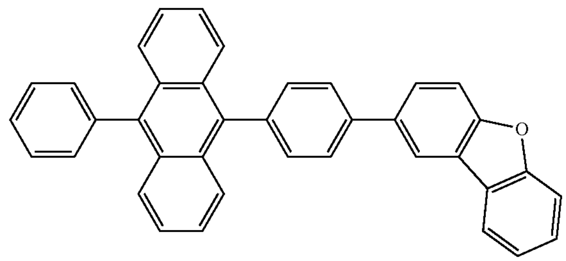
D22
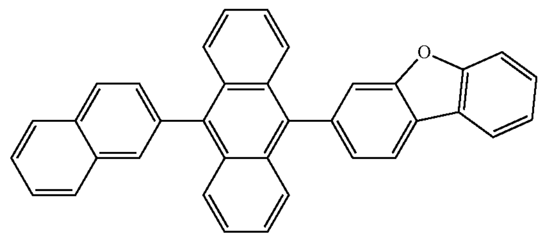
D23
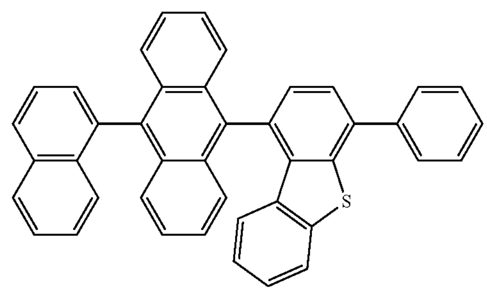
D24
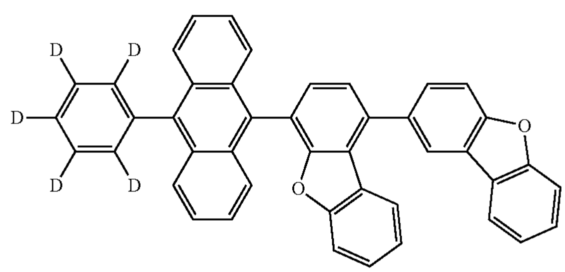
D25
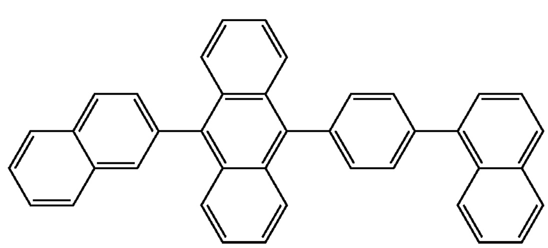

-continued
D26
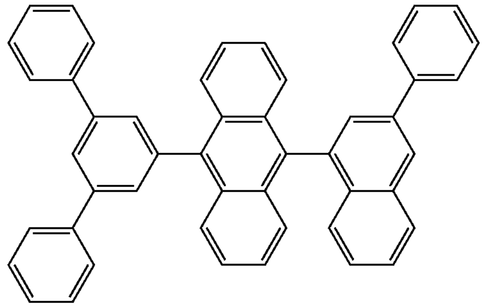
D27
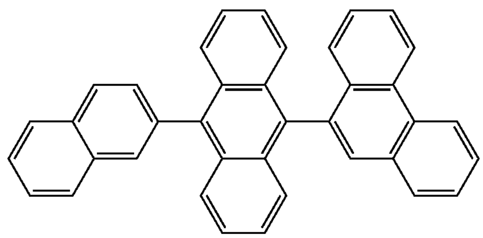
D28
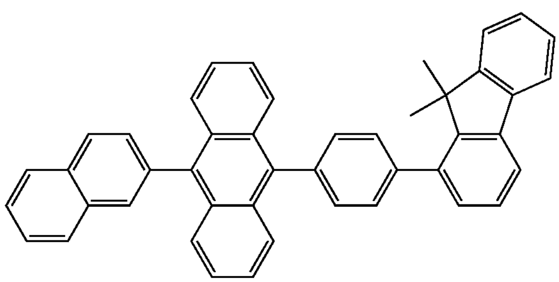
D29
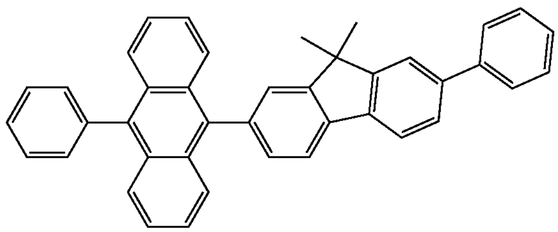
D30
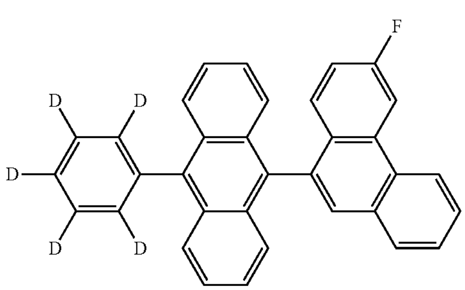
D31
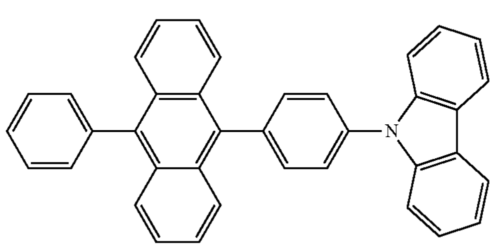
-continued
D32
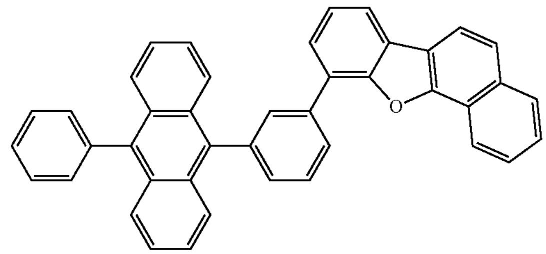
D33
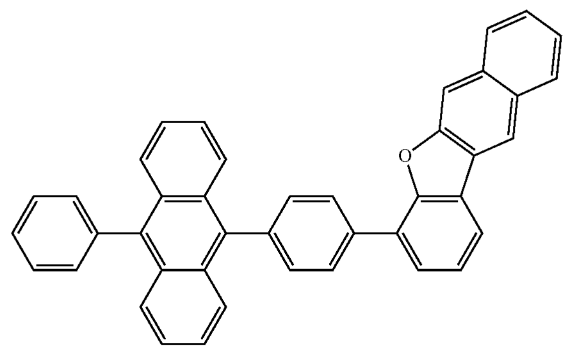
D34
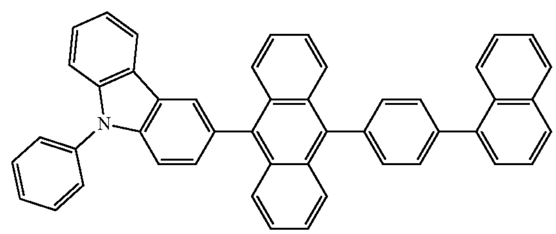
D35
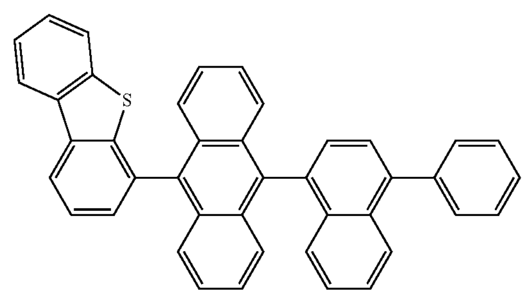
D36
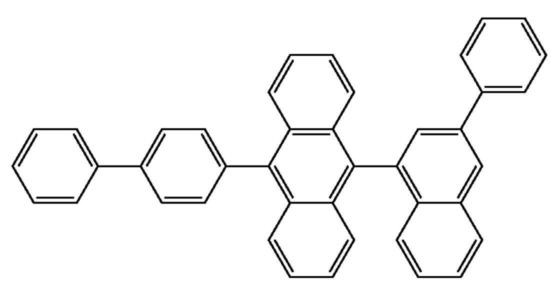

-continued
D37
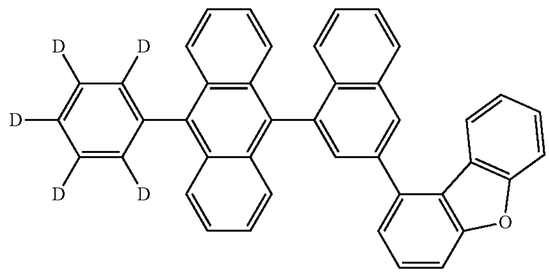
D38
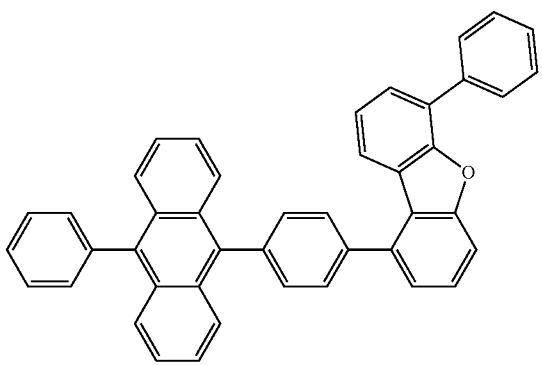
D39
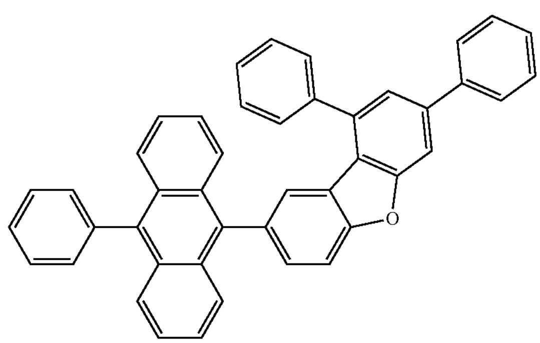
D40
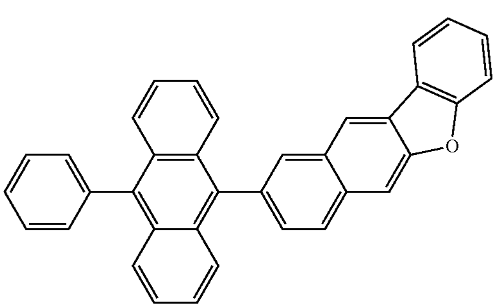
-continued
D41
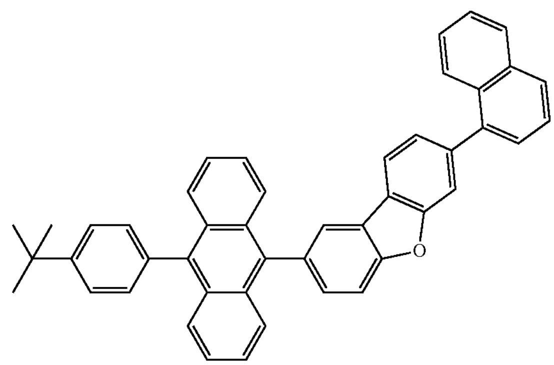
D42
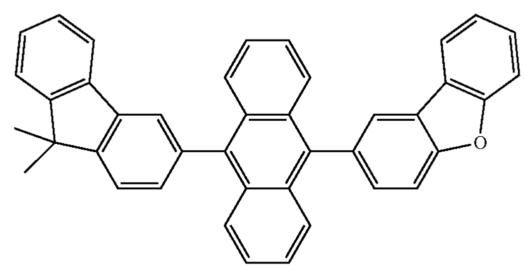
D43
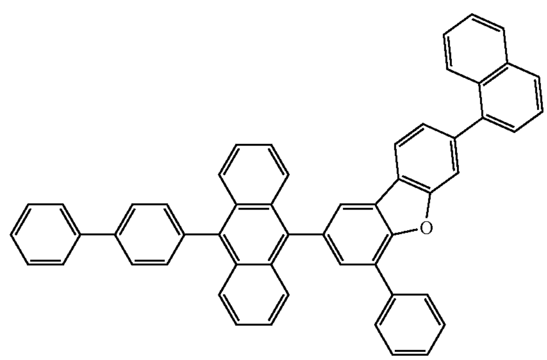
D44
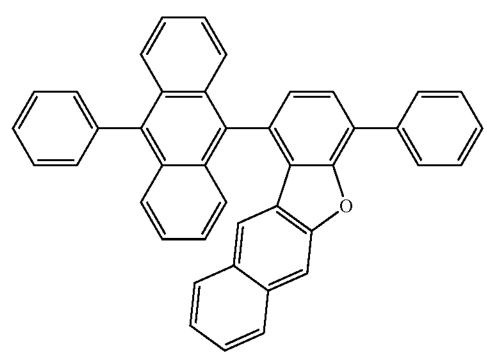

-continued

D45

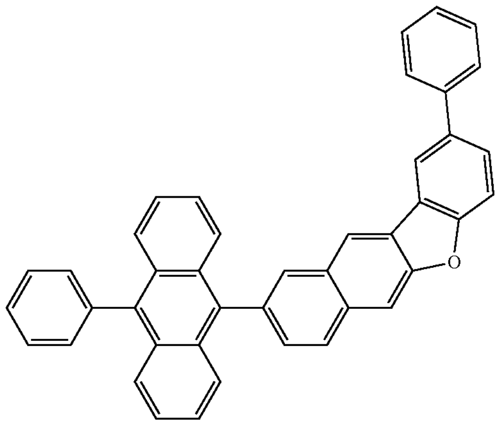

D46

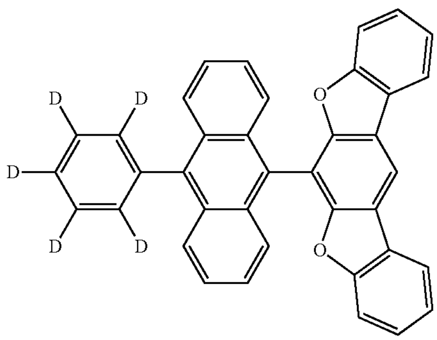

D47

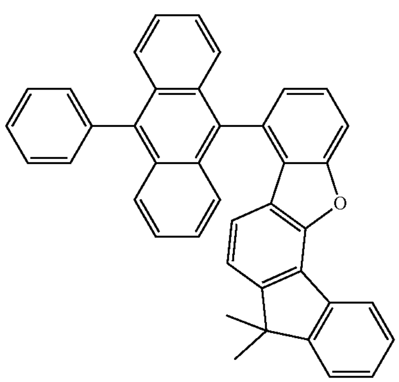

D48

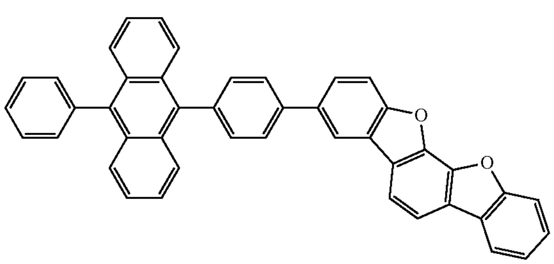

7. The organic electroluminescent device according to claim 1, further comprising a hole transport layer and an electron blocking layer interposed between the first electrode and the second electrode wherein each of the hole transport layer and the electron blocking layer comprises a compound represented by Formula E:

[Formula E]

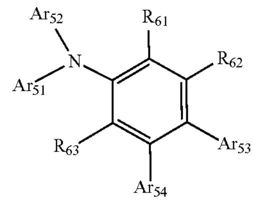

wherein $R_{61}$ to $R_{63}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

8. The organic electroluminescent device according to claim 7, wherein the compound of Formula E is selected from the group consisting of the compounds of Formulae E1 to E33:

E1

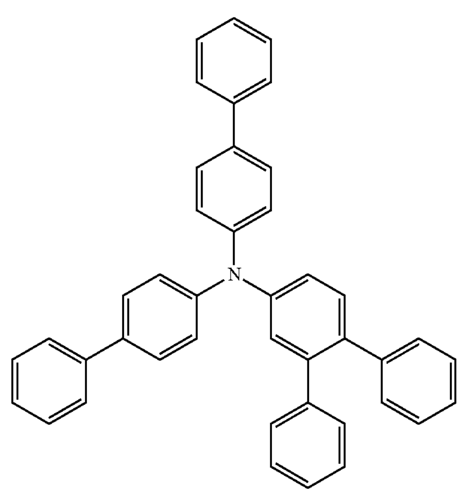

E2
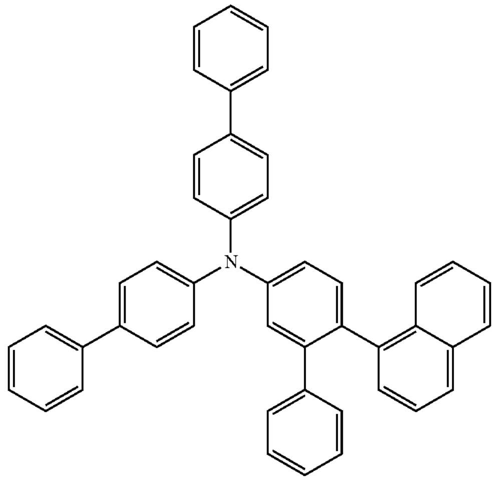
E3
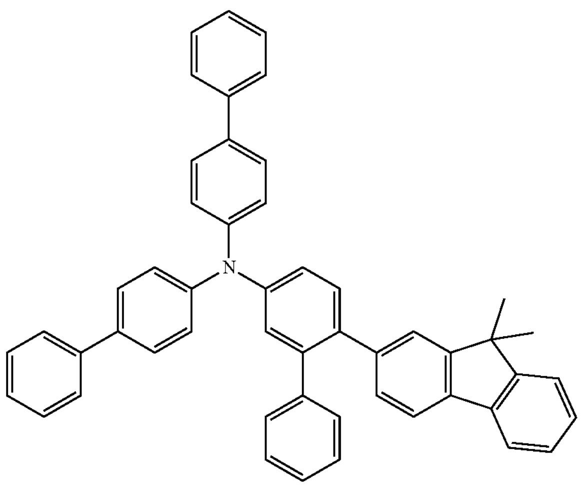
E4
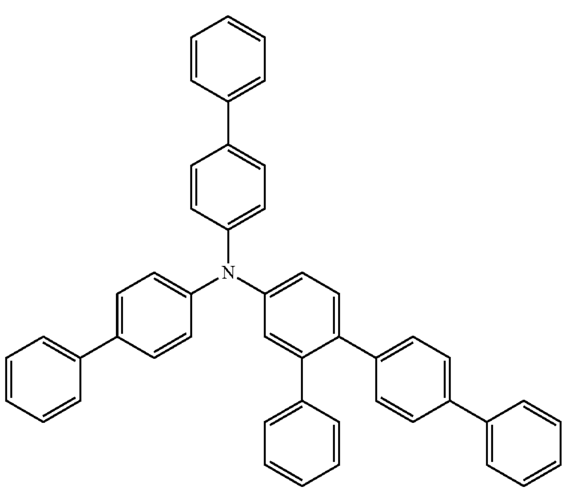
E5
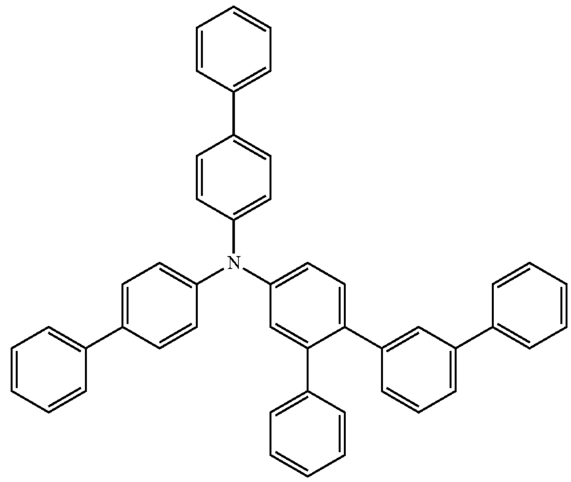
E6
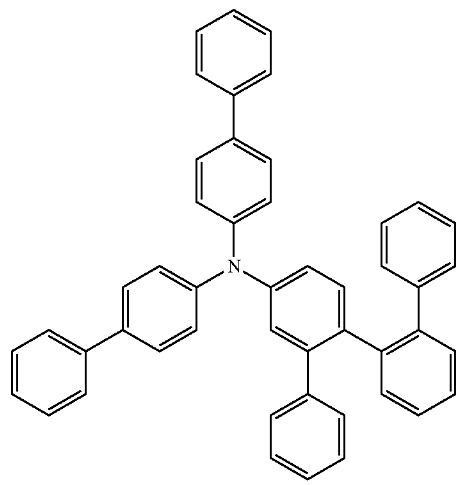
E7
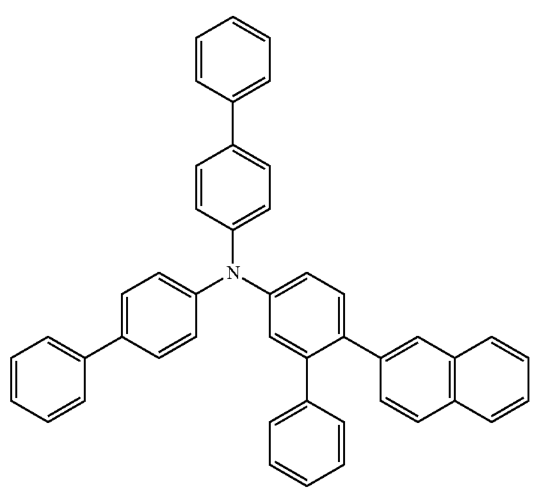

E8
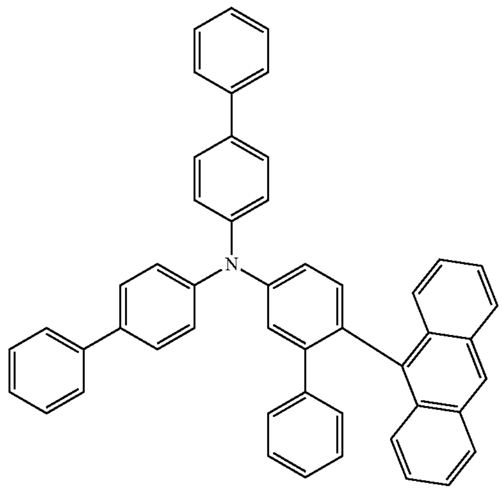
E9
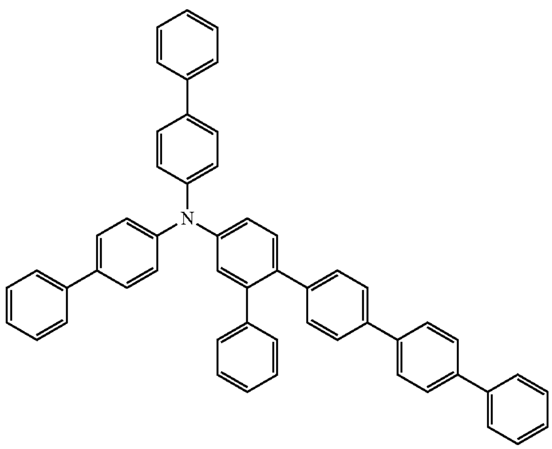
E10
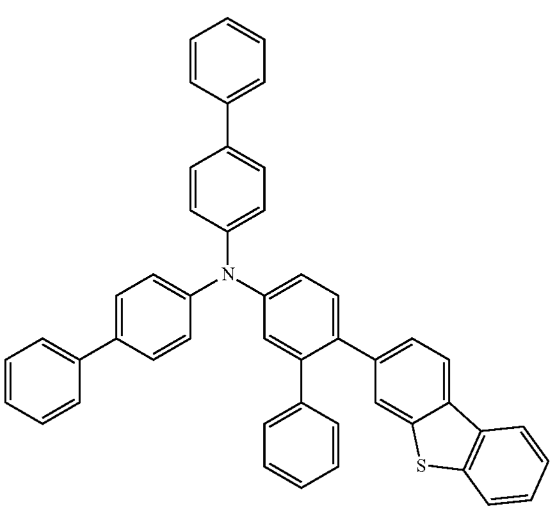
E11
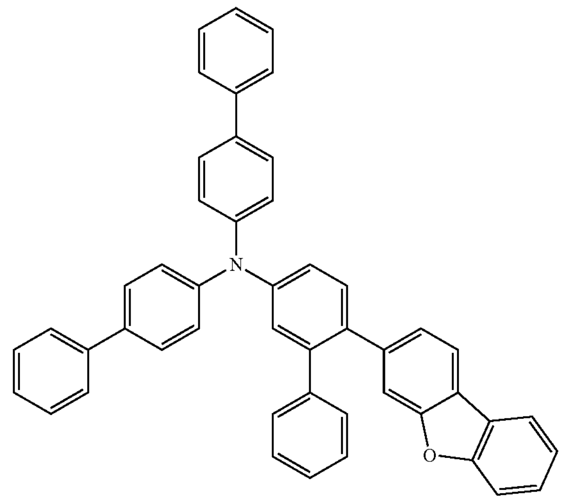
E12
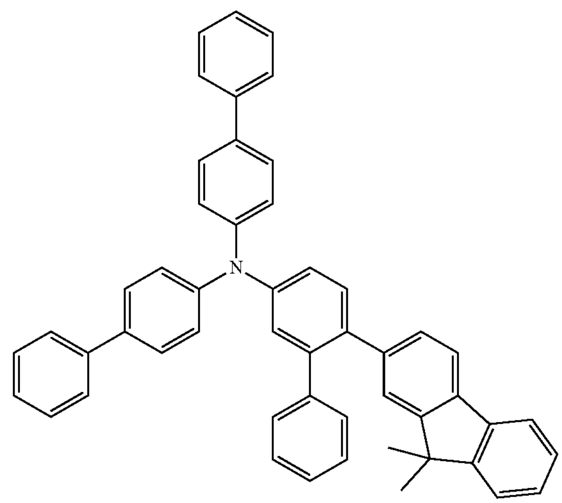
E13
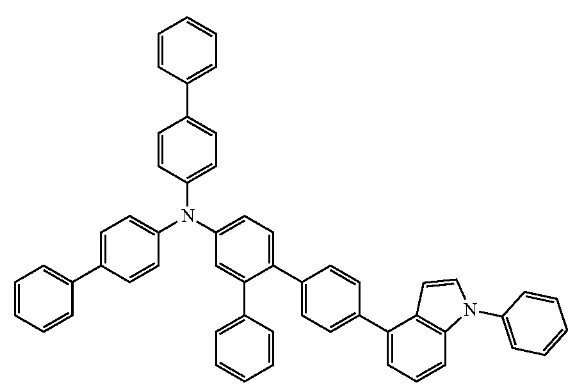

268
-continued
E14
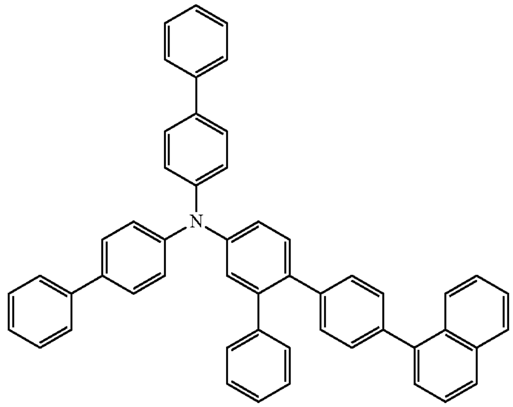
E15
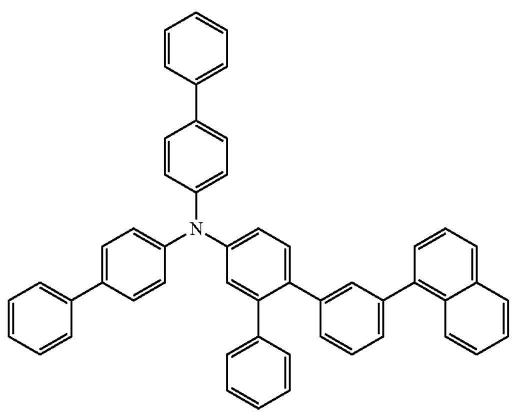
E16
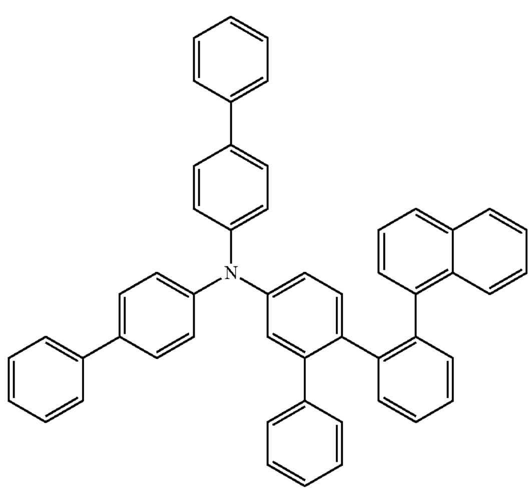
E17
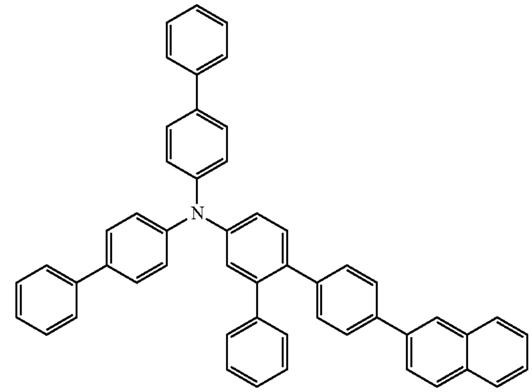
E18
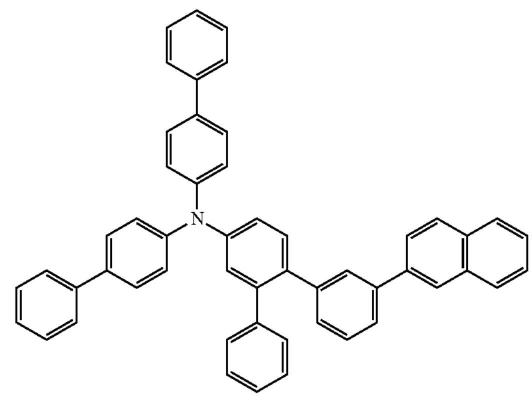
E19
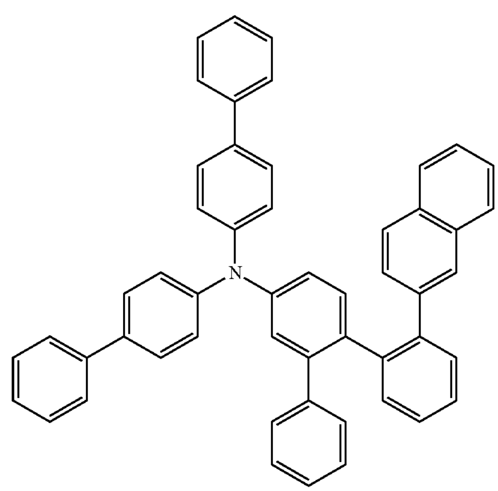

-continued
E20
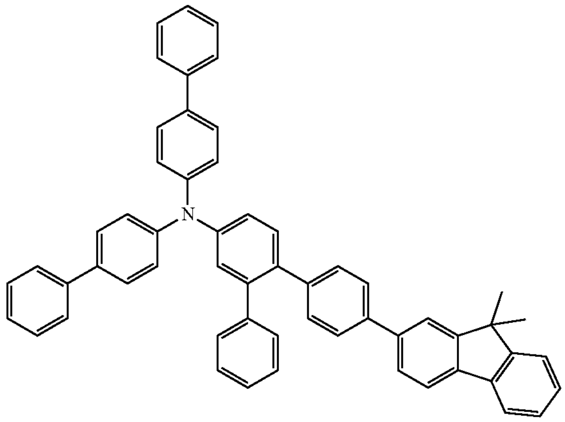
E21
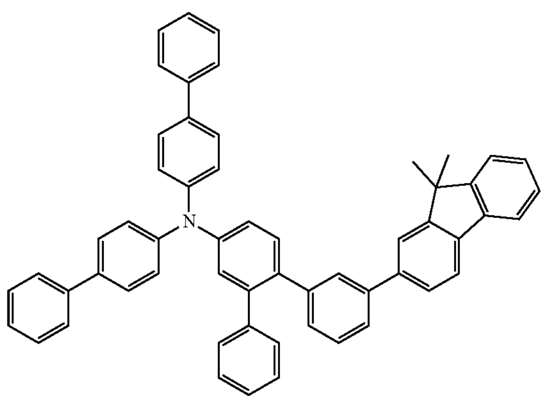
E22
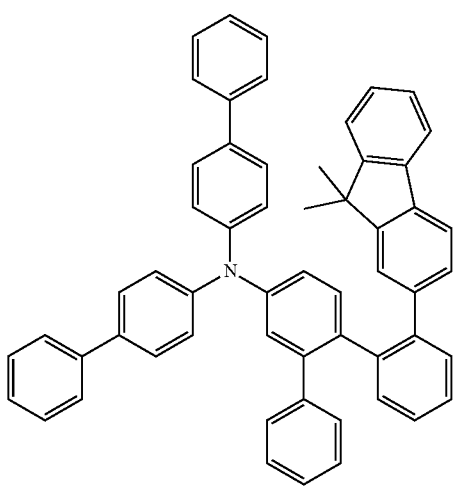
-continued
E23
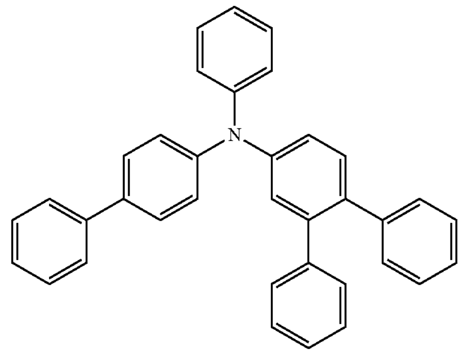
E24
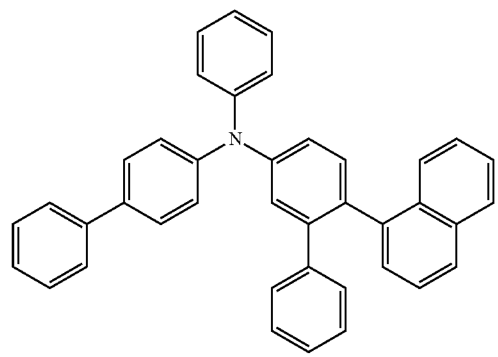
E25
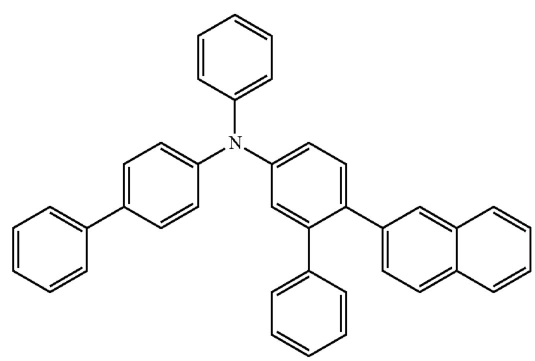
E26
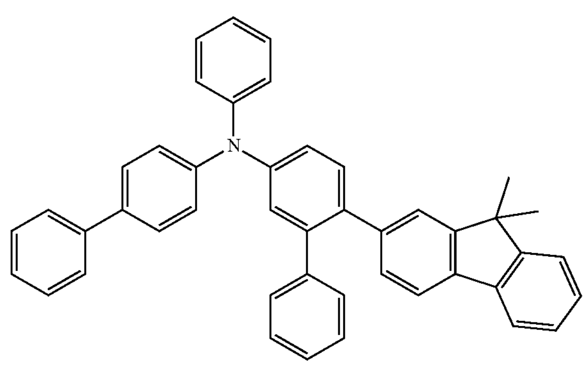

-continued
E27
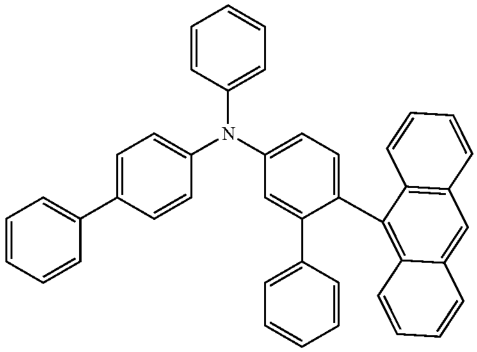
E28
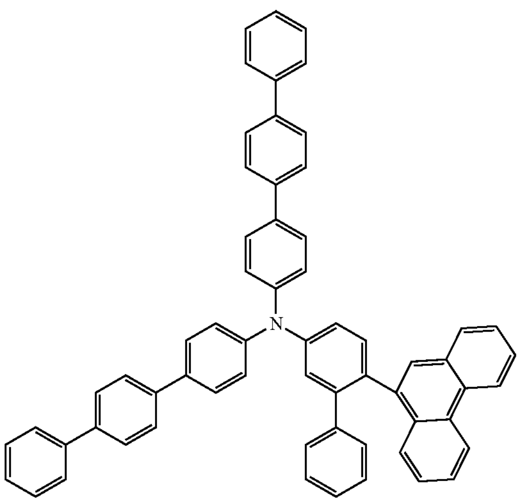
E29
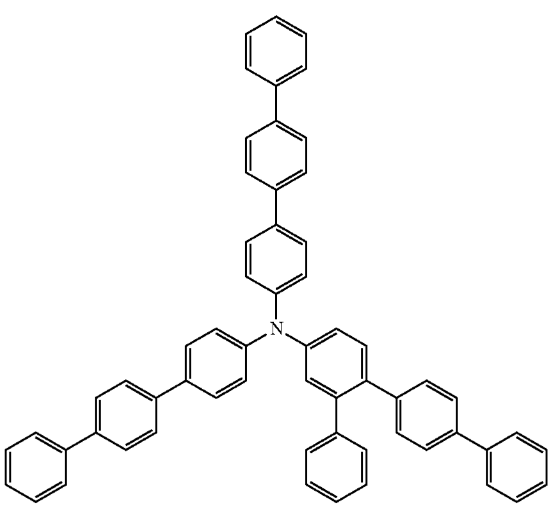
-continued
E30
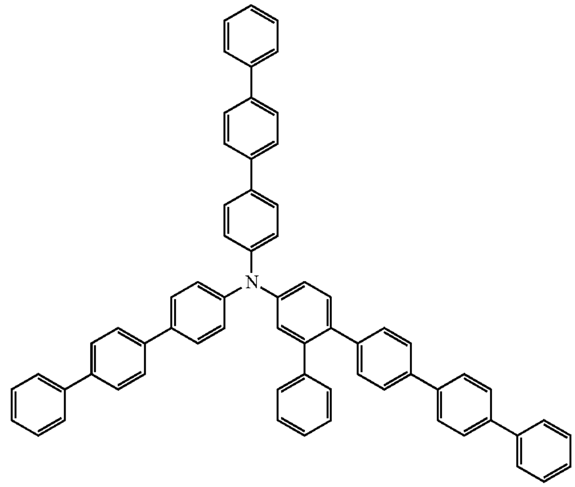
E31
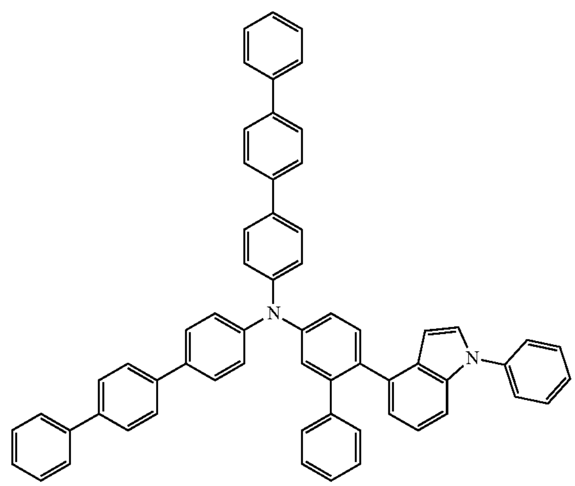
E32
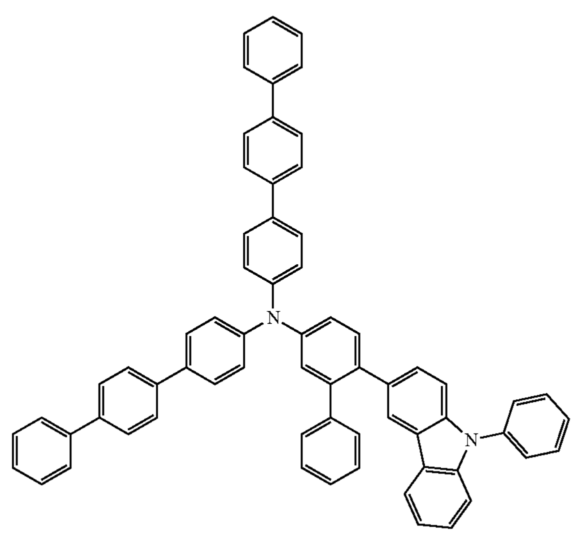

-continued
E33
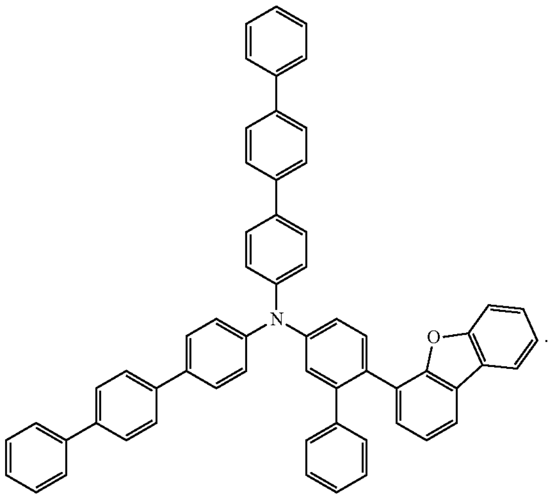
9. The organic electroluminescent device according to claim 1, wherein the compound of Formula B is selected from the group consisting of the following the compounds of Formula B101 to B145:
B101
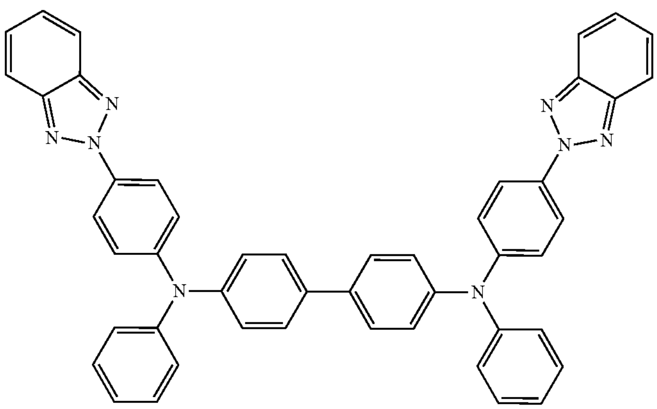
B102
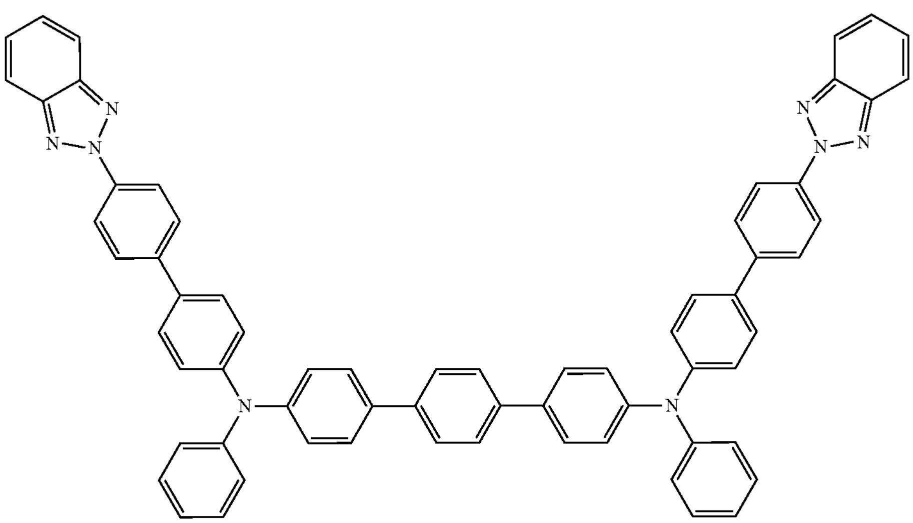

-continued
B103
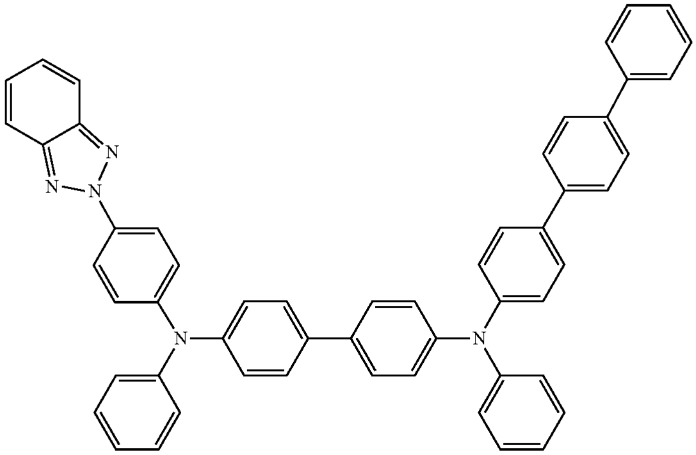
B104
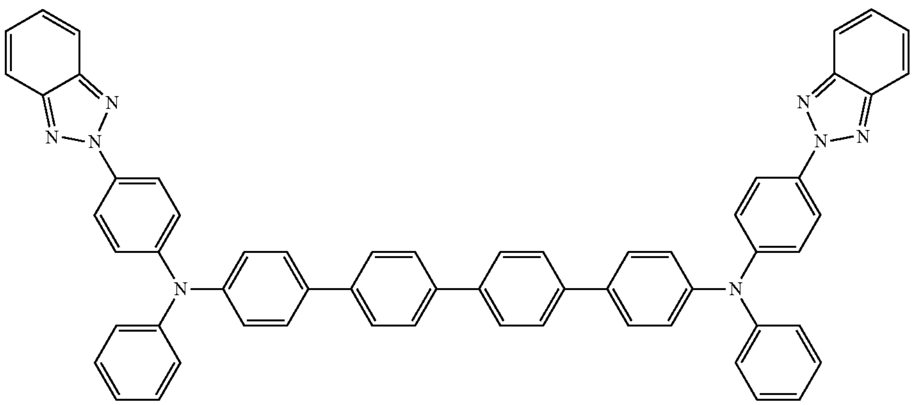
B105
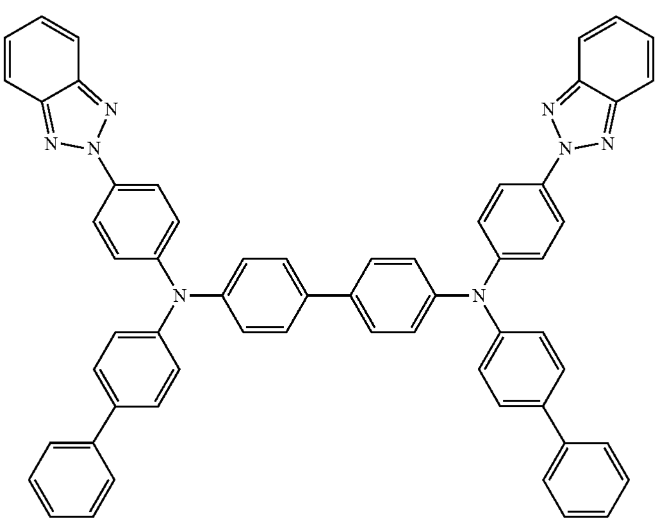

-continued
B106
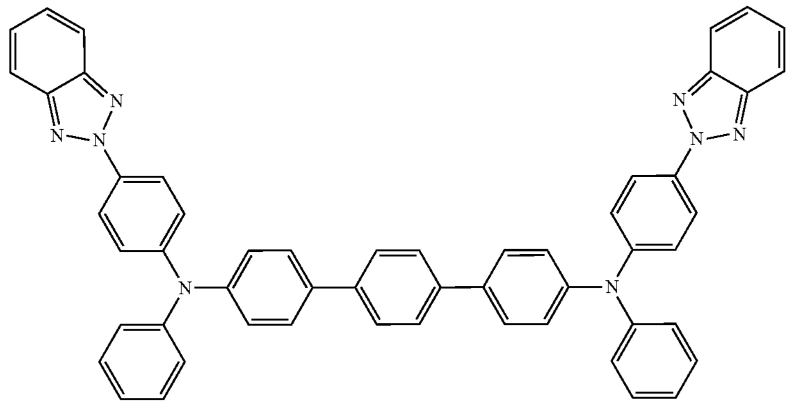
B107
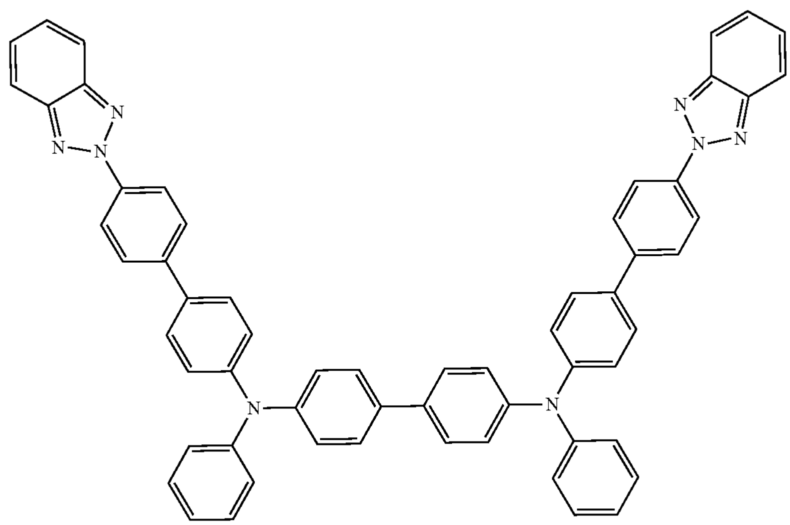
B108
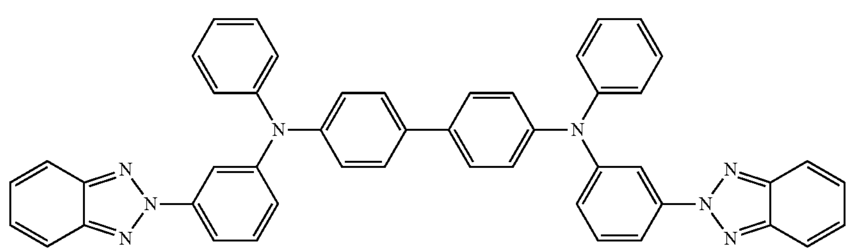
B109
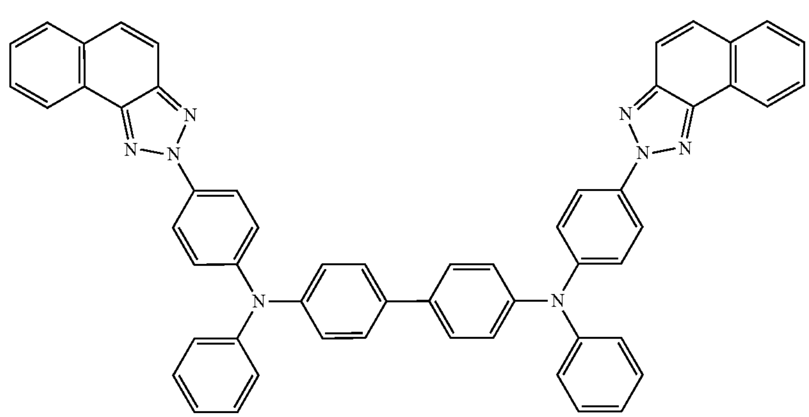

-continued
B110
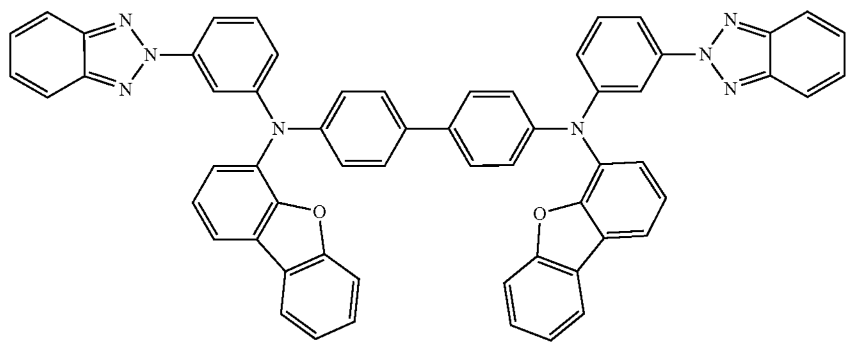
B111
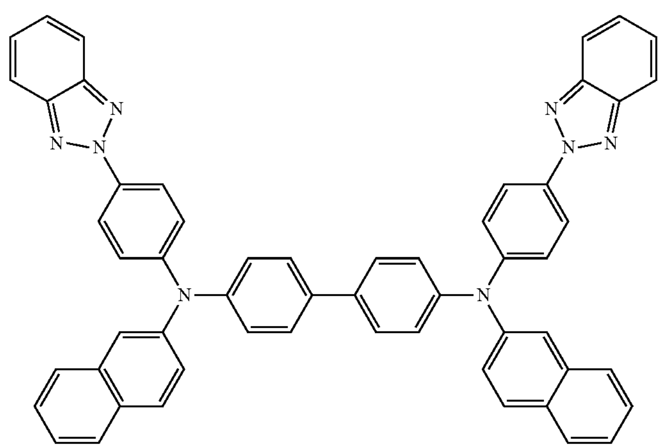
B112
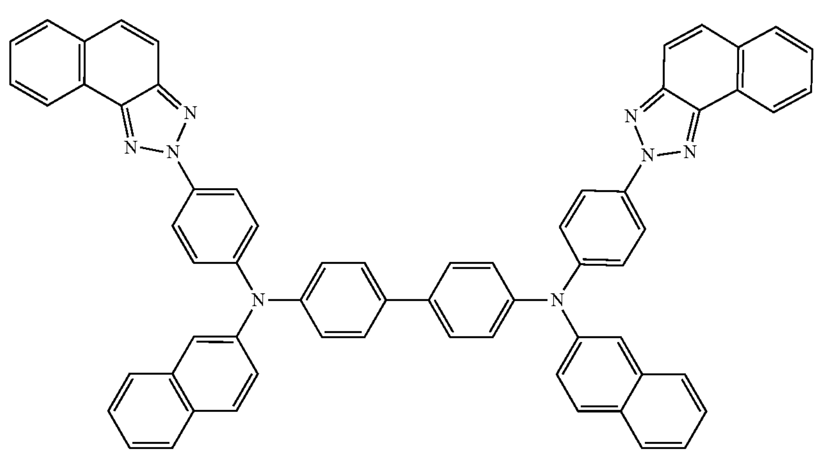

-continued
B113
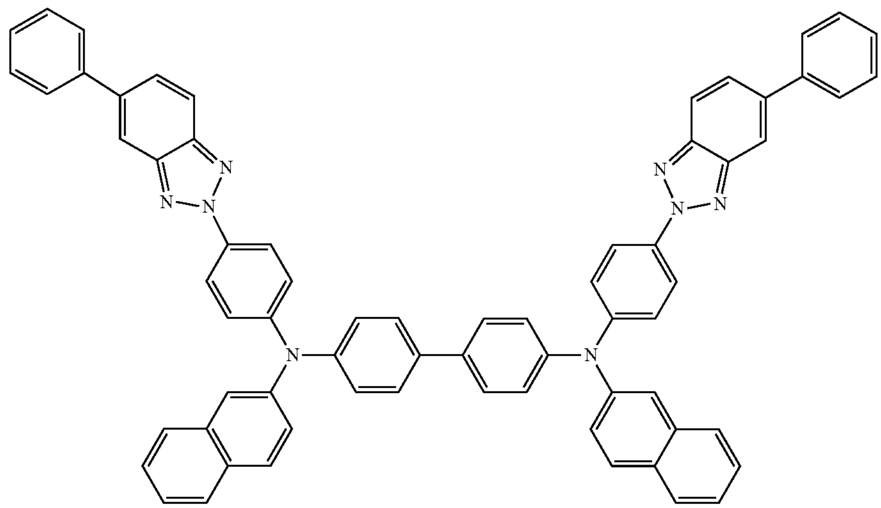
B114
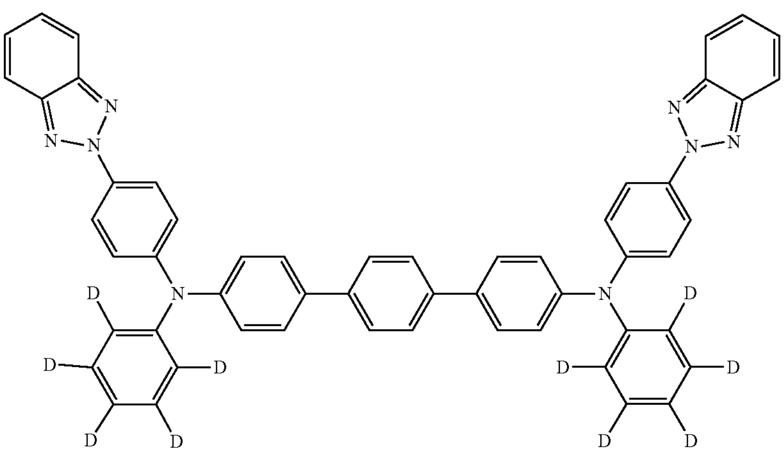
B115
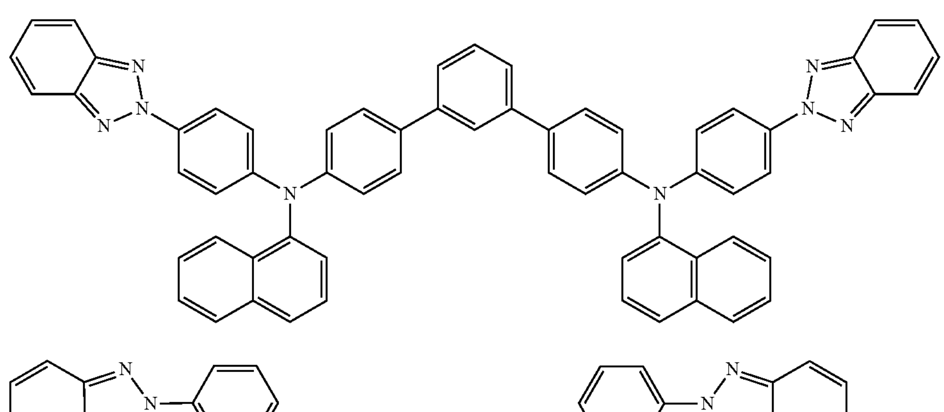
B116
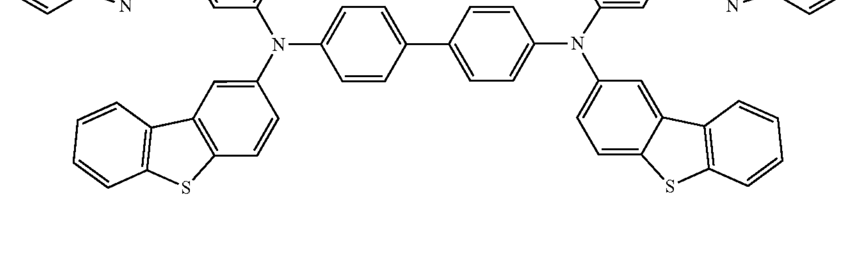

-continued
B117
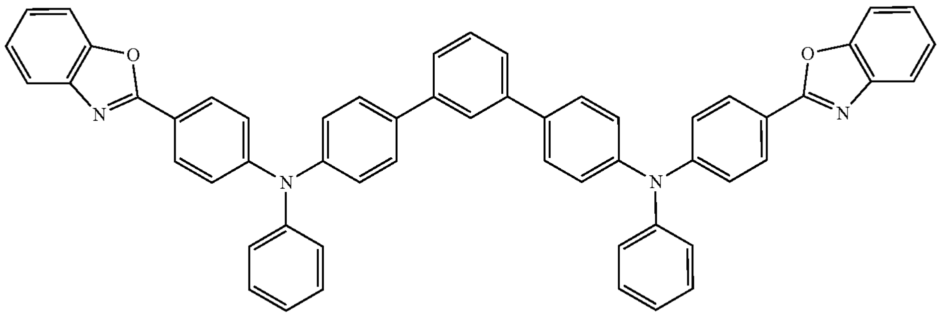
B118
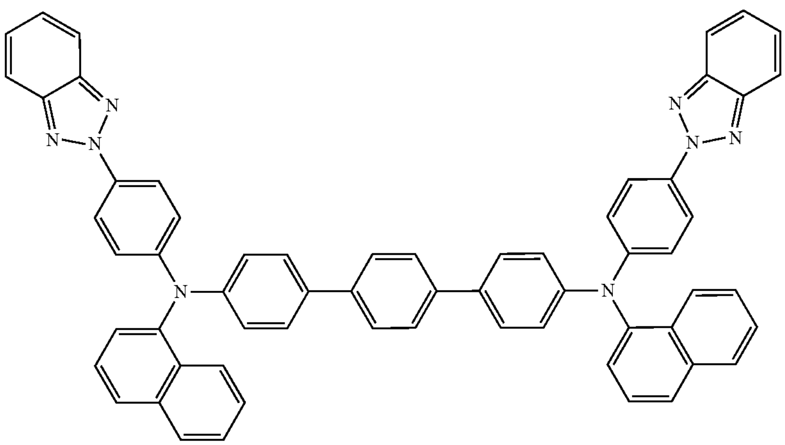
B119
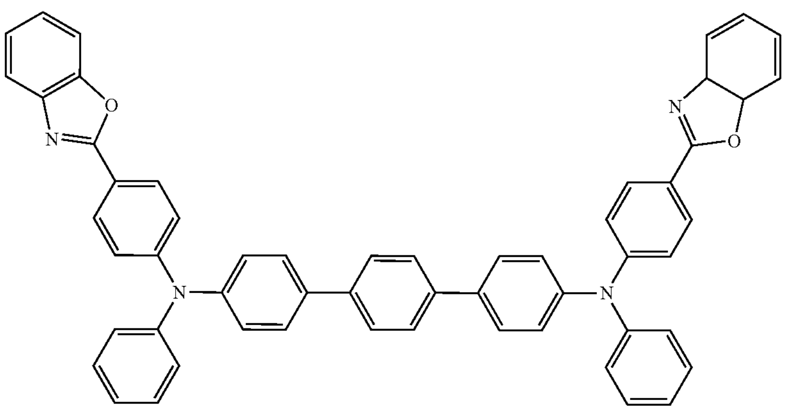
B120
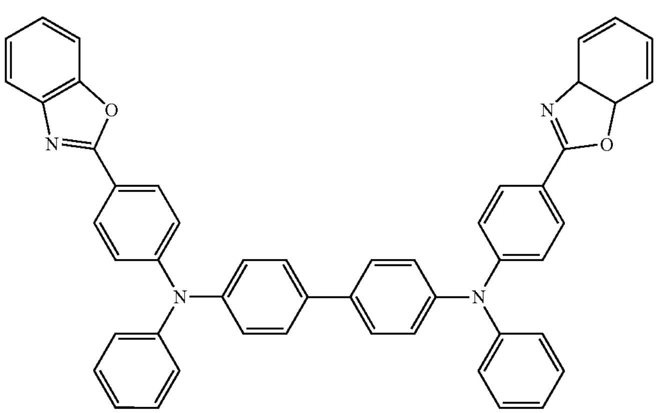

-continued
B121
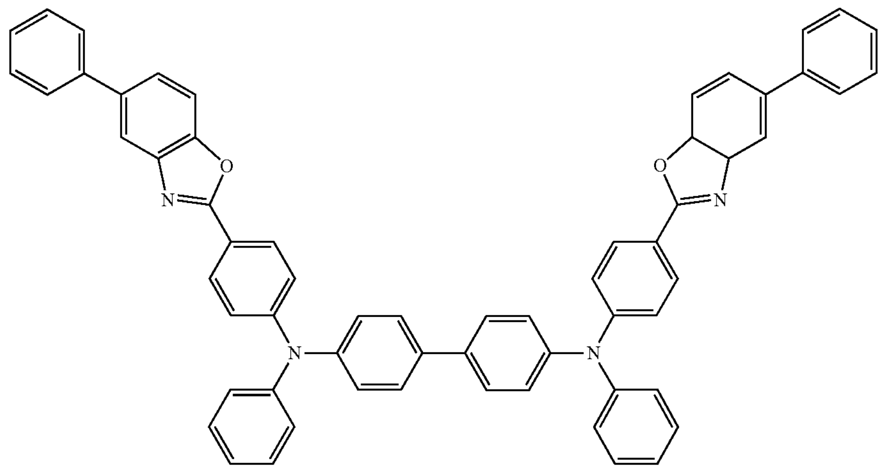
B122
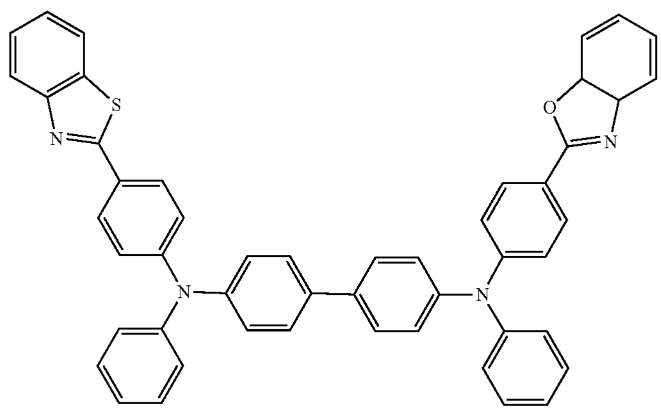
B123
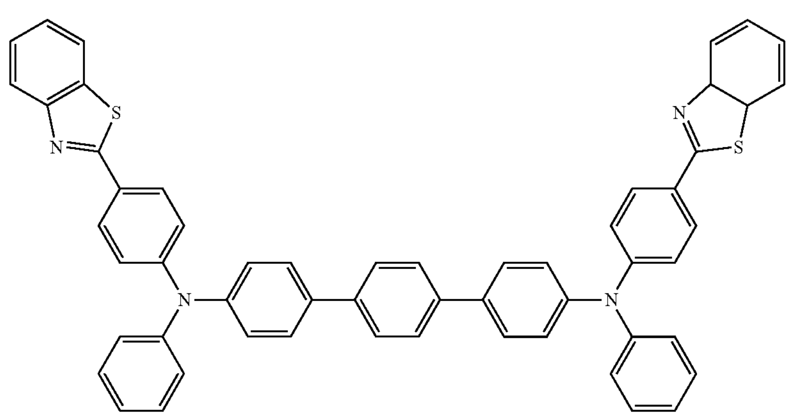

-continued
B124
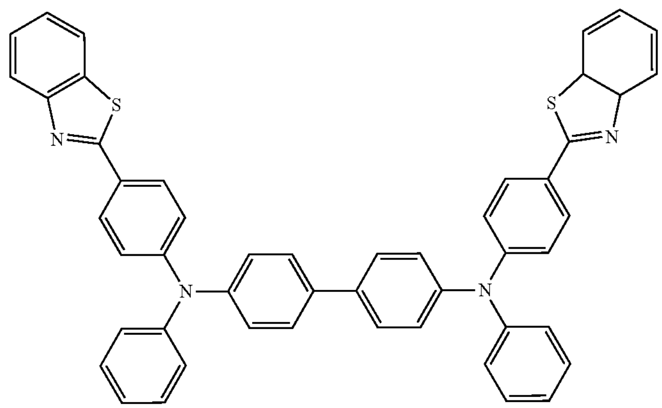
B125
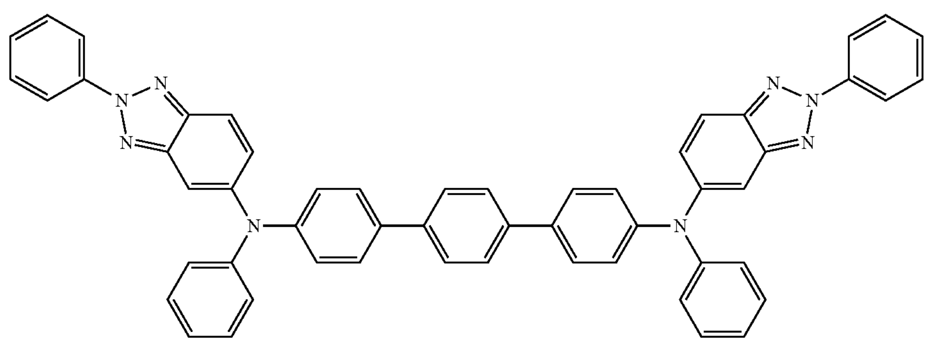
B126
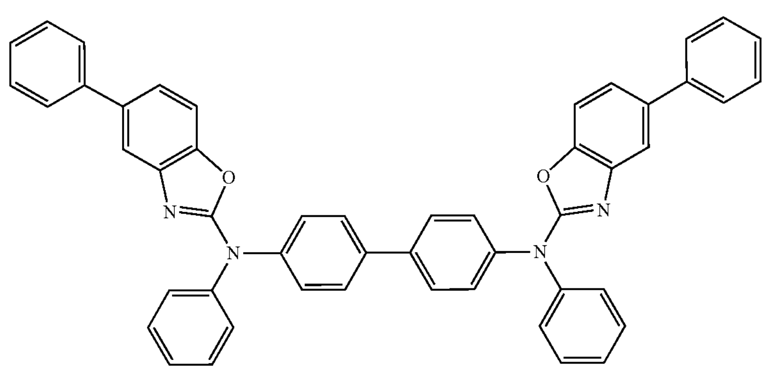
B127
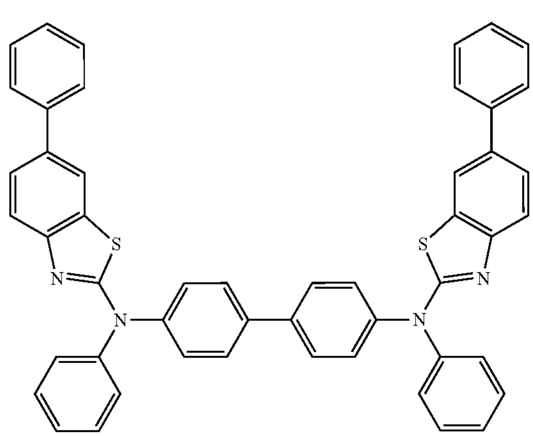

-continued
B128
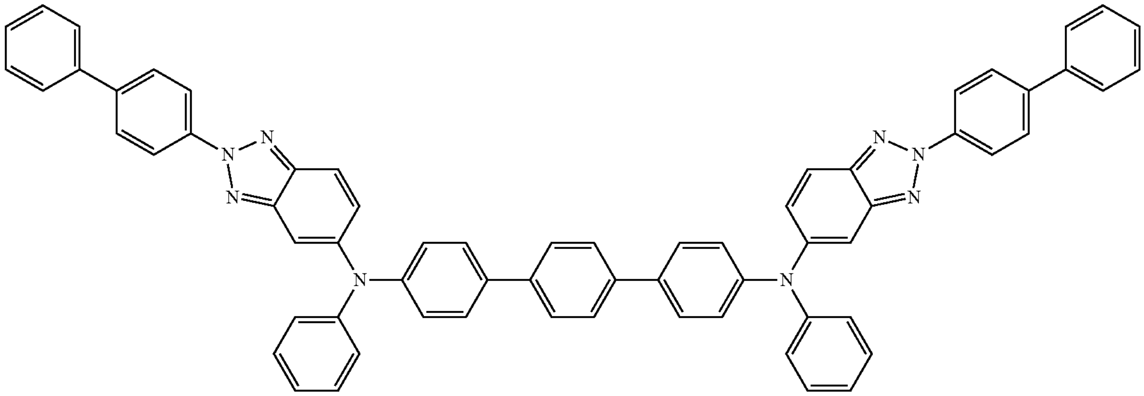
B129
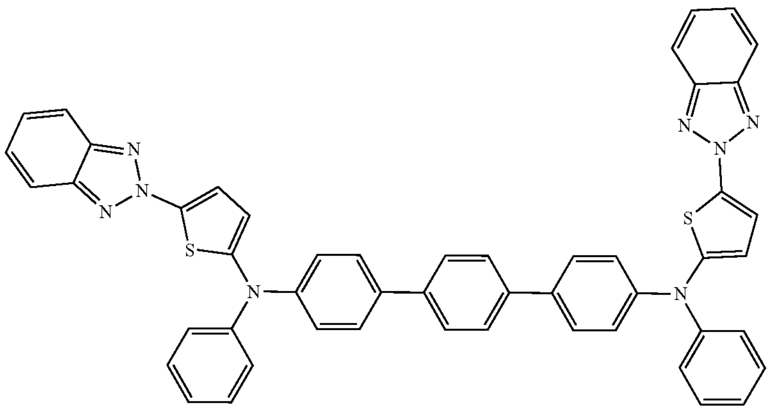
B130
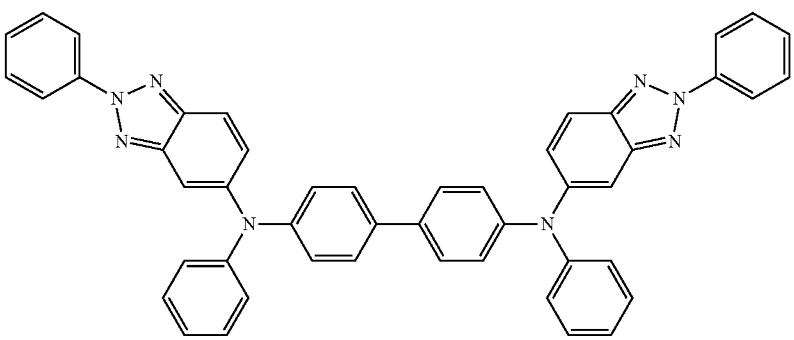
B131
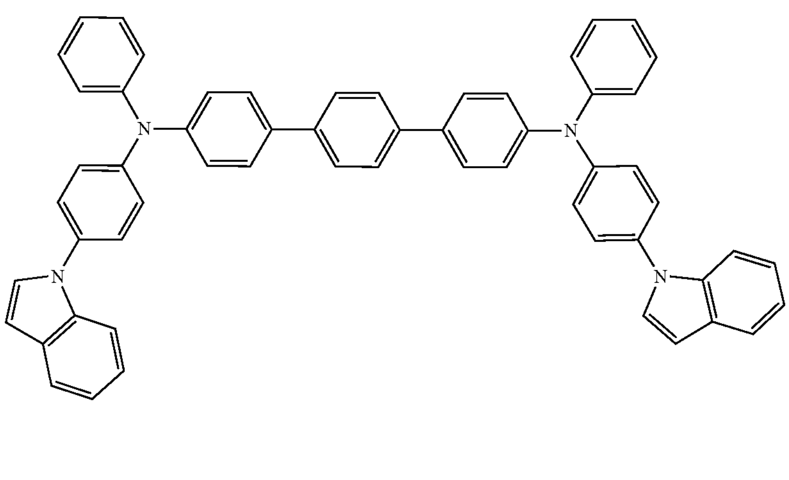

-continued
B132
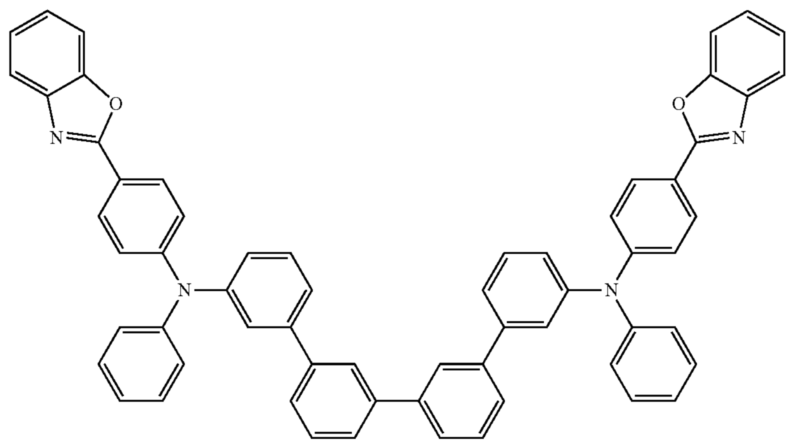
B133
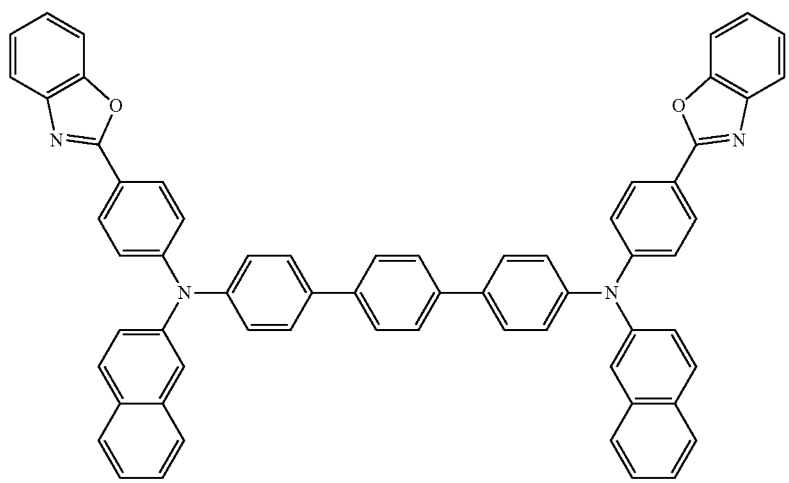
B134
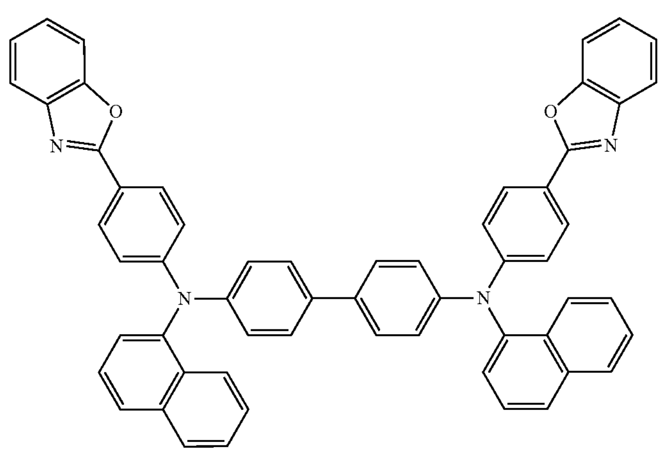

-continued
B135
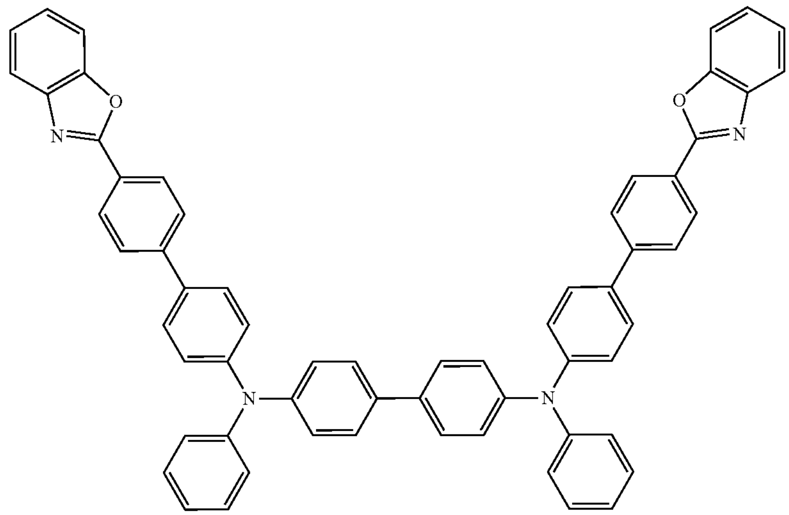
B136
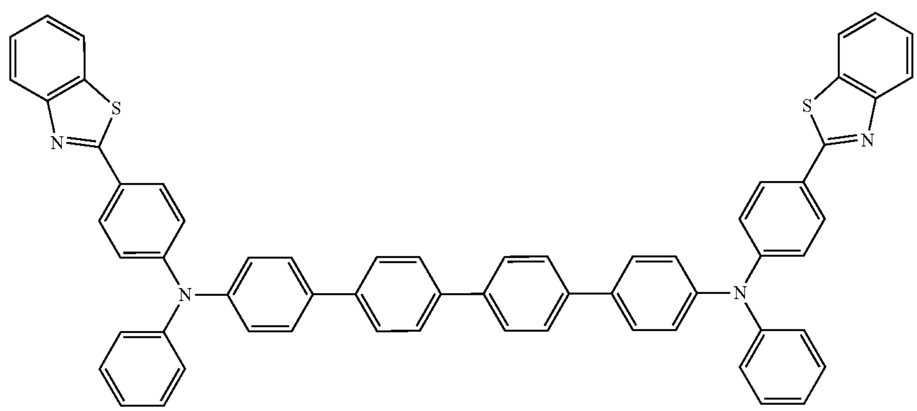
B137
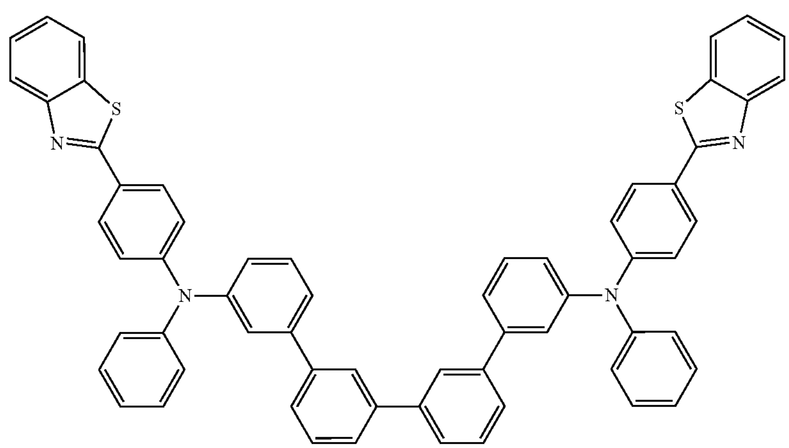

-continued
B138
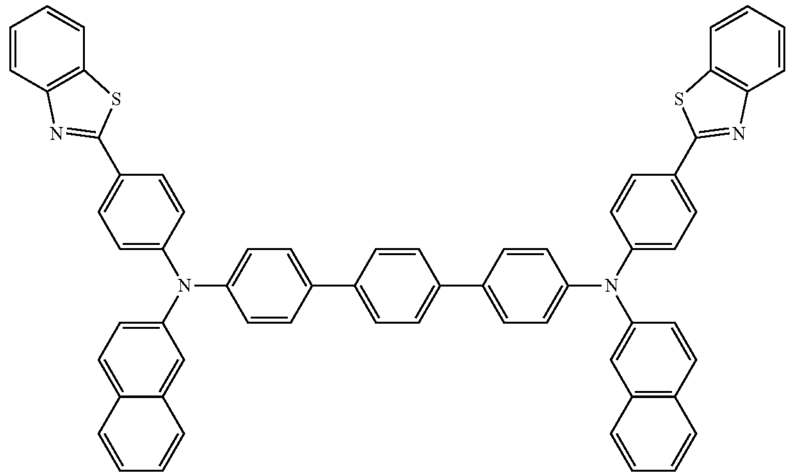
B139
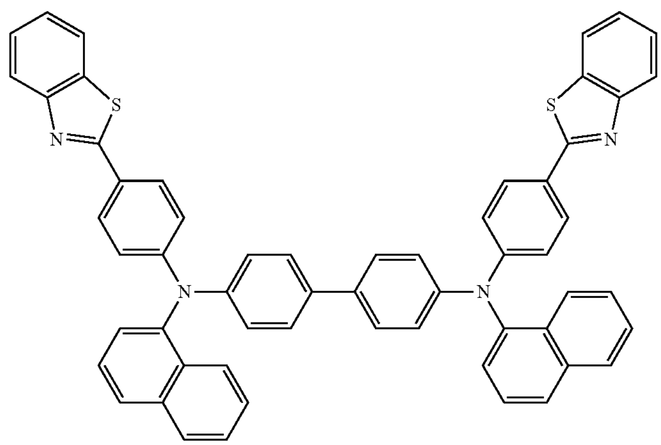
B140
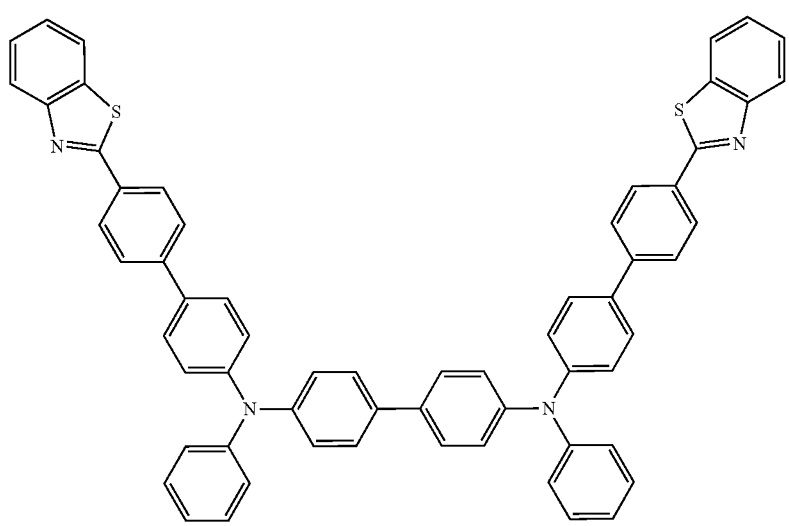

-continued
B141
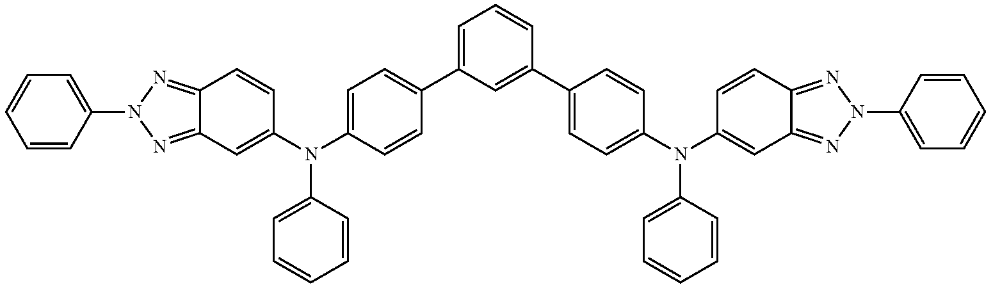
B142
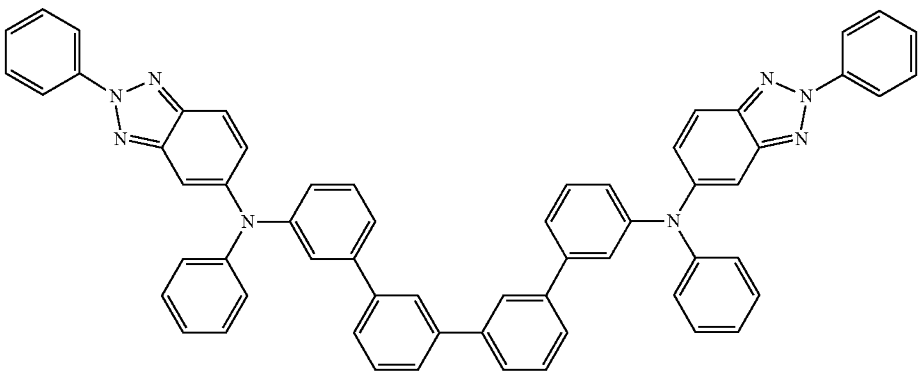
B143
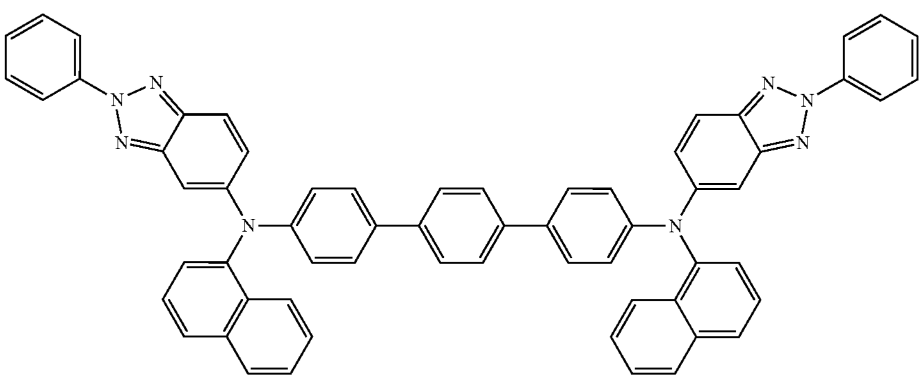
B144
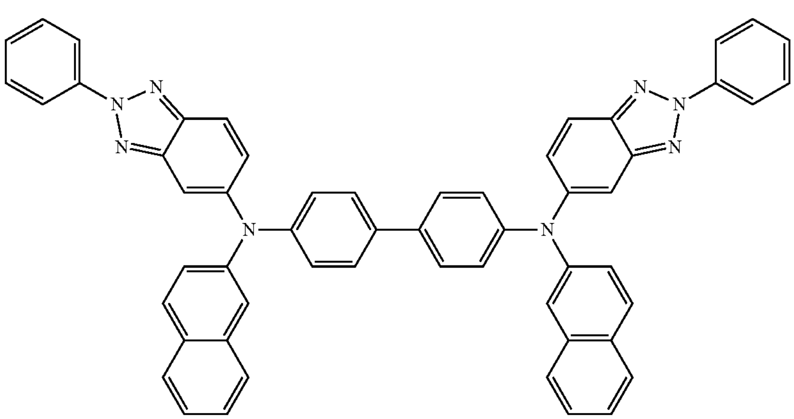

-continued

B145

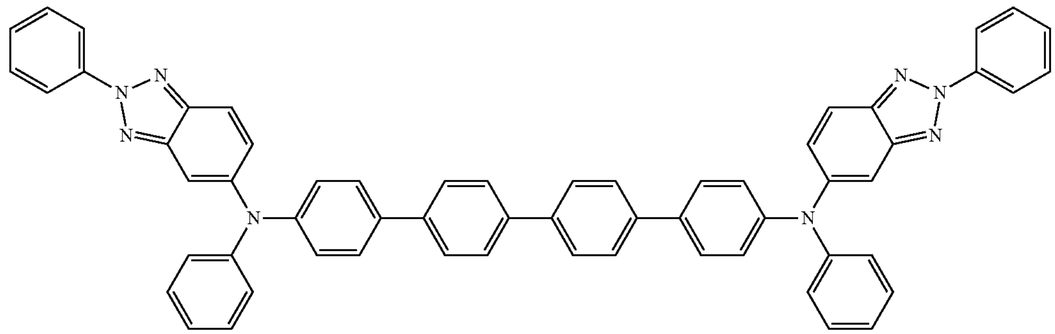

10. An organic electroluminescent device comprising a first electrode, a second electrode opposite to the first electrode, a light emitting layer interposed between the first and second electrodes, and a capping layer formed on one of the surfaces of the first and second electrodes opposite to the light emitting layer, wherein the light emitting layer comprises any one of compounds represented by Formula A-4 or Formula A-6 and the capping layer comprises a compound represented by Formula B:

[Formula A-4]

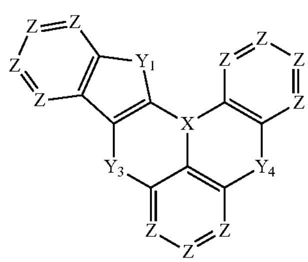

[Formula A-6]

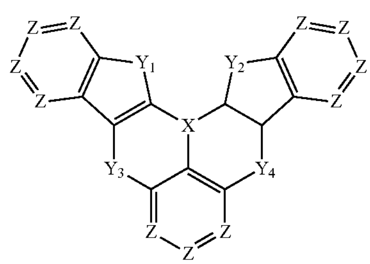

wherein each Z is independently CR or N, $Y_1$ and $Y_2$ are identical to or different from each other and are each independently selected from the group consisting of $CR_2R_3$, O, S, Se, and $SiR_4R_5$, $Y_3$ and $Y_4$ are identical to or different from each other and are each independently selected from the group consisting of $CR_2R_3$, and $SiR_4R_5$, and X is selected from the group consisting of B, P, P═S, and P═O, and R, $R_2$ to $R_5$ are identical to or different from each other and are independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso R are optionally bonded to each other or are optionally linked to other adjacent R to form alicyclic or aromatic monocyclic or polycyclic rings whose carbon atoms are optionally substituted with one or more heteroatoms selected from the group consisting of N, S, and O atoms, and

[Formula B]

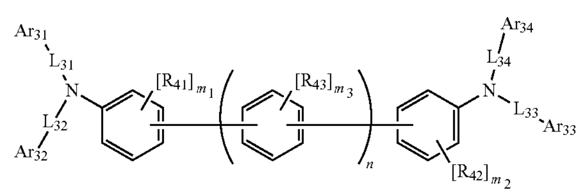

wherein $R_{41}$ to $R_{43}$ are identical to or different from each other and are each independently selected from the group consisting of hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from the group consisting of substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from the group consisting of substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_5$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

11. The organic electroluminescent device according to claim 10, wherein at least one of $Ar_{31}$ to $Ar_{34}$ in Formula B is represented by Formula C:

[Formula C]

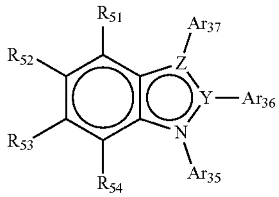

wherein $R_{51}$ to $R_{54}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from the group consisting of substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, or $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula B.

12. The organic electroluminescent device according to claim 10, wherein the compound of Formula B is selected from the group consisting of the following the compounds of Formula B1 to B79:

B1

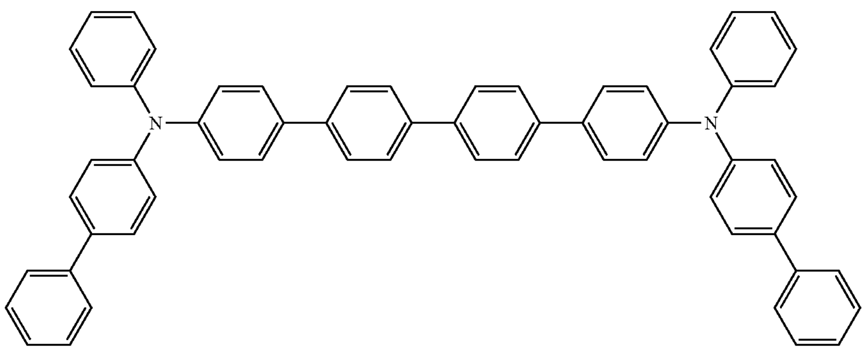

B2

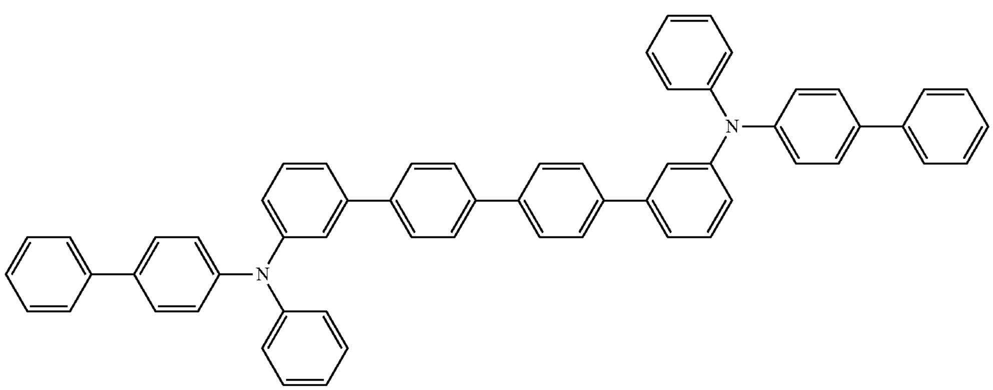

-continued
B3
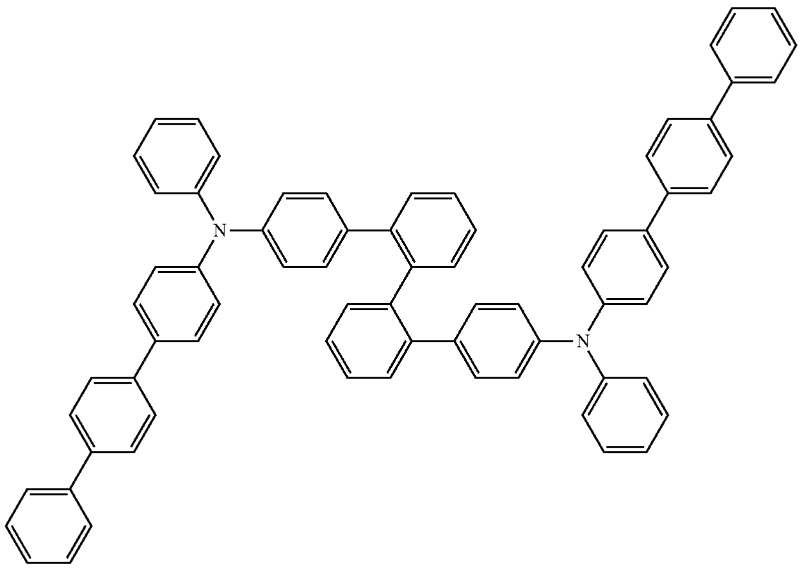
B4
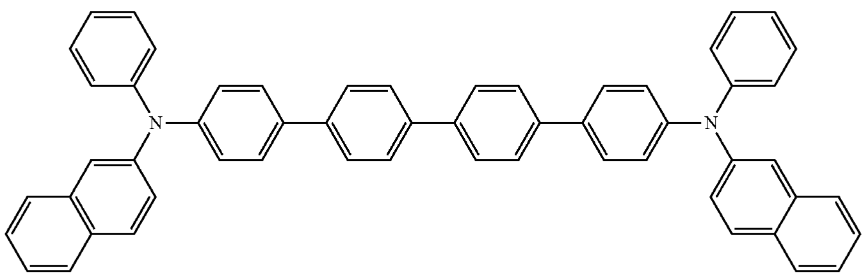
B5
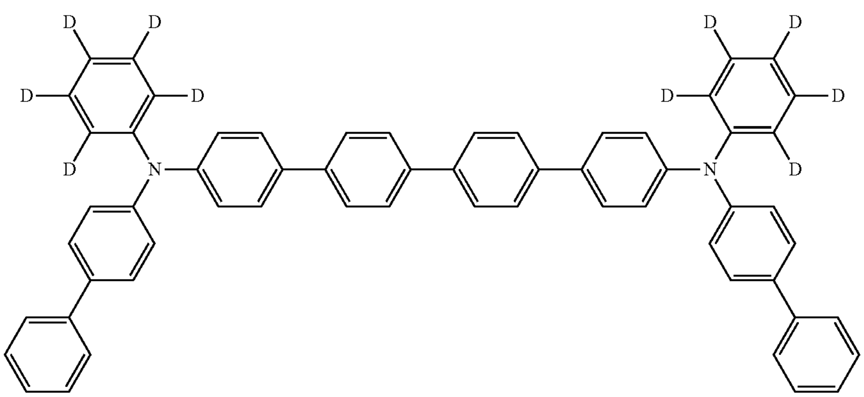
B6
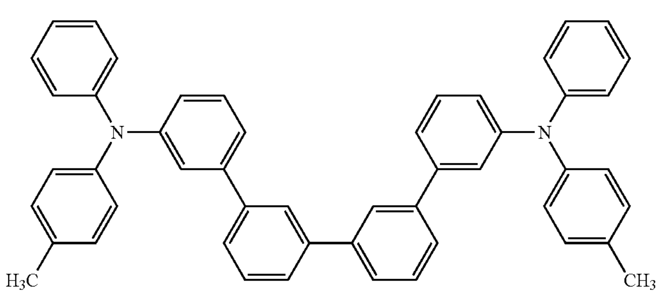

-continued
B7
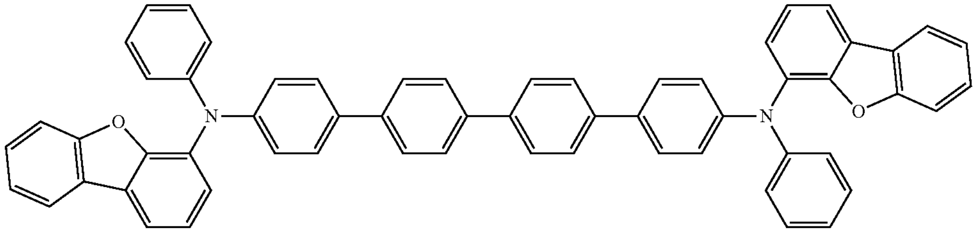
B8
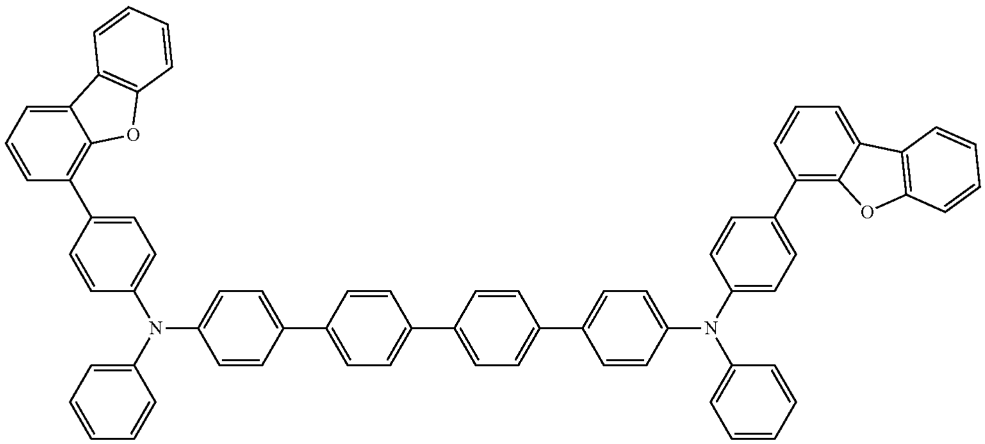
B9
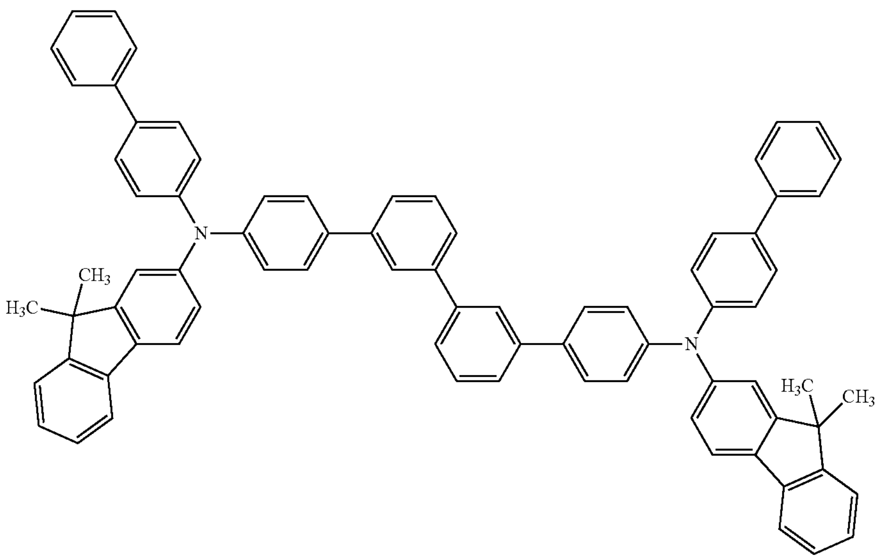
B10
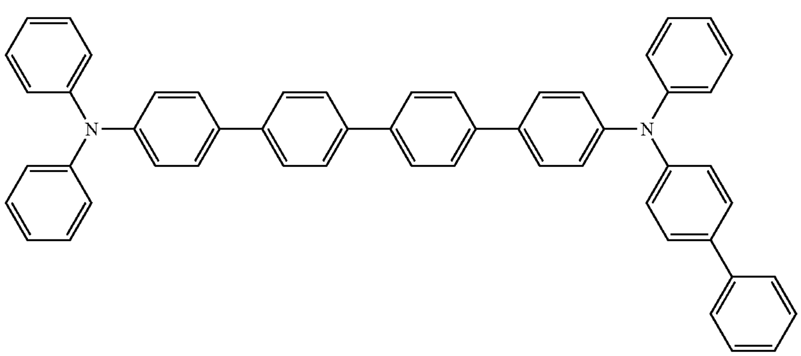

-continued
B11
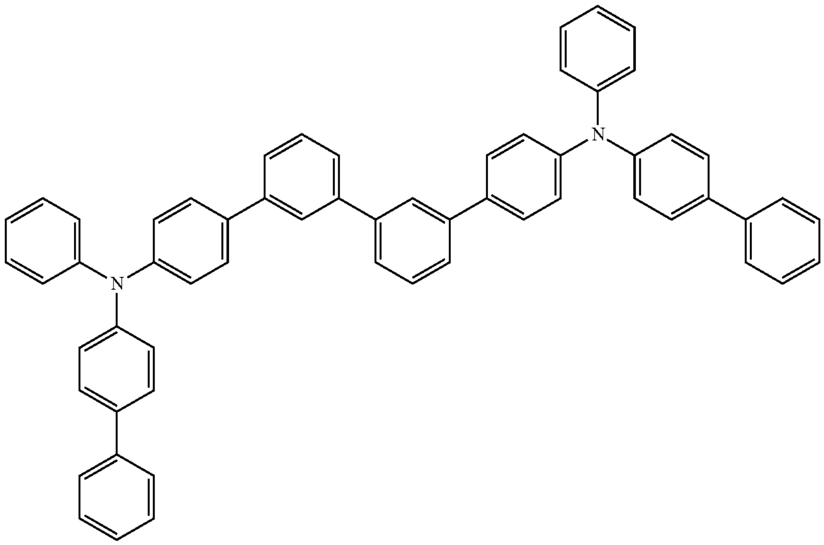
B12
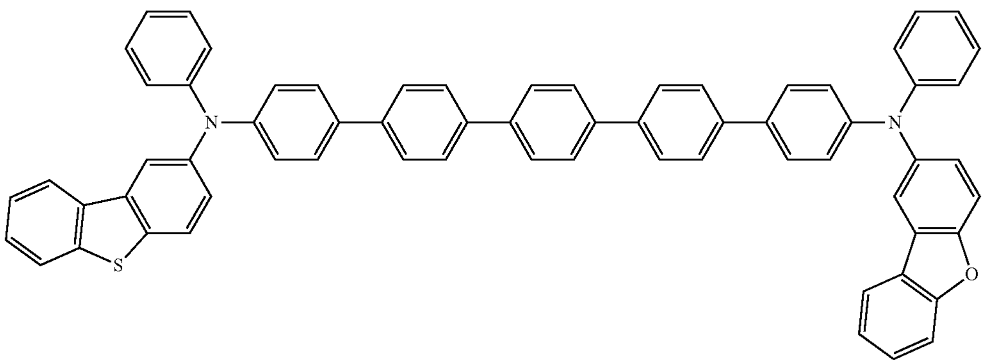
B13
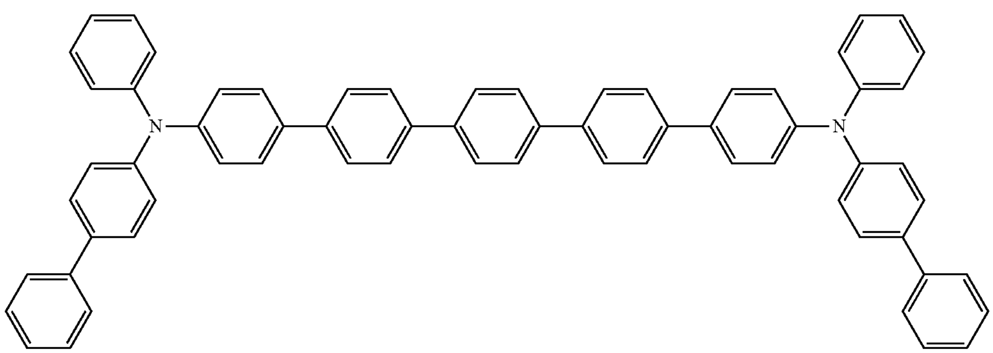
B14
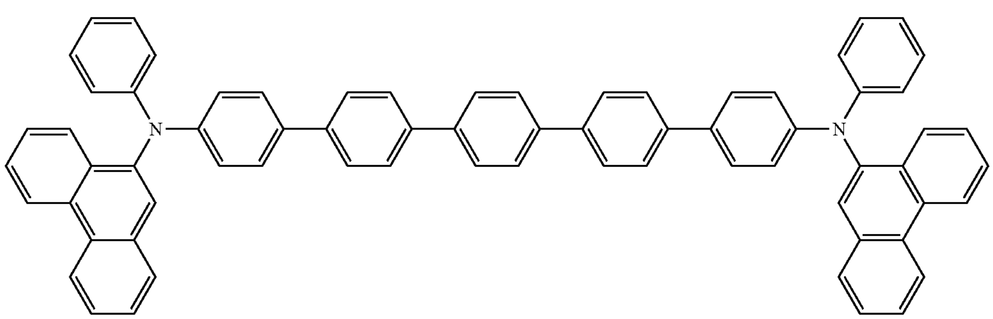

-continued
B15
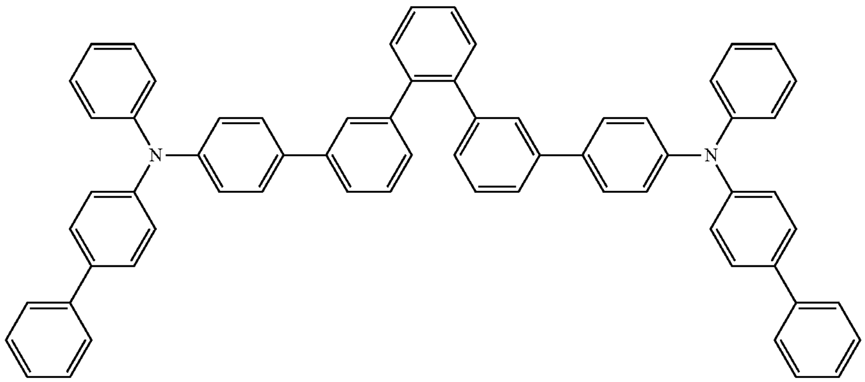
B16
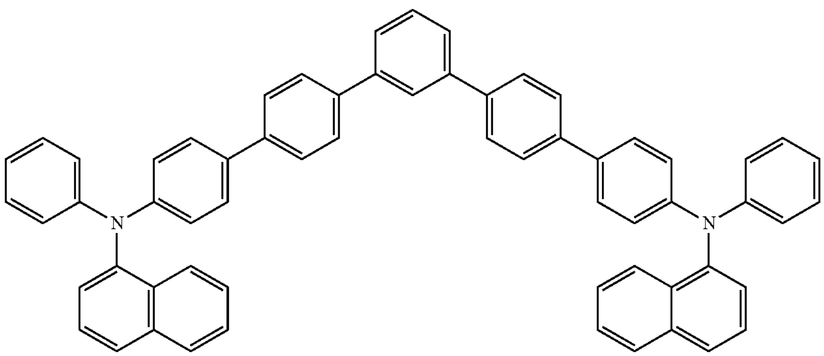
B17
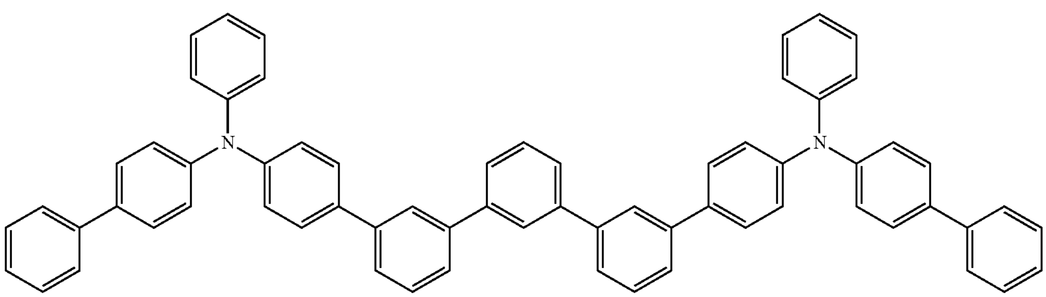
B18
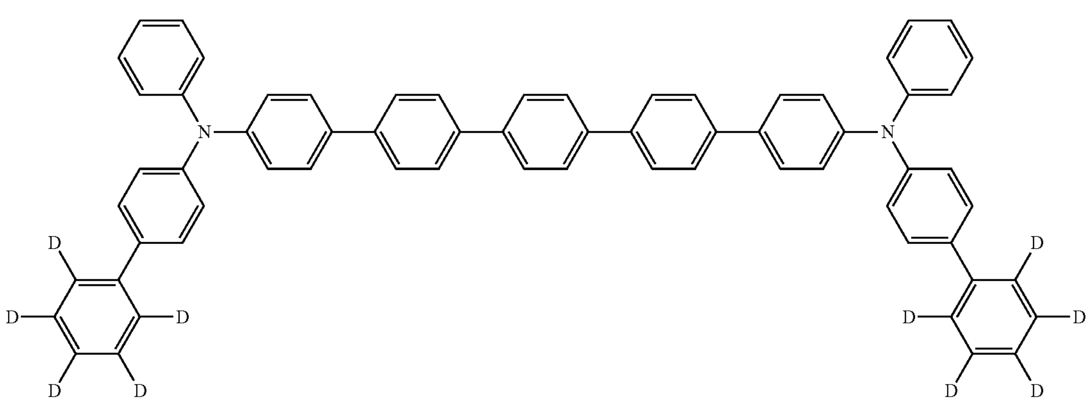

-continued
B19
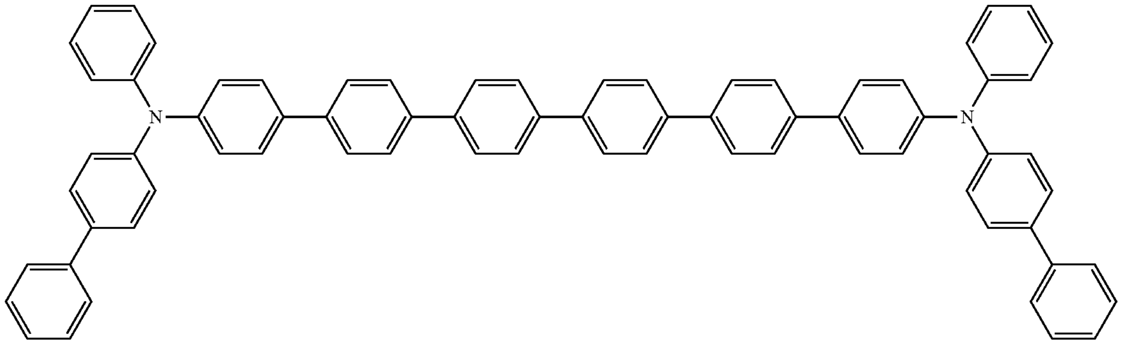
B20
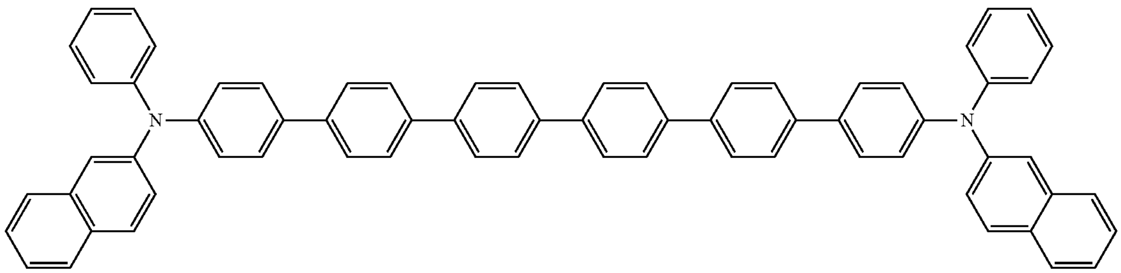
B21
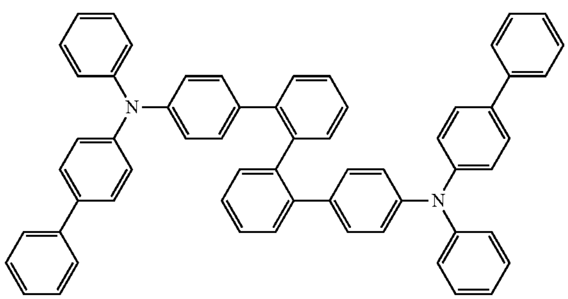
B22
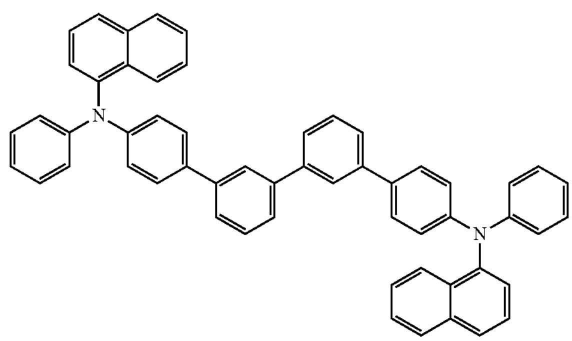
B23
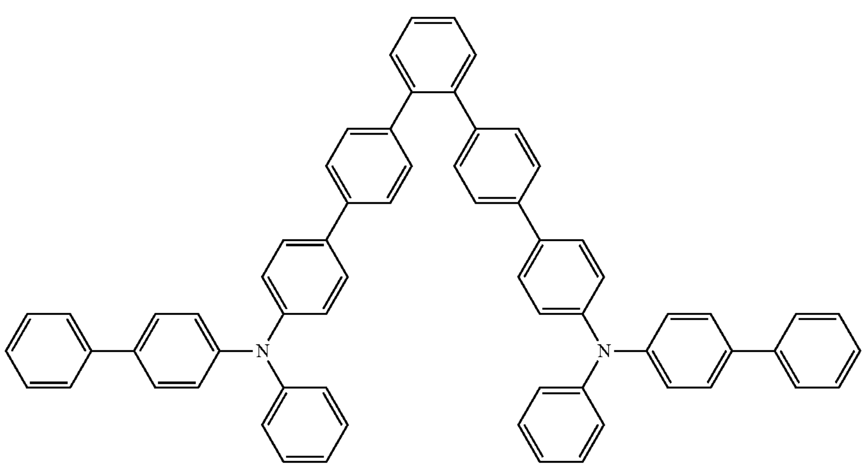

-continued
B24
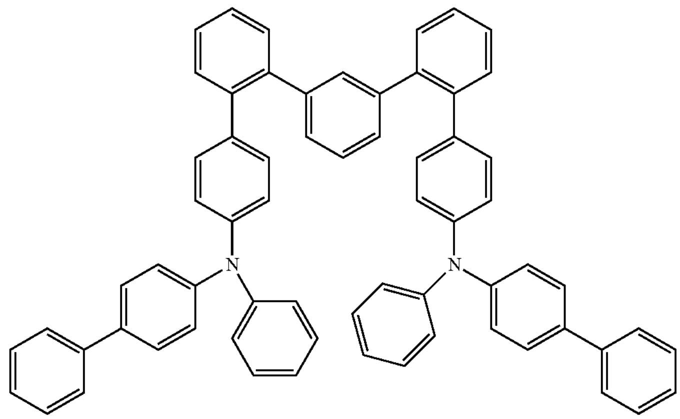
B25
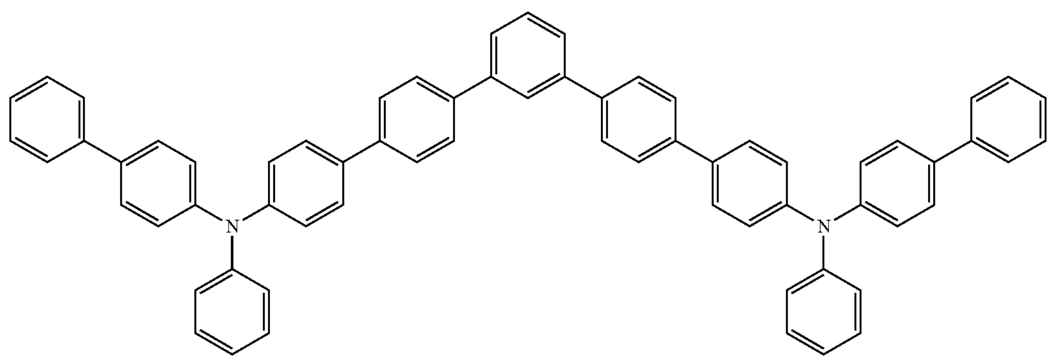
B26
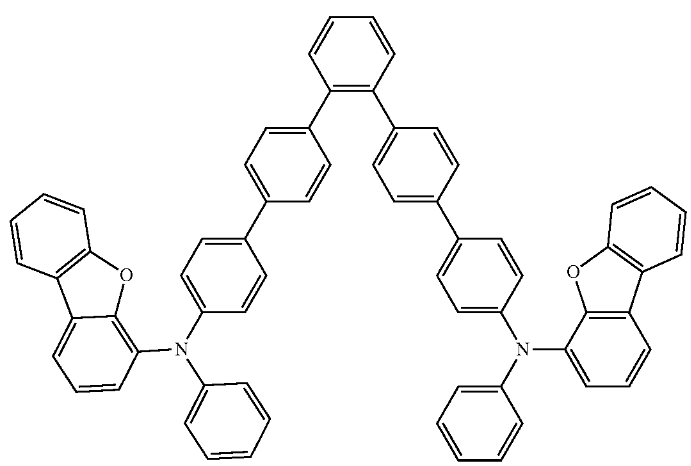
B27
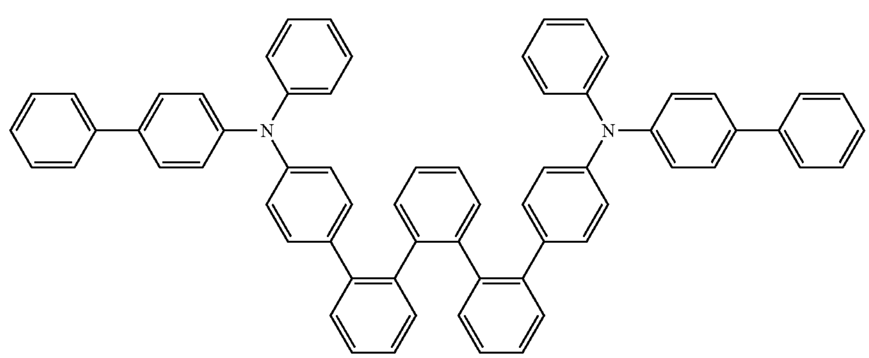

-continued
B28
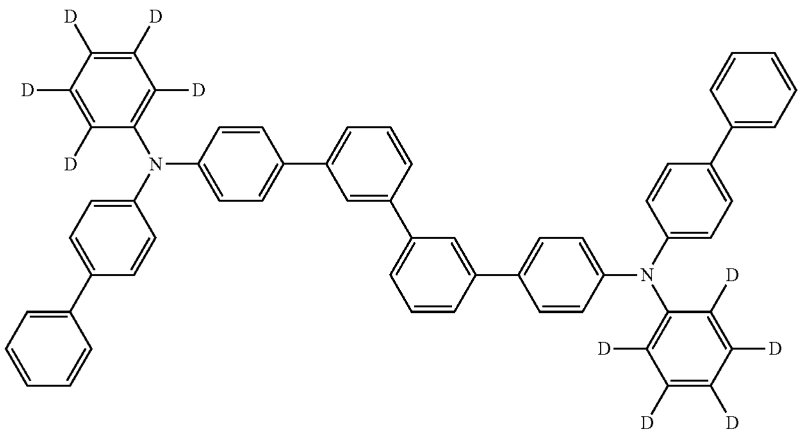
B29
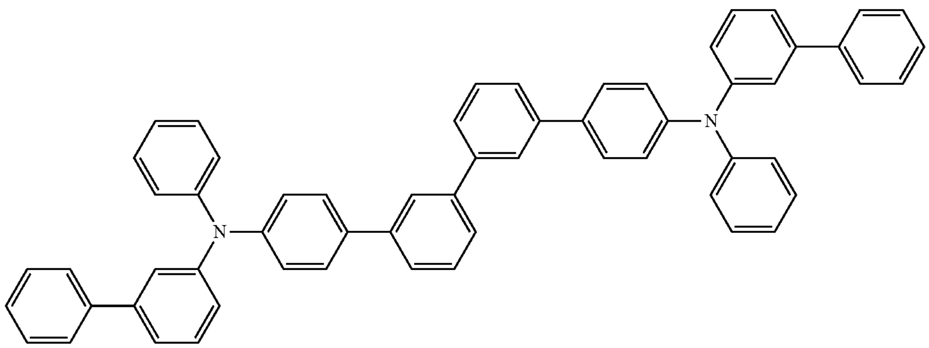
B30
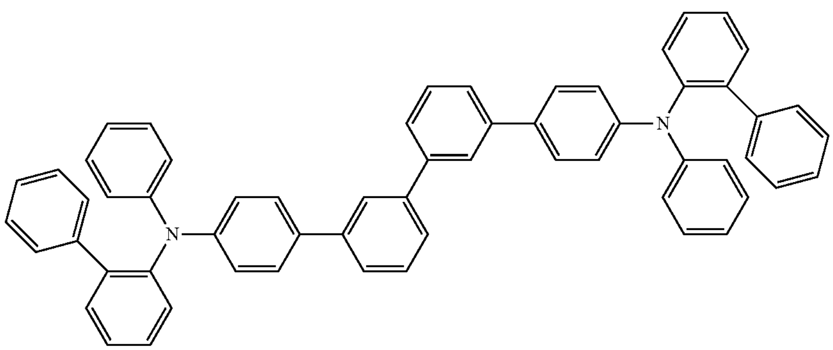
B31
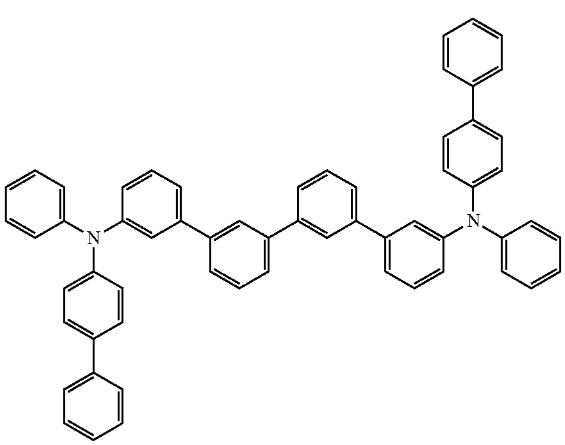
B32
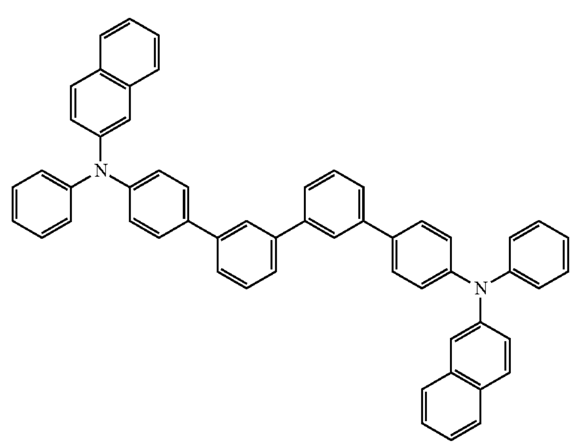

-continued
B33
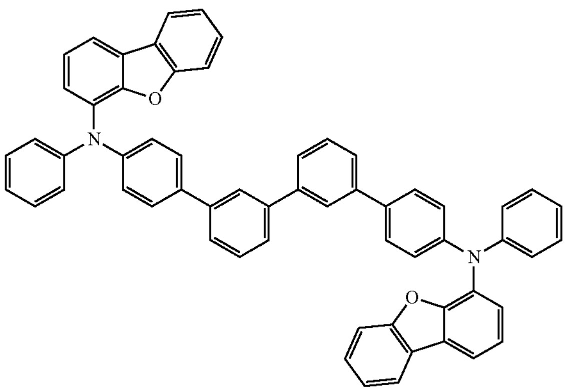
B34
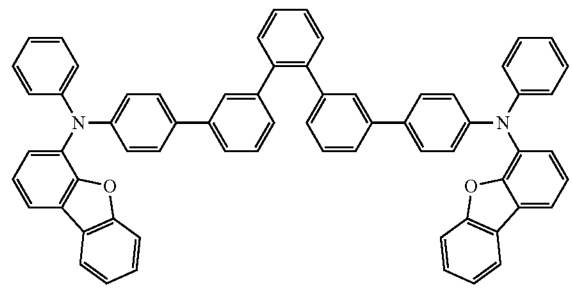
B35
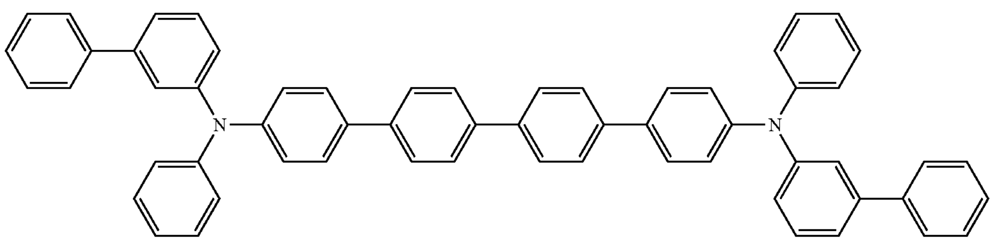
B36
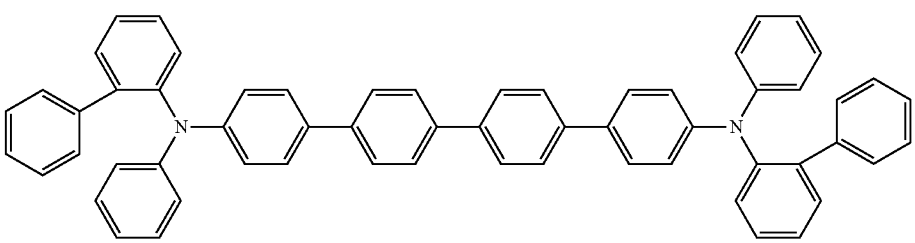
B37
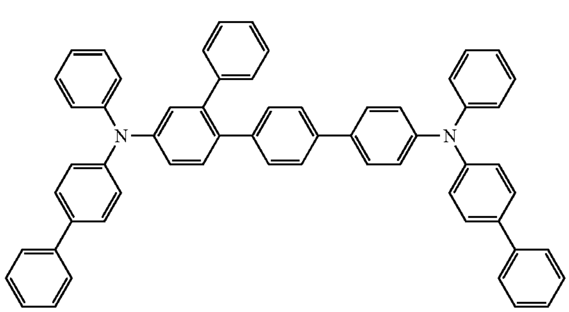
B38
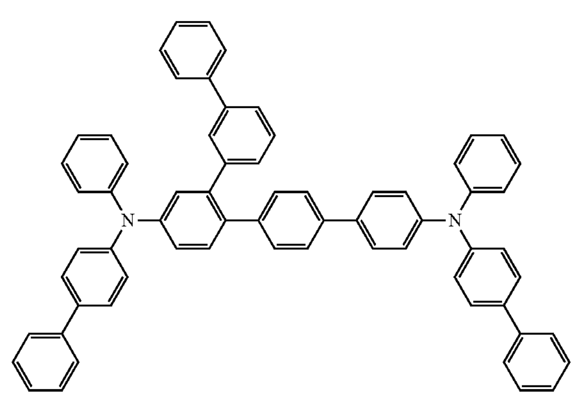

-continued
B39
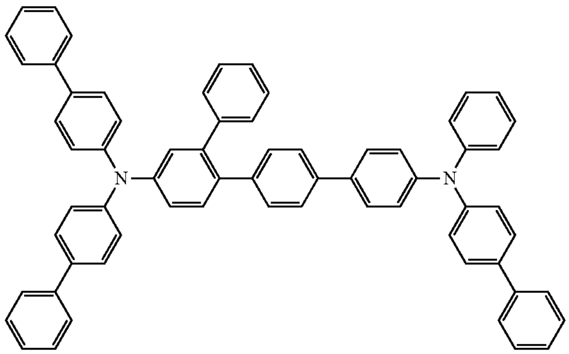
B40
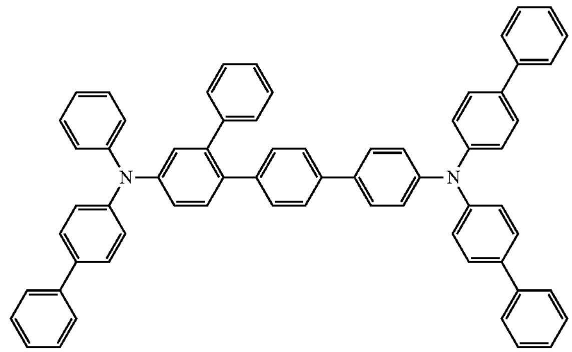
B41
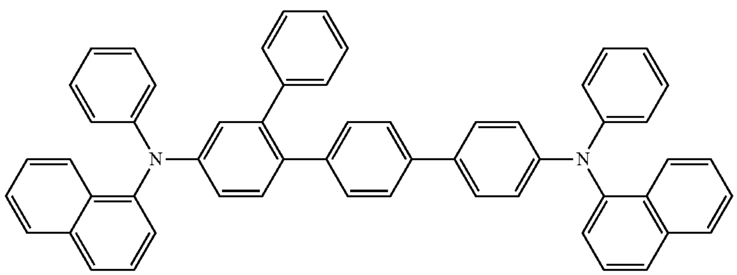
B42
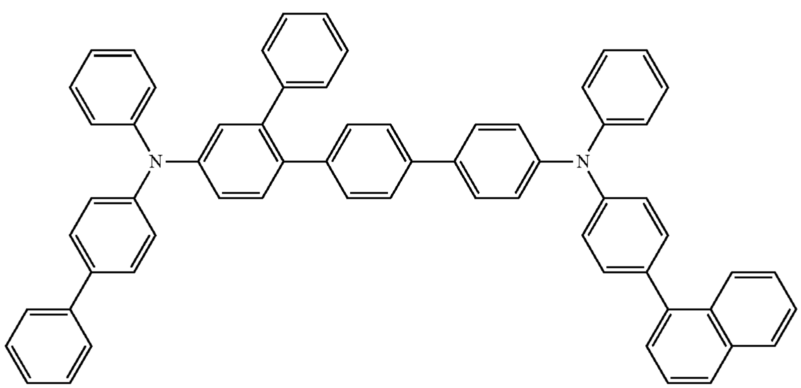
B43
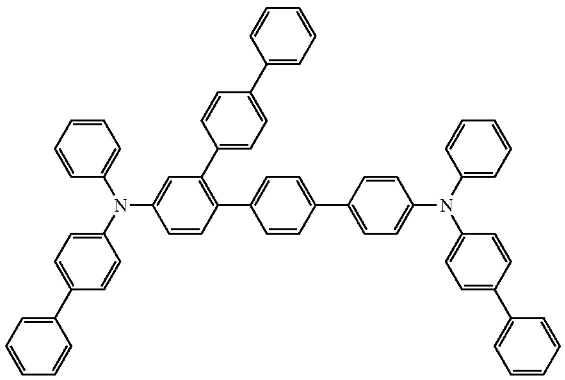
B44
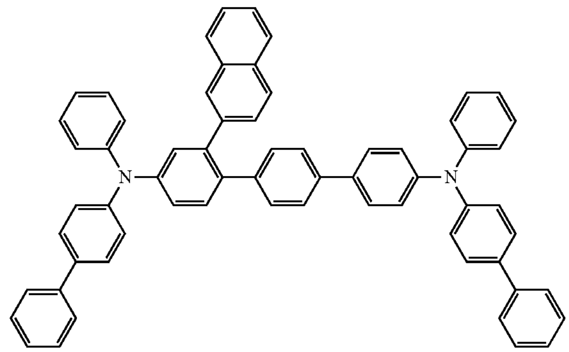

-continued
B45
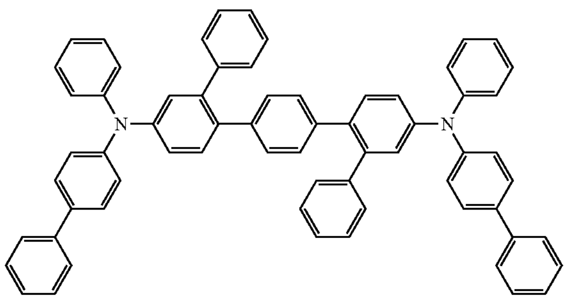
B46
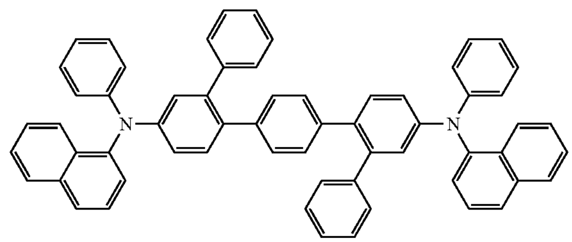
B47
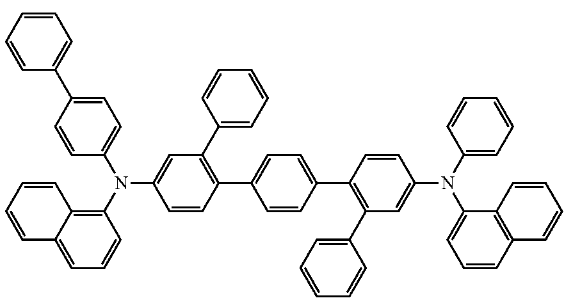
B48
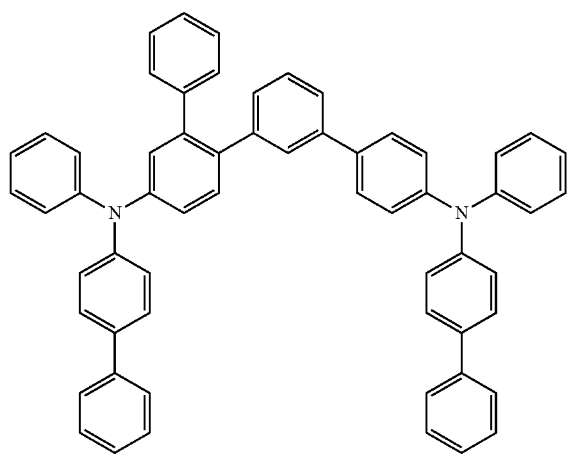
B49
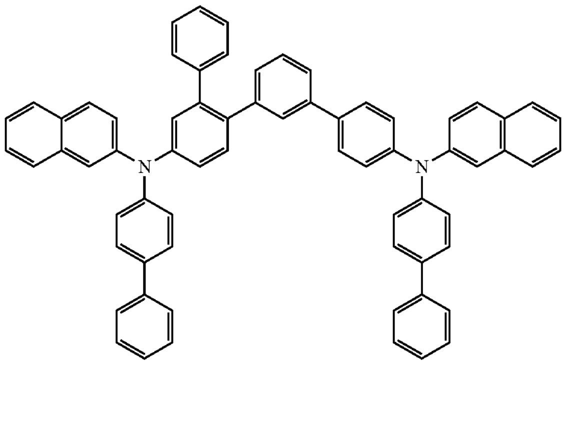
B50
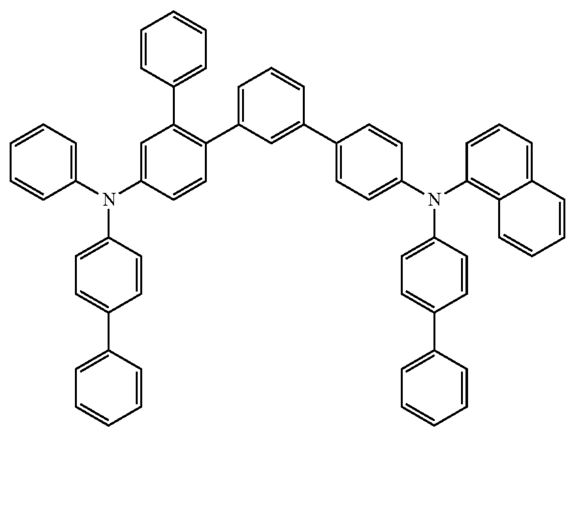

-continued
B51
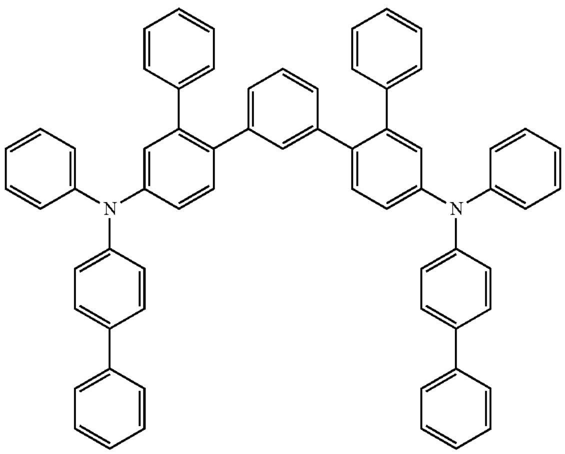
B52
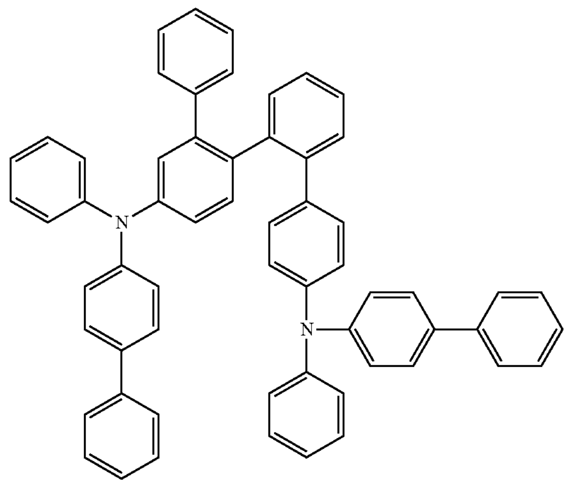
B53
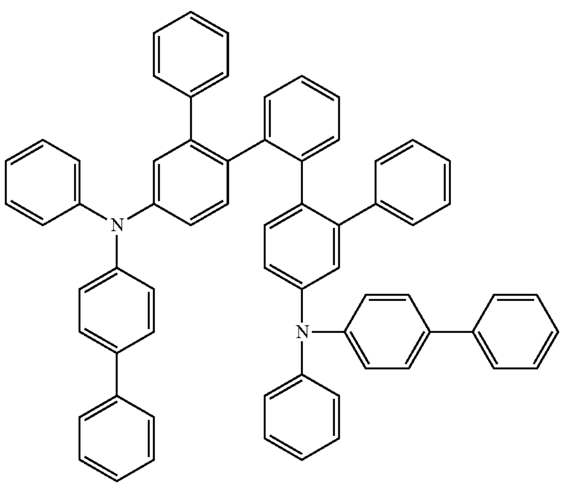
B54
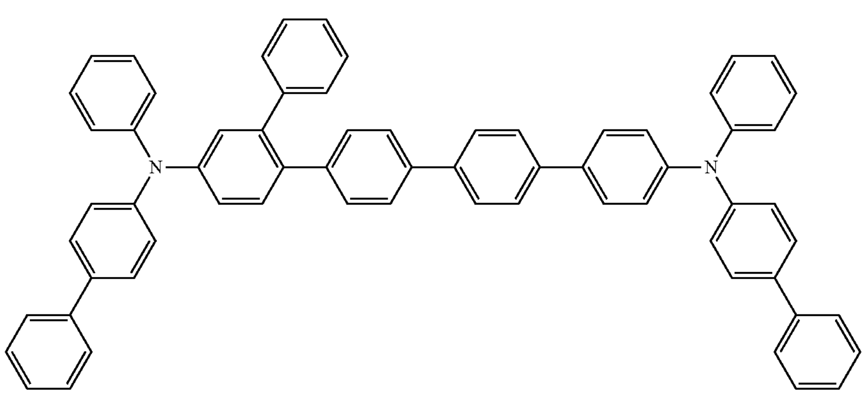

-continued
B55
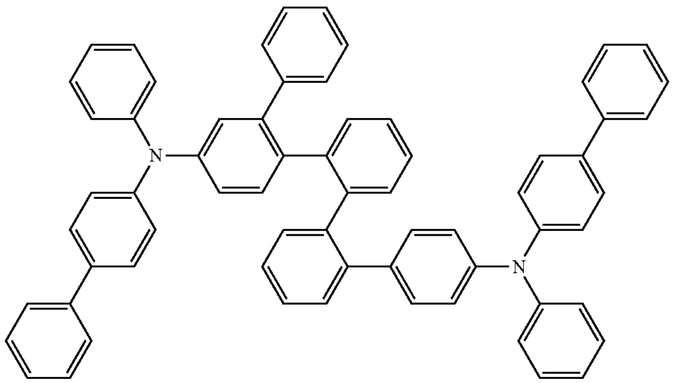
B56
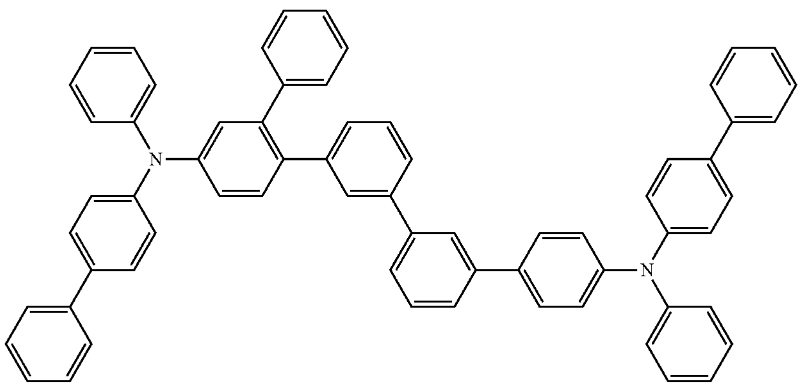
B57
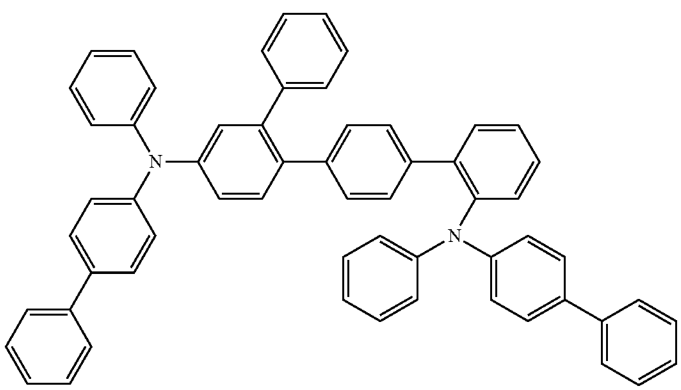
B58
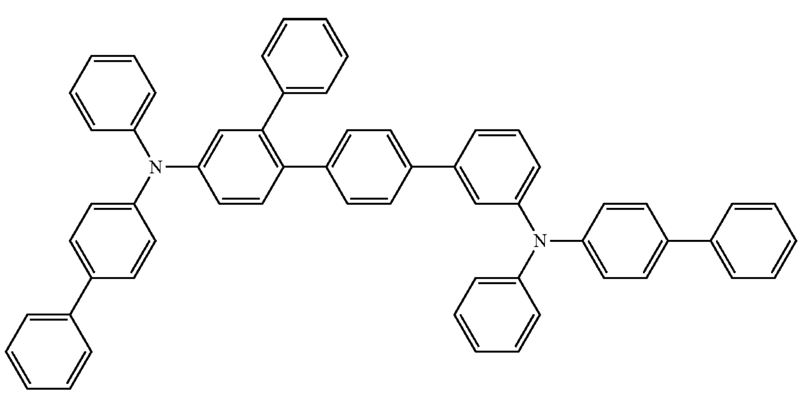

-continued
B59
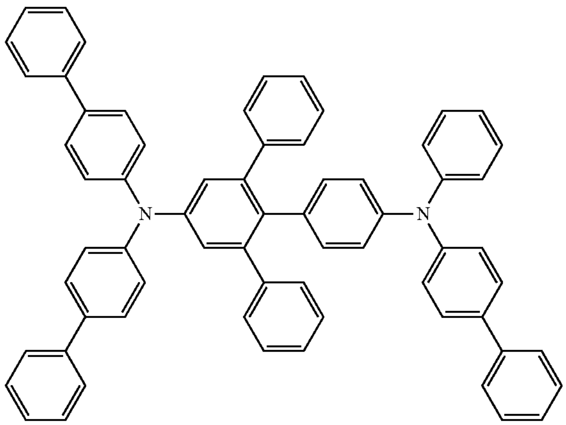
B60
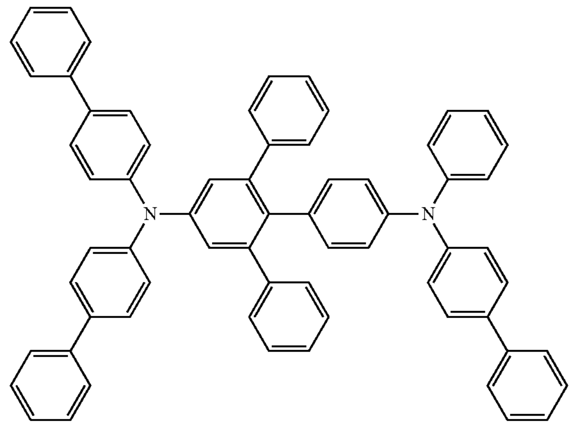
B61
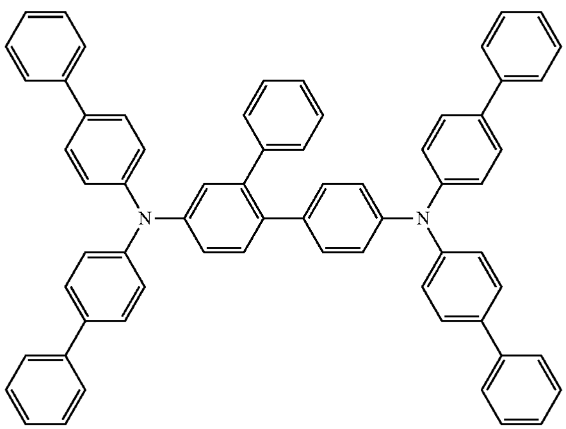
B62
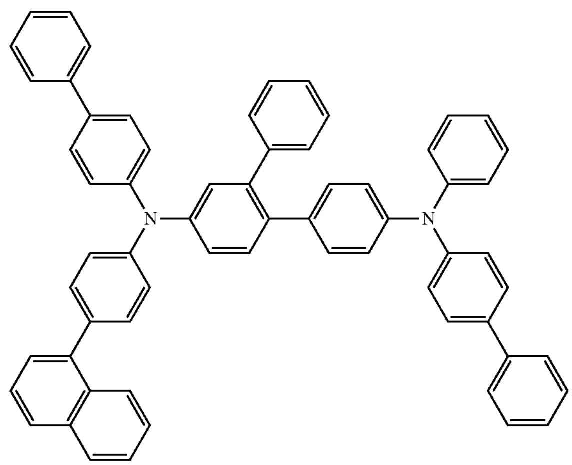
B63
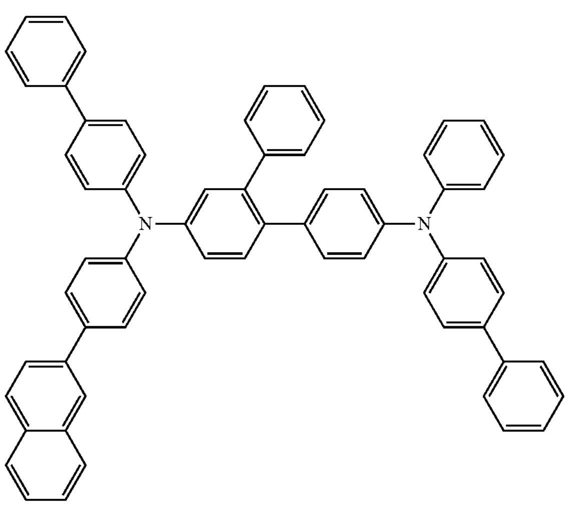
B64
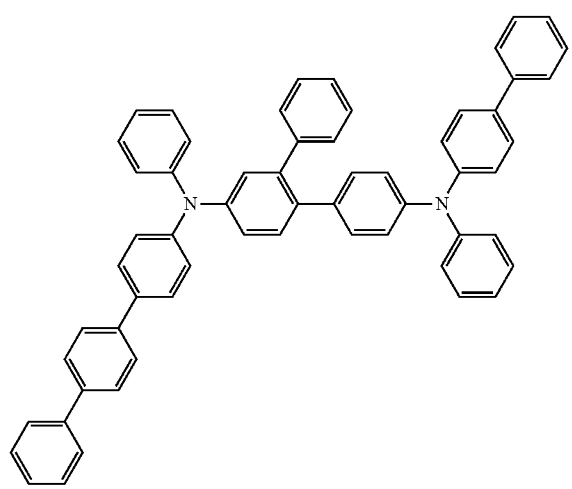

-continued
B65
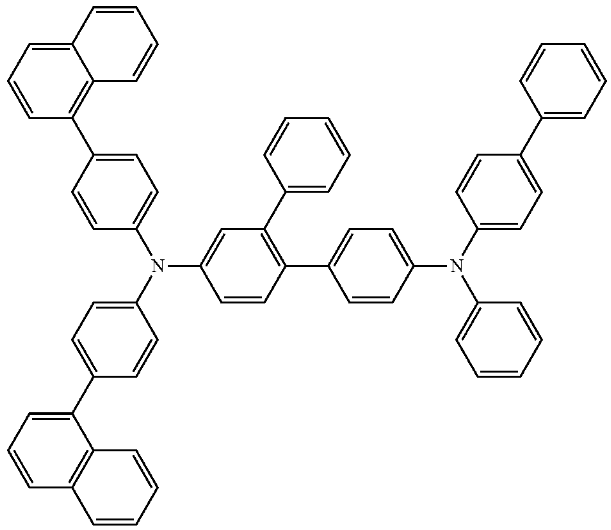
B66
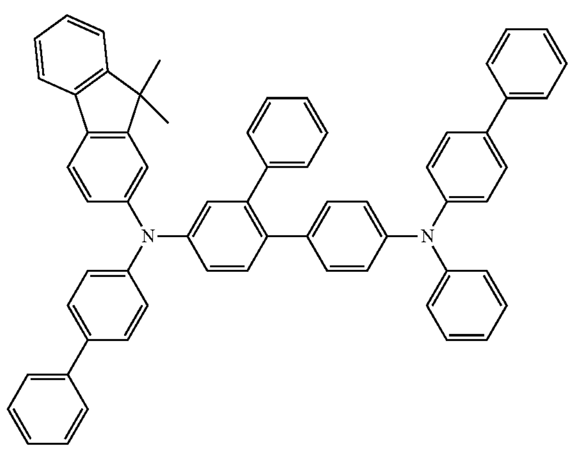
B67
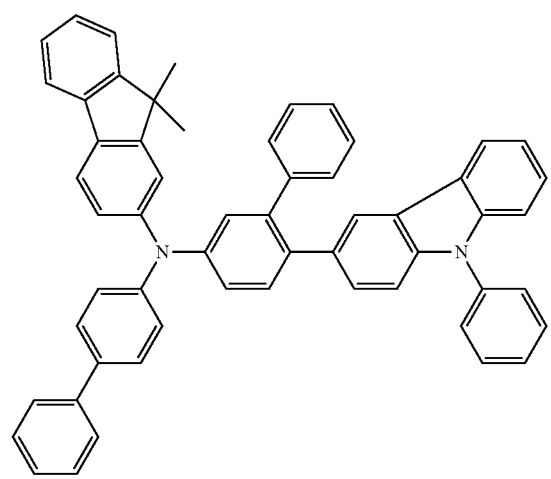
B68
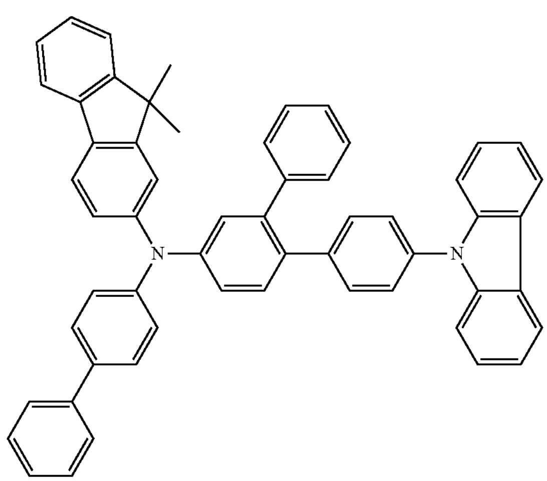
B69
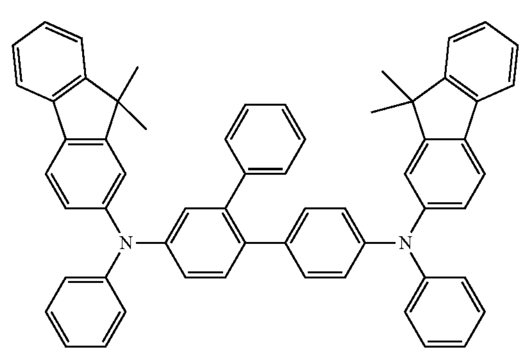

-continued
B70
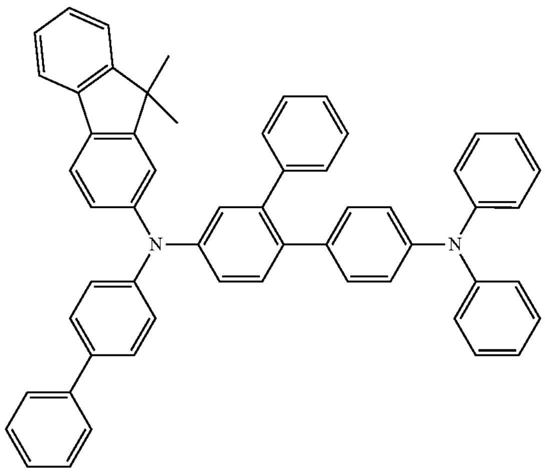
B71
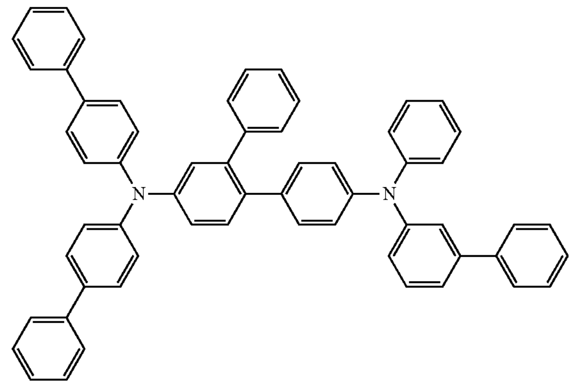
B72
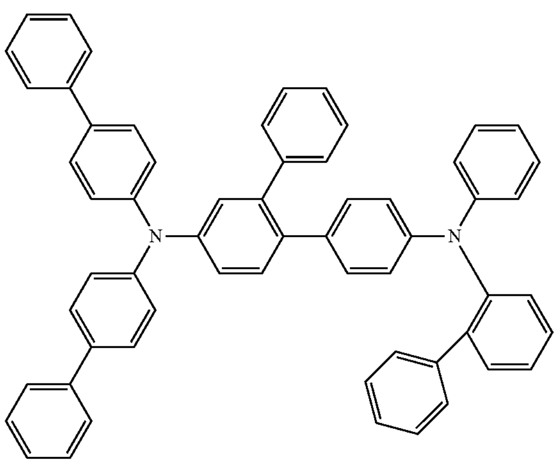
B73
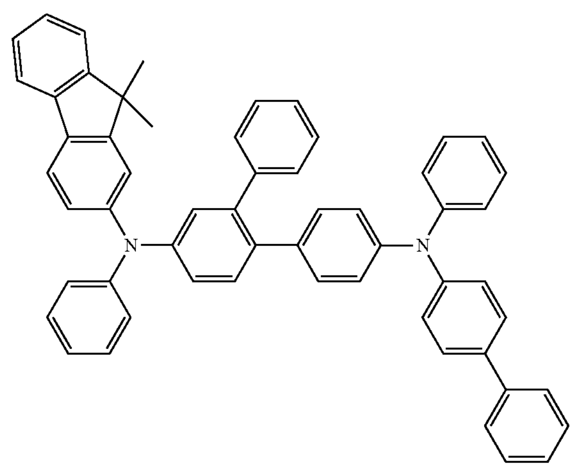
B74
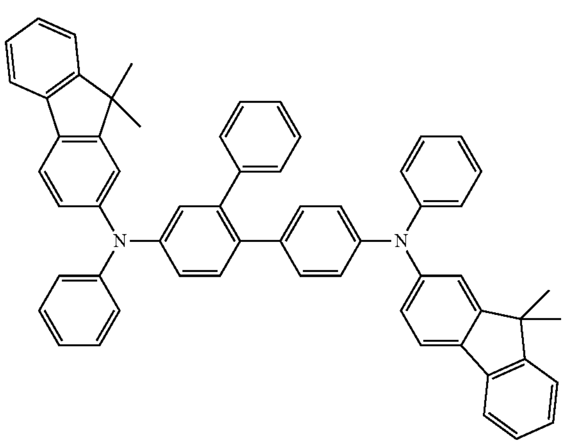
B75
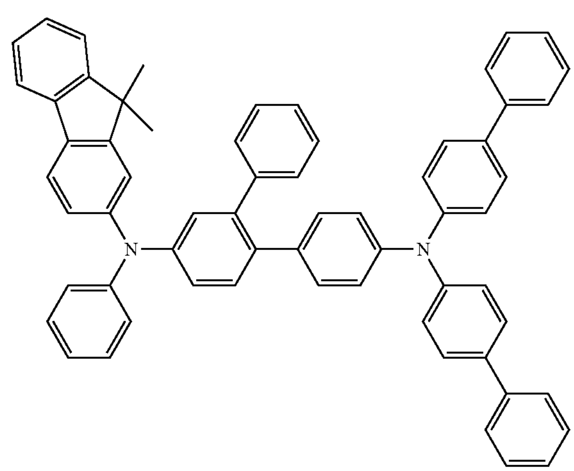

-continued

B76

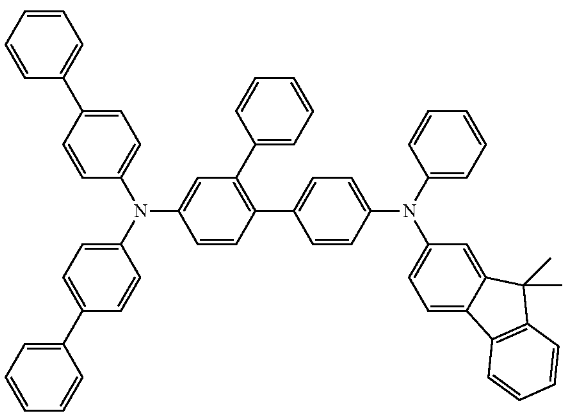

B77

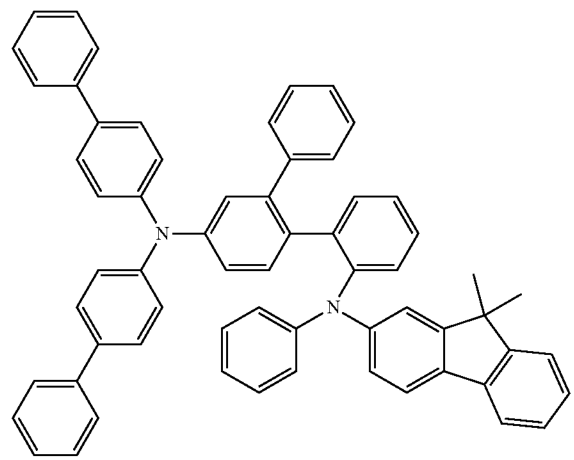

B78

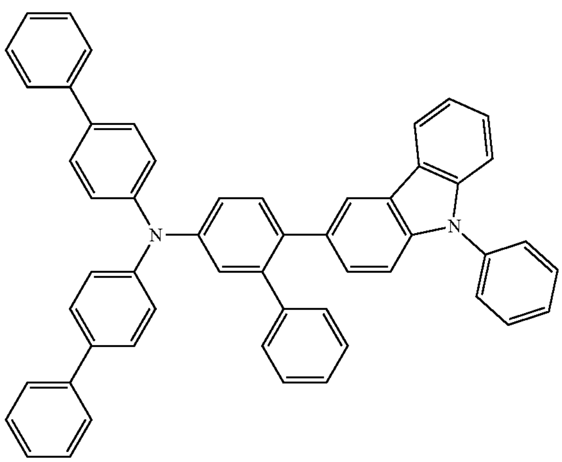

B79

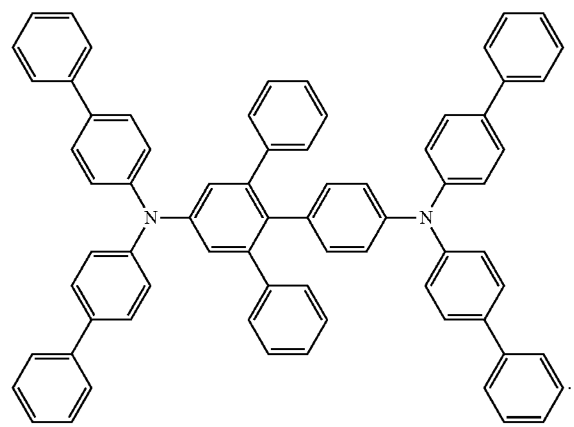

13. The organic electroluminescent device according to claim 10, wherein the light emitting layer comprises, as a host compound, an anthracene derivative represented by Formula D:

[Formula D]

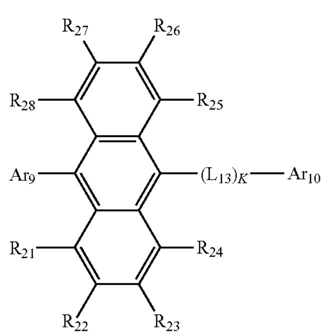

wherein $R_{21}$ to $R_{28}$ are identical to or different from each other and are as defined for R, $R_2$ to $R_5$ in Formula A-4 or A-6, $Ar_9$ and $Ar_{10}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from the group consisting of substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

14. The organic electroluminescent device according to claim 13, wherein the compound of Formula D is selected from the group consisting of the compounds of Formulae D1 to D48:

-continued
D1
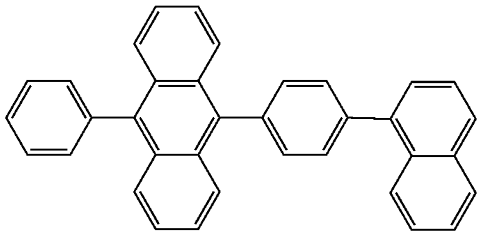
D2
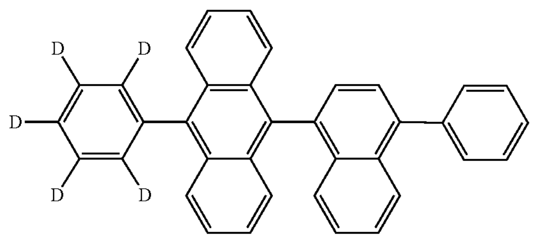
D3
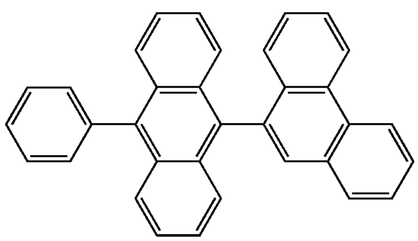
D4
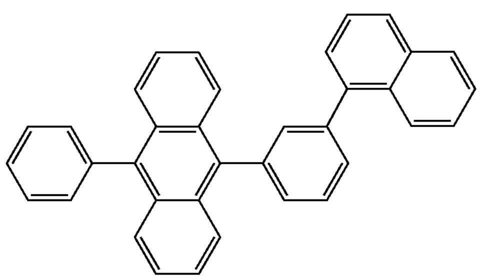
D5
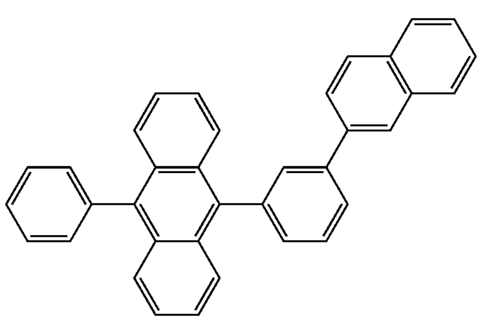
D6
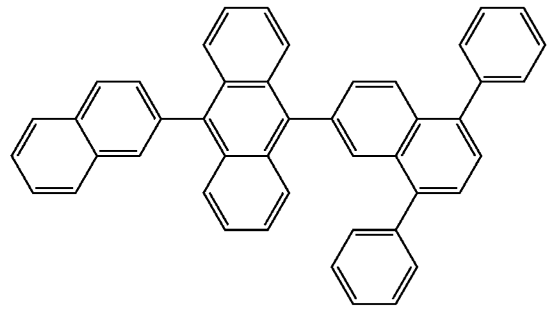
D7
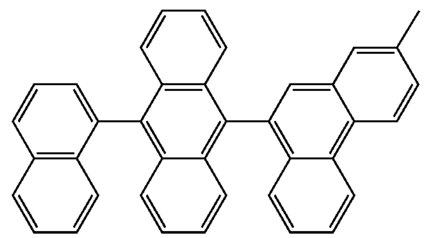
D8
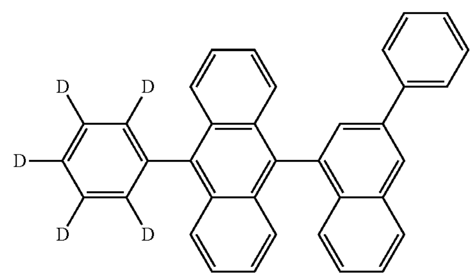
D9
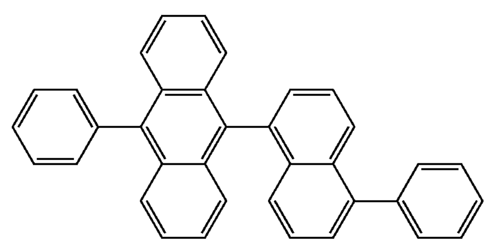
D10
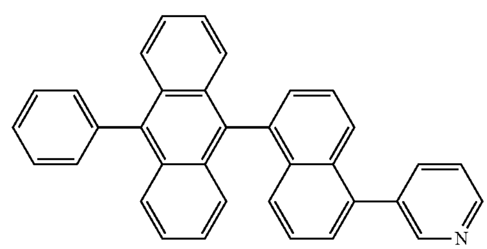
D11
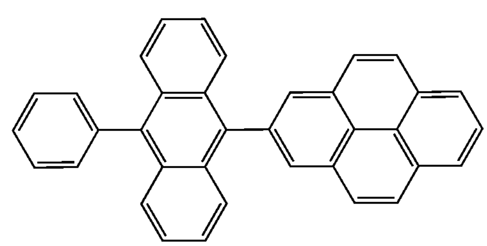

-continued
D12
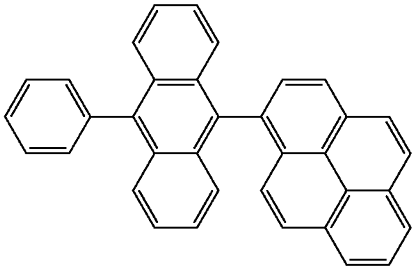
D13
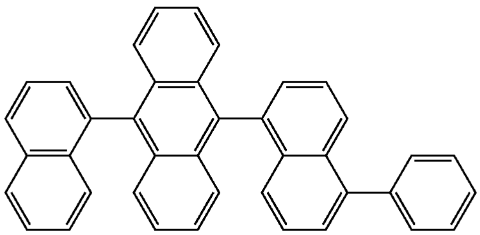
D14
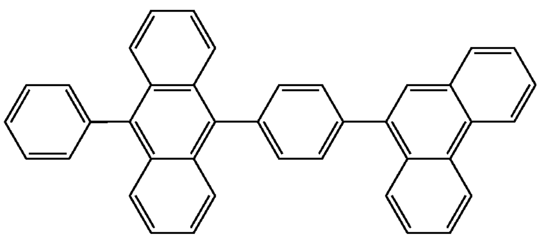
D15
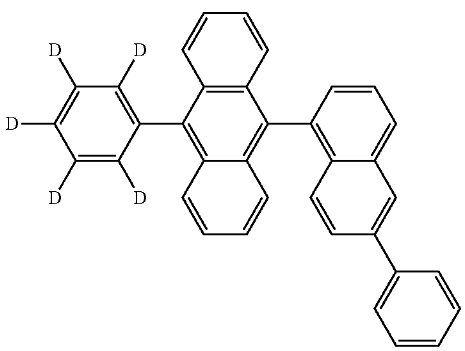
D16
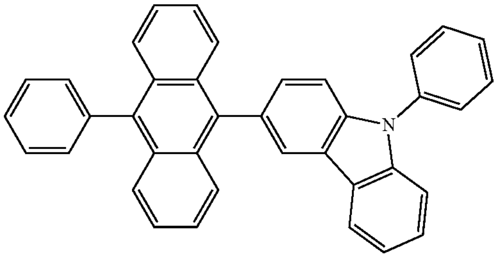
-continued
D17
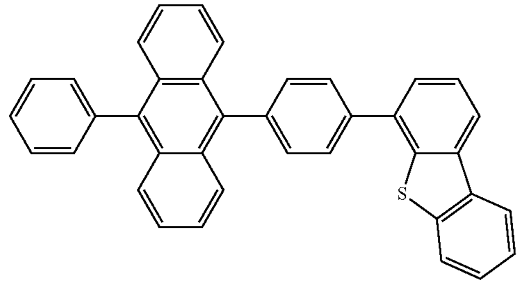
D18
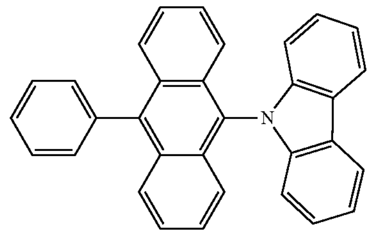
D19
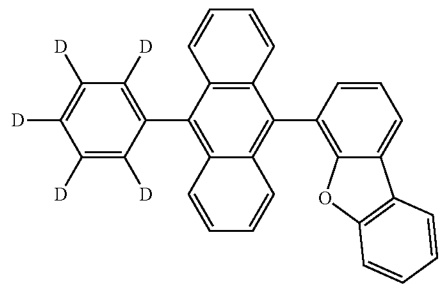
D20
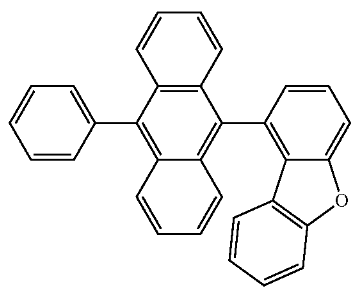
D21
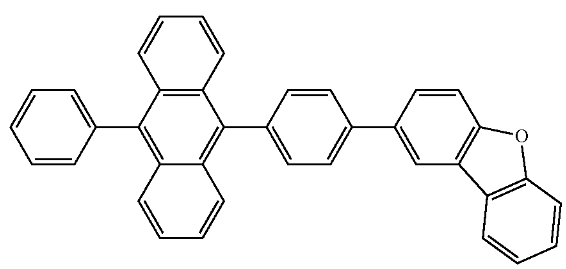

-continued
D22
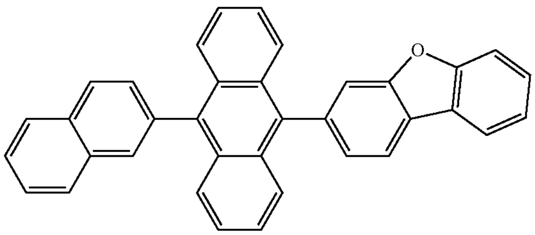
D23
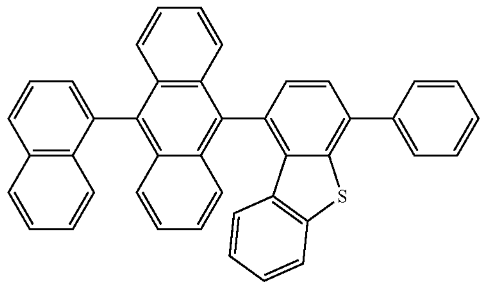
D24
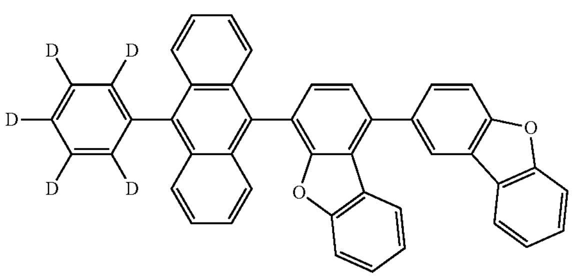
D25
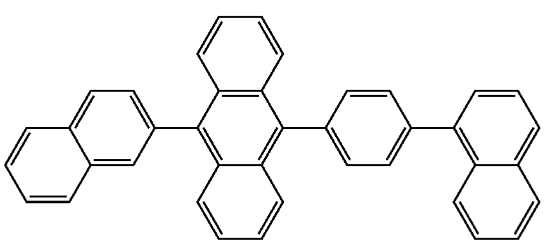
D26
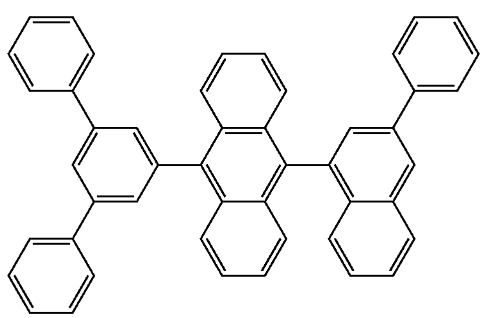
-continued
D27
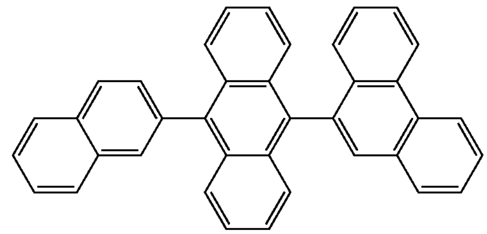
D28
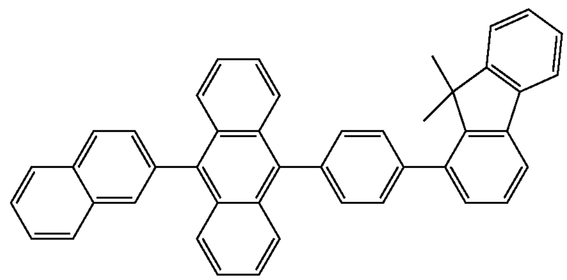
D29
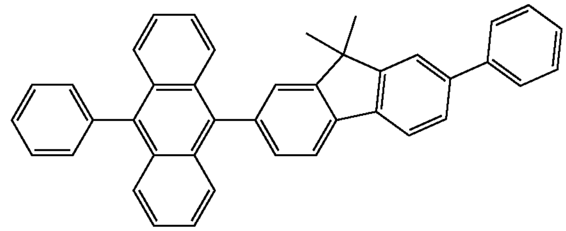
D30
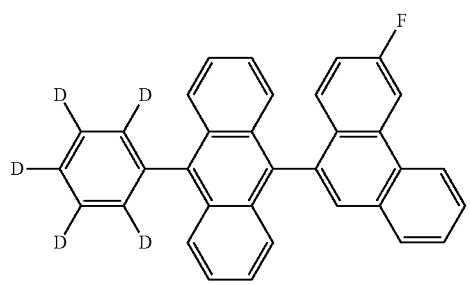
D31
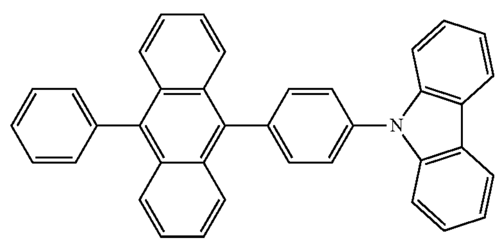
D32
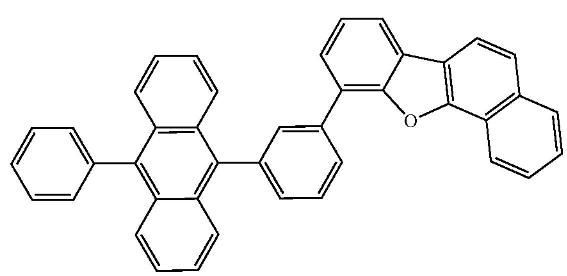

-continued
D33
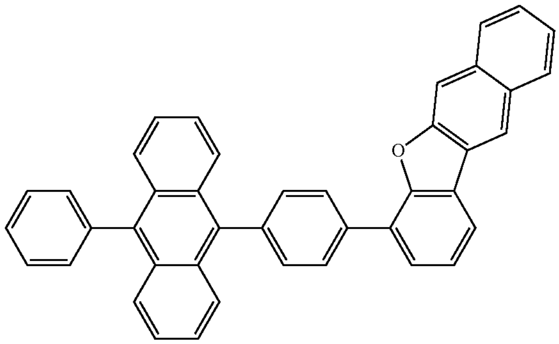
D34
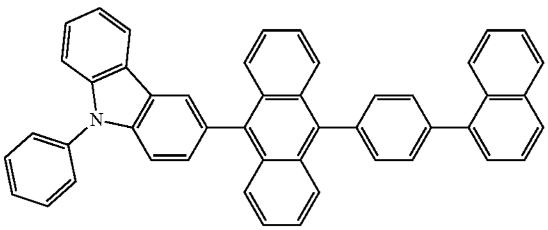
D35
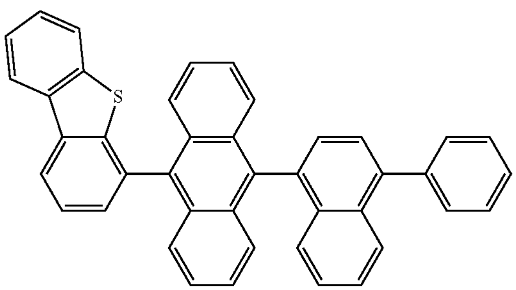
D36
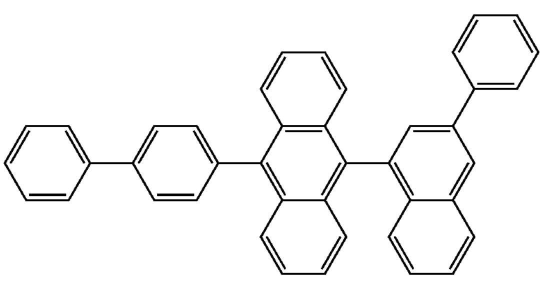
D37
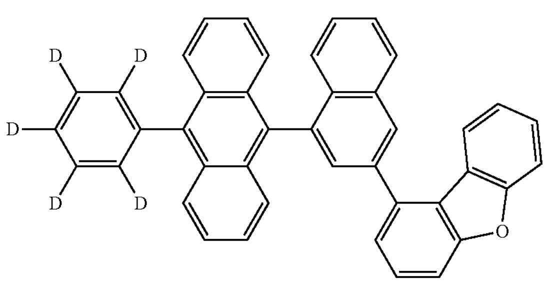
-continued
D38
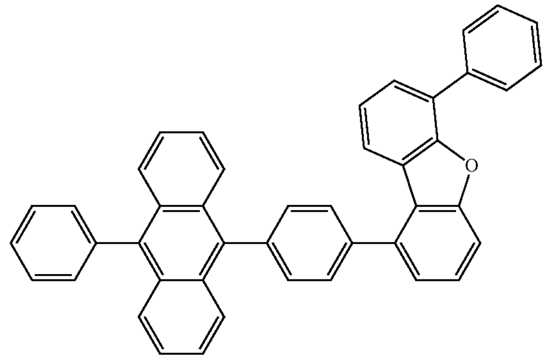
D39
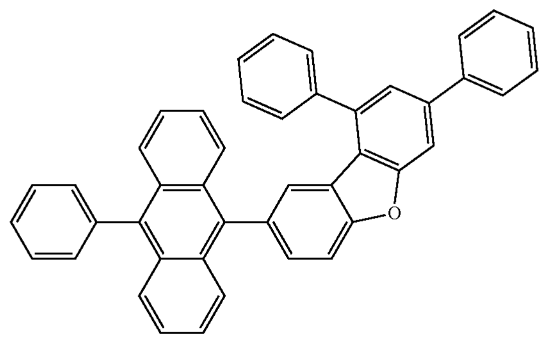
D40
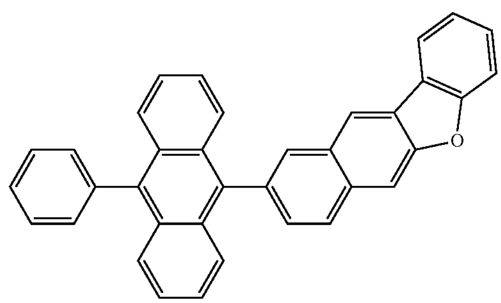
D41
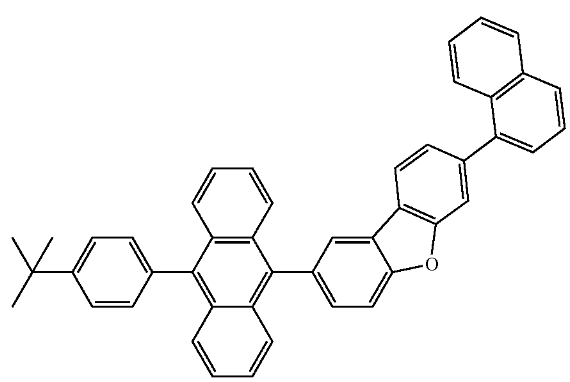

-continued

D42

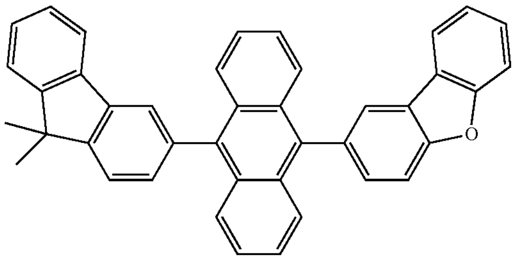

D43

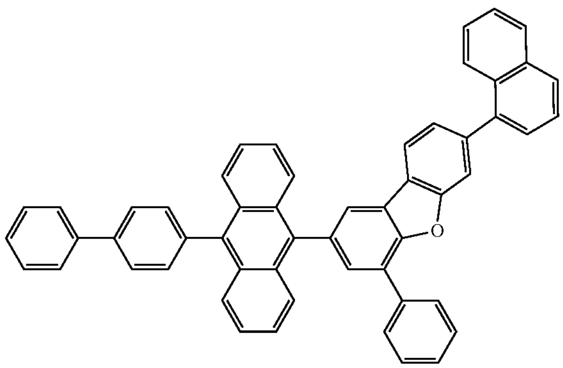

D44

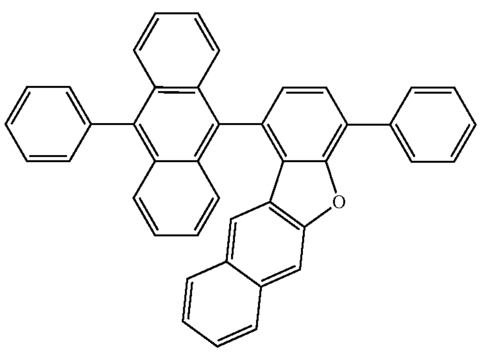

D45

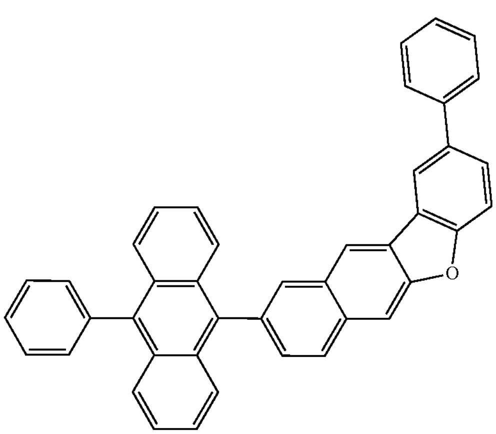

-continued

D46

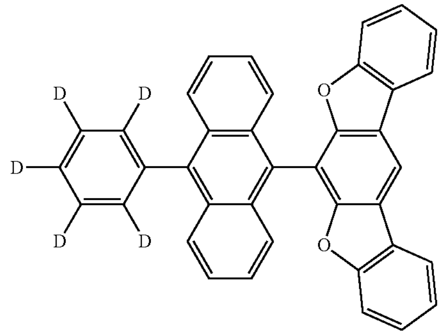

D47

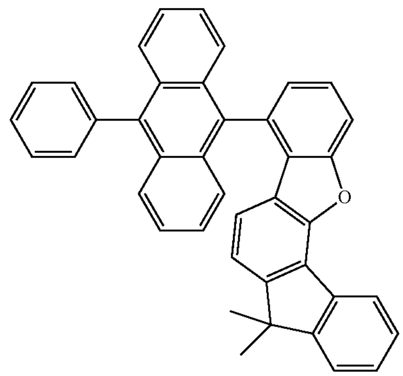

D48

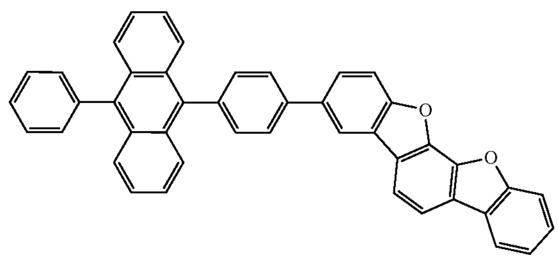

15. The organic electroluminescent device according to claim 10, further comprising a hole transport layer and an electron blocking layer interposed between the first electrode and the second electrode wherein each of the hole transport layer and the electron blocking layer comprises a compound represented by Formula E:

[Formula E]

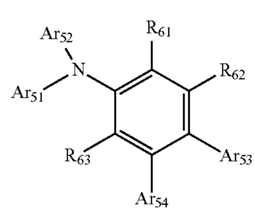

wherein $R_{61}$ to $R_{63}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

16. The organic electroluminescent device according to claim 15, wherein the compound of Formula E is selected from the group consisting of the compounds of Formulae E1 to E33:

E1

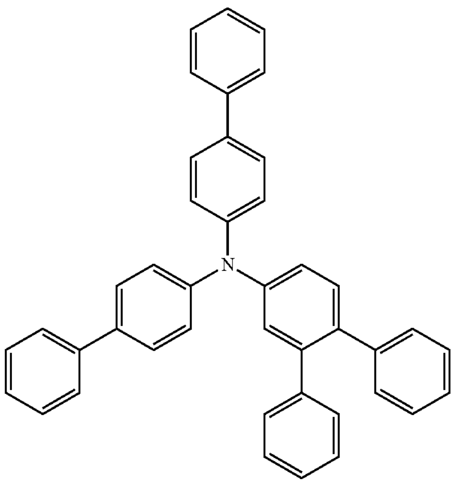

E2

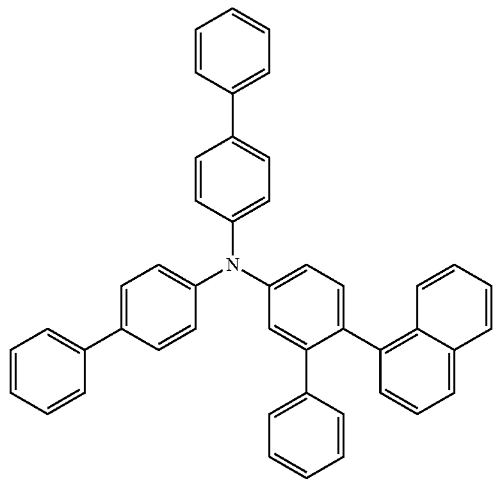

E3

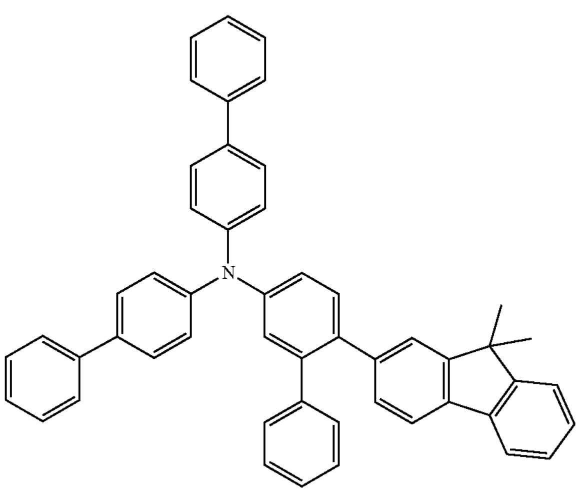

E4

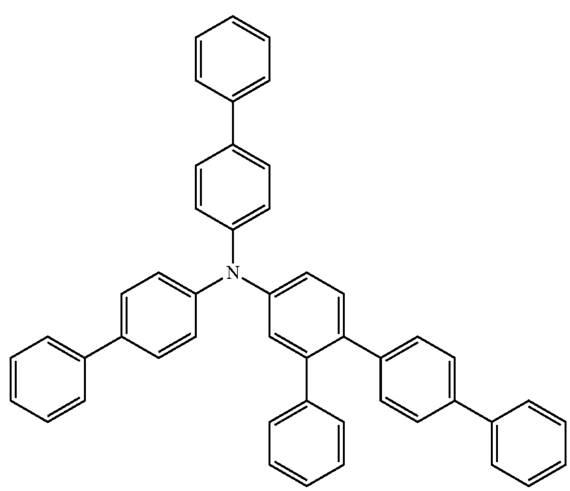

-continued
E5
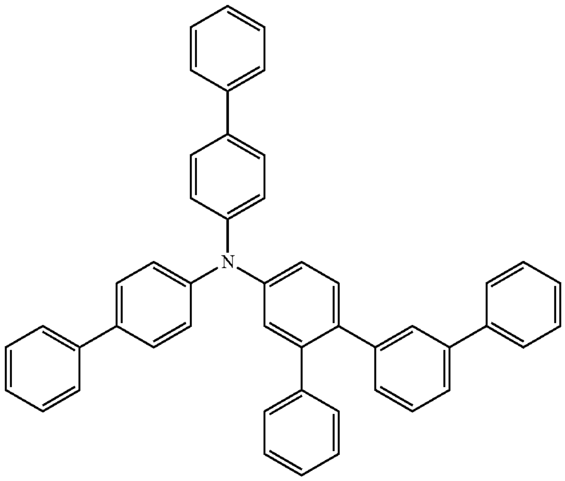
E6
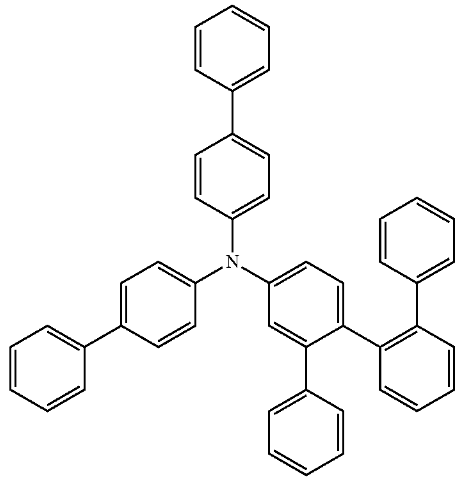
E7
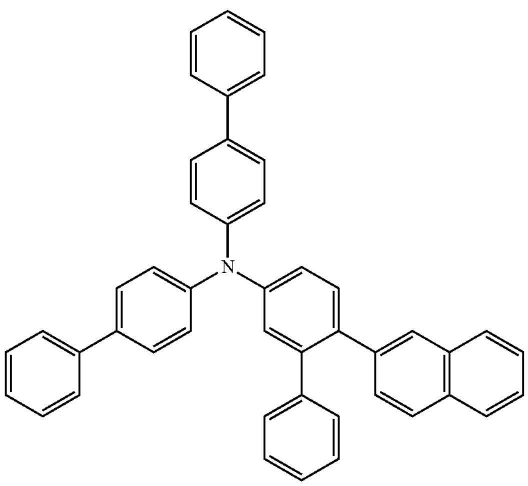
E8
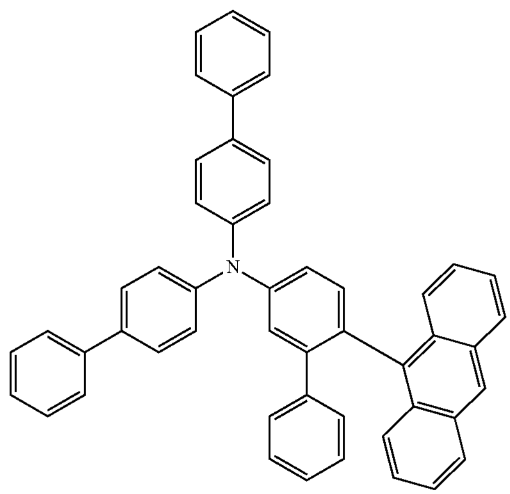
E9
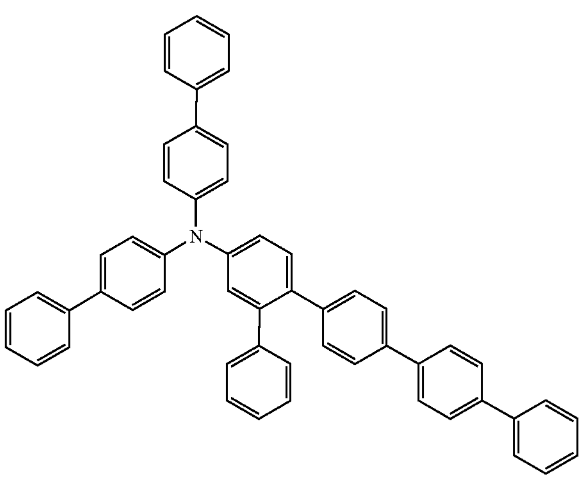
E10
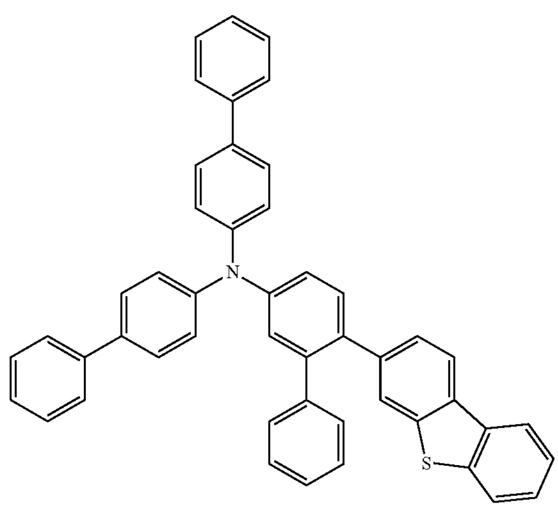

-continued
E11
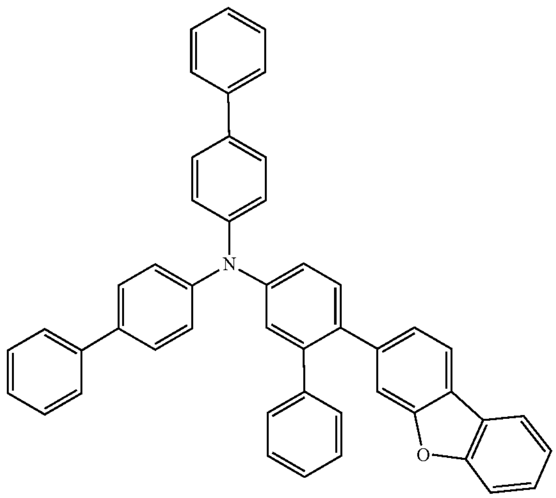
E12
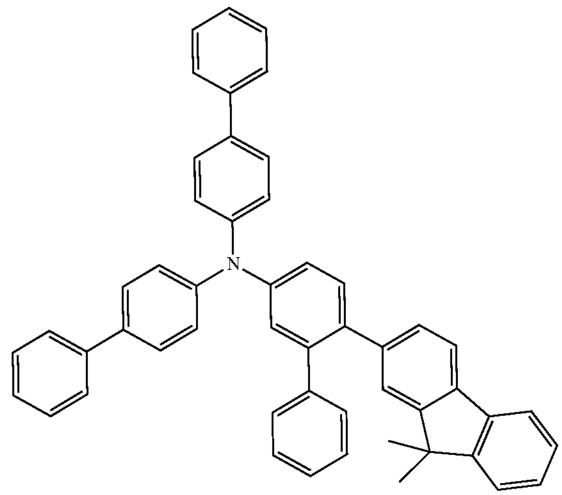
E13
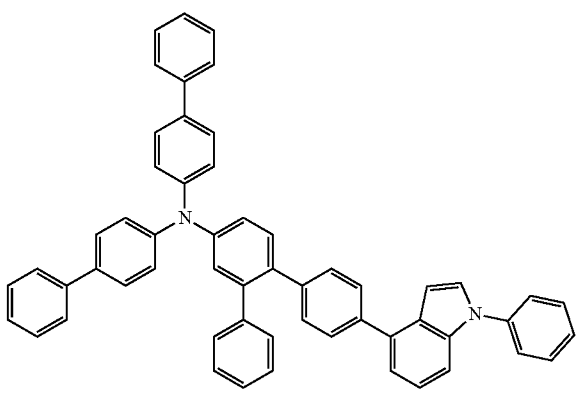
E14
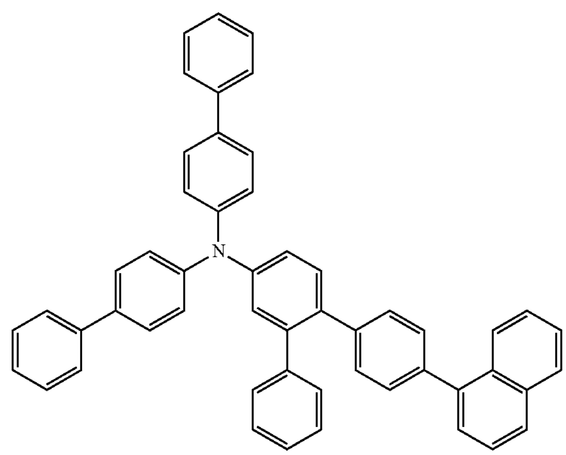
E15
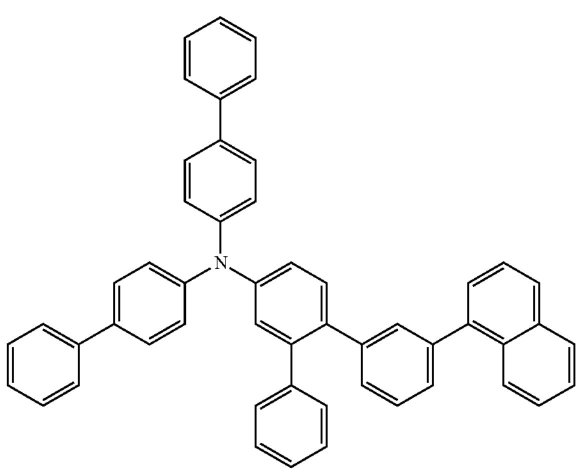
E16
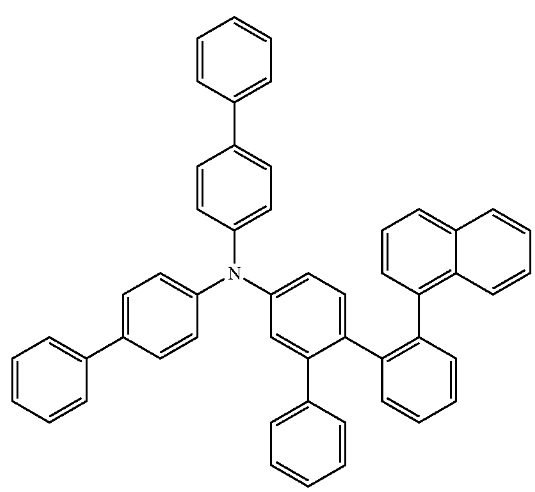

-continued
E17
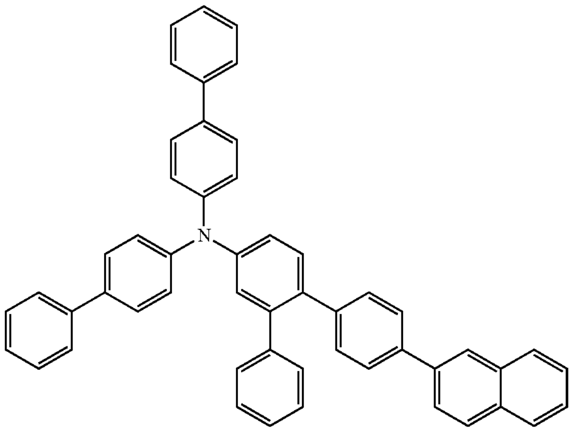
E18
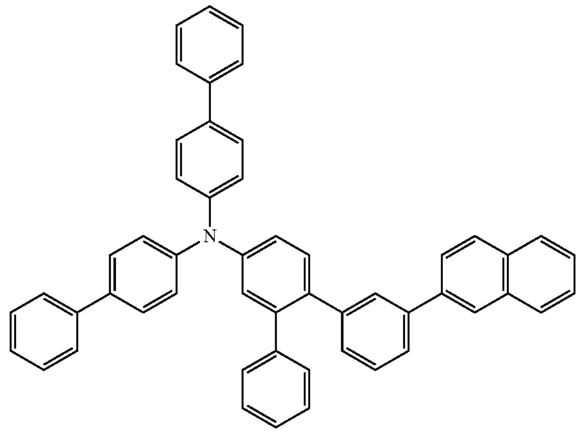
E19
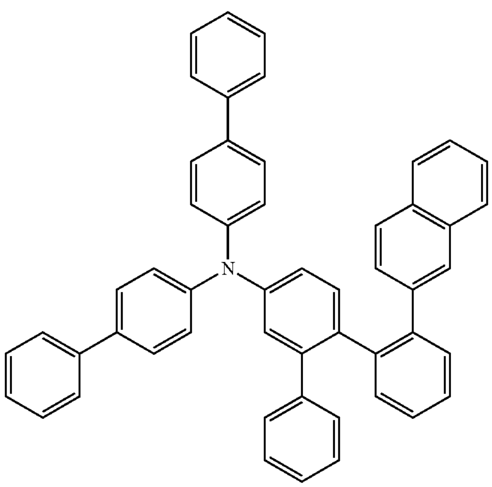
E20
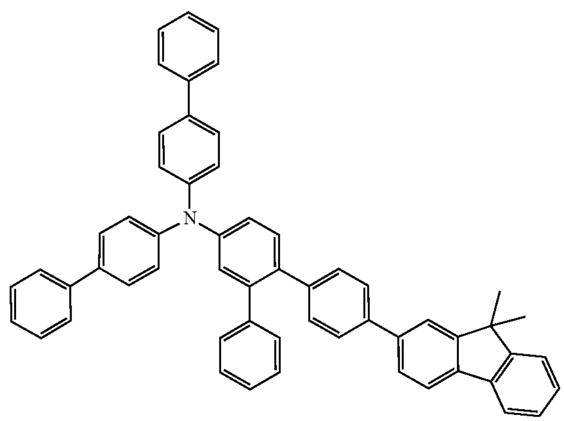
E21
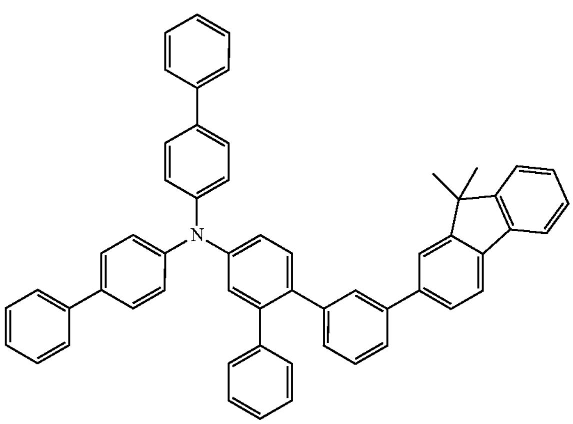
E22
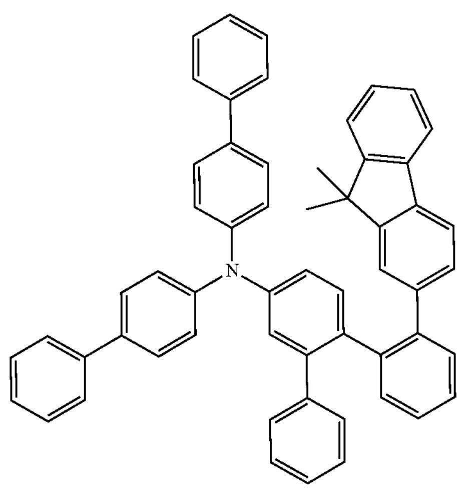

-continued
E23
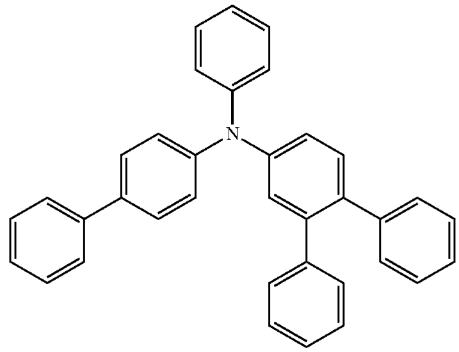
E24
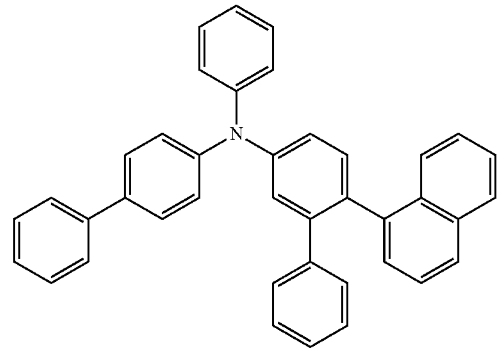
E25
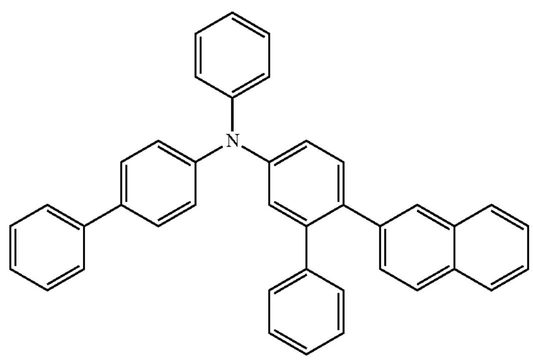
E26
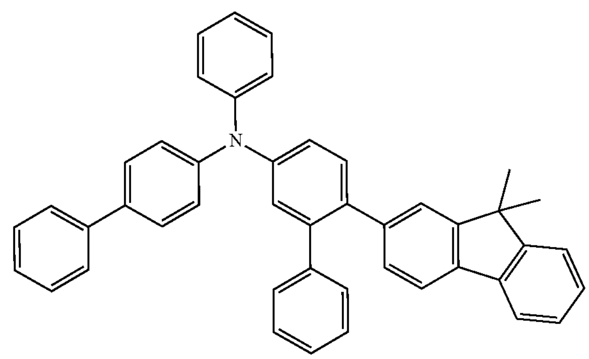
E27
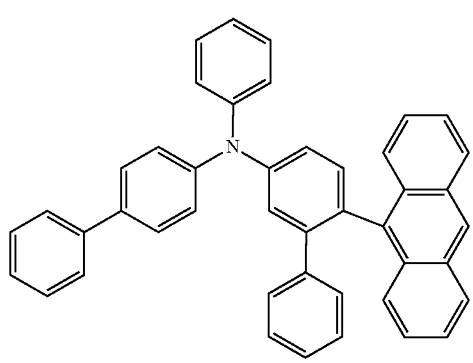
E28
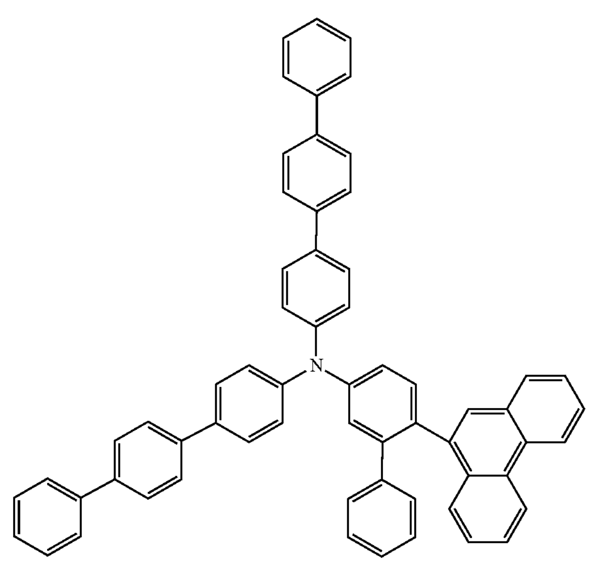

-continued
E29
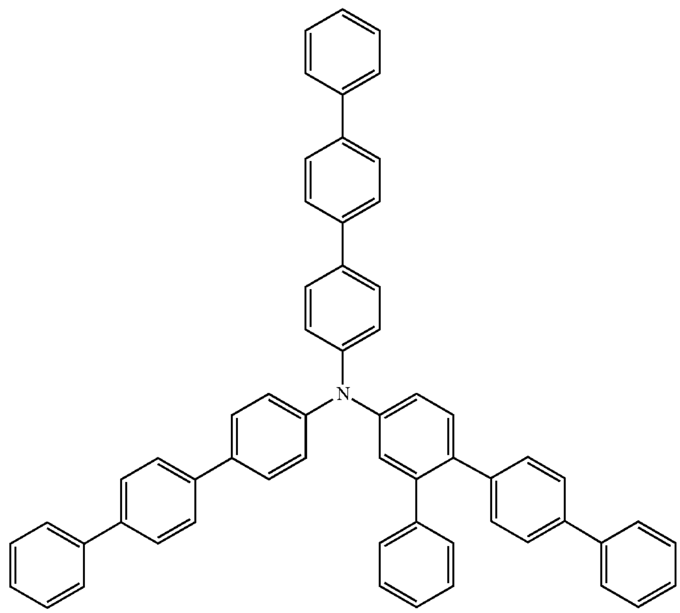
E30
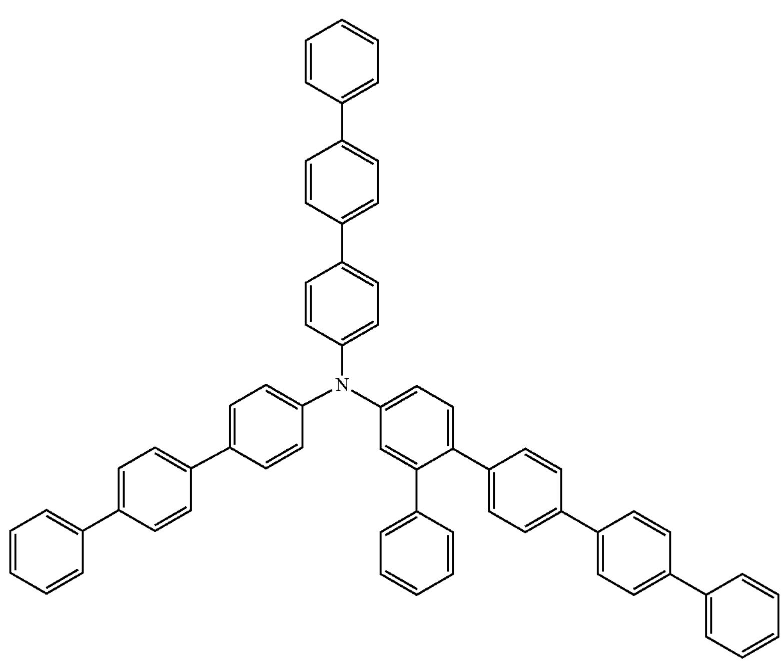

-continued
E31
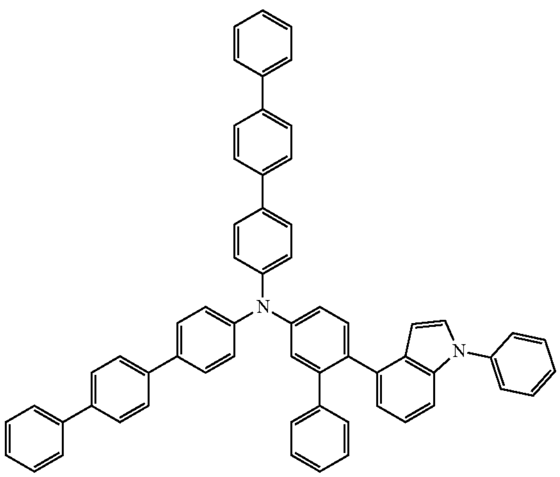
E32
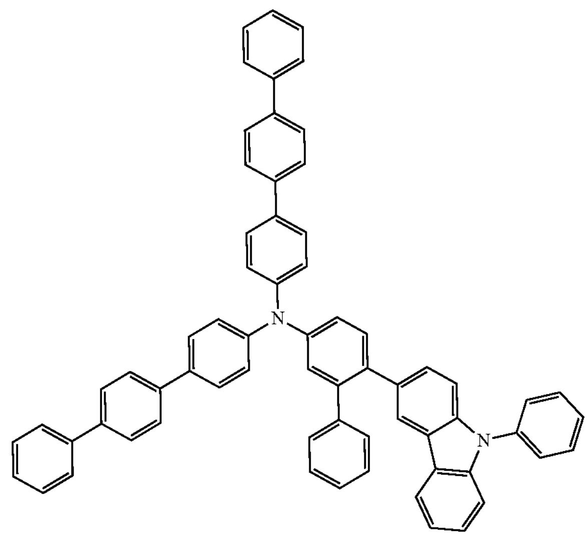
E33
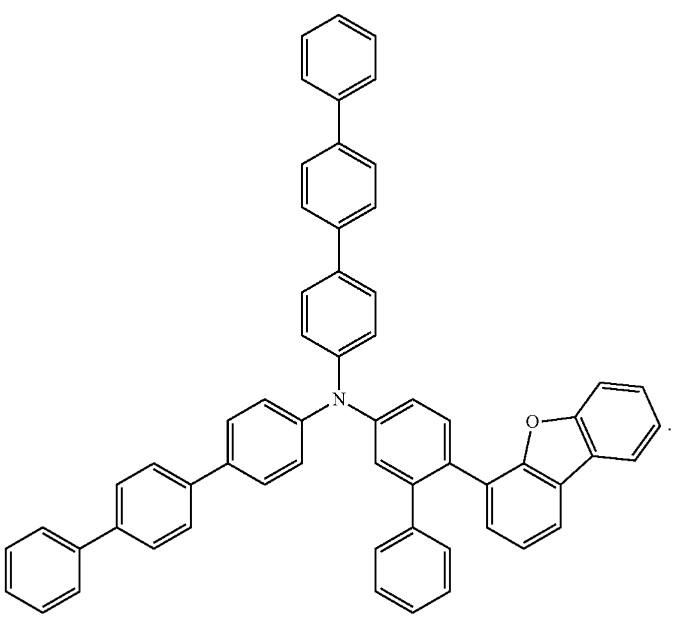

17. An organic electroluminescent device comprising a first electrode, a second electrode opposite to the first electrode, a light emitting layer interposed between the first and second electrodes, and a capping layer formed on one of the surfaces of the first and second electrodes opposite to the light emitting layer, wherein the light emitting layer comprises a compound represented by Formula A-3 and the capping layer comprises a compound represented by Formula B:

[Formula A-3]

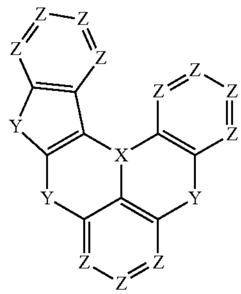

wherein each Z is independently CR or N, Y are identical to or different from each other and are each independently selected from the group consisting of $CR_2R_3$, Se, and $SiR_4R_5$, X is selected from the group consisting of B, P, P═S, and P═O, and R, $R_2$ to $R_5$ are identical to or different from each other and are independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that R are optionally bonded to each other or are optionally linked to other adjacent R to form alicyclic or aromatic monocyclic or polycyclic rings whose carbon atoms are optionally substituted with one or more heteroatoms selected from the group consisting of N, S, and O atoms, and

[Formula B]

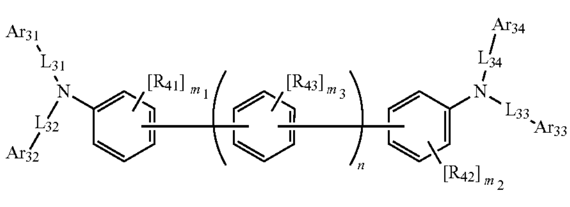

wherein $R_{41}$ to $R_{43}$ are identical to or different from each other and are each independently selected from the group consisting of hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from the group consisting of substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from the group consisting of substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

18. The organic electroluminescent device according to claim 17, wherein at least one of $Ar_{31}$ to $Ar_{34}$ in Formula B is represented by Formula C:

[Formula C]

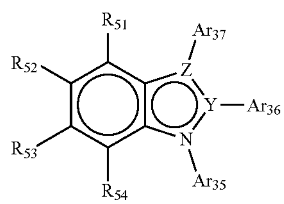

wherein $R_{51}$ to $R_{54}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from the group consisting of substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, or $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula B.

19. The organic electroluminescent device according to claim 17, wherein the compound of Formula B is selected from the group consisting of the following the compounds of Formula B1 to B79:

B1
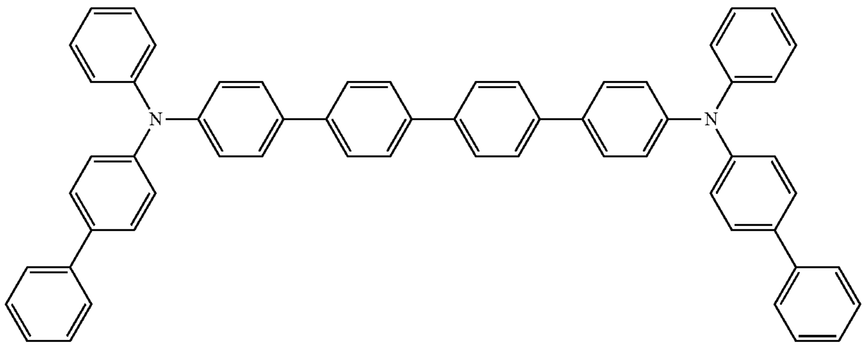
B2
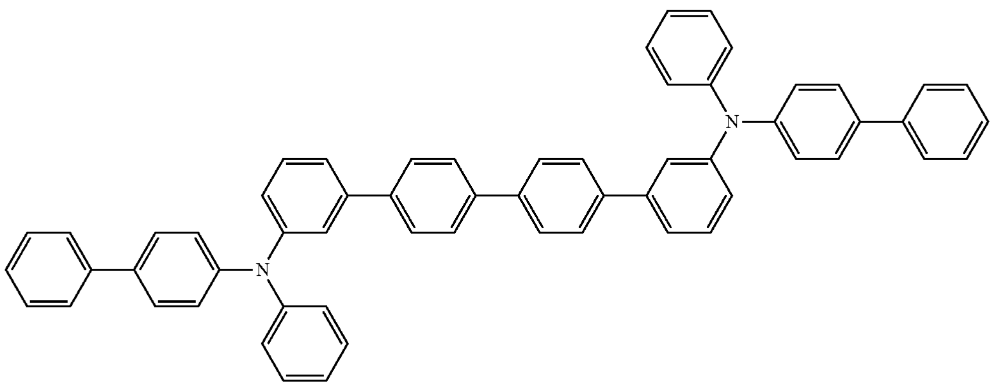
B3
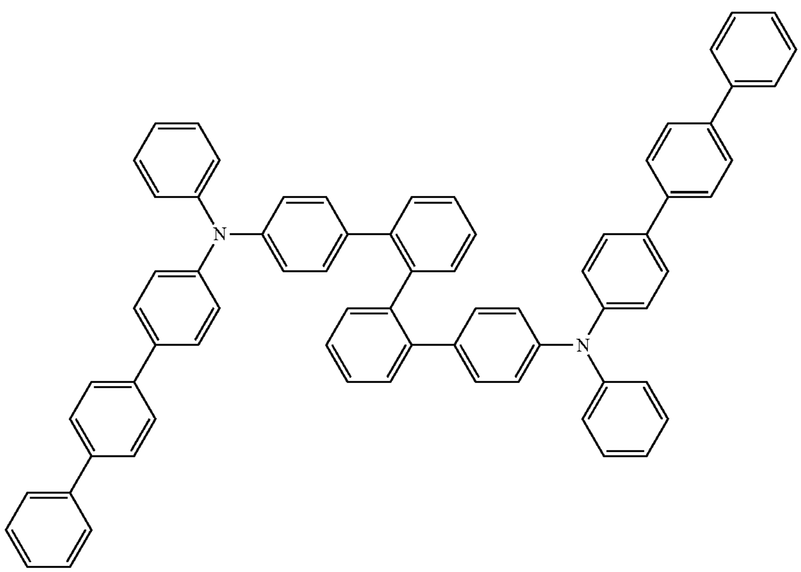
B4
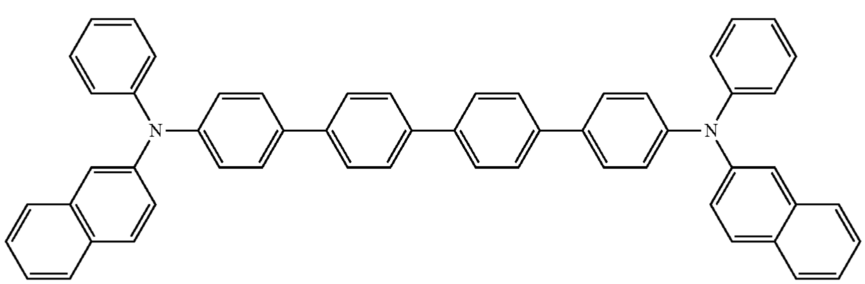

-continued
B5
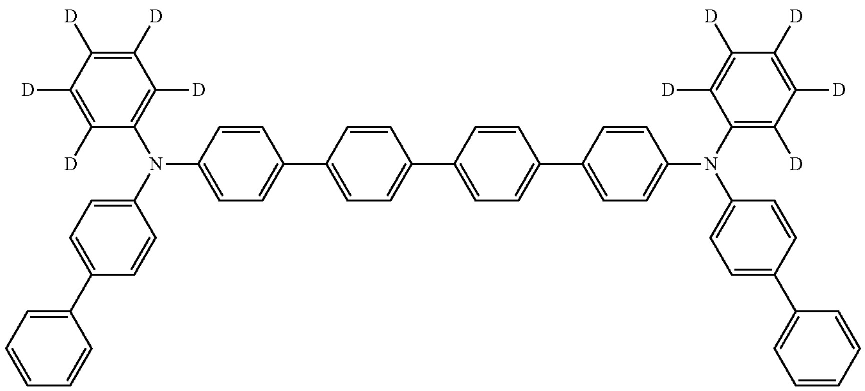
B6
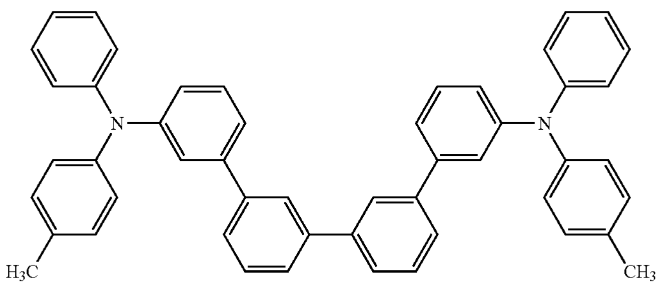
B7
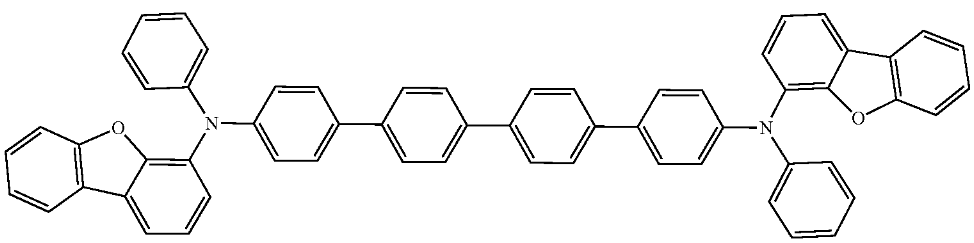
B8
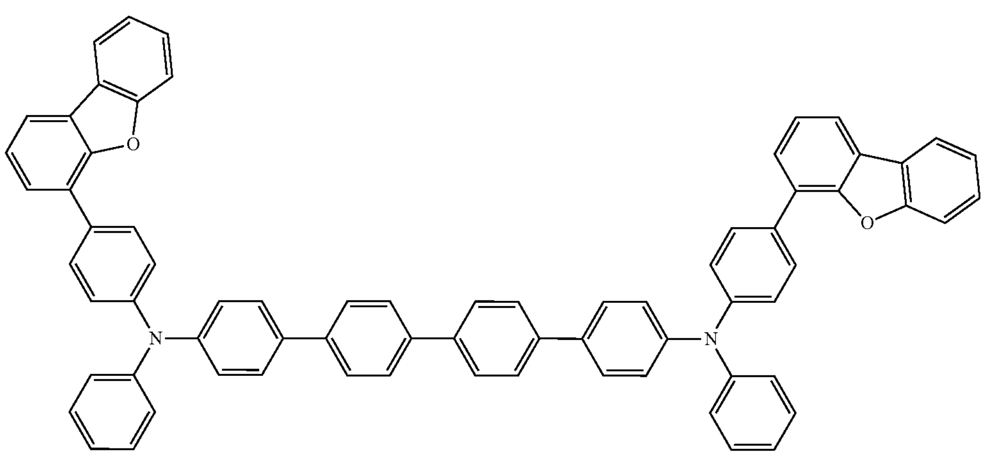

-continued
B9
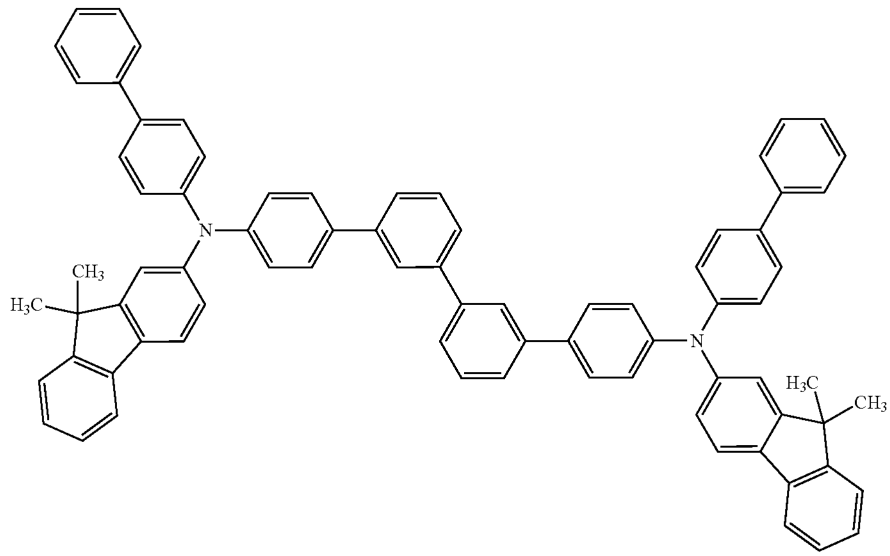
B10
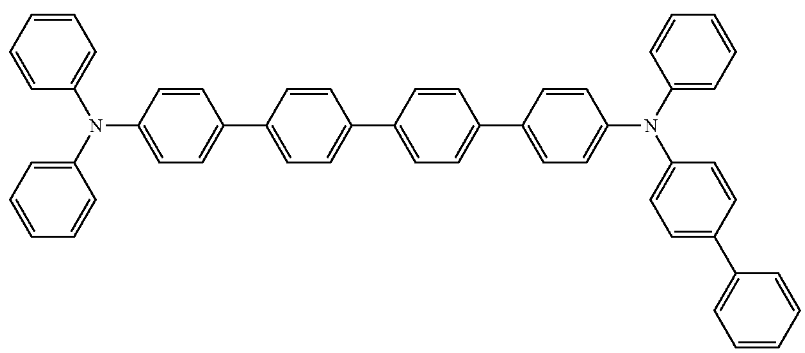
B11
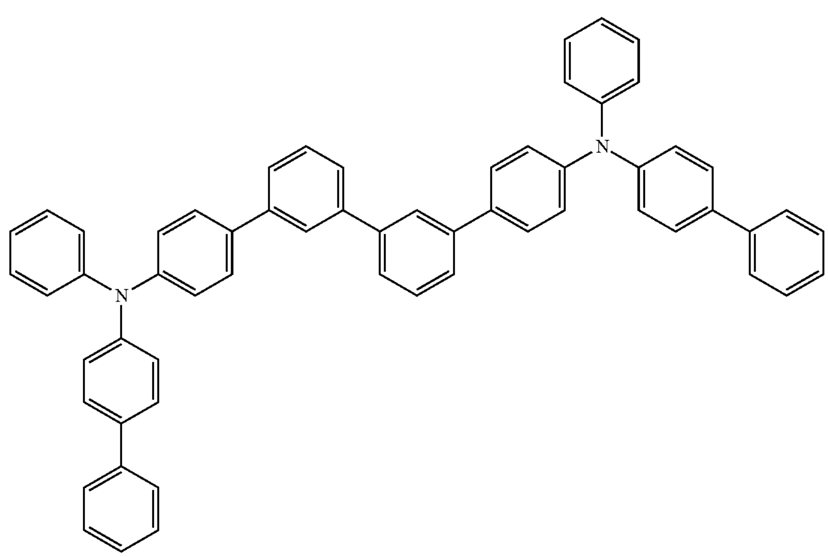

-continued
B12
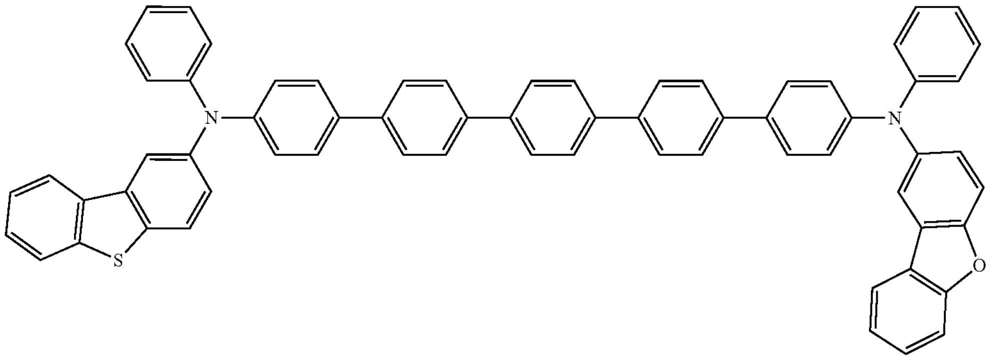
B13
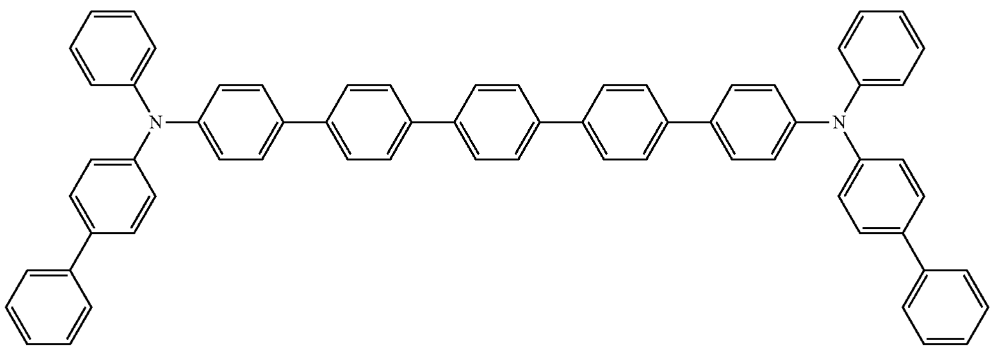
B14
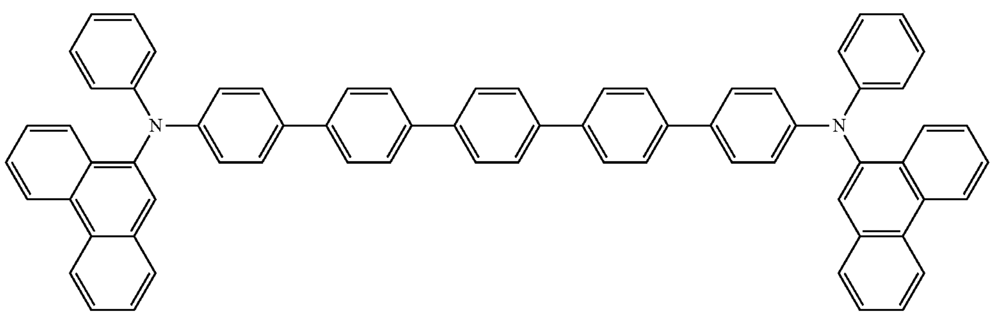
B15
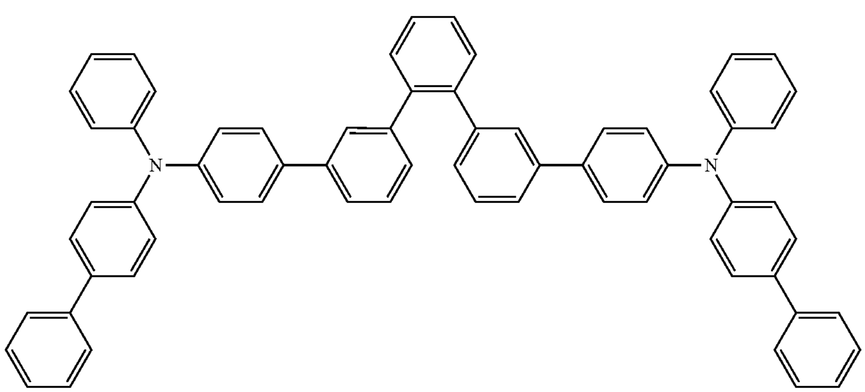

-continued
B16
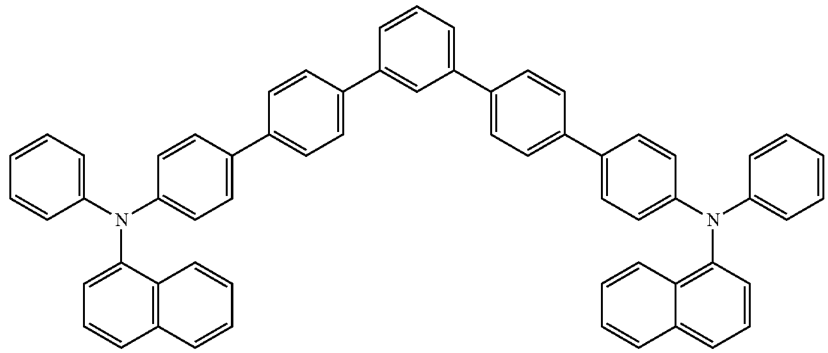
B17
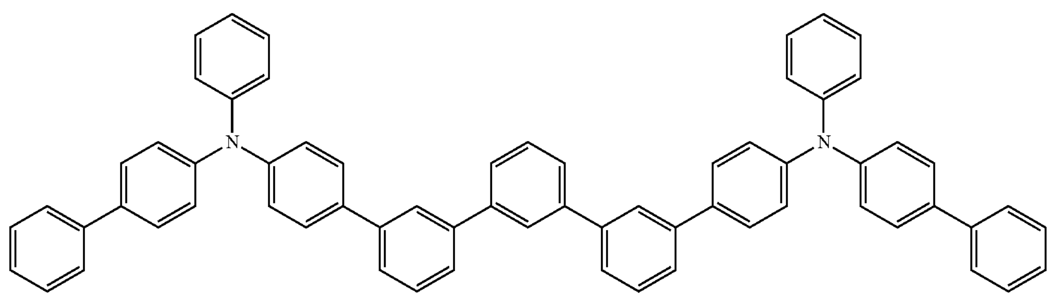
B18
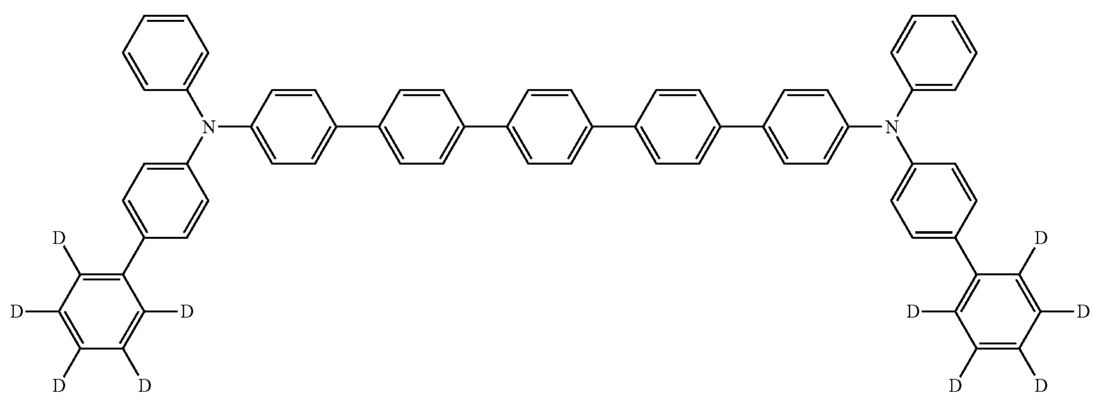
B19
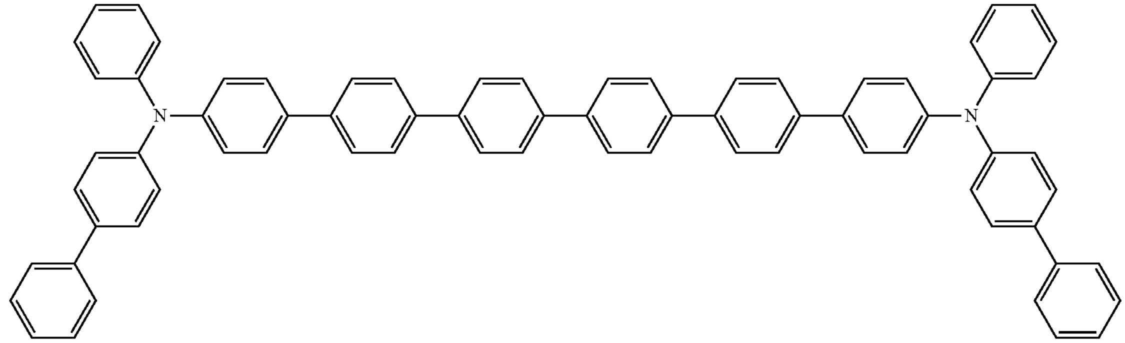

-continued
B20
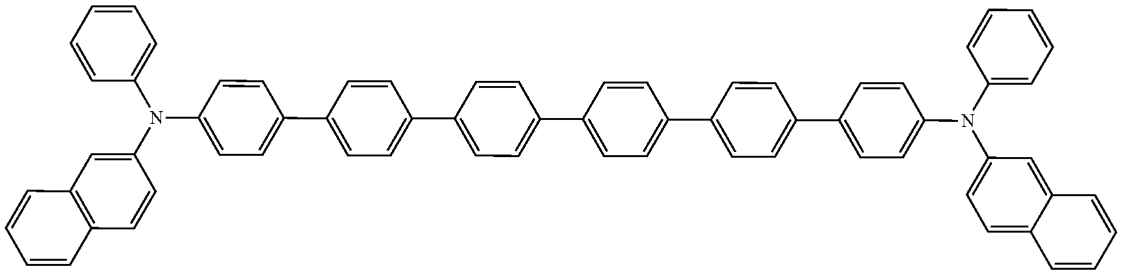
B21
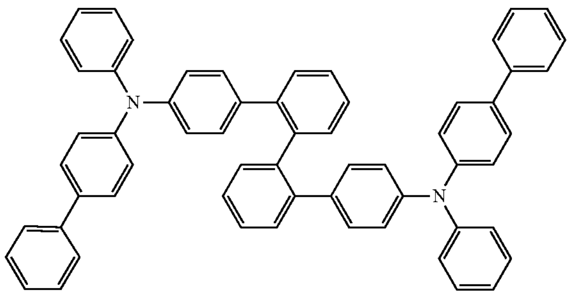
B22
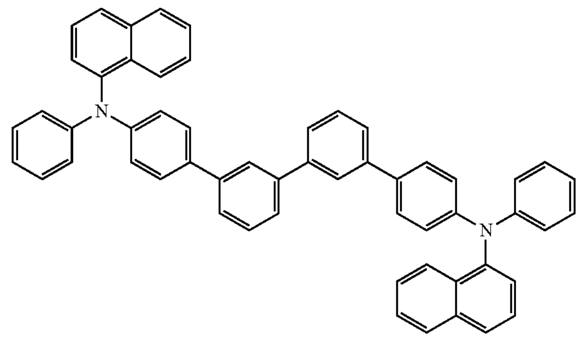
B23
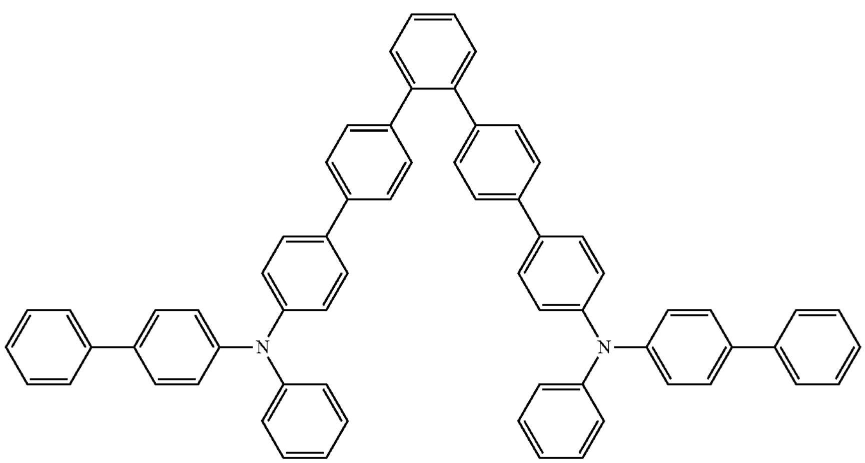
B24
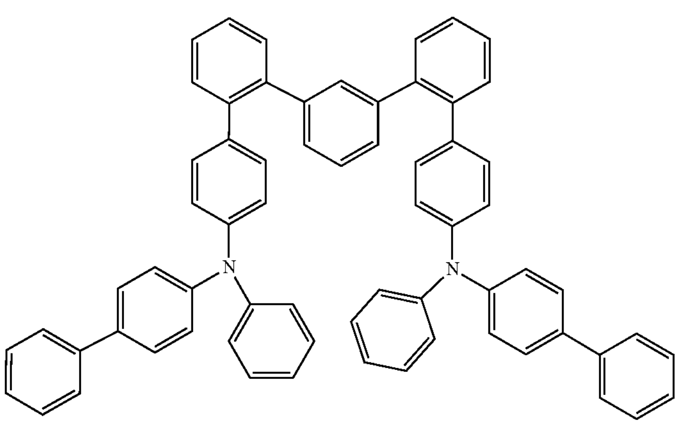

-continued
B25
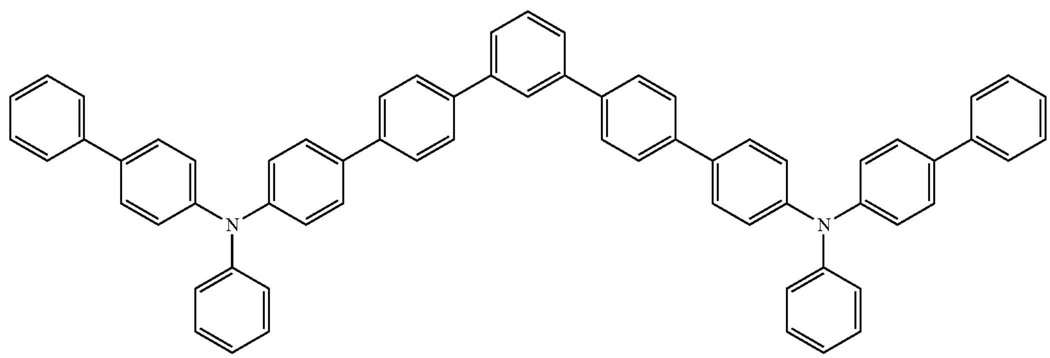
B26
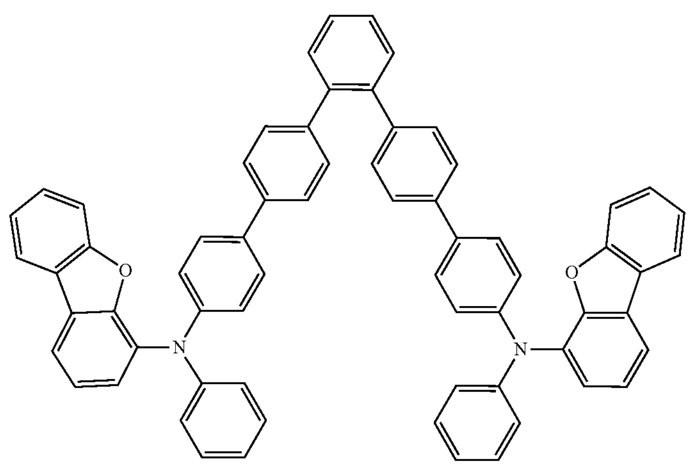
B27
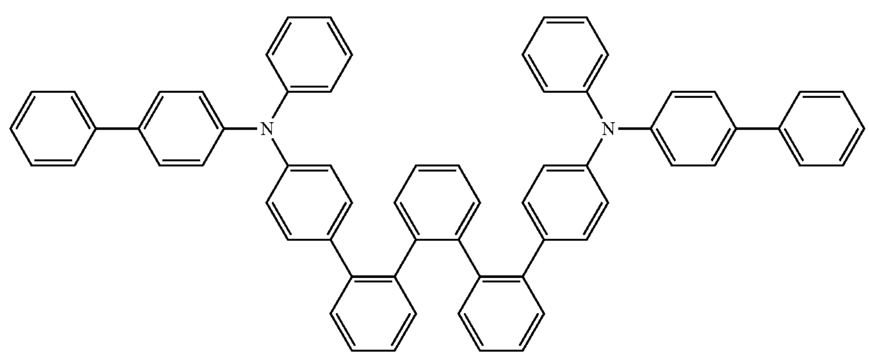
B28
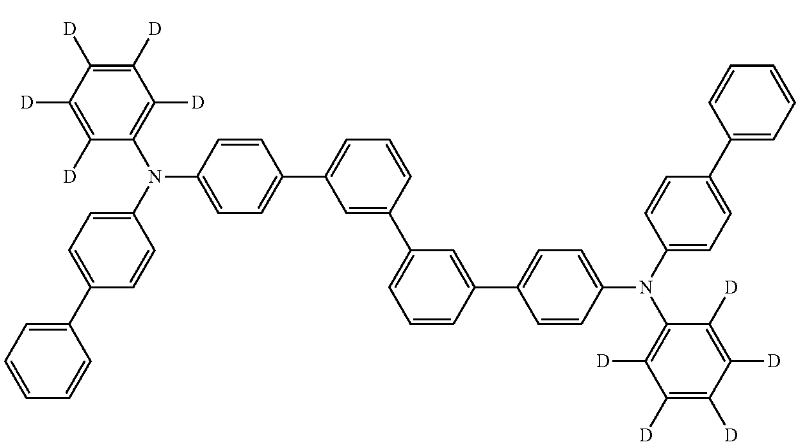

-continued
B29
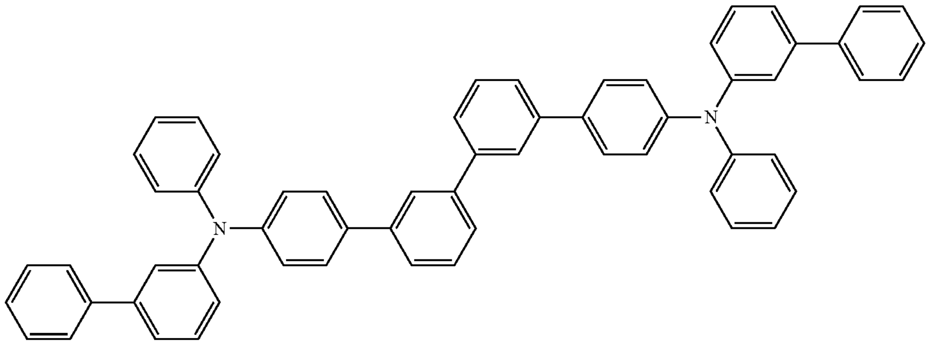
B30
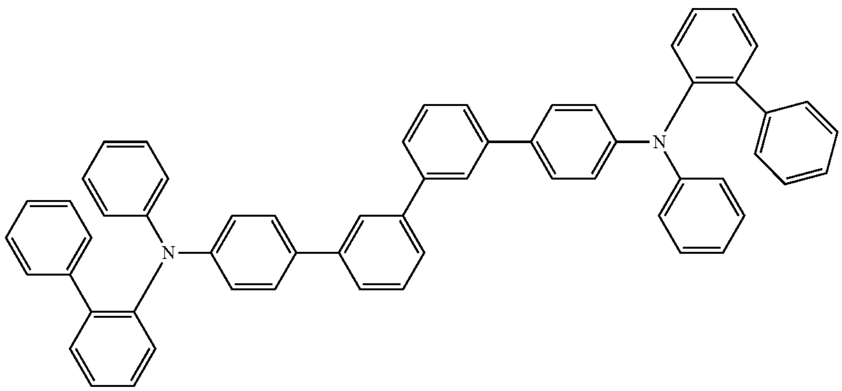
B31
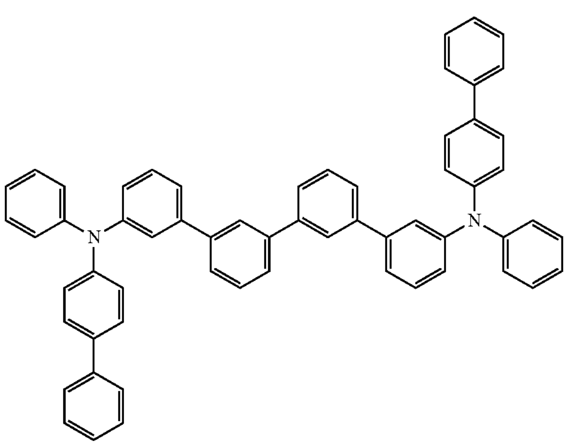
B32
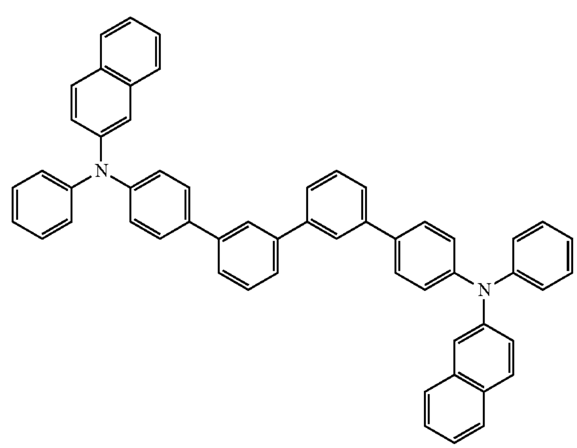
B33
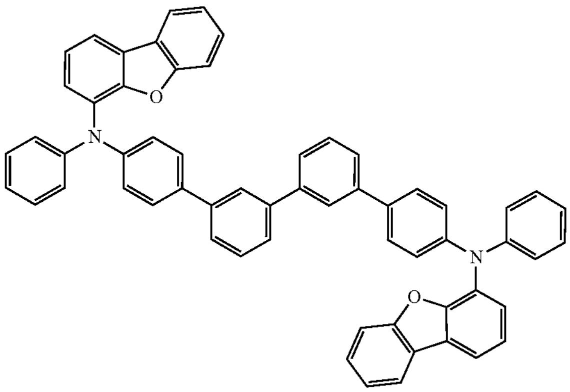
B34
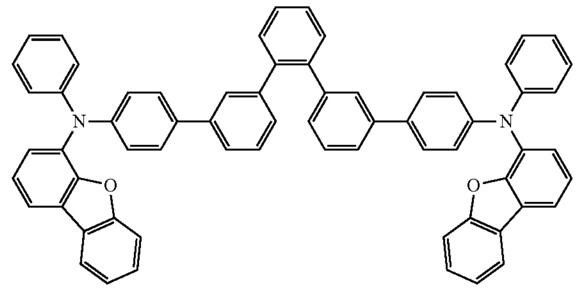

-continued
B35
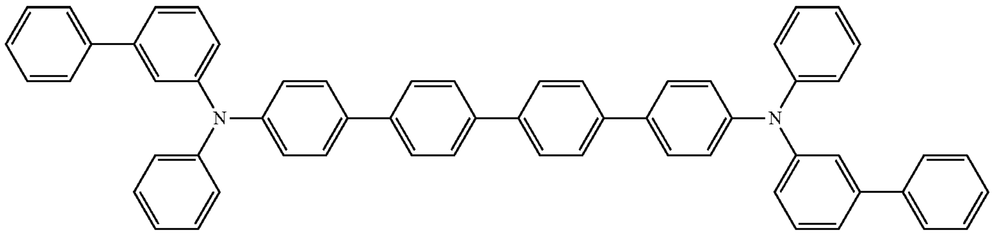
B36
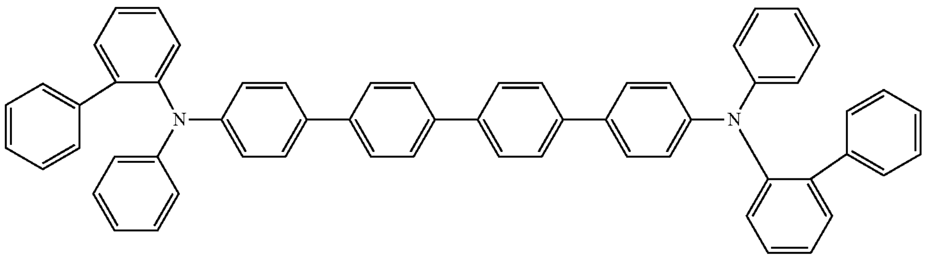
B37
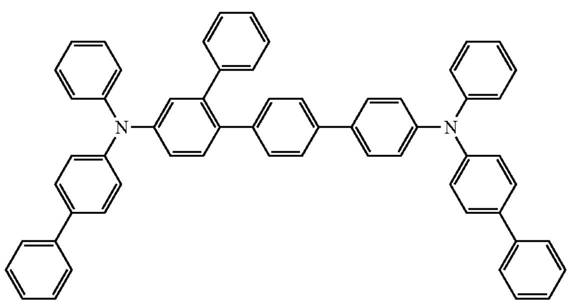
B38
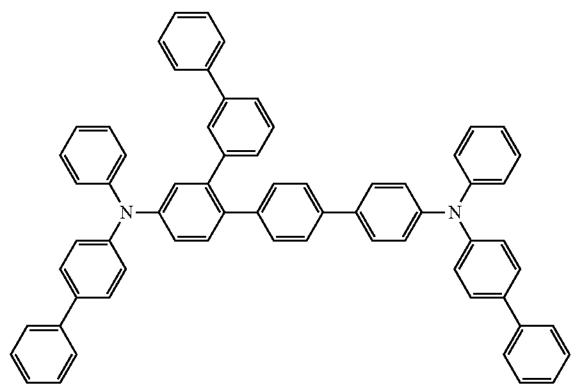
B39
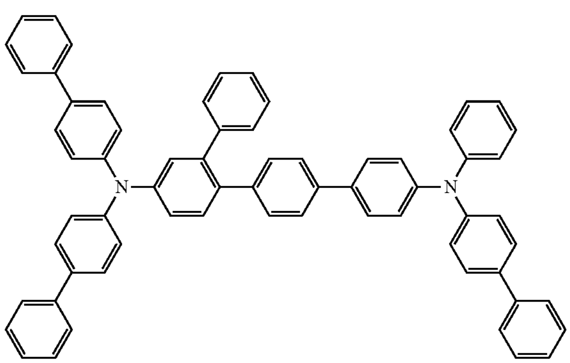
B40
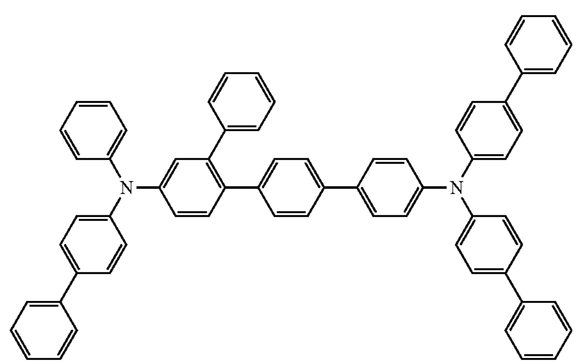
B41
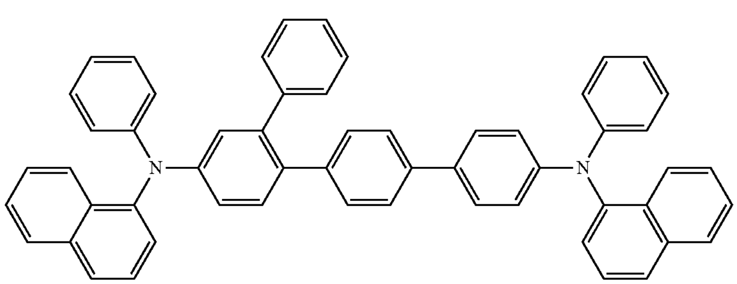

-continued
B42
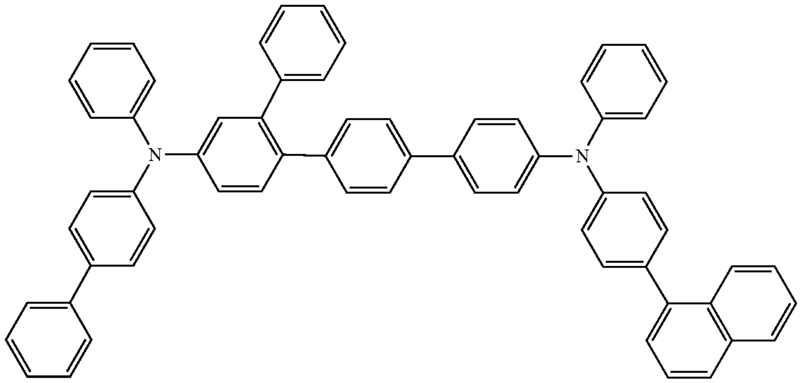
B43
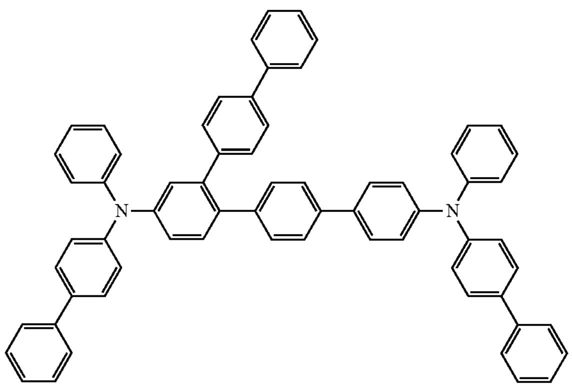
B44
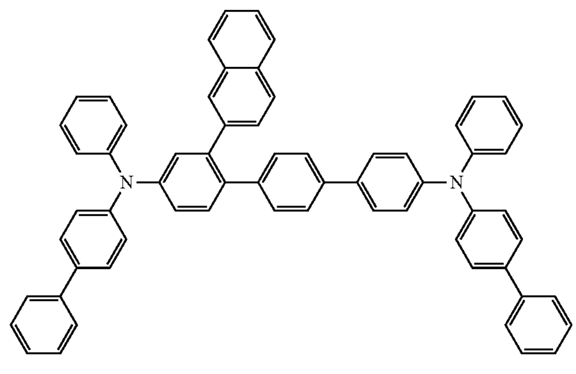
B45
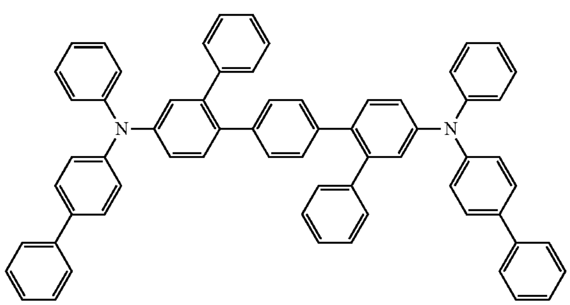
B46
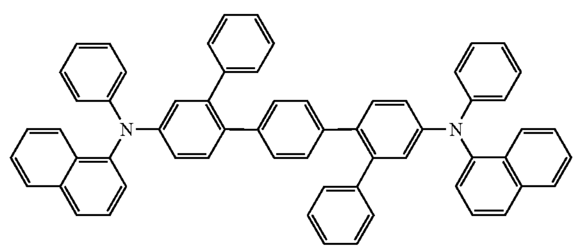
B47
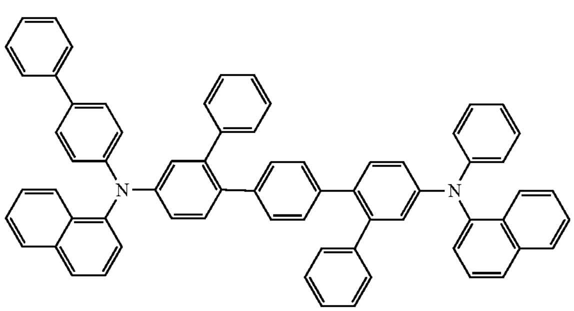
B48
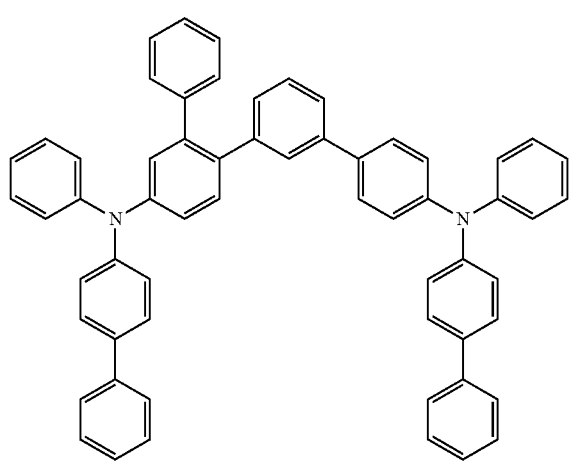

-continued
B49
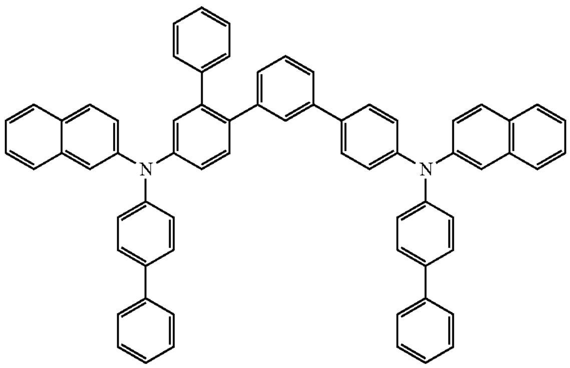
B50
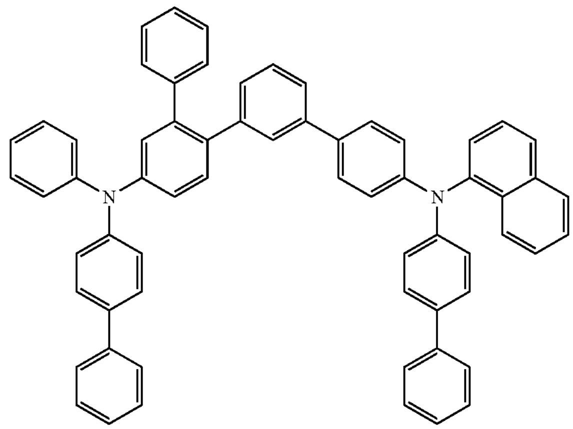
B51
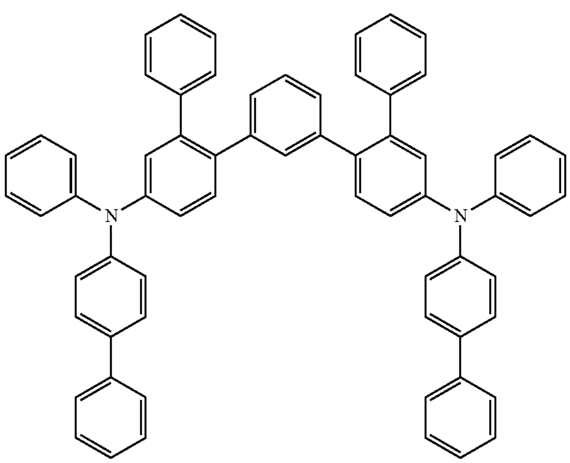
B52
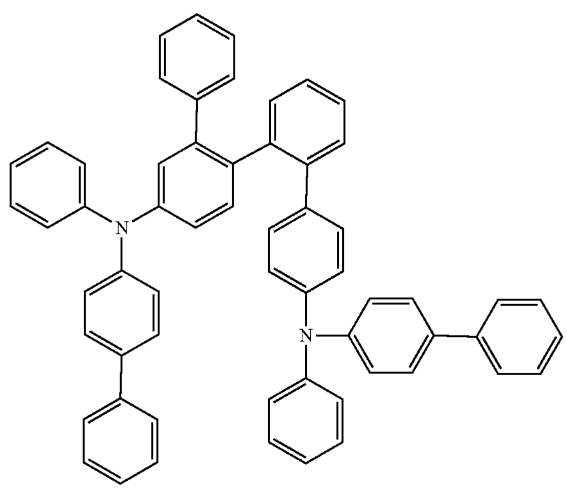
B53
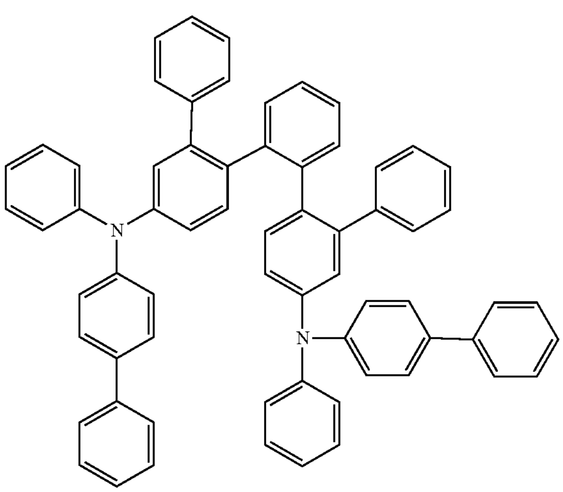

-continued
B54
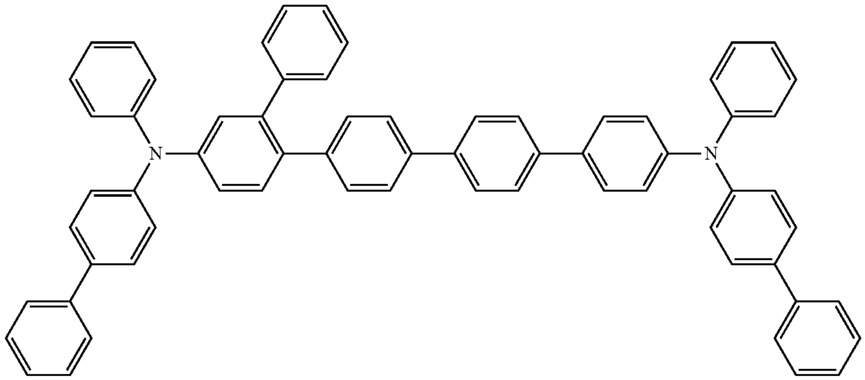
B55
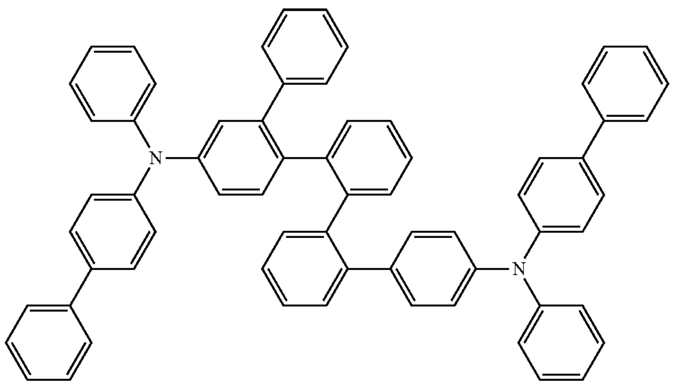
B56
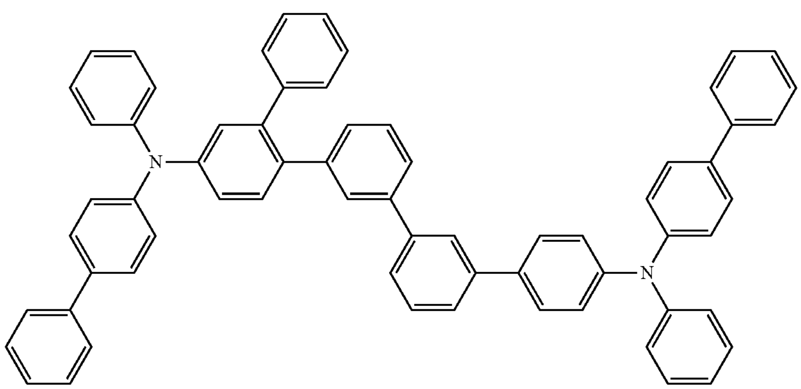
B57
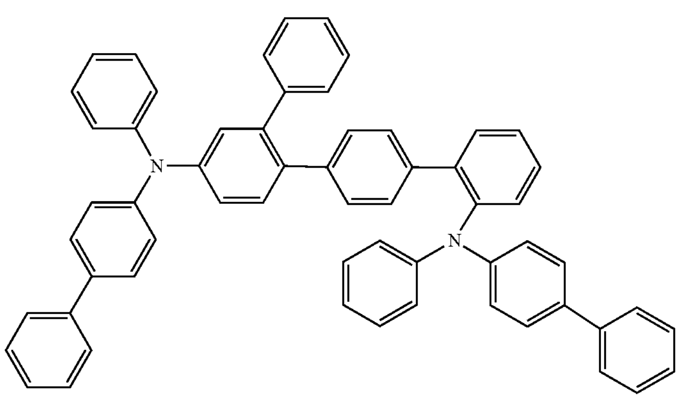

-continued
B58
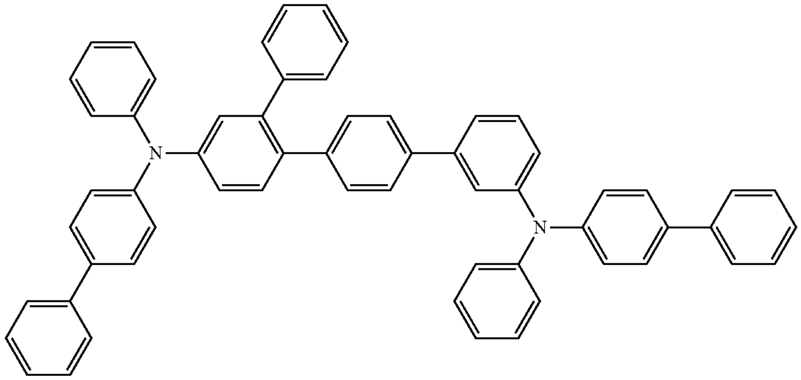
B59
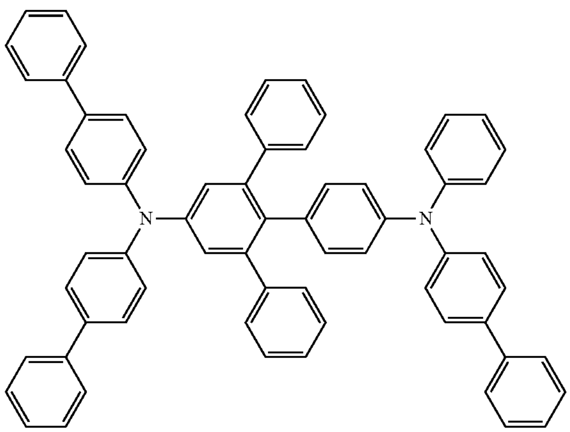
B60
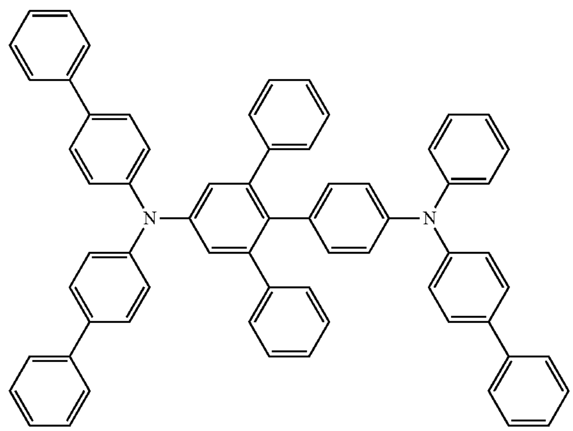
B61
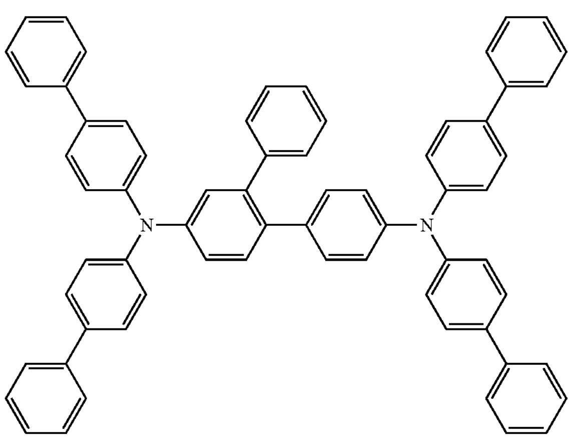
B62
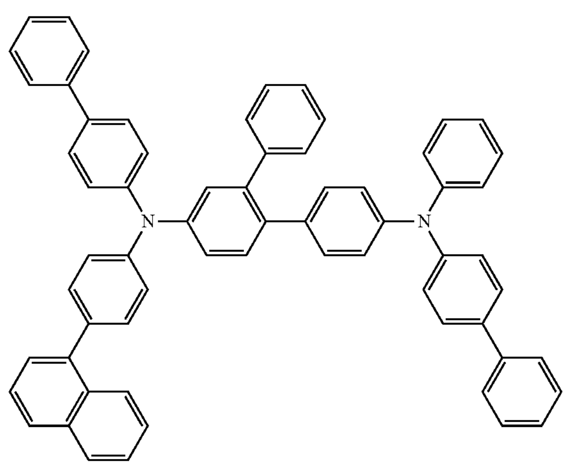

-continued
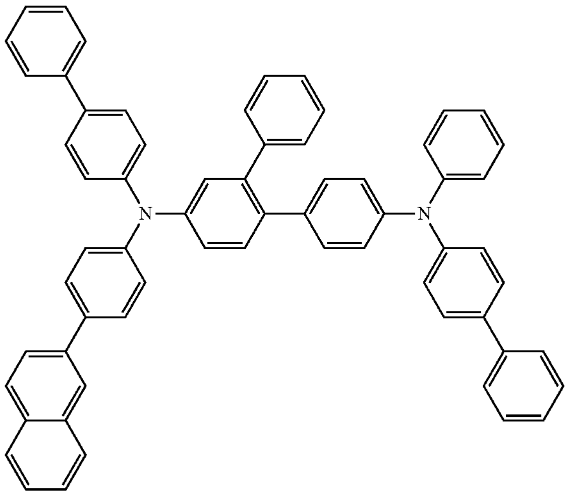
B63
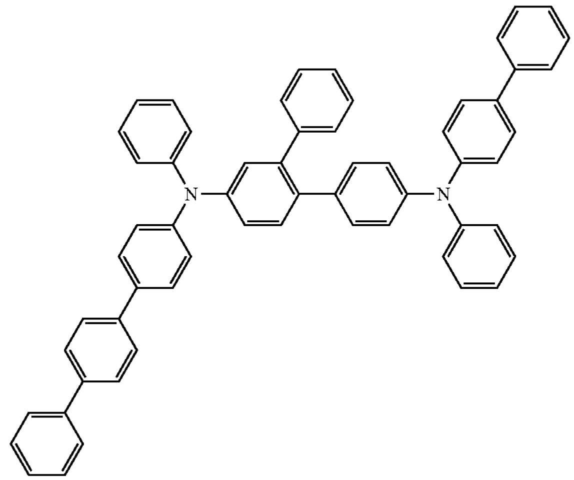
B64
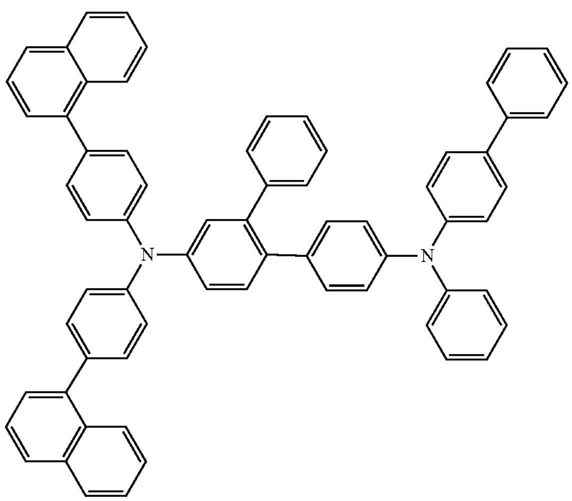
B65
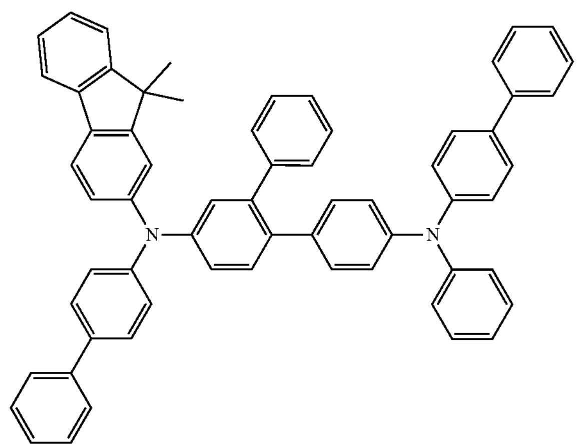
B66
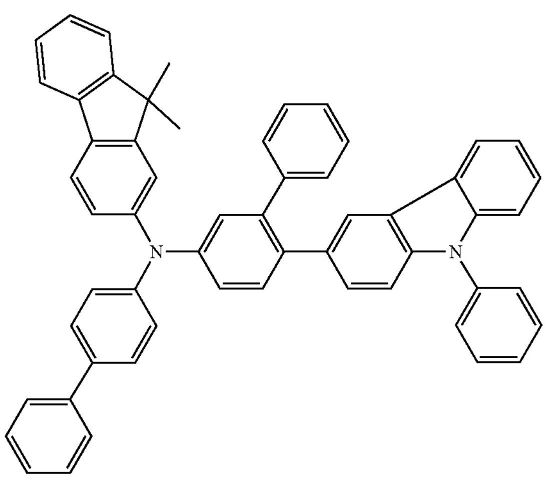
B67
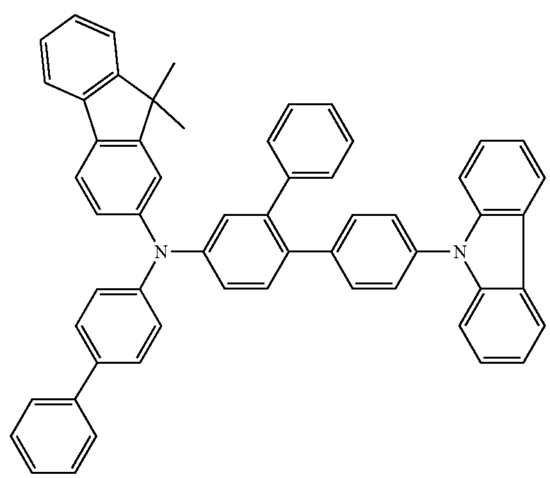
B68

-continued
B69
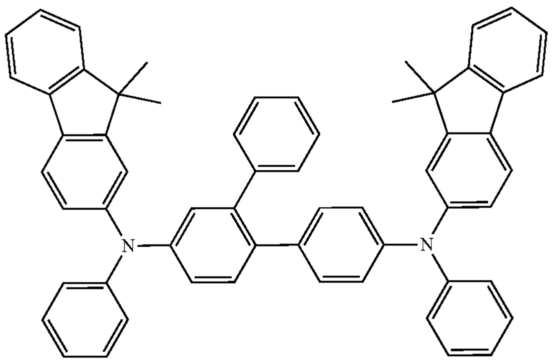
B70
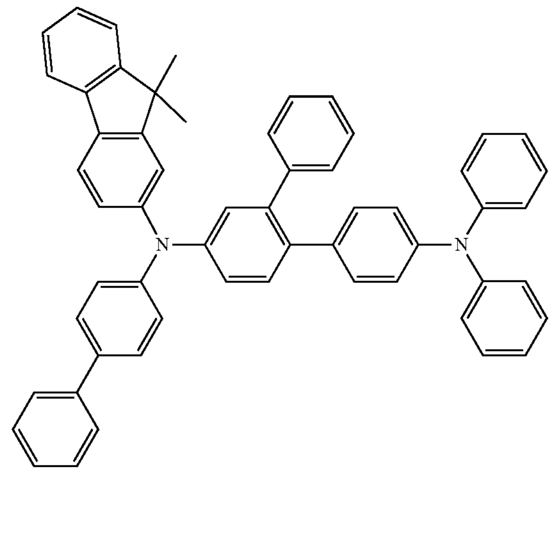
B71
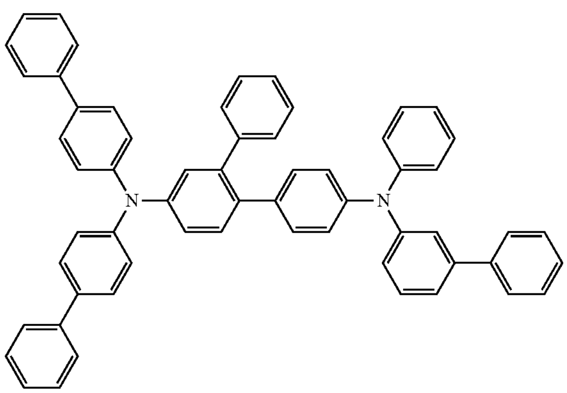
B72
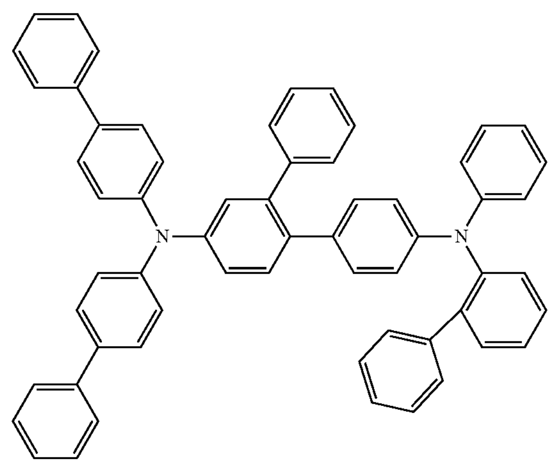
B73
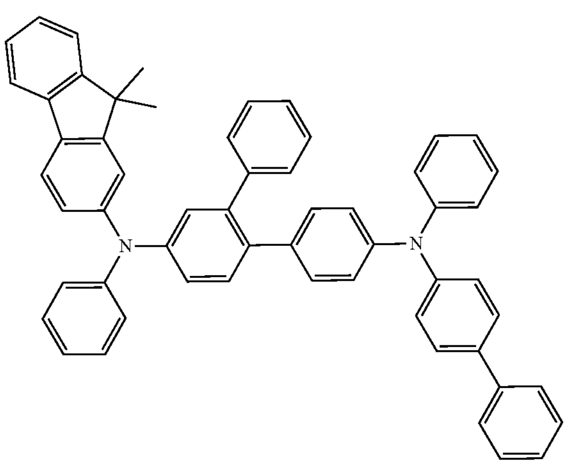
B74
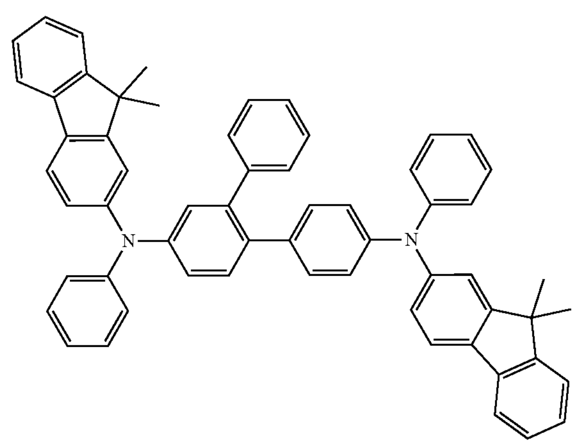

-continued
B75
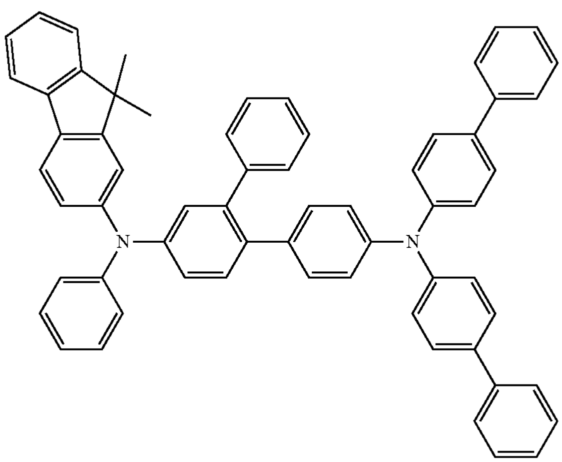
B76
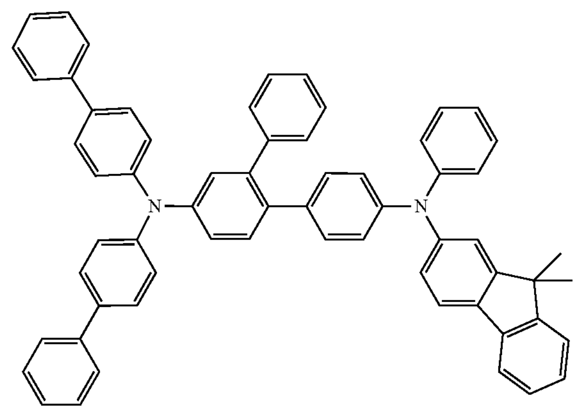
B77
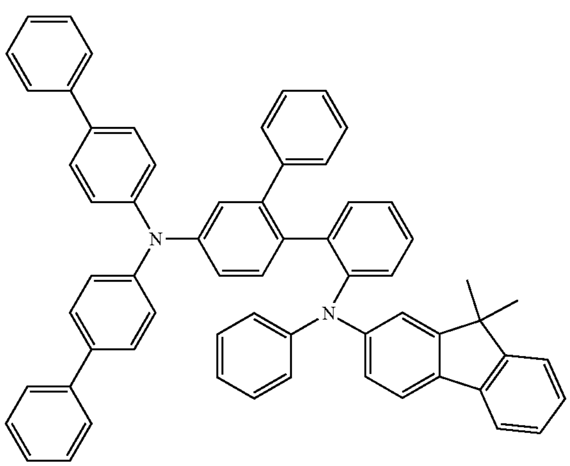
B78
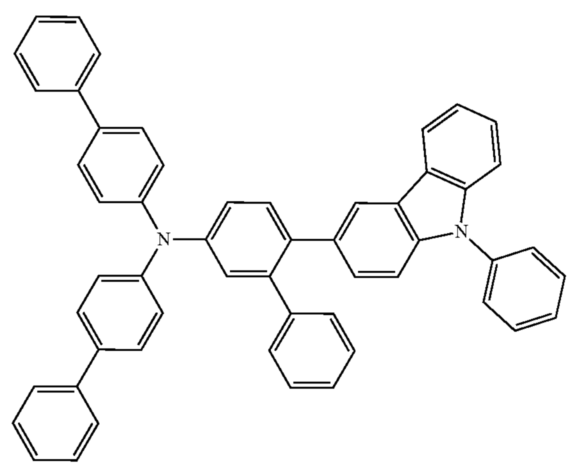
B79
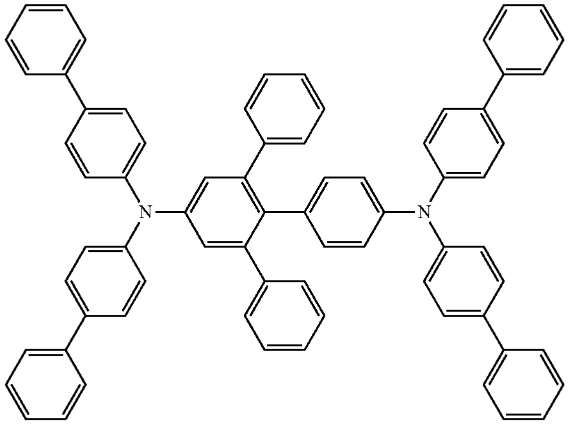

20. The organic electroluminescent device according to claim 17, wherein the compound of Formula B is selected from the group consisting of the following the compounds of Formula B101 to B145:
B101
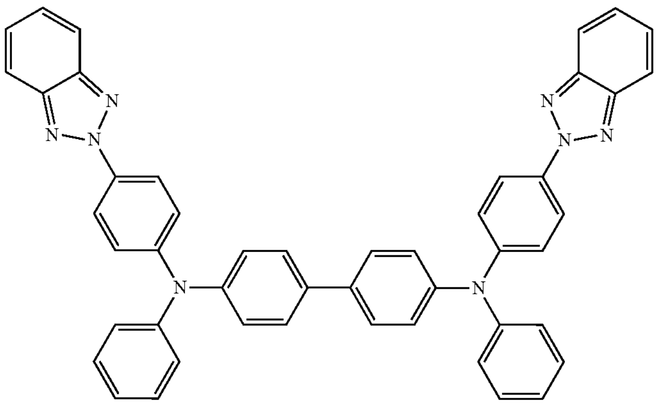
B102
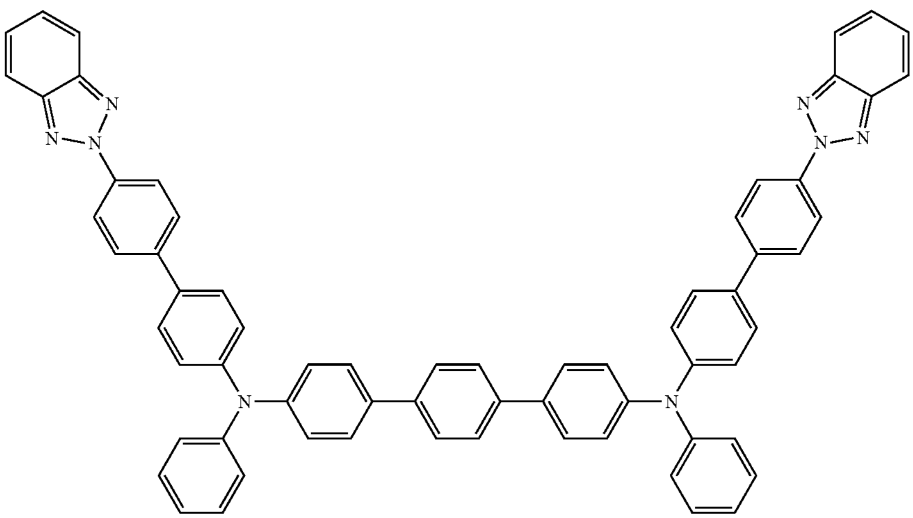
B103
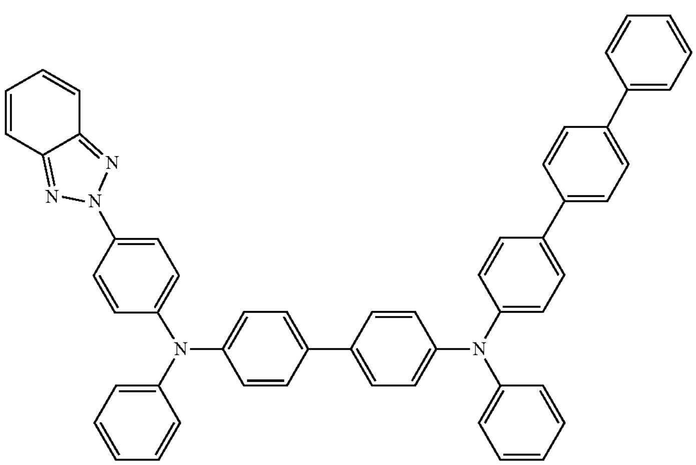

-continued
B104
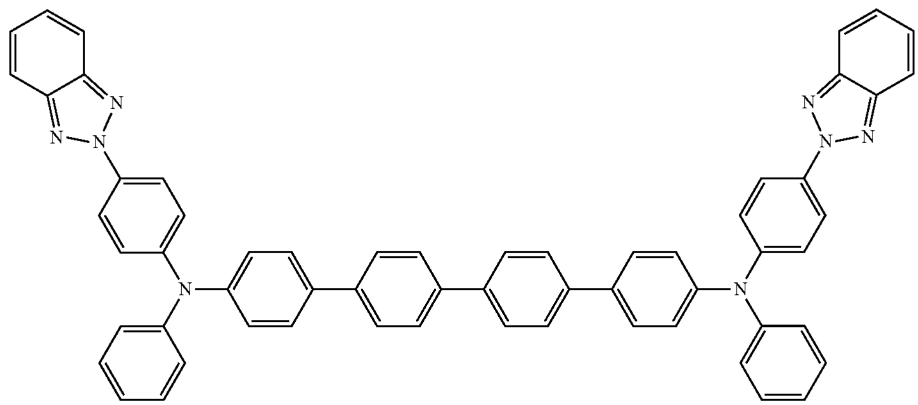
B105
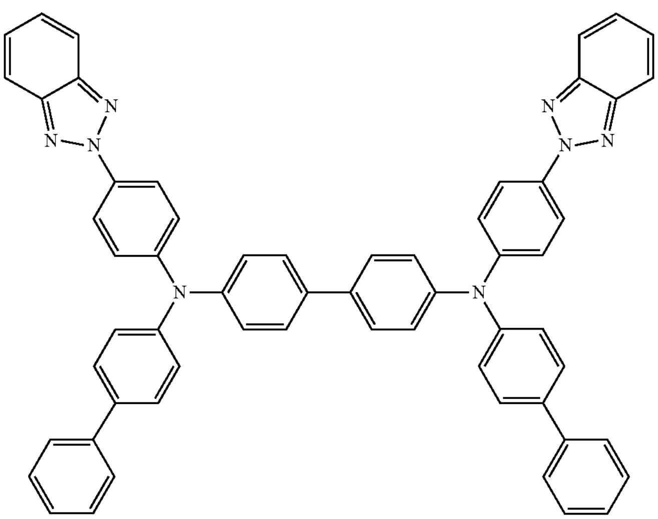
B106
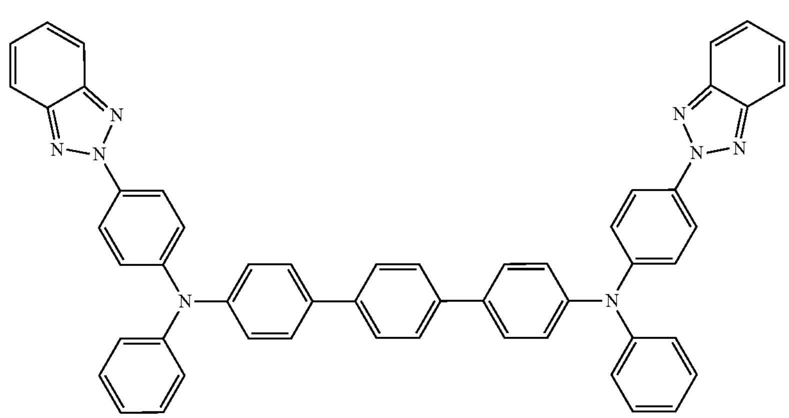

-continued
B107
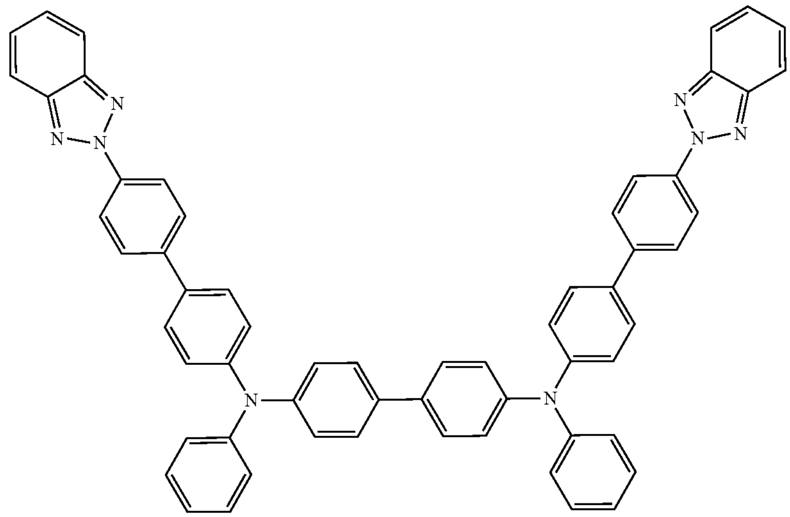
B108
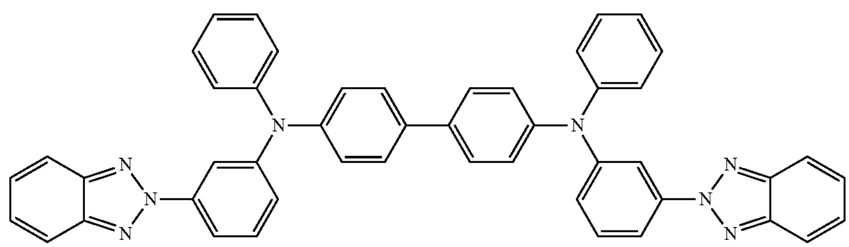
B109
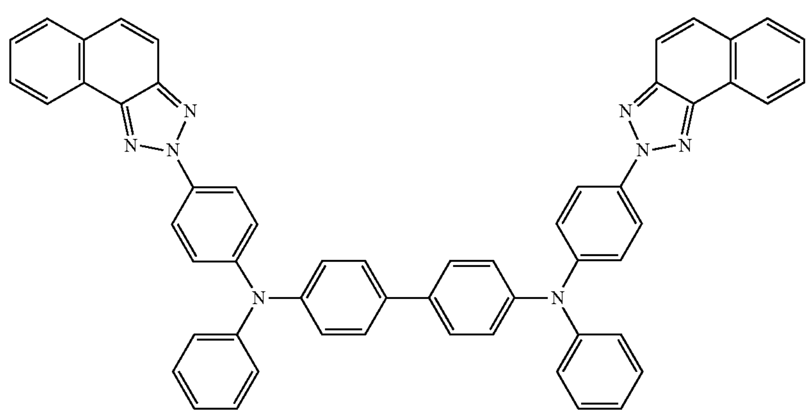
B110
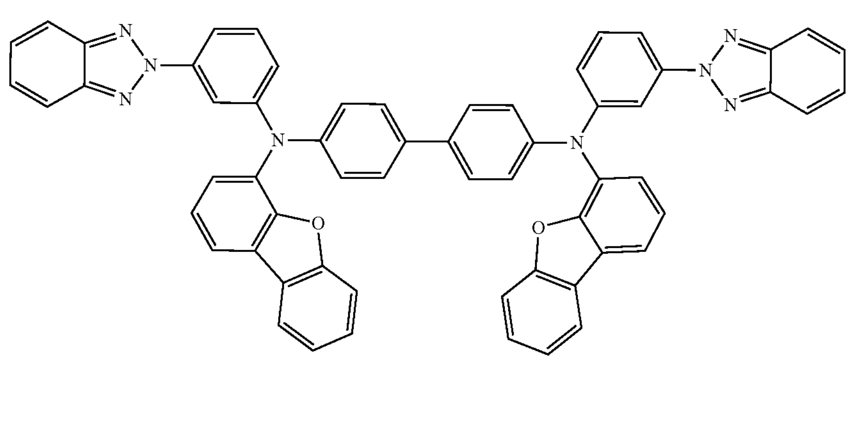

-continued
B111
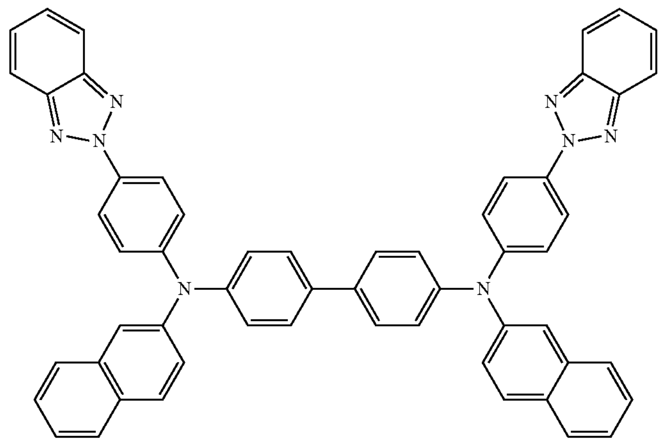
B112
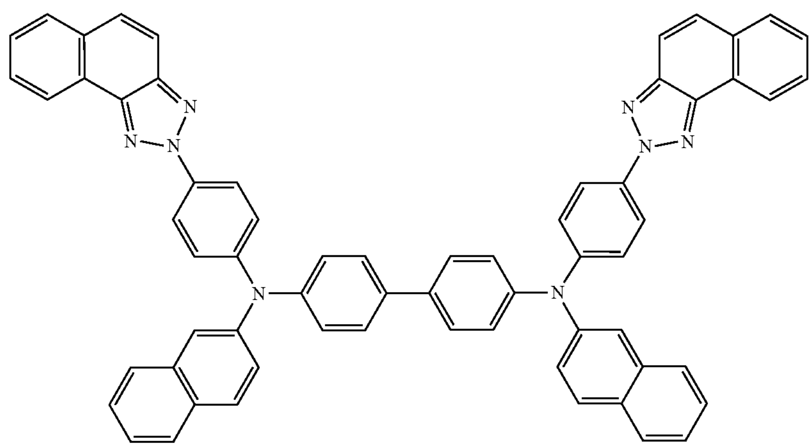
B113
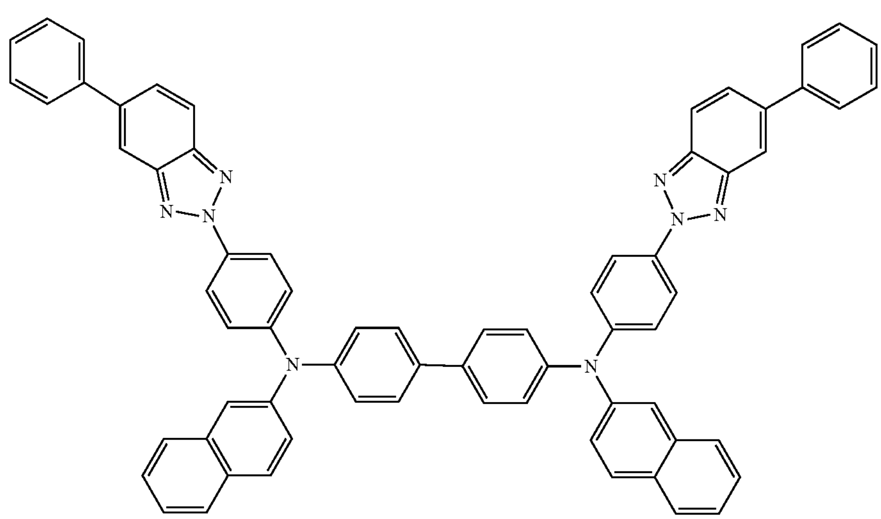

-continued
B114
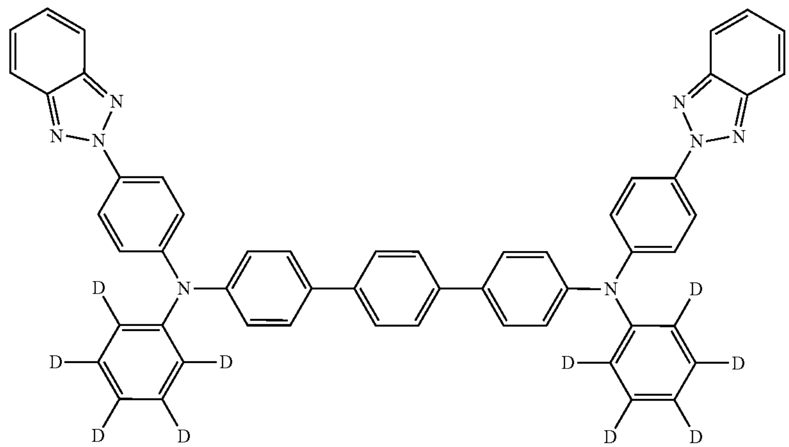
B115
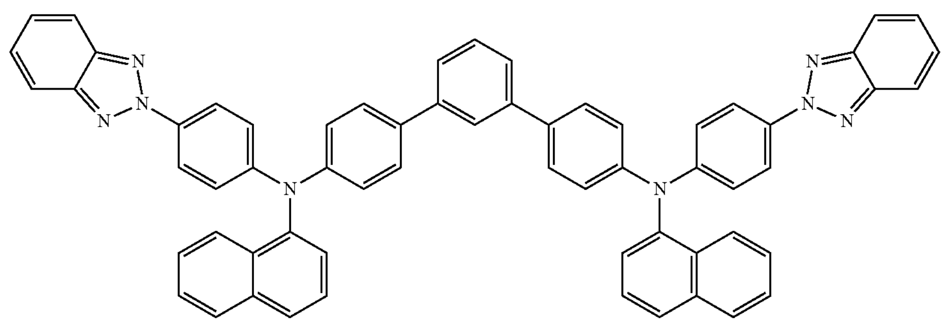
B116
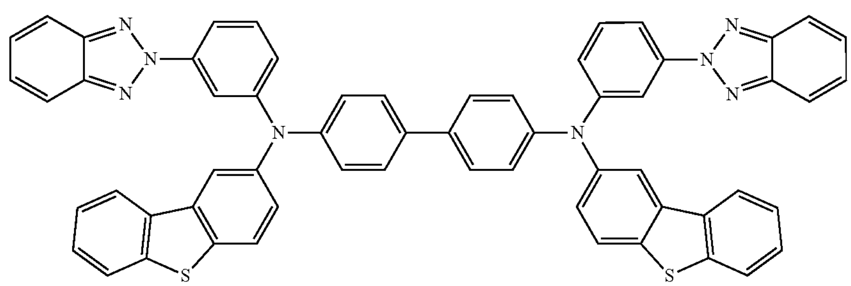
B117
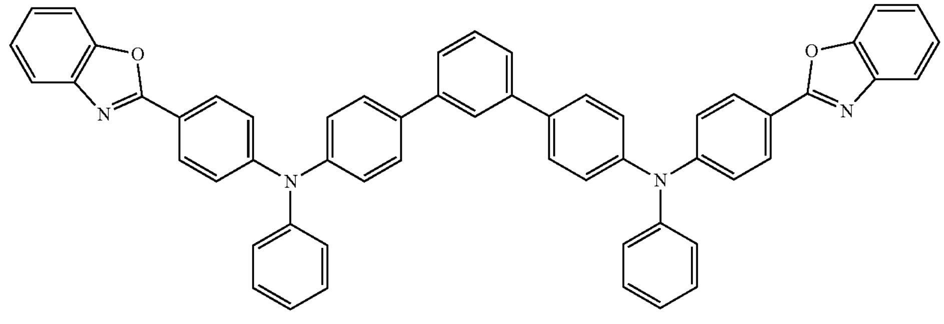

-continued
B118
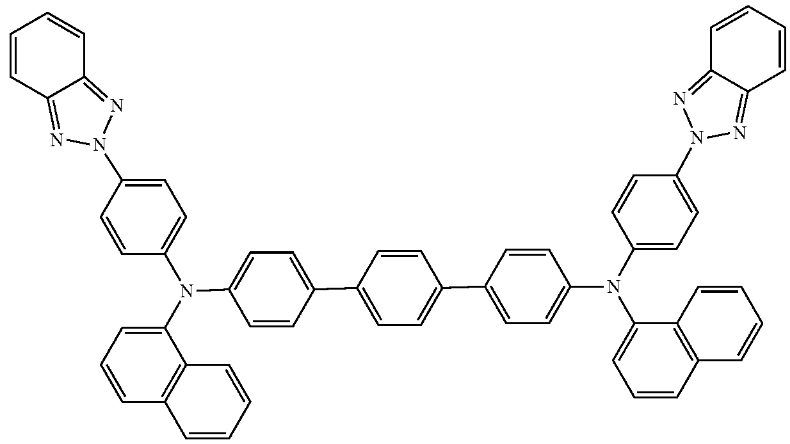
B119
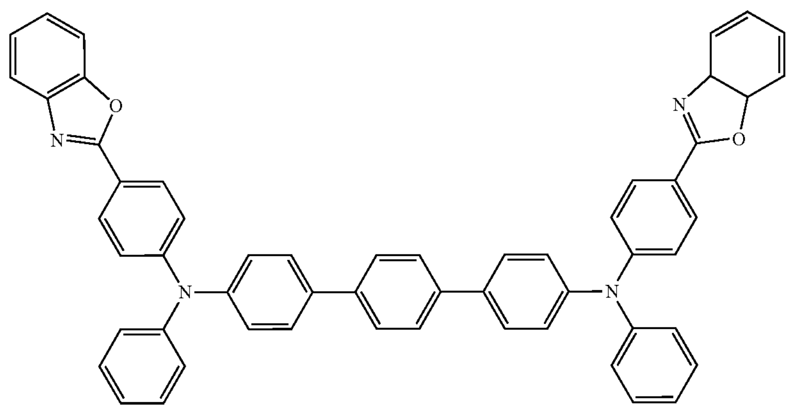
B120
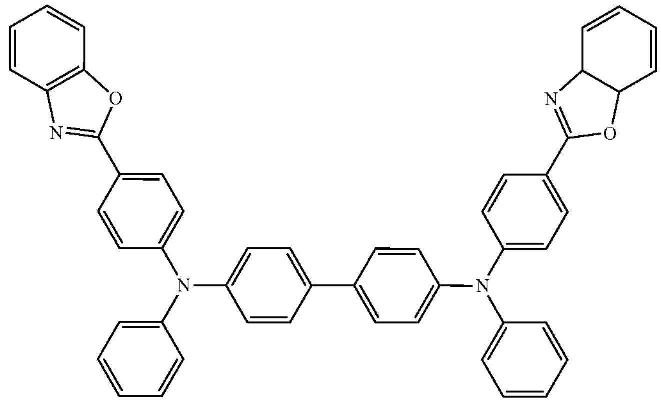

-continued
B121
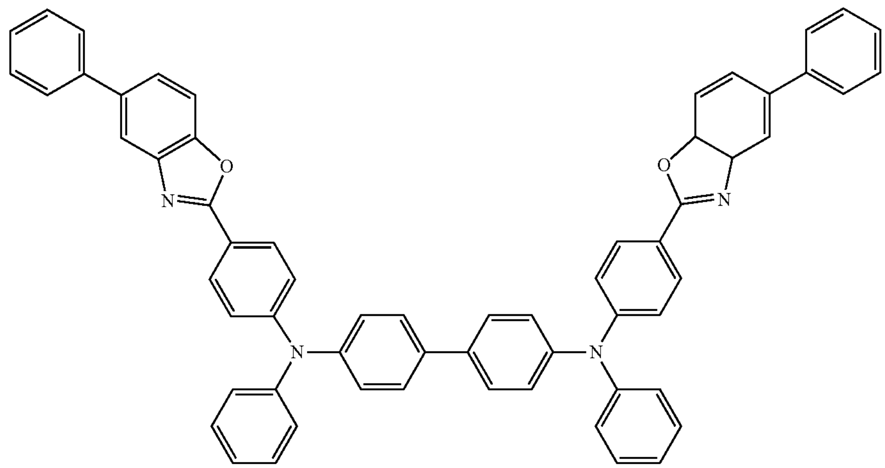
B122
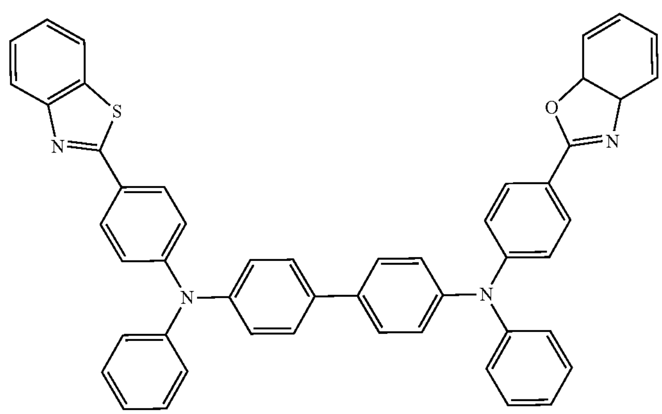
B123
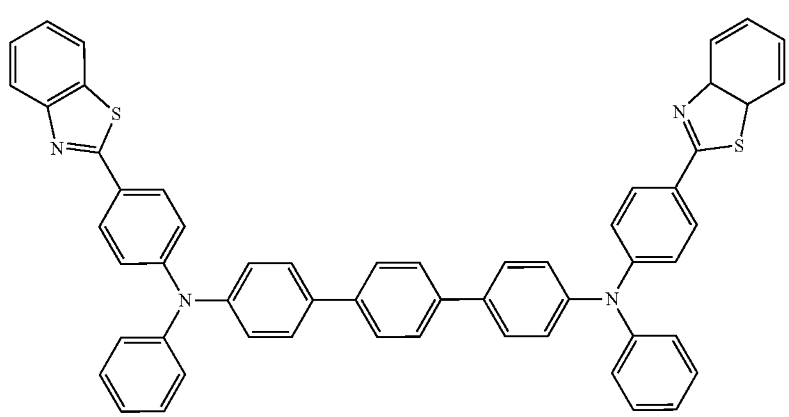

-continued
B124
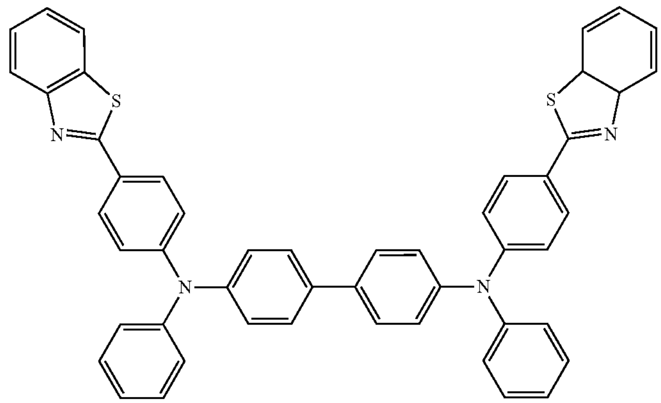
B125
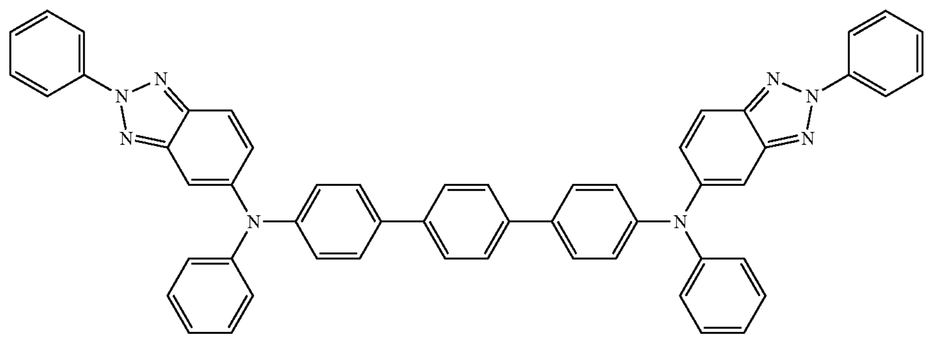
B126
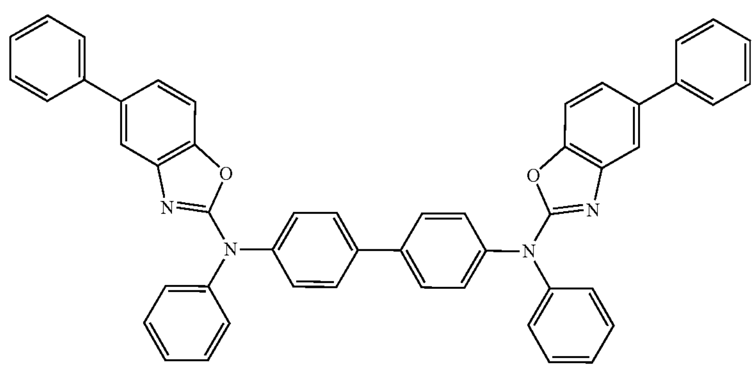
B127
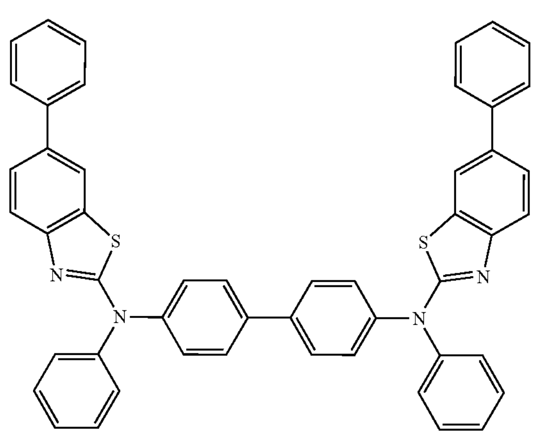

-continued
B128
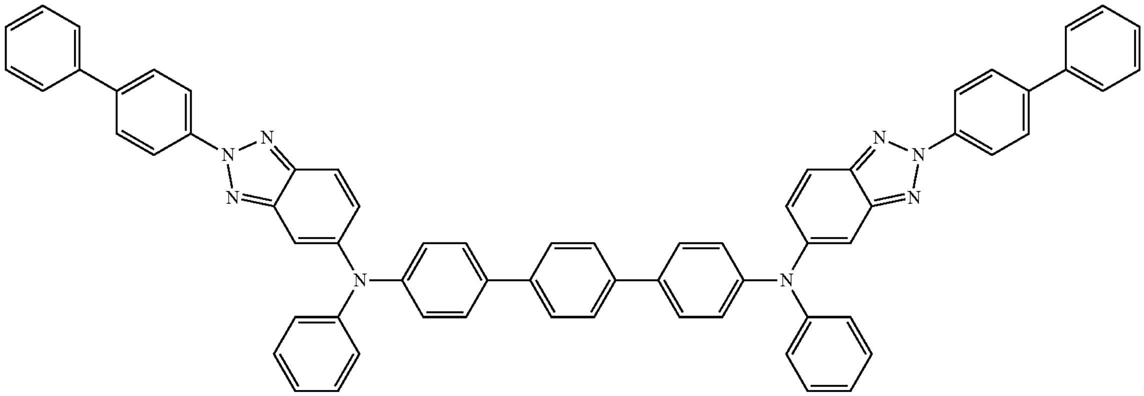
B129
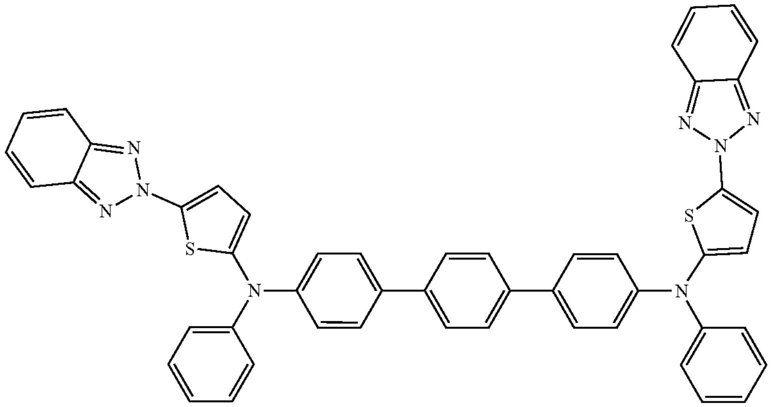
B130
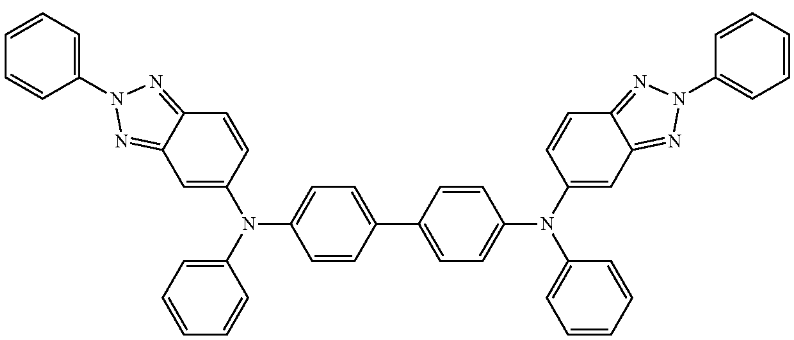
B131
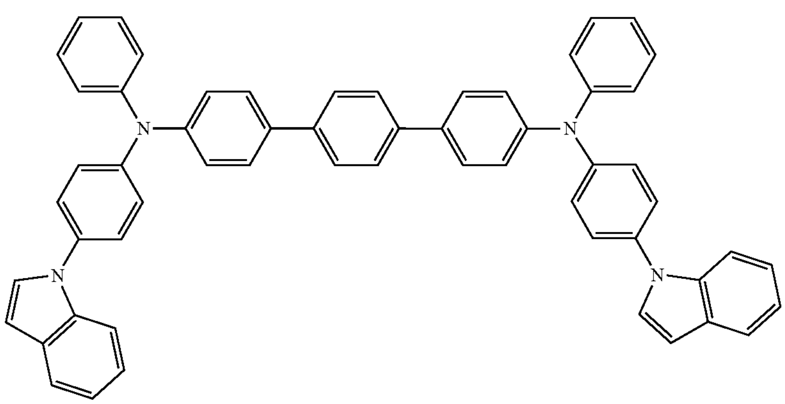

-continued
B132
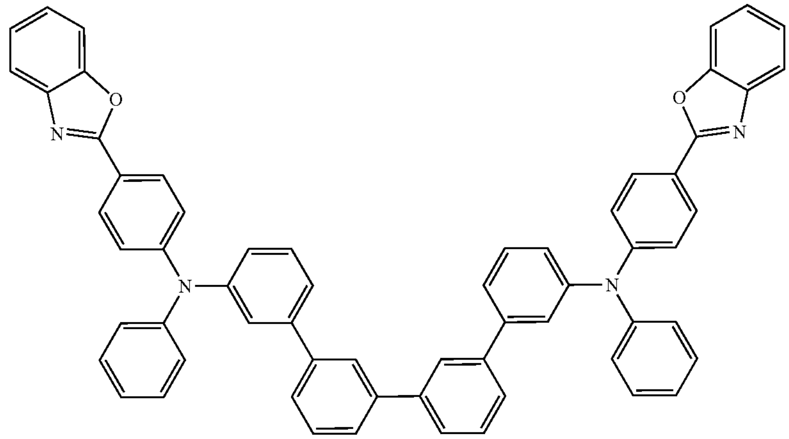
B133
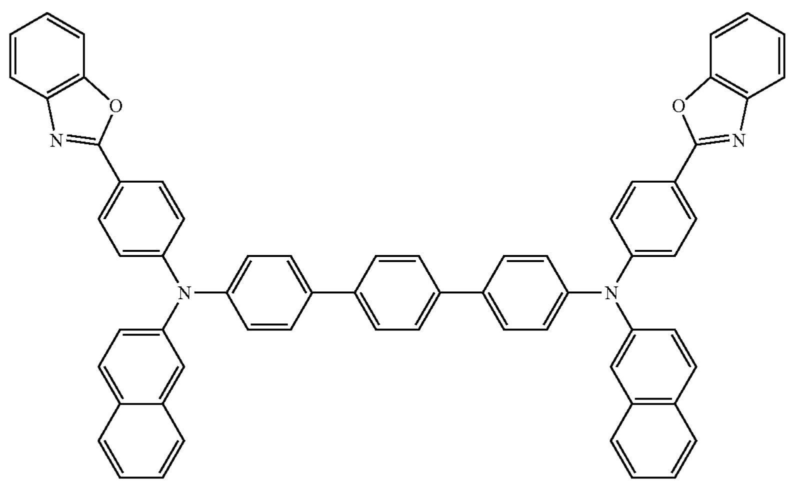
B134
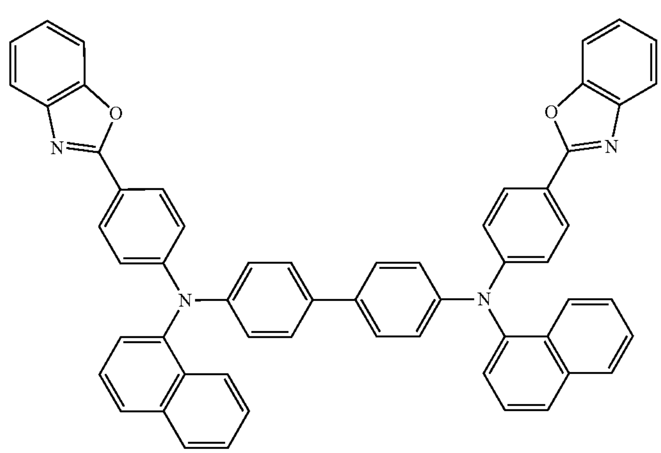

-continued
B135
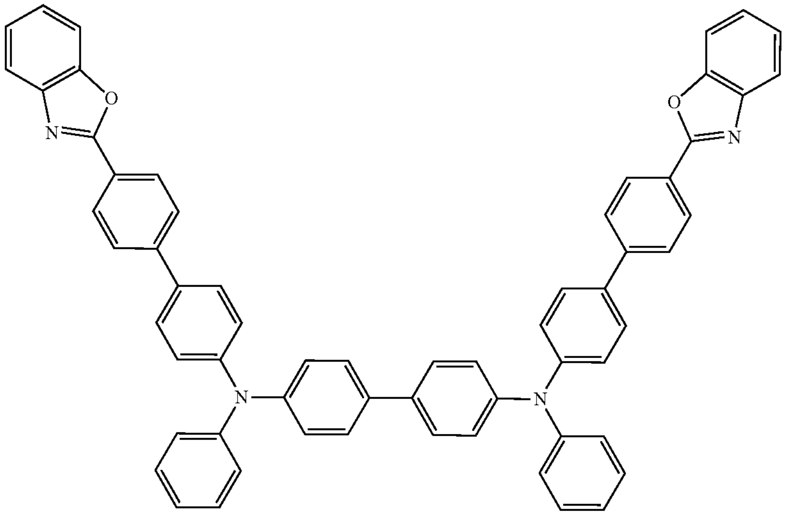
B136
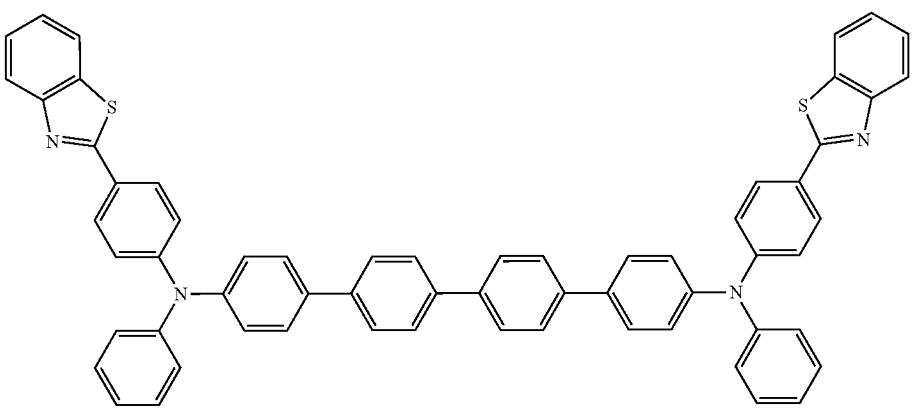
B137
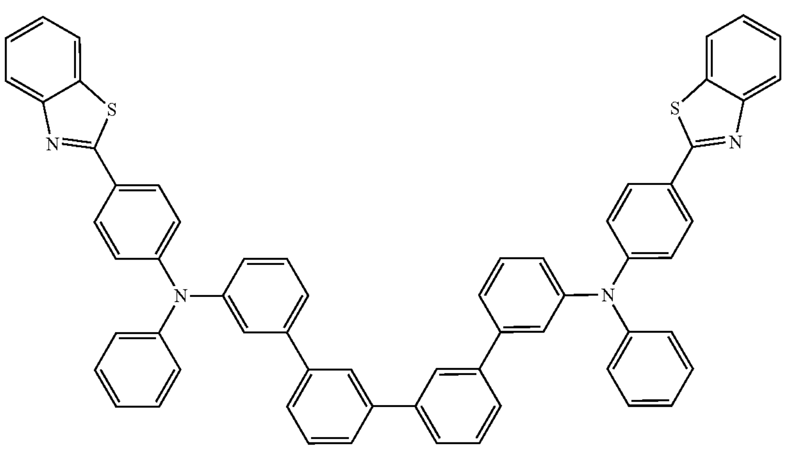

-continued
B138
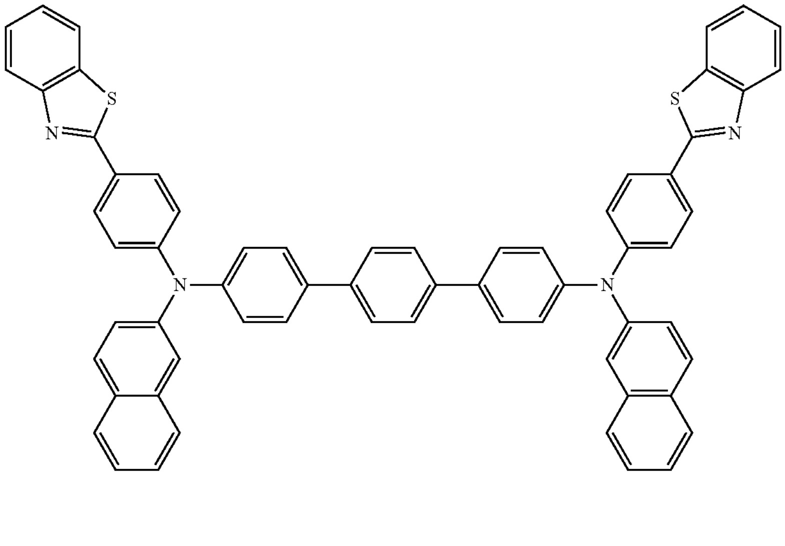
B139
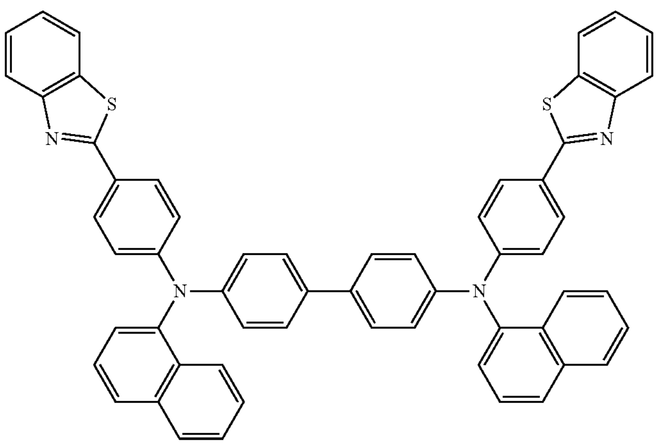
B140
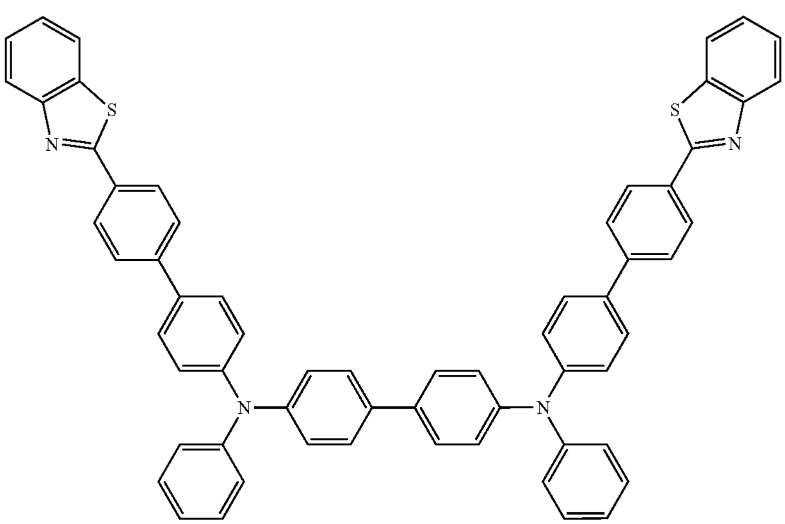

-continued
B141
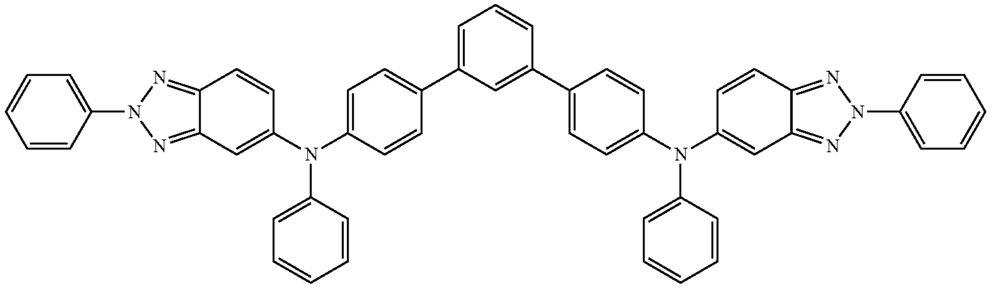
B142
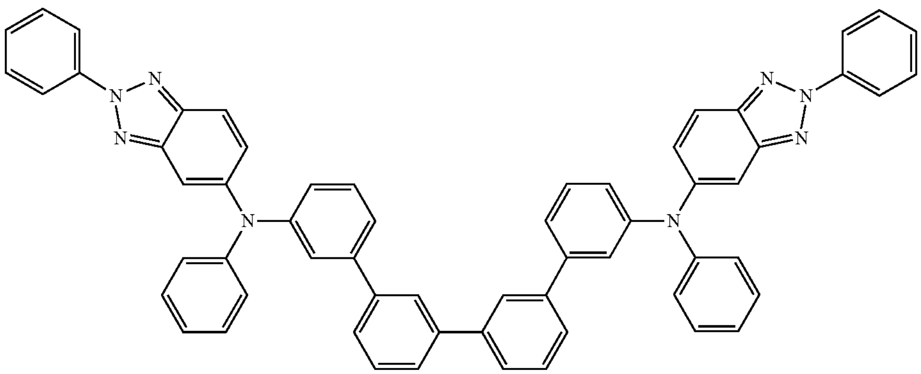
B143
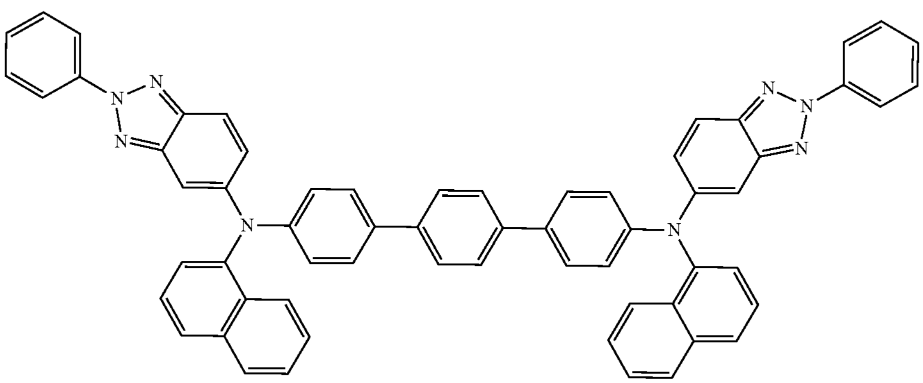
B144
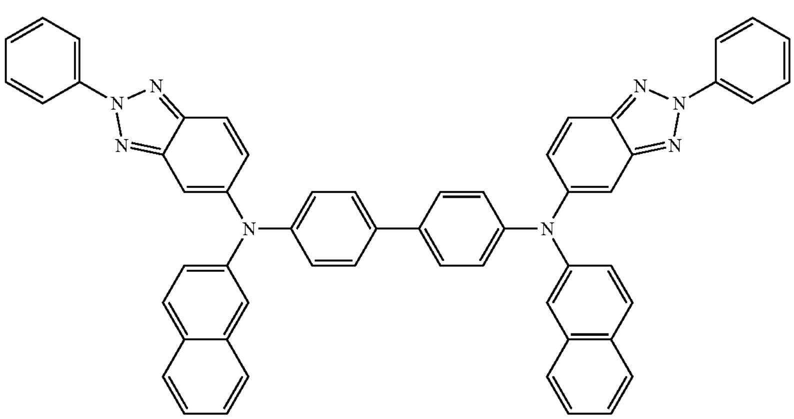

-continued

B145

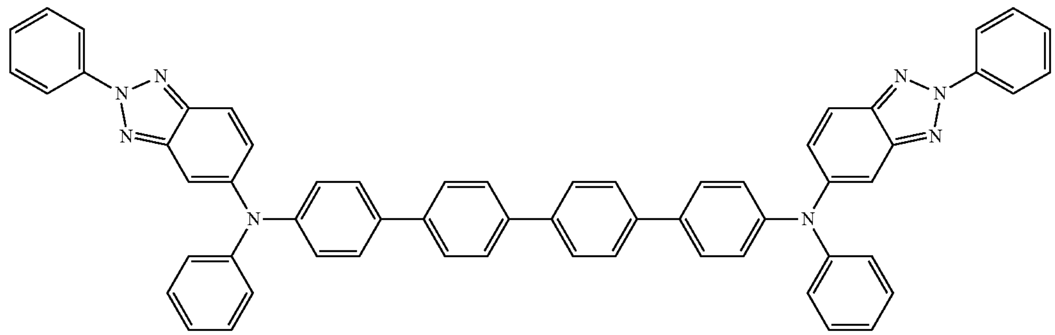

21. The organic electroluminescent device according to claim 17, wherein the light emitting layer comprises, as a host compound, an anthracene derivative represented by Formula D:

[Formula D]

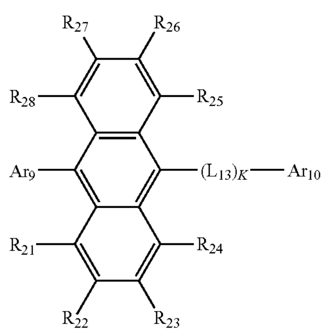

wherein $R_{21}$ to $R_{28}$ are identical to or different from each other and are as defined for R, $R_2$ to $R_5$ in Formula A-3 or A-5, $Ar_9$ and $Ar_{10}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from the group consisting of substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

22. The organic electroluminescent device according to claim 21, wherein the compound of Formula D is selected from the group consisting of the compounds of Formulae D1 to D48:

D1

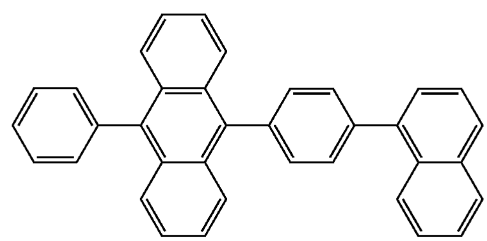

D2

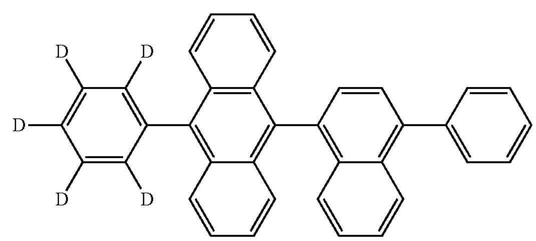

D3

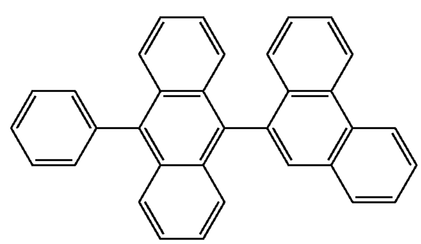

D4

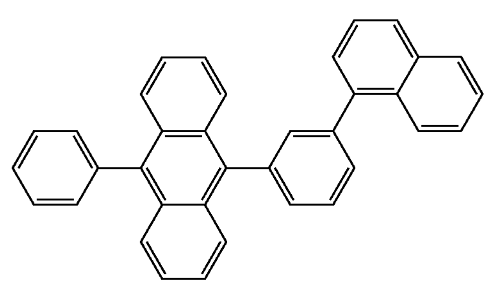

-continued
D5
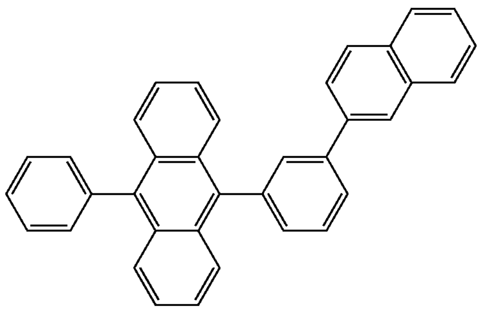
D6
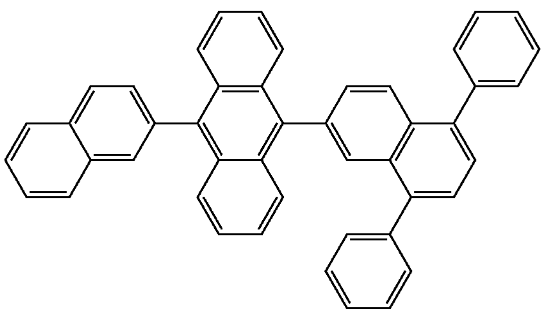
D7
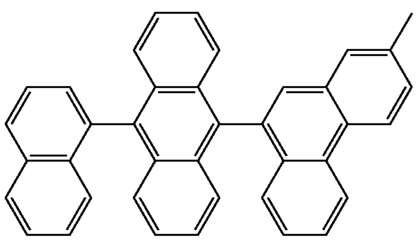
D8
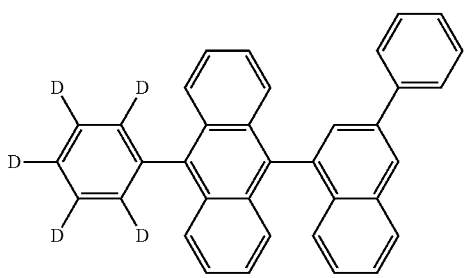
D9
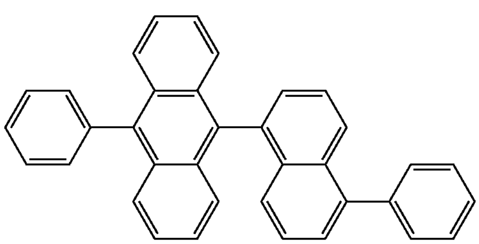
D10
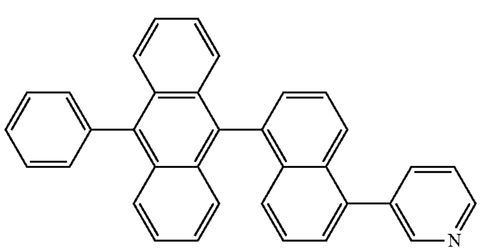
-continued
D11
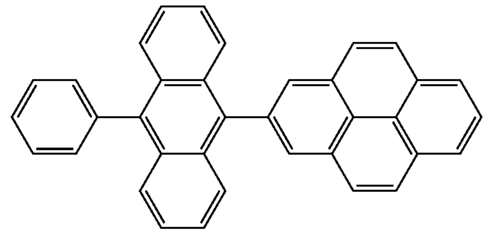
D12
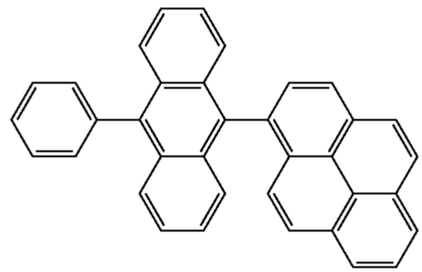
D13
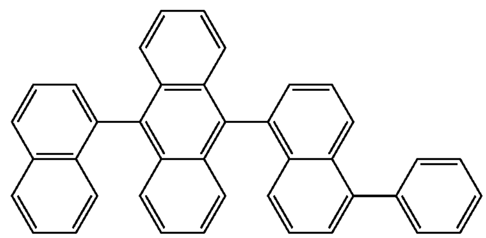
D14
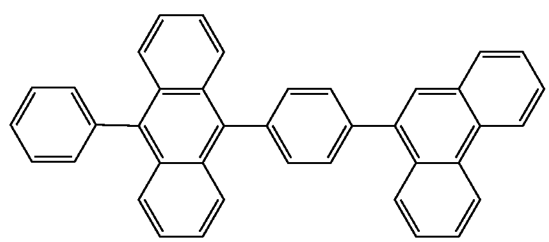
D15
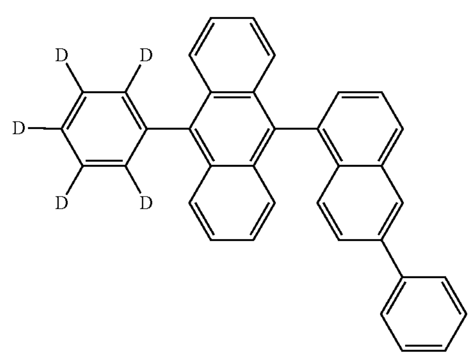

-continued
D16
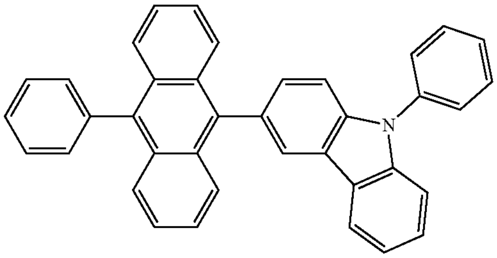
D17
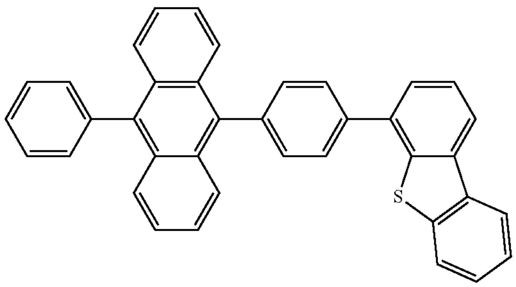
D18
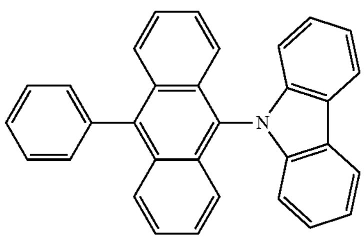
D19
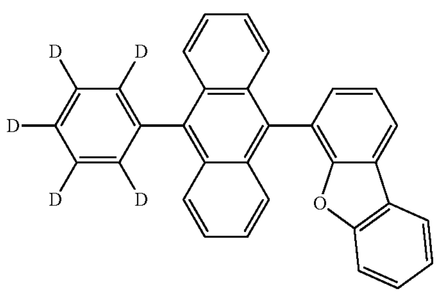
D20
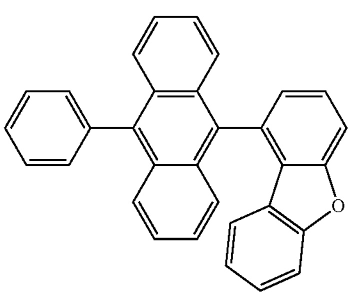
-continued
D21
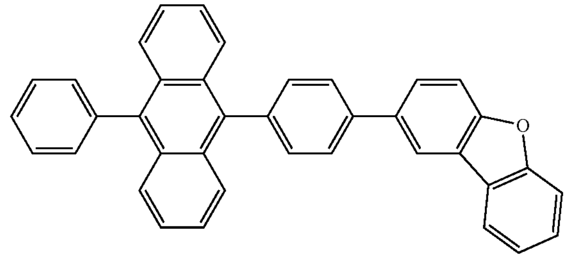
D22
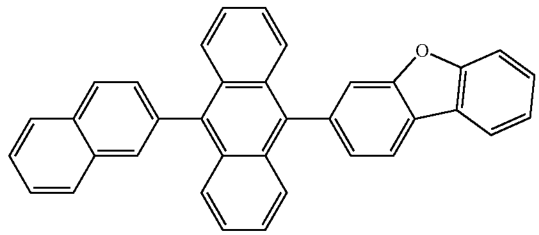
D23
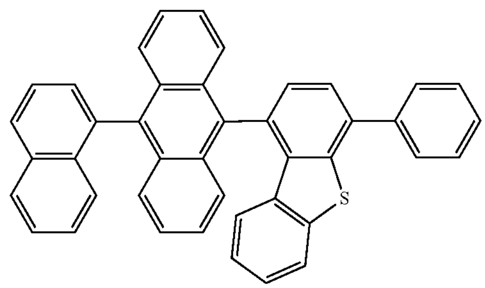
D24
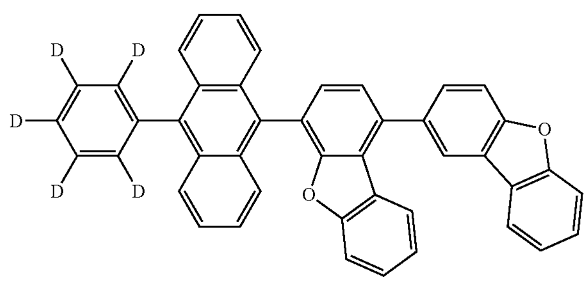
D25
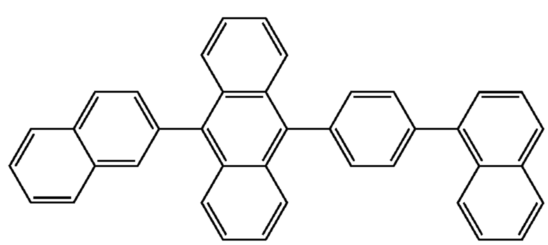

-continued
D26
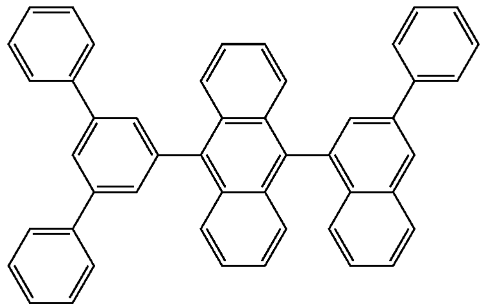
D27
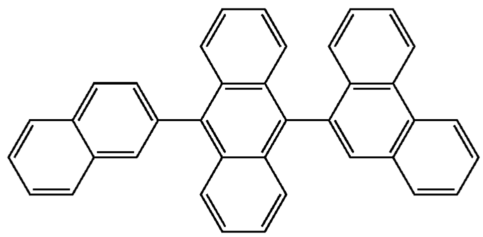
D28
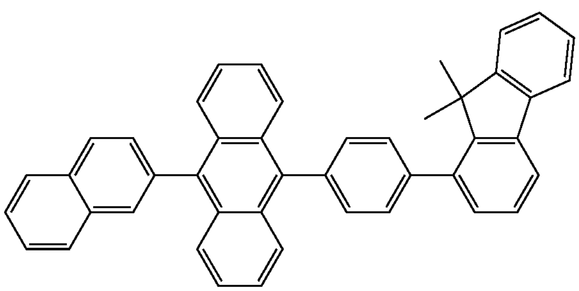
D29
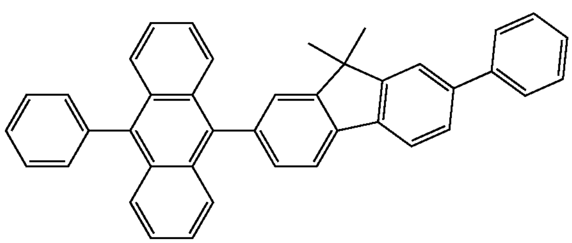
D30
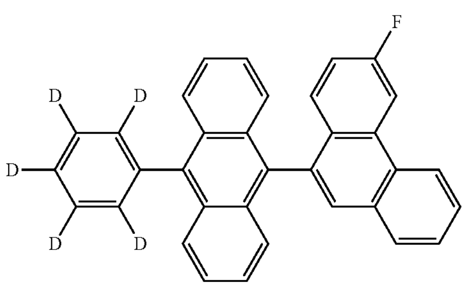
D31
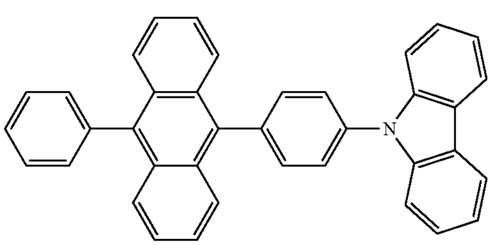
-continued
D32
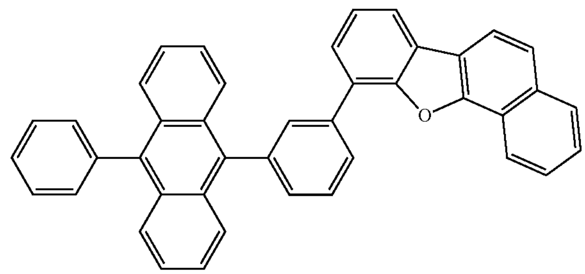
D33
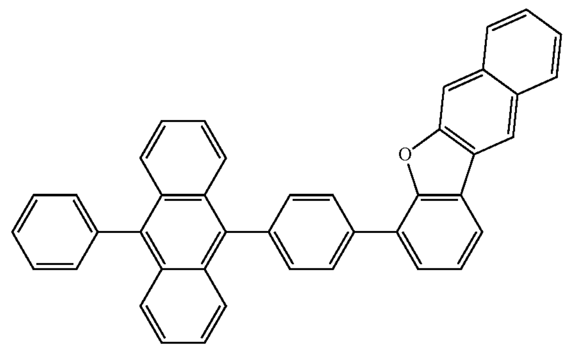
D34
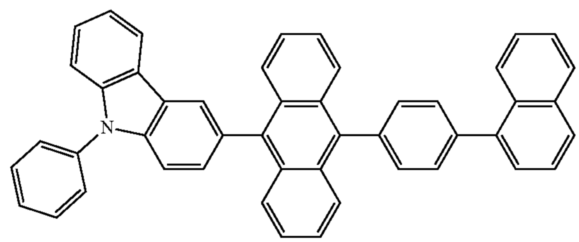
D35
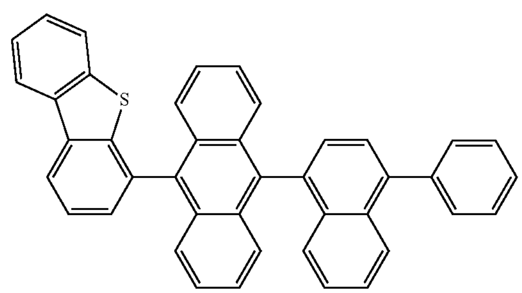
D36
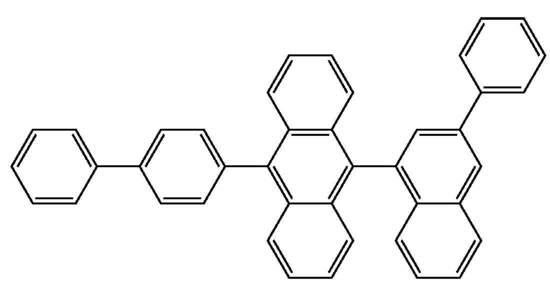

-continued
D37
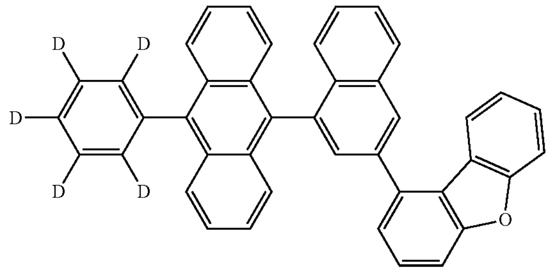
D38
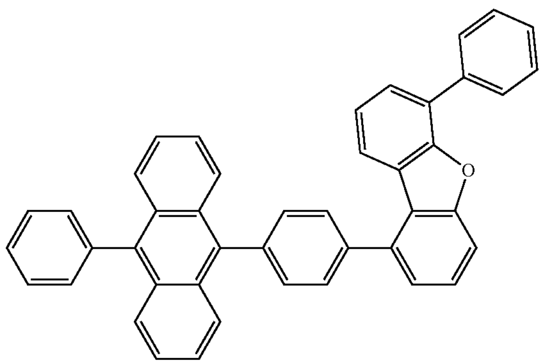
D39
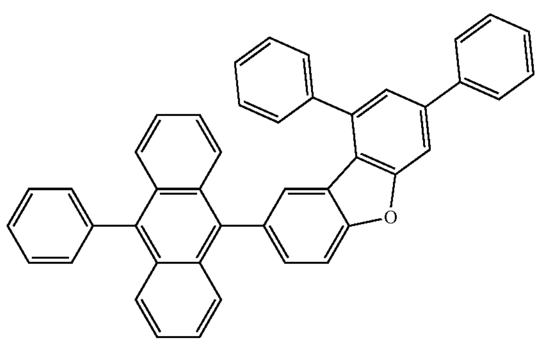
D40
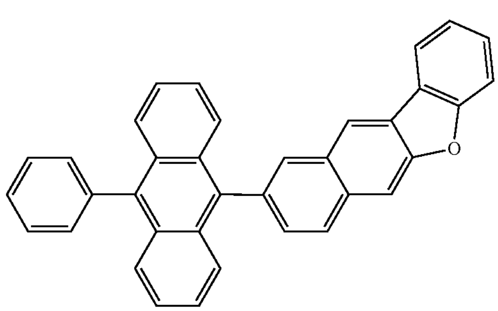
-continued
D41
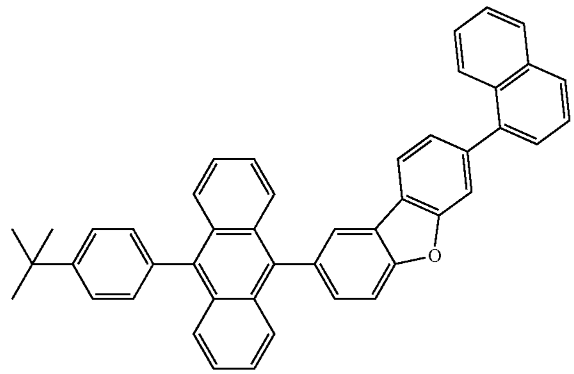
D42
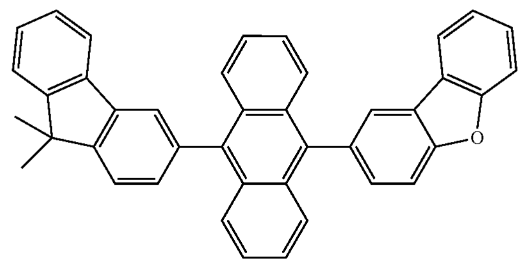
D43
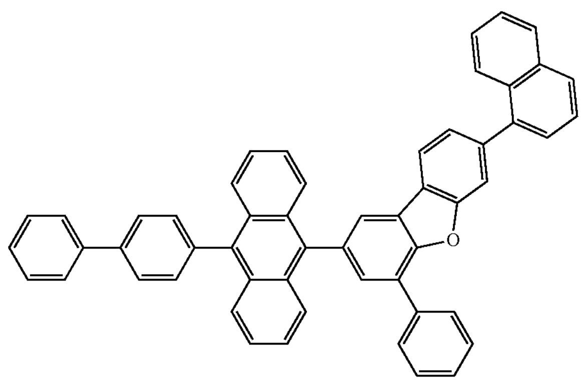
D44
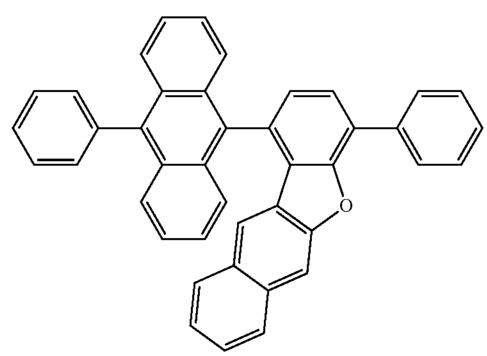

-continued

D45

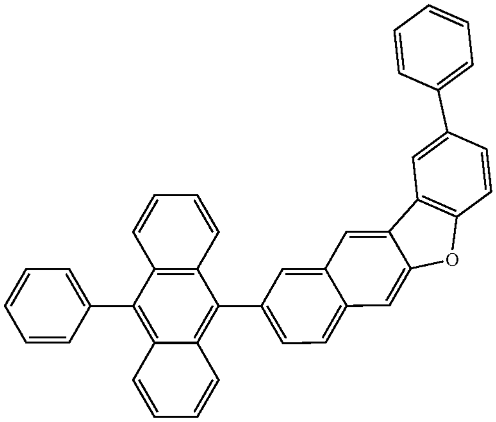

D46

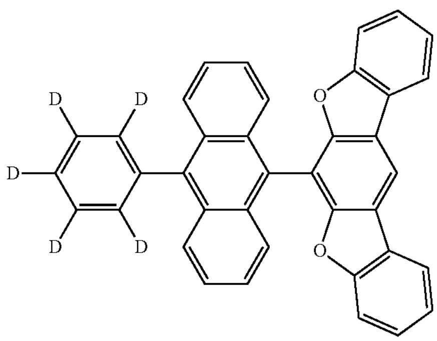

D47

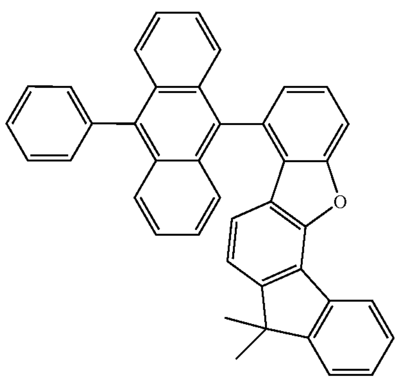

D48

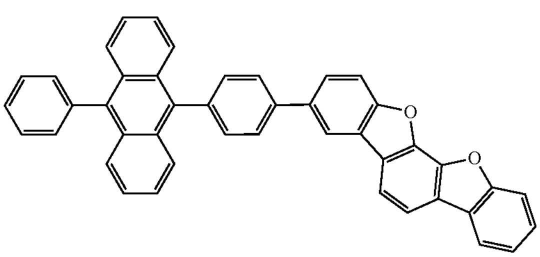

23. The organic electroluminescent device according to claim 17, further comprising a hole transport layer and an electron blocking layer interposed between the first electrode and the second electrode wherein each of the hole transport layer and the electron blocking layer comprises a compound represented by Formula E:

[Formula E]

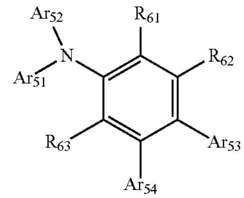

wherein $R_{61}$ to $R_{63}$ are identical to or different from each other and are each independently selected from the group consisting of hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

24. The organic electroluminescent device according to claim 23, wherein the compound of Formula E is selected from the group consisting of the compounds of Formulae E1 to E33:

E1

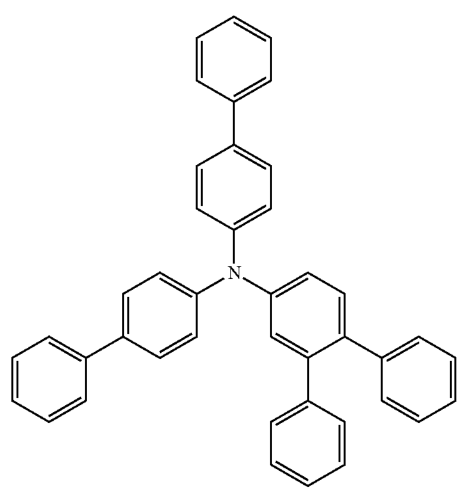

E2
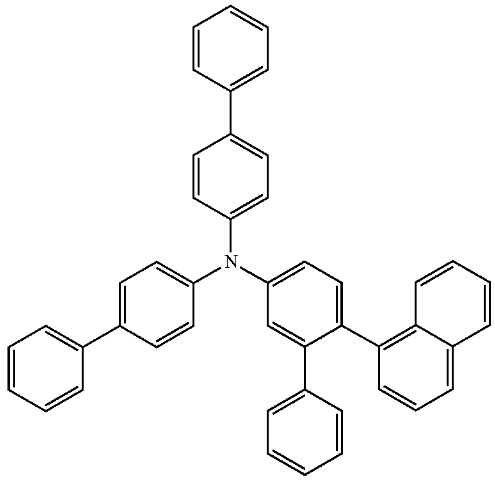
E3
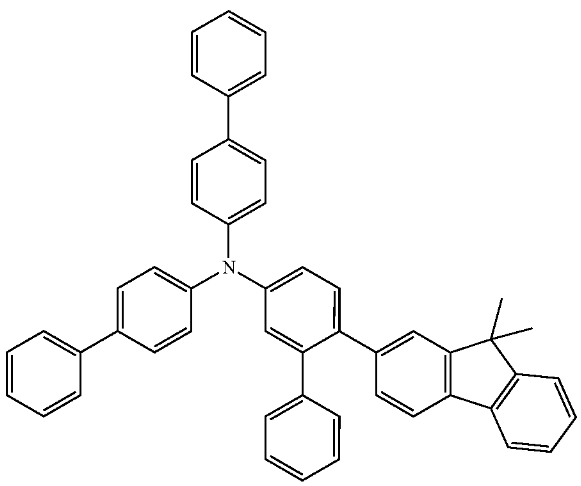
E4
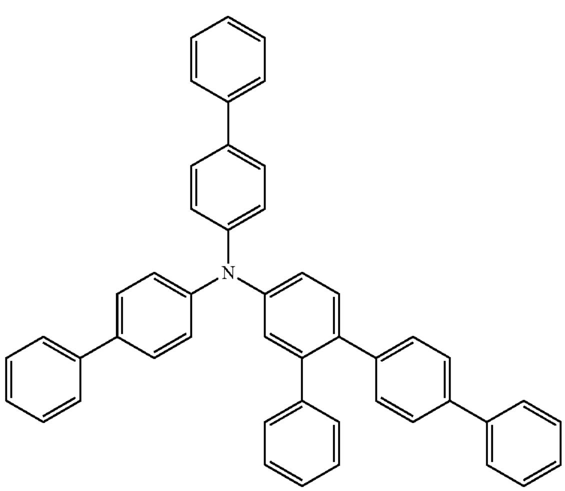
E5
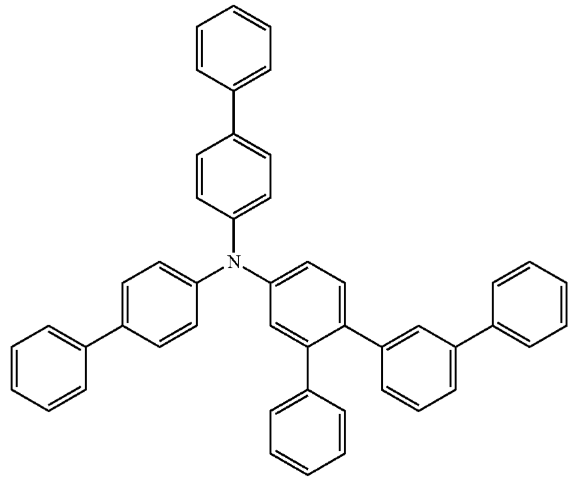
E6
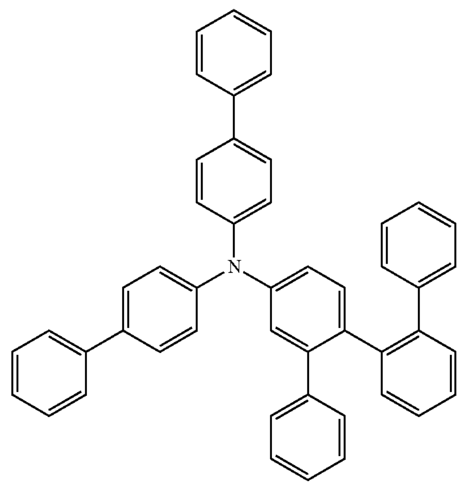
E7
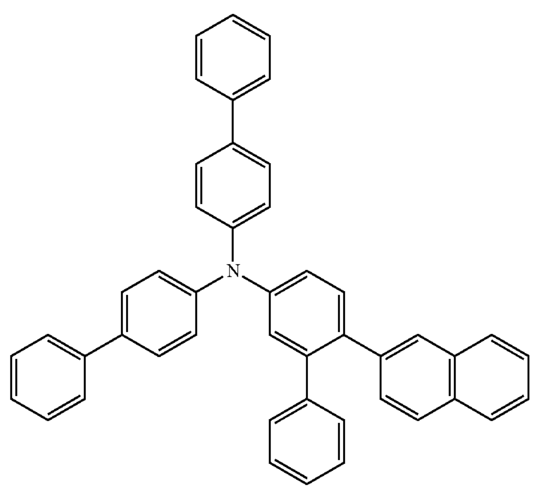

-continued
E8
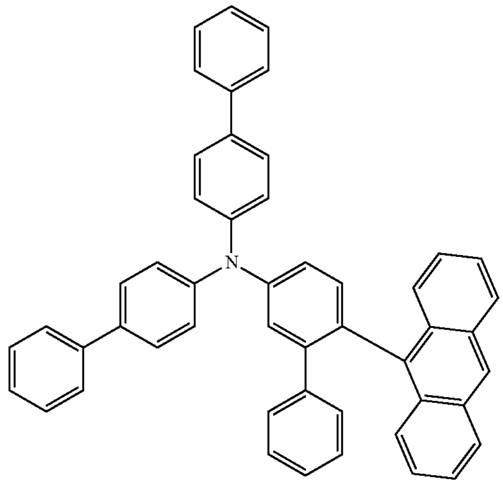
E9
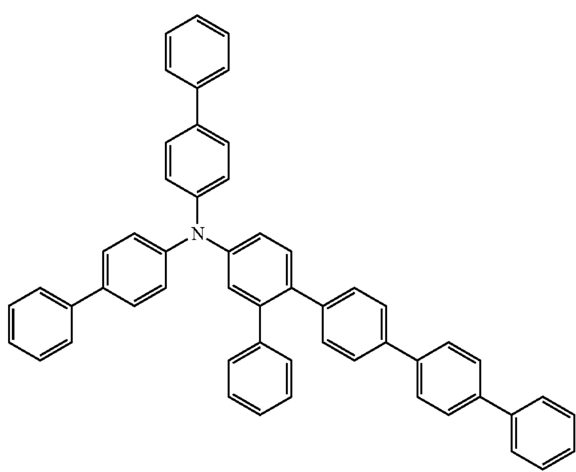
E10
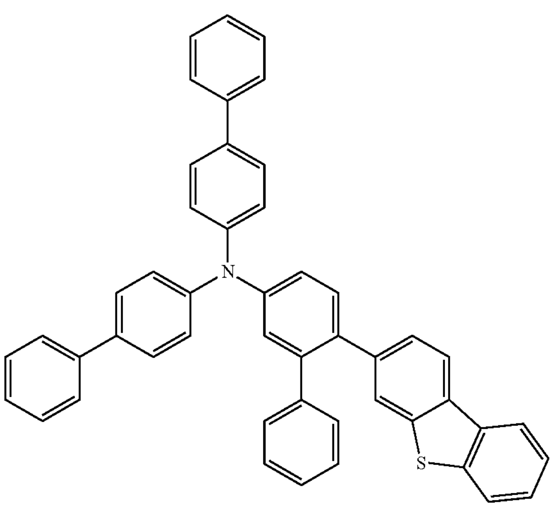
-continued
E11
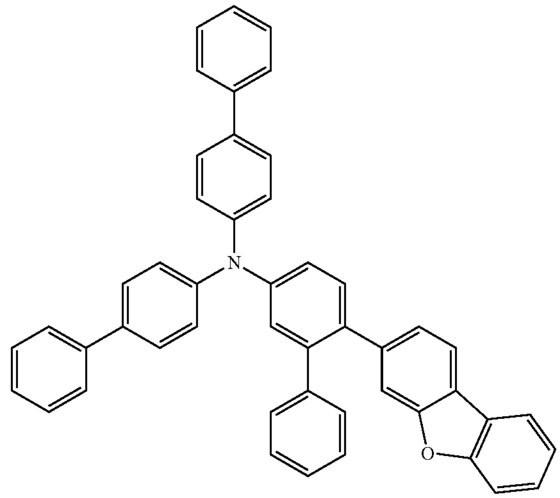
E12
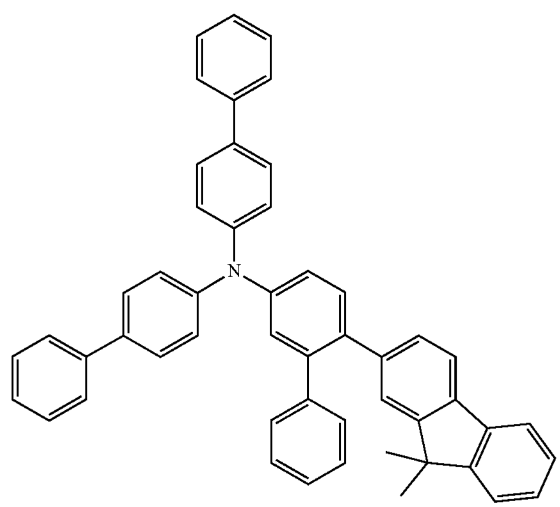
E13
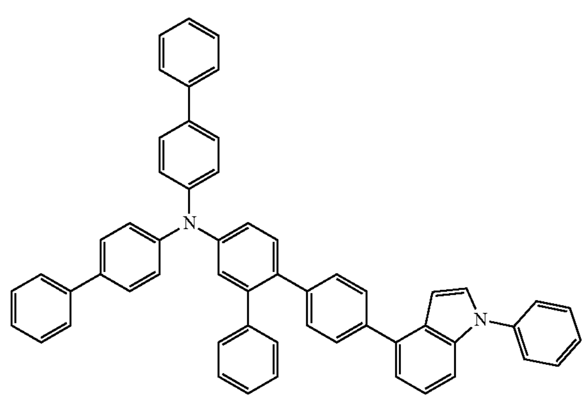

-continued
E14
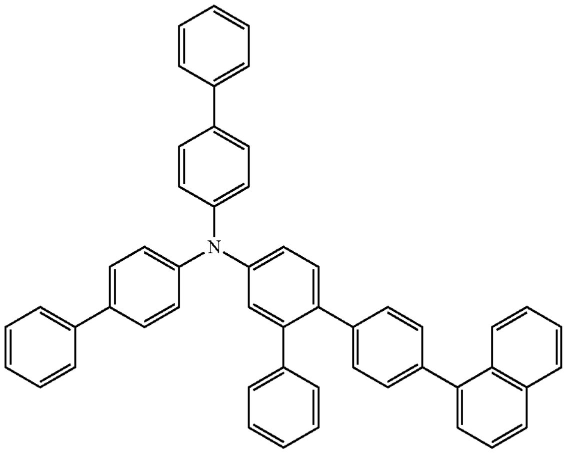
E15
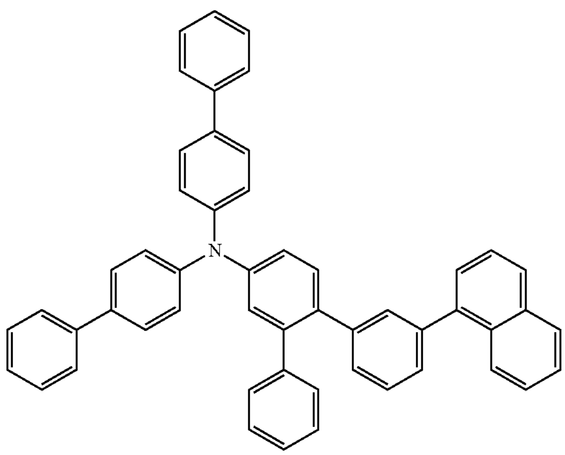
E16
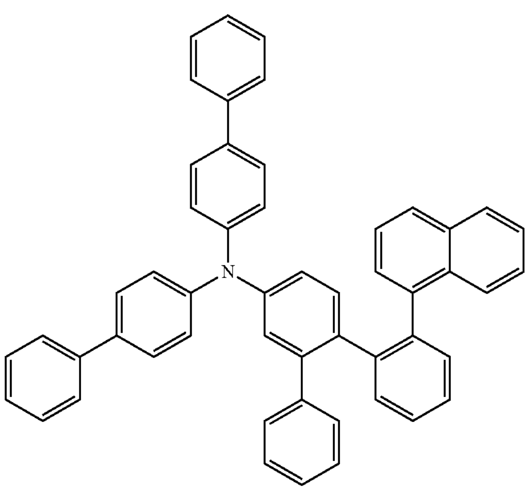
-continued
E17
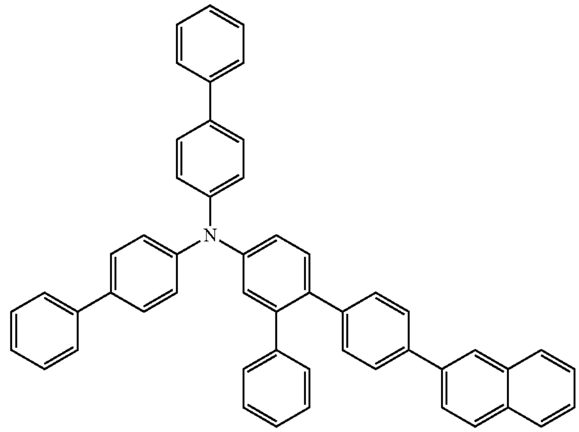
E18
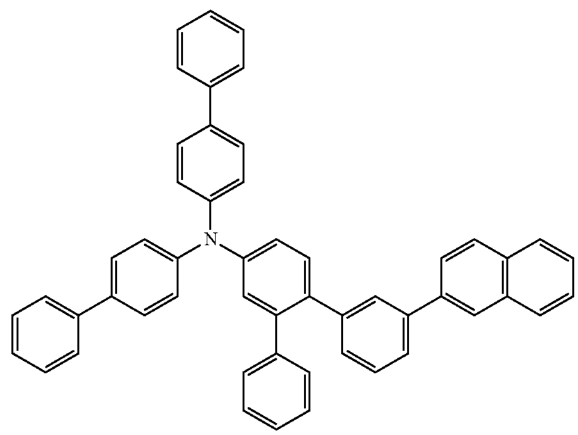
E19
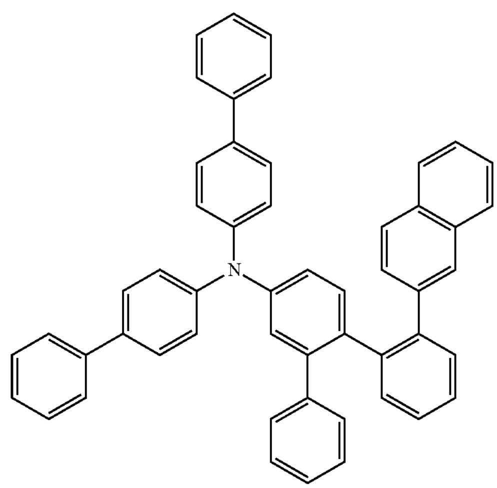

-continued
E20
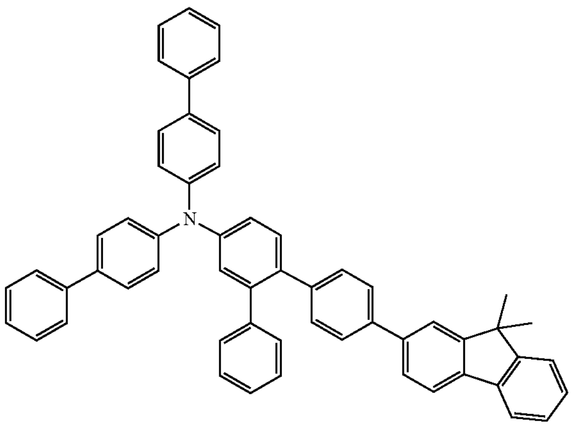
E21
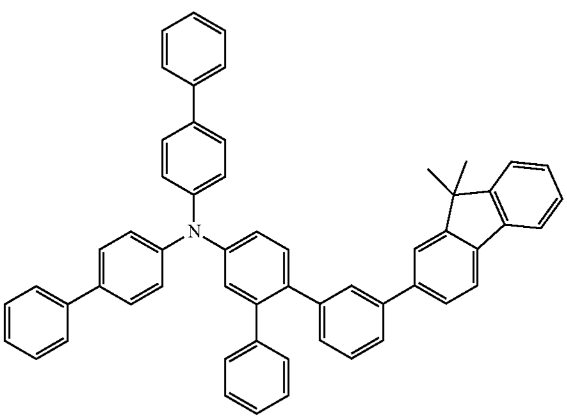
E22
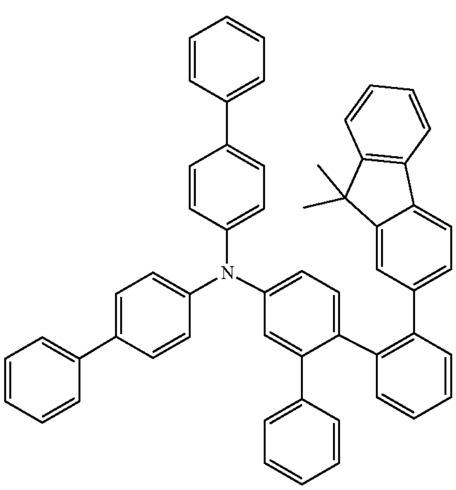
-continued
E23
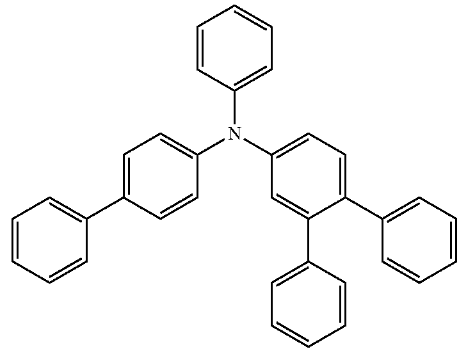
E24
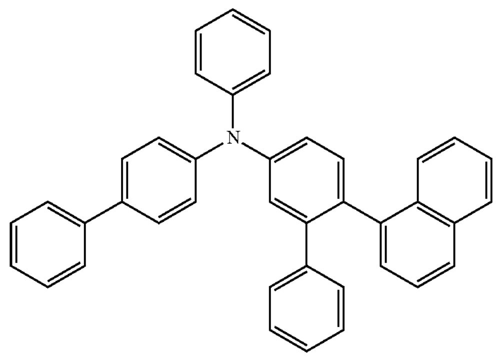
E25
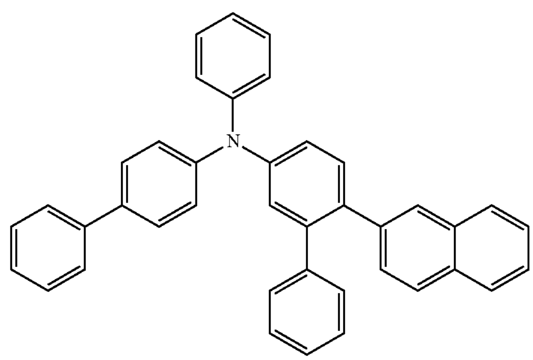
E26
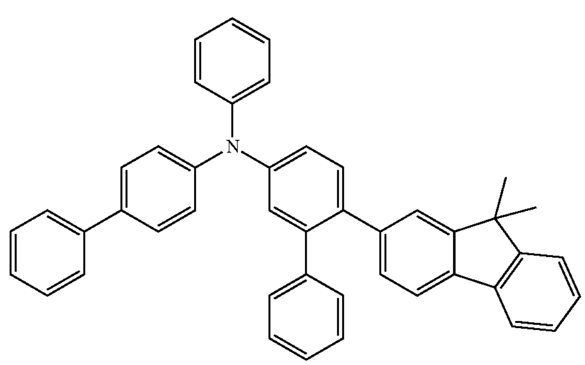

E27
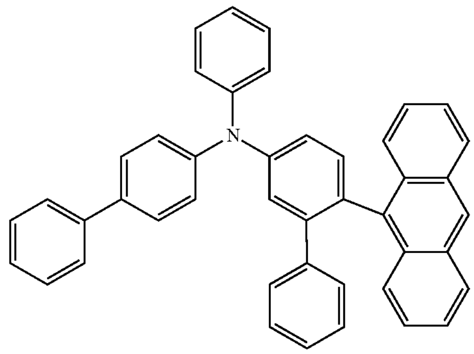
E28
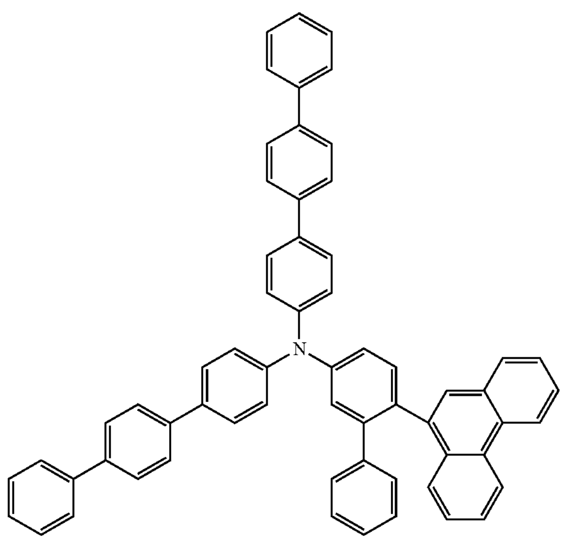
E29
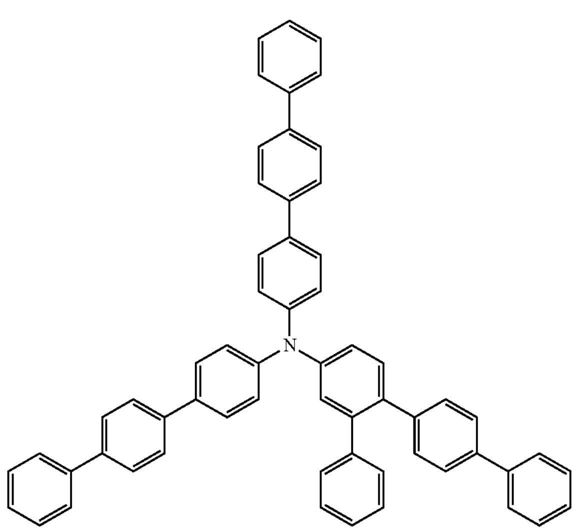
E30
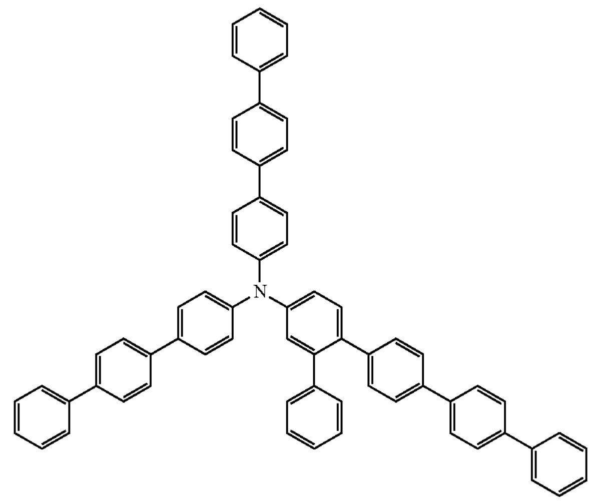
E31
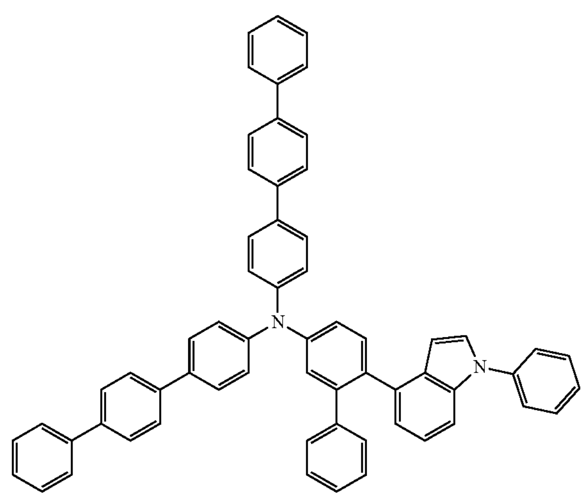
E32
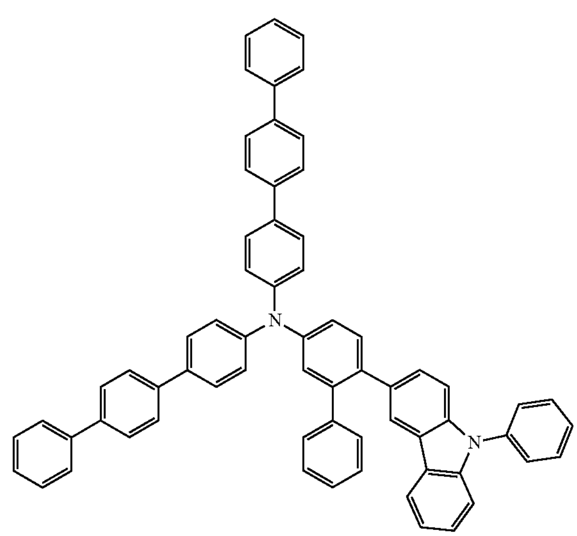

-continued
E33
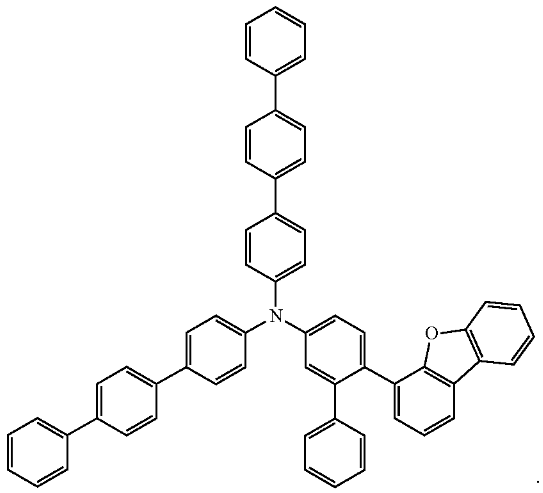
.
* * * * *